US012052913B2

(12) United States Patent
Ha et al.

(10) Patent No.: US 12,052,913 B2
(45) Date of Patent: Jul. 30, 2024

(54) ORGANIC ELECTROLUMINESCENT DEVICE

(71) Applicant: LG CHEM, LTD., Seoul (KR)

(72) Inventors: Jae Seung Ha, Daejeon (KR); Seong So Kim, Daejeon (KR); Minseung Chun, Daejeon (KR); Sang Duk Suh, Daejeon (KR); Min Woo Jung, Daejeon (KR); Boon Jae Jang, Daejeon (KR); Yongbum Cha, Daejeon (KR); Dong Uk Heo, Daejeon (KR); Jungha Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 823 days.

(21) Appl. No.: 17/264,462

(22) PCT Filed: Sep. 29, 2019

(86) PCT No.: PCT/KR2019/012673

§ 371 (c)(1),
(2) Date: Jan. 29, 2021

(87) PCT Pub. No.: WO2020/067823

PCT Pub. Date: Apr. 2, 2020

(65) Prior Publication Data

US 2022/0123218 A1 Apr. 21, 2022

(30) Foreign Application Priority Data

Sep. 28, 2018 (KR) ........................ 10-2018-0116024

(51) Int. Cl.

*H01L 51/50* (2006.01)
*H10K 85/60* (2023.01)

(Continued)

(52) U.S. Cl.

CPC ......... *H10K 85/624* (2023.02); *H10K 85/654* (2023.02); *H10K 85/6572* (2023.02);

(Continued)

(58) Field of Classification Search

None

See application file for complete search history.

(56) References Cited

U.S. PATENT DOCUMENTS

| | | | |
|---|---|---|---|
| 2004/0251816 | A1 | 12/2004 | Leo et al. |
| 2007/0054151 | A1 | 3/2007 | Iwakuma et al. |

(Continued)

FOREIGN PATENT DOCUMENTS

| | | |
|---|---|---|
| JP | 2013-093587 | 5/2013 |
| JP | 2015-124206 | 7/2015 |

(Continued)

OTHER PUBLICATIONS

Becke, A. D., "Density-functional exchange-energy approximation with correct asymptotic behavior," Phys Rev A Gen Phys., 38(6):3098-3100 (1988).

(Continued)

*Primary Examiner* — Gregory D Clark

(74) *Attorney, Agent, or Firm* — Bryan Cave Leighton Paisner LLP

(57) ABSTRACT

Provided is an organic electroluminescent device, the organic electroluminescent device comprising a cathode, an anode, and one or more organic material layers provided between the cathode and the anode, the one or more organic material layers comprising a light emitting layer, an electron transport region and a hole transport region, wherein all of the organic materials, other than a dopant, contained in the one or more organic material layers have a triplet state energy of 2.5 eV or higher, at least three types of the organic materials having a triplet state energy of 2.5 eV or higher (Continued)

have a triplet state energy of 2.7 eV or higher, and at least two types of the organic materials having a triplet state energy of 2.5 eV or higher include a spiro compound.

17 Claims, 1 Drawing Sheet

(51) Int. Cl.

| | |
|---|---|
| *H10K 50/11* | (2023.01) |
| *H10K 50/15* | (2023.01) |
| *H10K 50/16* | (2023.01) |
| *H10K 50/17* | (2023.01) |
| *H10K 101/00* | (2023.01) |
| *H10K 101/10* | (2023.01) |

(52) U.S. Cl.

CPC ..... *H10K 85/6574* (2023.02); *H10K 85/6576* (2023.02); *H10K 50/11* (2023.02); *H10K 50/15* (2023.02); *H10K 50/16* (2023.02); *H10K 50/17* (2023.02); *H10K 50/171* (2023.02); *H10K 2101/10* (2023.02); *H10K 2101/90* (2023.02)

(56) References Cited

U.S. PATENT DOCUMENTS

| | | | |
|---|---|---|---|
| 2007/0159083 | A1 | 7/2007 | Matsuura et al. |
| 2009/0236974 | A1 | 9/2009 | Tamaru et al. |
| 2014/0197401 | A1 | 7/2014 | Kroeber et al. |
| 2015/0349266 | A1 | 12/2015 | Lee et al. |
| 2016/0308147 | A1 | 10/2016 | Parham et al. |
| 2018/0269402 | A1* | 9/2018 | Huh ....................... C09K 11/06 |
| 2018/0337341 | A1 | 11/2018 | Heo et al. |

FOREIGN PATENT DOCUMENTS

| | | |
|---|---|---|
| KR | 10-0428642 | 4/2004 |
| KR | 10-2008-0052579 | 6/2008 |
| KR | 10-2012-0004018 | 1/2012 |
| KR | 10-1159374 | 6/2012 |
| KR | 10-2014-0054330 | 5/2014 |
| KR | 10-1422914 | 7/2014 |
| KR | 10-2015-0139709 | 12/2015 |
| KR | 10-2016-0095165 | 8/2016 |
| KR | 10-2017-0041155 | 4/2017 |
| KR | 10-1755986 | 7/2017 |
| KR | 10-2017-0092097 | 8/2017 |
| KR | 10-2018-0096532 | 8/2018 |
| WO | 2003-012890 | 2/2003 |

OTHER PUBLICATIONS

Perdew et al., “Accurate and simple analytic representation of the electron-gas correlation energy,” Phys Rev B Condens Mater., 45(23):13244-13249 (1992).

Delley, “An all-electron numerical method for solving the local density functional for polyatomic molecules,” J. Chem. Phys., 92(1):508-517 (1990).

Hehre et al., “Self-Consistent Molecular Orbital Methods, XII. Further Extensions of Gaussian-Type Basis Sets for Use in Molecular Orbital Studies of Organic Molecules,” J. Chem Phys., 56(5):2257-2261 (1972).

* cited by examiner

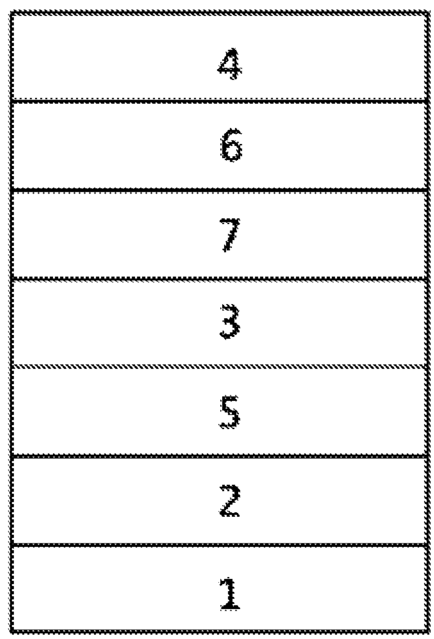
4
6
7
3
5
2
1

ORGANIC ELECTROLUMINESCENT DEVICE

CROSS-REFERENCE TO RELATED APPLICATIONS

This application is a National Stage Application of International Application No. PCT/KR2019/012673 filed on Sep. 29, 2019, which claims priority to and the benefit of Korean Patent Application No. 10-2018-0116024 filed in the Korean Intellectual Property Office on Sep. 28, 2018, the entire contents of which are incorporated herein by reference.

TECHNICAL FIELD

The present specification relates to an organic electroluminescent device.

BACKGROUND

An organic electroluminescent device has a structure in which an organic thin film is disposed between two electrodes. When a voltage is applied to an organic electroluminescent device having the structure, electrons and holes injected from the two electrodes combine with each other in the organic thin film to make a pair, and then, emit light while being extinguished. The organic thin film can be composed of a single layer or multi layers, if necessary.

An organic electroluminescent device using phosphorescence has been typically used, and particularly, a phosphorescent device using an Ir complex has been actively studied. Efforts to introduce phosphorescence in a blue light emitting region have been continuously made, and the progress on the efforts is currently at the low level due to the need for high singlet and triplet energy of a blue host. A phosphorescent light emitting device with high efficiency using an Ir complex is generally used in red and green regions. Thus, in order to secure a light emitting region, a compound for a host of a light emitting layer is secured to have singlet and triplet energy at a relatively higher level than the Ir complex, and a relatively high triplet energy is used in a light emitting device. Thus, only when organic materials used in each layer in the organic electroluminescent device have a triplet energy at a suitable level or more, the organic materials can have excellent device performance. In particular, the introduction of compounds having a high triplet energy in terms of service life exhibits a great advantage, and additional advantages have also been confirmed.

It is preferred that all of the compounds used in each layer in the organic electroluminescent device have a high triplet energy of 2.5 eV or more, and particularly, the high triplet energy of a layer, which is in contact with a light emitting layer, induces bonding of a carrier in the light emitting layer and thus enables an excellent device structure, and the case where the structure of the compound is a spiro compound is further preferred in terms of the performance of the organic electroluminescent device. In the present patent application, three or more spiro compounds are included in all the layers of a specific device structure, and the following exemplified compounds can be used. However, not only the spiro compound of the present patent application is used in each organic layer in the device, and a triplet energy of the used spiro compound does not always have 2.5 eV, preferably 2.6 eV or more, and a spiro compound having triplet energy of 2.5 eV or less and the other compounds having high triplet energy of 2.5 eV or more can be used in combination in the entire structure of the organic electroluminescent device.

Preferably, a compound having a high triplet energy of 2.6 eV or more (also including a spiro compound) is used in the entire structure of the organic electroluminescent device. Furthermore, it is more preferred that an organic material layer, which is in contact with a light emitting layer, is composed of a spiro compound.

BRIEF DESCRIPTION OF INVENTION

Technical Problem

The present specification provides an organic electroluminescent device.

Technical Solution

An exemplary embodiment of the present specification has been made in an effort to provide an organic electroluminescent device including: a cathode; an anode; a light emitting layer provided between the cathode and the anode; and one or more organic material layers provided the cathode and the anode, in which the one or more organic material layers include an electron transport region provided between the cathode and the light emitting layer and a hole transport region provided between the anode and the light emitting layer, all of the other organic materials, except for a dopant, among organic materials included in the one or more organic material layers have a triplet energy ($T_{org}$) of 2.5 eV or more, three or more of the organic materials having a triplet energy ($T_{org}$) of 2.5 eV or more have a triplet energy ($T_{org}$) of 2.7 eV or more, and two or more of the organic materials having a triplet energy ($T_{org}$) of 2.5 eV or more include a spiro compound.

Advantageous Effects

The compound described in the present specification can be used as a material for an organic material layer of an organic electroluminescent device. The compound according to at least one exemplary embodiment can improve the efficiency, achieve a low driving voltage or improve service life characteristics in the organic electroluminescent device.

The compound described in the present specification can be used as a material for an electron injection layer, an electron transport layer, or a light emitting layer.

BRIEF DESCRIPTION OF DRAWINGS

FIG. 1 illustrates an example of an organic electroluminescent device composed of a substrate 1, an anode 2, a hole transport layer 5, a light emitting layer 3, an electron transport layer 7, an electron injection layer 6, and a cathode 4.

EXPLANATION OF REFERENCE NUMERALS AND SYMBOLS

1: Substrate
2: Anode
3: Light emitting layer
4: Cathode
5: Hole transport layer
6: Electron injection layer
7: Electron transport layer

DETAILED DESCRIPTION

Hereinafter, the present specification will be described in more detail.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium, a halogen group, a cyano group, a silyl group, an alkyl group, a cycloalkyl group, an aryl group, and a heterocyclic group, being substituted with a substituent to which two or more substituents among the exemplified substituents are linked, or having no substituent. For example, "the substituent to which two or more substituents are linked" can be a biphenyl group. That is, the biphenyl group can also be an aryl group, and can be interpreted as a substituent to which two phenyl groups are linked.

In the present specification, examples of a halogen group include fluorine (F), chlorine (Cl), bromine (Br) or iodine (I).

In the present specification, a silyl group can be —$SiR_aR_bR_c$, and $R_a$, $R_b$, and $R_c$ each can be hydrogen, a substituted or unsubstituted alkyl group, or a substituted or unsubstituted aryl group. Specific examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group can be —$BY_dY_e$, and $Y_d$ and $Y_e$ each can be hydrogen, a substituted or unsubstituted alkyl group, or a substituted or unsubstituted aryl group. Specific examples of the boron group include a trimethylboron group, a triethylboron group, a tert-butyldimethylboron group, a triphenylboron group, a phenylboron group, and the like, but are not limited thereto.

In the present specification, an amine group can be selected from the group consisting of —$NH_2$, an alkylamine group, an N-arylalkylamine group, an arylamine group, an N-arylheteroarylamine group, an N-alkylheteroarylamine group, and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, and the like, but are not limited thereto.

In the present specification, the alkoxy group can be straight-chained, branched, or cyclic. The number of carbon atoms of the alkoxy group is not particularly limited, but is preferably 1 to 40. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methyl-benzyloxy, and the like, but are not limited thereto.

In the present specification, the alkyl group can be straight-chained or branched, and the number of carbon atoms thereof is not particularly limited, but is preferably 1 to 60. According to an exemplary embodiment, the number of carbon atoms of the alkyl group is 1 to 40. According to another exemplary embodiment, the number of carbon atoms of the alkyl group is 1 to 20. Specific examples thereof include a methyl group, an ethyl group, a propyl group, an n-propyl group, an isopropyl group, a butyl group, an n-butyl group, an isobutyl group, a tert-butyl group, a sec-butyl group, a 1-methyl-butyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexyl-methyl group, an octyl group, an n-octyl group, a tert-octyl group, a 1-methylheptyl group, a 2-ethylhexyl group, a 2-propyl-pentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group, and the like, but are not limited thereto.

In the present specification, the alkenyl group can be straight-chained or branched, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10. According to still another exemplary embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but has preferably 3 to 60 carbon atoms. According to an exemplary embodiment, the number of carbon atoms of the cycloalkyl group is 3 to 40. According to another exemplary embodiment, the number of carbon atoms of the cycloalkyl group is 3 to 20. Specific examples thereof include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group, and the like, but are not limited thereto.

In the present specification, when the aryl group is a monocyclic aryl group, the number of carbon atoms thereof is not particularly limited, but is preferably 6 to 60. According to an exemplary embodiment, the number of carbon atoms of the aryl group is 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 60. According to an exemplary embodiment, the number of carbon atoms of the aryl group is 10 to 30. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group can be substituted, and adjacent substituents can be bonded to each other to form a ring.

When the fluorenyl group is substituted, the substituent can be

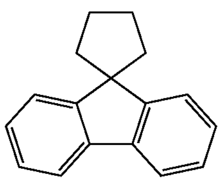,

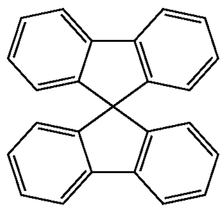,

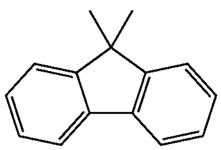,

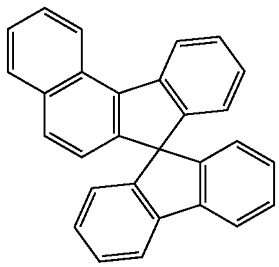,

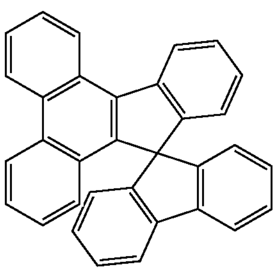,

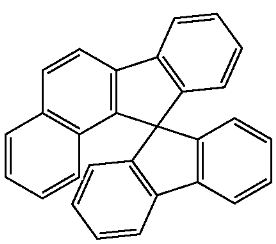,

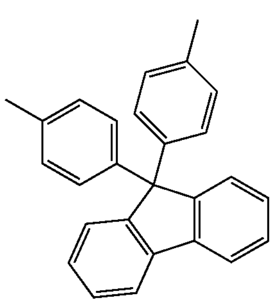,

-continued

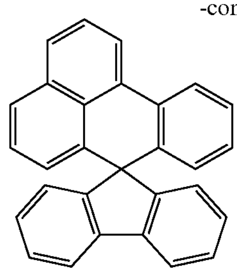, and

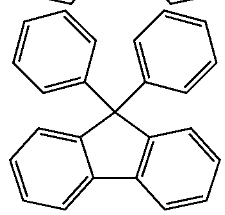, and the like. However, the substituent is not limited thereto.

In the present specification, a heterocyclic group includes one or more of N, O, S, Si, and Se as a heteroatom, and the number of carbon atoms thereof is not particularly limited, but is preferably 2 to 60. According to an exemplary embodiment, the number of carbon atoms of the heterocyclic group is 2 to 30. According to another exemplary embodiment, the number of carbon atoms of the heterocyclic group is 2 to 20. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzo-carbazole group, a benzothiophene group, a dibenzo-thiophene group, a dibenzofuran group, a benzofuranyl group, a phenanthroline group, a thiazolyl group, an isoxazolyl group, an oxadiazolyl group, a thiadiazolyl group, a benzothiazolyl group, a dibenzofuranyl group, and the like, but are not limited thereto.

In the present specification, the above-described description on the heterocyclic group can be applied to a heteroaryl group except for an aromatic heteroaryl group.

In the present specification, the above-described description on the heterocyclic group can be applied to a heteroaryl group in a heteroarylamine group and an arylheteroarylamine group.

In the present specification, the above-described description on the aryl group can be applied to an arylene group except for a divalent arylene group.

In the present specification, the above-described description on the heteroaryl group can be applied to a heteroarylene group except for a divalent heteroarylene group.

In the present specification, examples of an arylphosphine group include a substituted or unsubstituted monoarylphosphine group, a substituted or unsubstituted diarylphosphine group, or a substituted or unsubstituted triarylphosphine group. The aryl group in the arylphosphine group can be a monocyclic aryl group, and can be a polycyclic aryl group. The arylphosphine group including two or more aryl groups can include a monocyclic aryl group, a polycyclic aryl group, or both a monocyclic aryl group and a polycyclic aryl group.

In the present specification, the above-described description on the aryl group can be applied to an aryl group in an aryloxy group, an arylthioxy group, an arylsulfoxy group, an arylphosphine group, an arylamine group, and an arylheteroarylamine group.

In the present specification, the above-described description on the alkyl group can be applied to an alkyl group in an alkylthioxy group, an alkylsulfoxy group, and an alkylamine group.

In the present specification, the "adjacent" group can mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other.

In the present specification, in a substituted or unsubstituted ring formed by bonding adjacent groups, the "ring" means a hydrocarbon ring or a hetero ring.

In the present specification, a hydrocarbon ring can be an aromatic ring, an aliphatic ring, or a fused ring of the aromatic ring and the aliphatic ring, and can be selected from the examples of the cycloalkyl group or the aryl group, except for the hydrocarbon ring which is not monovalent.

In the present specification, a hetero ring includes one or more atoms other than carbon, that is, heteroatoms, and specifically, the heteroatom can include one or more atoms selected from the group consisting of N, O, P, S, Si, Se, and the like. The hetero ring can be monocyclic or polycyclic and can be an aromatic ring, an aliphatic ring, or a fused ring of the aromatic ring and the aliphatic ring, and the aromatic hetero ring can be selected from the examples of the heteroaryl group, except for the aromatic hetero ring which is not monovalent.

According to an exemplary embodiment of the present specification, an organic electroluminescent device includes: a cathode; an anode; a light emitting layer provided between the cathode and the anode; and one or more organic material layers provided between the cathode and the anode, and all of the other organic materials, except for a dopant, among the organic materials included in the one or more organic material layers has a triplet energy ($T_{org}$) of 2.5 eV or more.

According to an exemplary embodiment of the present specification, the other organic materials, except for a dopant, among the organic materials included in the one or more organic material layers can have a triplet energy ($T_{org}$) of 3 eV or less.

Further, an exemplary embodiment of the present specification can provide an organic electroluminescent device in which the other organic materials, except for a dopant, among the organic materials included in the one or more organic material layers have a triplet energy ($T_{org}$) of 2.6 eV or more.

According to an exemplary embodiment of the present specification, three or more of the organic materials having a triplet energy ($T_{org}$) of 2.5 eV or more have a triplet energy ($T_{org}$) of 2.7 eV or more.

According to an exemplary embodiment of the present specification, three of the organic materials having a triplet energy ($T_{org}$) of 2.5 eV or more have a triplet energy ($T_{org}$) of 2.7 eV or more.

According to an exemplary embodiment of the present specification, four of the organic materials having a triplet energy ($T_{org}$) of 2.5 eV or more have a triplet energy ($T_{org}$) of 2.7 eV or more.

According to an exemplary embodiment of the present specification, five of the organic materials having a triplet energy ($T_{org}$) of 2.5 eV or more have a triplet energy ($T_{org}$) of 2.7 eV or more.

According to an exemplary embodiment of the present specification, six of the organic materials having a triplet energy ($T_{org}$) of 2.5 eV or more have a triplet energy ($T_{org}$) of 2.7 eV or more.

According to an exemplary embodiment of the present specification, two or more of the organic materials having a triplet energy ($T_{org}$) of 2.5 eV or more are spiro compounds.

According to an exemplary embodiment of the present specification, at least three of the organic materials having a triplet energy ($T_{org}$) of 2.5 eV or more are spiro compounds.

According to an exemplary embodiment of the present specification, two of the organic materials having a triplet energy ($T_{org}$) of 2.5 eV or more are spiro compounds.

According to an exemplary embodiment of the present specification, three of the organic materials having a triplet energy ($T_{org}$) of 2.5 eV or more are spiro compounds.

According to an exemplary embodiment of the present specification, four of the organic materials having a triplet energy ($T_{org}$) of 2.5 eV or more are spiro compounds.

In the present specification, at least one layer of the one or more organic material layers is a layer each including a host and a dopant, and in the organic material layer including the host and the dopant, the dopant is excluded from the triplet energy condition of the present specification.

In the present specification, the one or more organic material layers include a light emitting layer including a host and a dopant, and a light emitting dopant of the light emitting layer is excluded from the triplet energy condition of the present specification.

In the present specification, the one or more organic material layers include a hole injection layer including a host and a dopant, and a dopant of the hole injection layer is excluded from the triplet energy condition of the present specification.

In the present specification, the one or more organic material layers can include an inorganic material or an organic-inorganic composite, if necessary, but the inorganic material or the organic-inorganic composite is not an organic material, and thus is excluded from the triplet energy condition of the present specification.

Further, an exemplary embodiment of the present specification can provide an organic electroluminescent device having a light emitting spectrum ($\lambda_{max}$) of 500 nm to 550 nm.

In addition, an exemplary embodiment of the present specification can provide an organic electroluminescent device in which the spiro compound is a compound of Formula 1:

Formula 1

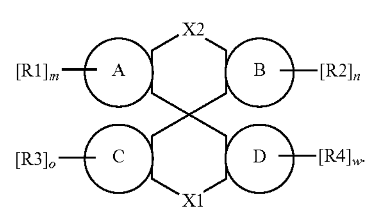

In Formula 1:

Ring A to Ring D are each independently a substituted or unsubstituted aromatic hydrocarbon ring group having 6 to 30 carbon atoms, or a substituted or unsubstituted hetero ring group having 5 to 40 carbon atoms;

X1 and X2 are each independently a direct bond, CRR', NR", O, or S;

at least one of R, R', R", and R1 to R4 is $-(L)_a-(A)_b$, and the remaining one(s) are each independently hydrogen, deuterium, a nitrile group, a nitro group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heterocyclic group, or adjacent groups can be bonded to each other to form a substituted or unsubstituted ring;

R1 to R4 each independently can be bonded to any one of adjacent Ring A to Ring D to form a substituted or unsubstituted ring;

R and R' can be bonded to each other to form a substituted or unsubstituted spiro ring;

L is a direct bond, a substituted or unsubstituted arylene group, or a substituted or unsubstituted monocyclic heteroarylene group including N;

A is a nitrile group, a substituted or unsubstituted silyl group, a substituted or unsubstituted phosphine oxide group, a substituted or unsubstituted amine group, a substituted or unsubstituted aryl group, or a substituted or unsubstituted heterocyclic group;

a and b are each an integer from 1 to 2;

m, n, o, and w are each independently an integer from 0 to 4;

the sum of m, n, o, and w is 1 or more;

when a and b are each 2, the substituents in the parenthesis are the same as or different from each other; and when m, n, o, and w are each 2 or more, the substituents in the parenthesis are the same as or different from each other.

Furthermore, an exemplary embodiment of the present specification can provide an organic electroluminescent device in which the spiro compound is any one of the following Formulae 2 to 9:

Formula 2

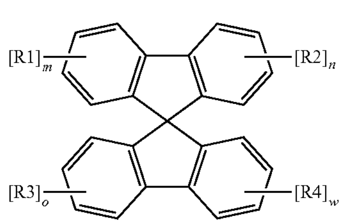

-continued

Formula 3

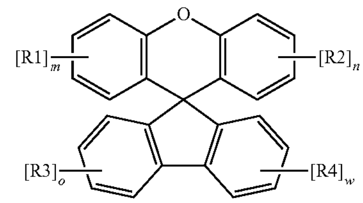

Formula 4

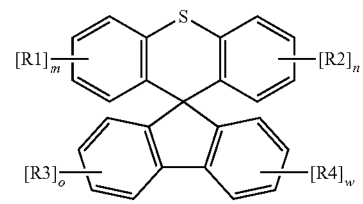

Formula 5

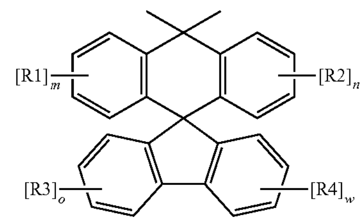

Formula 6

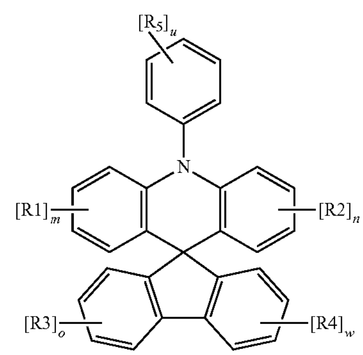

Formula 7

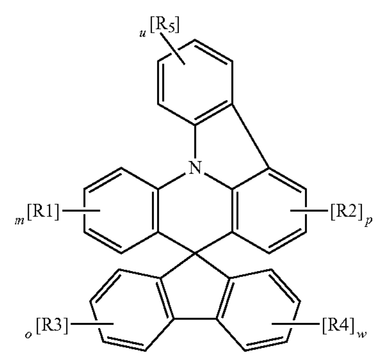

Formula 8

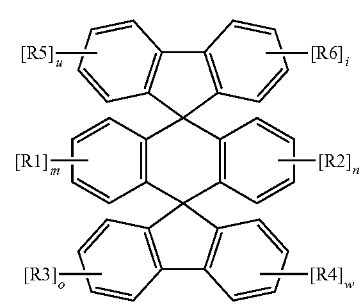

-continued

Formula 9

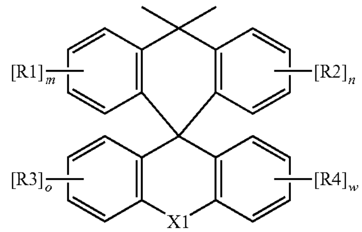

In Formulae 2 to 9:

X1 is CRR', NR", O, or S;

at least one of R, R', R", and R1 to R6 is $-(L)_a-(A)_b$, and the remaining one(s) are each independently hydrogen, deuterium, a nitrile group, a nitro group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heterocyclic group;

L is a direct bond, a substituted or unsubstituted arylene group, or a substituted or unsubstituted monocyclic heteroarylene group including N;

A is a nitrile group, a substituted or unsubstituted silyl group, a substituted or unsubstituted phosphine oxide group, a substituted or unsubstituted amine group, a substituted or unsubstituted aryl group, or a substituted or unsubstituted heterocyclic group;

a and b are each an integer from 1 to 2;

m, n, o, w, u, and i are each independently an integer from 0 to 4;

p is an integer from 0 to 3;

when a and b are each 2, the substituents in the parenthesis are the same as or different from each other; and when m, n, o, p, w, u, and i are each 2 or more, the substituents in the parenthesis are the same as or different from each other.

According to an exemplary embodiment of the present specification, Ring A to Ring D are each independently a substituted or unsubstituted aromatic hydrocarbon ring having 6 to 30 carbon atoms.

According to an exemplary embodiment of the present specification, Ring A to Ring D are each independently an aromatic hydrocarbon ring having 6 to 20 carbon atoms.

According to an exemplary embodiment of the present specification, Ring A to Ring D are each independently a benzene ring or a naphthalene ring.

According to an exemplary embodiment of the present specification, Ring A to Ring D are a benzene ring.

According to an exemplary embodiment of the present specification, X1 is a direct bond.

According to an exemplary embodiment of the present specification, X1 is CRR', and R and R' are each an alkyl group or an aryl group, or can be bonded to each other to form a substituted or unsubstituted ring.

According to an exemplary embodiment of the present specification, X1 is CRR', and R and R' are each a methyl group or a phenyl group, or can be bonded to each other to form a substituted or unsubstituted fluorene ring.

According to an exemplary embodiment of the present specification, X1 is NR", and R" is $-(L)_a-(A)_b$, or a substituted or unsubstituted aryl group, or can be bonded to an adjacent group to form a substituted or unsubstituted ring.

According to an exemplary embodiment of the present specification, X1 is O.

According to an exemplary embodiment of the present specification, X1 is S.

According to an exemplary embodiment of the present specification, X2 is a direct bond.

According to an exemplary embodiment of the present specification, X2 is CRR', and R and R' are each an alkyl group or an aryl group, or can be bonded to each other to form a substituted or unsubstituted ring.

According to an exemplary embodiment of the present specification, X2 is CRR', and R and R' are each a methyl group or a phenyl group, or can be bonded to each other to form a substituted or unsubstituted fluorene ring.

According to an exemplary embodiment of the present specification, X2 is NR", and R" is $-(L)_a-(A)_b$, or a substituted or unsubstituted aryl group, or can be bonded to an adjacent group to form a substituted or unsubstituted ring.

According to an exemplary embodiment of the present specification, X2 is O.

According to an exemplary embodiment of the present specification, X2 is S.

According to an exemplary embodiment of the present specification, in Formula 1, at least one of R, R', R", and R1 to R4 is $-(L)_a-(A)_b$.

According to an exemplary embodiment of the present specification, in Formula 1, at least one of R1 to R4 is $-(L)_a-(A)_b$, and the remaining one(s) are hydrogen.

According to an exemplary embodiment of the present specification, in Formula 1, any one of R1 to R4 is $-(L)_a-(A)_b$, and the remaining one(s) are hydrogen.

According to an exemplary embodiment of the present specification, in Formulae 2 to 9, at least one of R, R', R", and R1 to R6 is $-(L)_a-(A)_b$.

According to an exemplary embodiment of the present specification, in Formulae 2 to 9, at least one of R1 to R6 is $-(L)_a-(A)_b$, and the remaining one(s) are hydrogen.

According to an exemplary embodiment of the present specification, in Formulae 2 to 9, at least one of R1 to R6 is $-(L)_a-(A)_b$, and the remaining one(s) are hydrogen.

According to an exemplary embodiment of the present specification, L is a direct bond, a substituted or unsubstituted arylene group, or a substituted or unsubstituted monocyclic heteroarylene group including N.

According to an exemplary embodiment of the present specification, L is a direct bond, a substituted or unsubstituted arylene group having 6 to 30 carbon atoms, or a substituted or unsubstituted monocyclic heteroarylene group including N.

According to an exemplary embodiment of the present specification, L is a direct bond, a substituted or unsubstituted phenylene group, a substituted or unsubstituted biphenylene group, a substituted or unsubstituted terphenylene group, a substituted or unsubstituted naphthalenylene group, a substituted or unsubstituted divalent fluorene group, a substituted or unsubstituted divalent triazine group, a substituted or unsubstituted divalent pyrimidine group, or a substituted or unsubstituted divalent pyridine group.

According to an exemplary embodiment of the present specification, A is a nitrile group, a substituted or unsubstituted silyl group, a substituted or unsubstituted phosphine oxide group, a substituted or unsubstituted amine group, a substituted or unsubstituted aryl group, or a substituted or unsubstituted heterocyclic group.

According to an exemplary embodiment of the present specification, a is 1.

According to an exemplary embodiment of the present specification, a is 2.

According to an exemplary embodiment of the present specification, b is 1.

According to an exemplary embodiment of the present specification, b is 2.

According to an exemplary embodiment of the present specification, in Formula 1, m, n, o, and w are each independently an integer from 0 to 4, and the sum of m, n, o, and w is 1 or more.

According to an exemplary embodiment of the present specification, in Formula 1, m, n, o, and w are each independently an integer from 0 to 4, and the sum of m, n, o, and w is 1.

According to an exemplary embodiment of the present specification, in Formula 1, m, n, o, and w are each independently an integer from 0 to 4, and the sum of m, n, o, and w is 2.

According to an exemplary embodiment of the present specification, in Formulae 2 to 9, the sum of m, n, o, p, w, u, and i is 1 or more.

According to an exemplary embodiment of the present specification, in Formulae 2 to 9, m, n, o, w, u, and i are each independently an integer from 0 to 4, p is an integer from 0 to 3, and the sum of m, n, o, p, w, u, and i is 1 or more.

According to an exemplary embodiment of the present specification, in Formulae 2 to 9, m, n, o, w, u, and i are each independently an integer from 0 to 4, p is an integer from 0 to 3, and the sum of m, n, o, p, w, u, and i is 1.

According to an exemplary embodiment of the present specification, in Formulae 2 to 9, m, n, o, w, u, and i are each independently an integer from 0 to 4, p is an integer from 0 to 3, and the sum of m, n, o, p, w, u, and i is 2.

Further, according to an exemplary embodiment of the present specification, the spiro compound is any one compound selected from the following compounds:

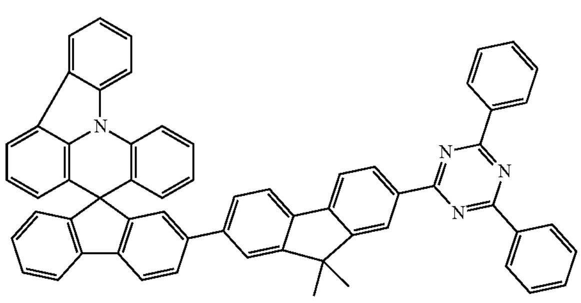

-continued

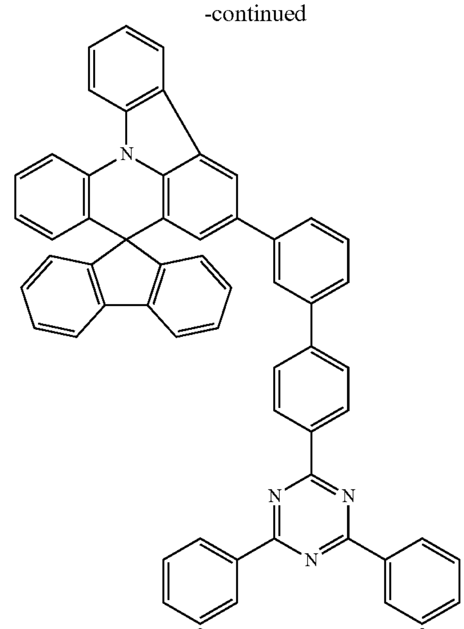

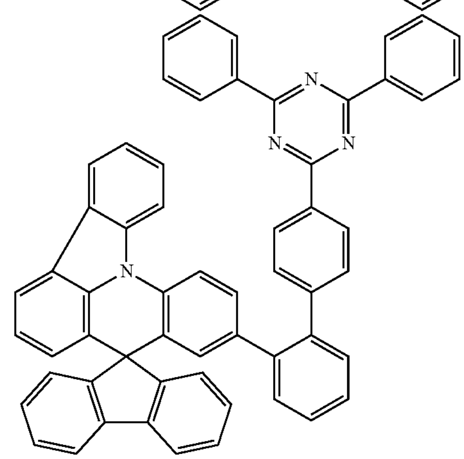

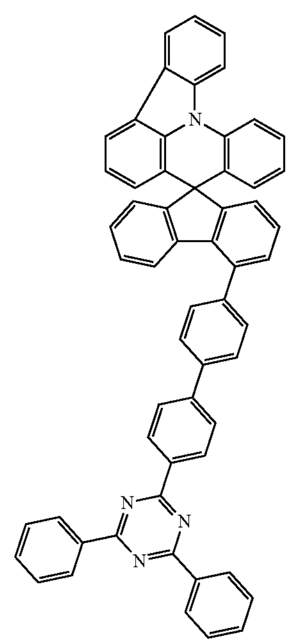

-continued
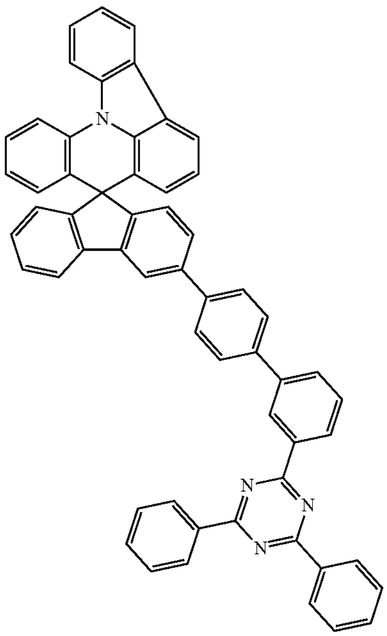
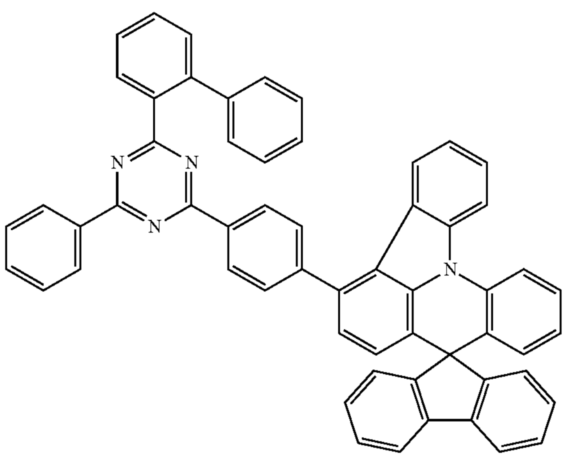
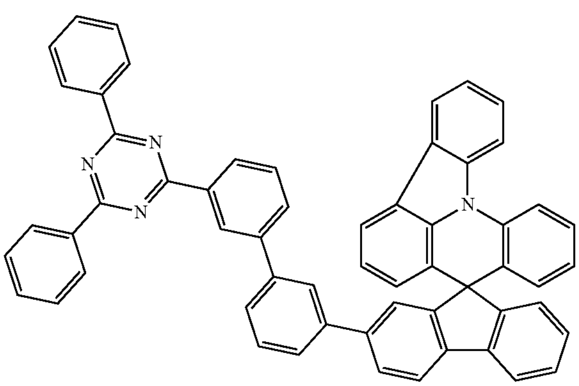
-continued
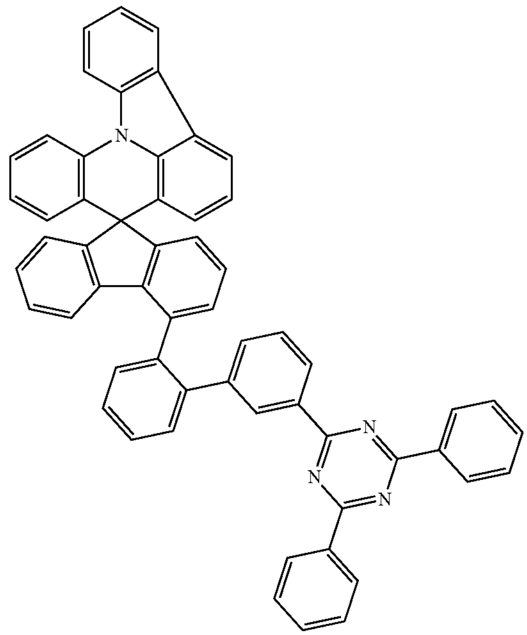
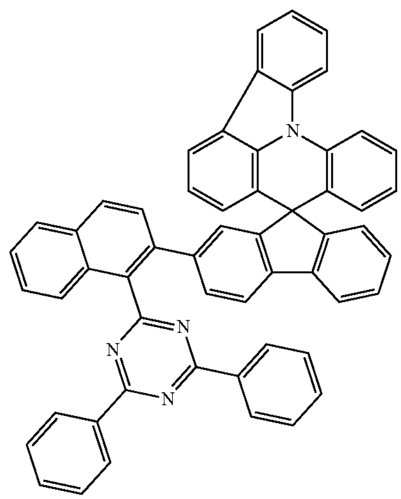
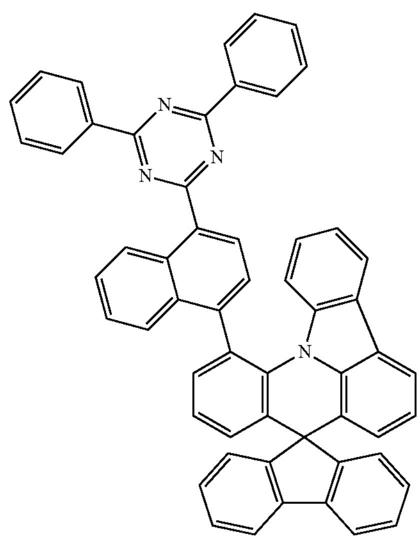

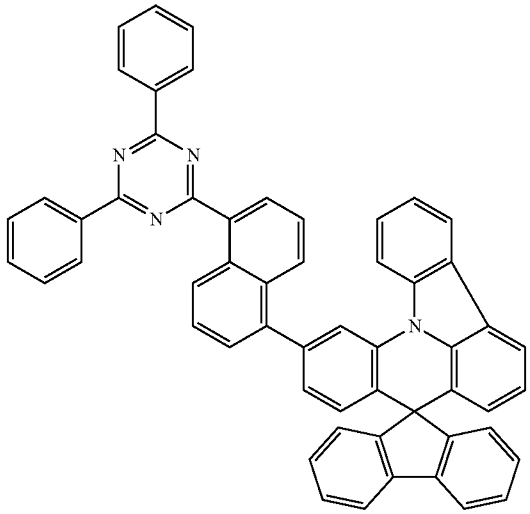
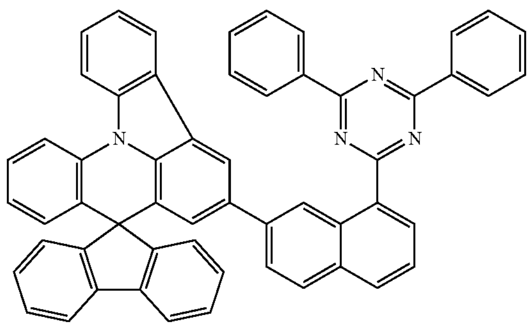
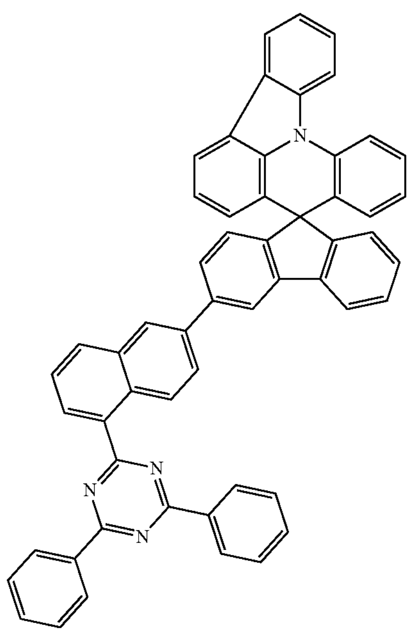
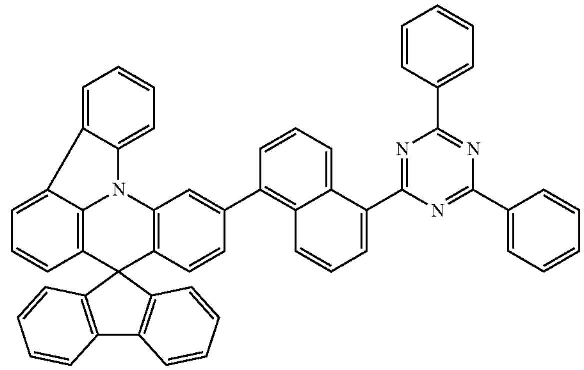
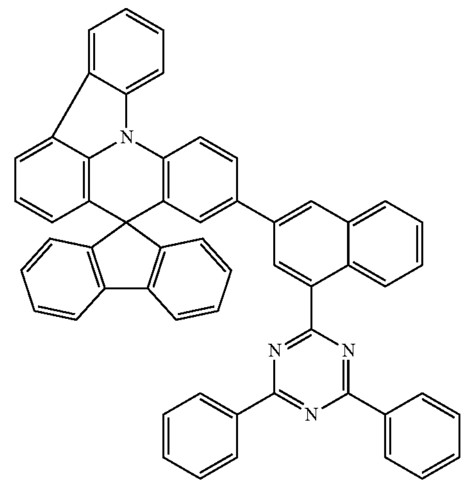
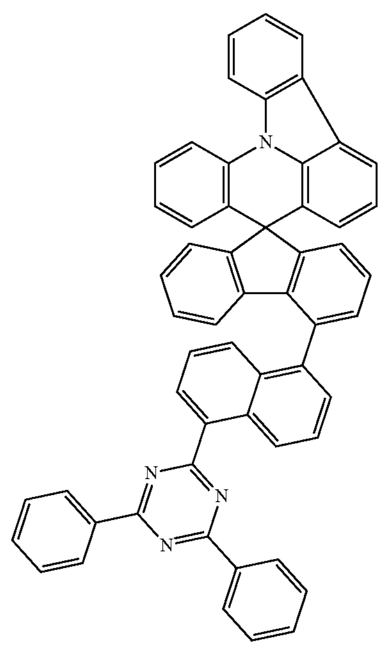

-continued
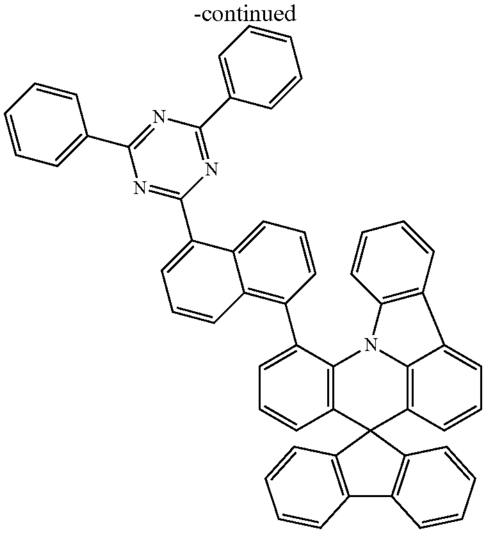
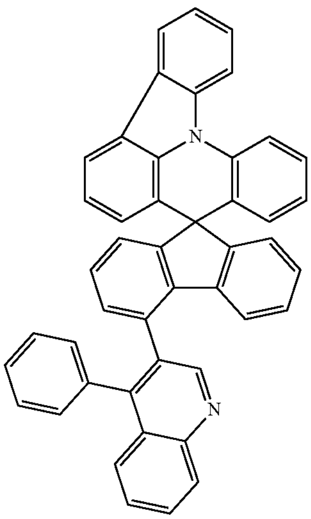
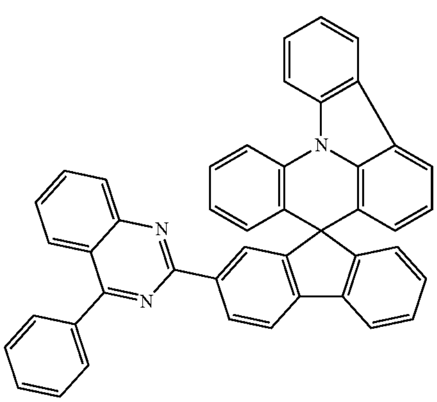
-continued
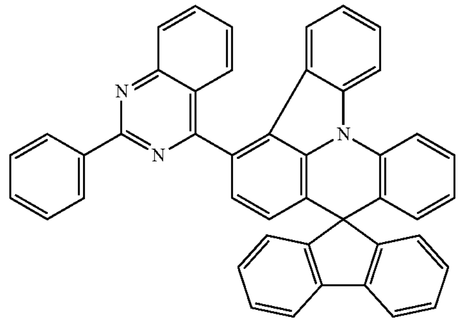
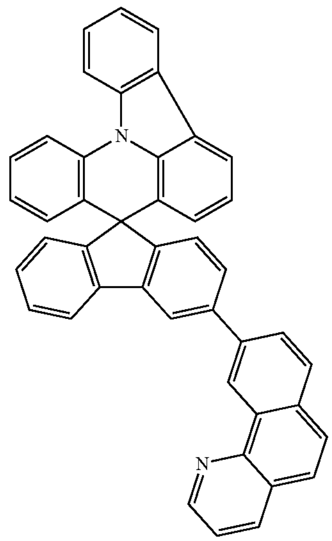
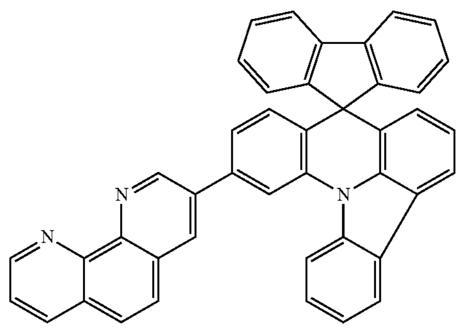
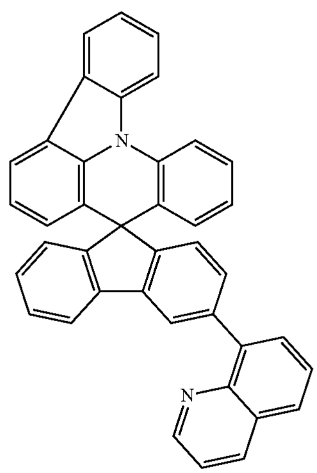

-continued
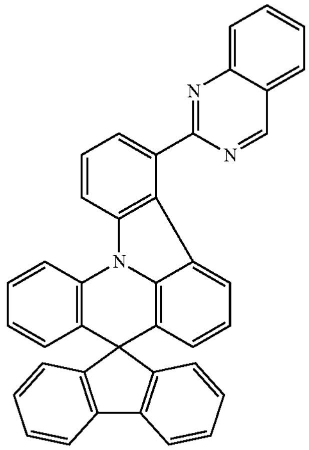
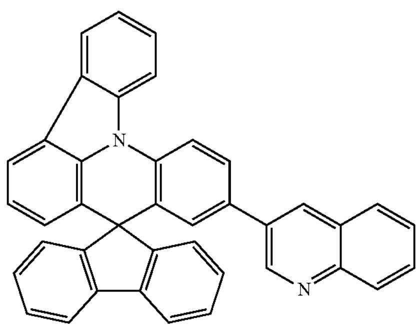
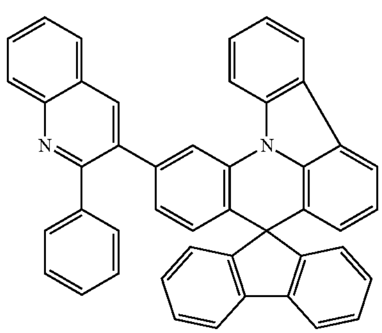
-continued
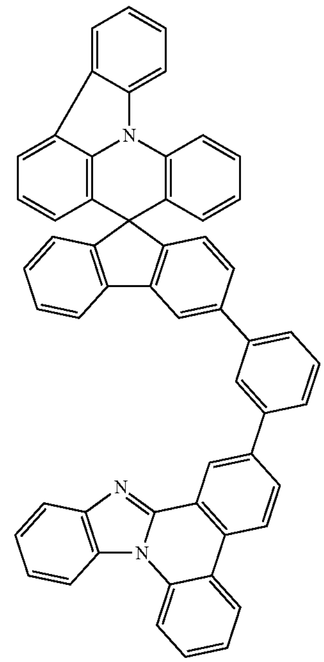
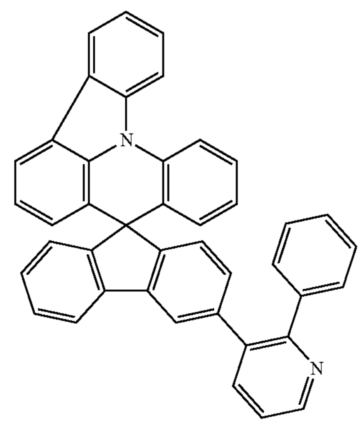
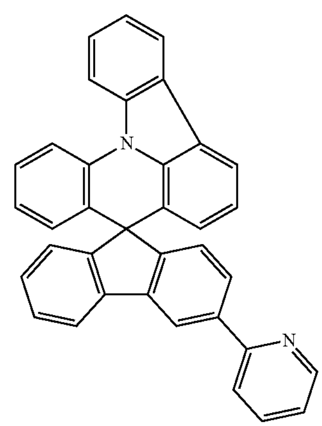

-continued
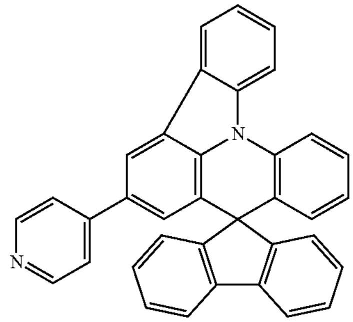
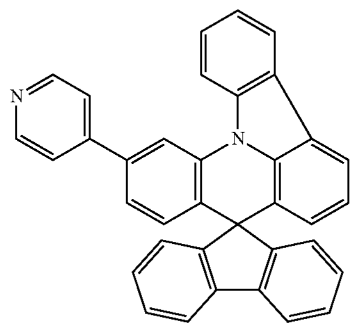
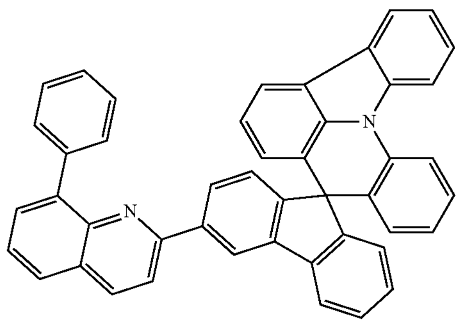
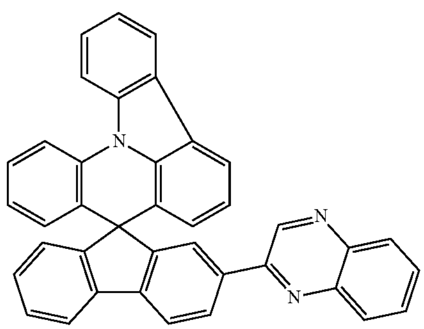
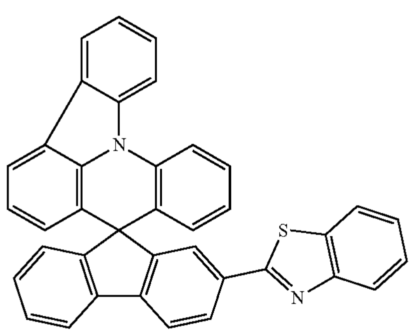
-continued
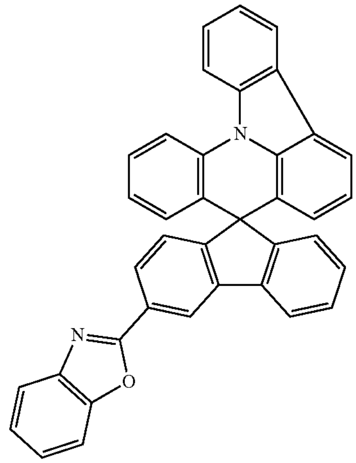
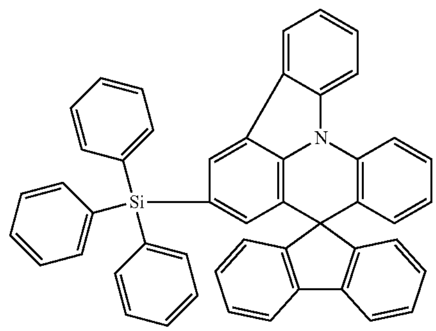
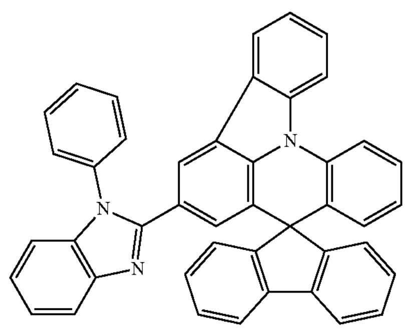
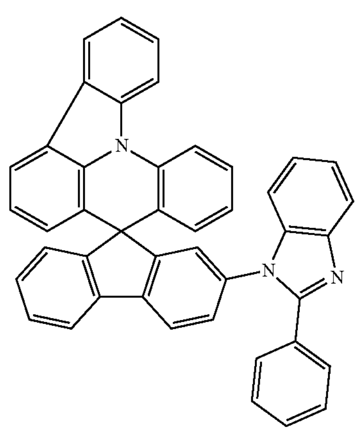

-continued
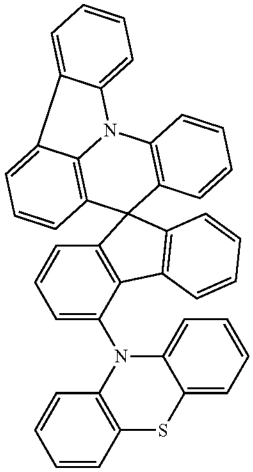
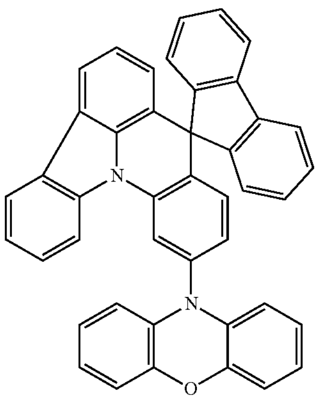
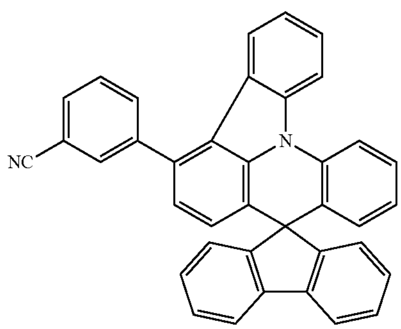
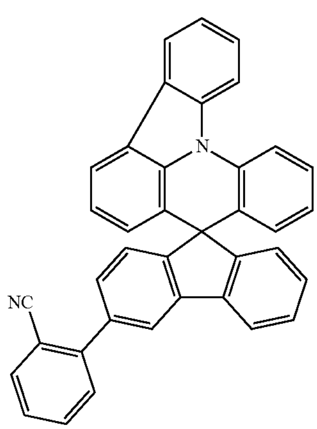
-continued
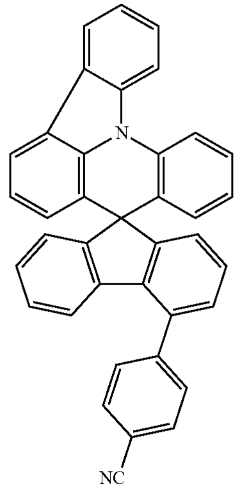
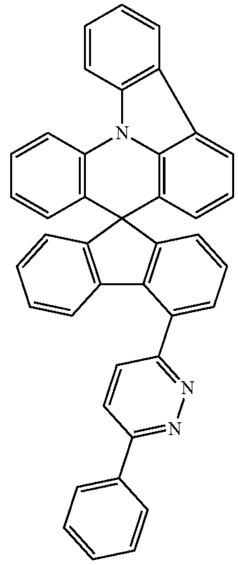
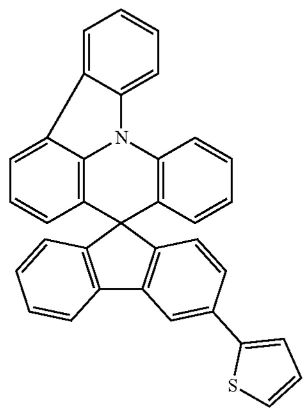
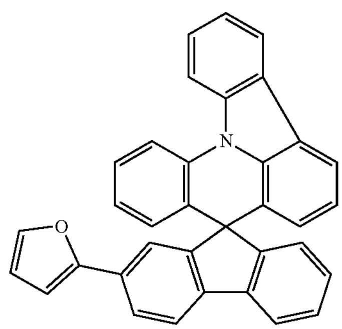
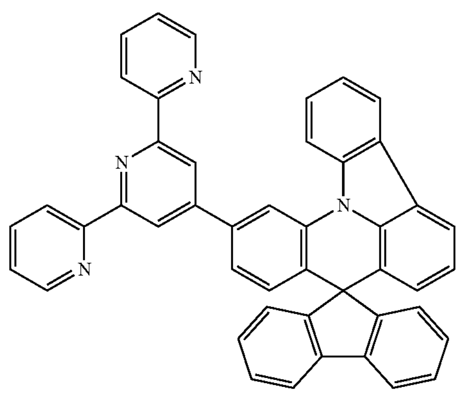

-continued
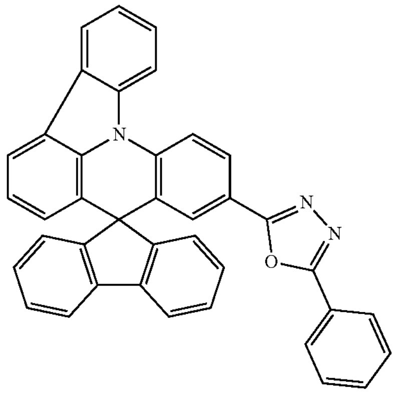
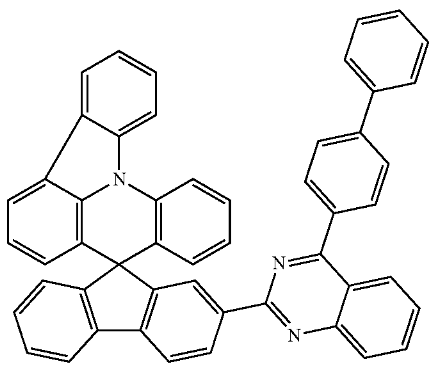
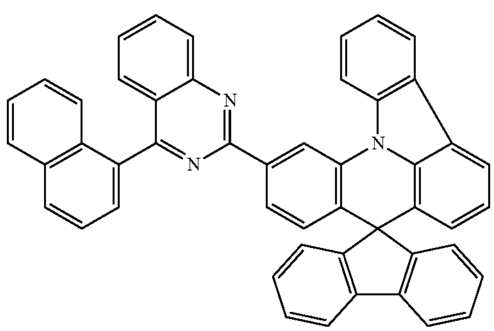
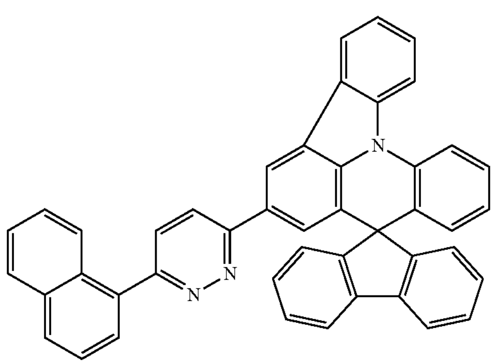
-continued
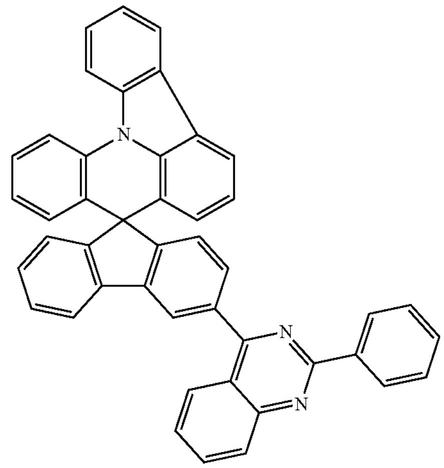
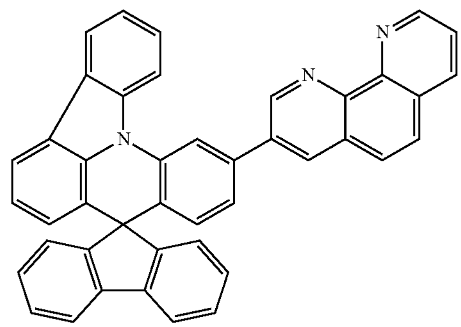
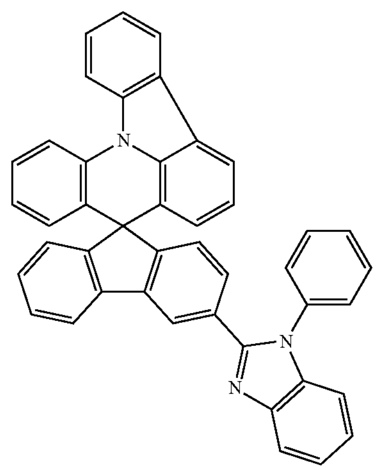
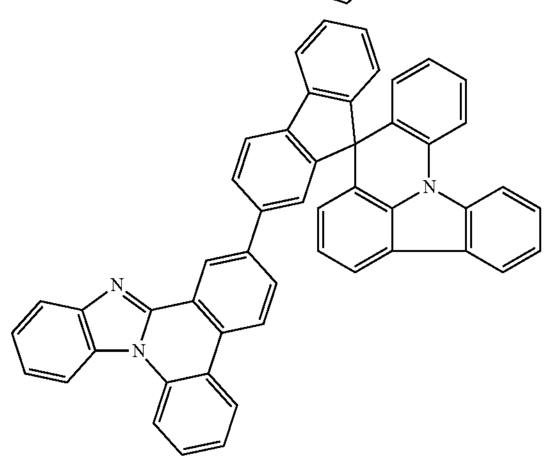

-continued
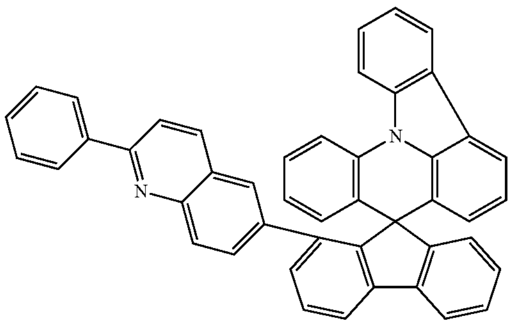
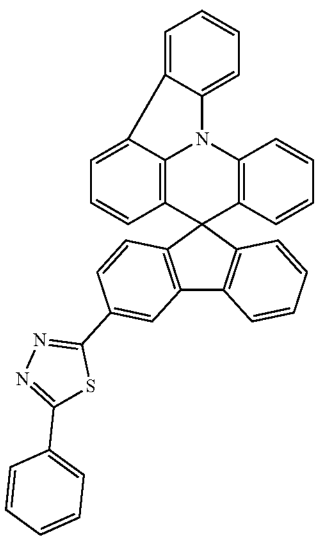
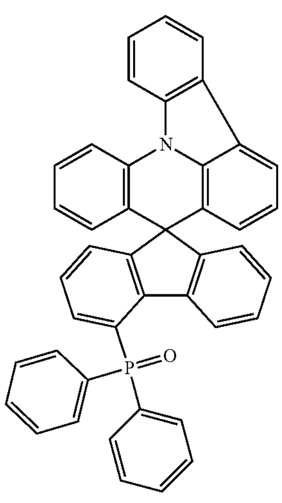
-continued
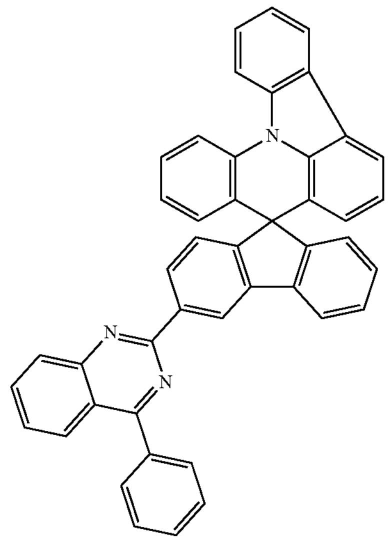
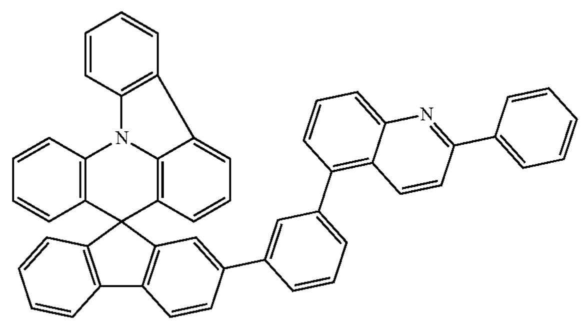
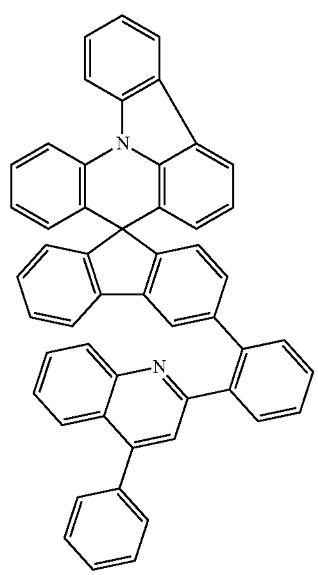

-continued
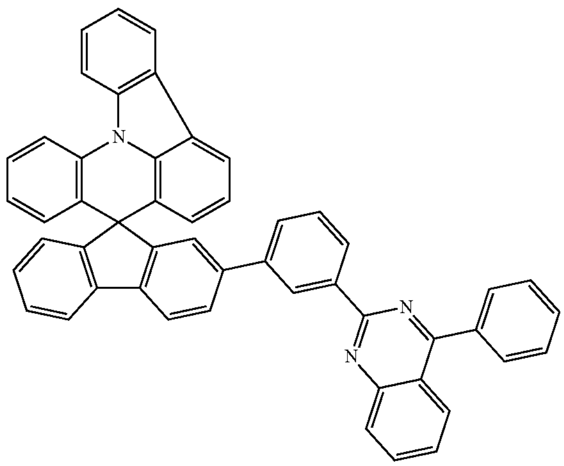
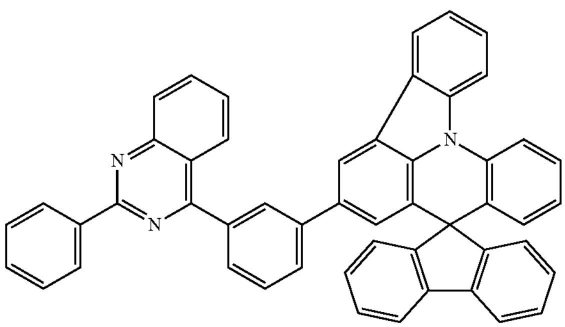
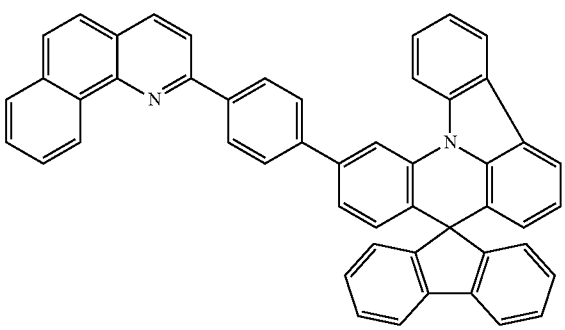
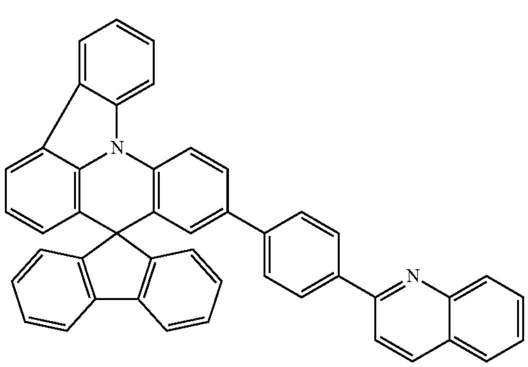
-continued
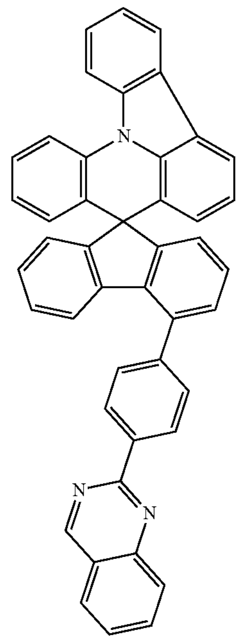
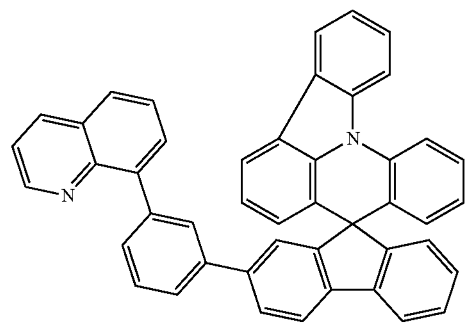
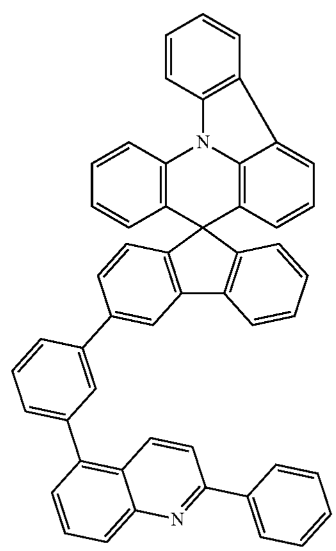

-continued
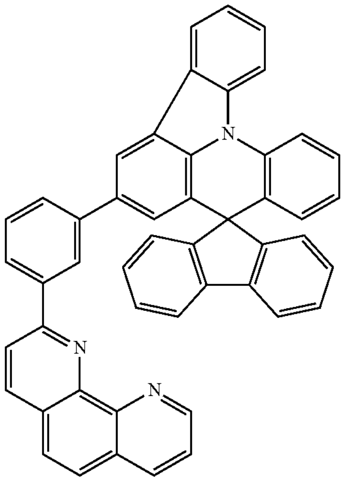
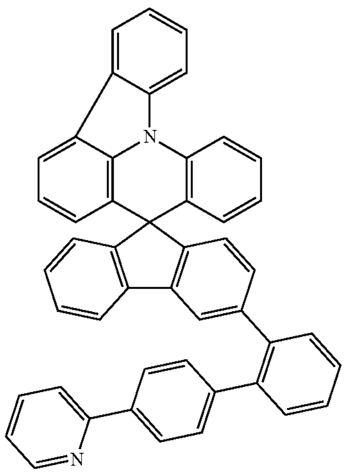
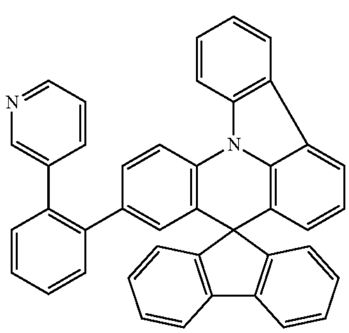
-continued
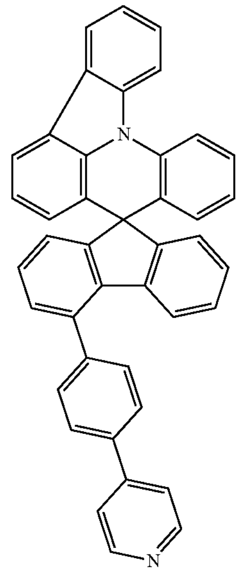
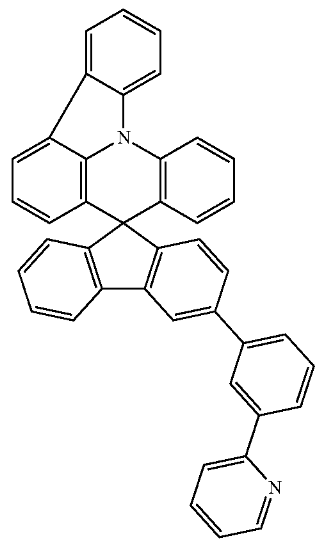
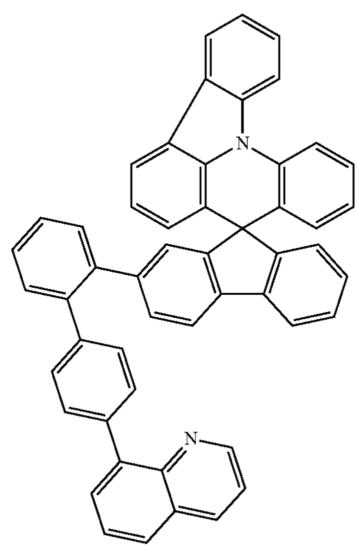

-continued
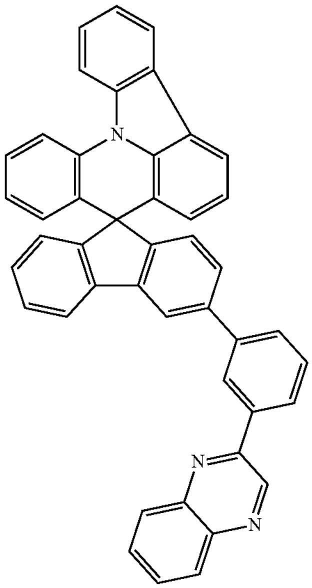
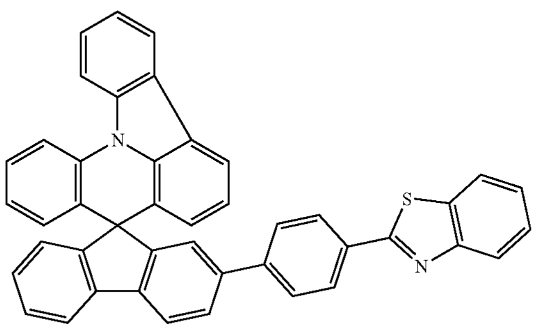
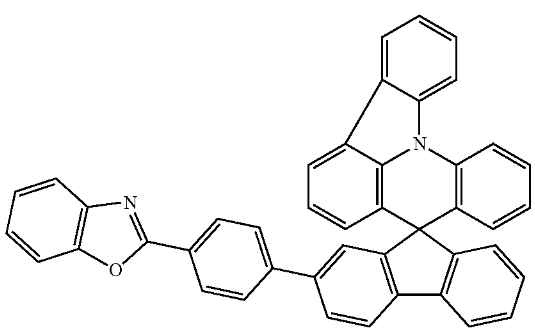
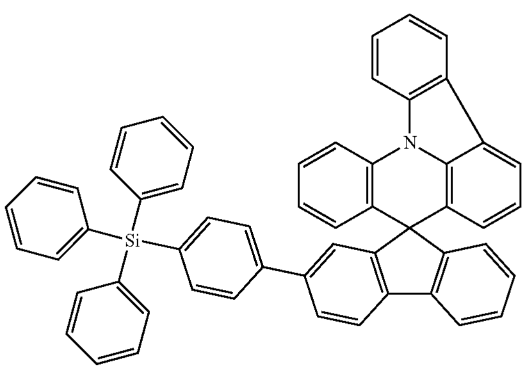
-continued
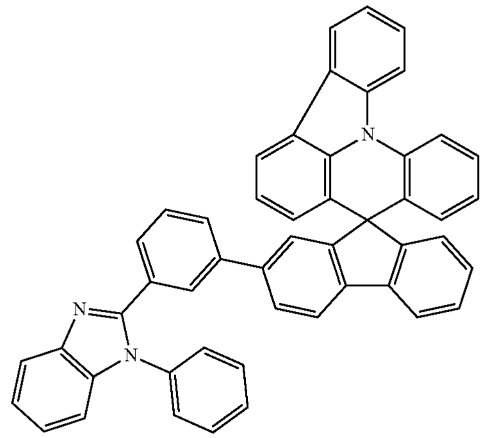
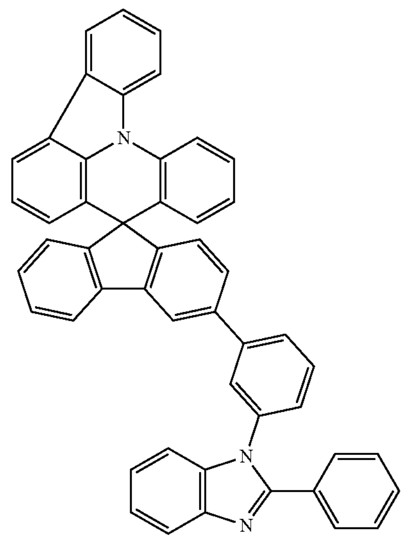
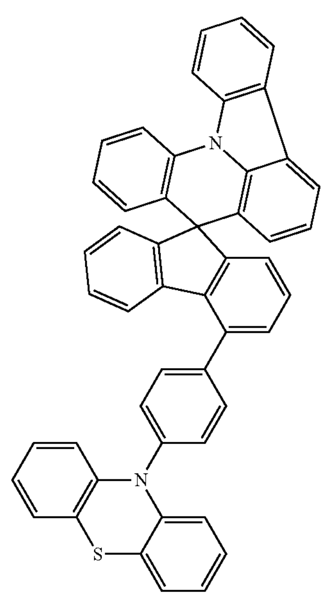

-continued
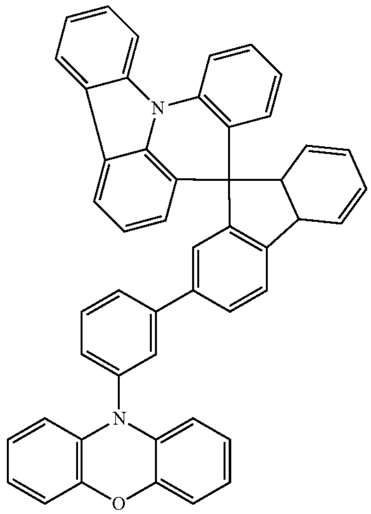
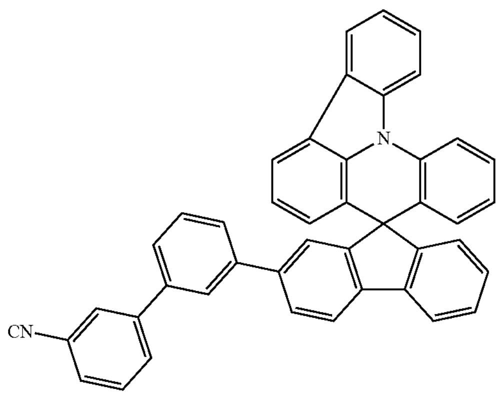
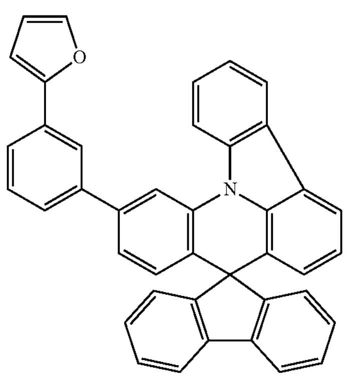
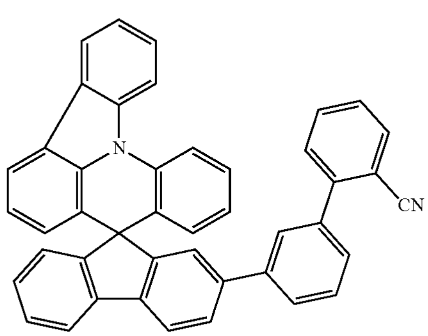
-continued
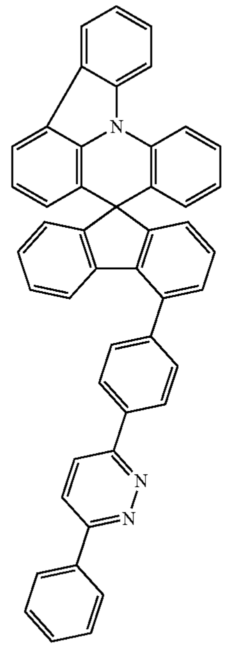
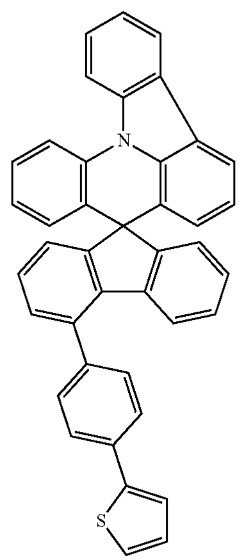
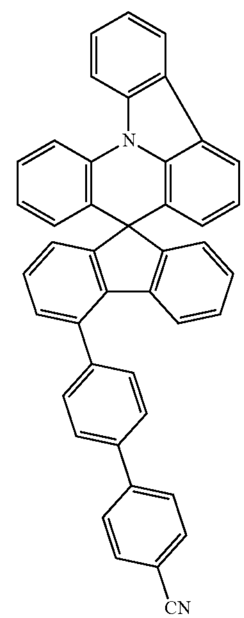
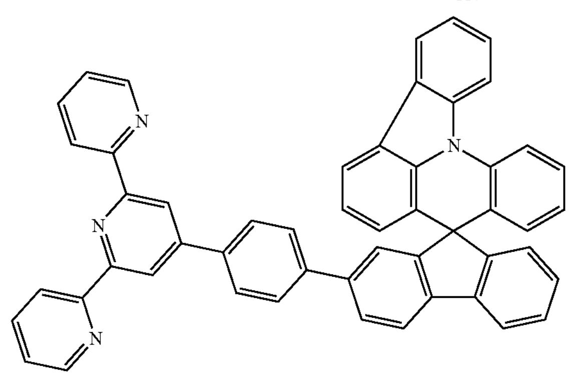

-continued
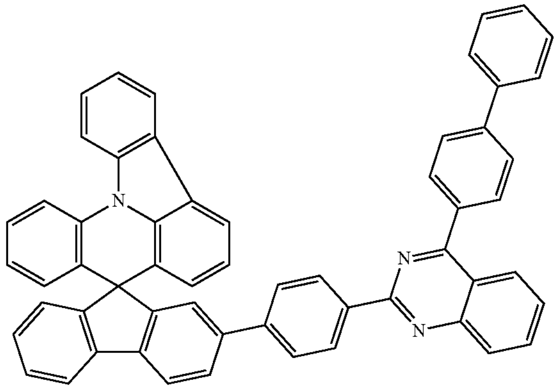
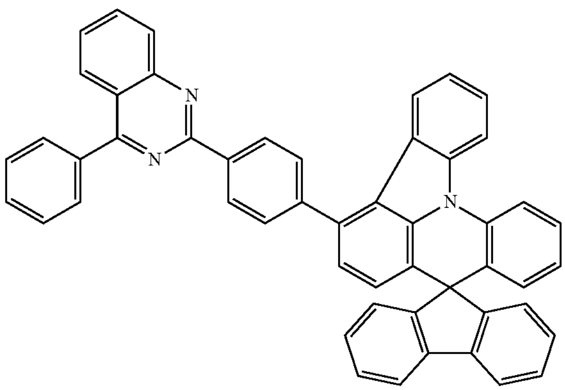
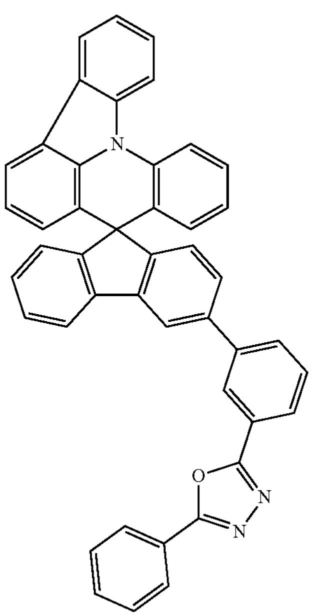
-continued
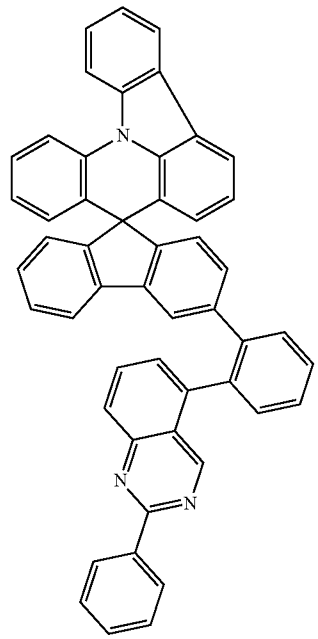
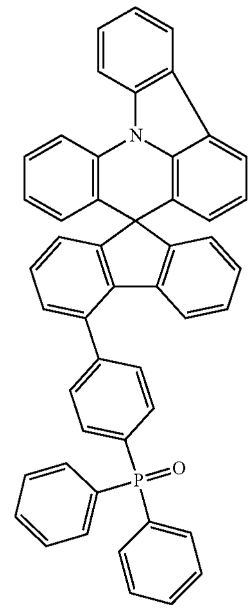
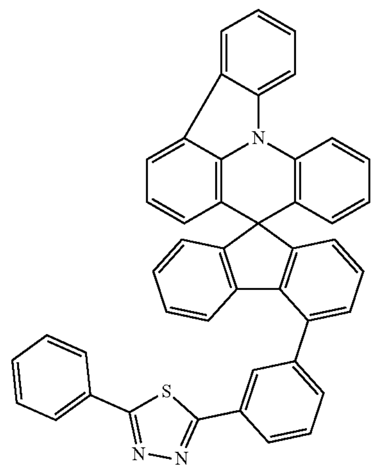
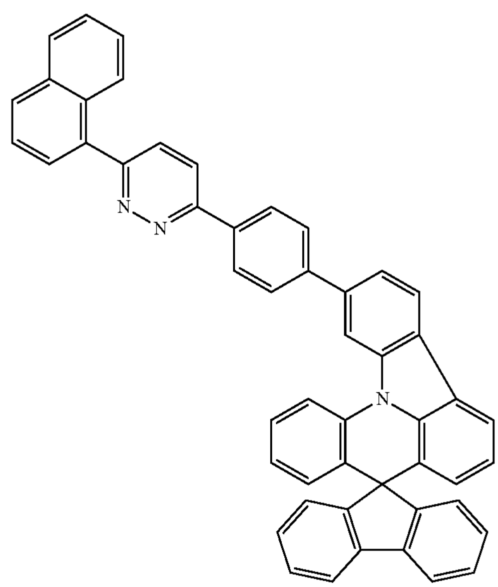

-continued
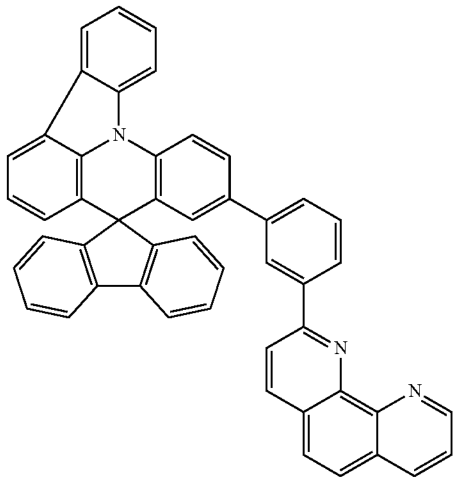
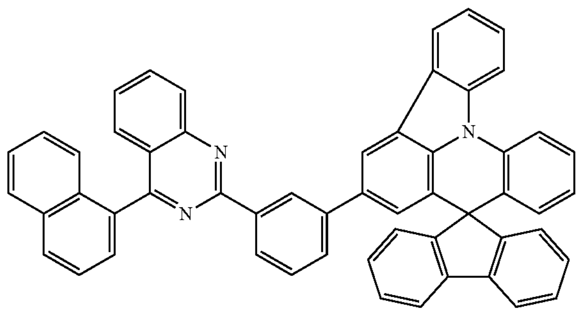
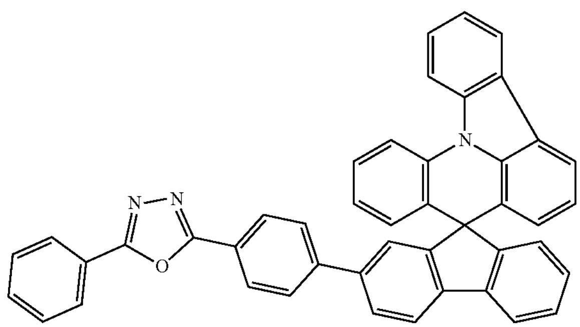
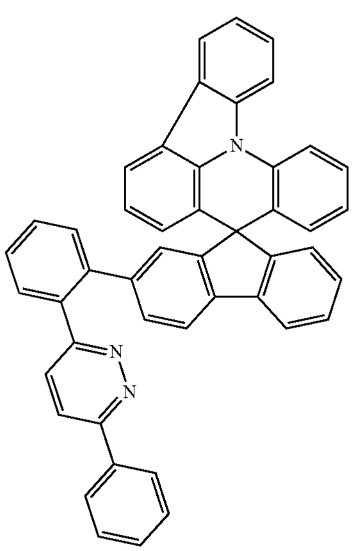
-continued
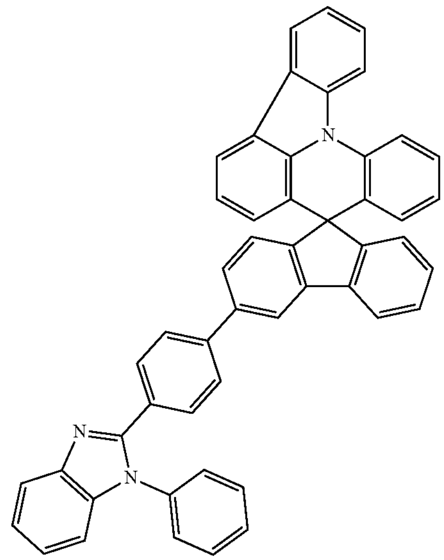
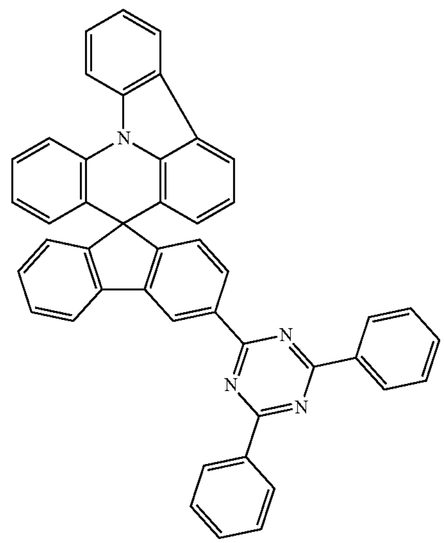
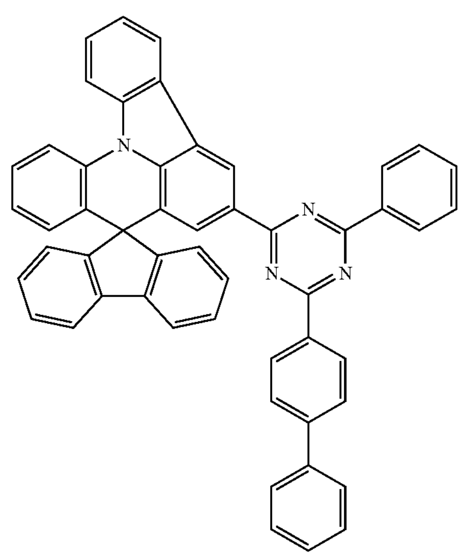

-continued
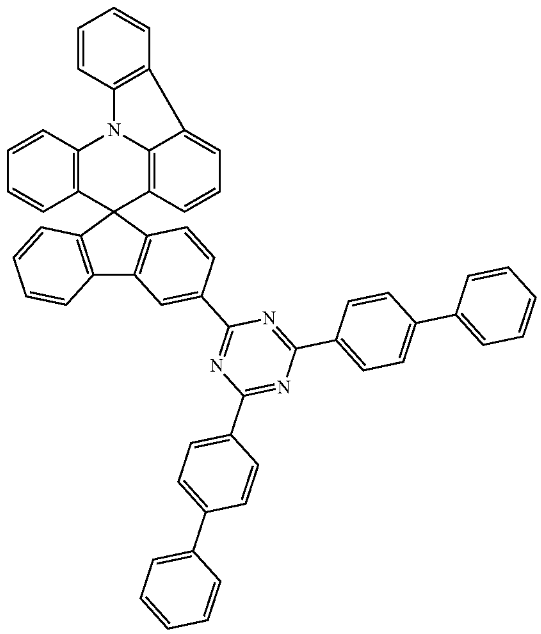
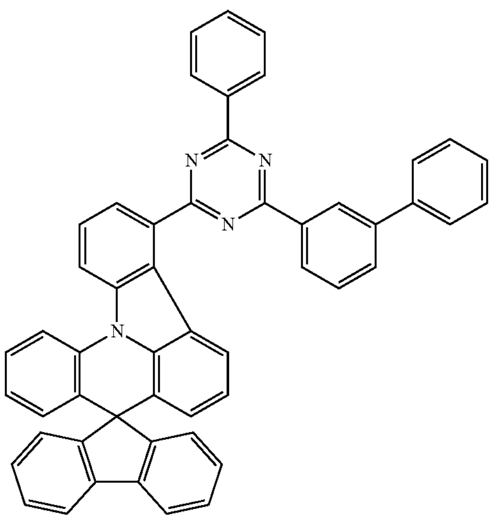
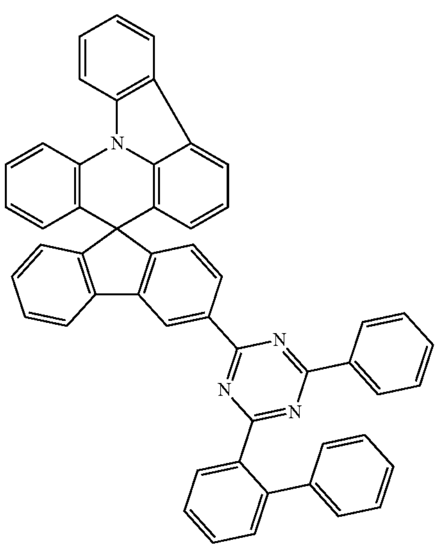
-continued
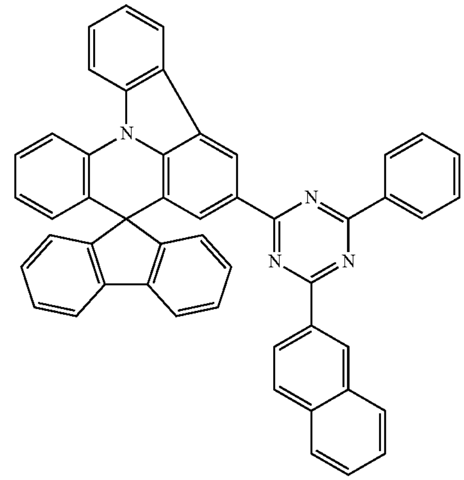
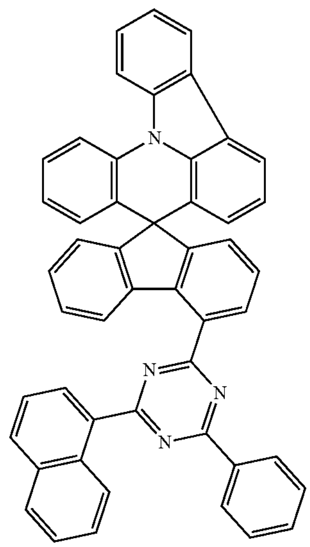
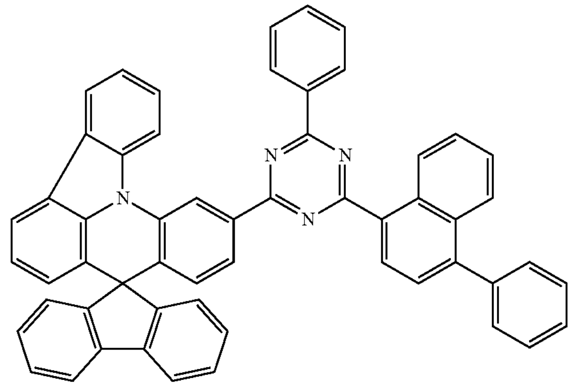

-continued
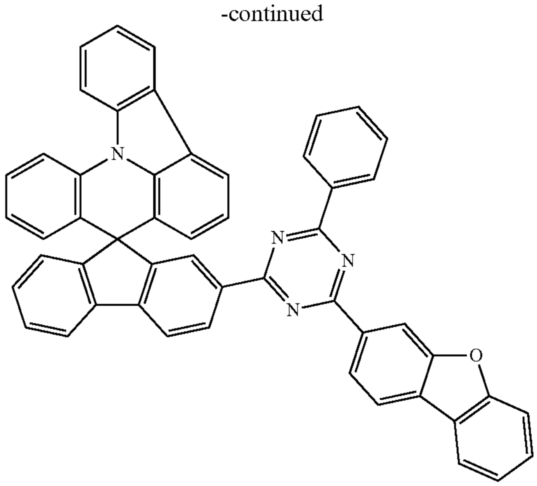
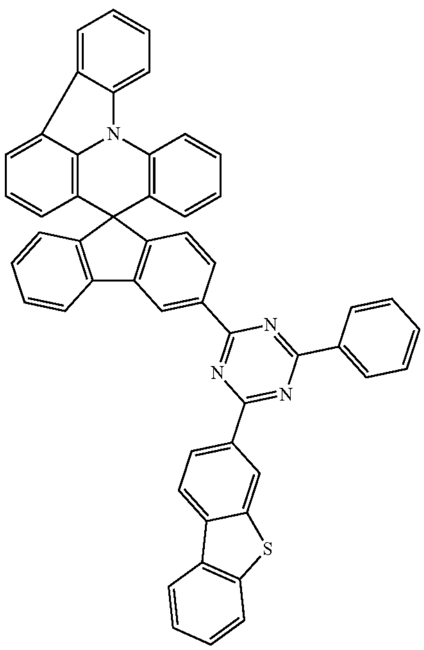
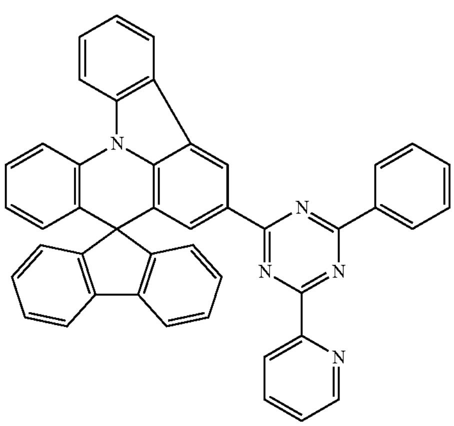
-continued
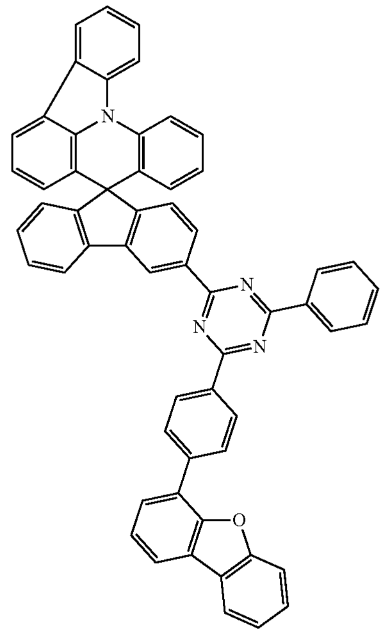
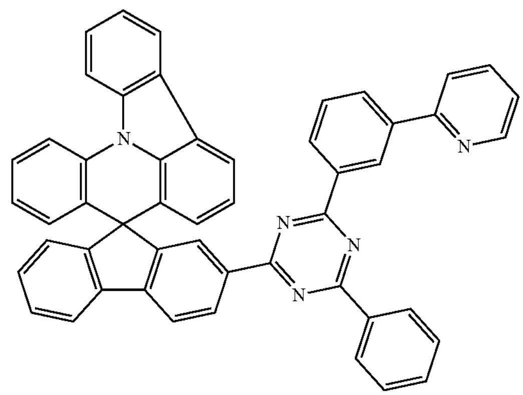
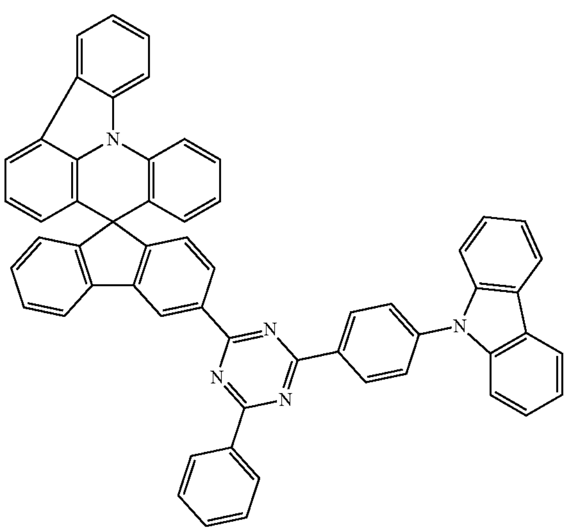

-continued
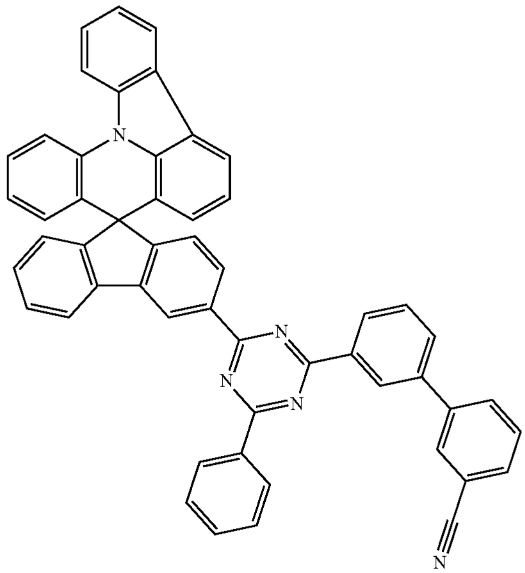
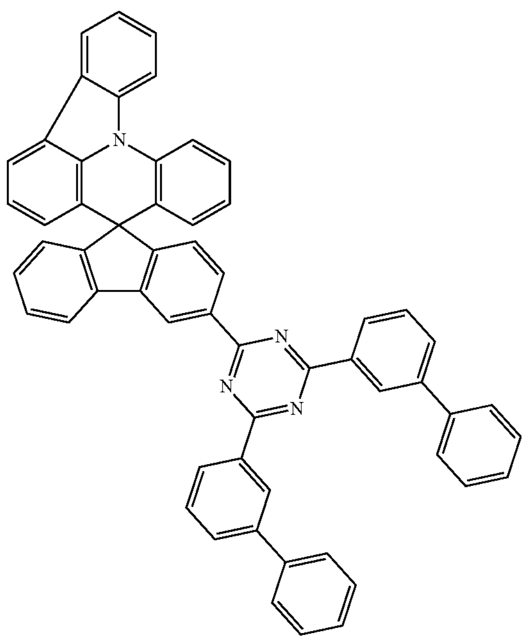
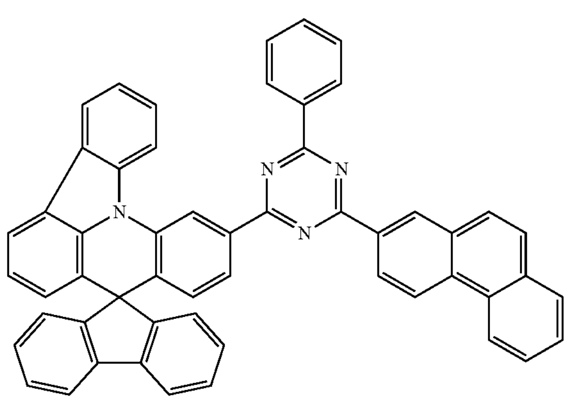
-continued
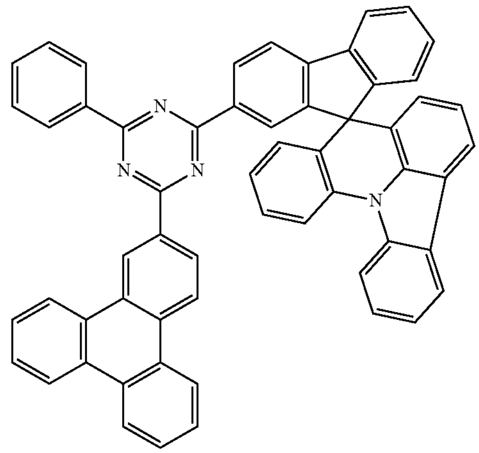
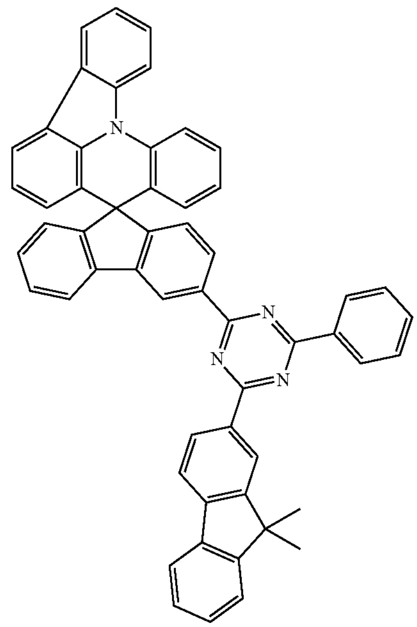
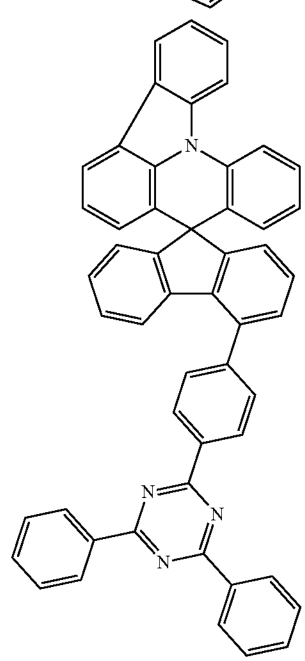

-continued
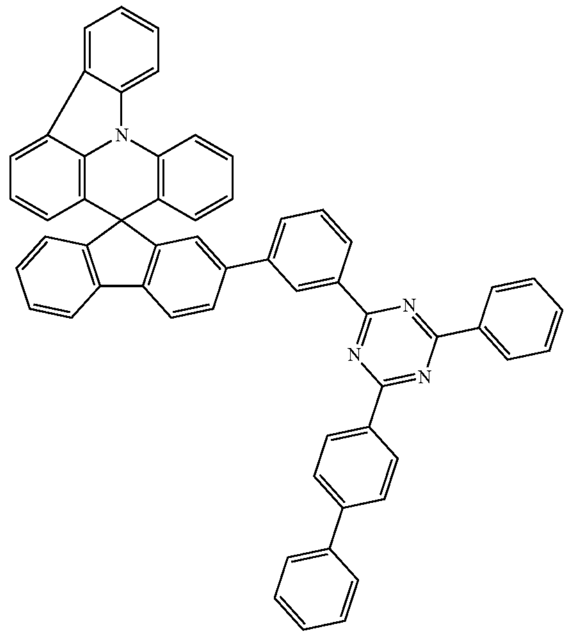
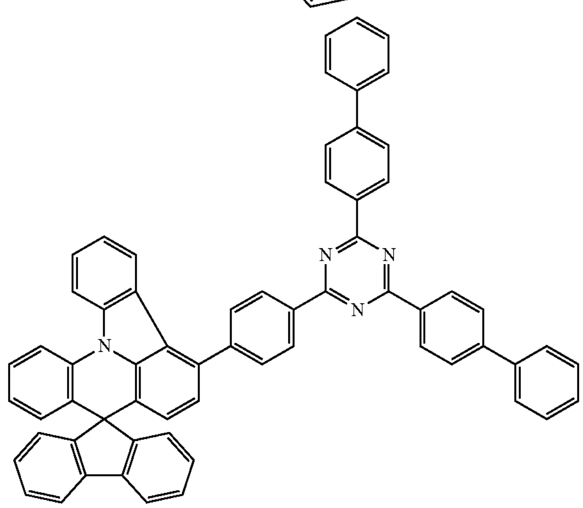
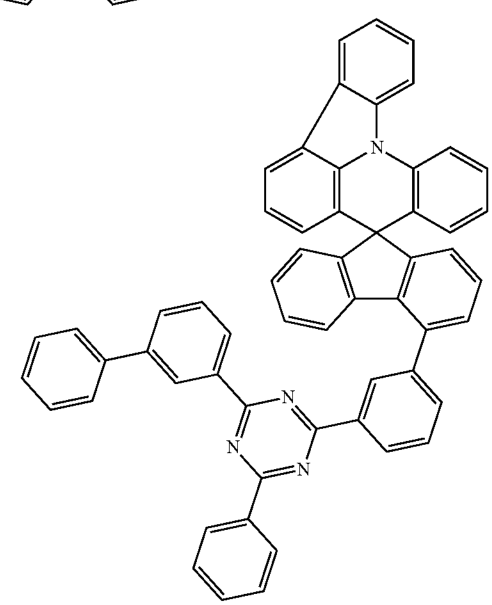
-continued
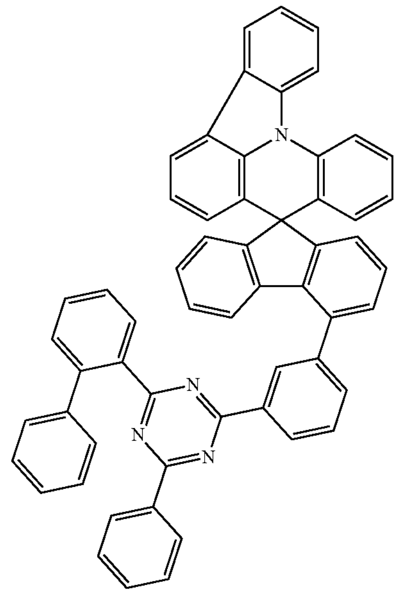
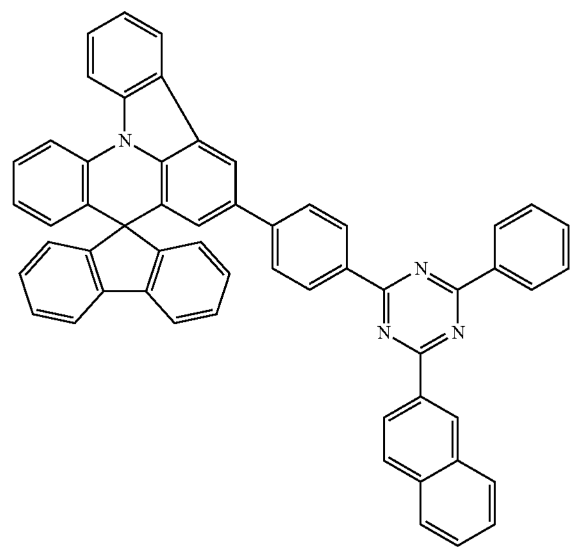
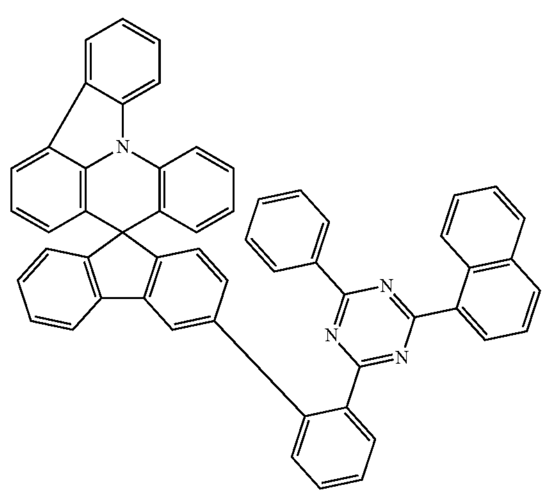

-continued
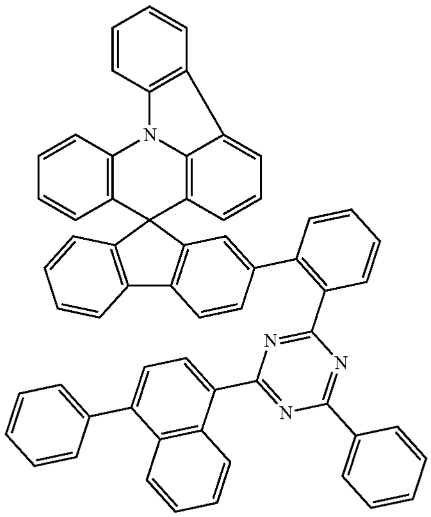
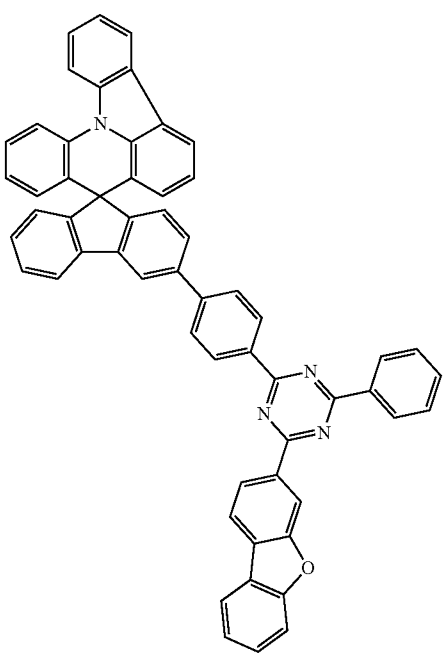
-continued
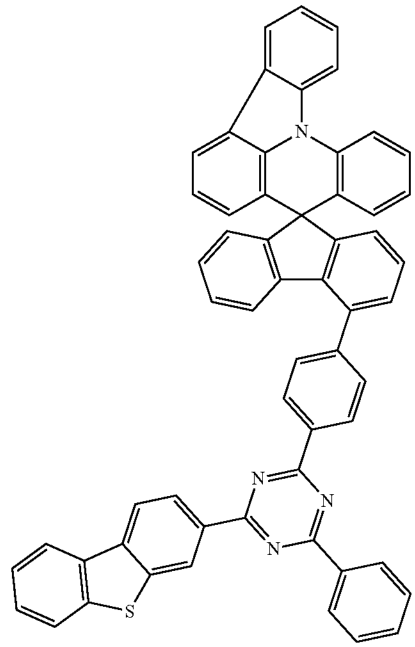
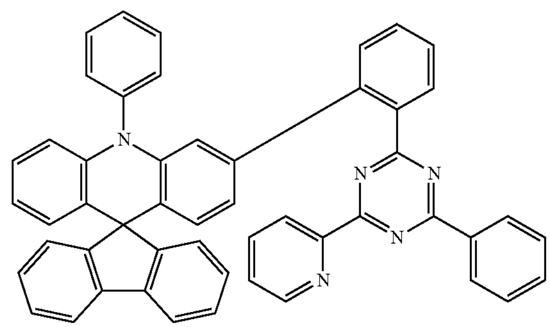
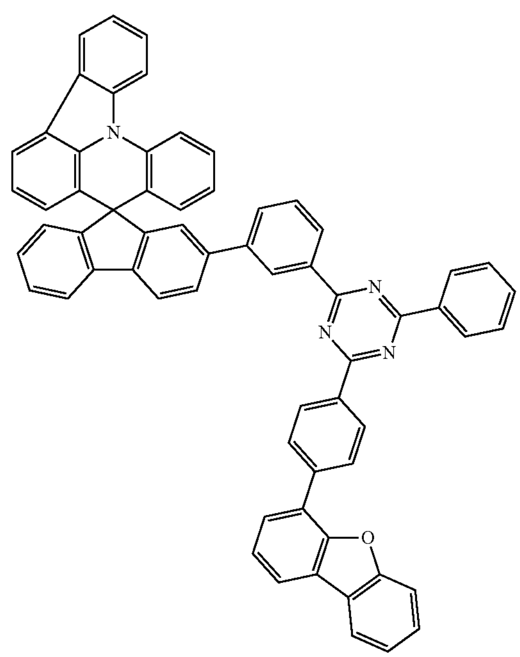

-continued
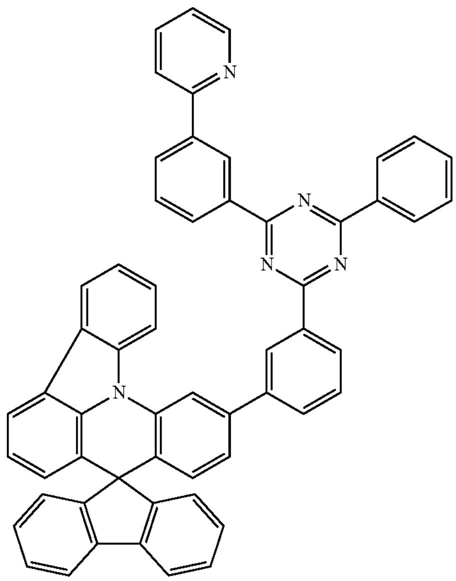
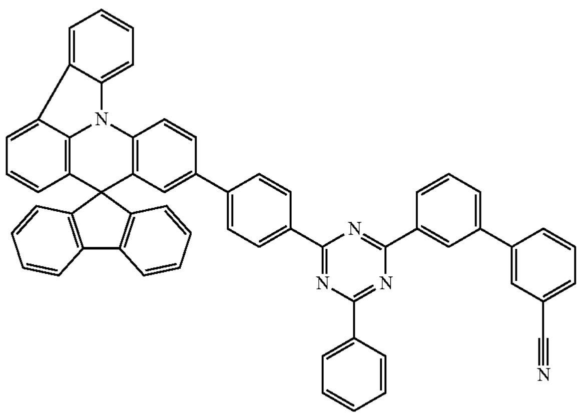
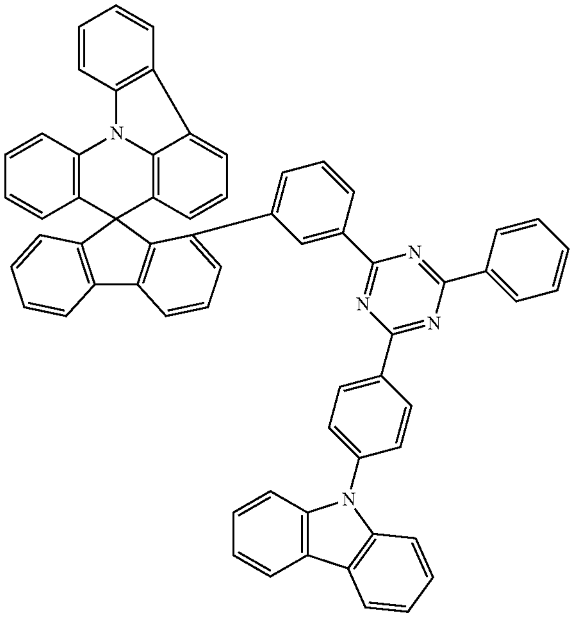
-continued
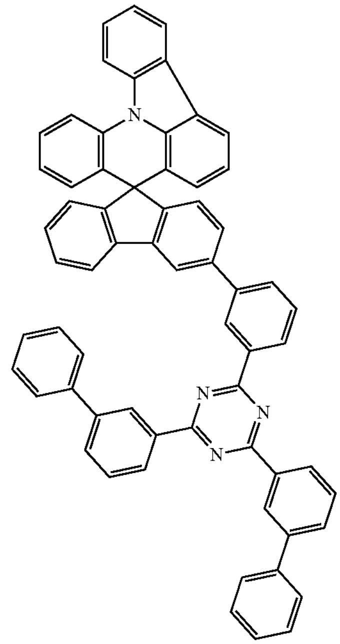
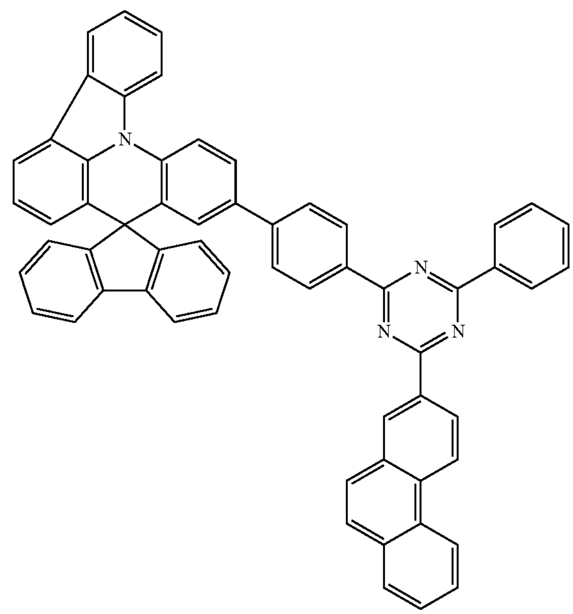
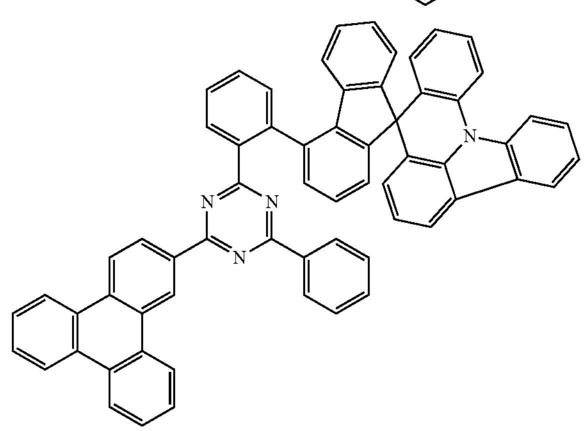

-continued
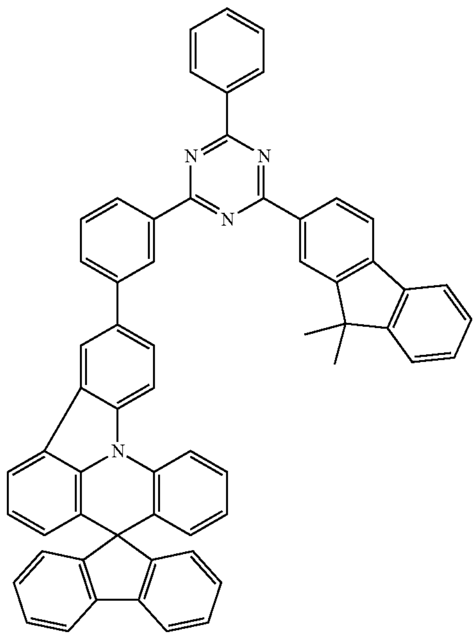
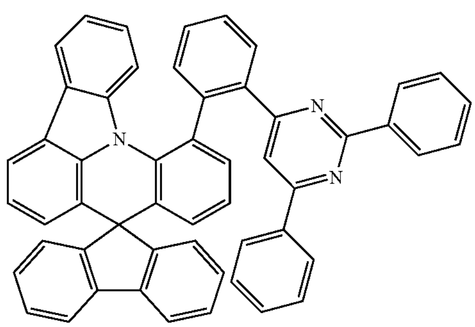
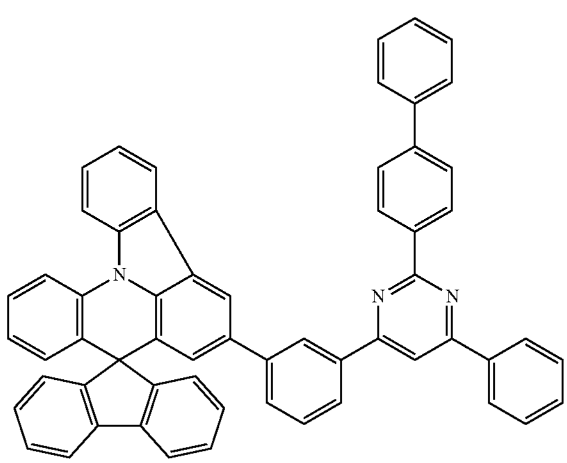
-continued
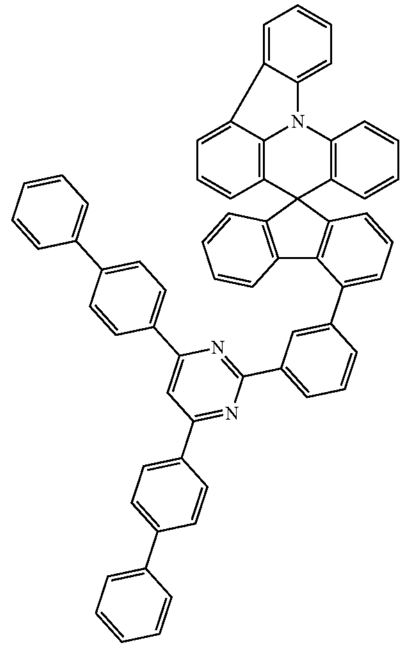
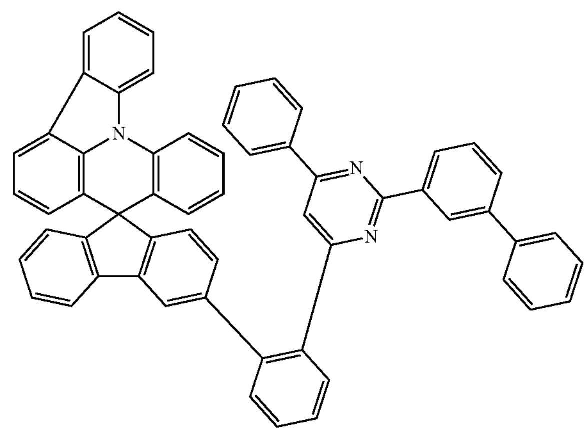
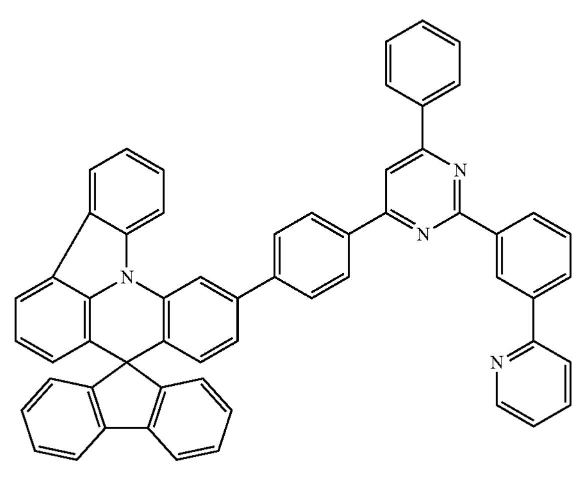

-continued
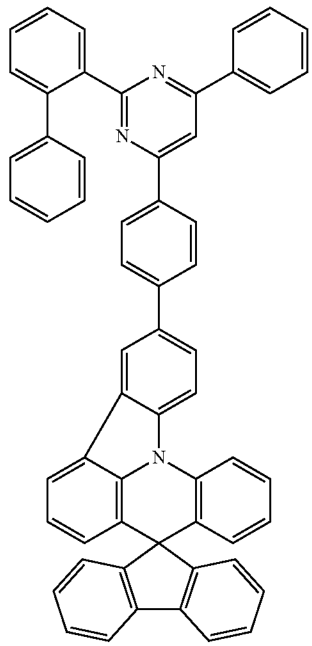
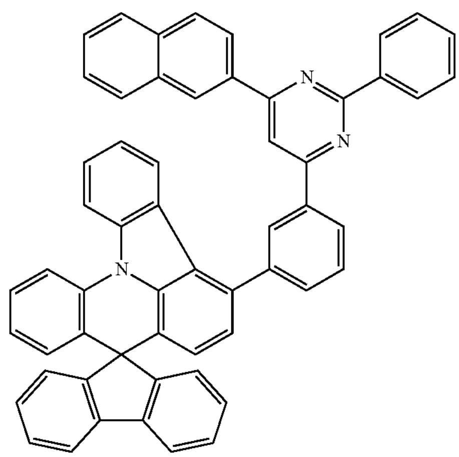
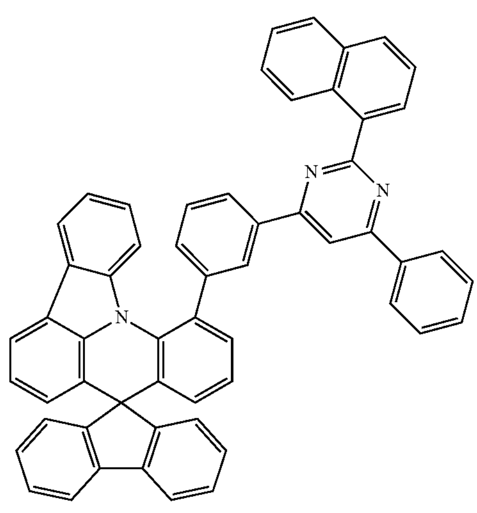
-continued
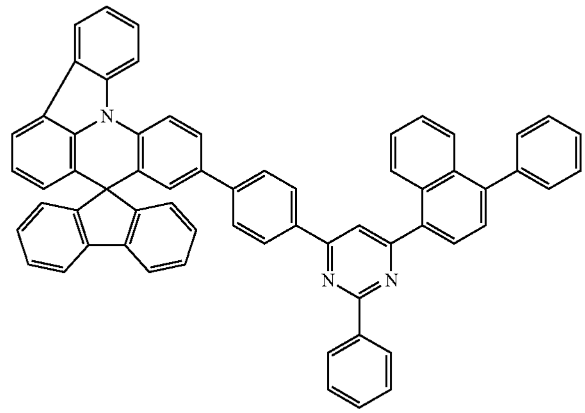
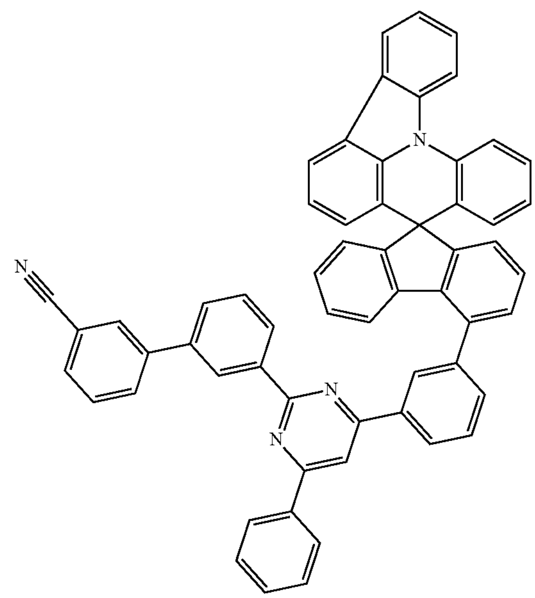
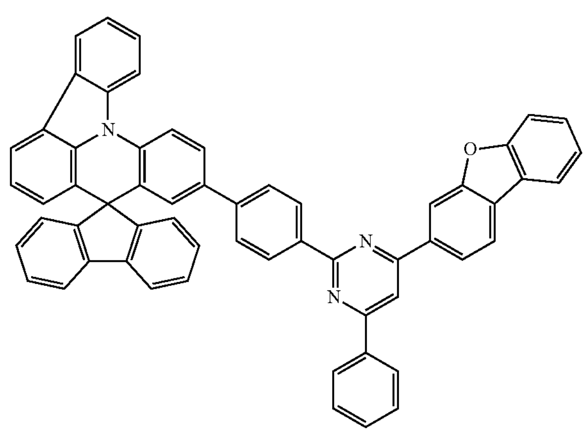

-continued
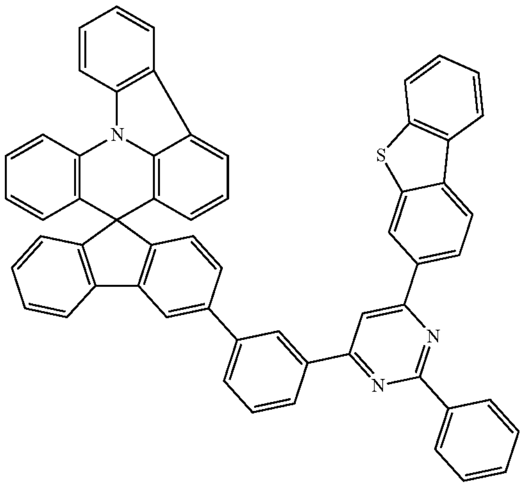
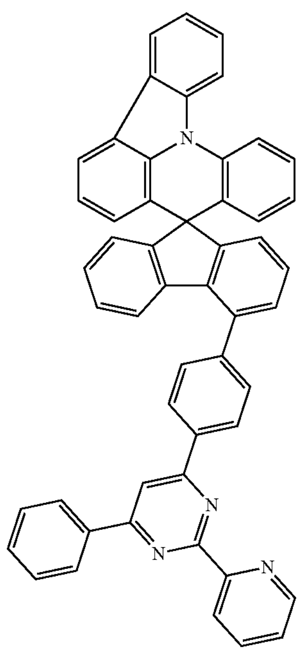
-continued
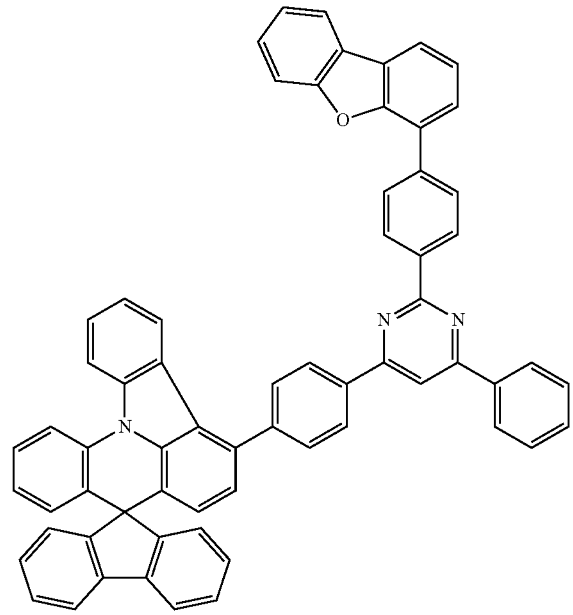
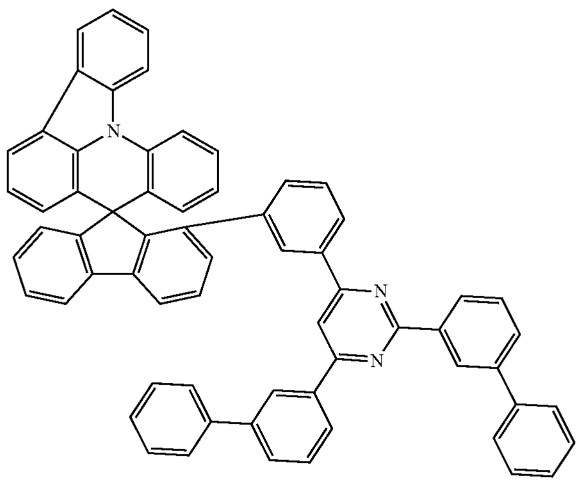
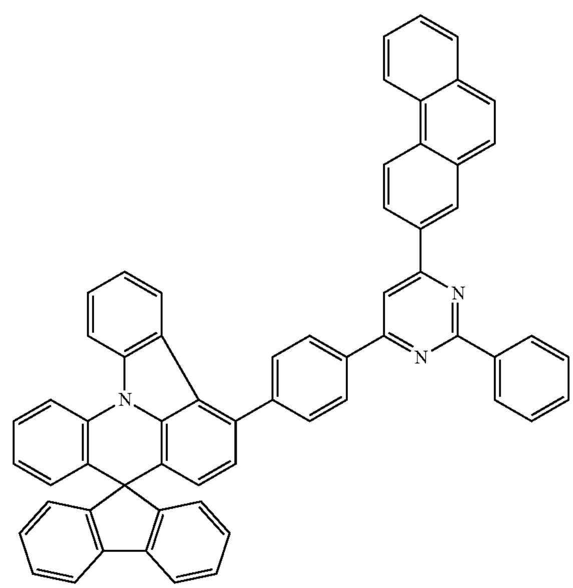

-continued
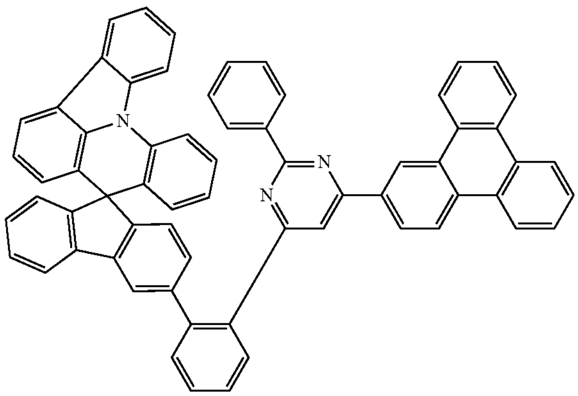
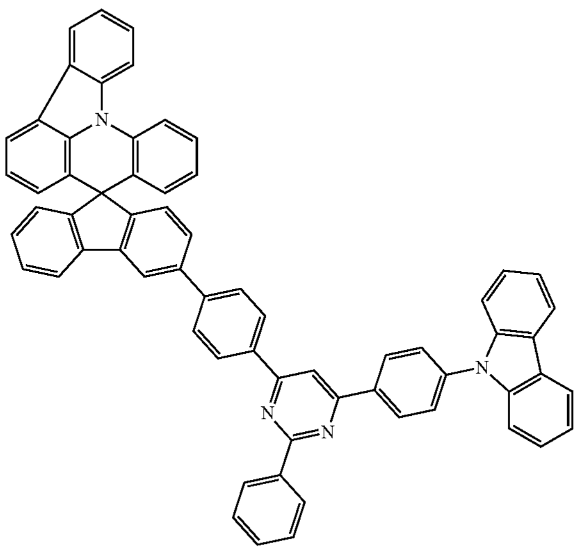
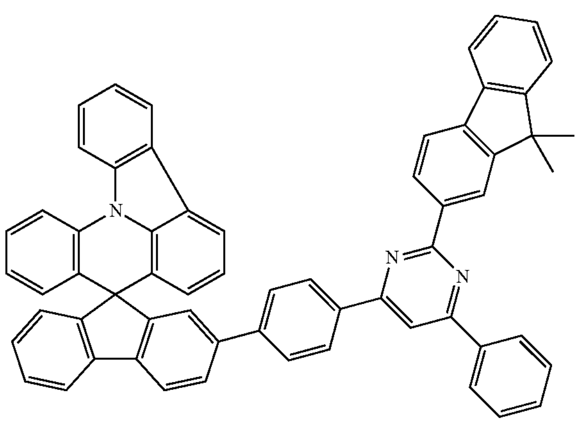
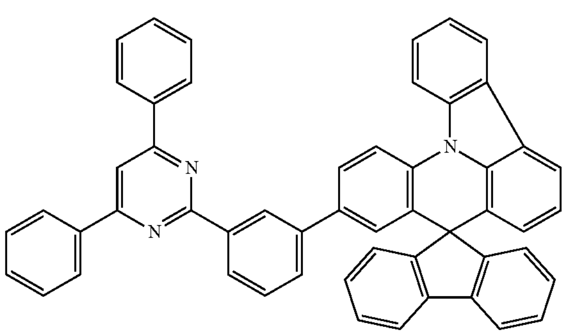
-continued
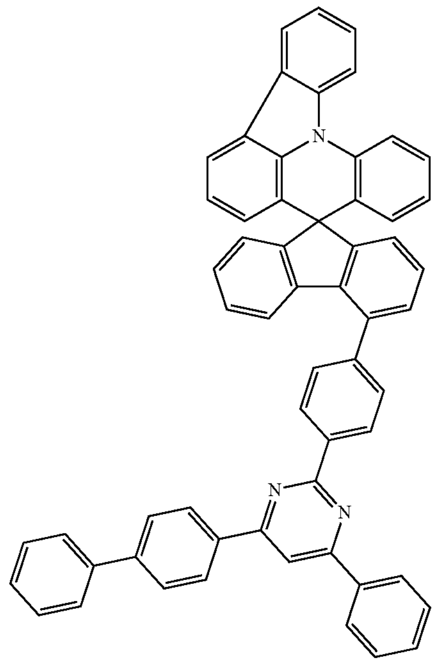
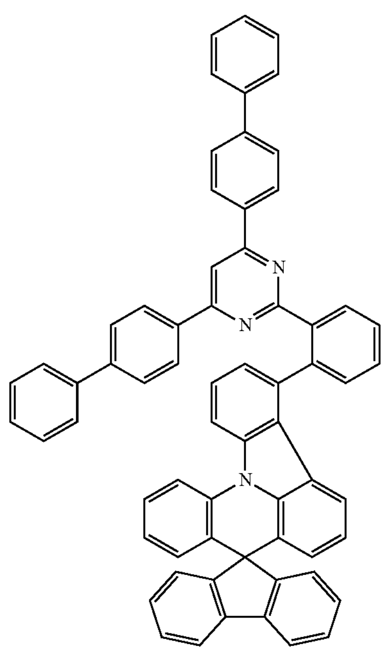

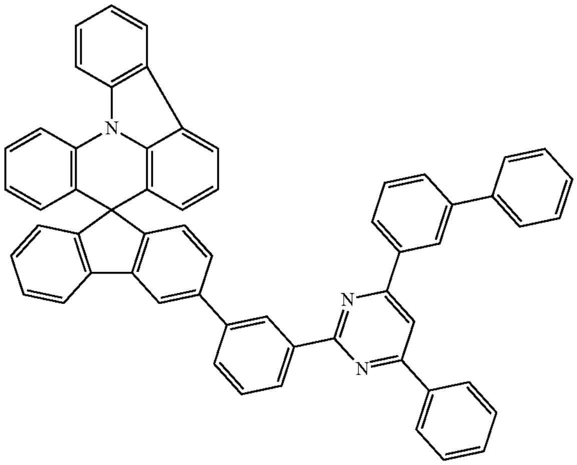
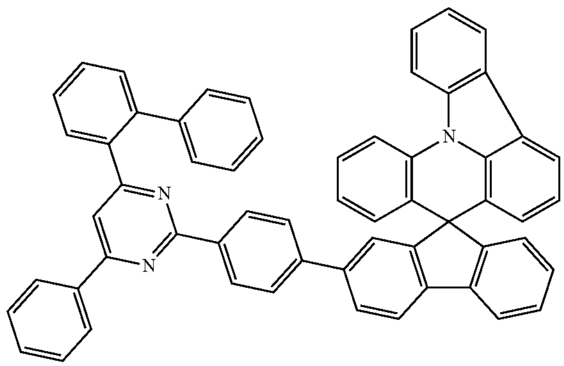
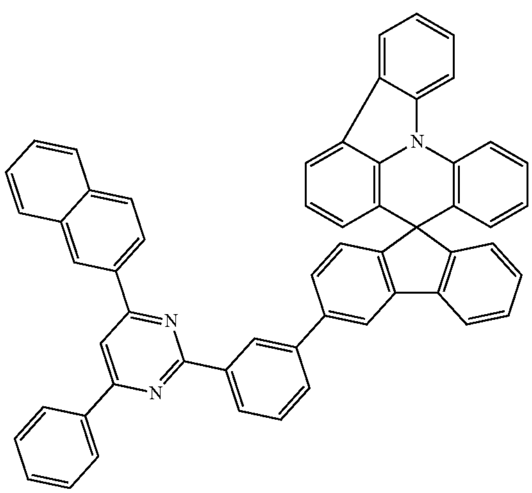
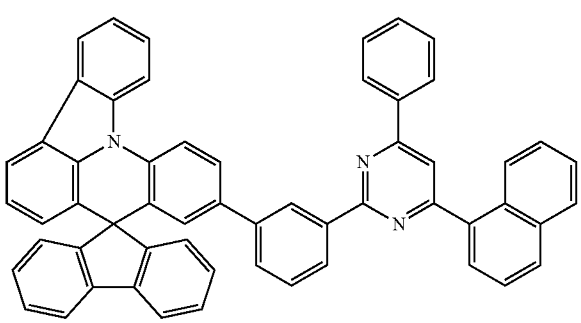
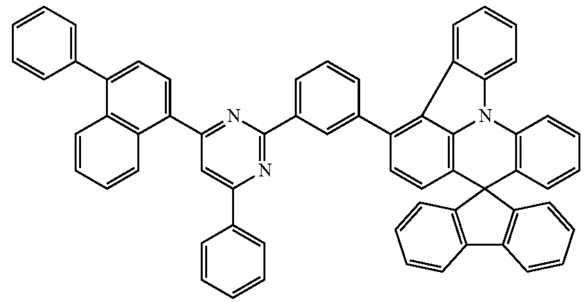
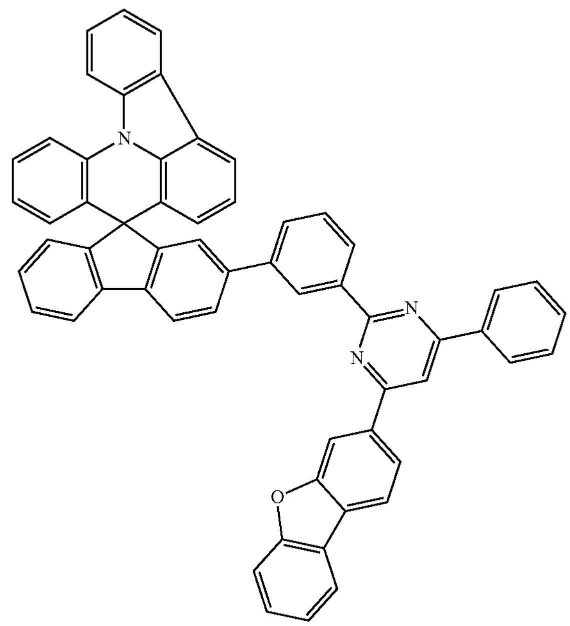
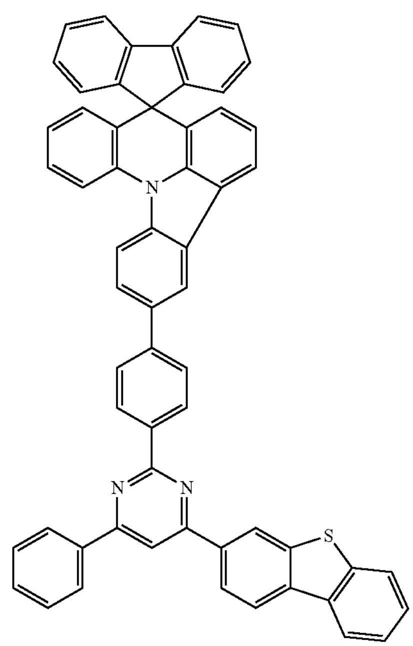

-continued
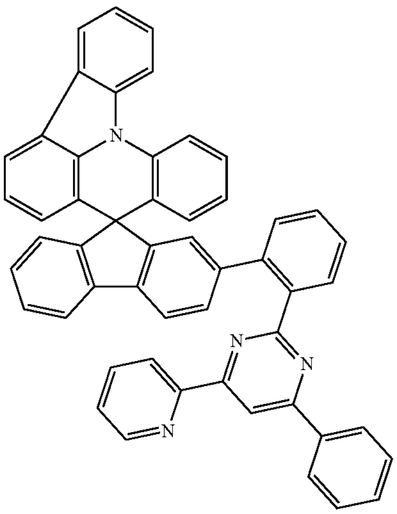
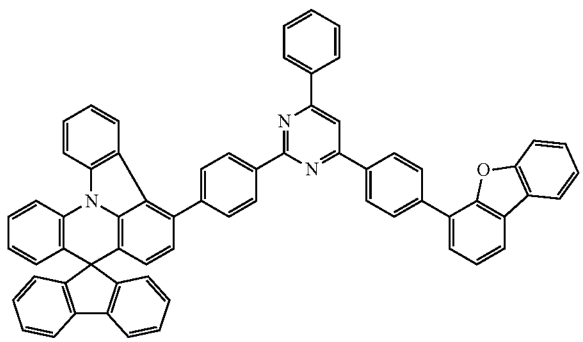
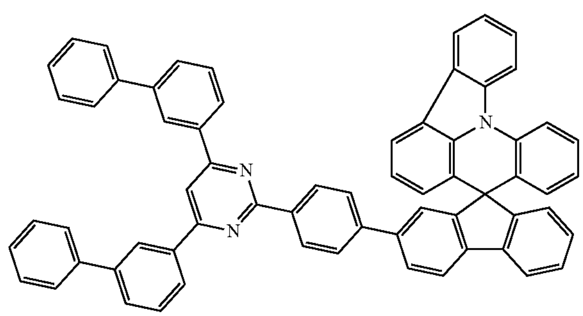
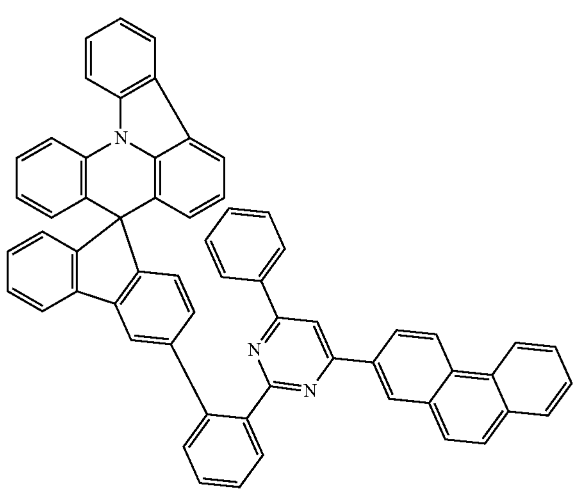
-continued
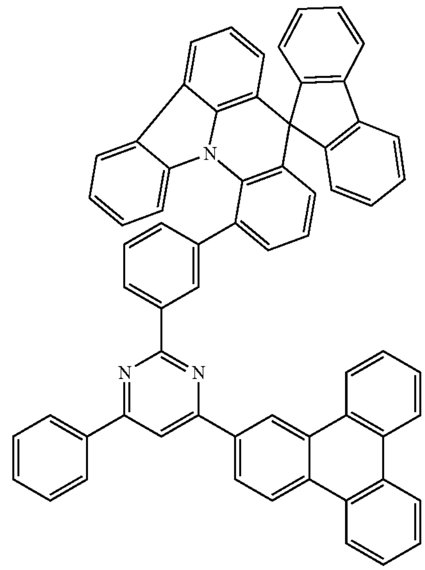
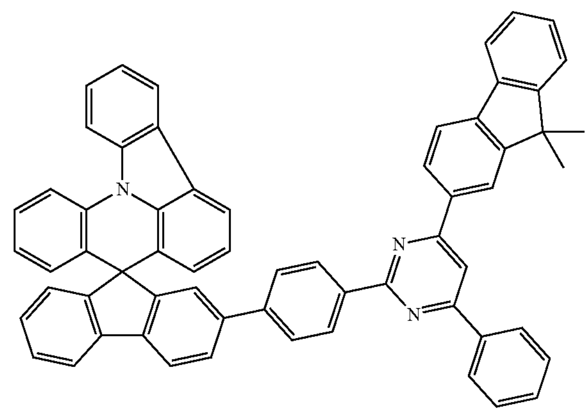
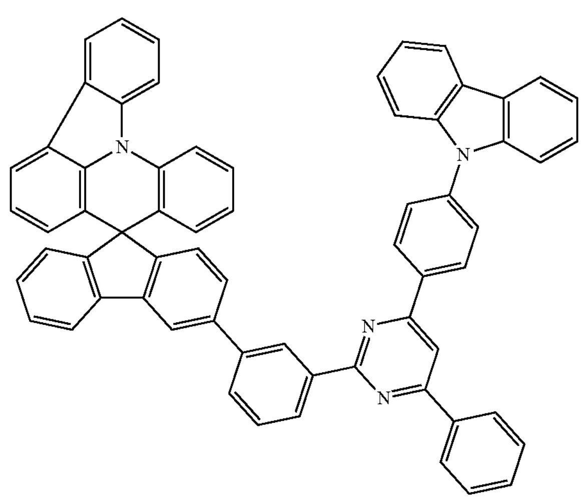

-continued
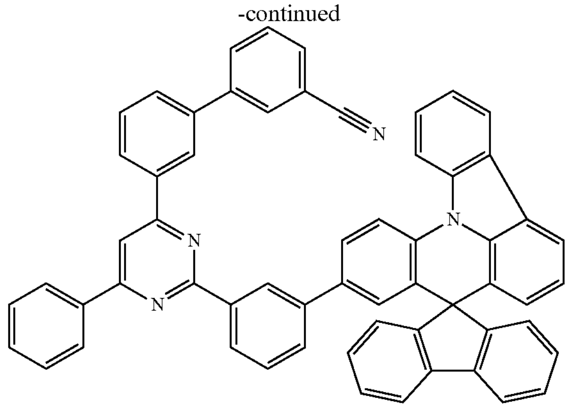
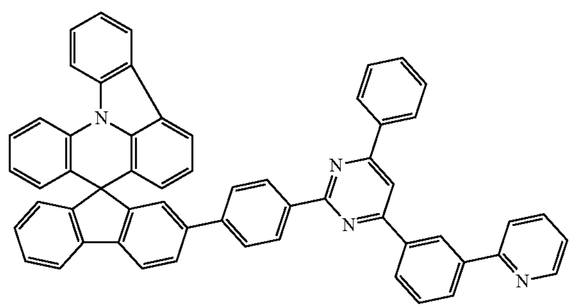
.
In addition, according to an exemplary embodiment of the present specification, the spiro compound can be any one compound selected from the following compounds:
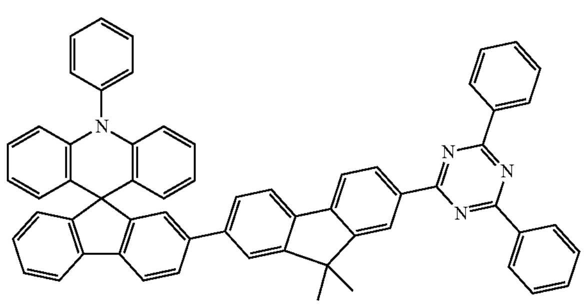
-continued
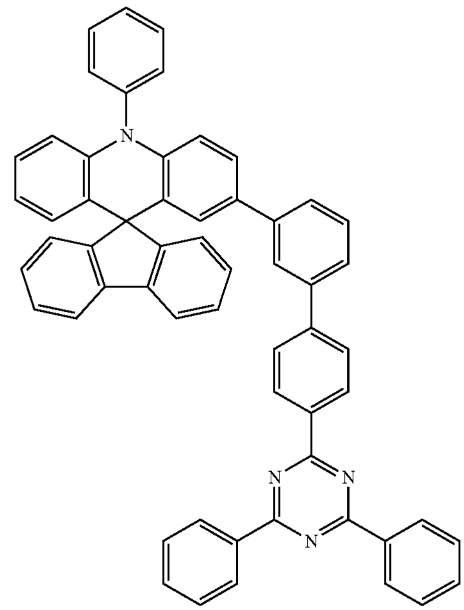
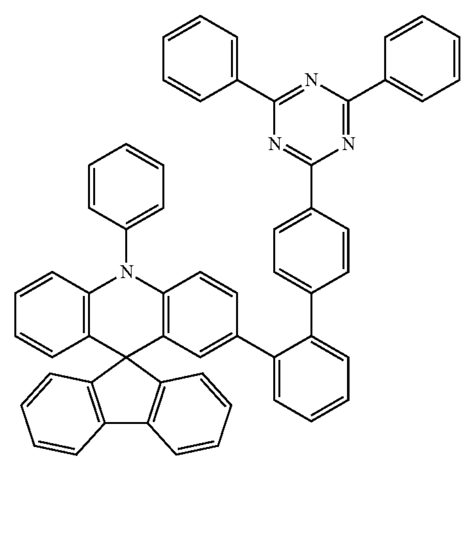

-continued
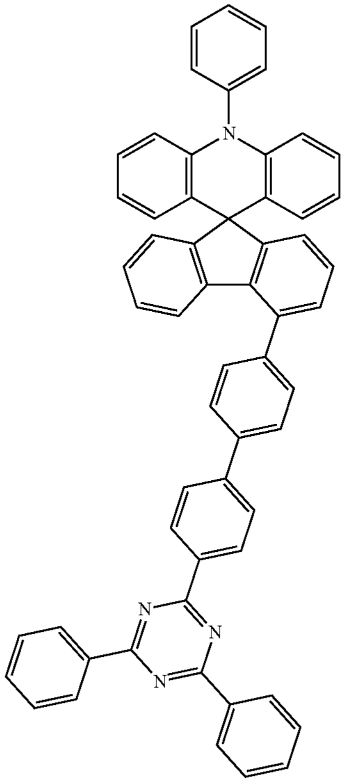
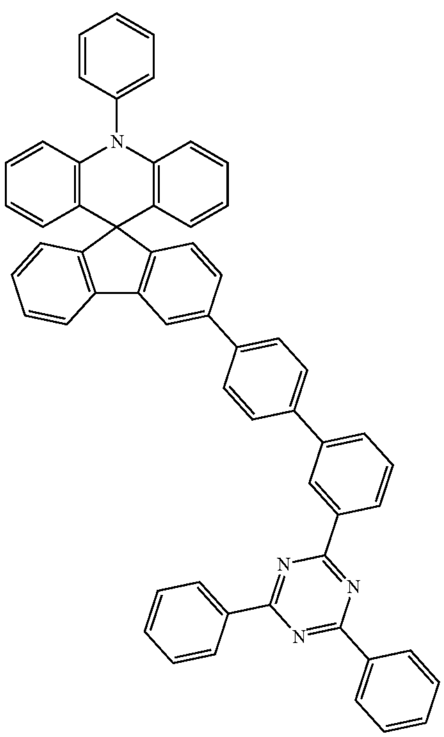
-continued
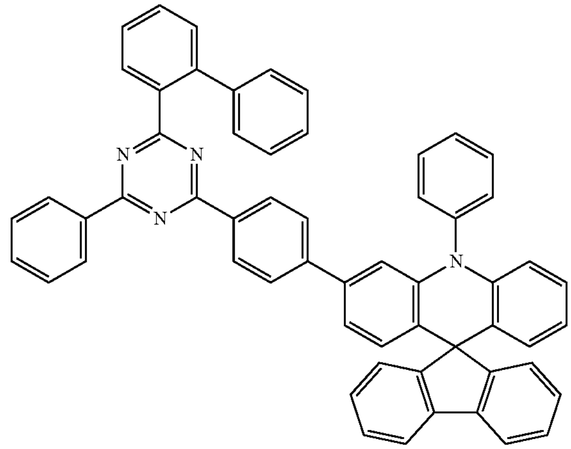
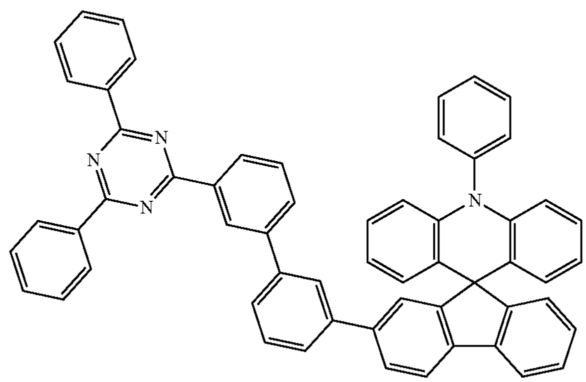
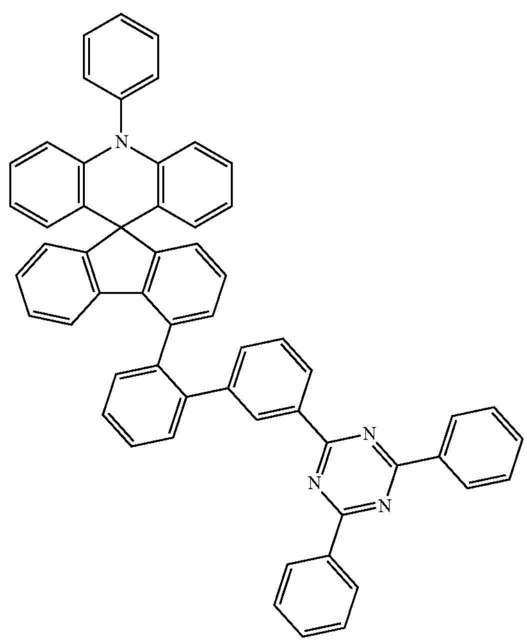

-continued
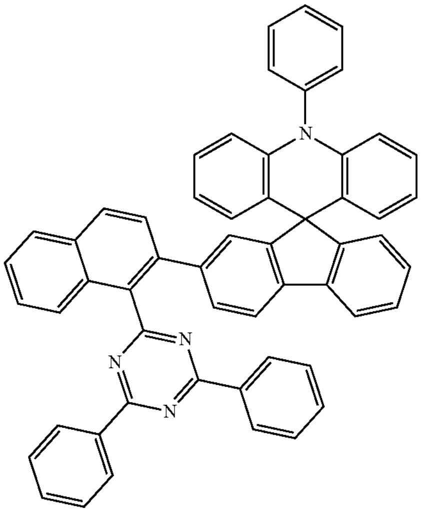
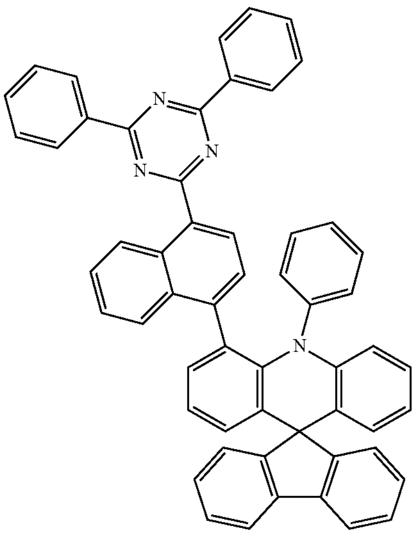
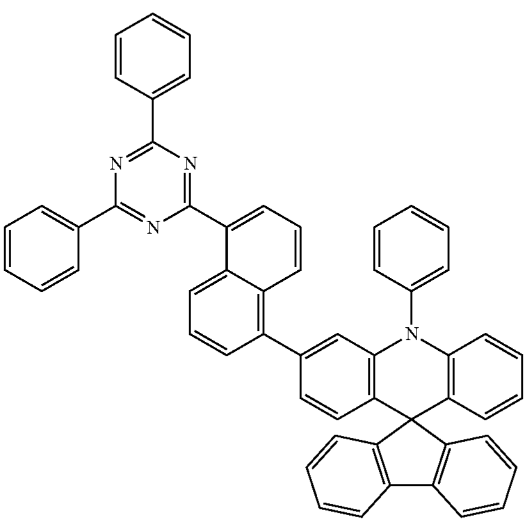
-continued
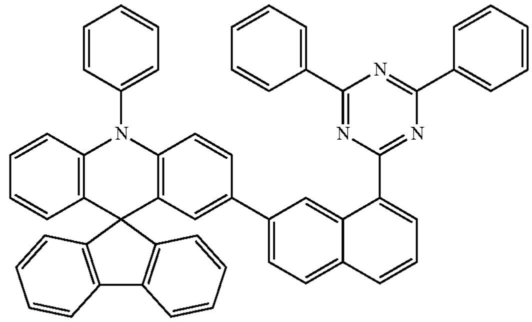
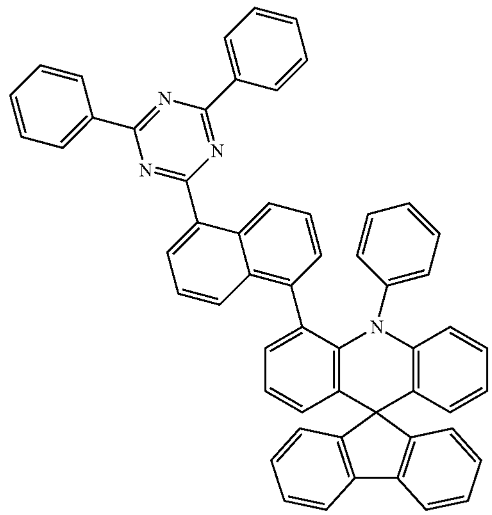
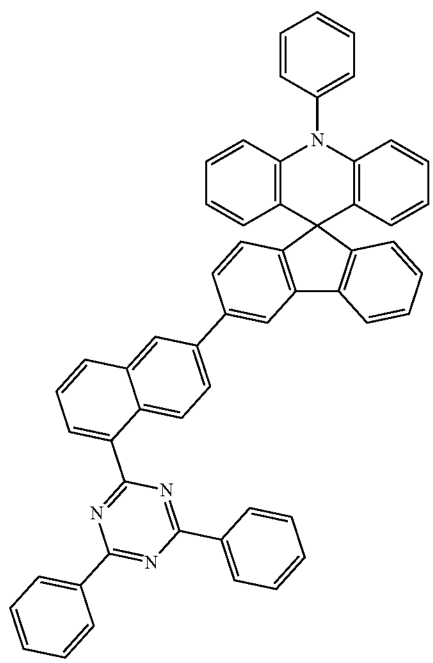

-continued
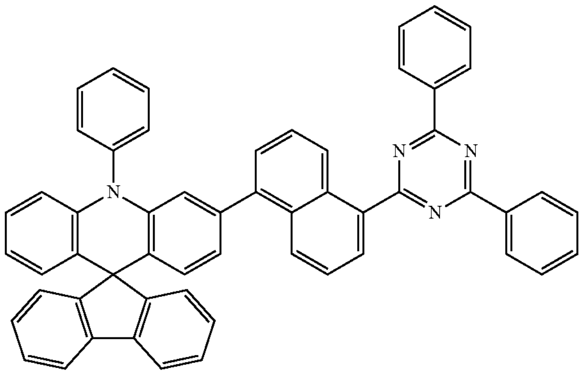
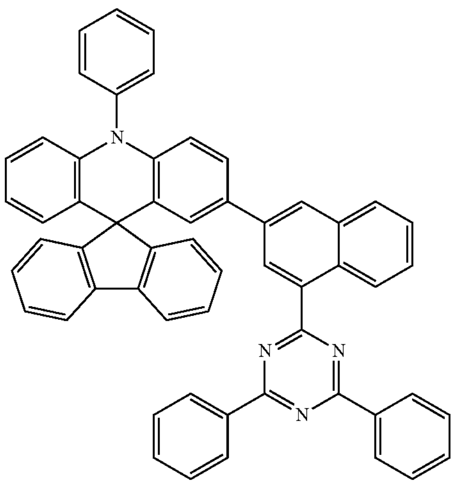
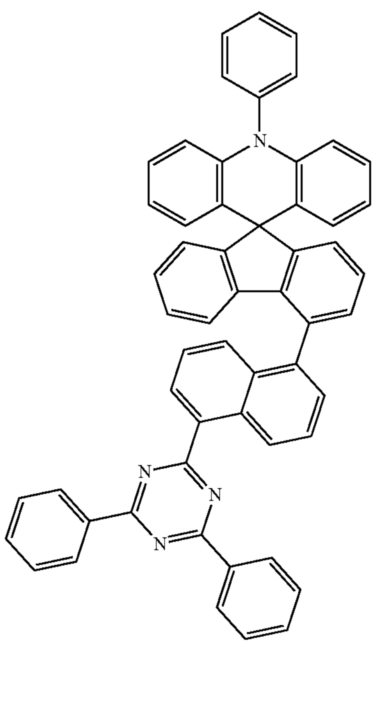
-continued
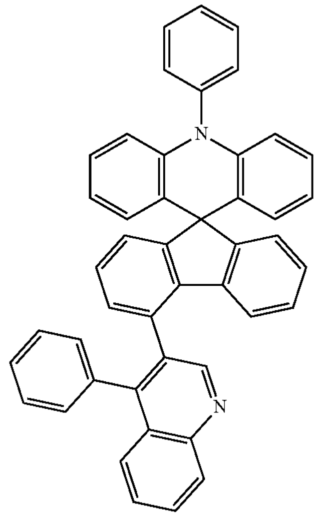
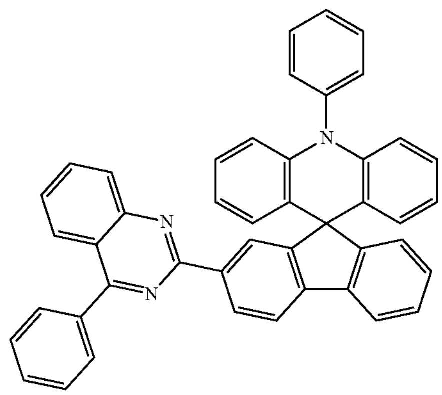
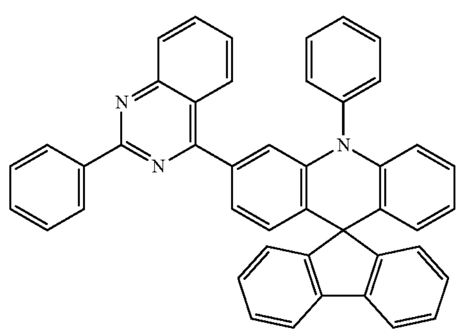

-continued
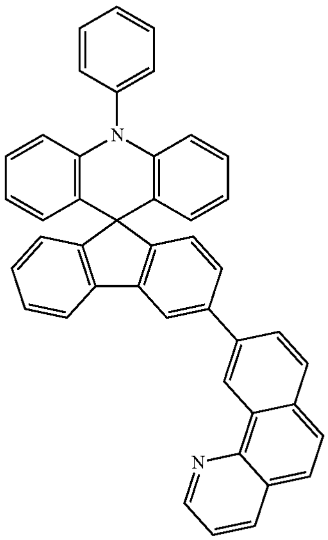
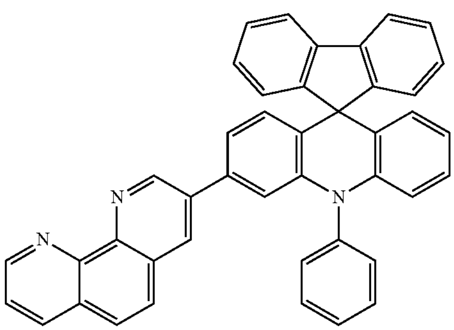
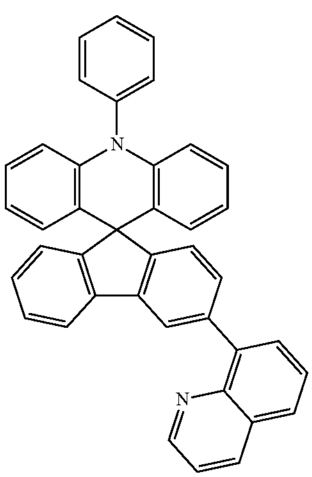
-continued
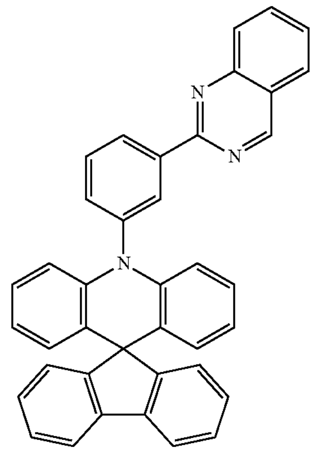
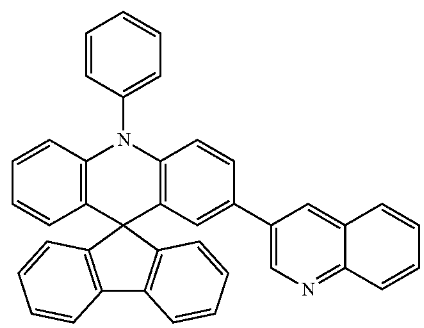
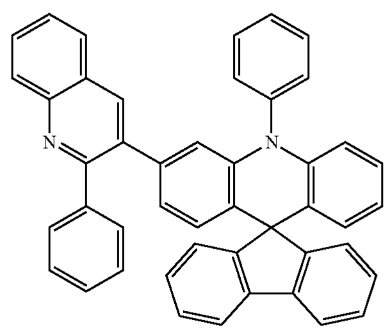
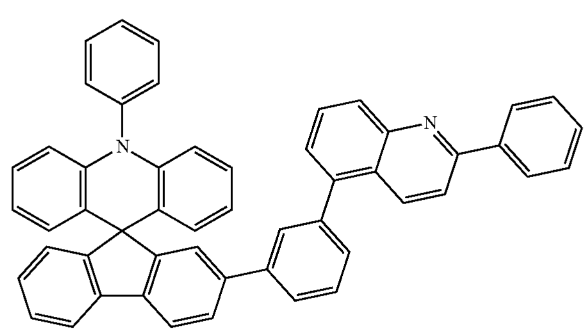

-continued
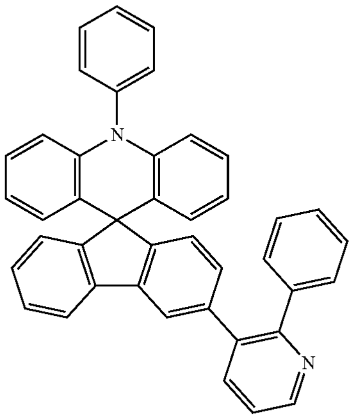
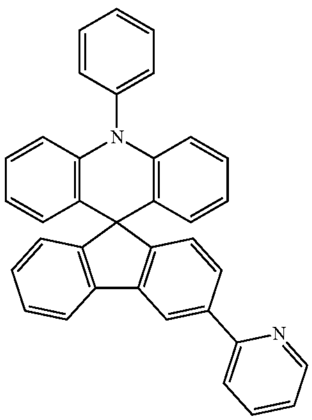
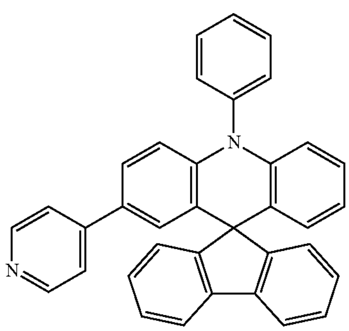
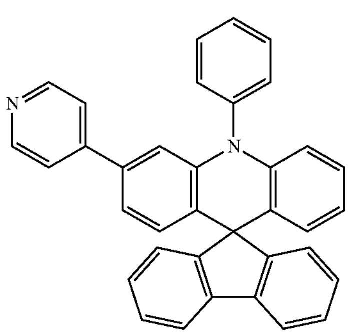
-continued
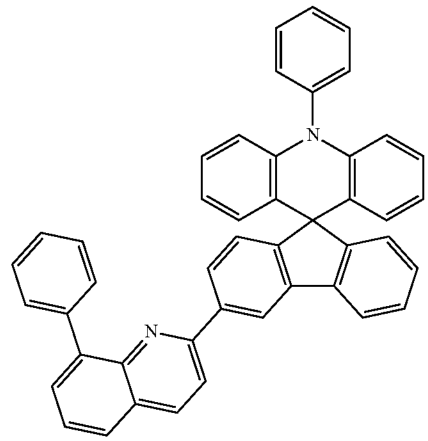
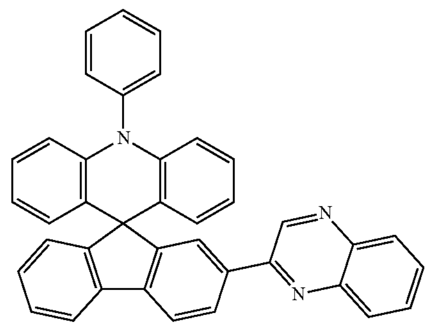
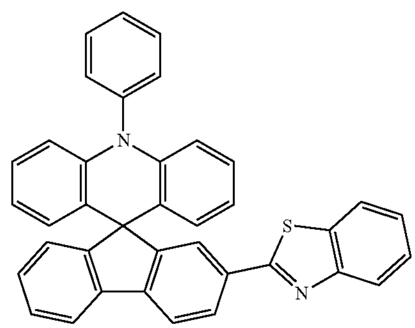
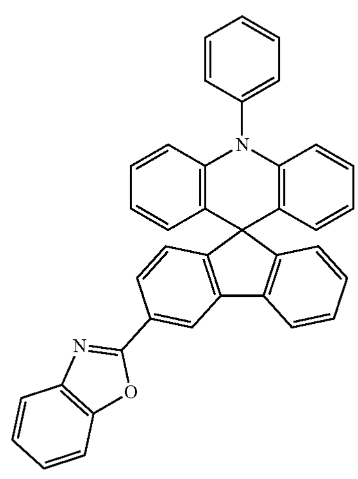

-continued
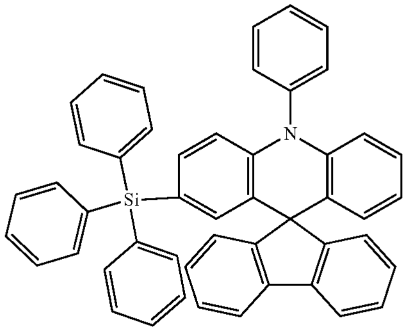
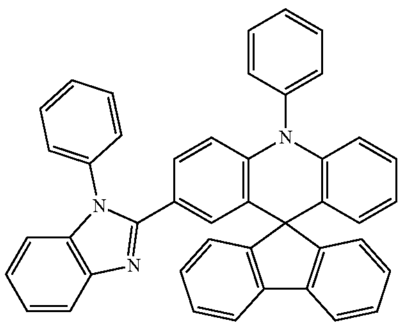
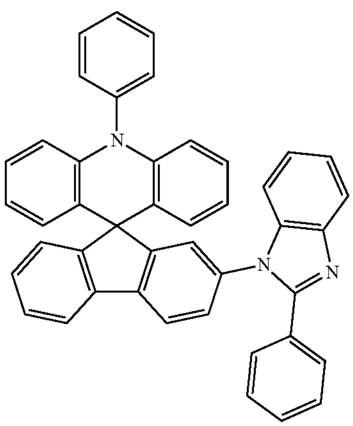
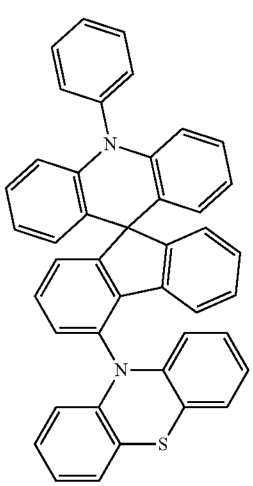
-continued
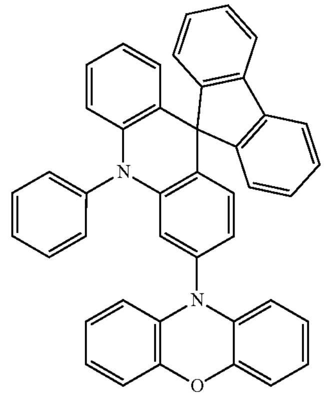
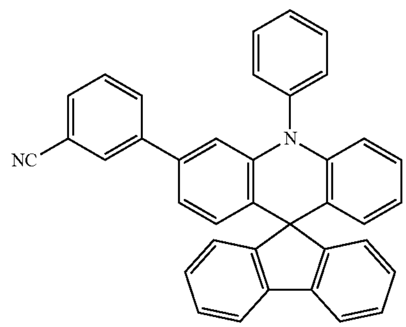
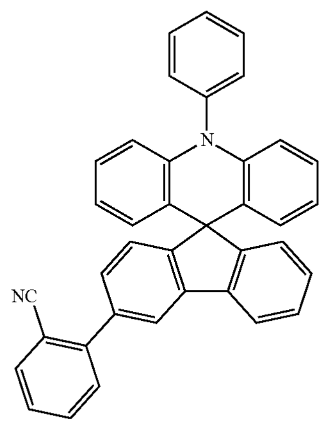
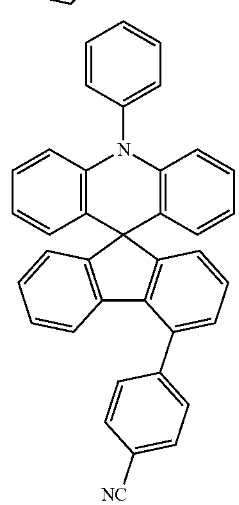

-continued
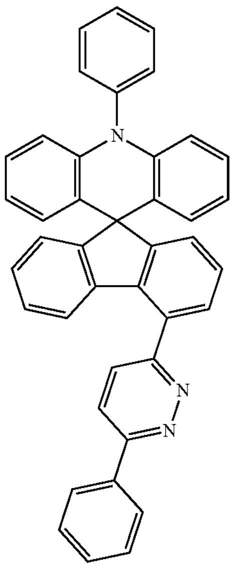
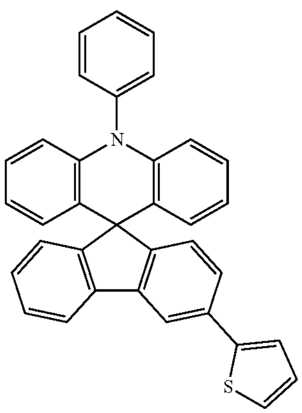
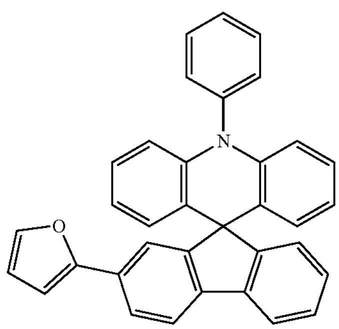
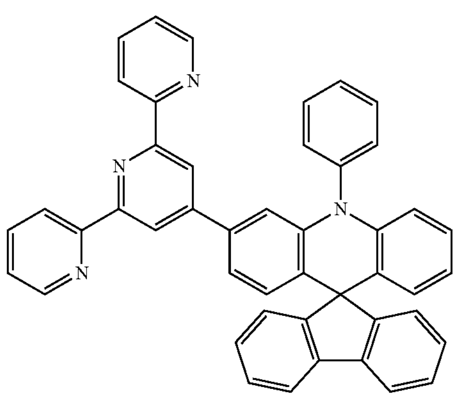
-continued
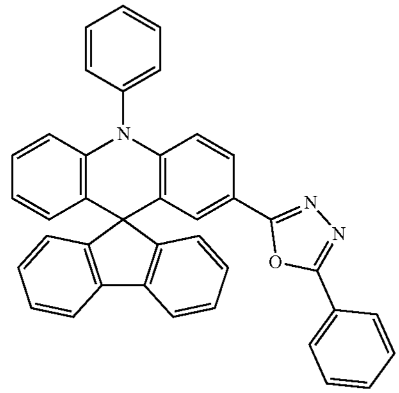
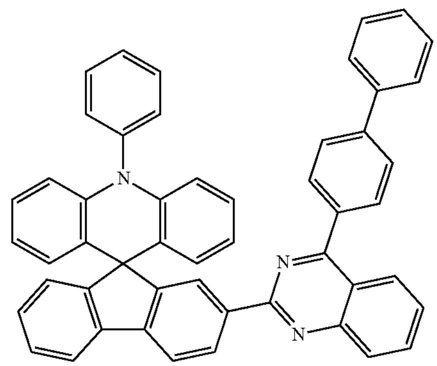
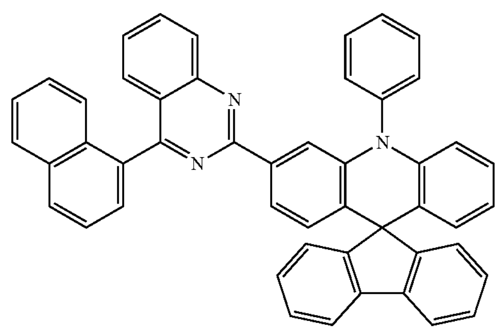
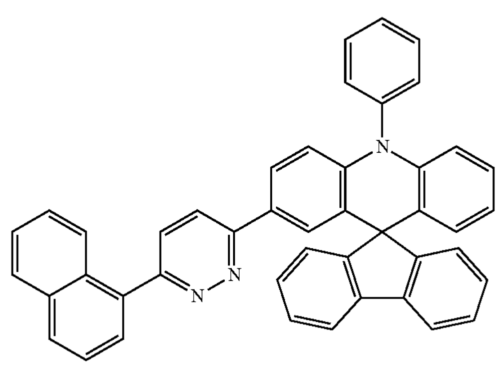

-continued
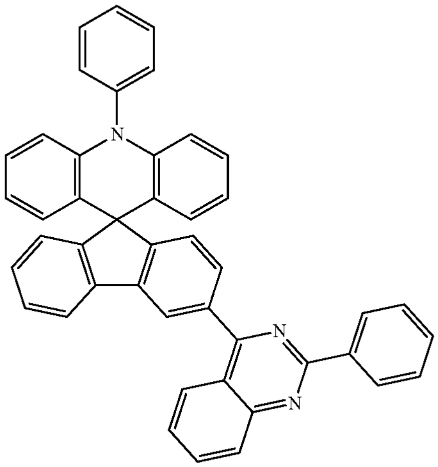
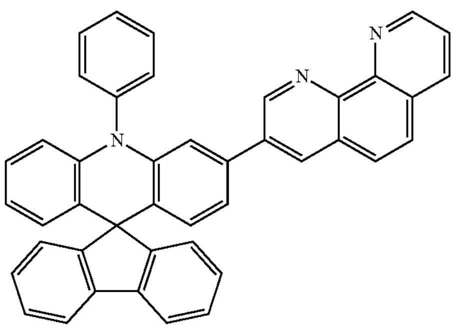
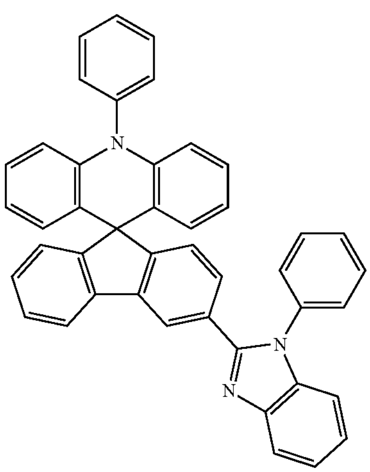
-continued
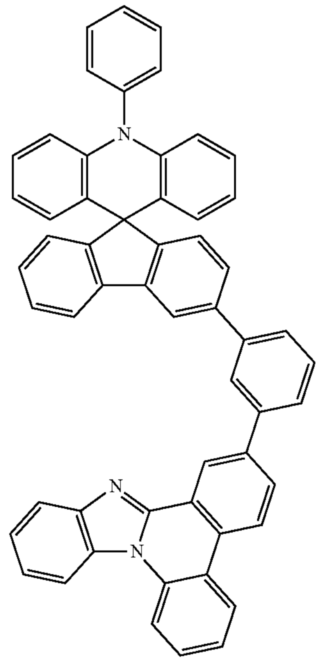
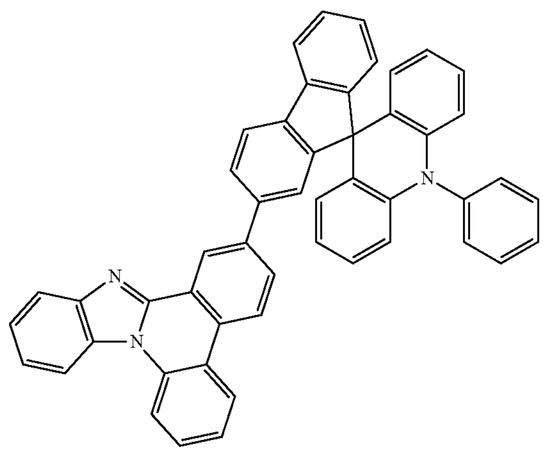
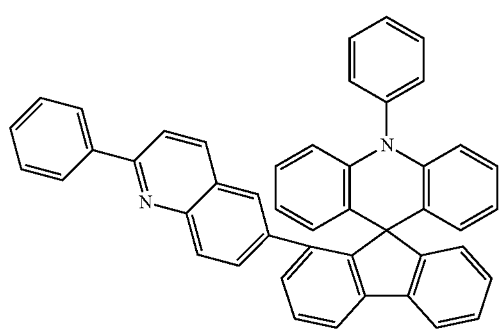

-continued
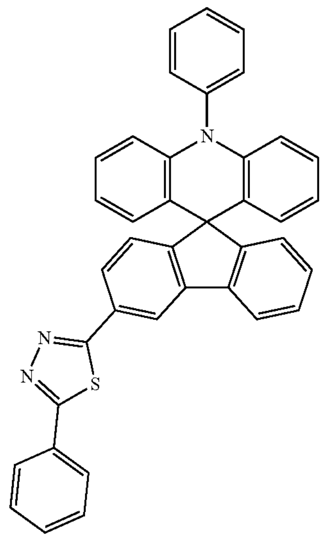
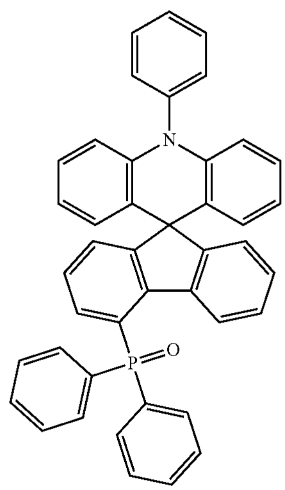
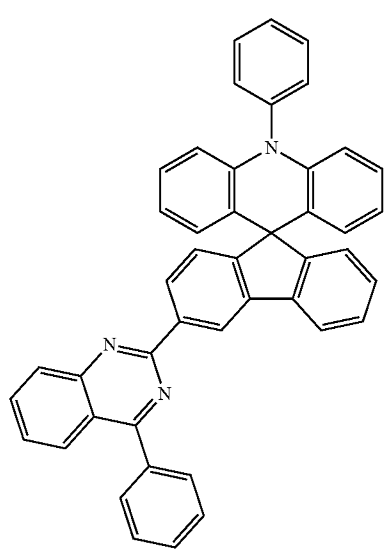
-continued
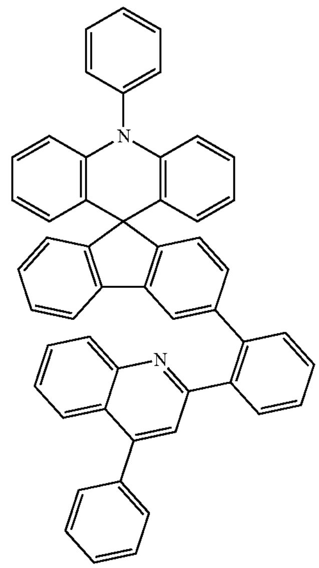
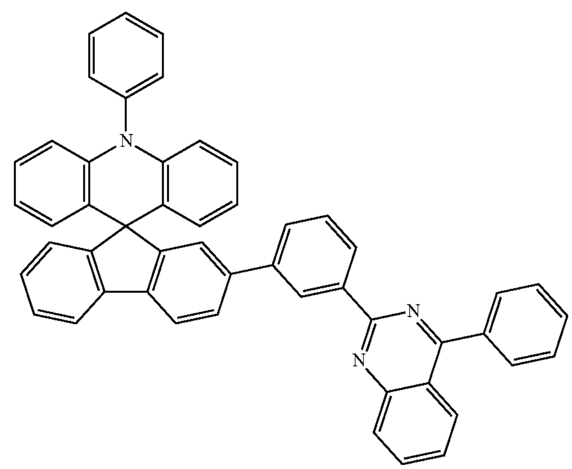
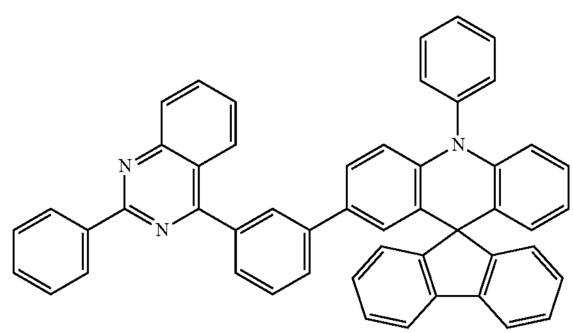
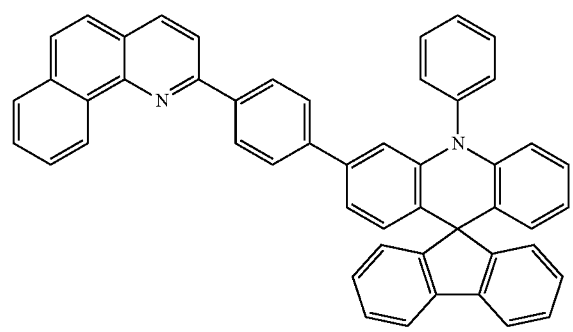

-continued
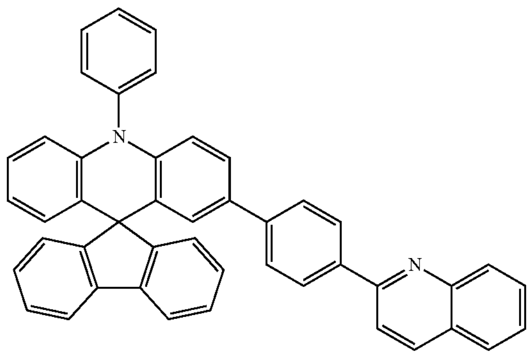
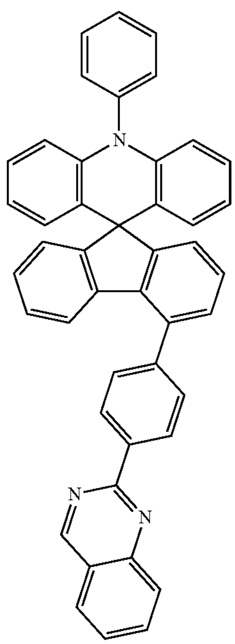
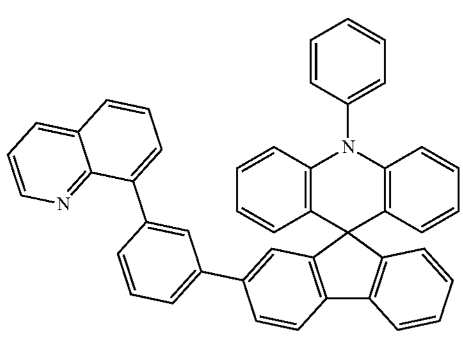
-continued
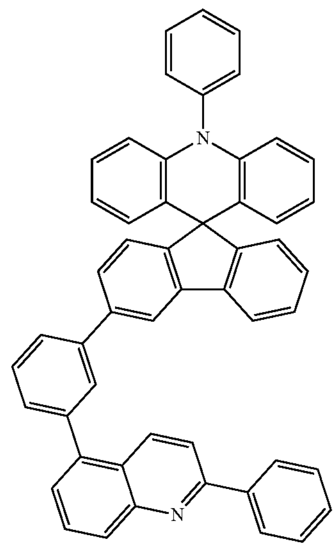
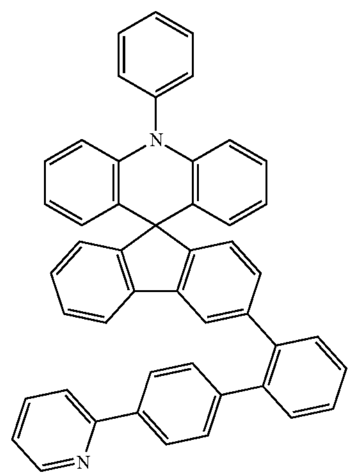
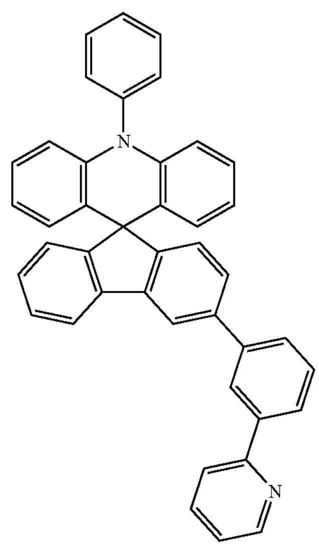

-continued
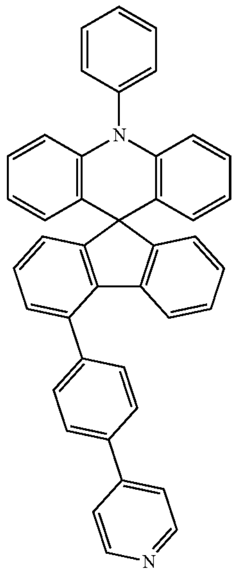
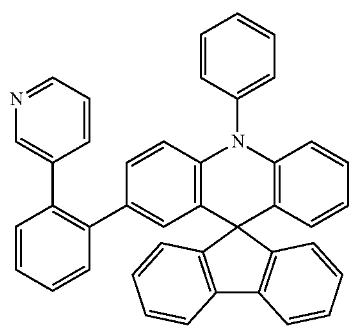
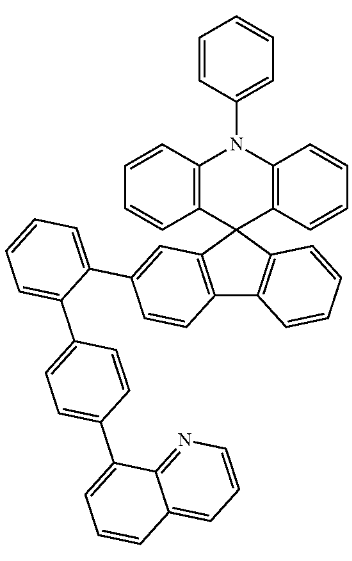
-continued
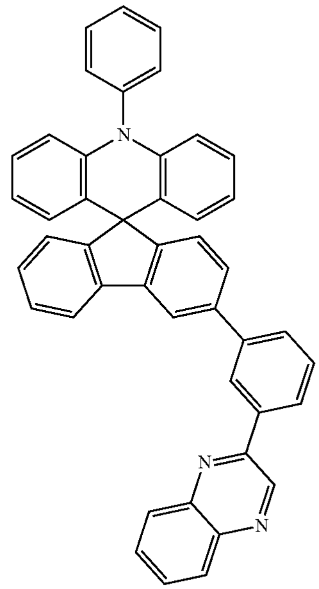
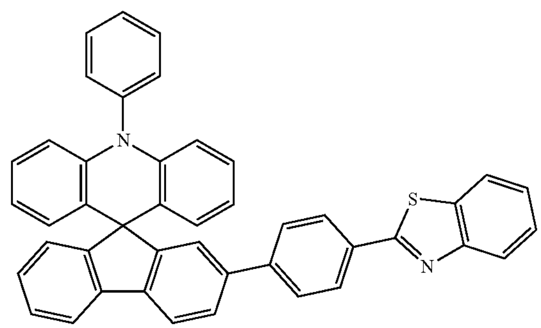
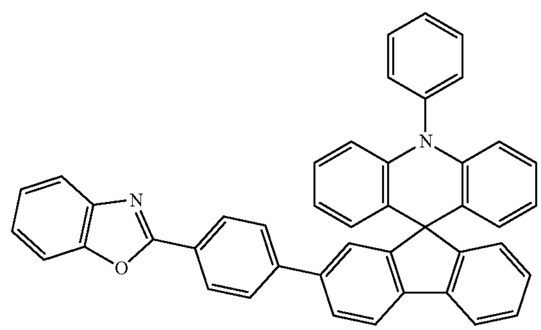
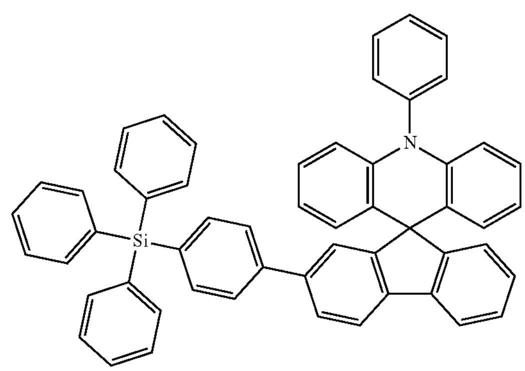

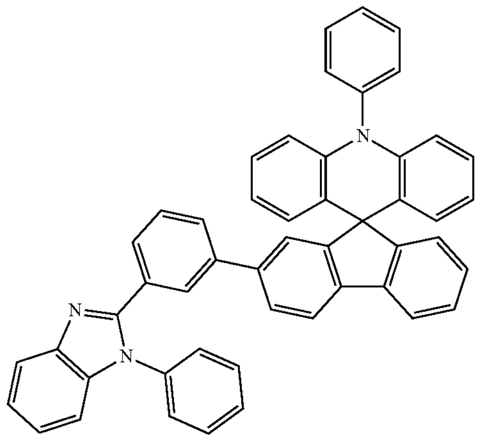
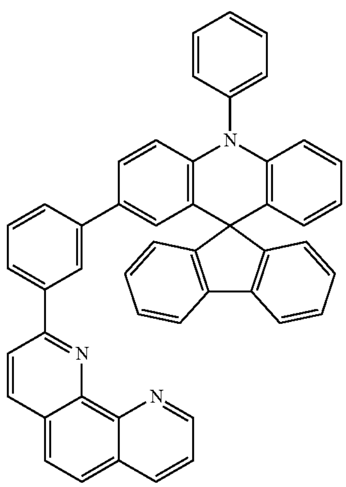
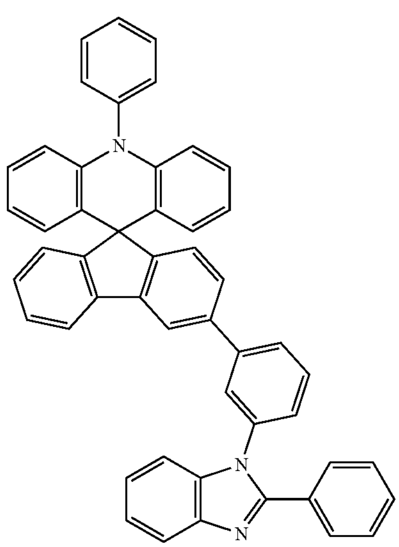
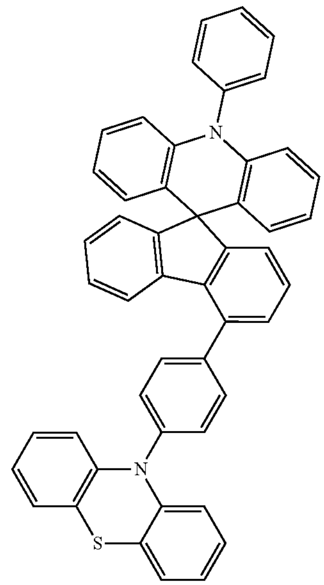
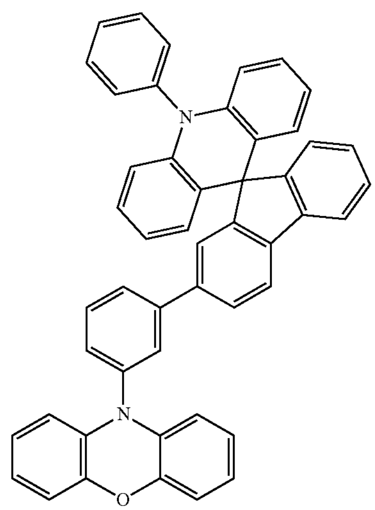
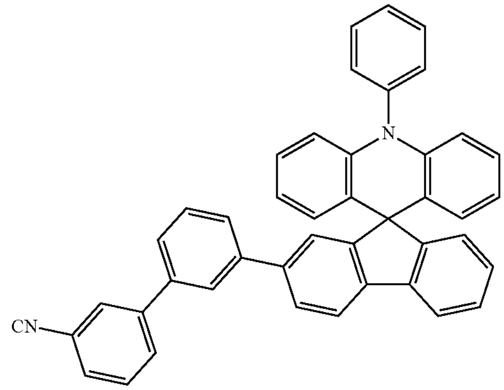

-continued
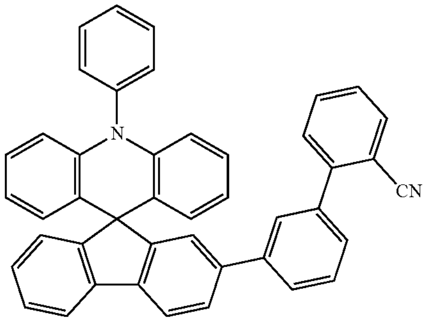
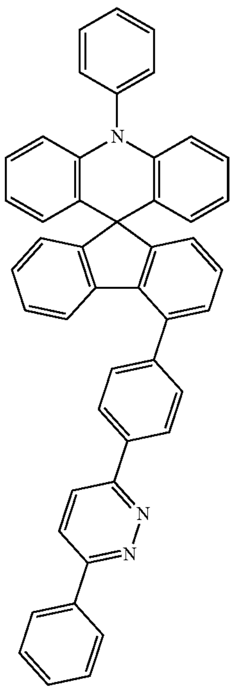
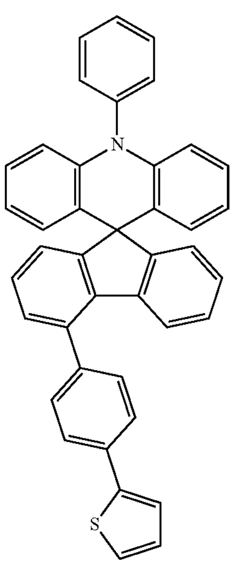
-continued
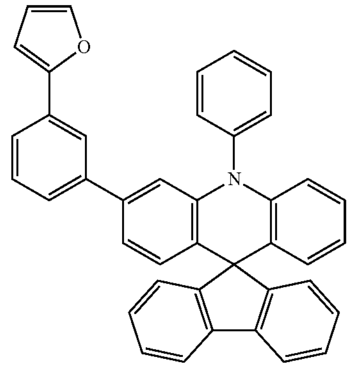
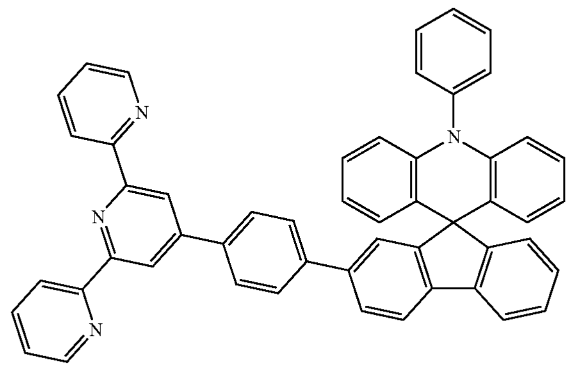
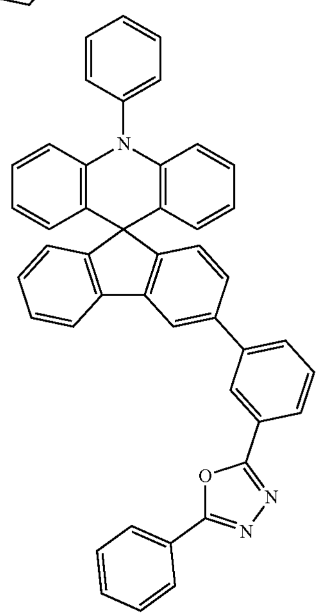
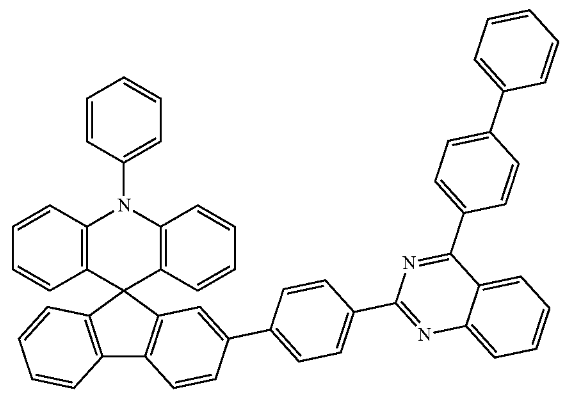

-continued
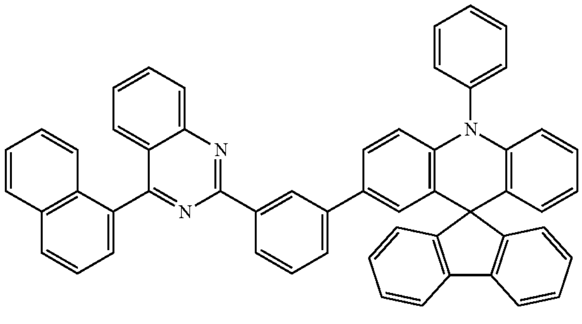
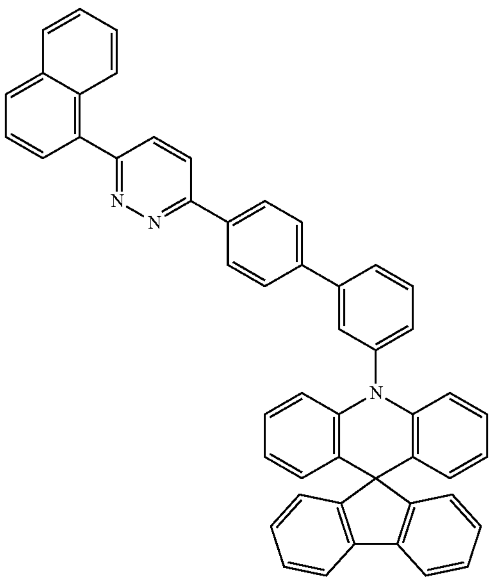
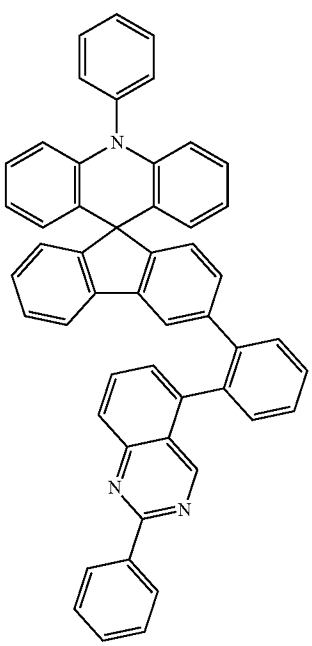
-continued
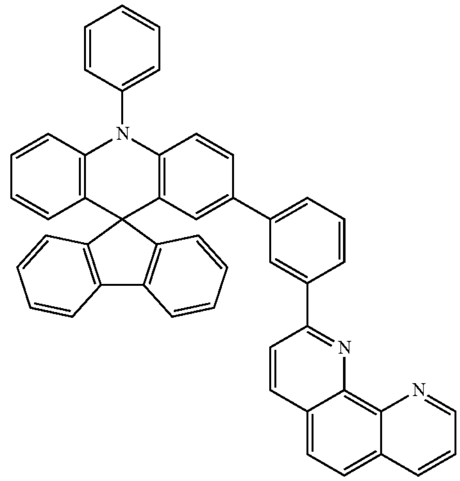
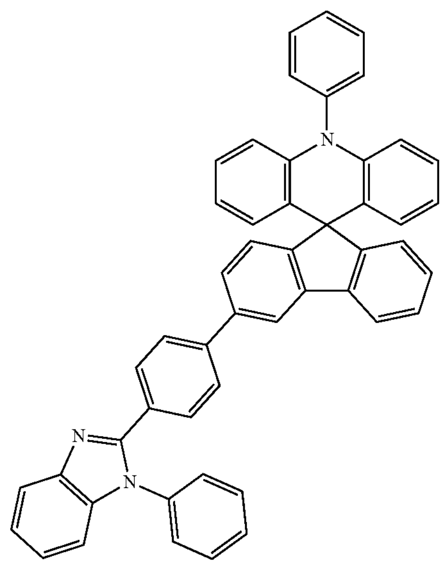
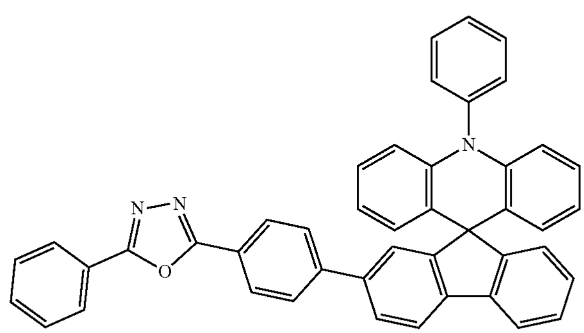

-continued
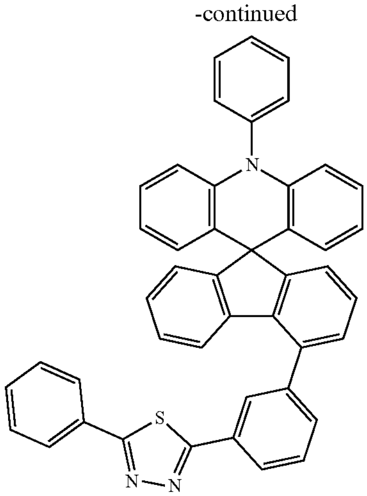
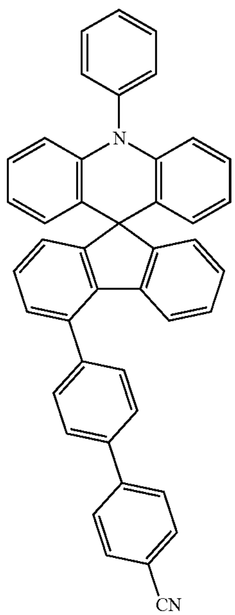
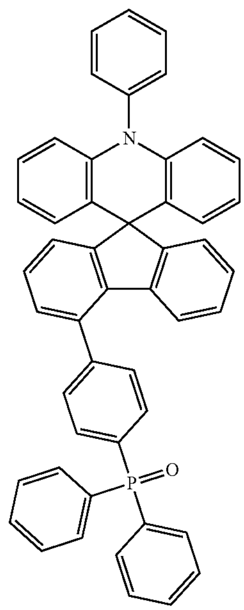
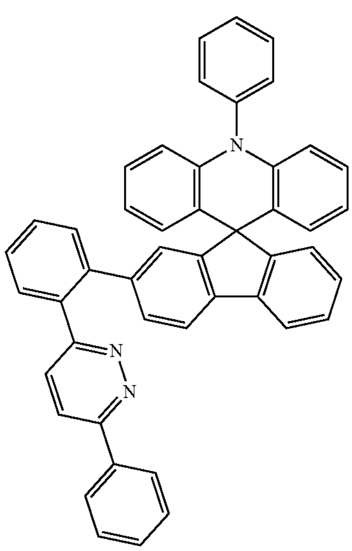
-continued
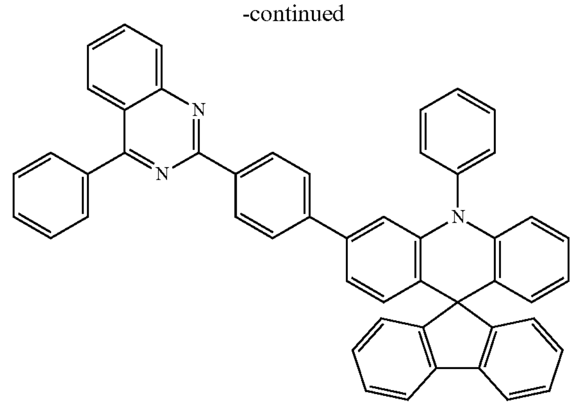
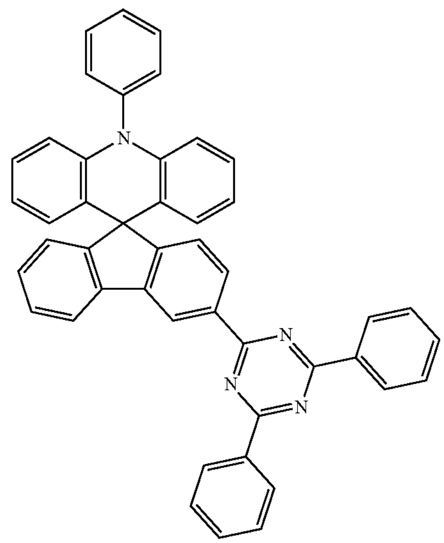
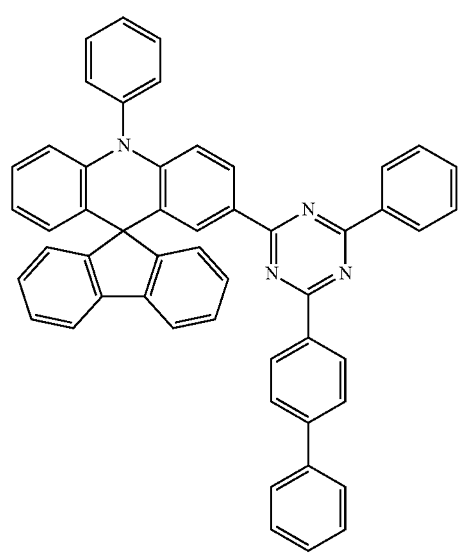

-continued
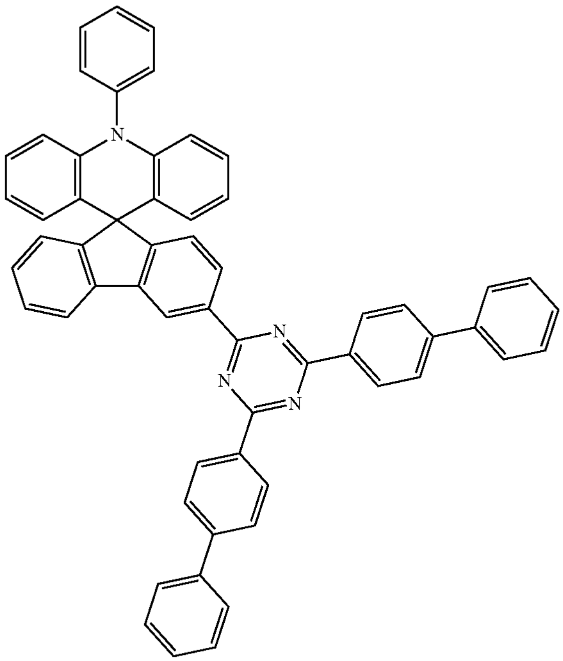
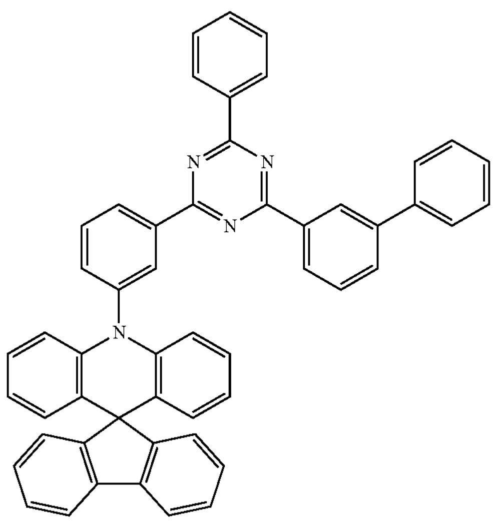
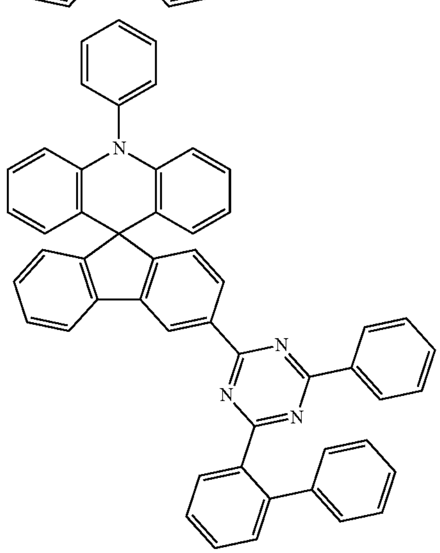
-continued
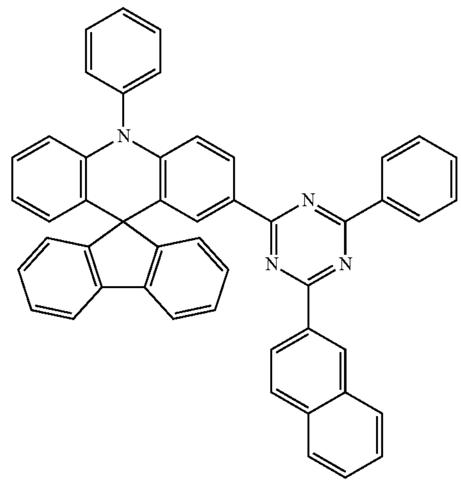
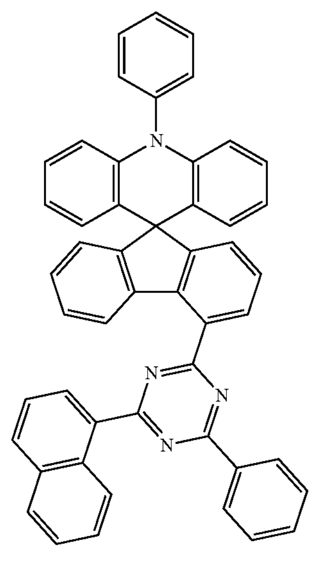
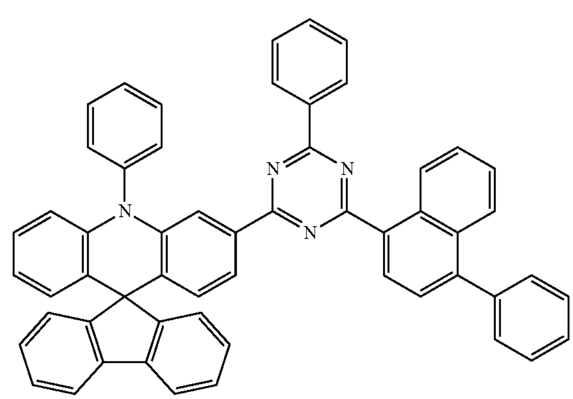

-continued
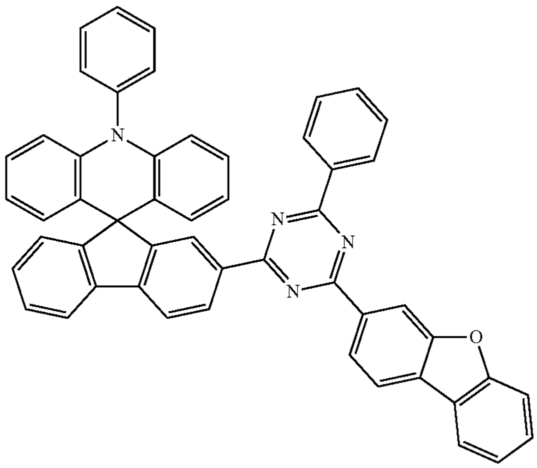
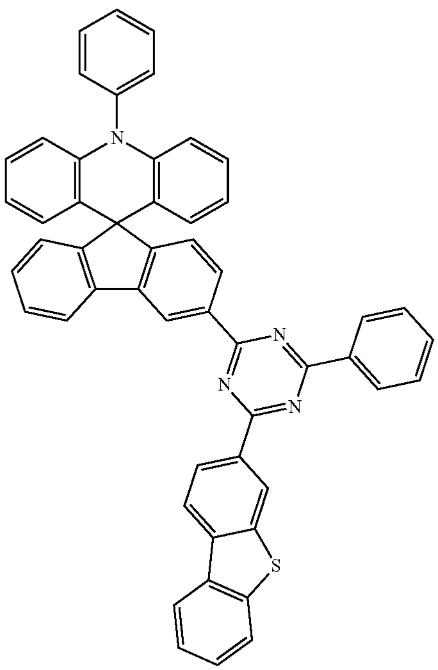
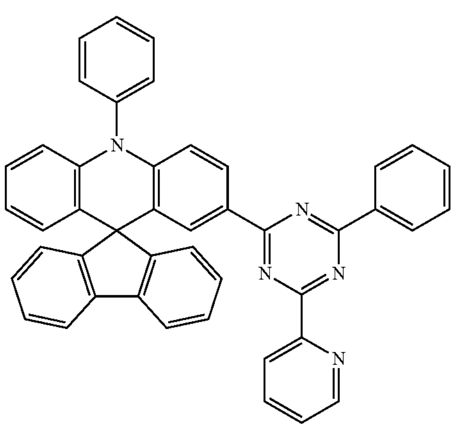
-continued
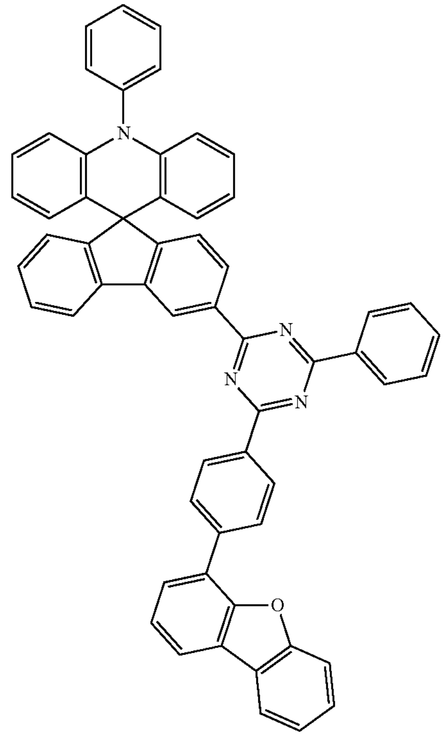
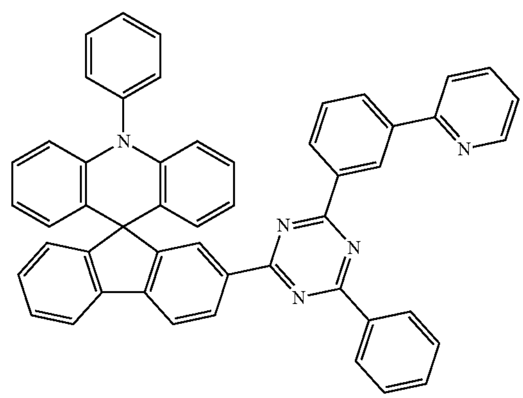
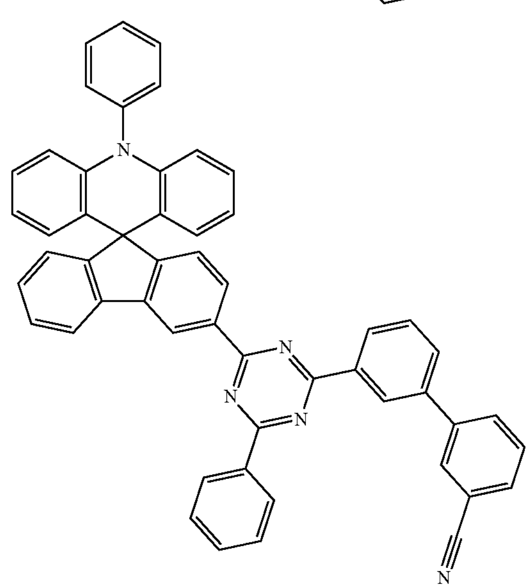

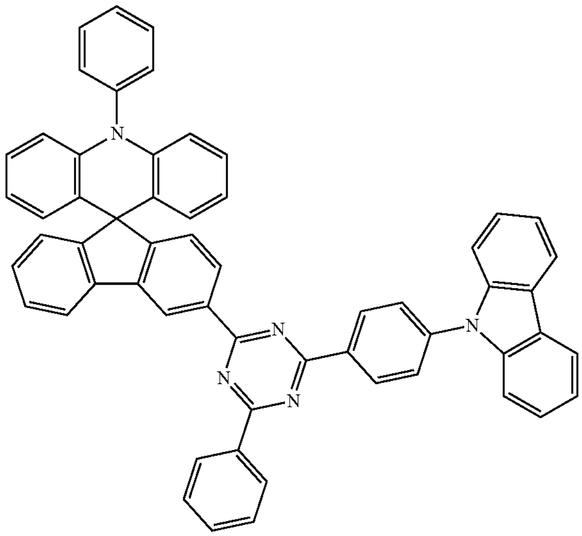
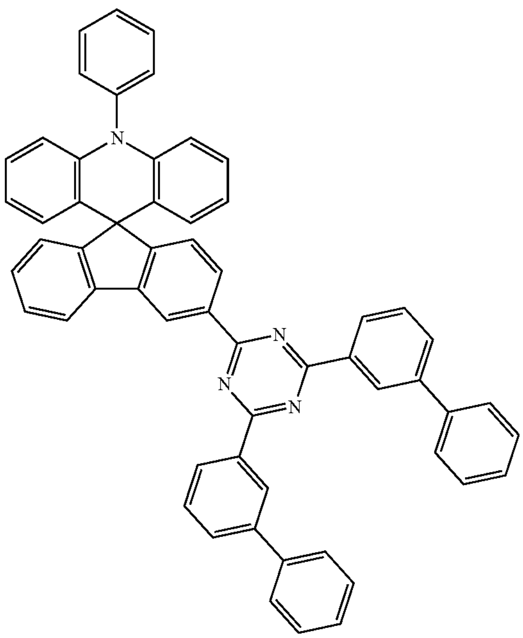
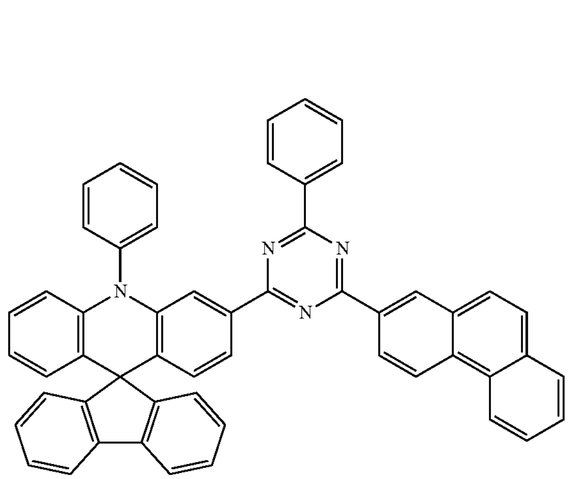
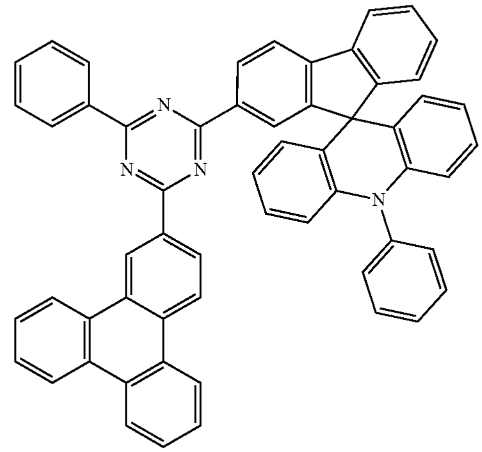
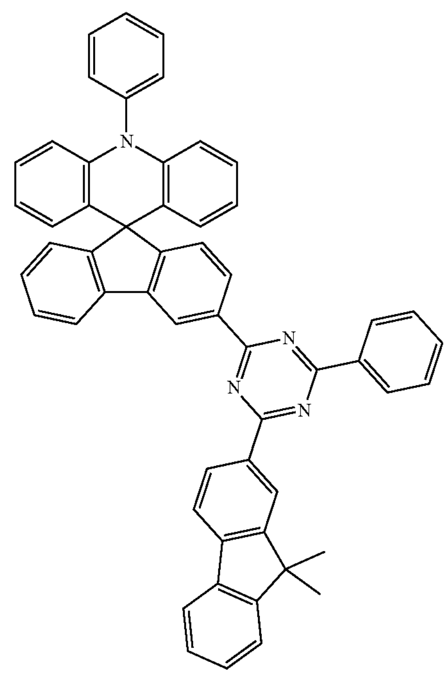

-continued
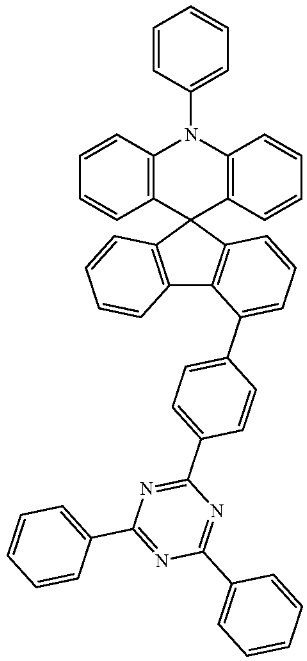
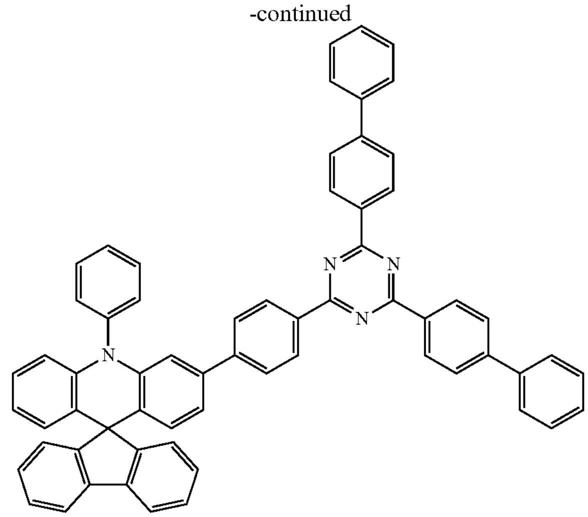
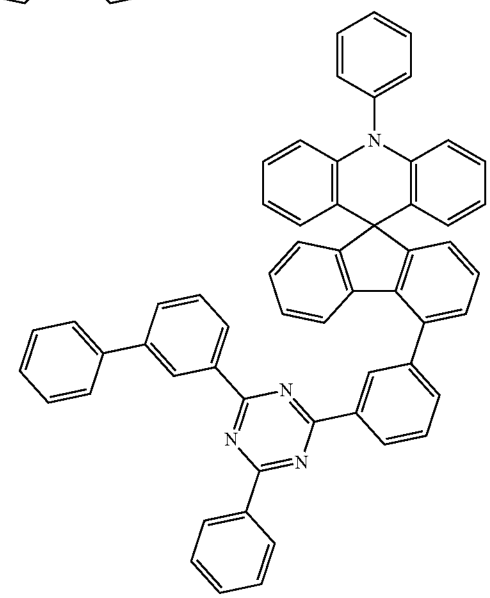
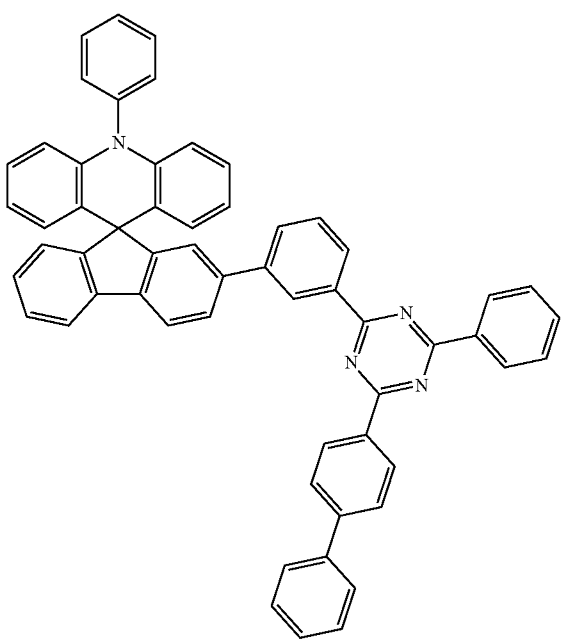
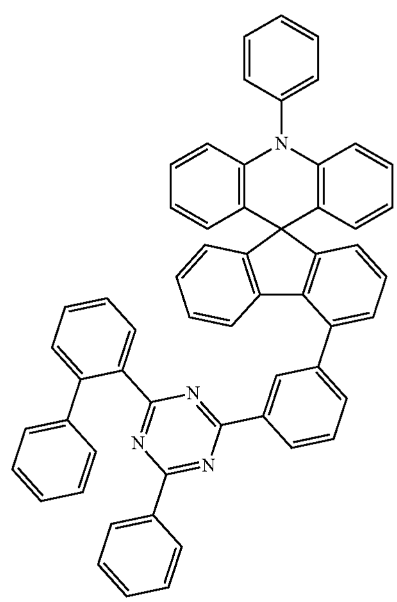

-continued
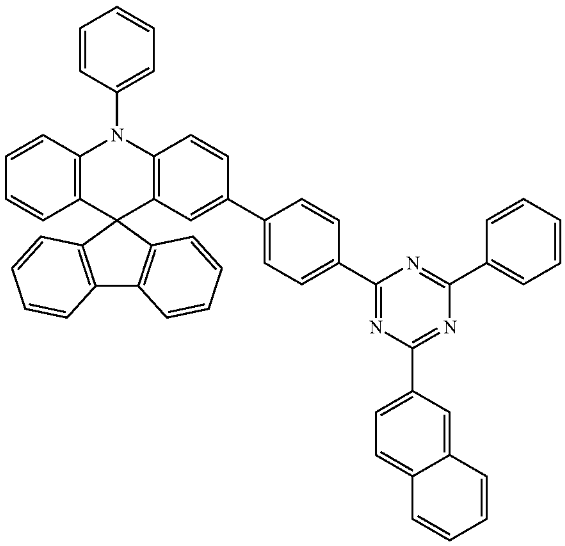
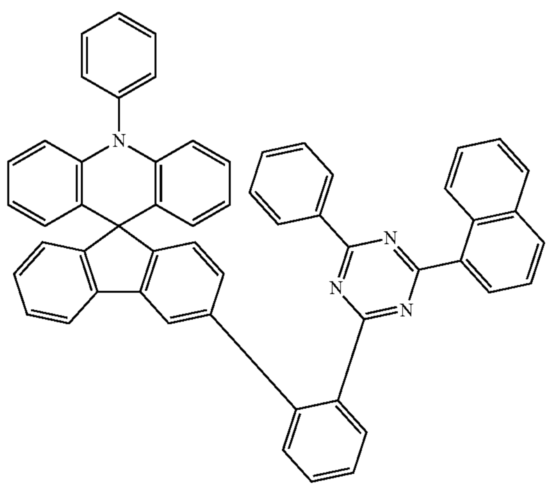
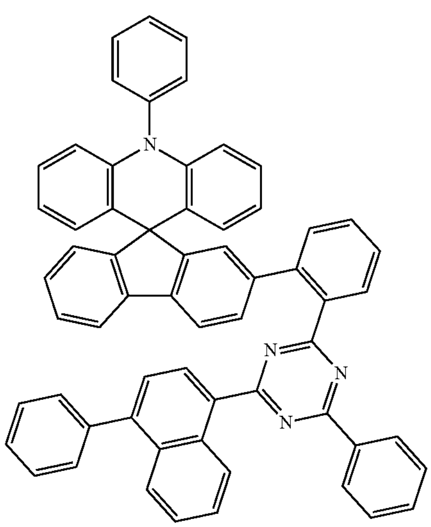
-continued
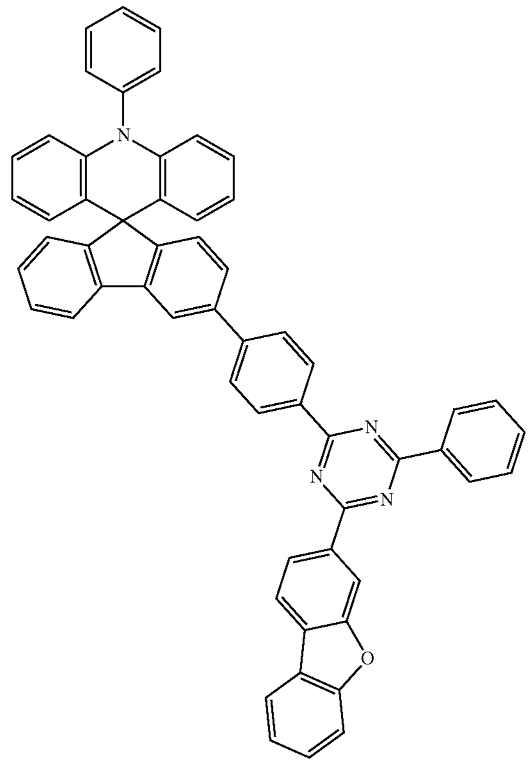
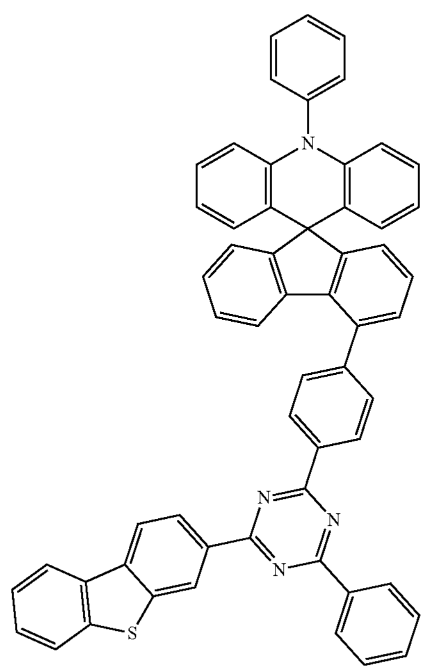

-continued
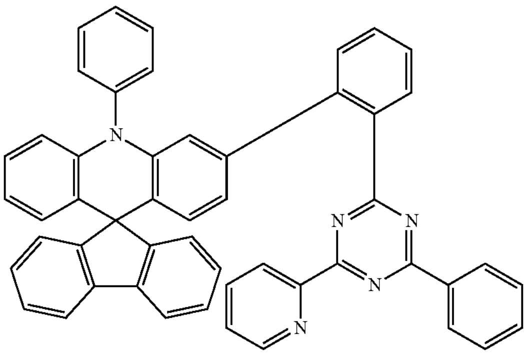
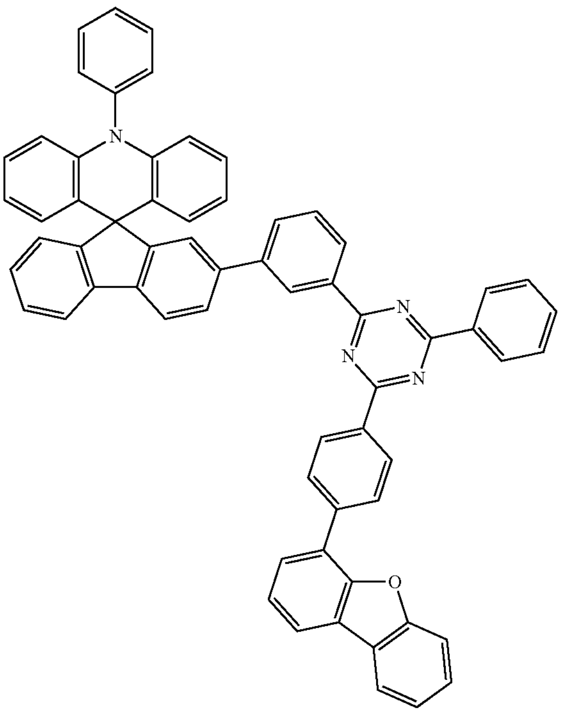
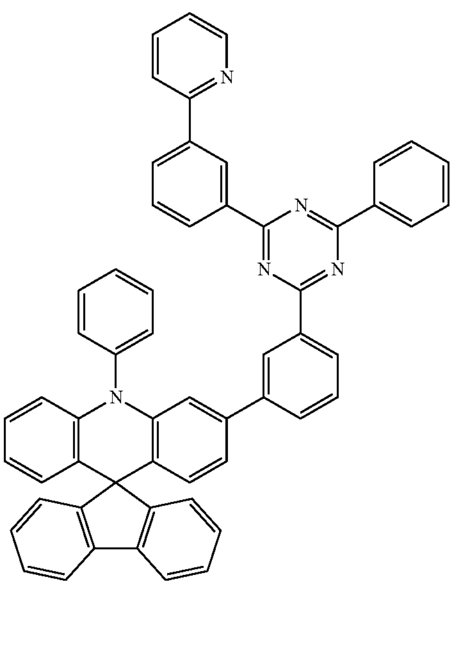
-continued
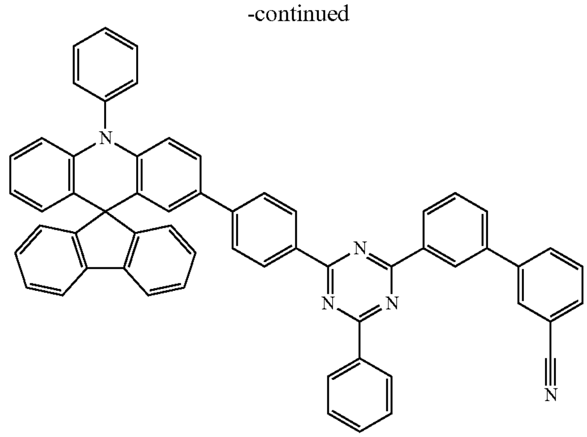
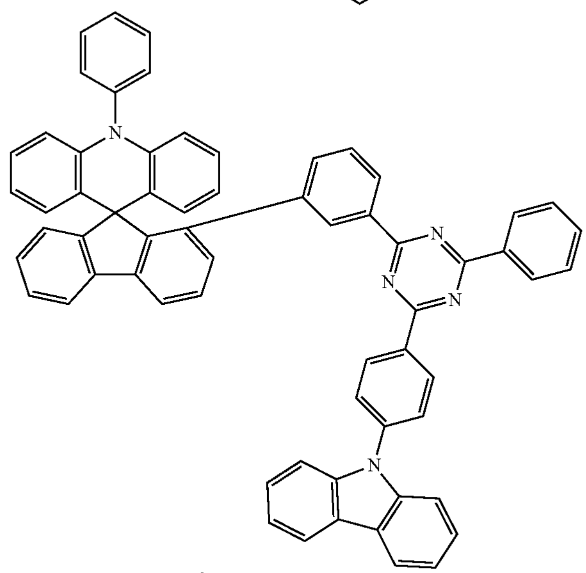
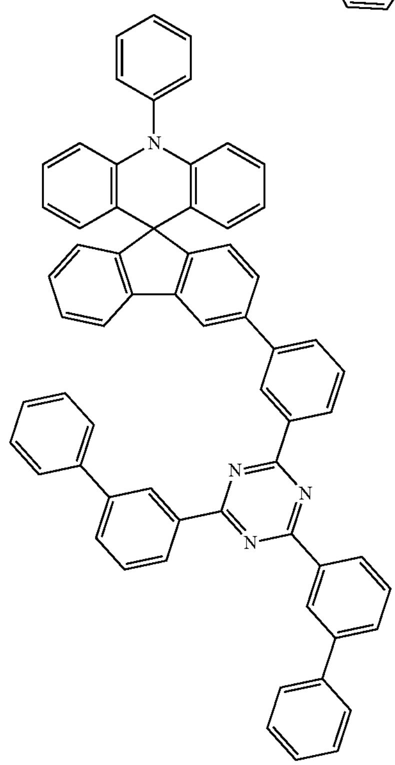

-continued
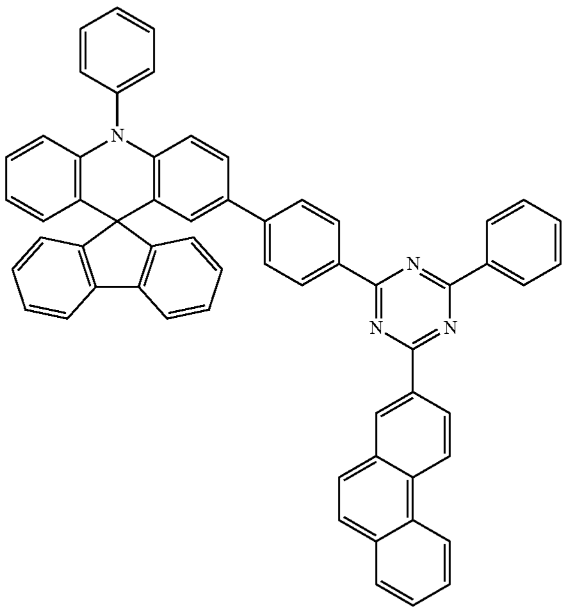
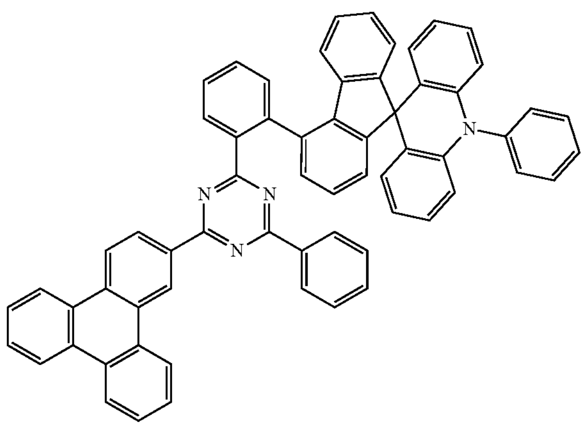
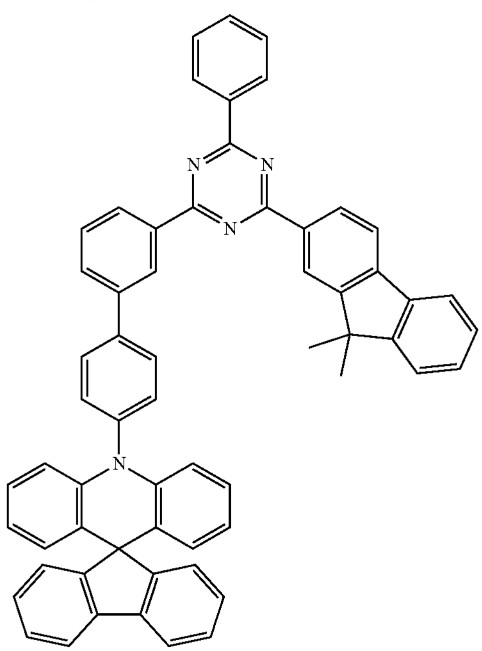
-continued
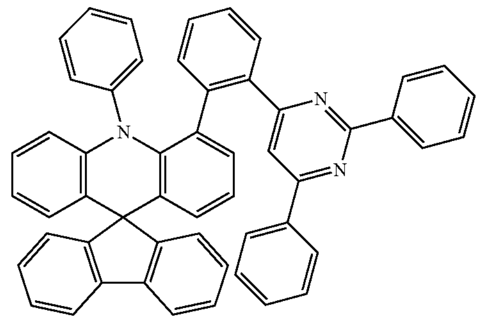
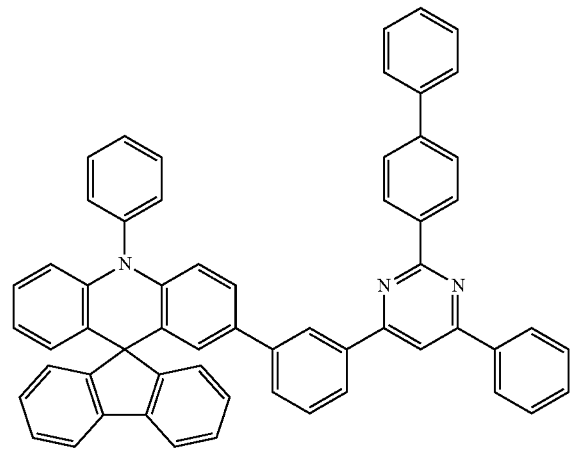
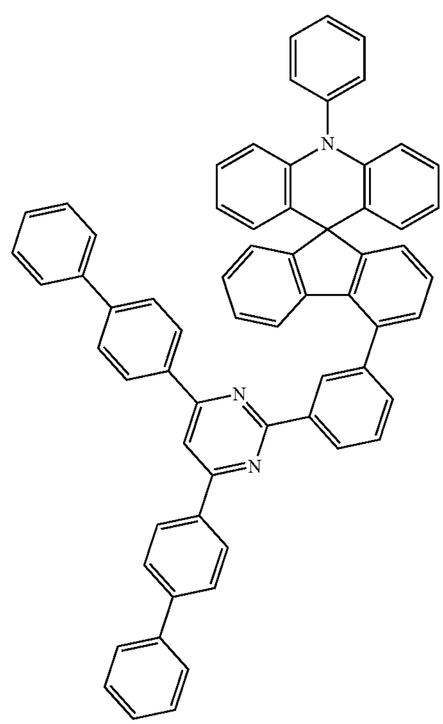

-continued
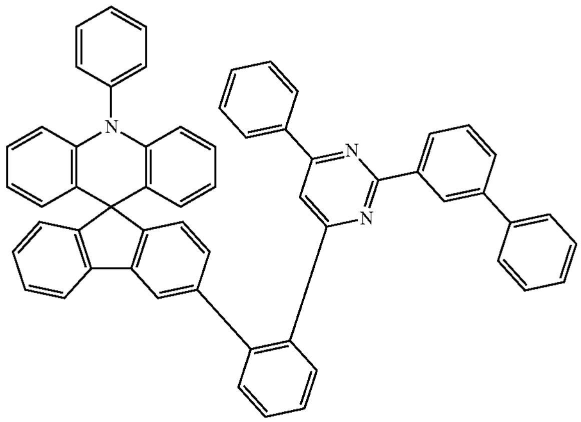
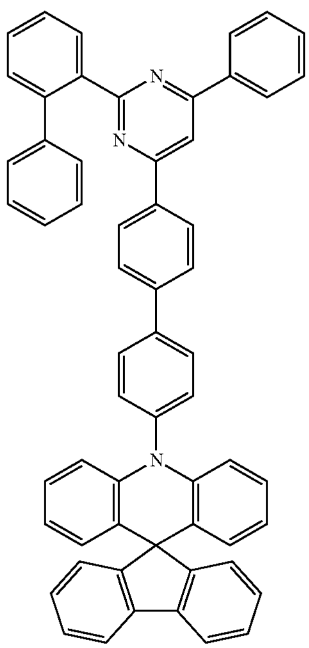
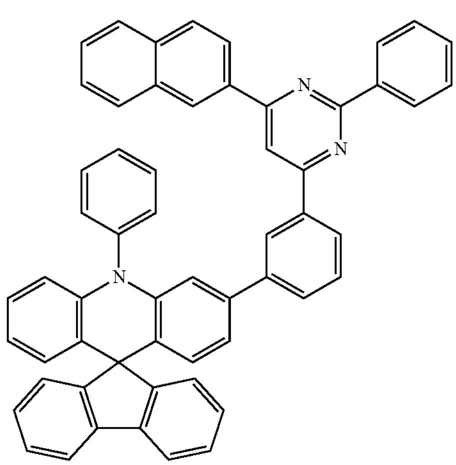
-continued
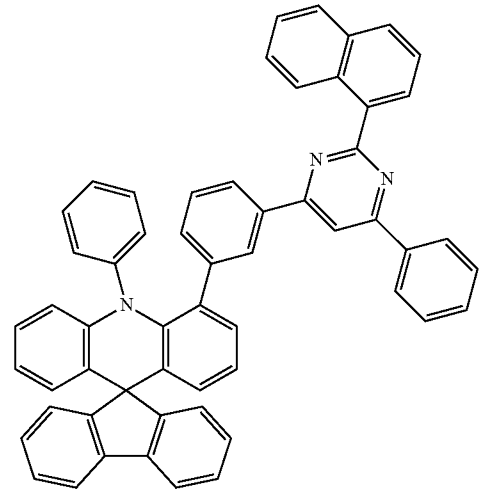
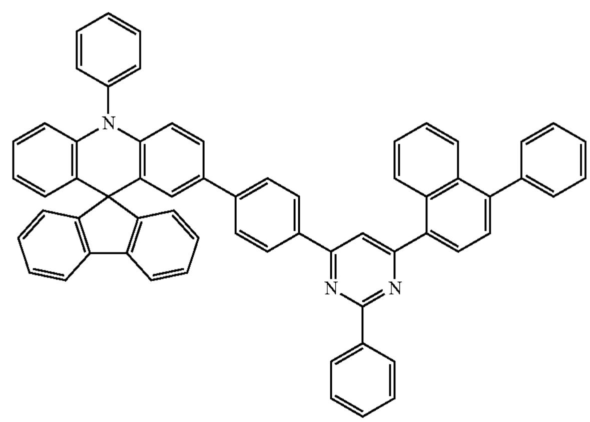
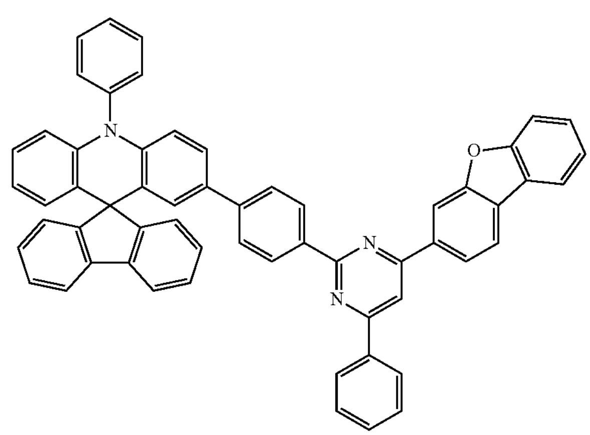

-continued
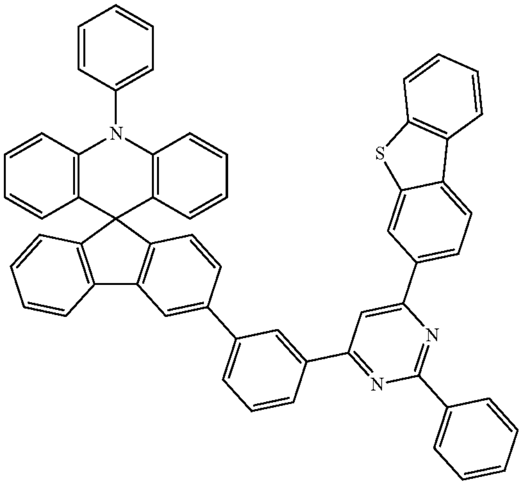
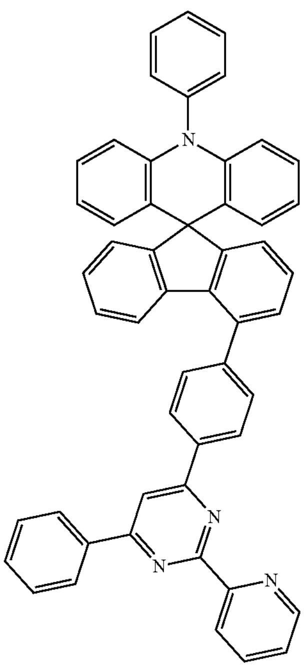
-continued
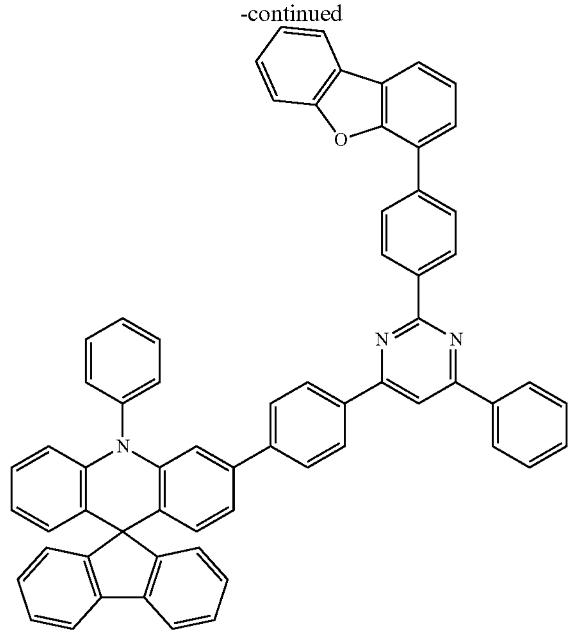
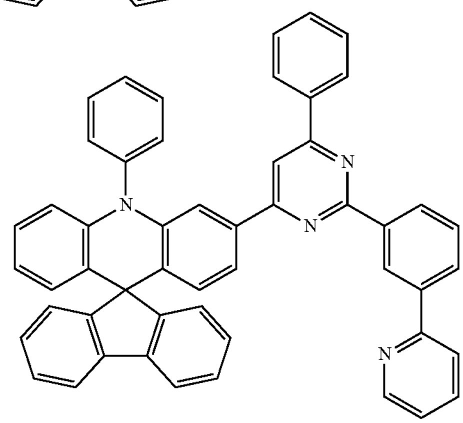
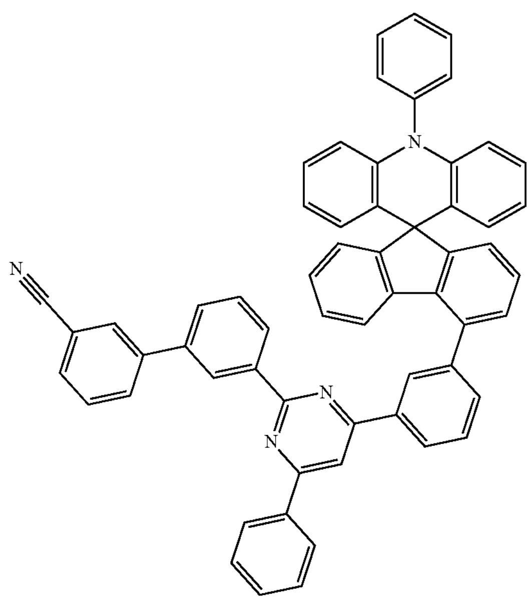

-continued
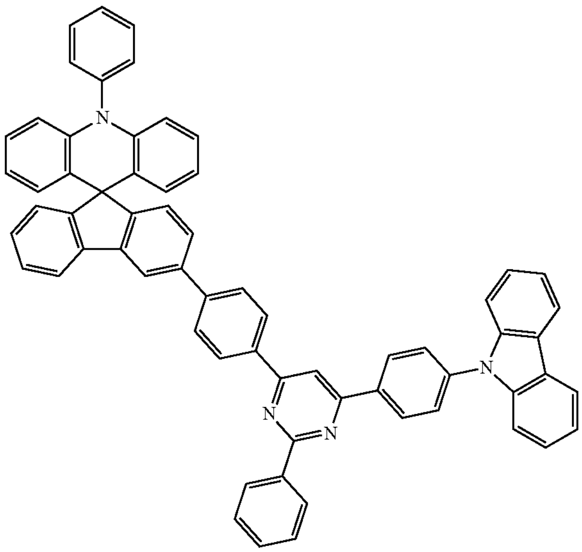
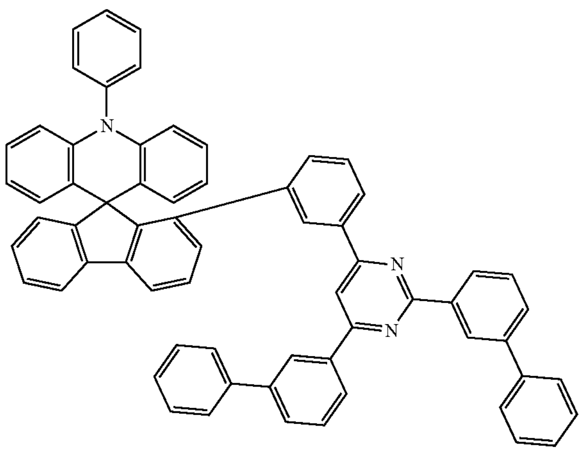
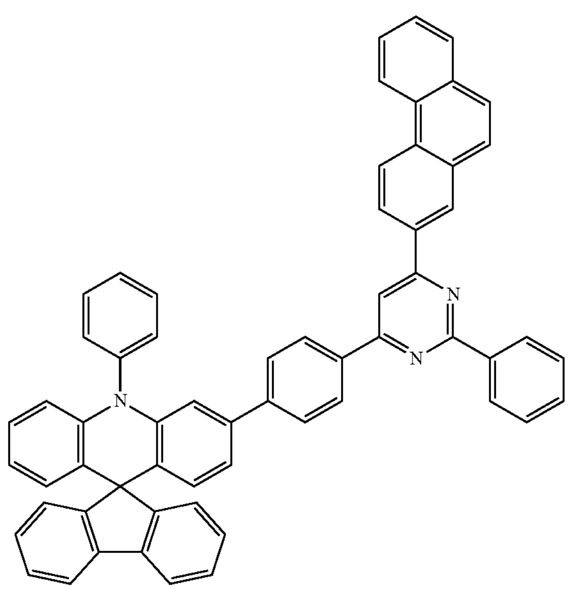
-continued
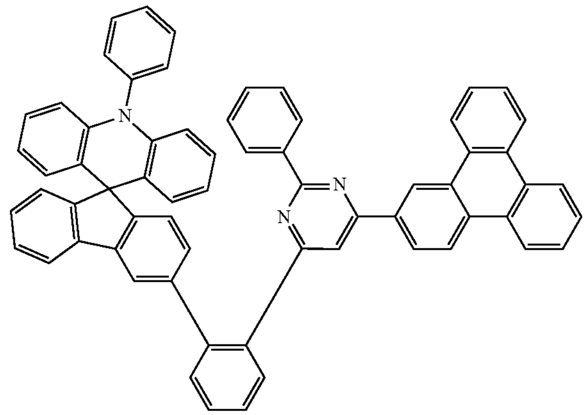
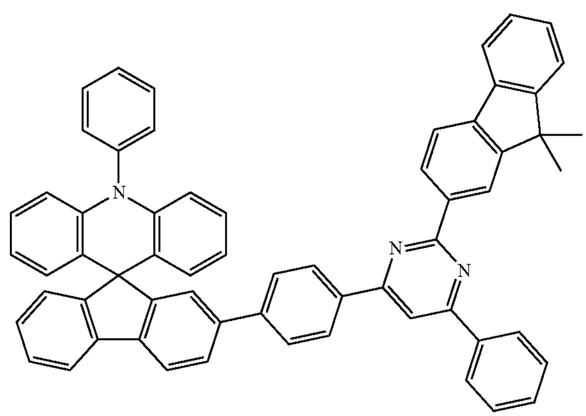
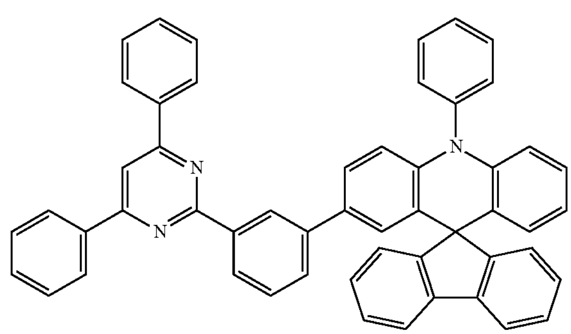

-continued
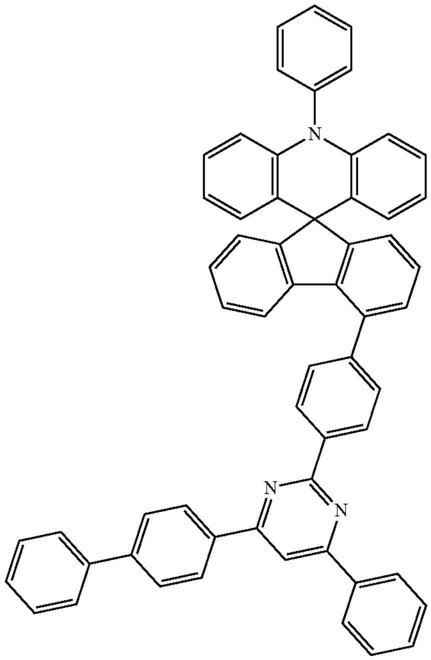
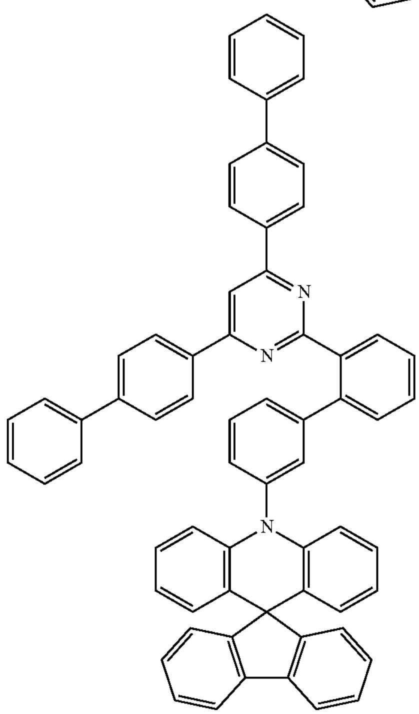
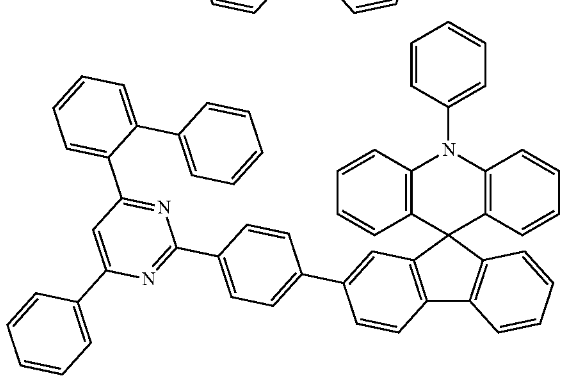
-continued
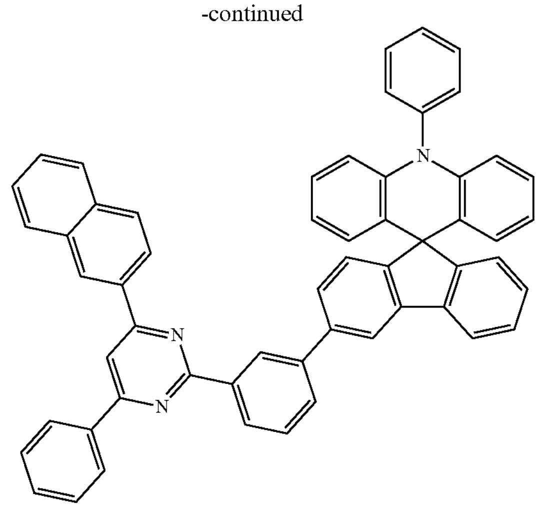
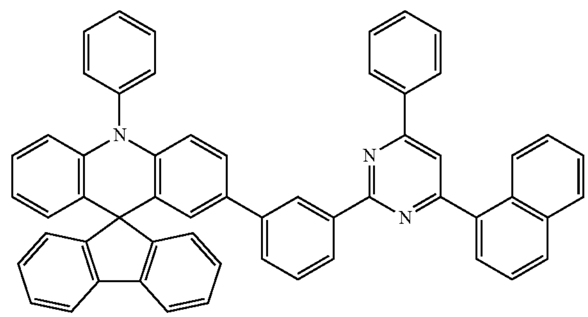
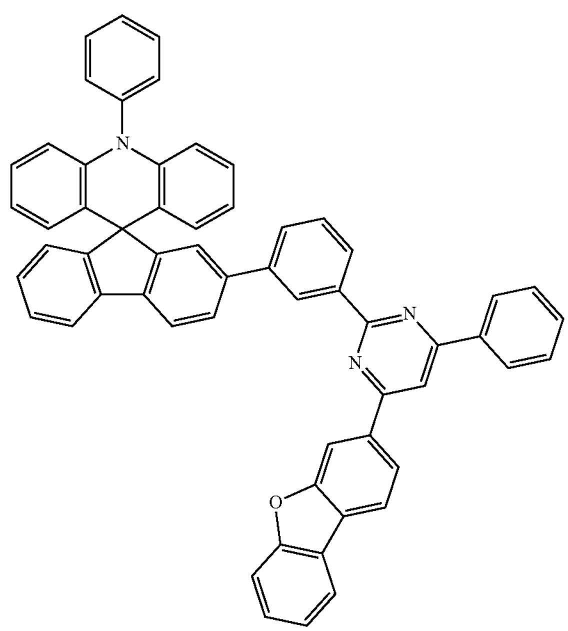

-continued
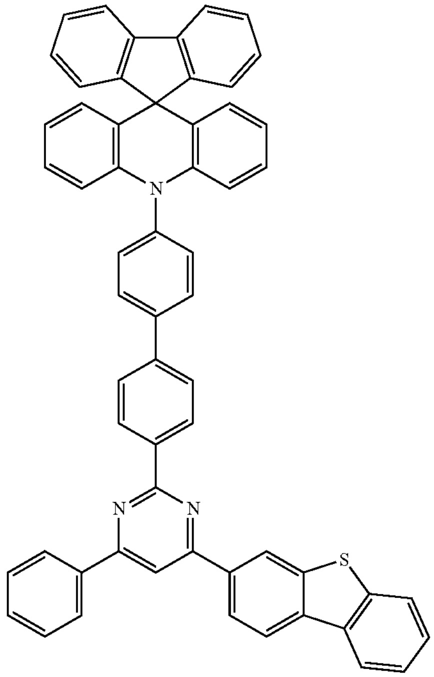
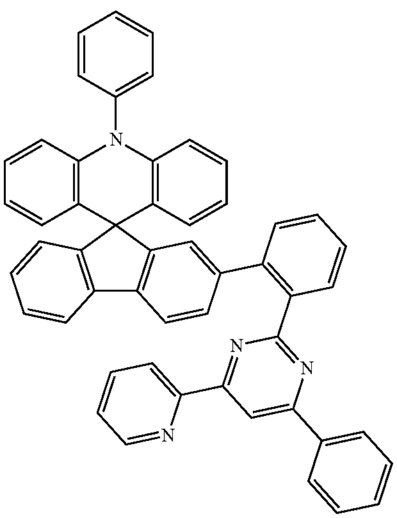
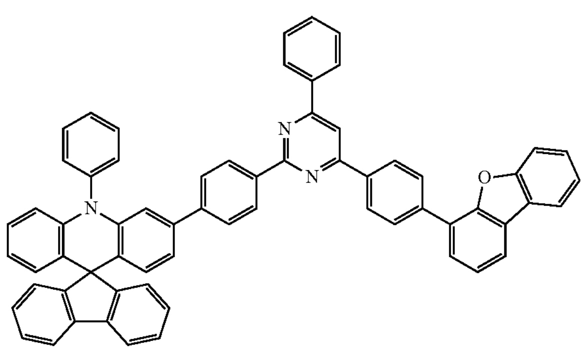
-continued
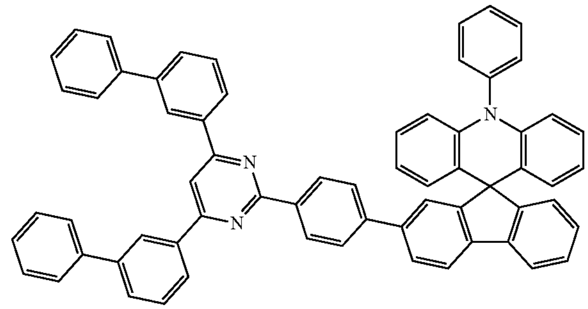
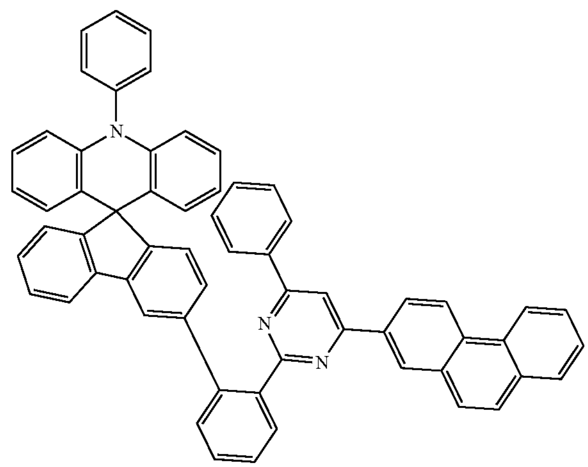
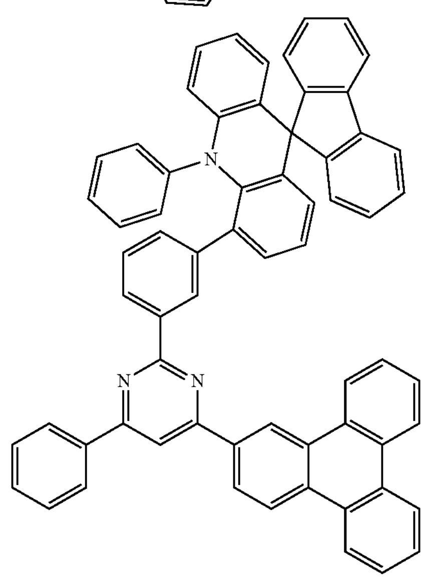
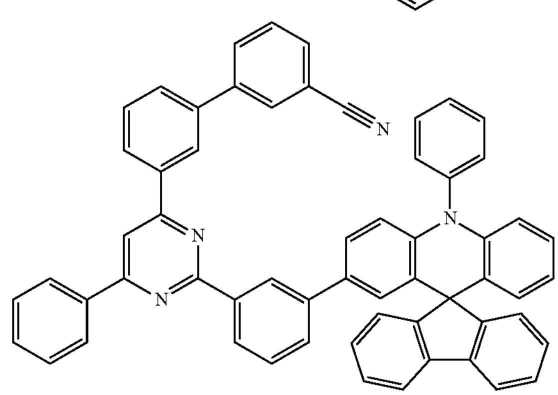

-continued
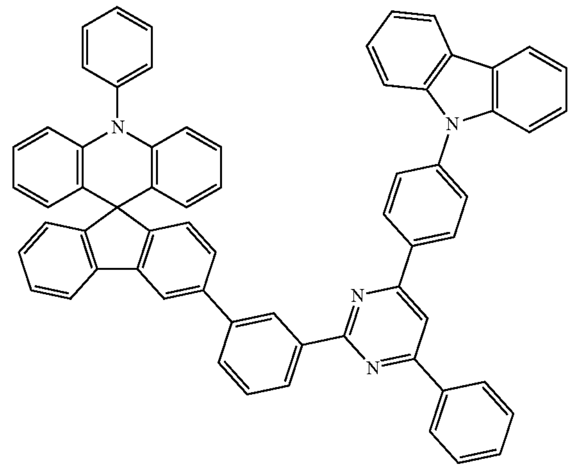
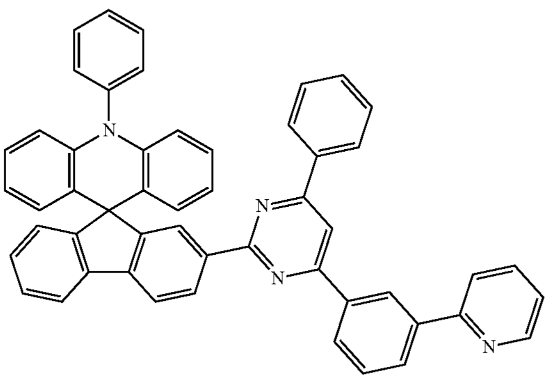
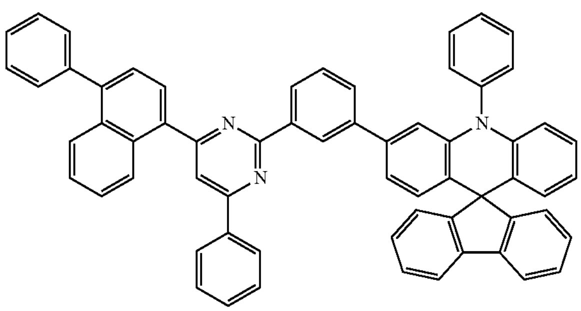
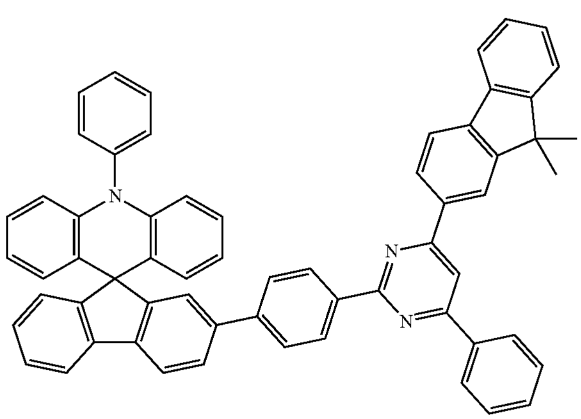
-continued
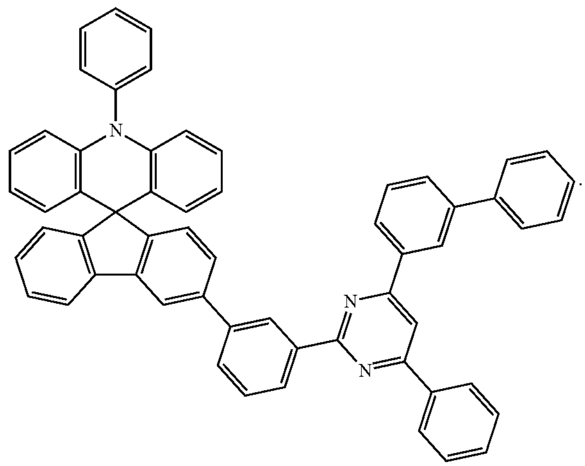
Furthermore, according to an exemplary embodiment of the present specification, the spiro compound can be any one compound selected from the following compounds:
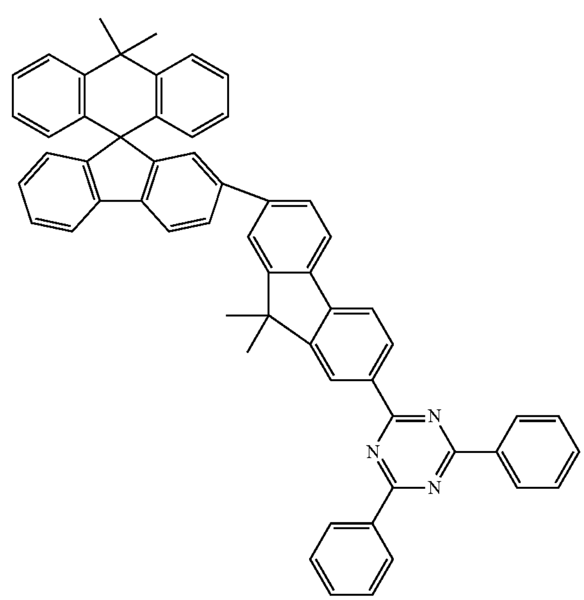

-continued
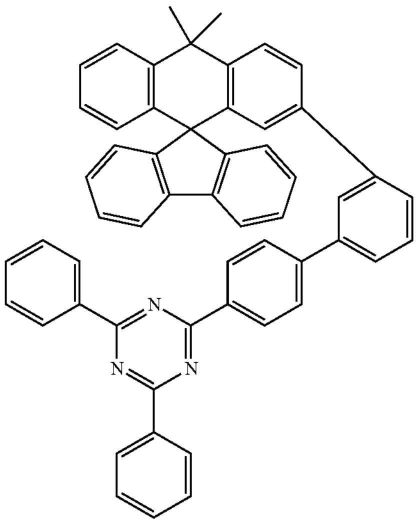
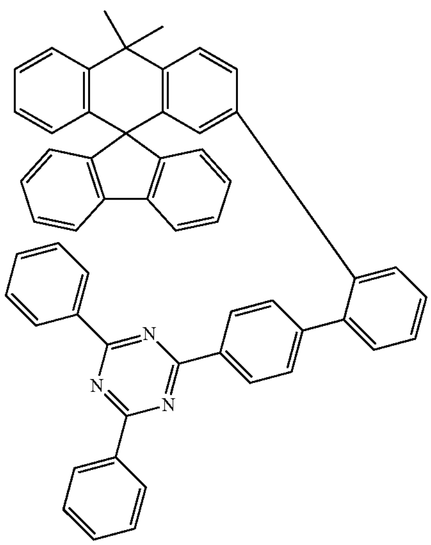
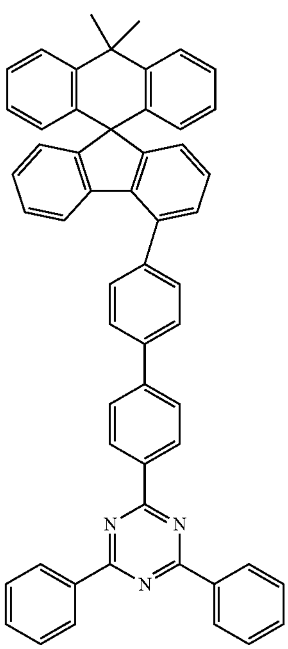
-continued
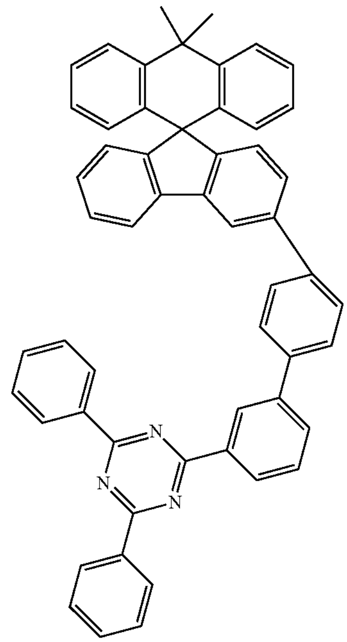
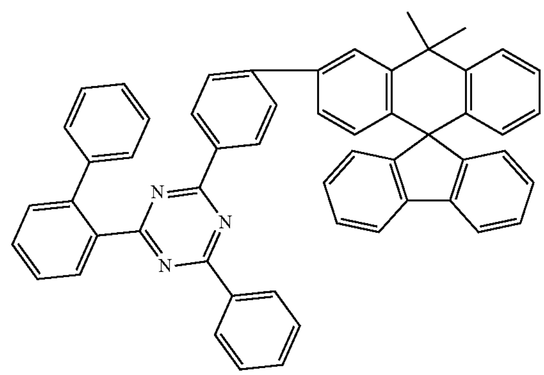
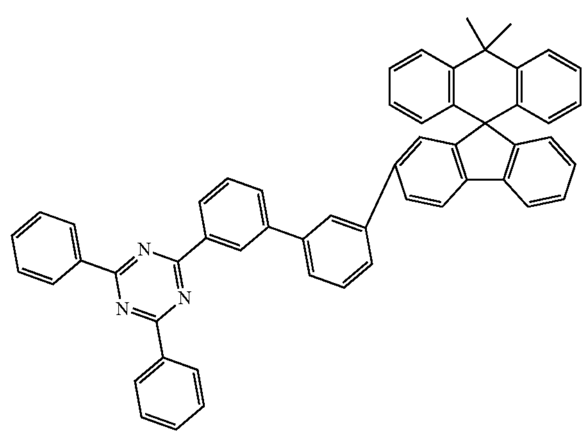

-continued
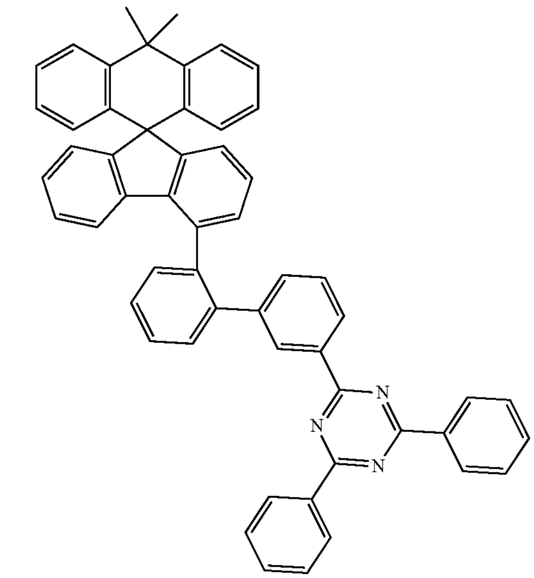
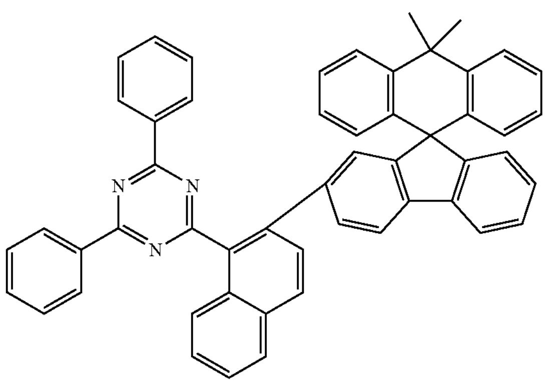
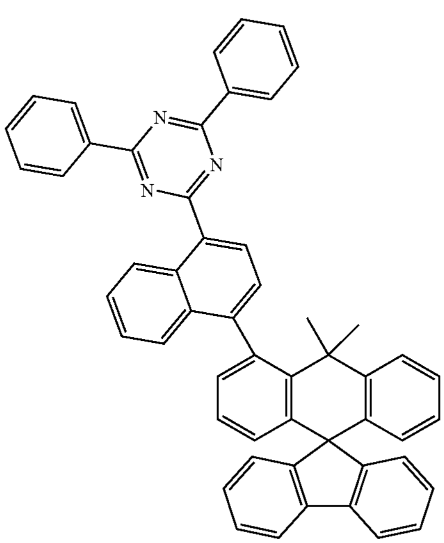
-continued
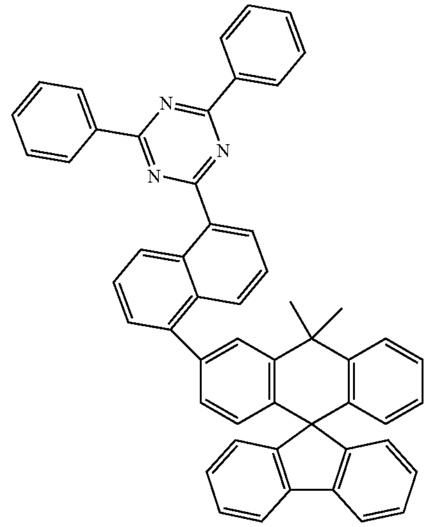
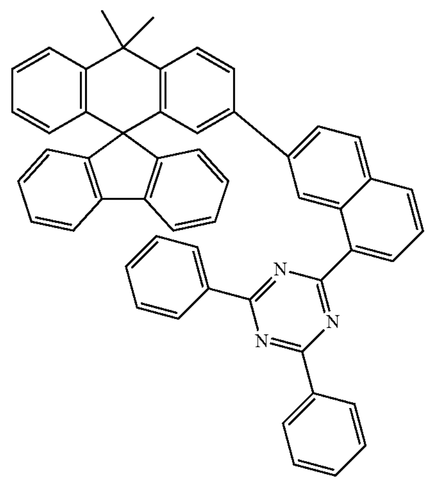
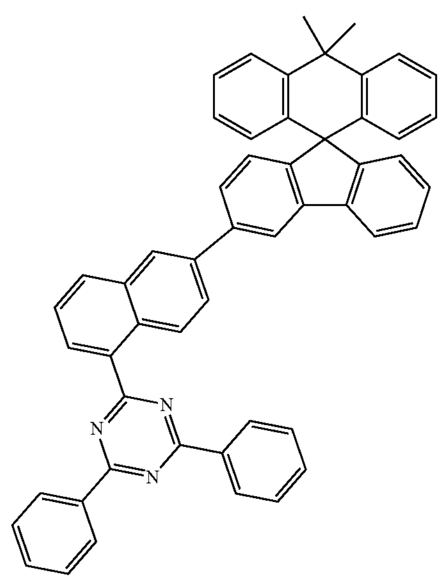

-continued
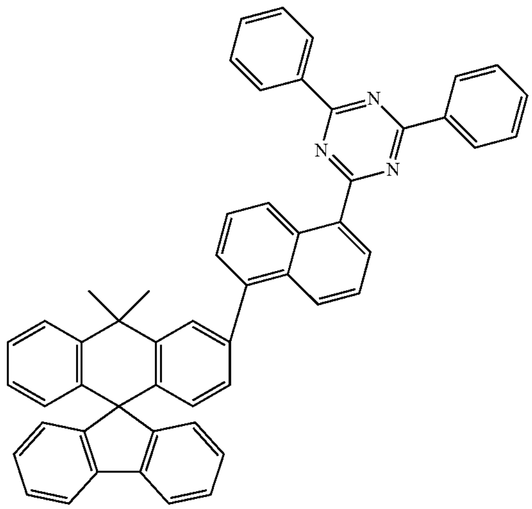
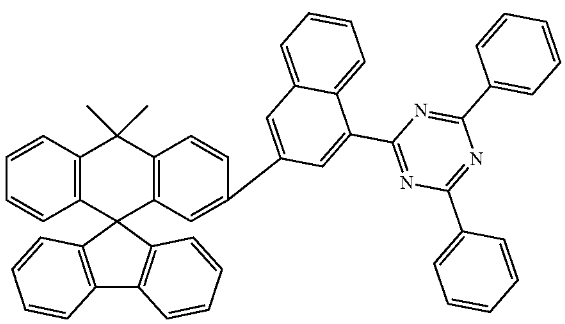
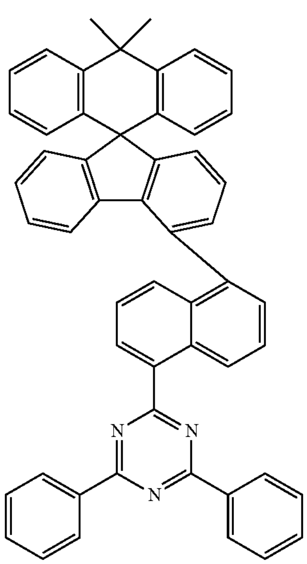
-continued
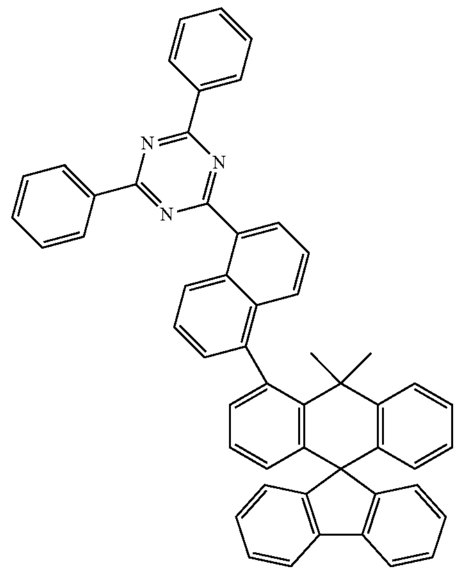
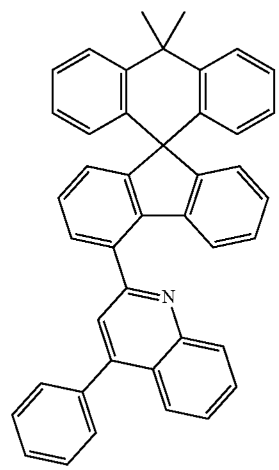
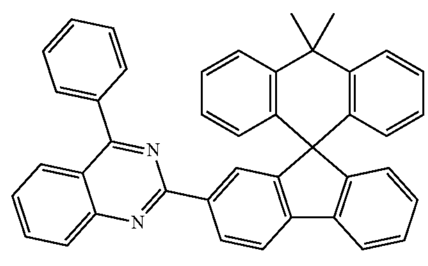
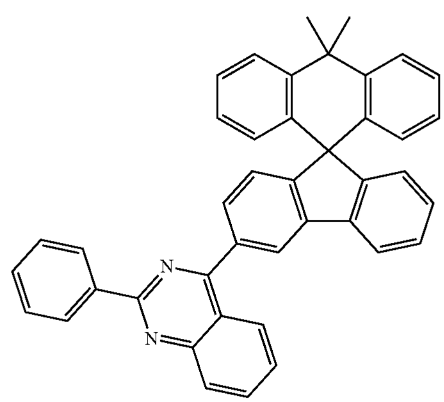

-continued
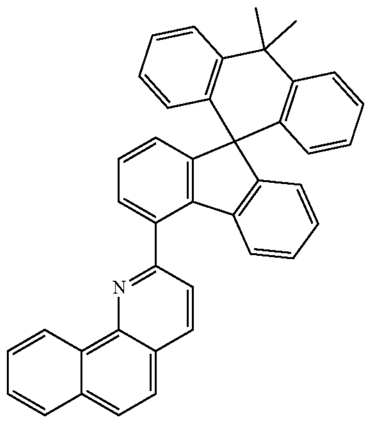
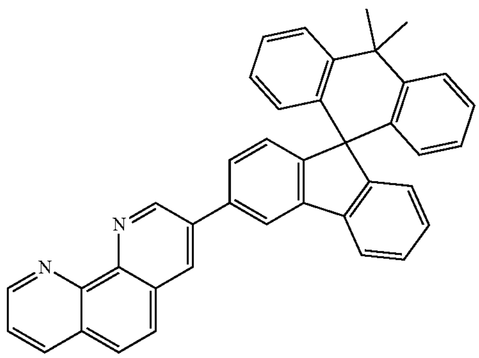
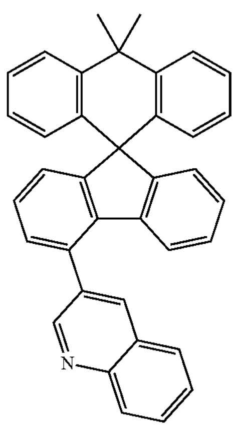
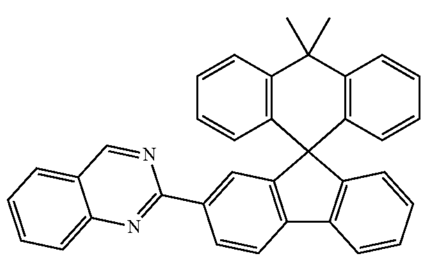
-continued
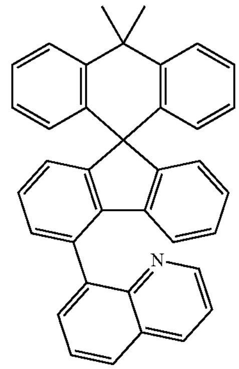
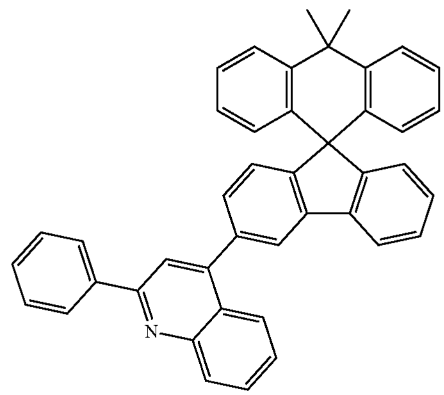
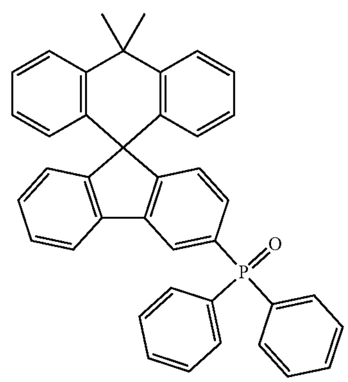
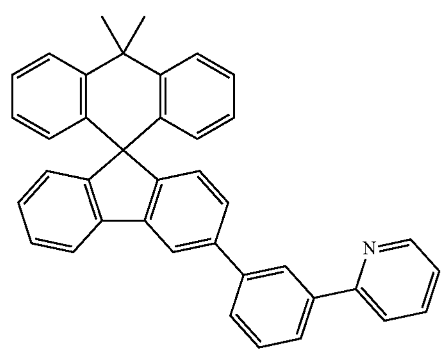

-continued
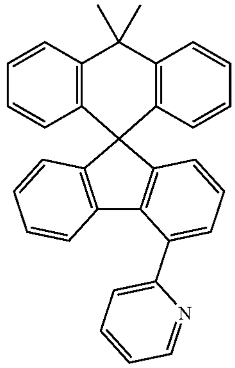
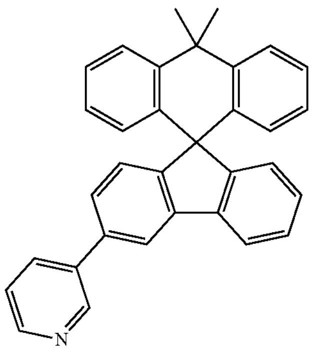
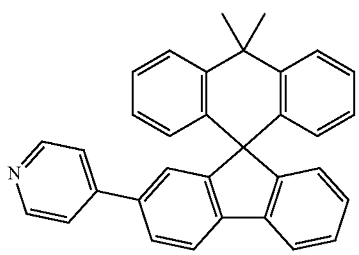
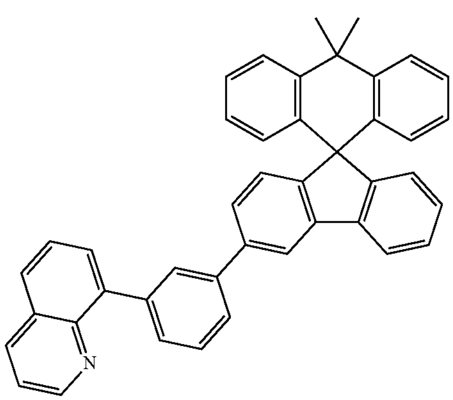
-continued
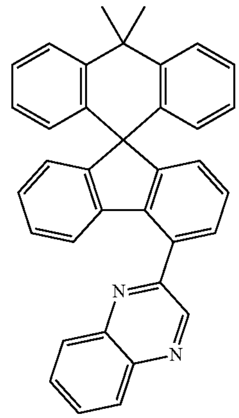
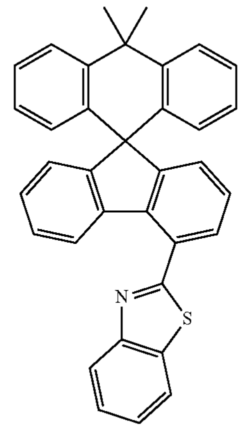
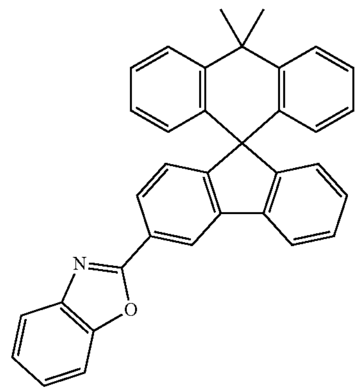
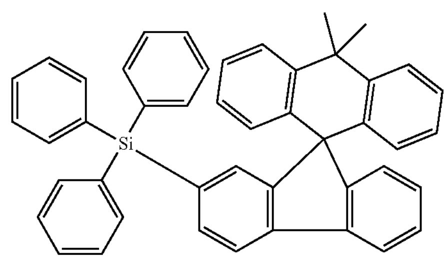
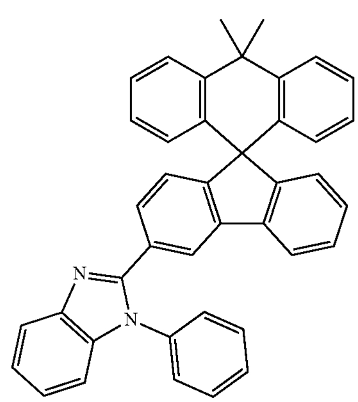

-continued
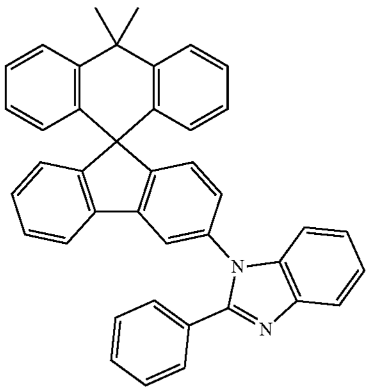
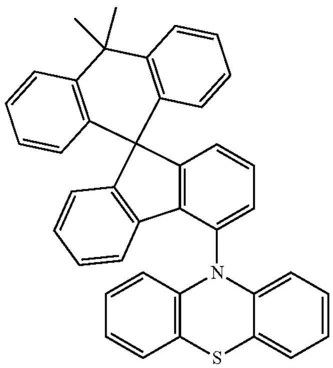
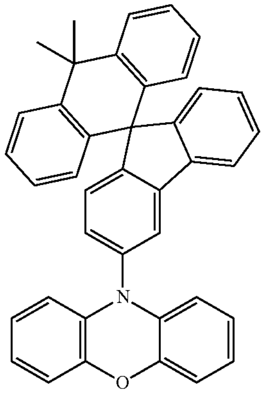
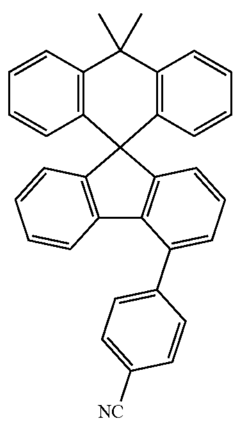
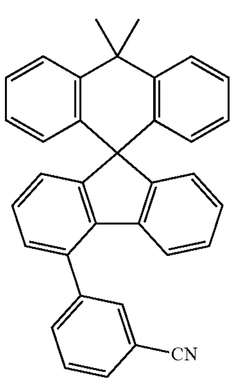
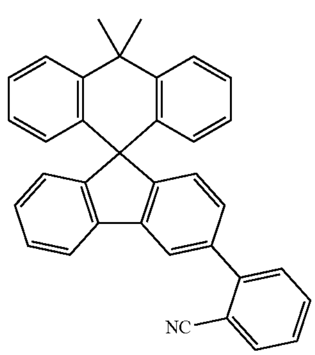
-continued
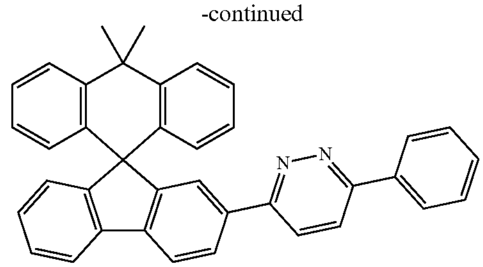
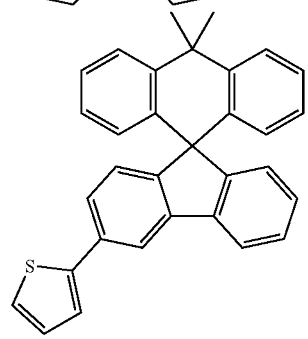
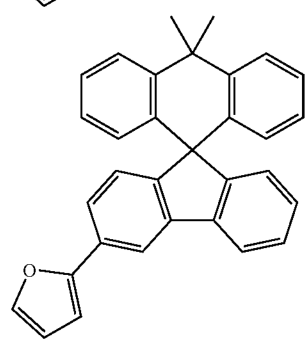
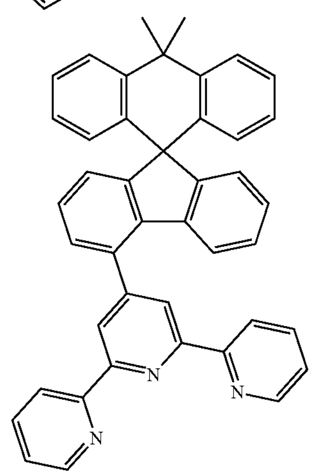
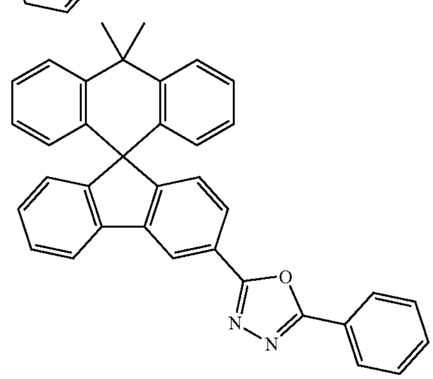

-continued
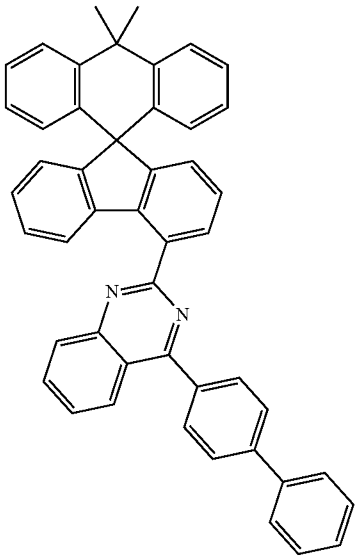
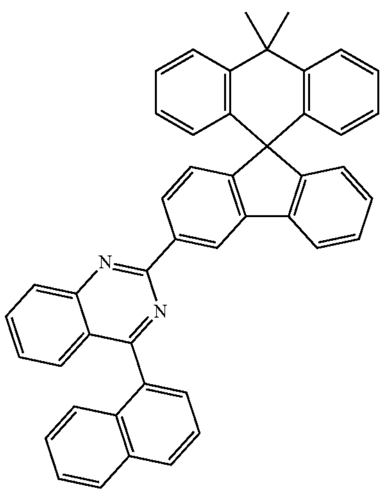
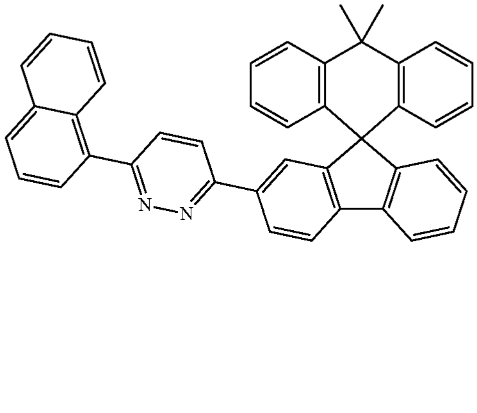
-continued
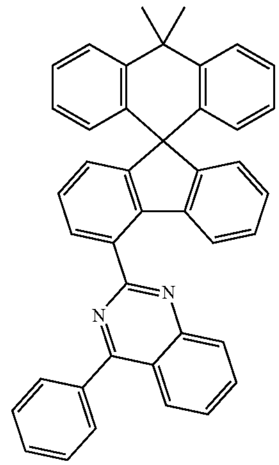
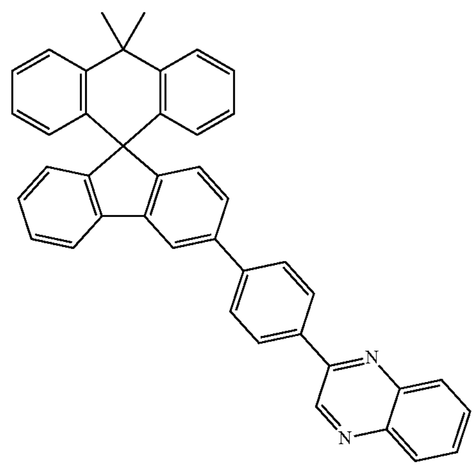
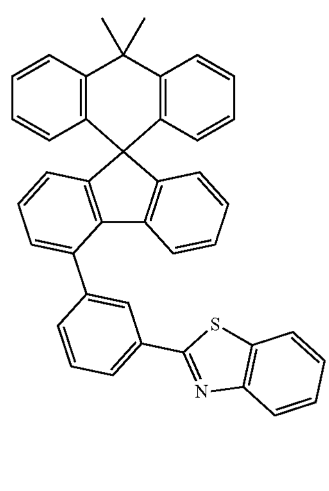

-continued
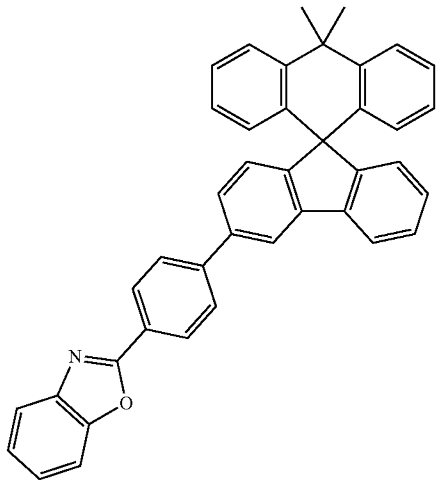
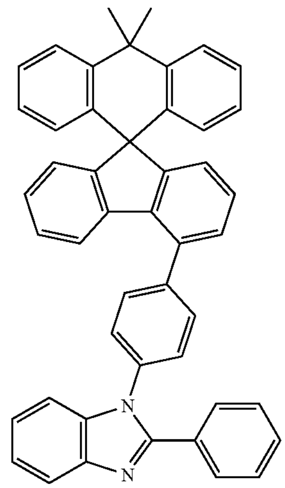
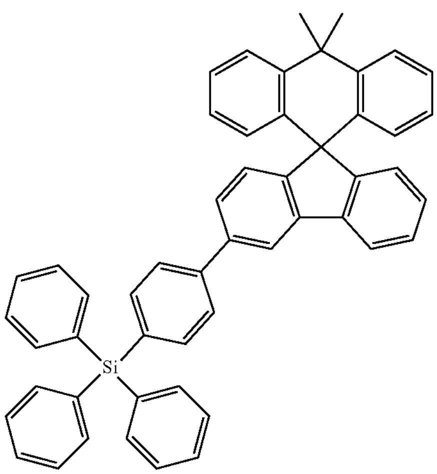
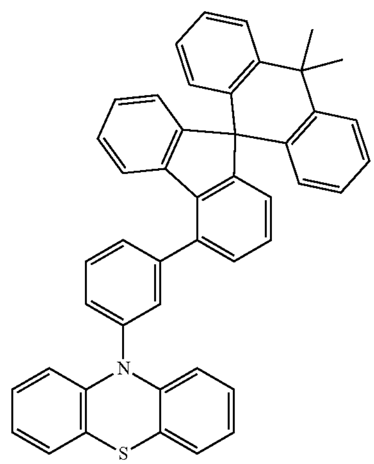
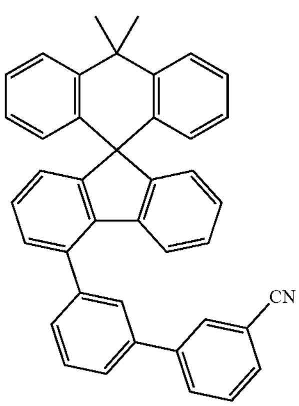
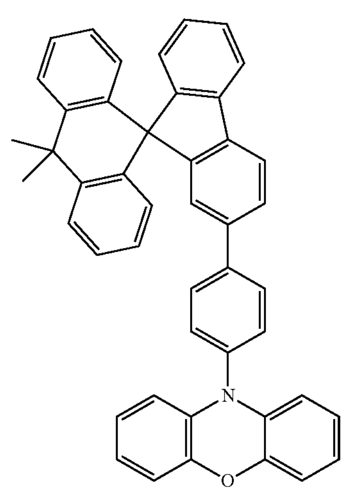

-continued
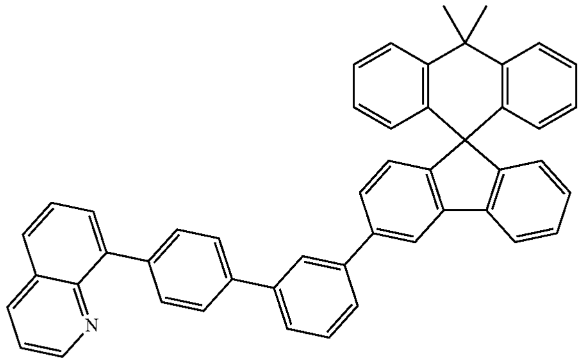
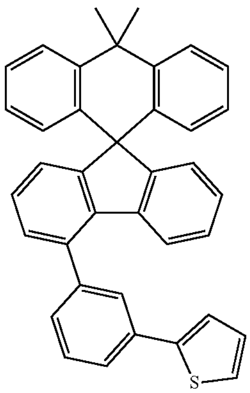
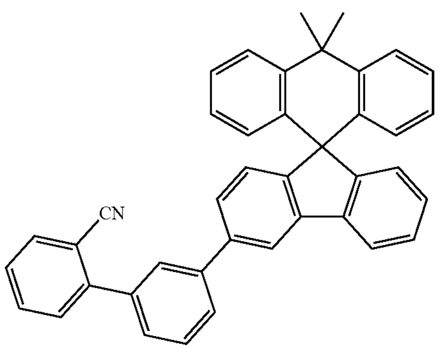
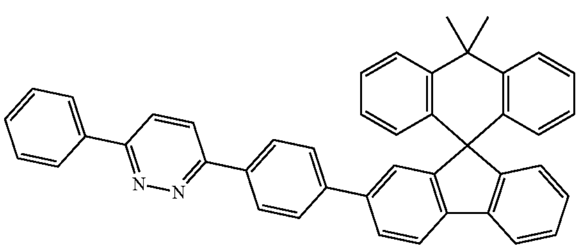
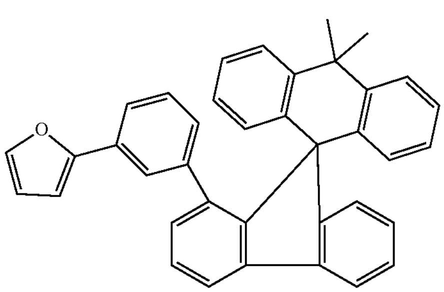
-continued
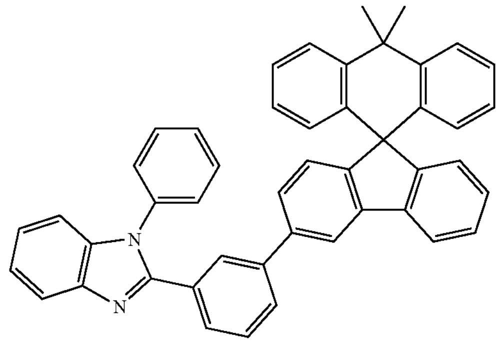
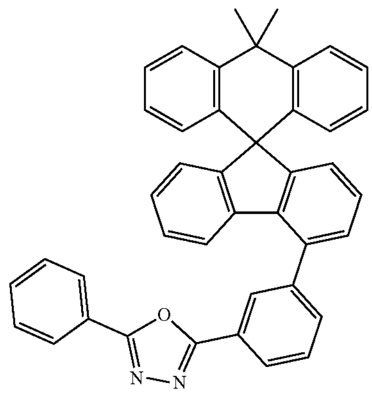
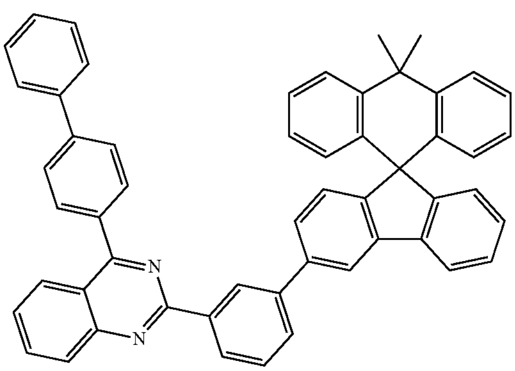
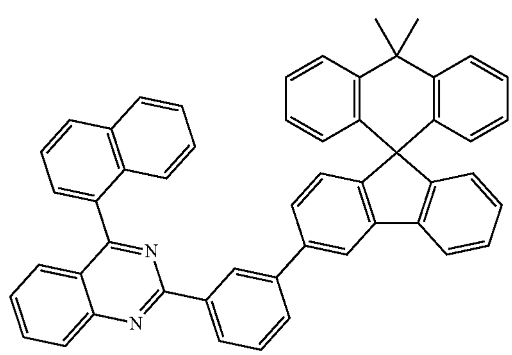

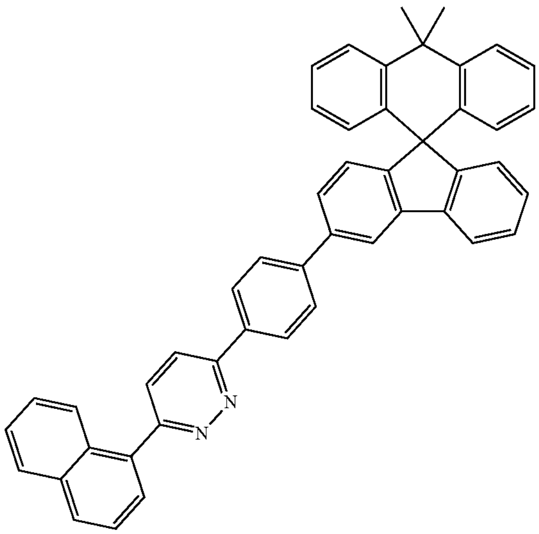
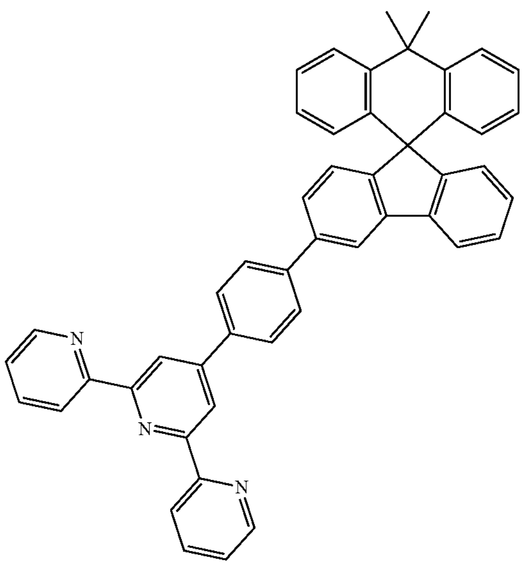
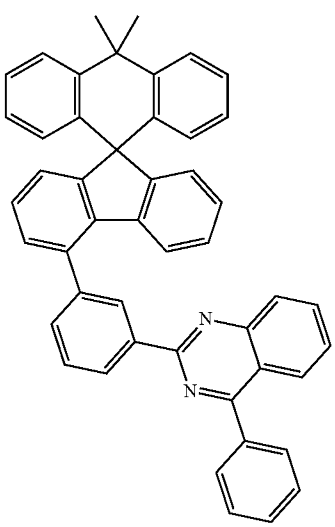
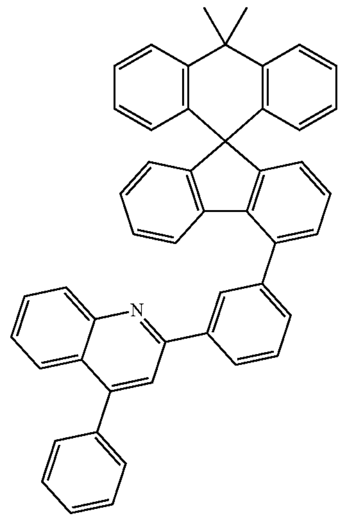
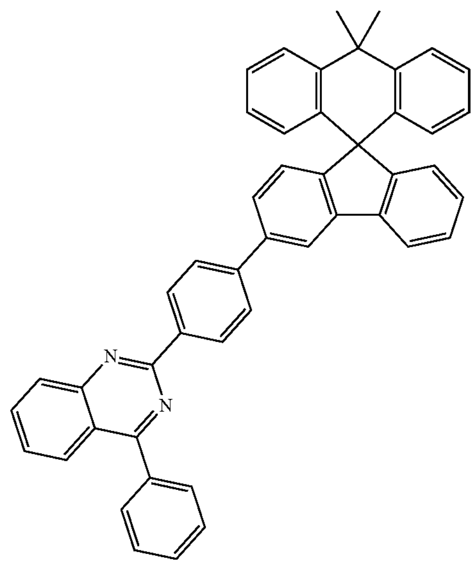
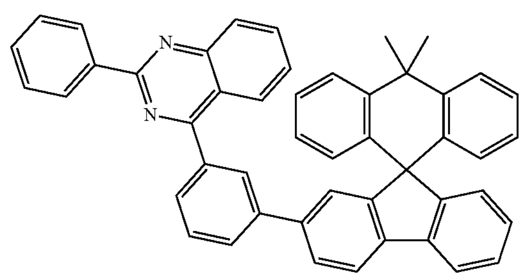
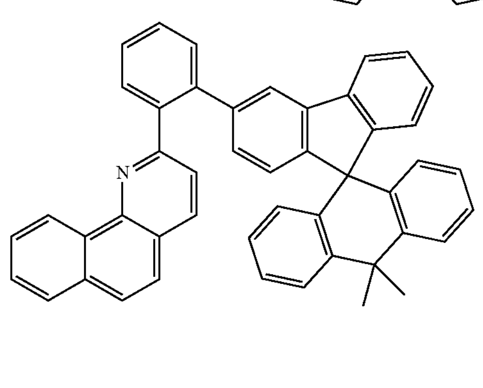

-continued
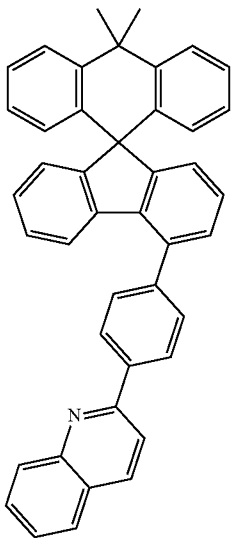
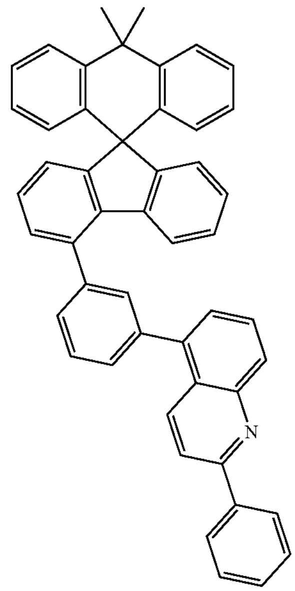
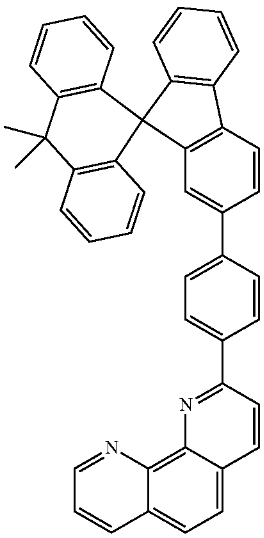
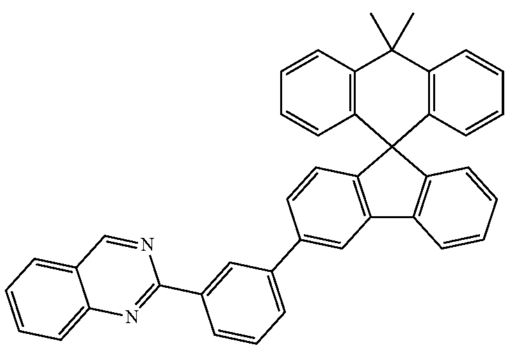
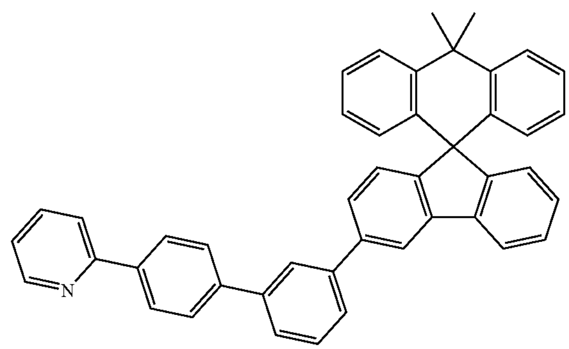
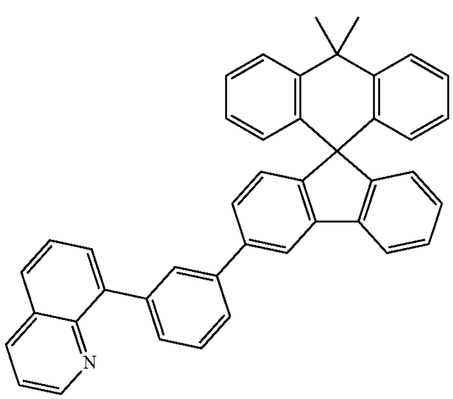
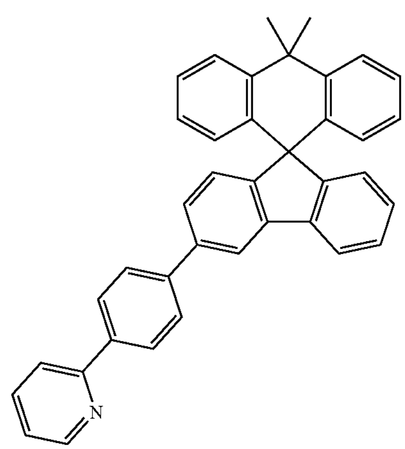

-continued
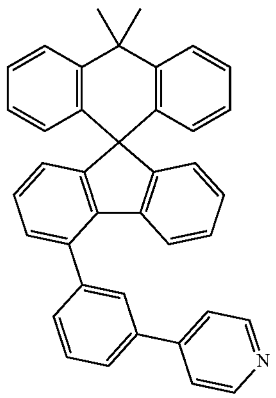
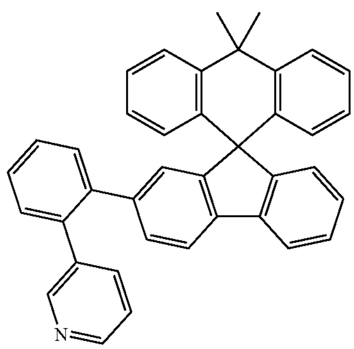
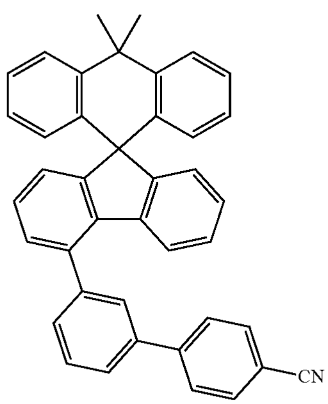
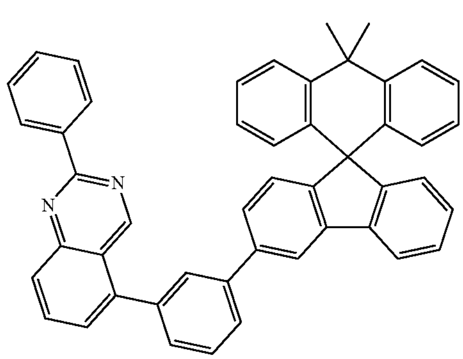
-continued
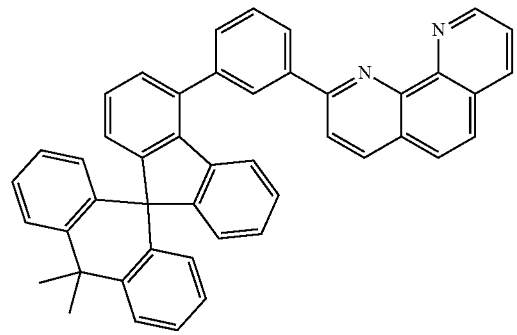
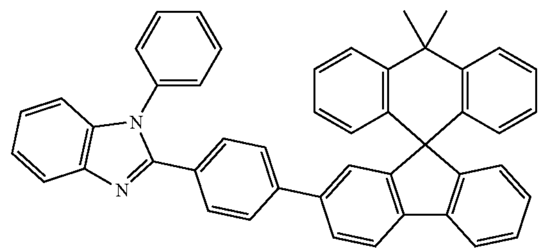
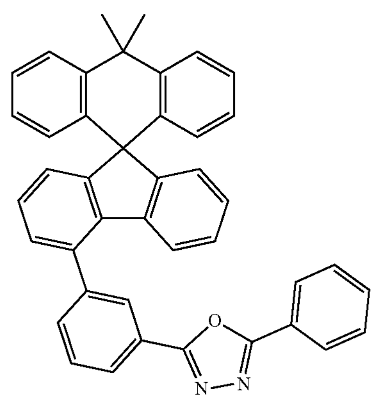
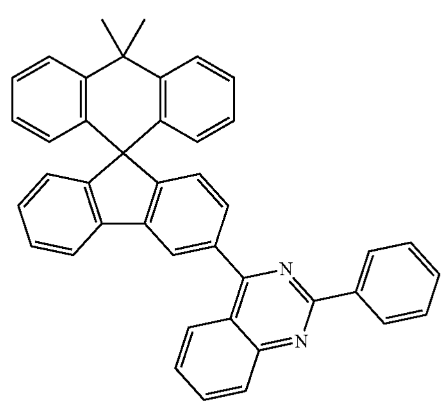

-continued
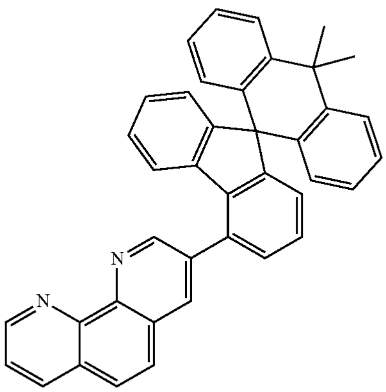
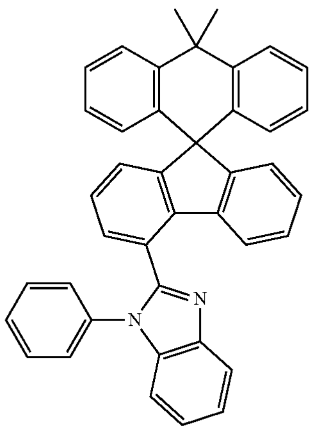
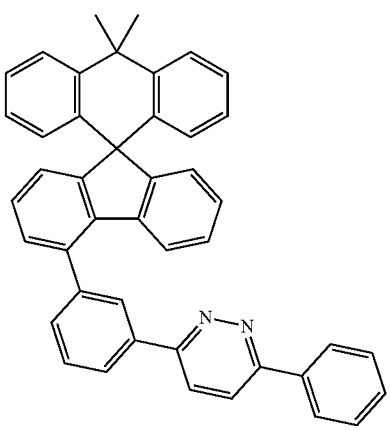
-continued
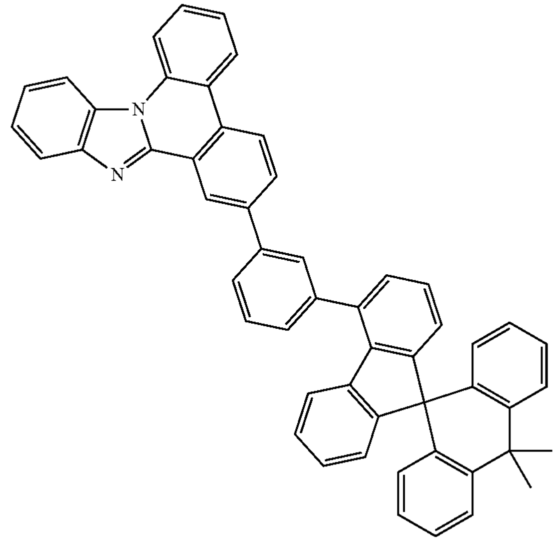
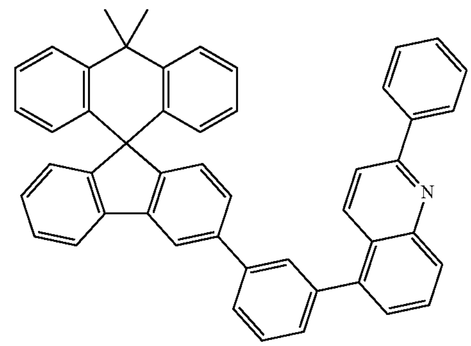
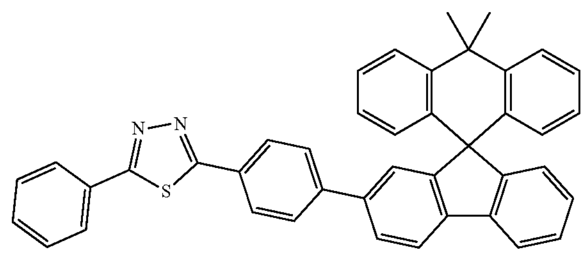
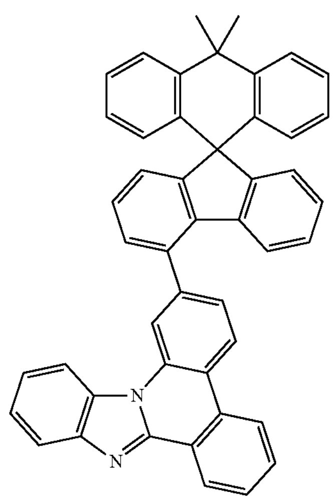

-continued
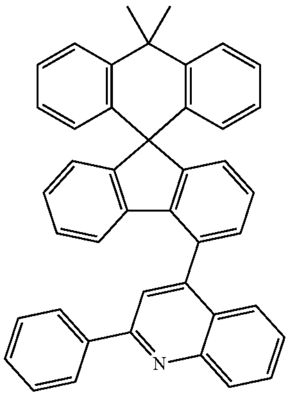
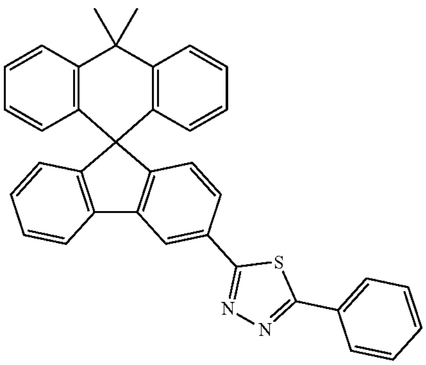
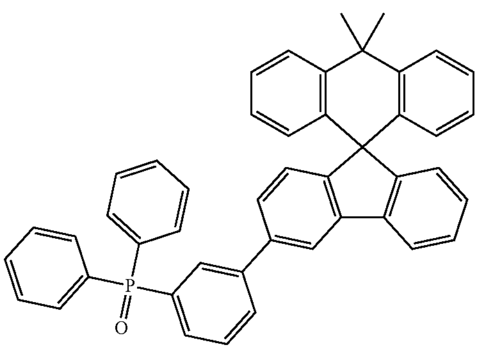
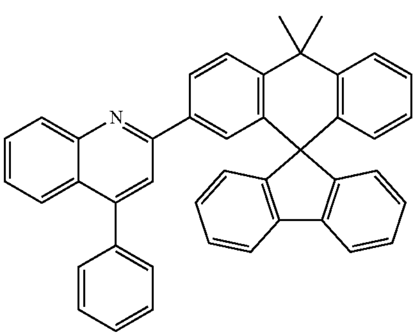
-continued
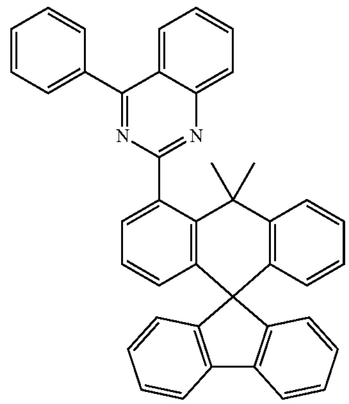
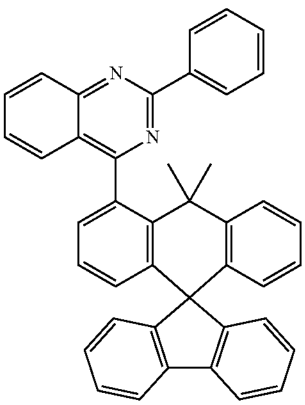
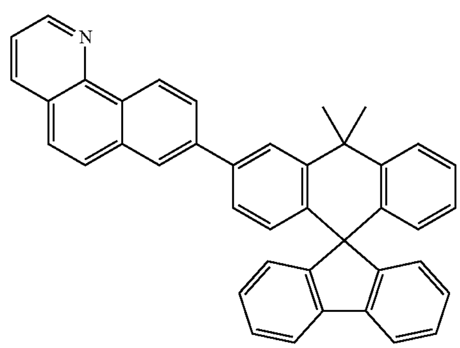
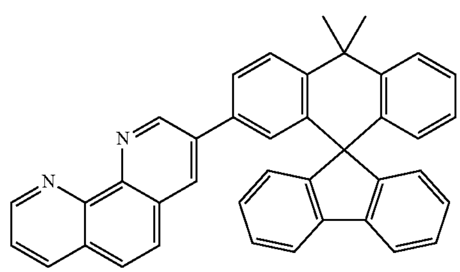

-continued
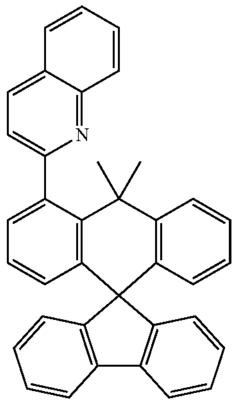
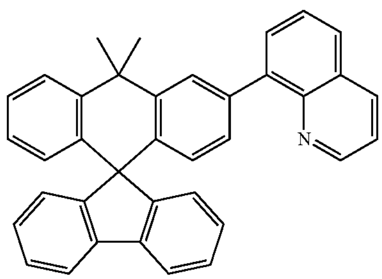
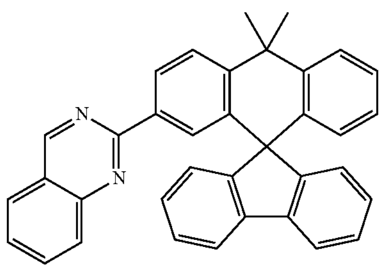
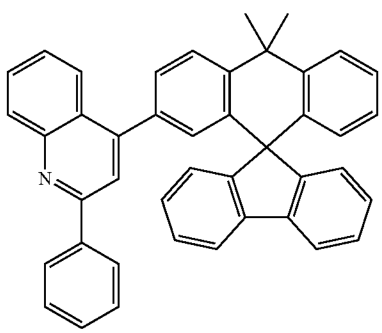
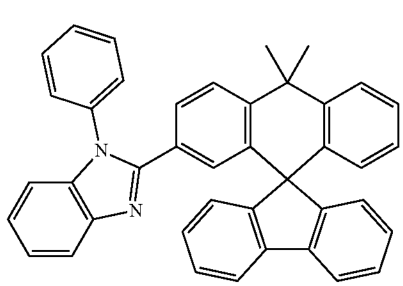
-continued
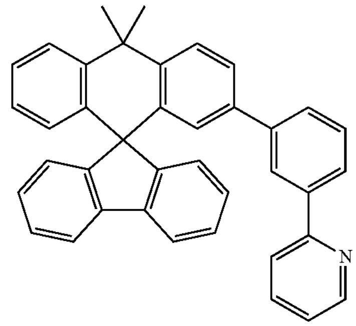
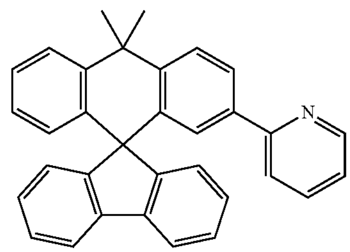
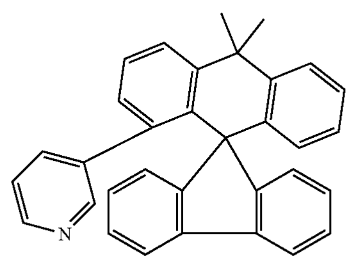
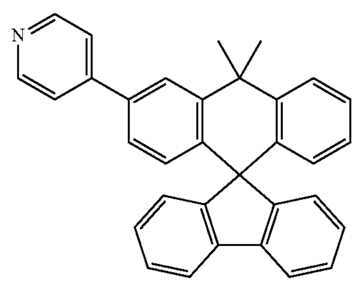
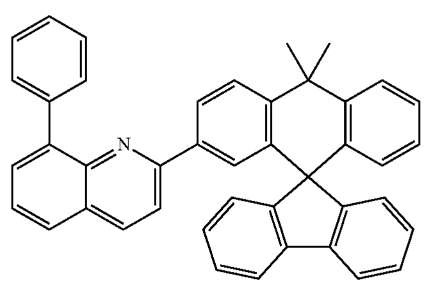
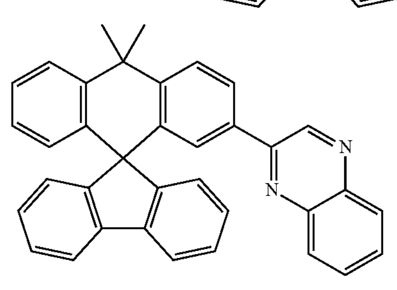

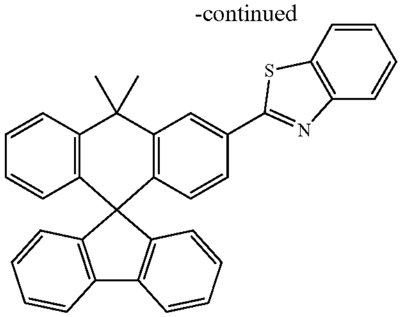
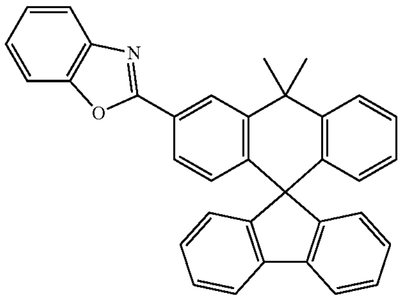
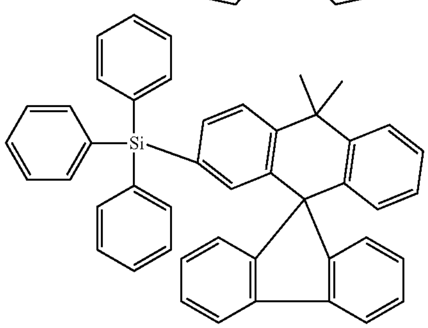
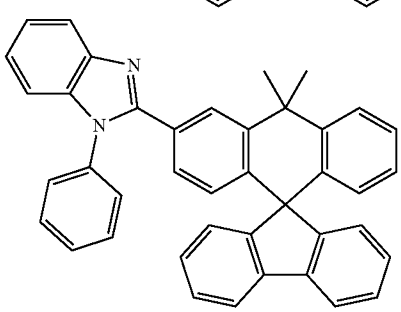
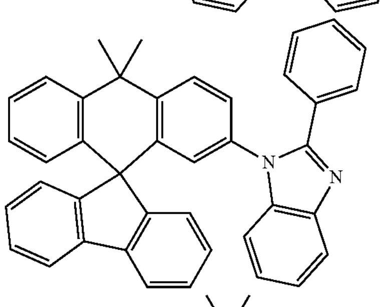
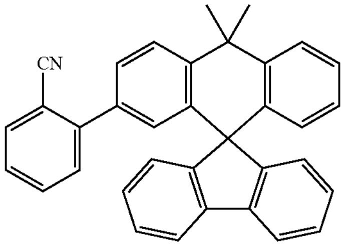
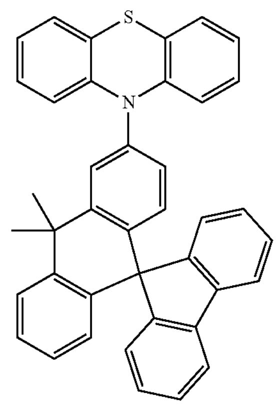
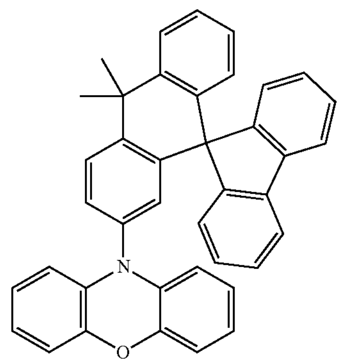
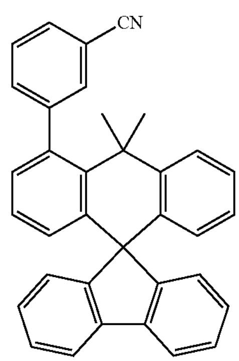
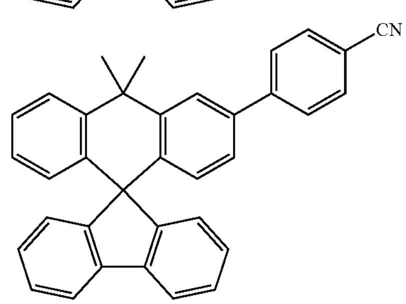
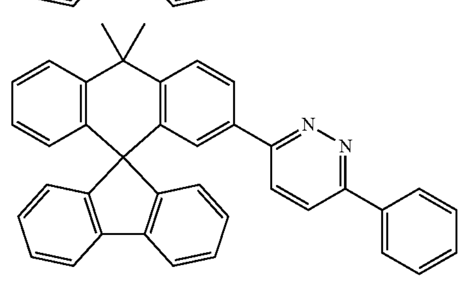

-continued
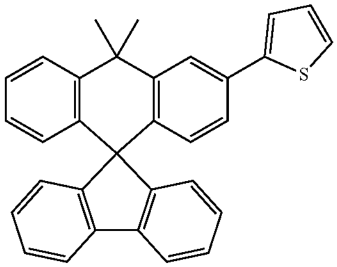
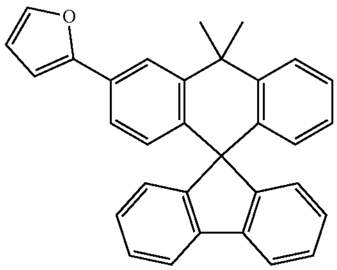
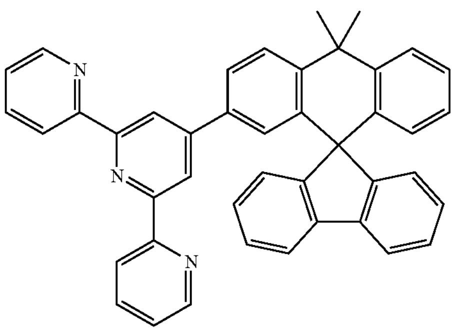
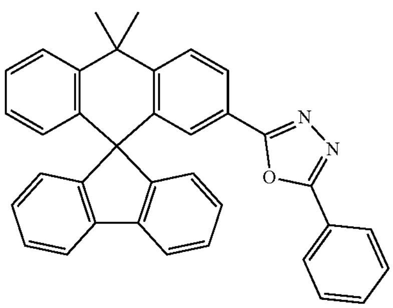
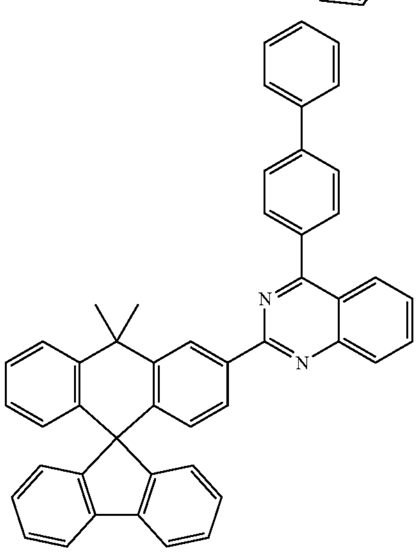
-continued
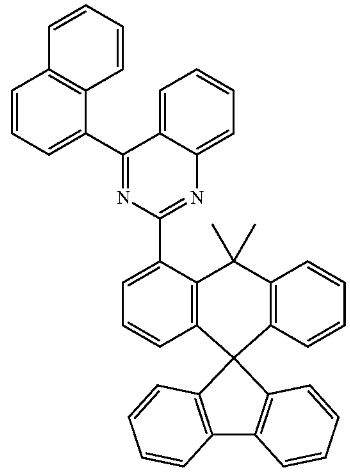
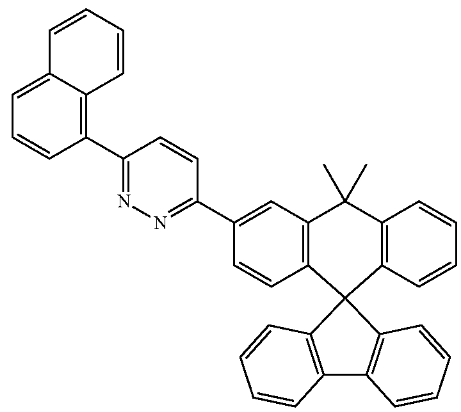
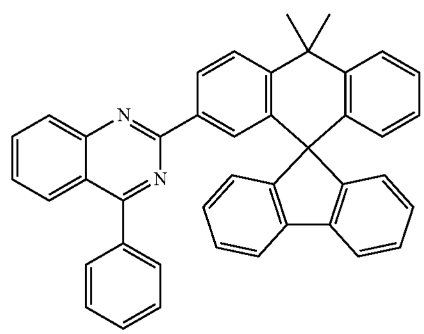
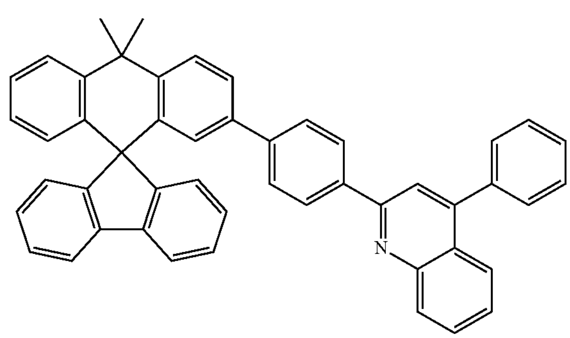

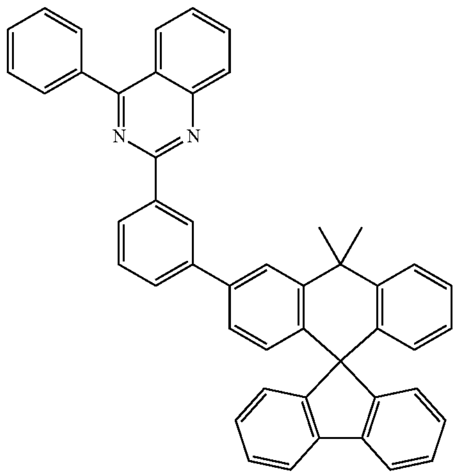
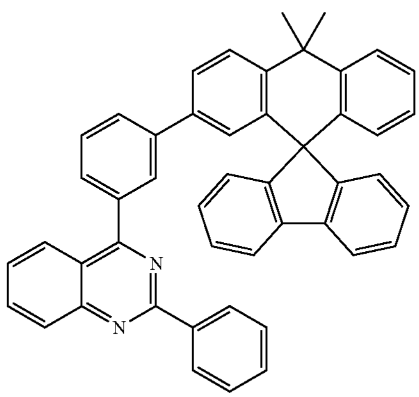
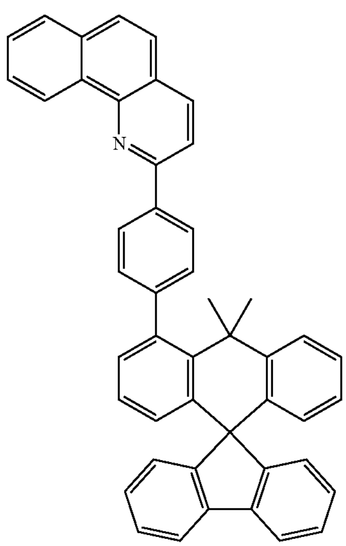
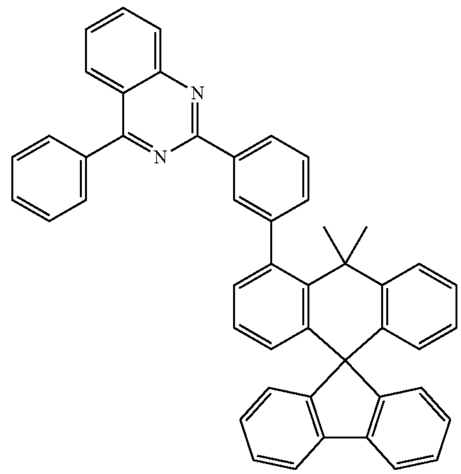
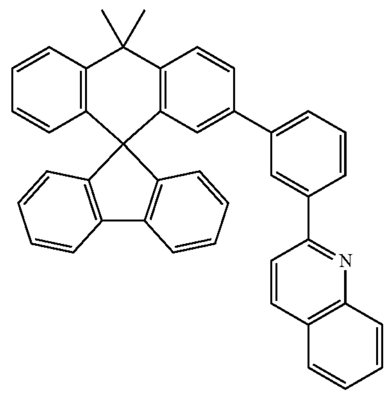
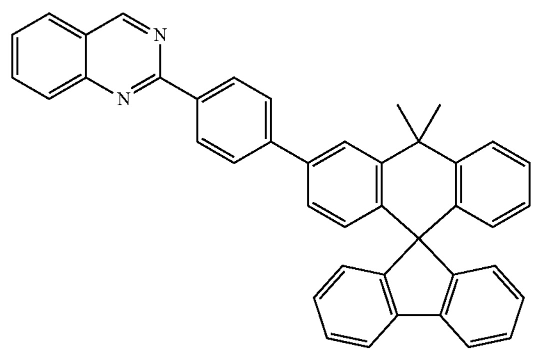
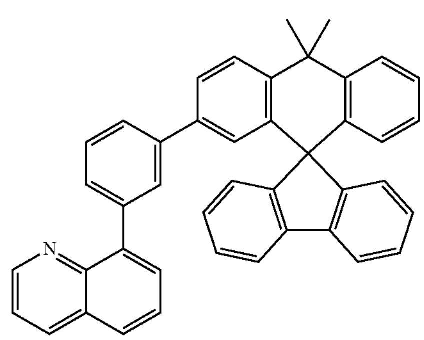

-continued
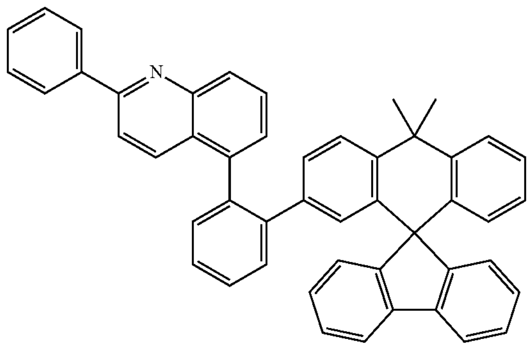
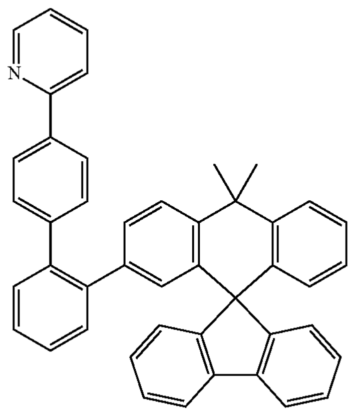
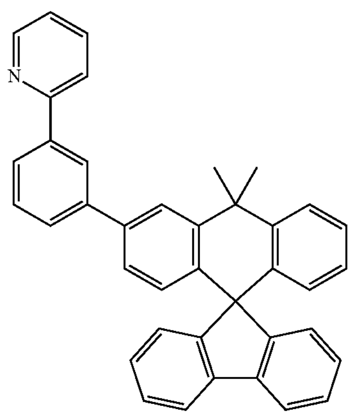
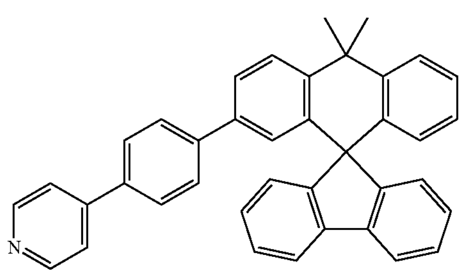
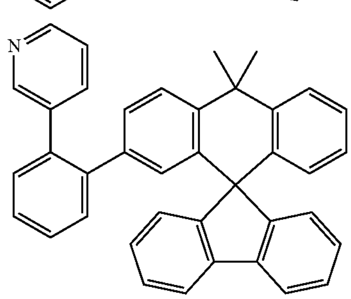
-continued
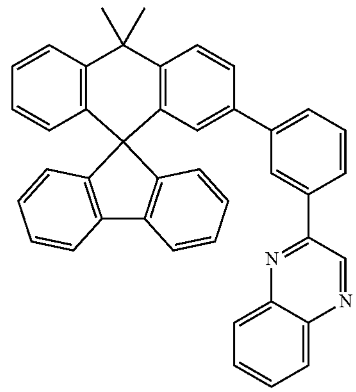
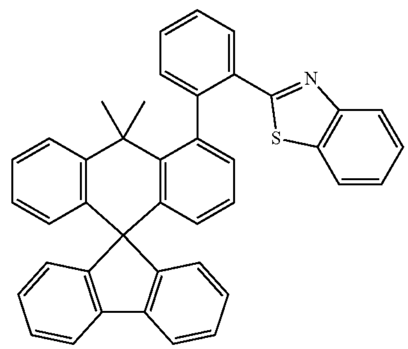
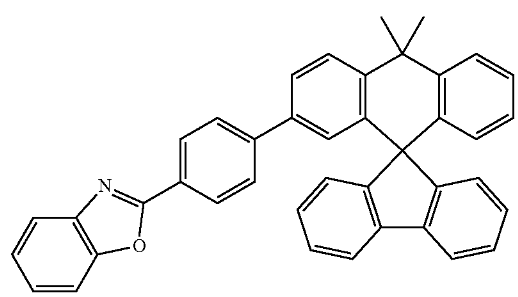
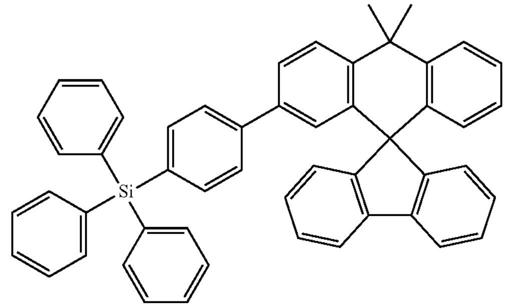

-continued
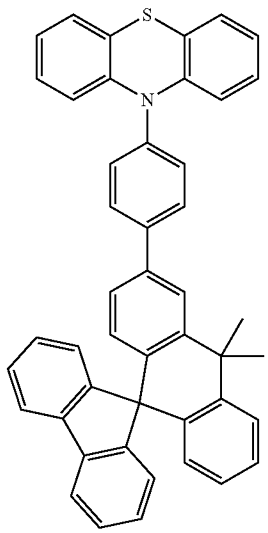
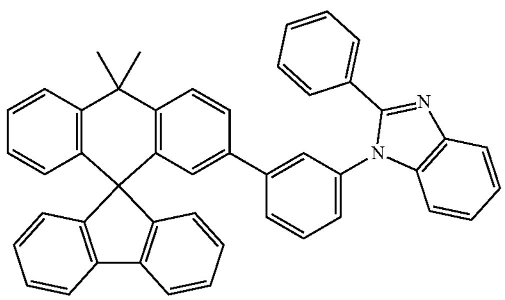
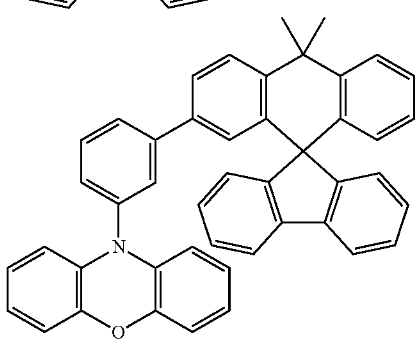
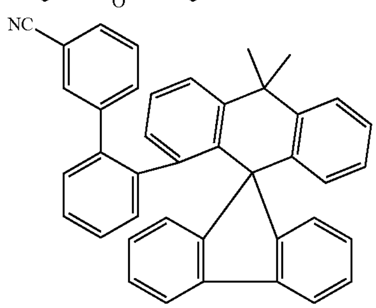
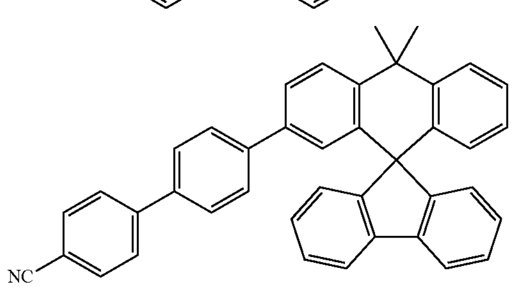
-continued
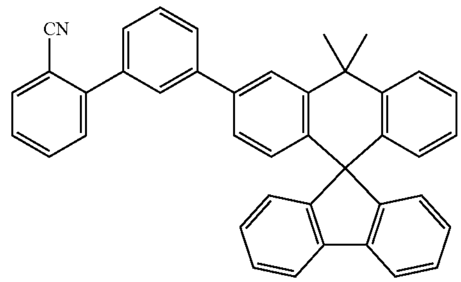
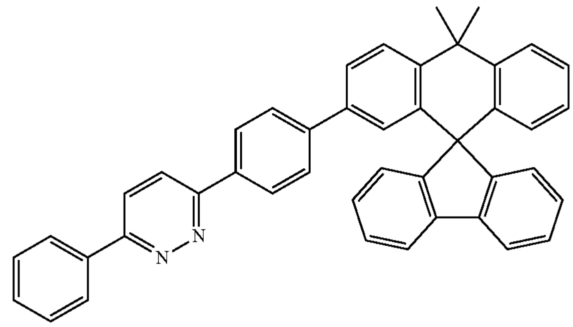
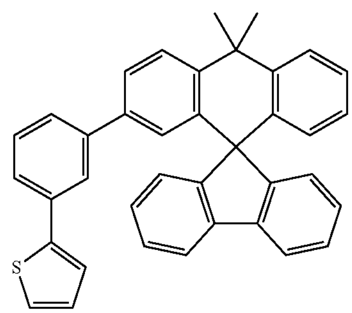
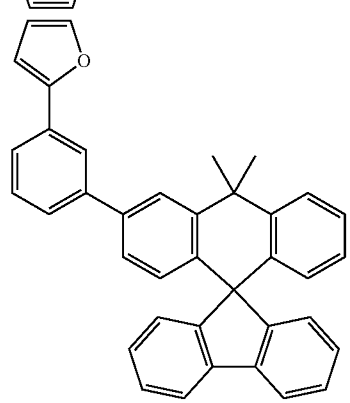
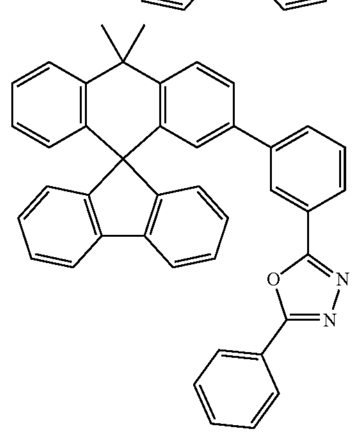

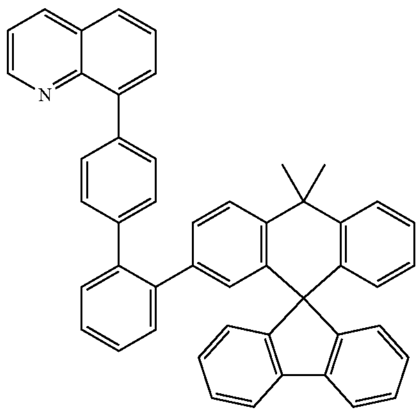
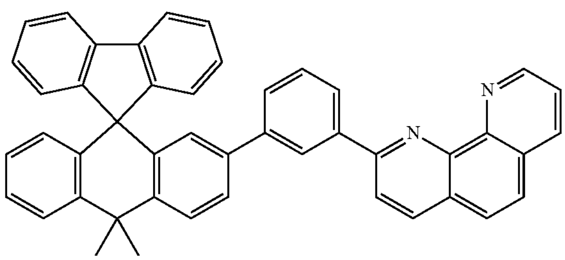
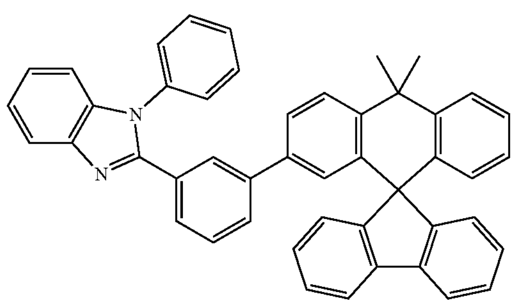
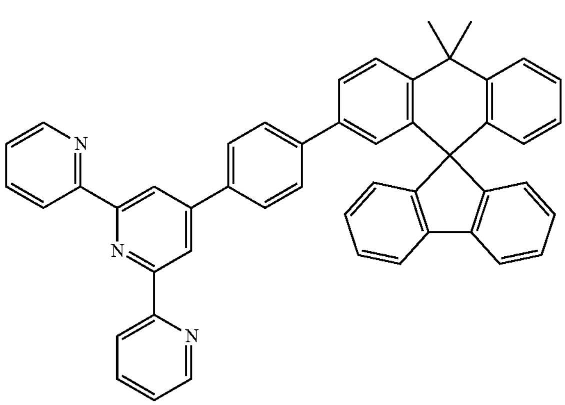
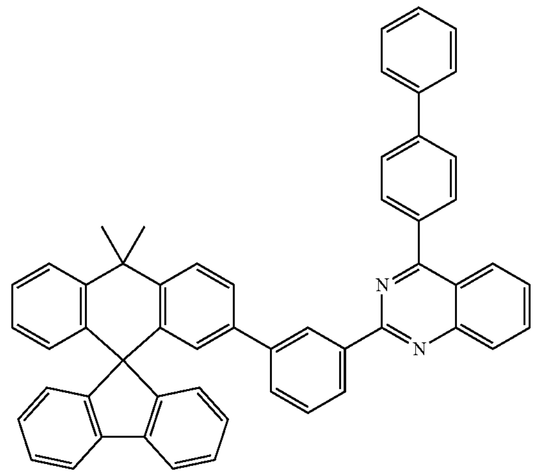
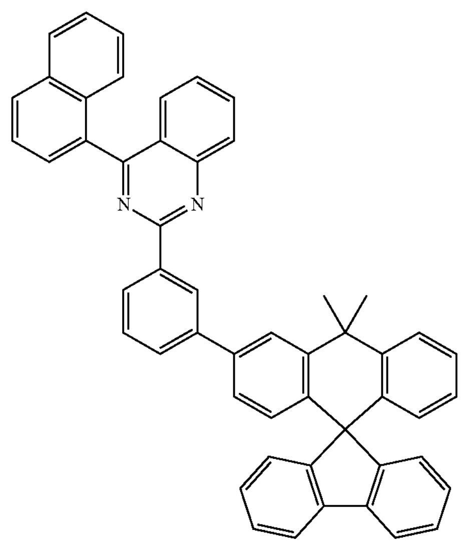
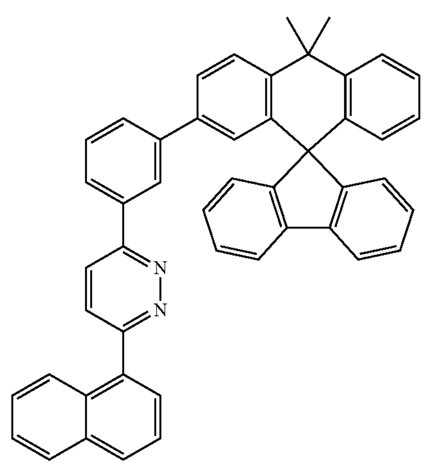

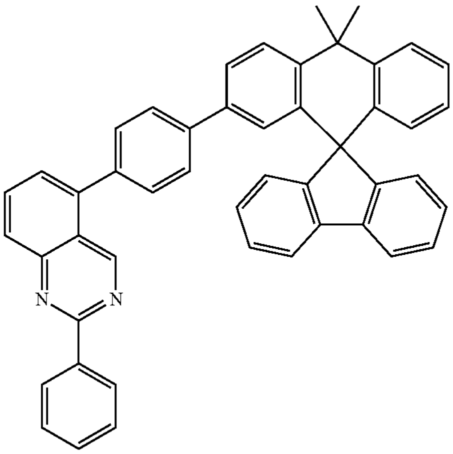
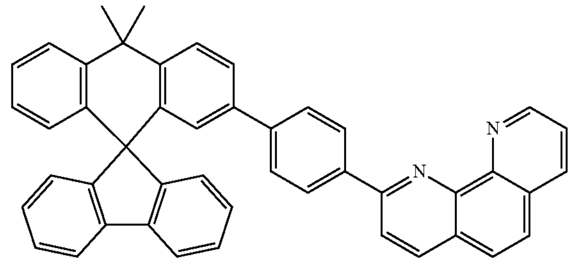
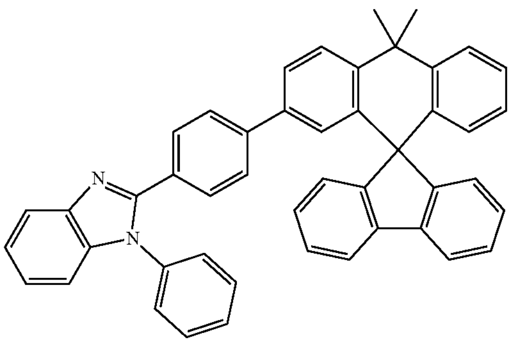
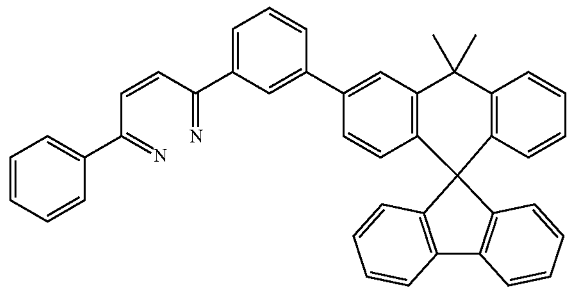
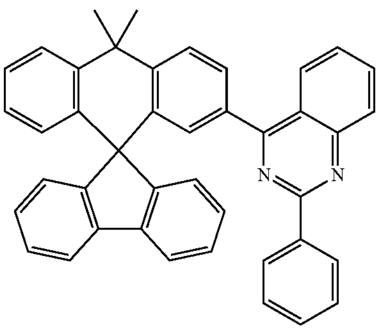
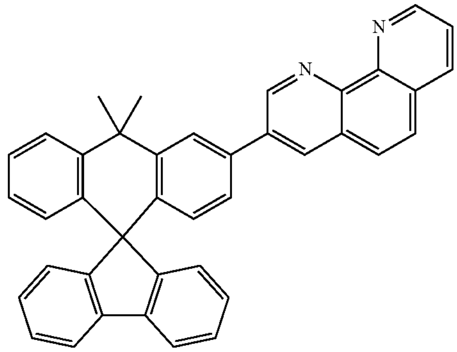
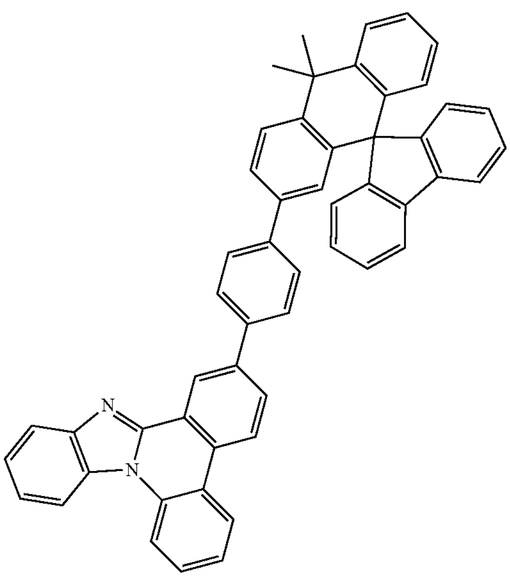
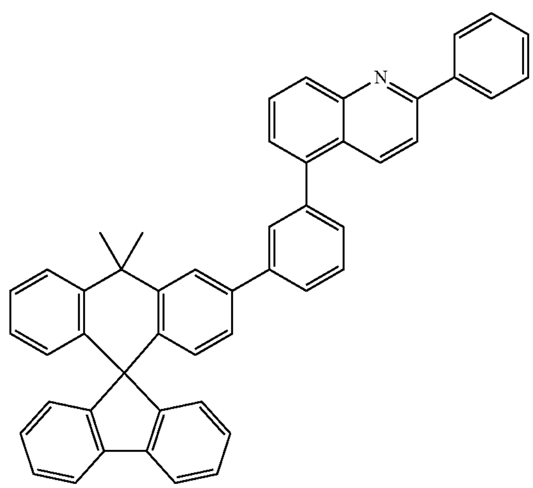

-continued
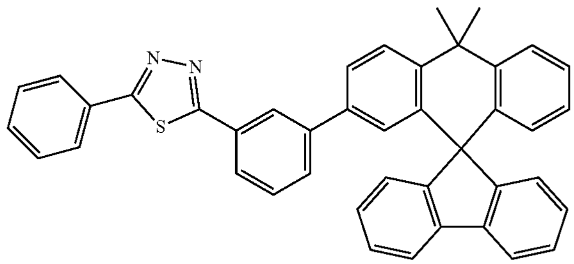
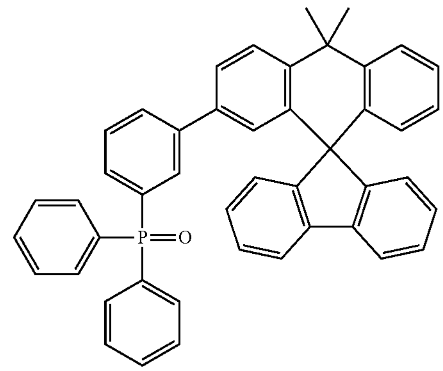
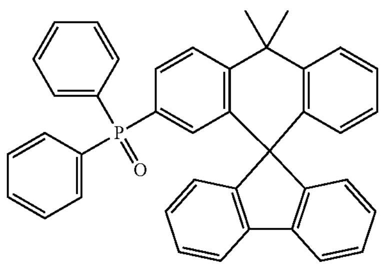
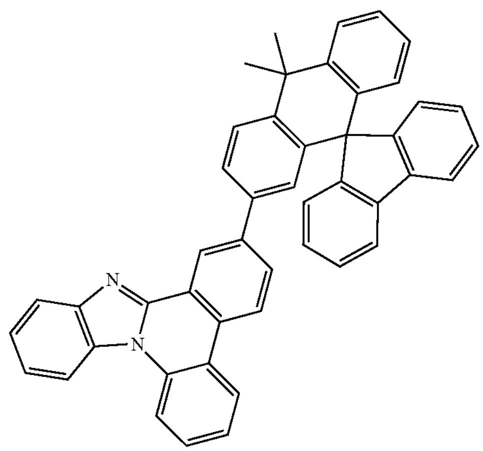
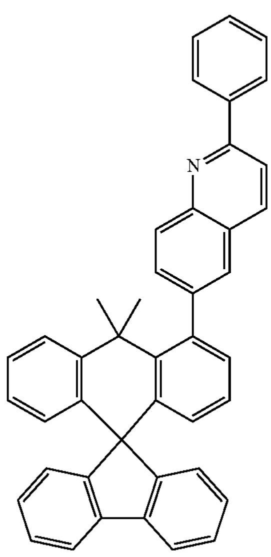
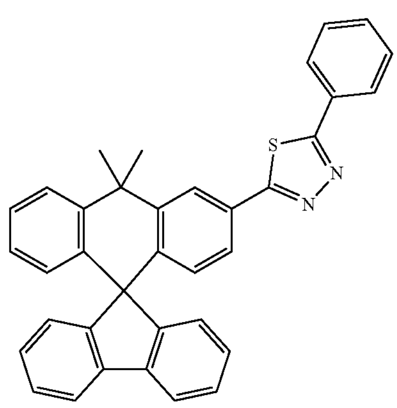

-continued
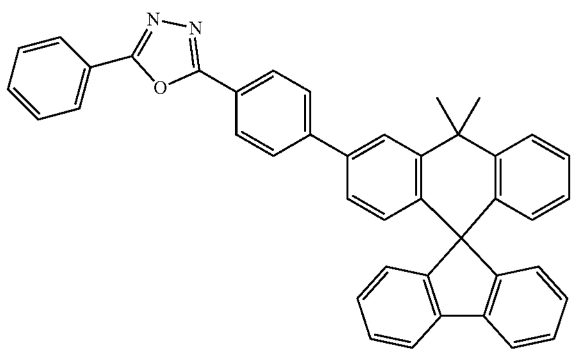
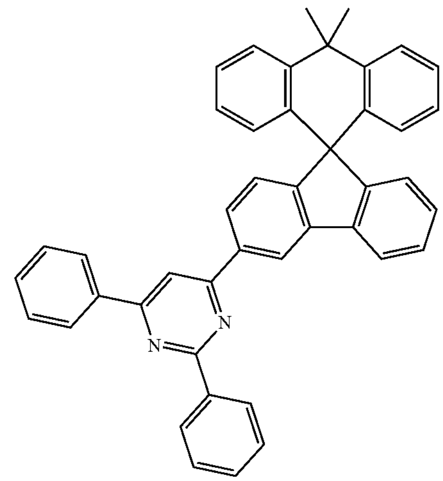
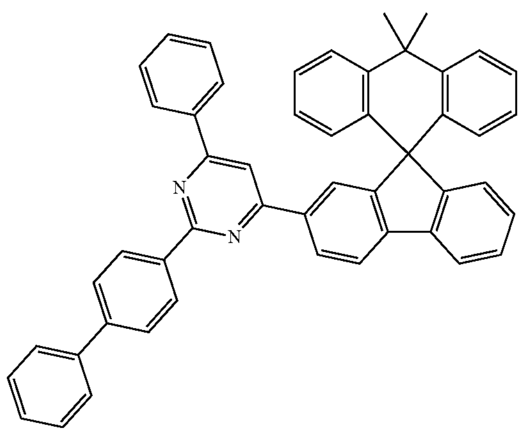
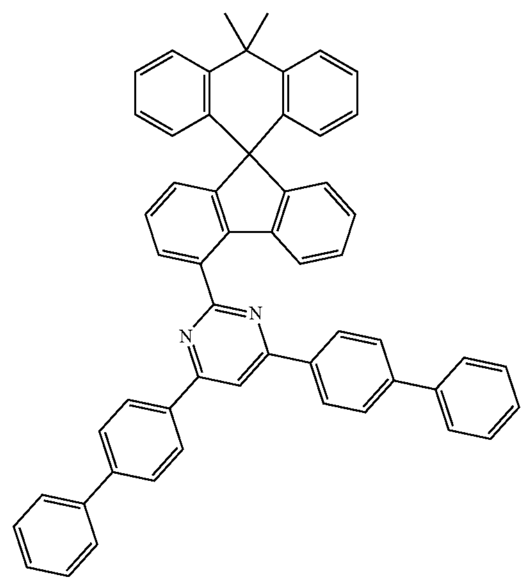
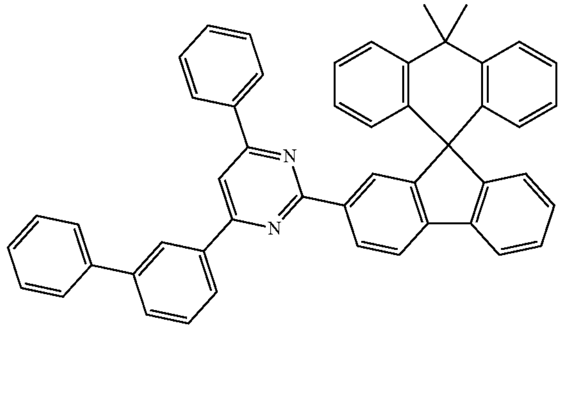
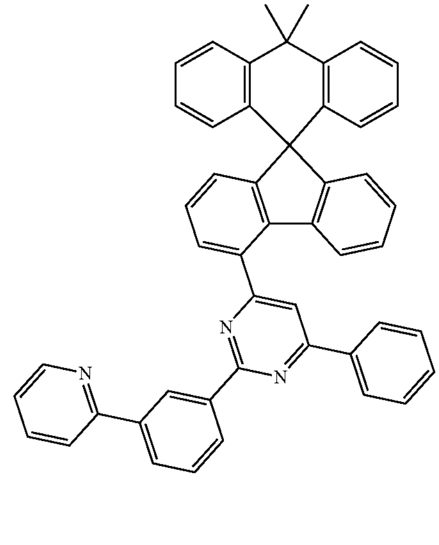

-continued
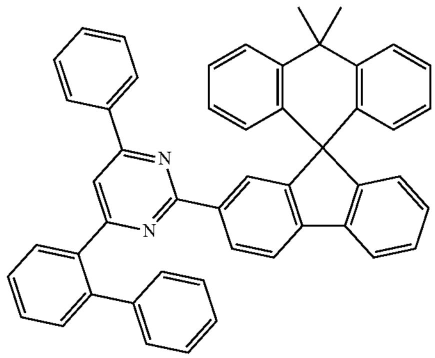
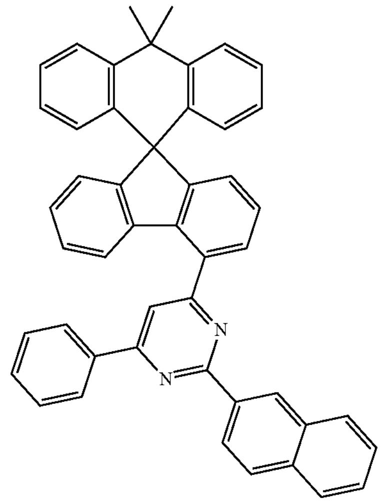
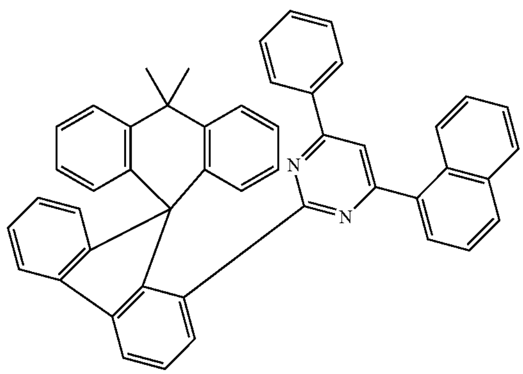
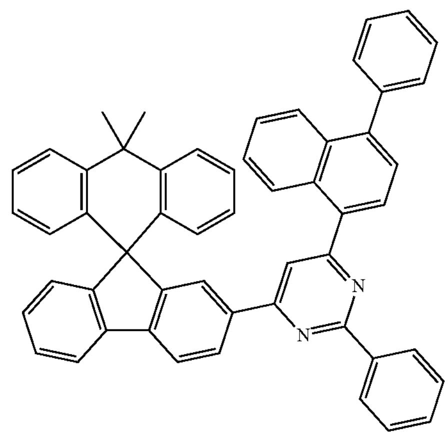
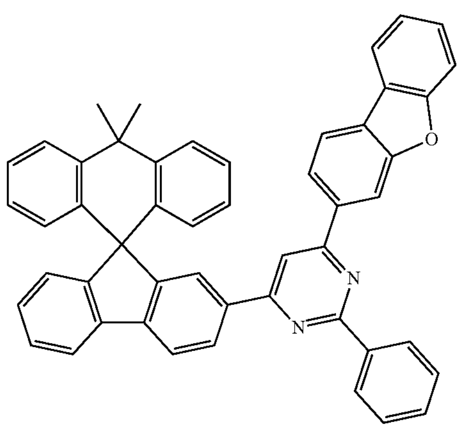
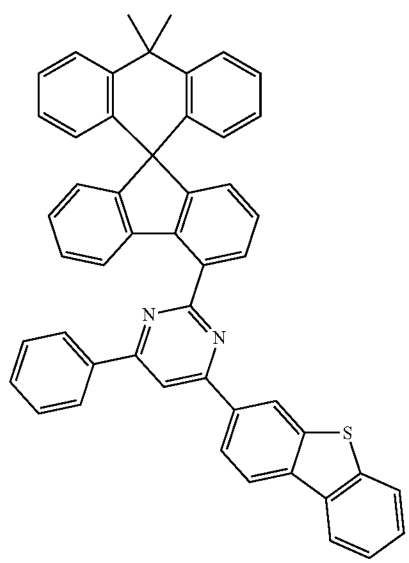

-continued
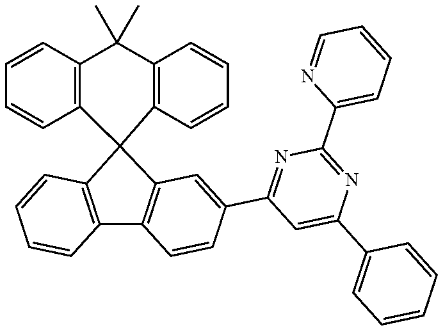
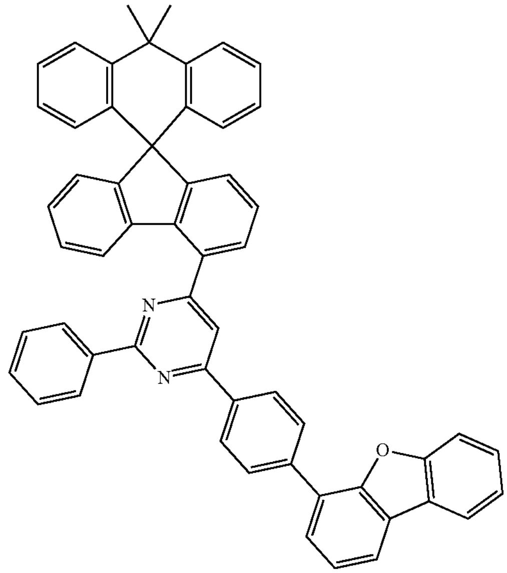
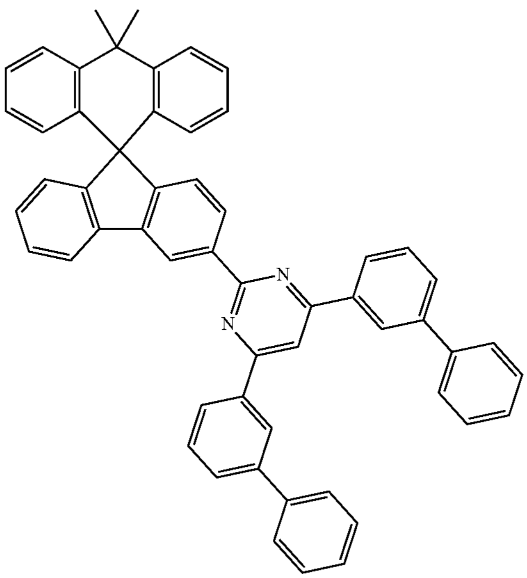
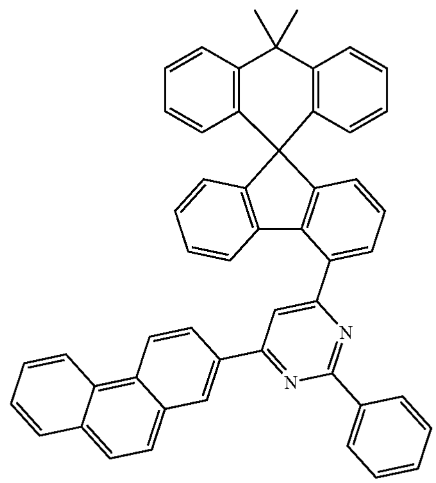
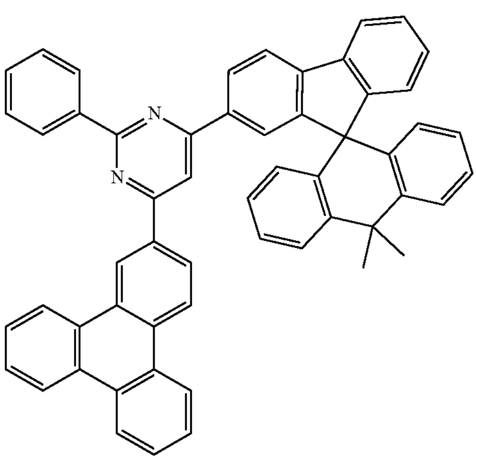
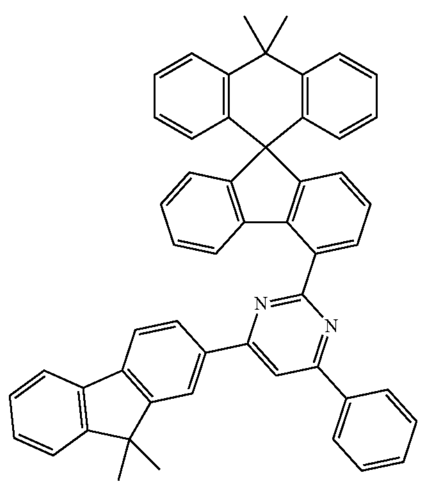

-continued
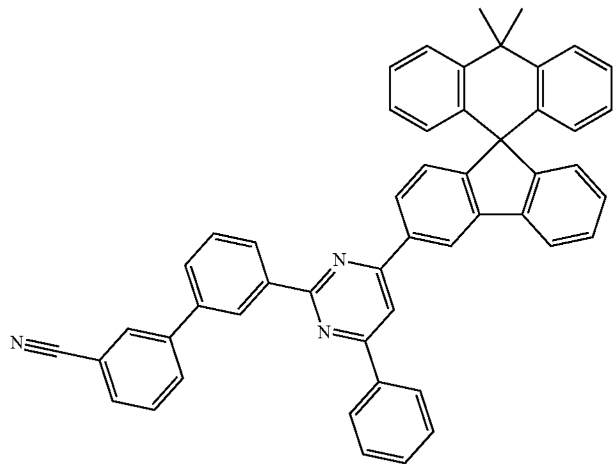
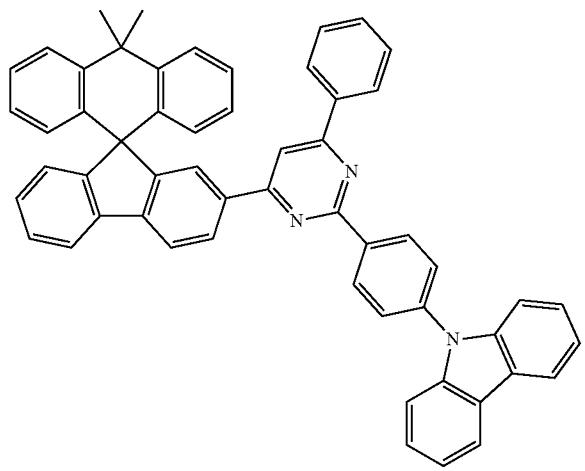
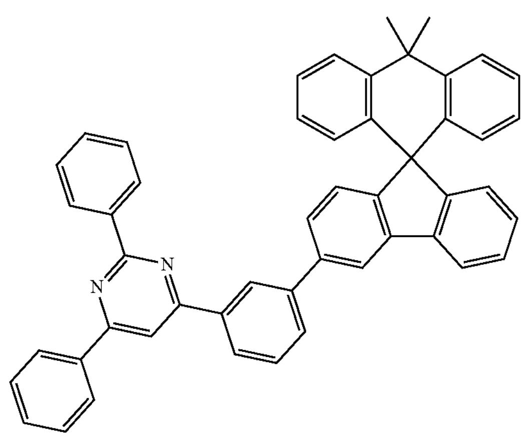
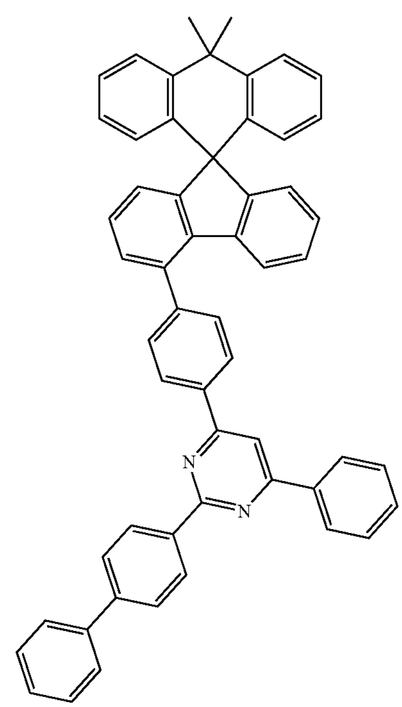

-continued
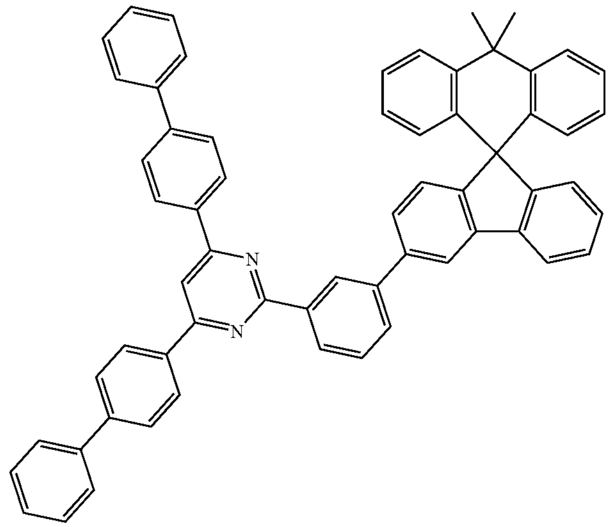
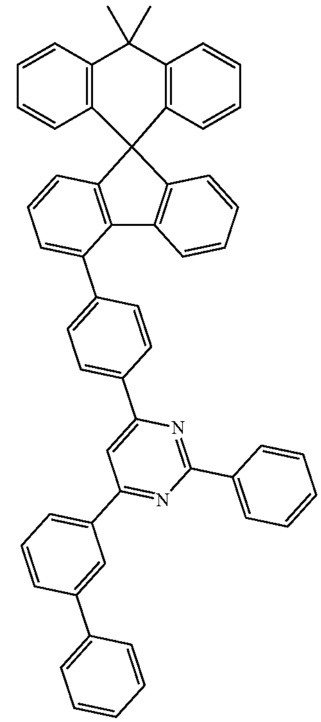
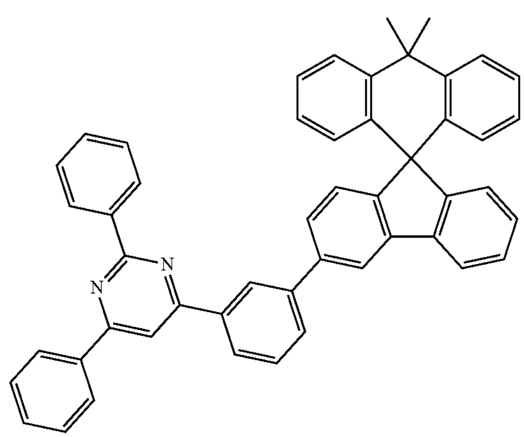
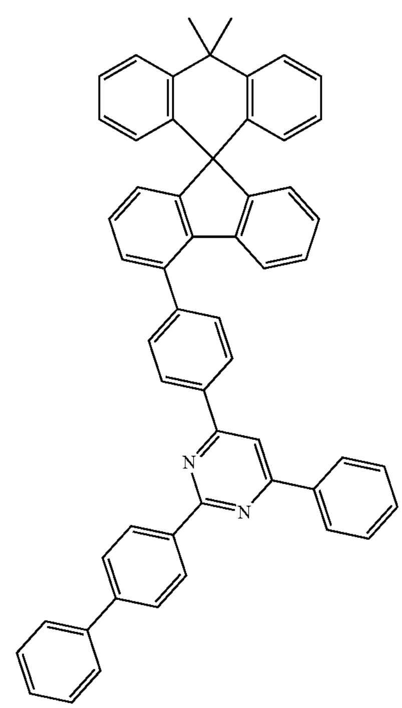

-continued
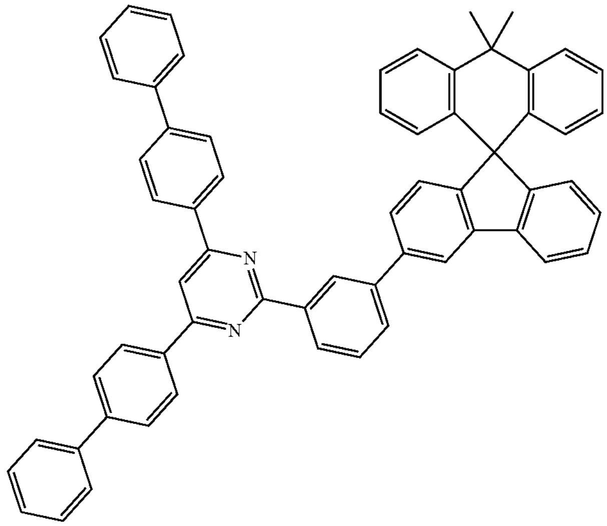
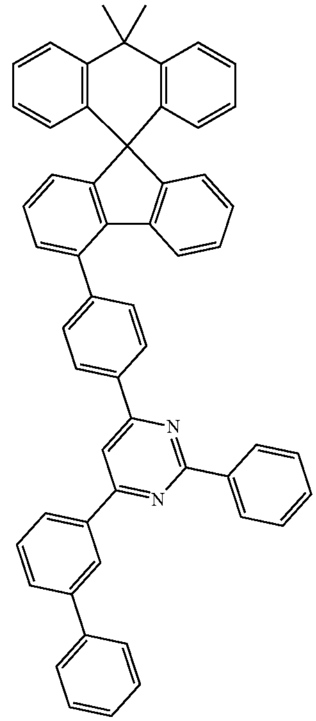
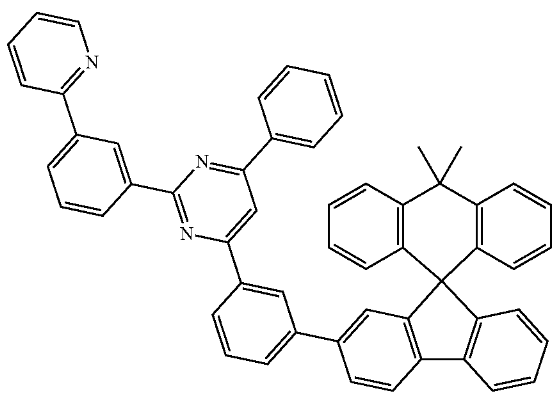
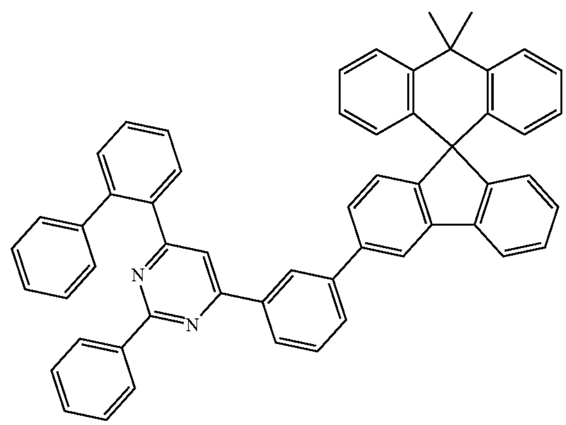
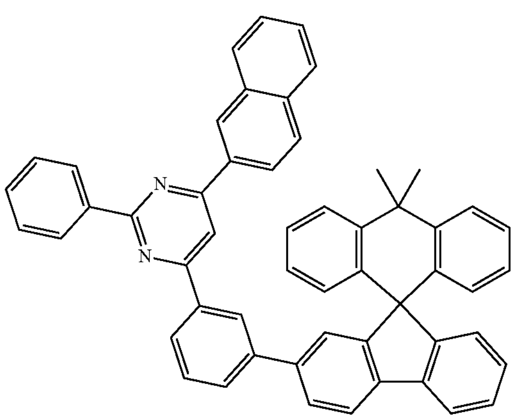
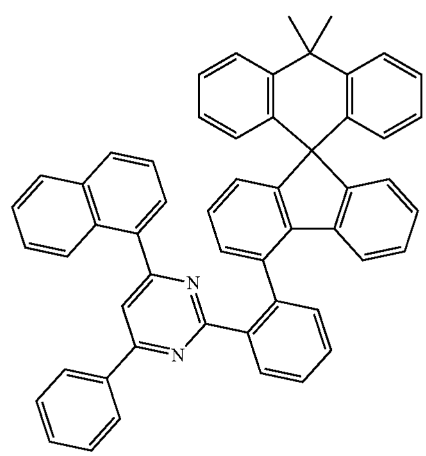

-continued
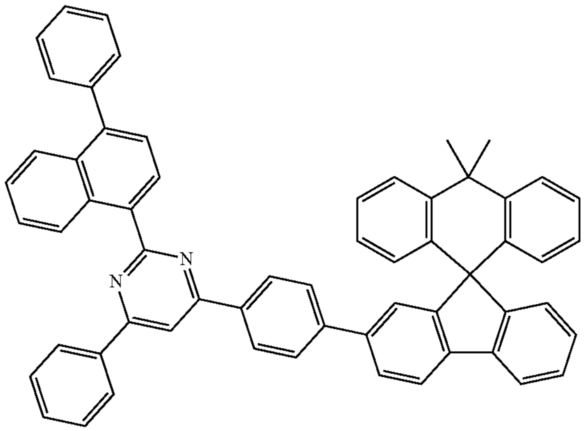
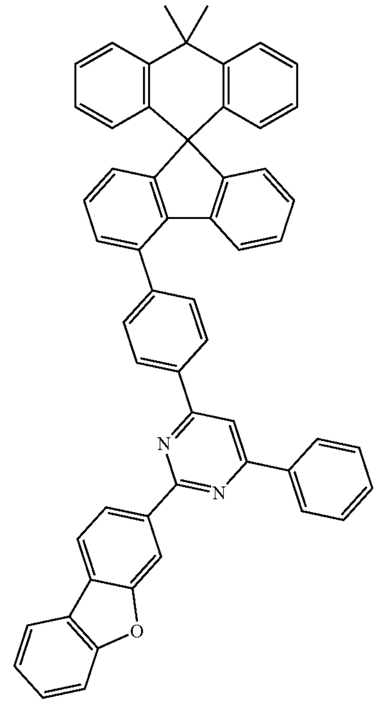
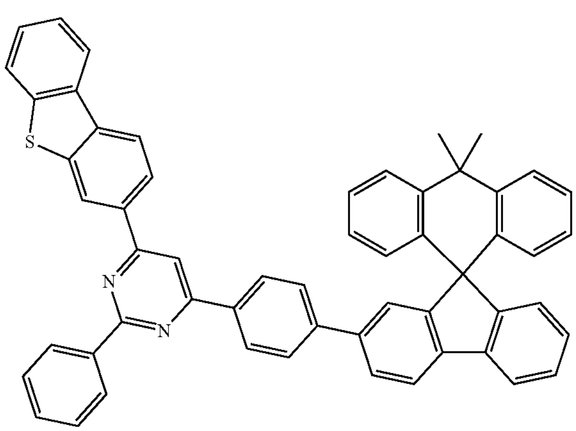
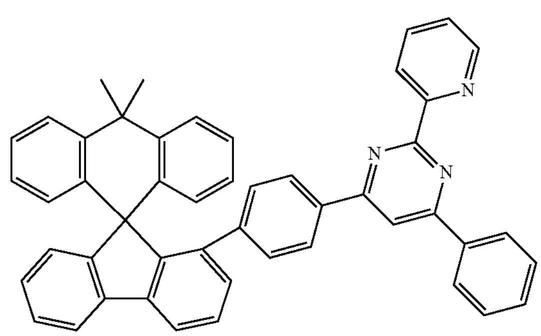

-continued
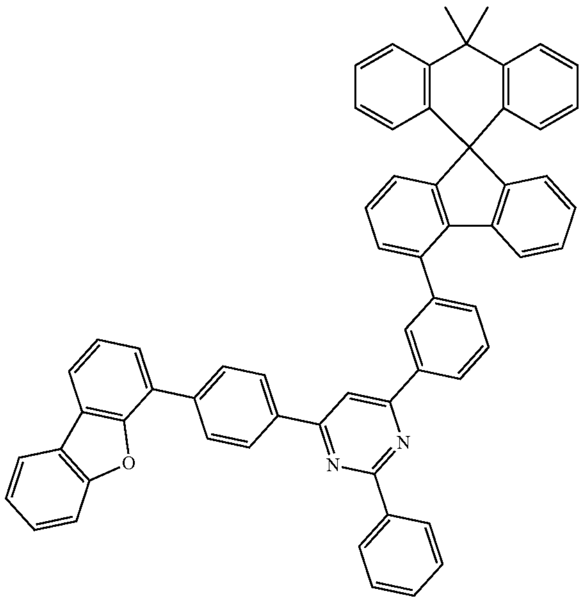
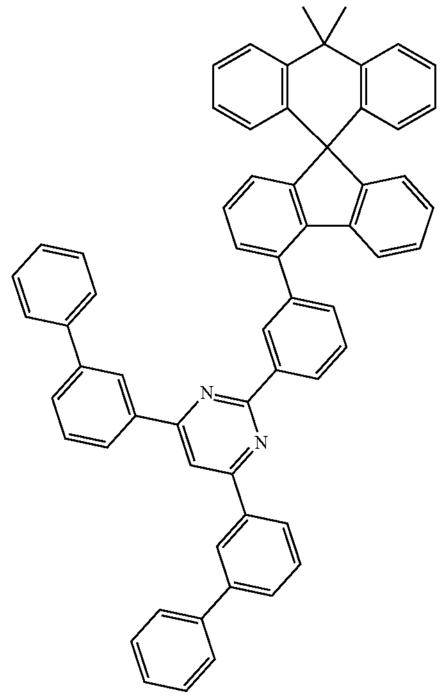
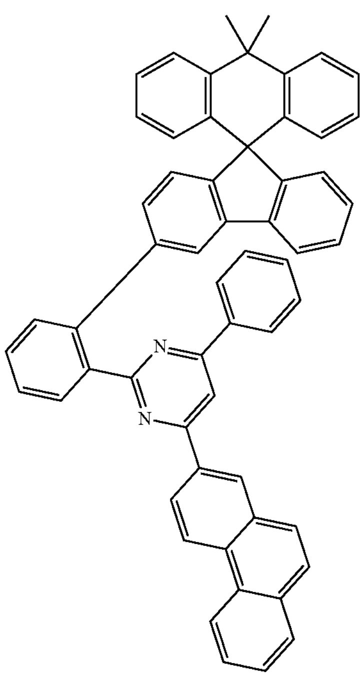
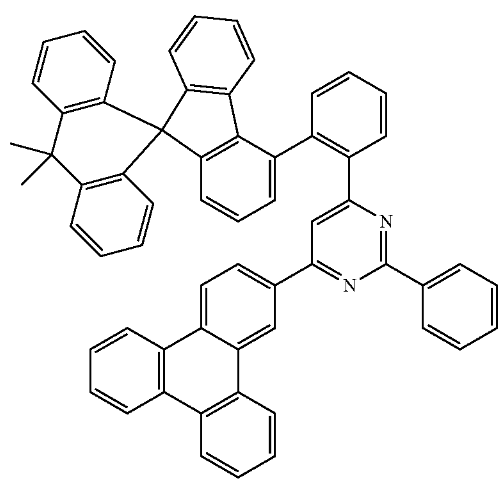

-continued
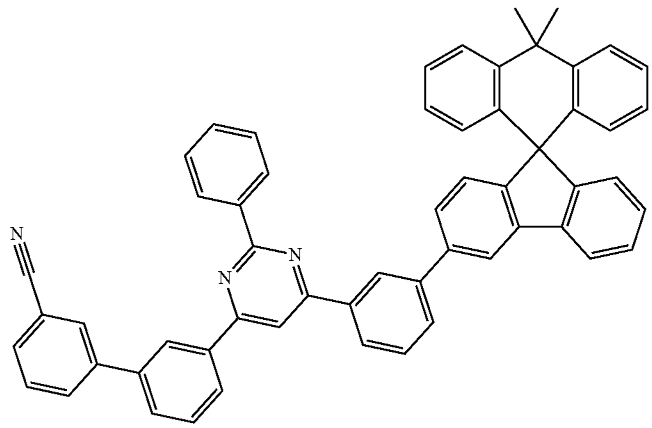
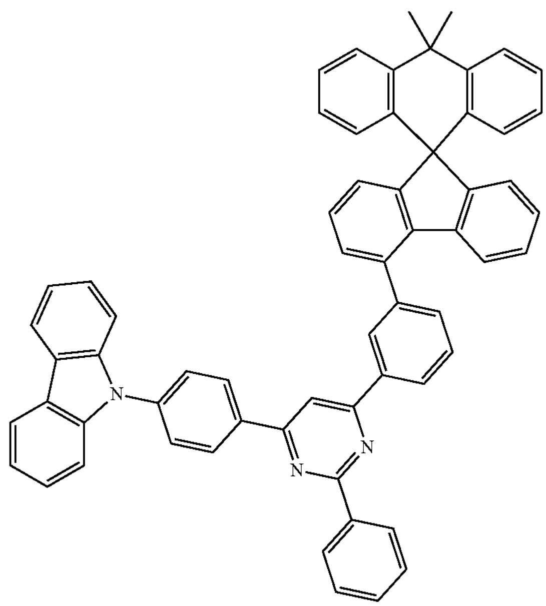
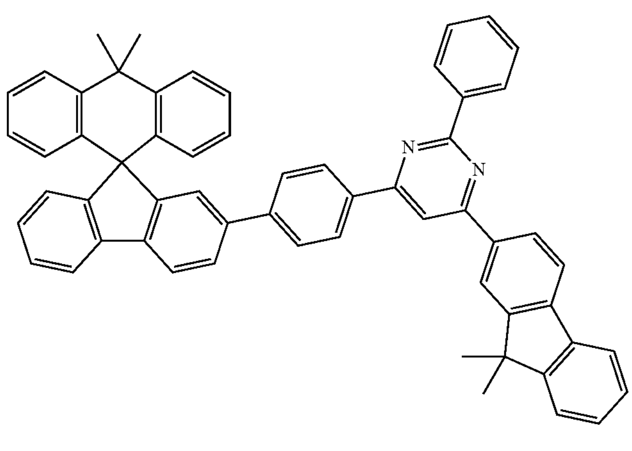
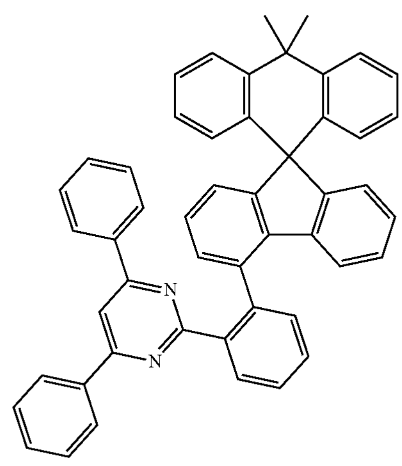

-continued
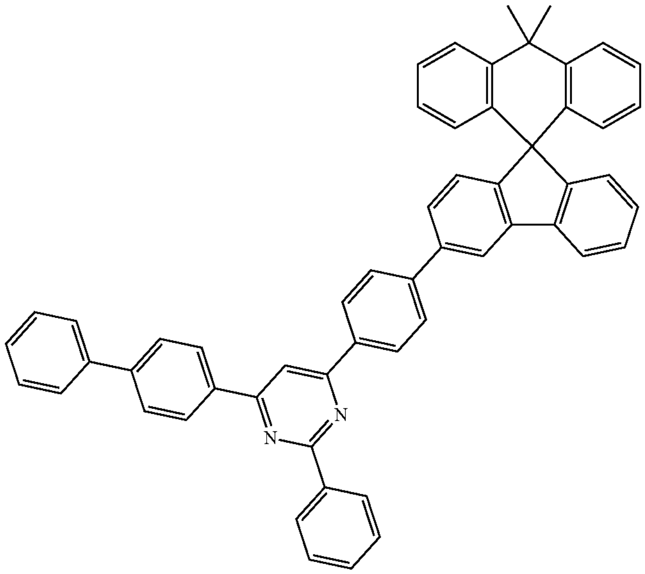
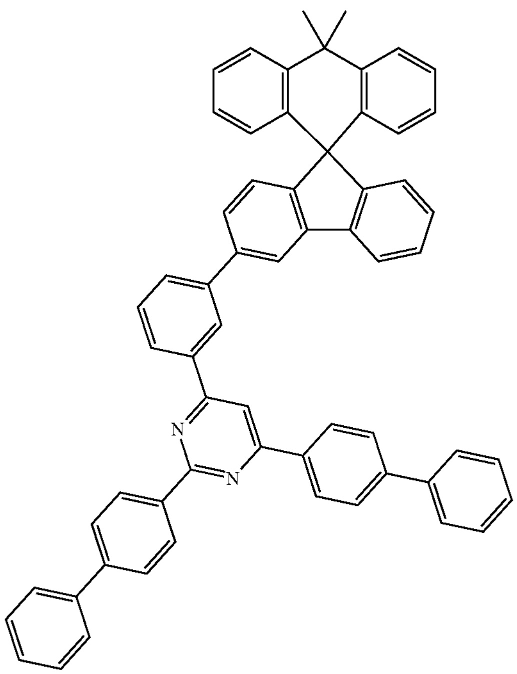
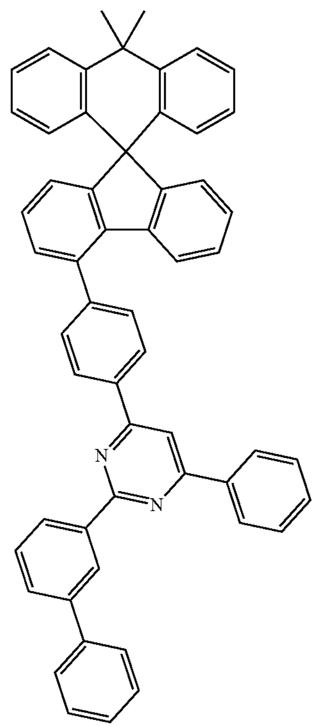
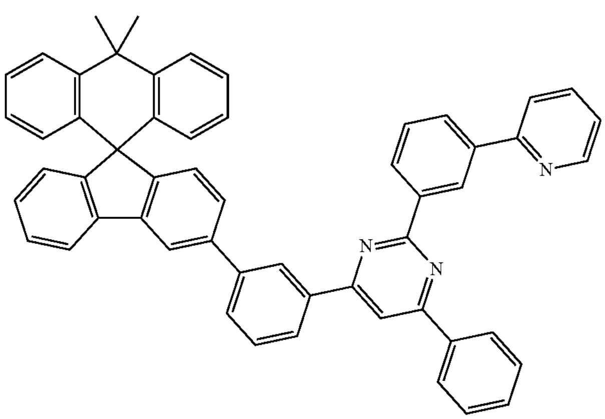

-continued
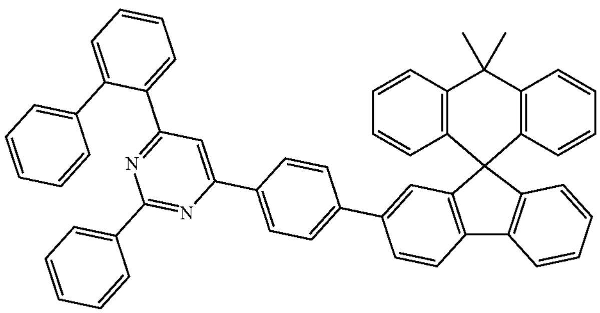
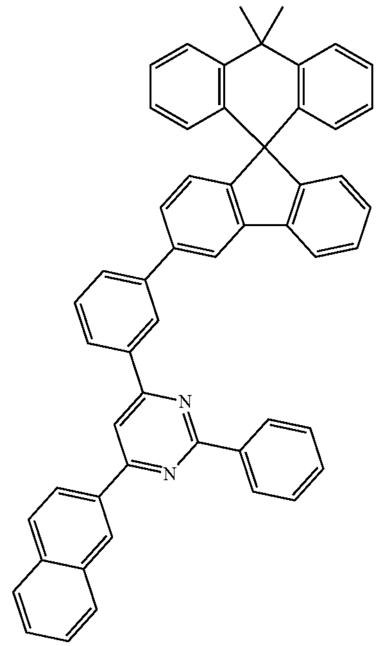
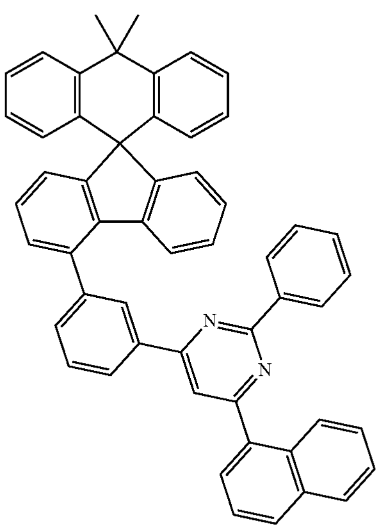
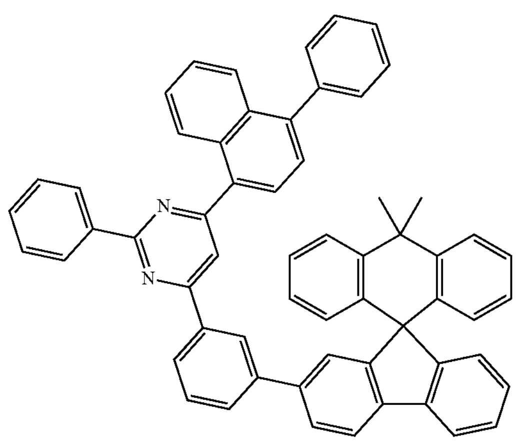

-continued
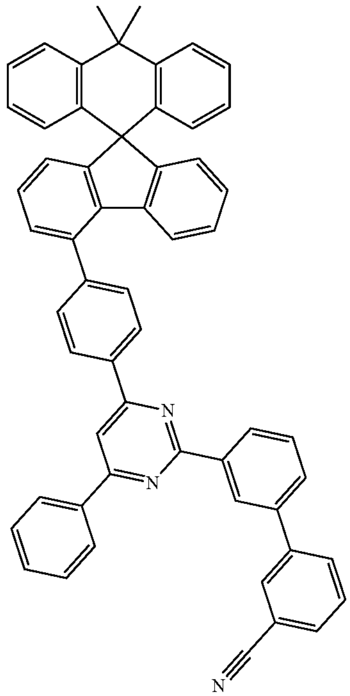
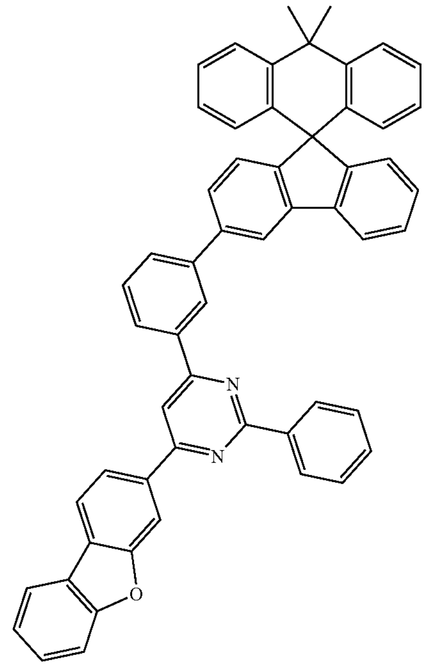
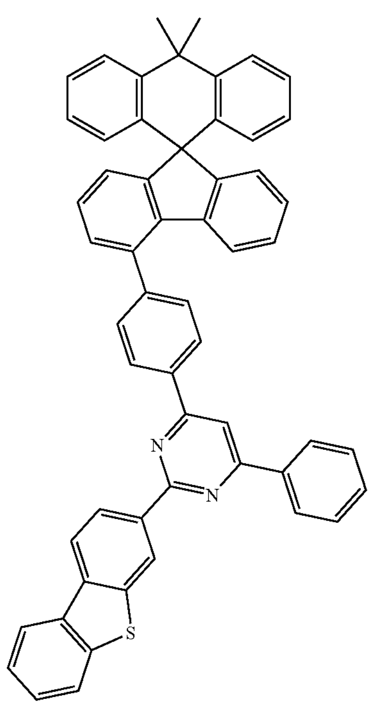
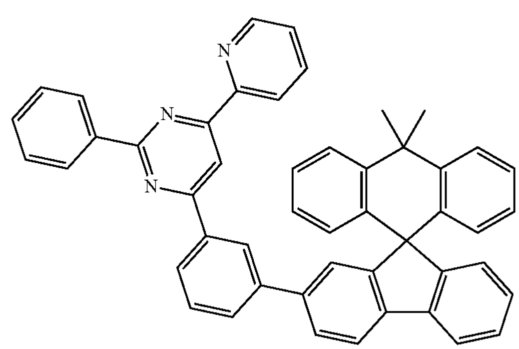

-continued
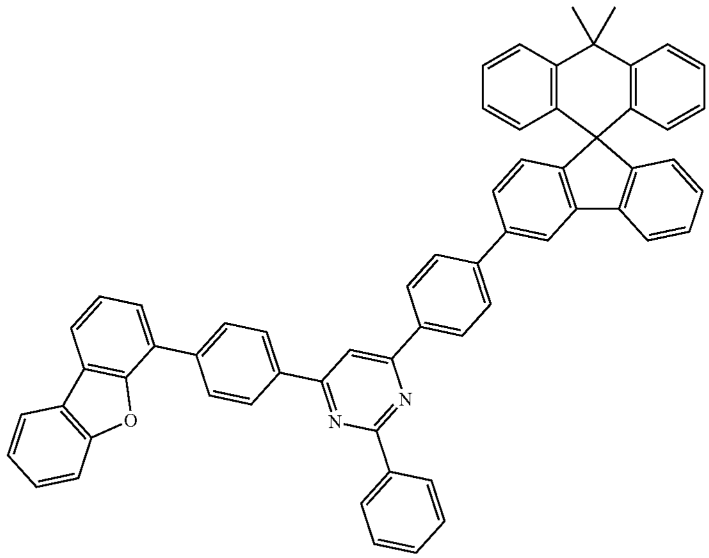
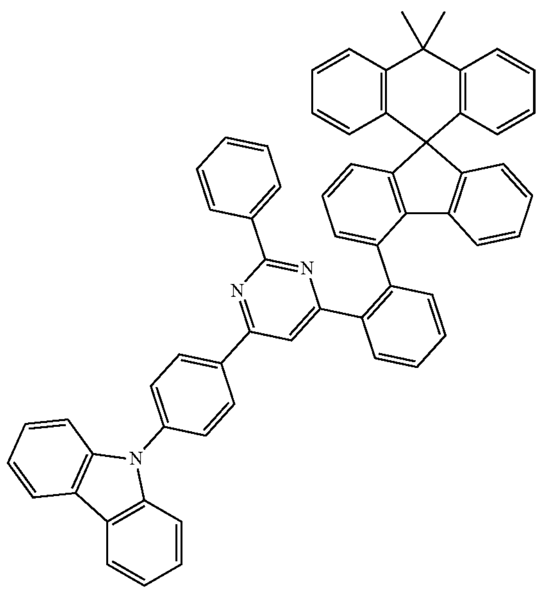
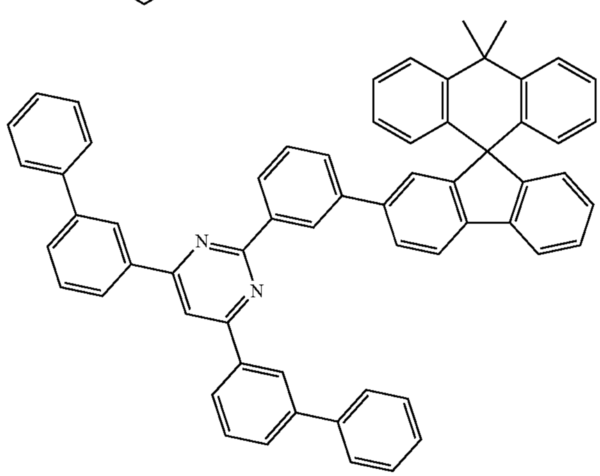

-continued
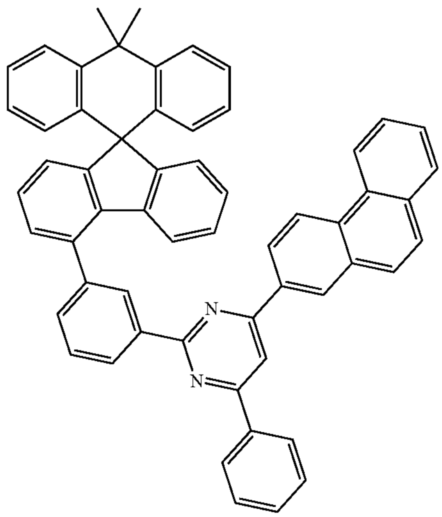
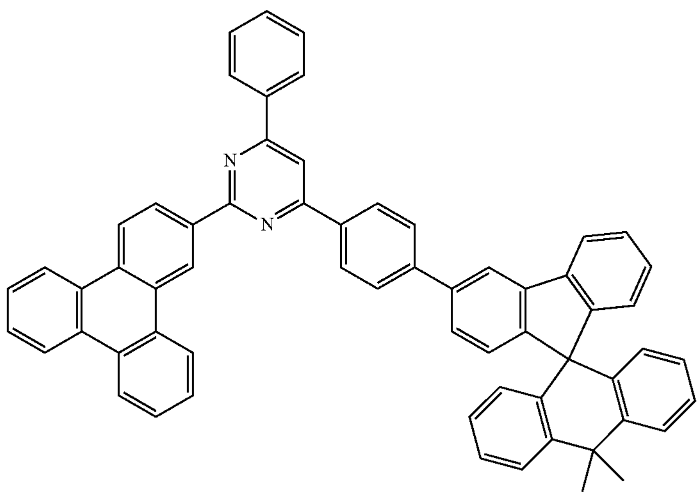
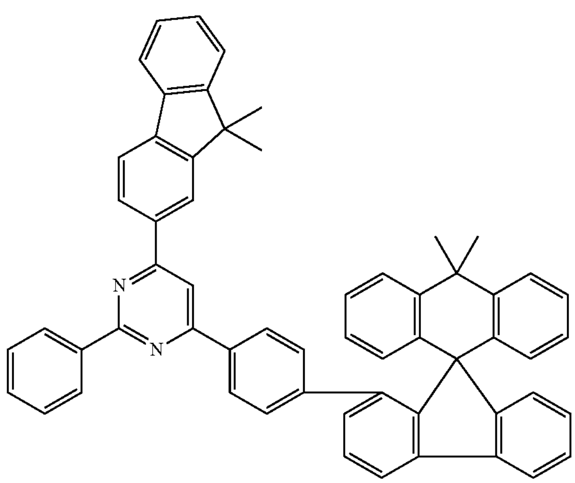

-continued
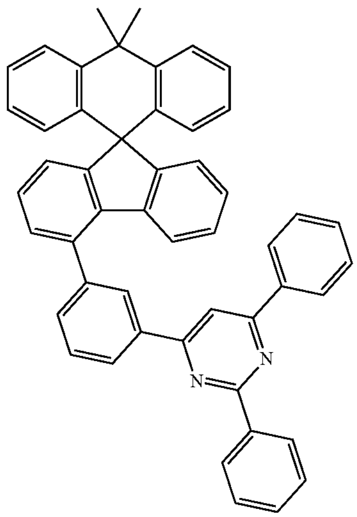
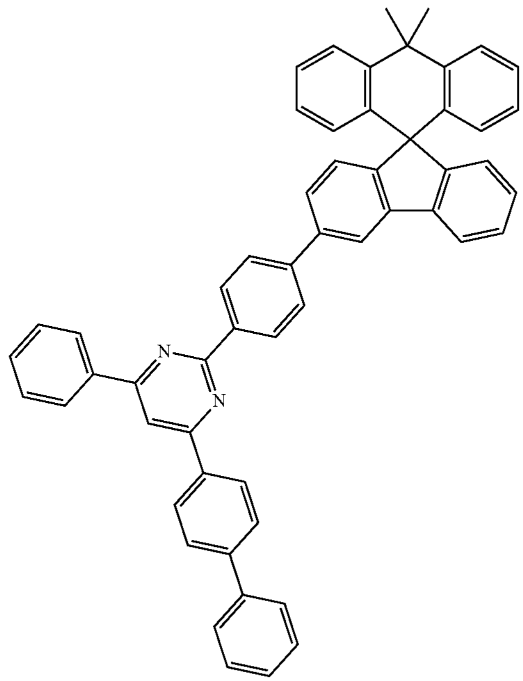
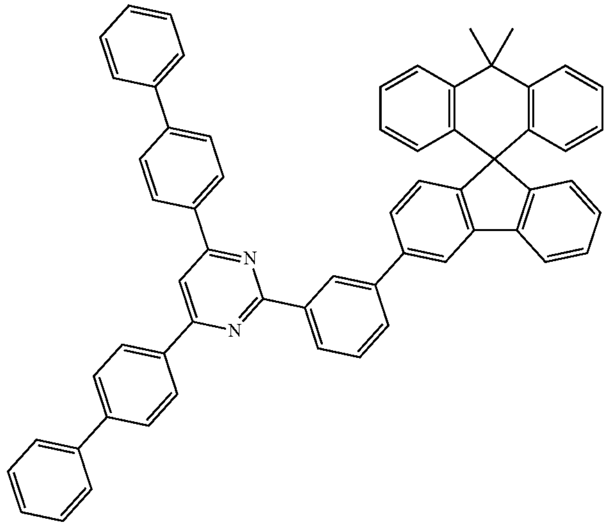
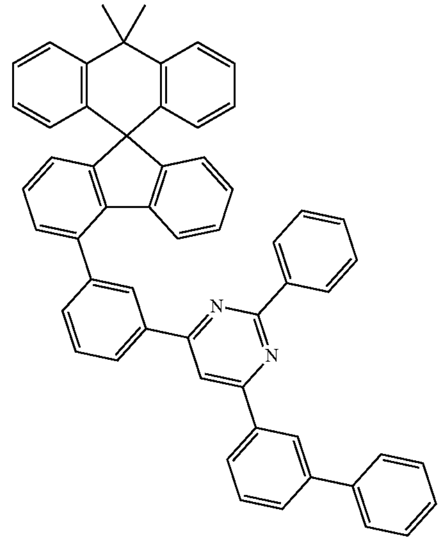

-continued
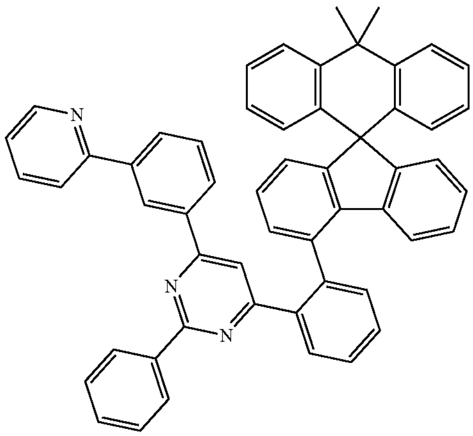
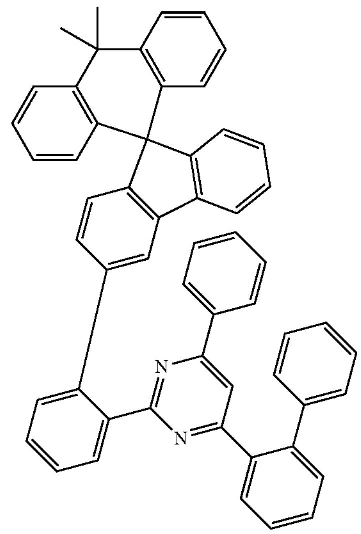
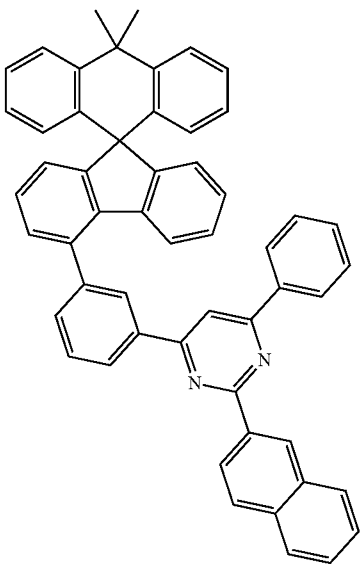
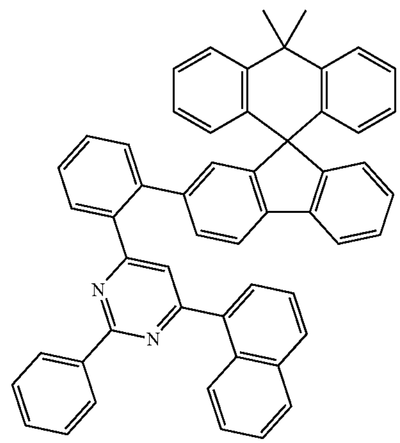
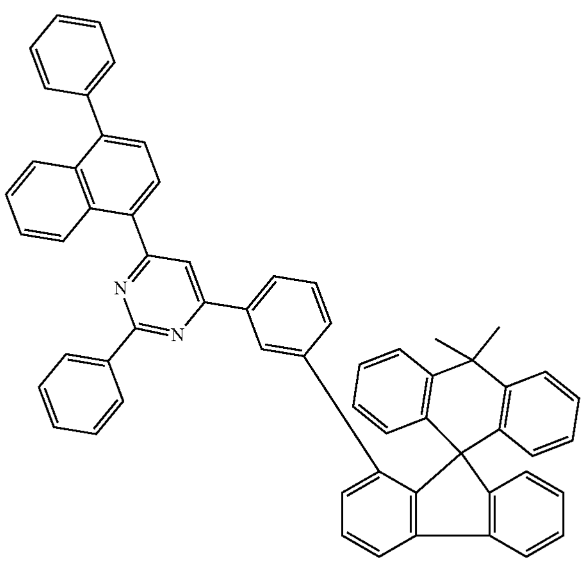
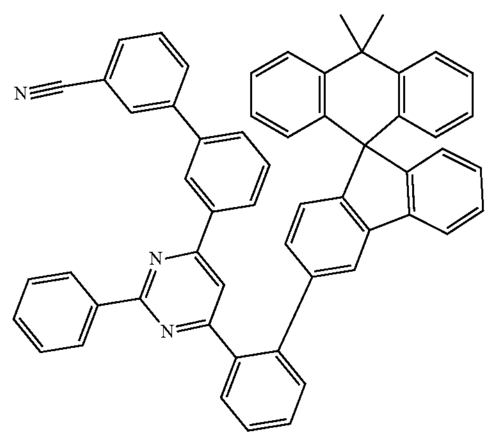

-continued
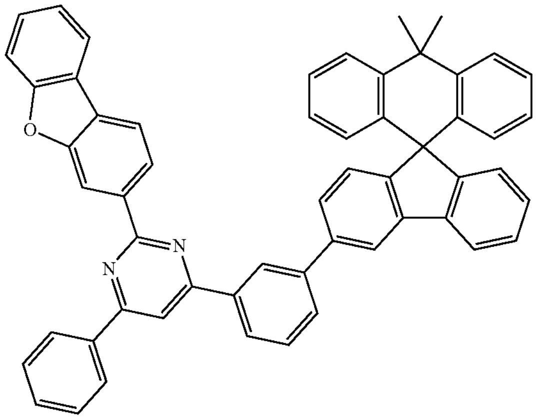
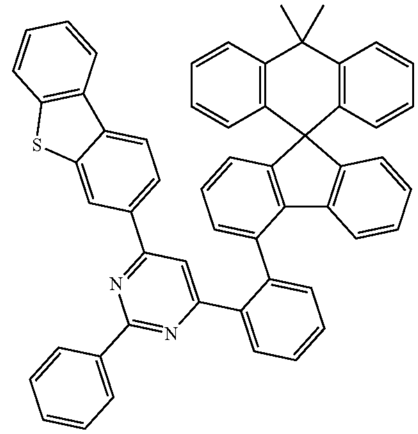
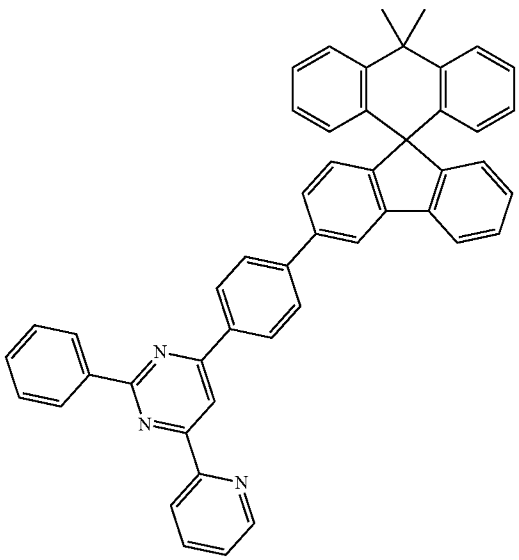
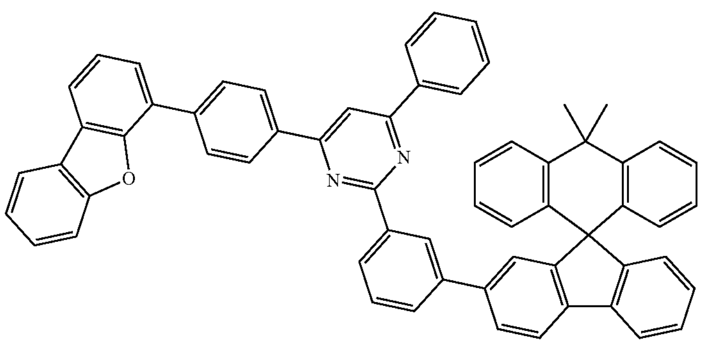
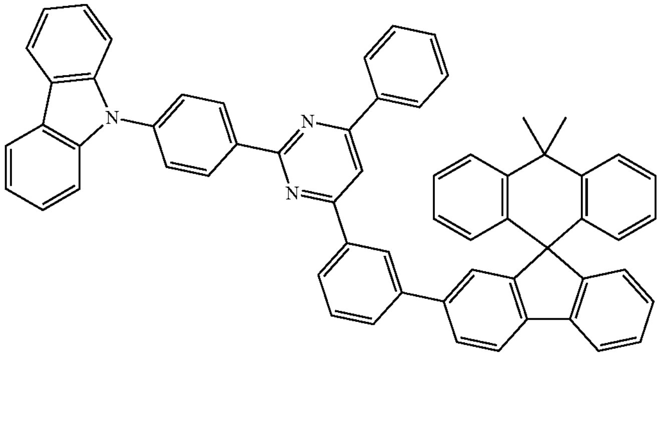

-continued
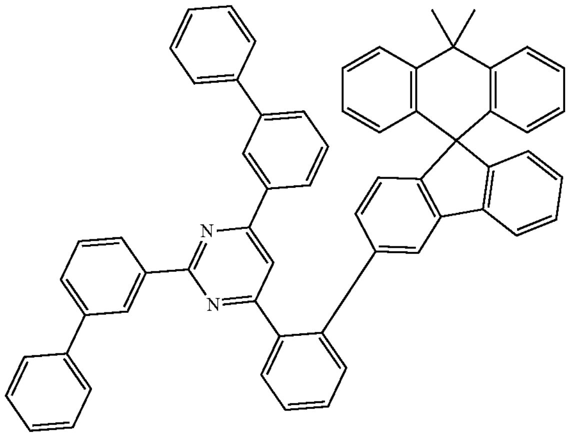
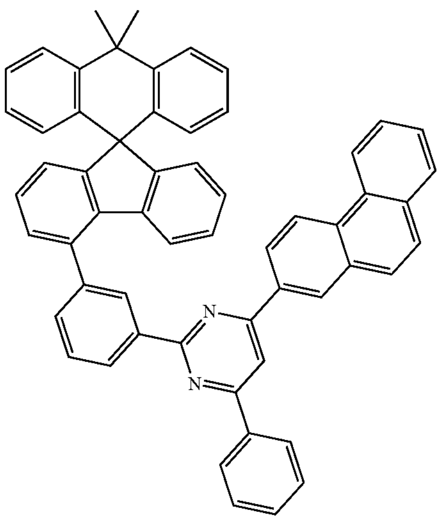
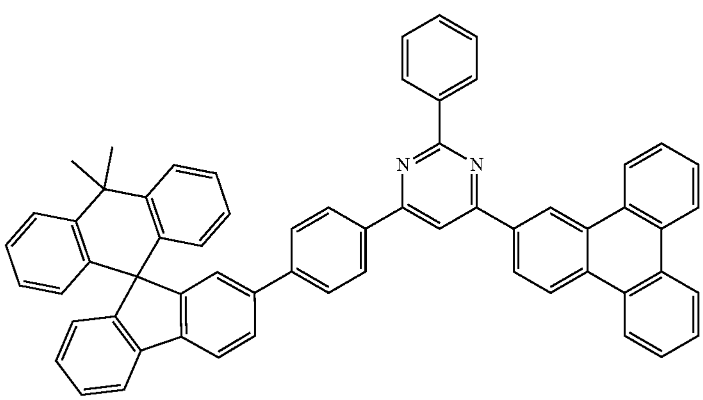

-continued
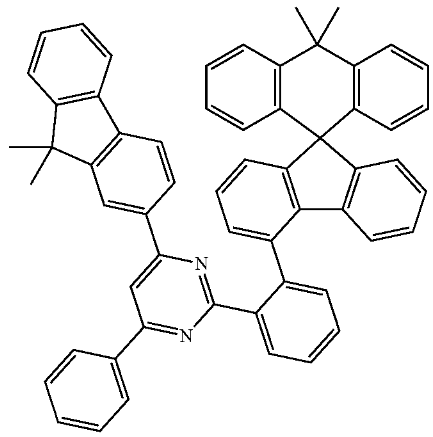
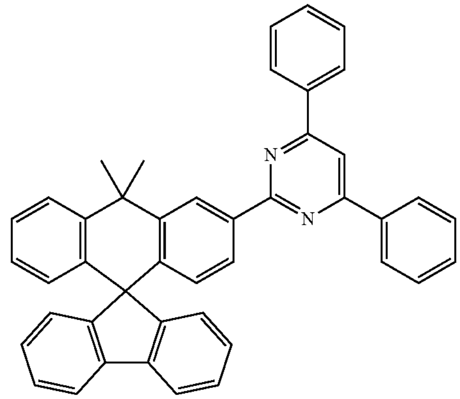
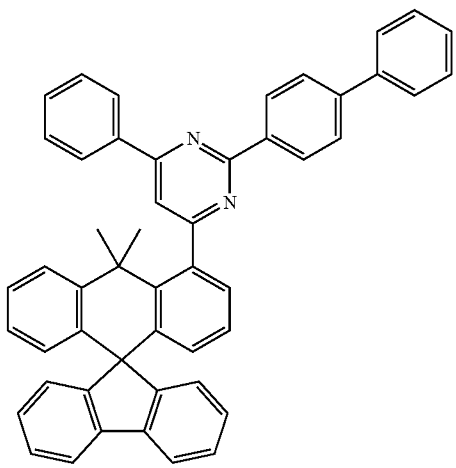
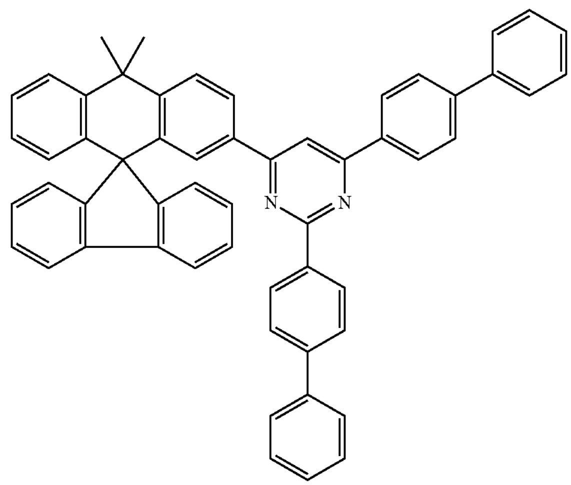
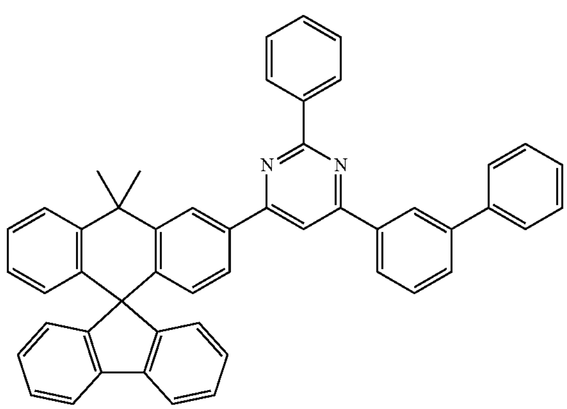
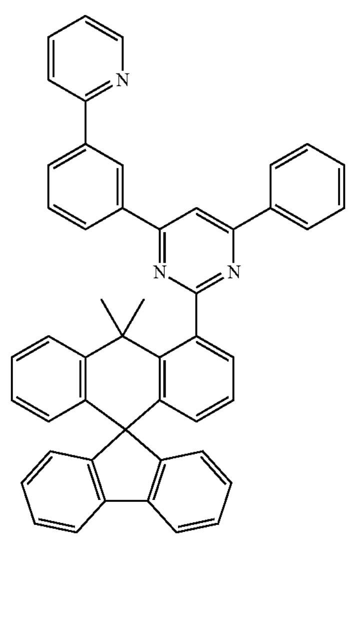

-continued
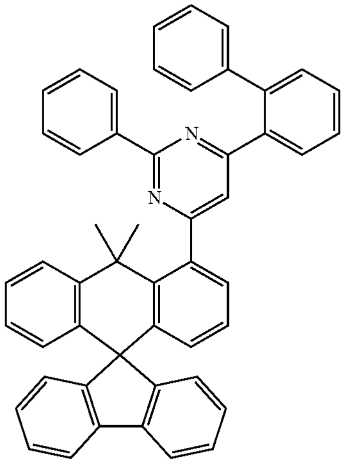
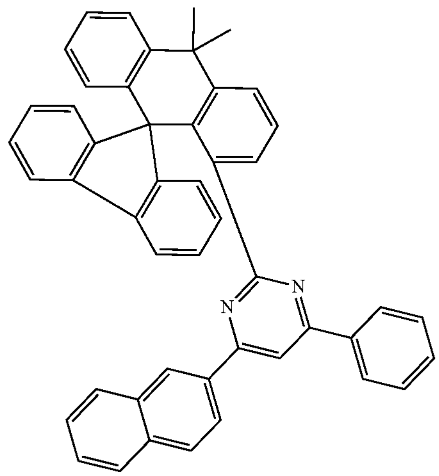
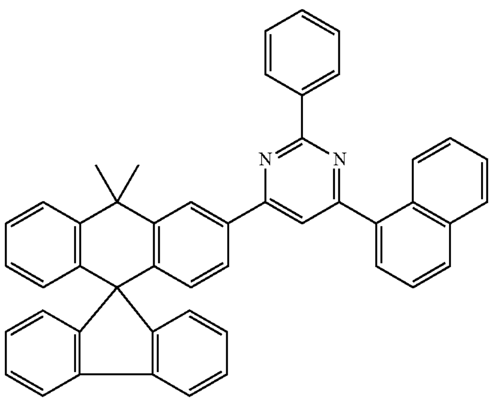
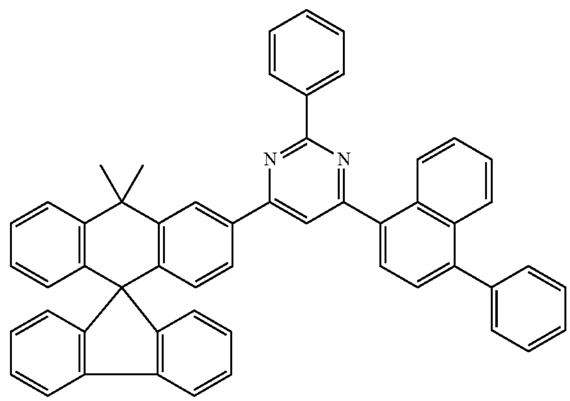
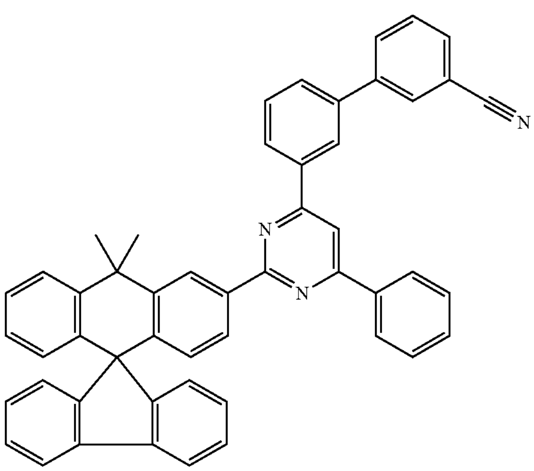
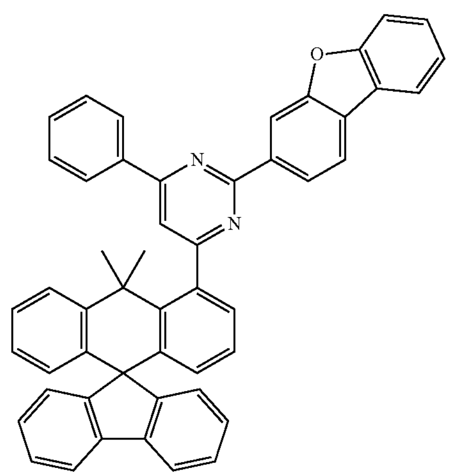

-continued
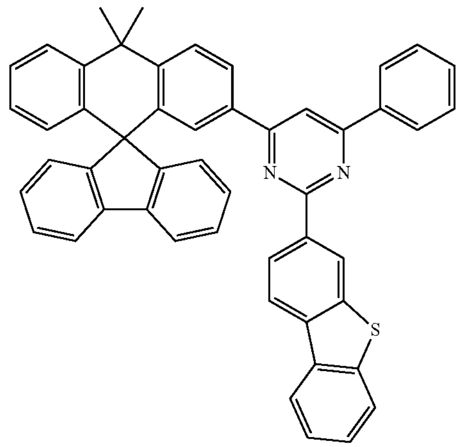
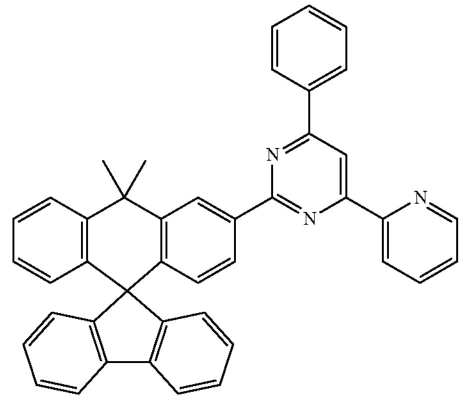
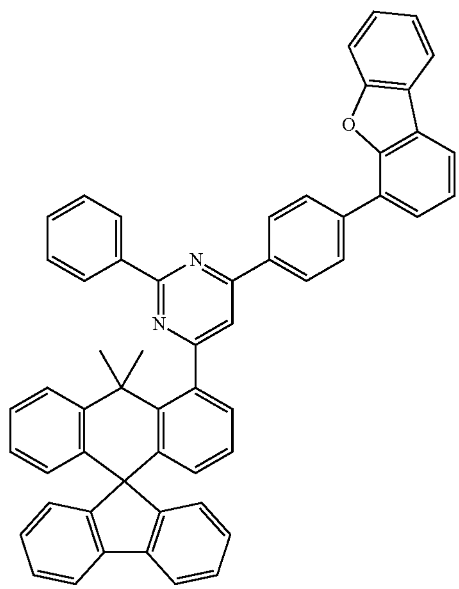
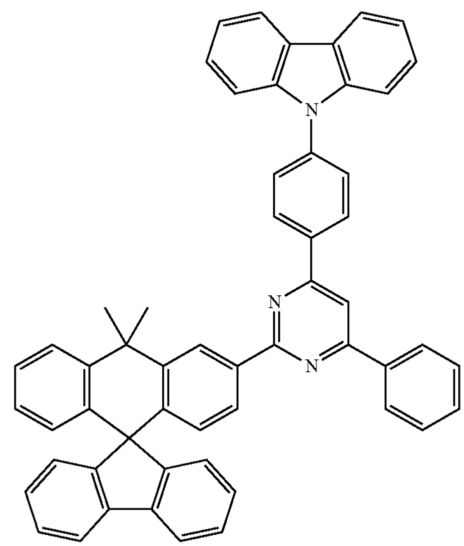
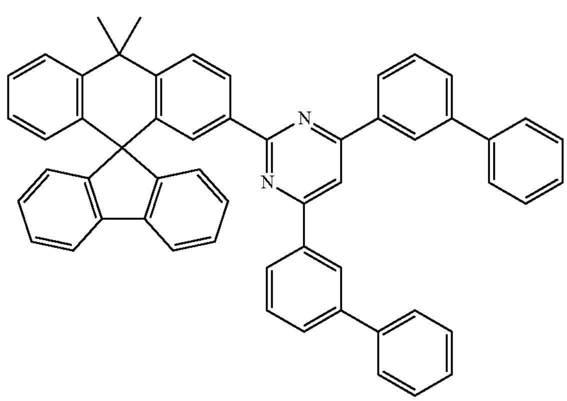
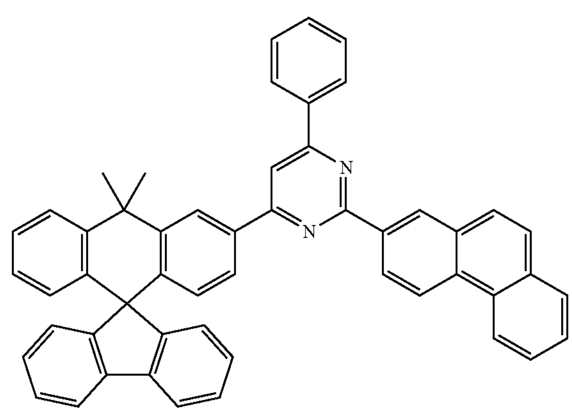

-continued
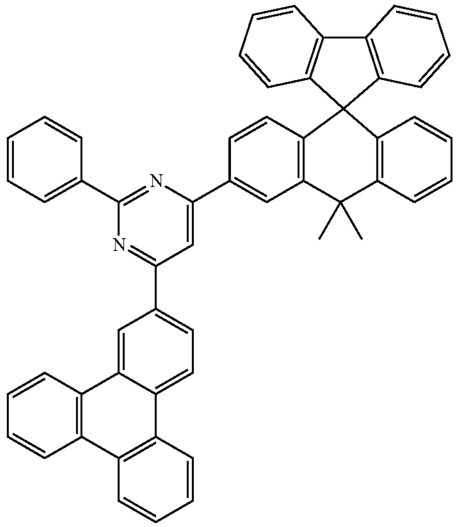
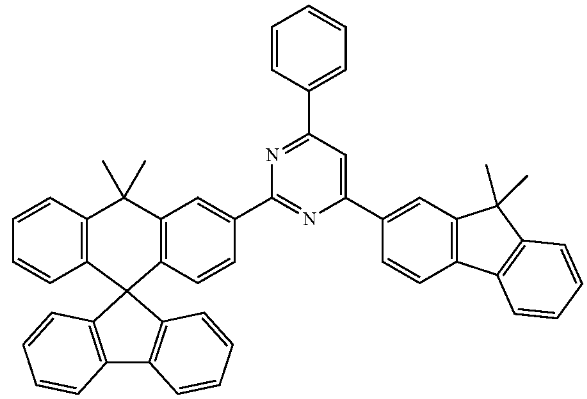
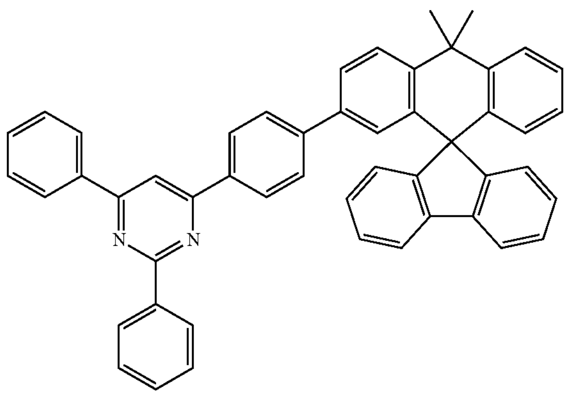
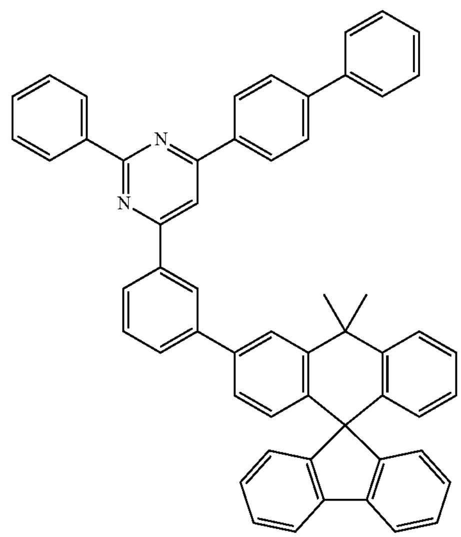
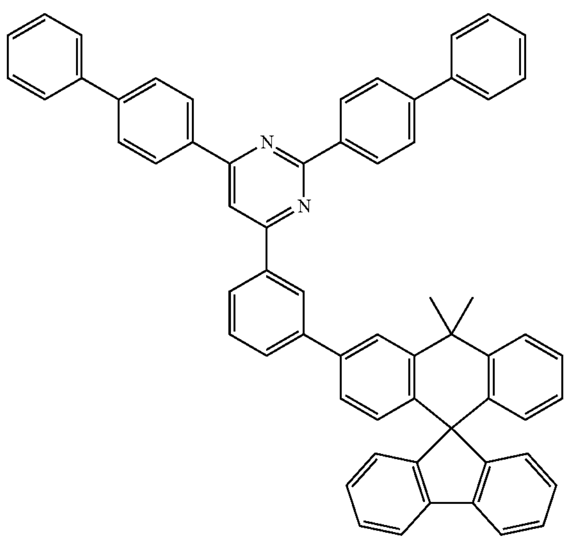
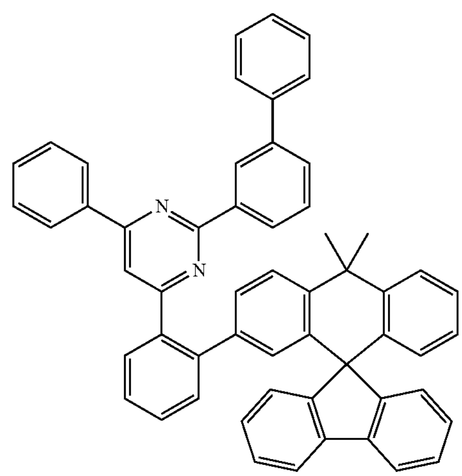

-continued
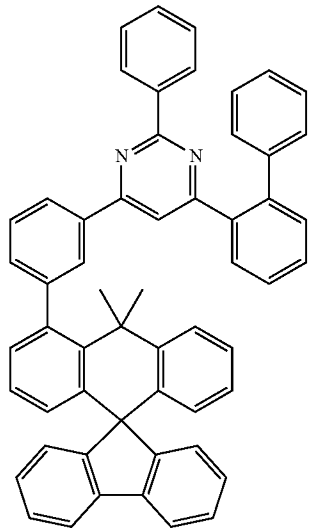
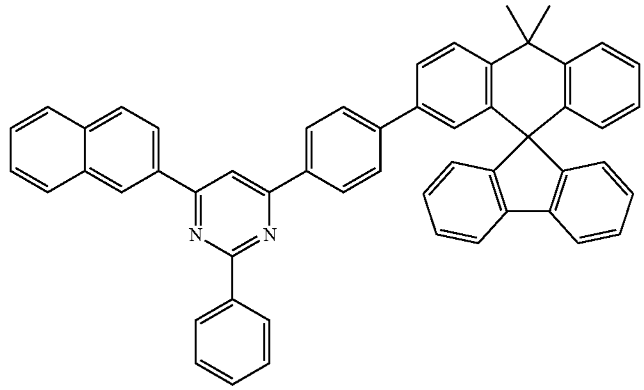
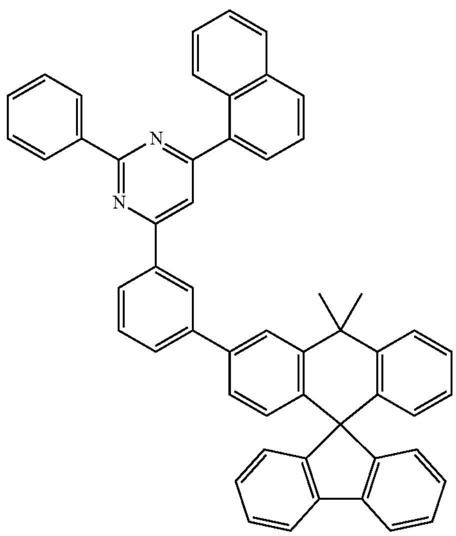
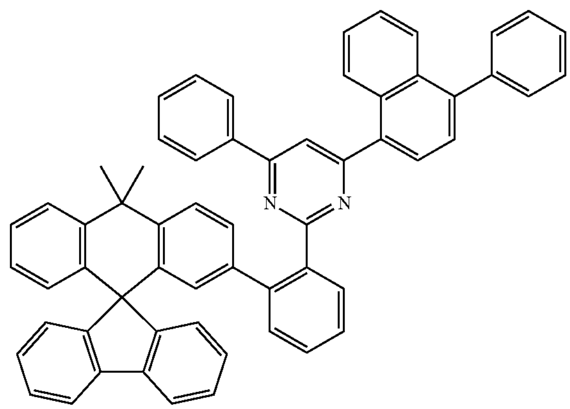
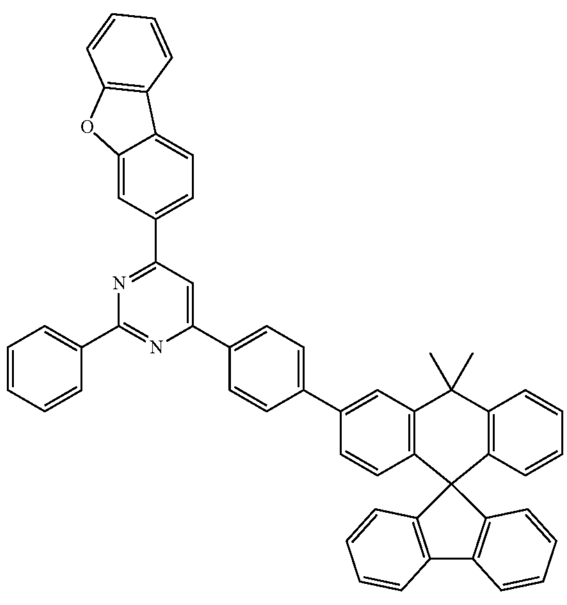
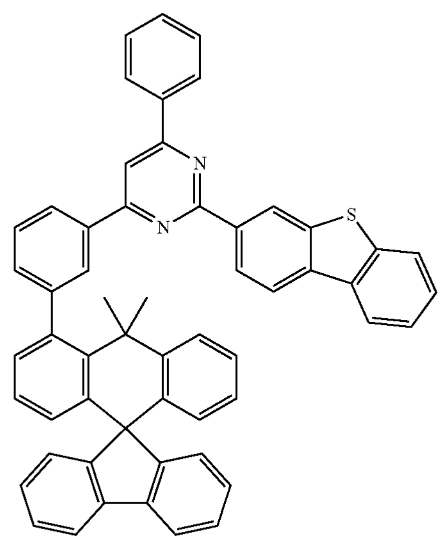

-continued
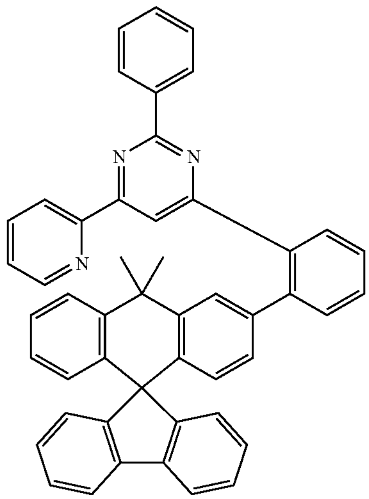
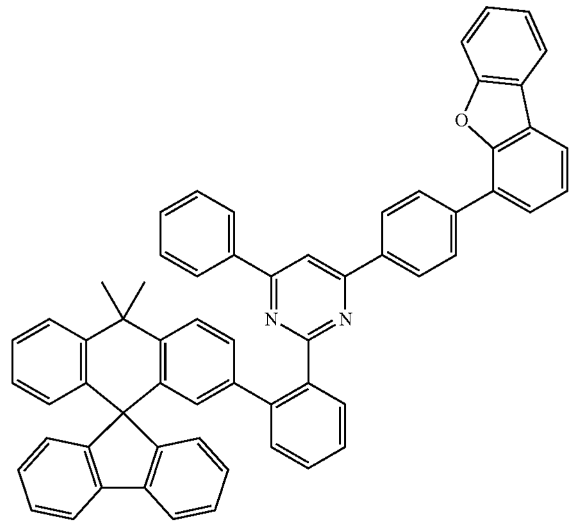
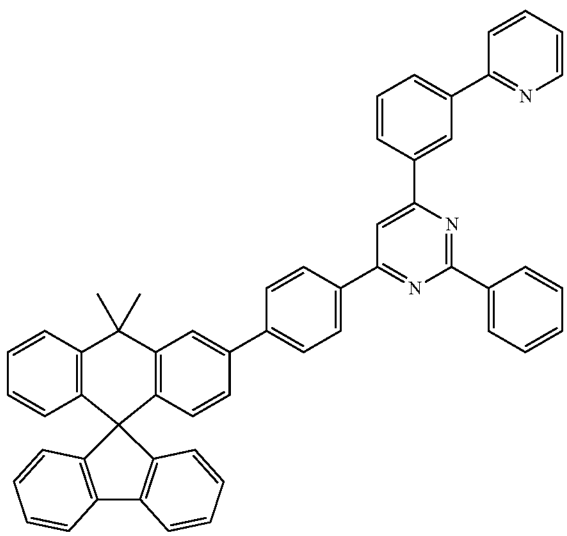
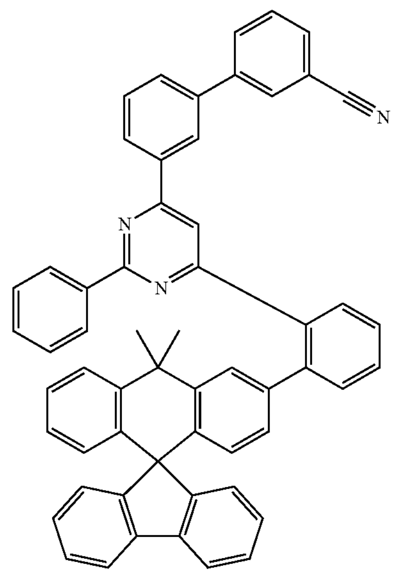
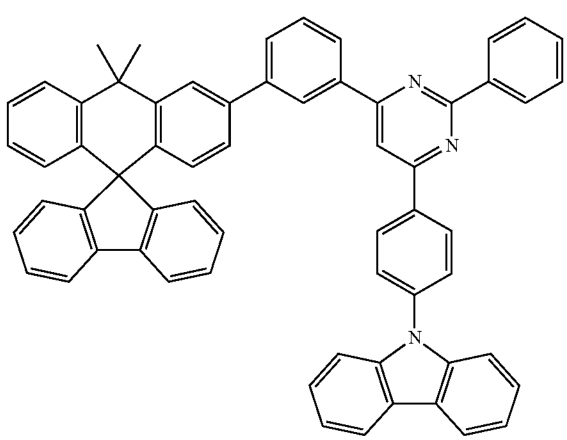

-continued
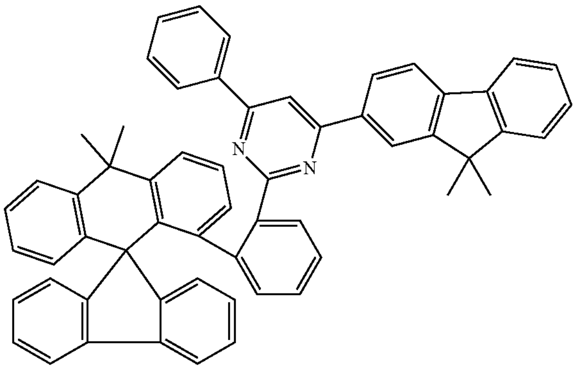
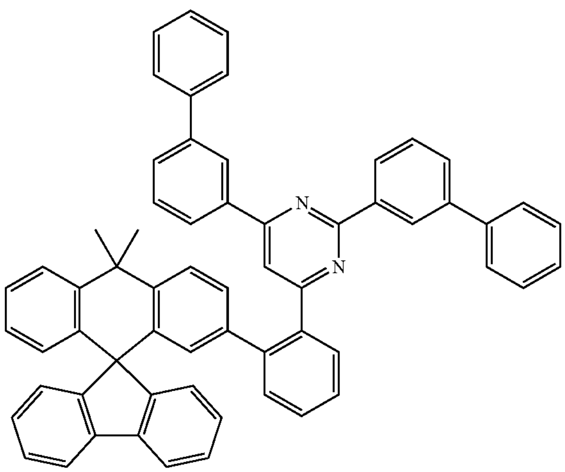
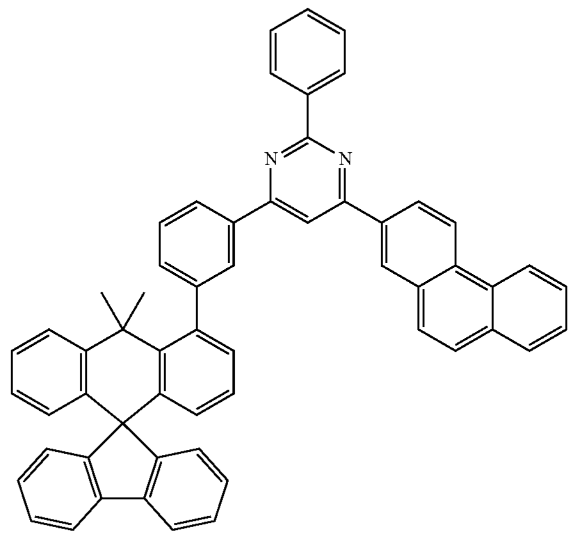
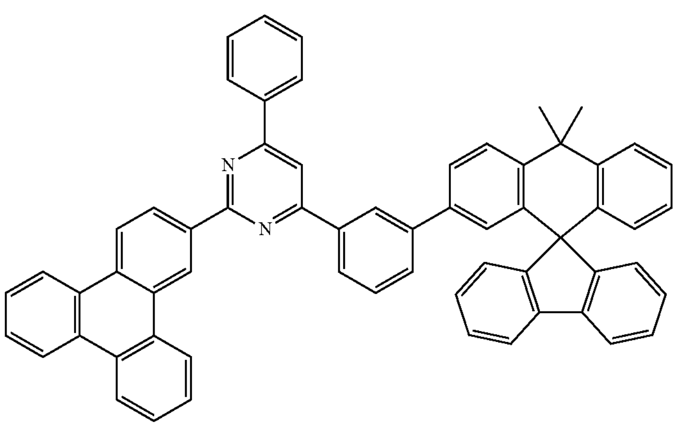

-continued
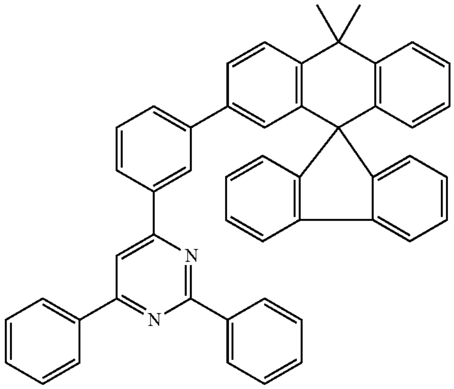
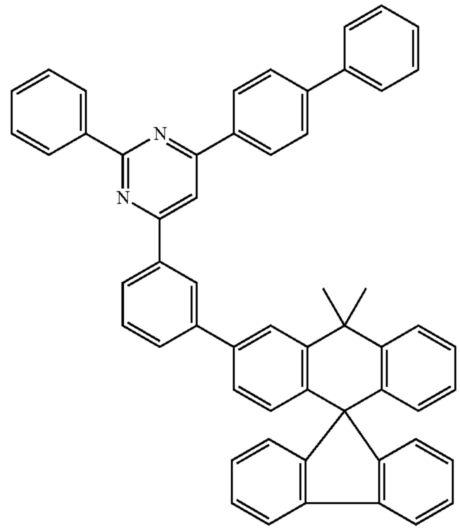
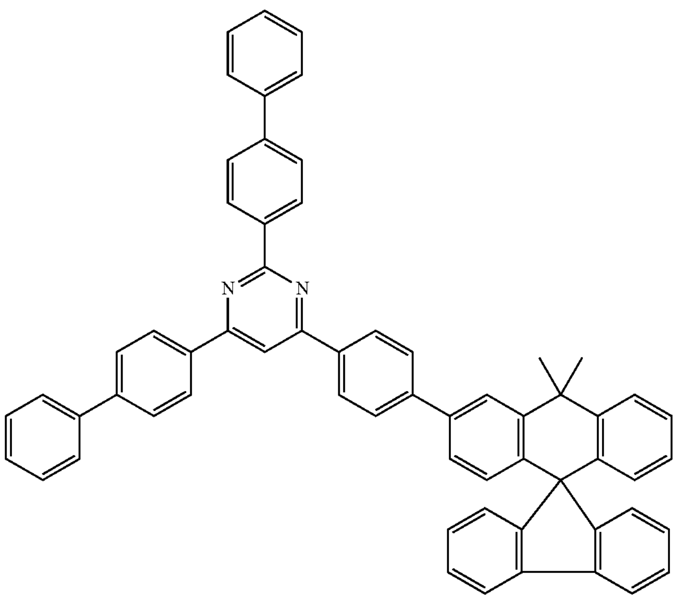
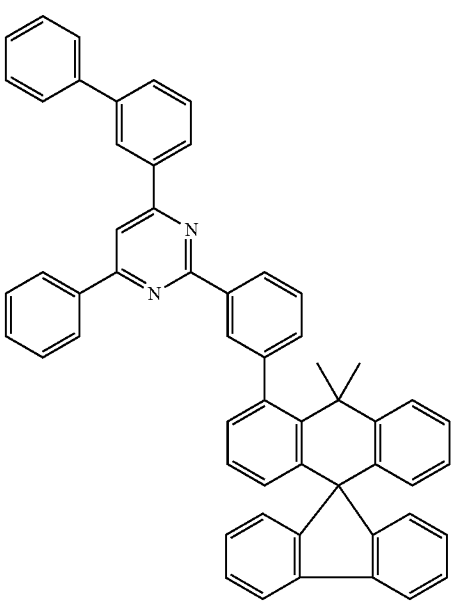
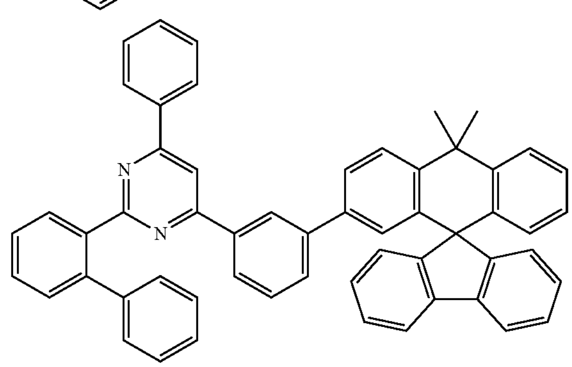

-continued
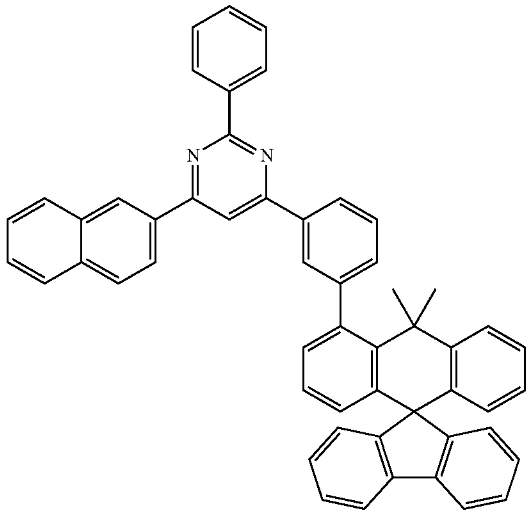
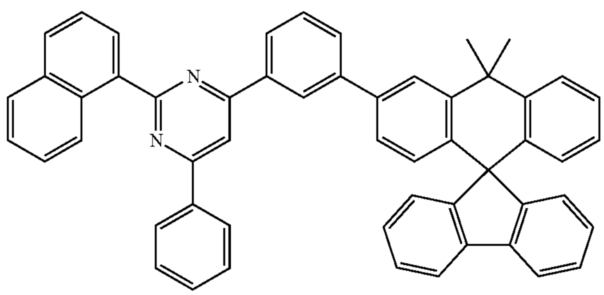
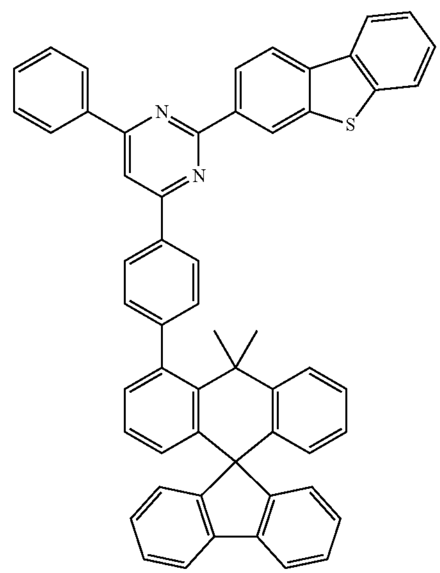
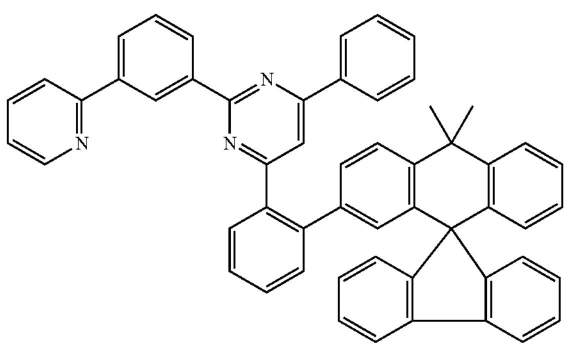

-continued
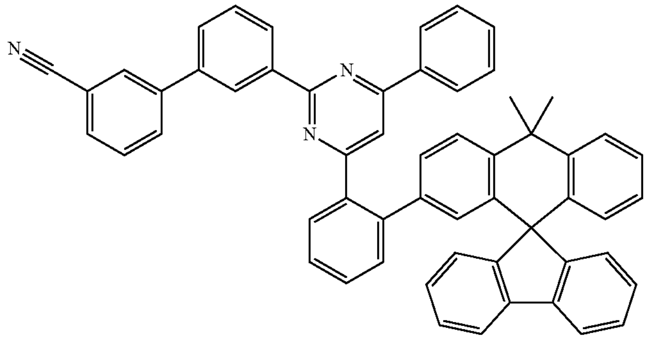
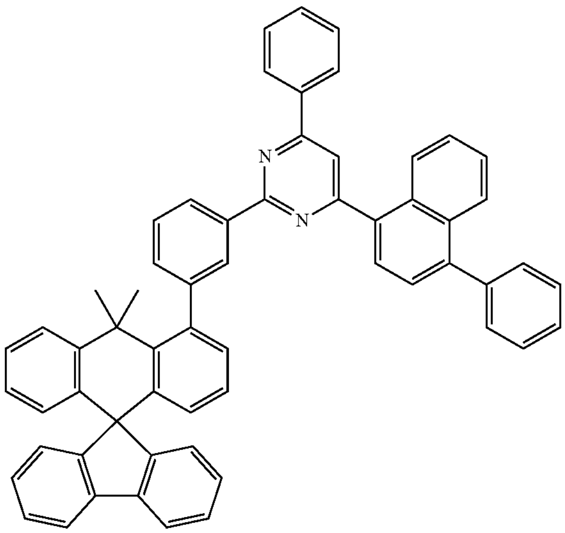
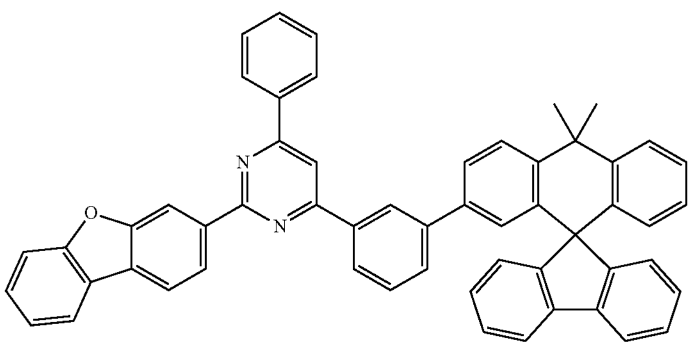
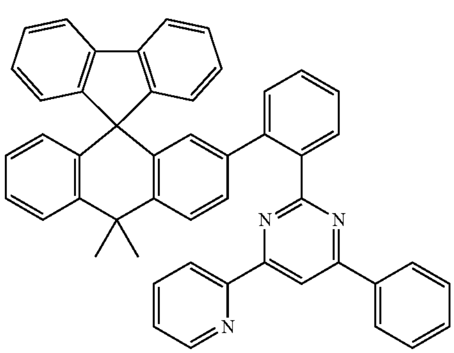

-continued
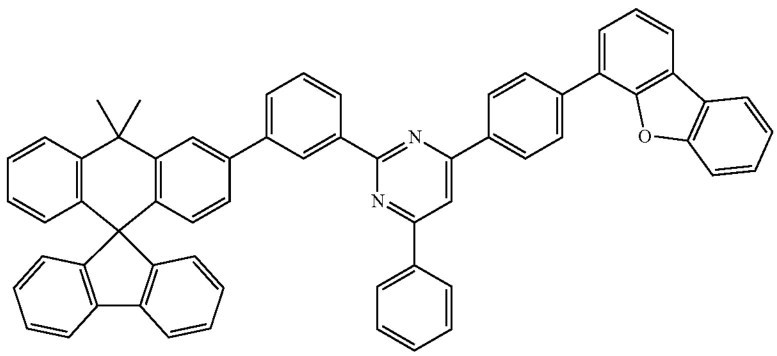
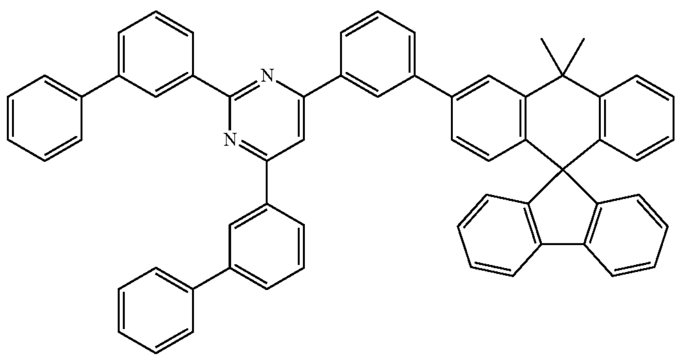
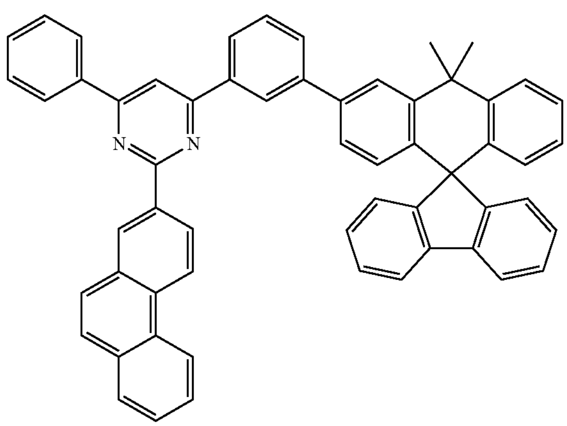
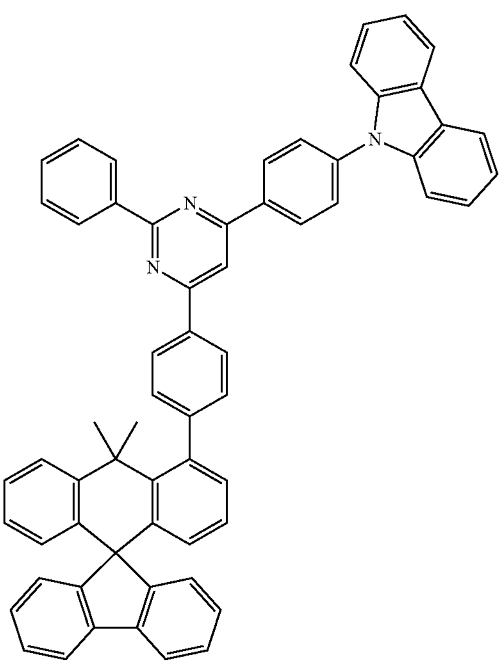

-continued
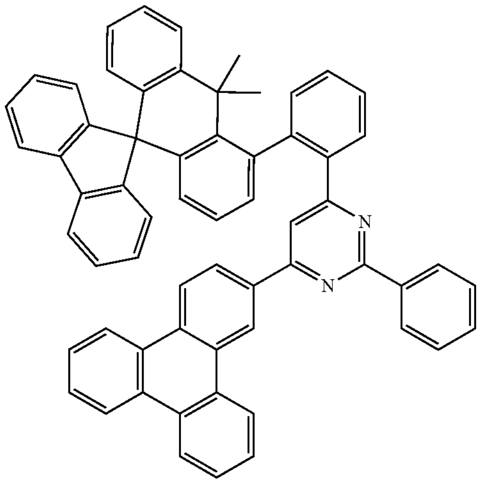
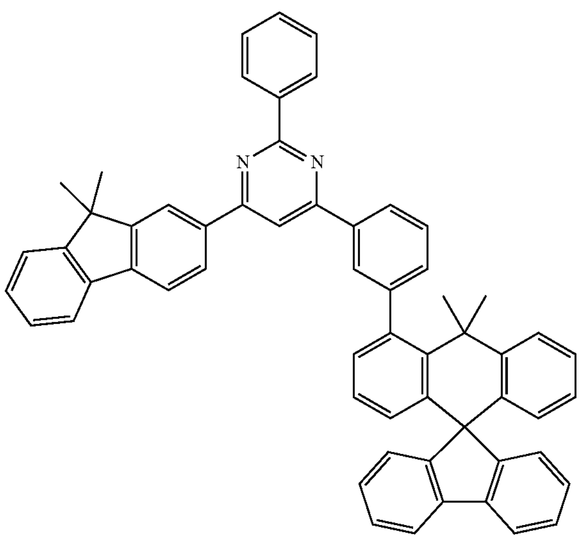 [SMILES: CC1(C)c2ccccc2-c2ccc(-c3cc(-c4cccc(-c5cccc6c5C(C)(C)c5ccccc5C65c6ccccc6-c6ccccc65)c4)nc(-c4ccccc4)n3)cc21]
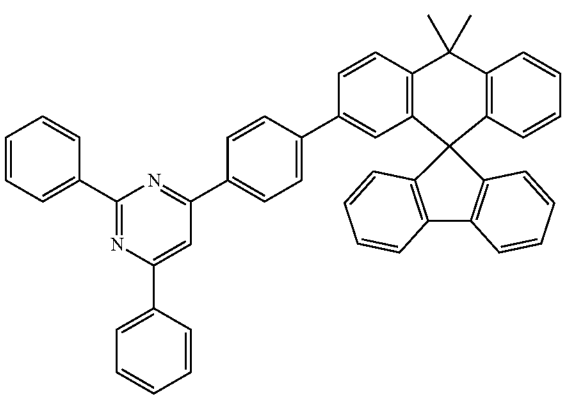

-continued
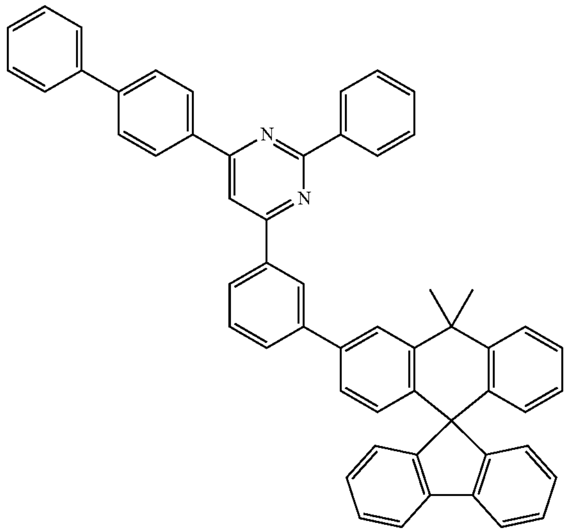
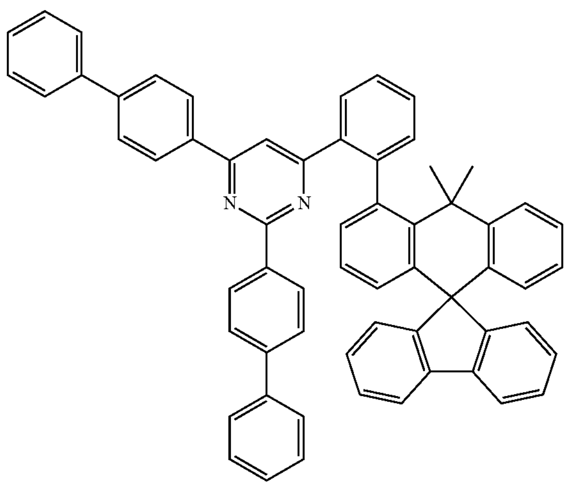
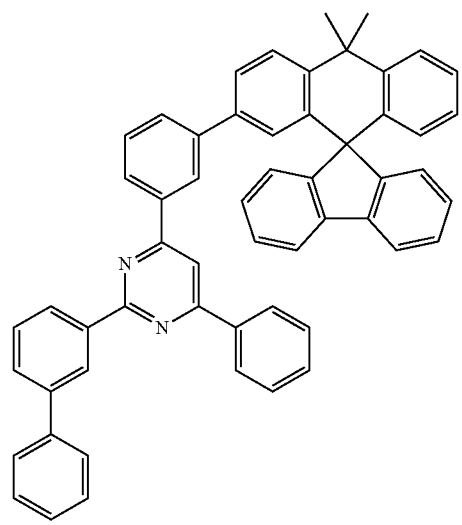
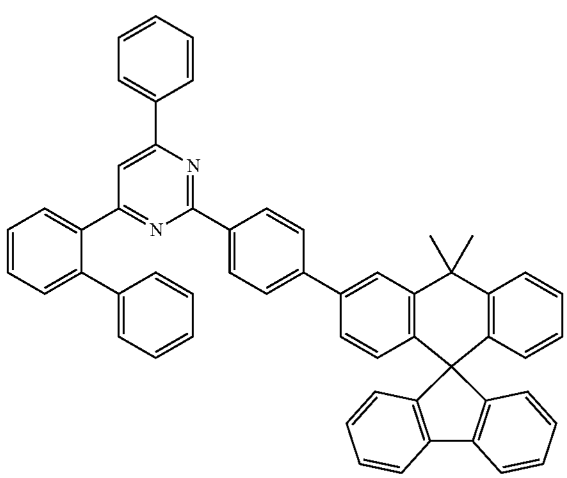
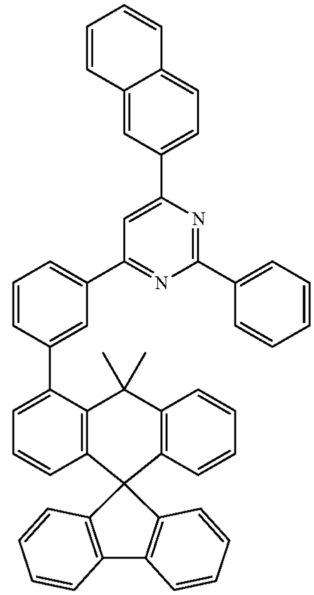

-continued
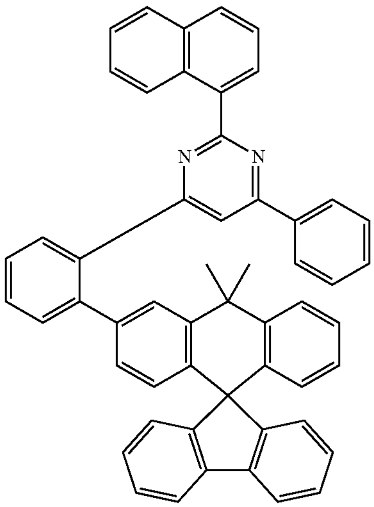
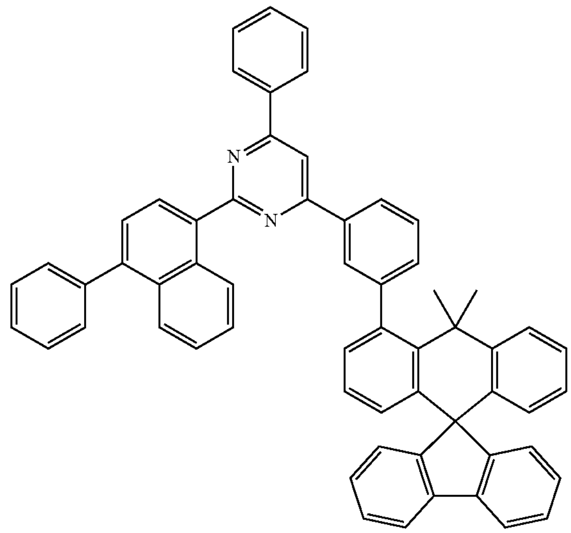
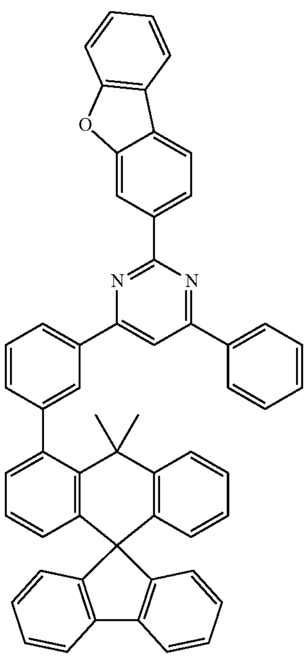
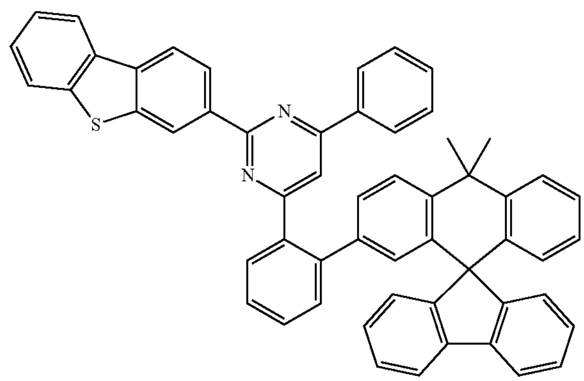
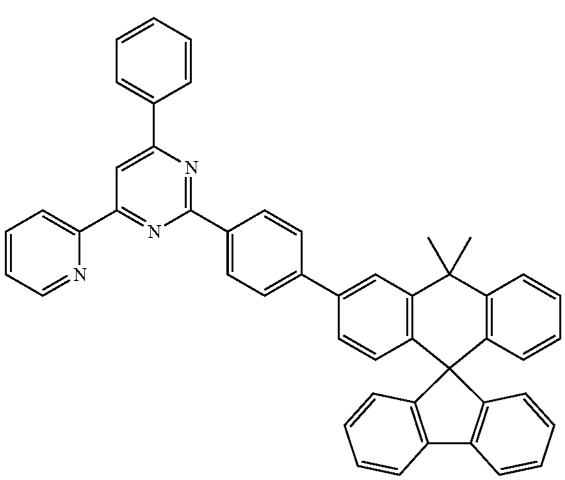

-continued
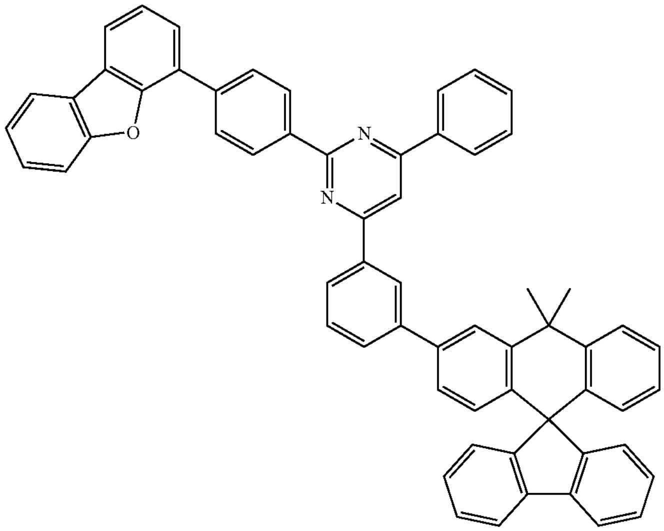
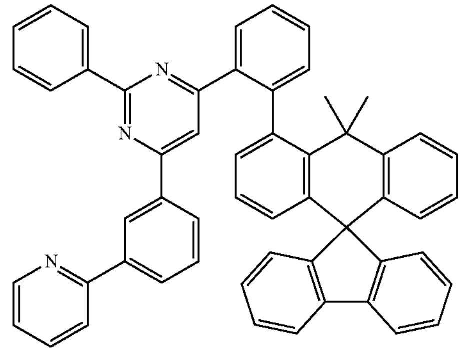
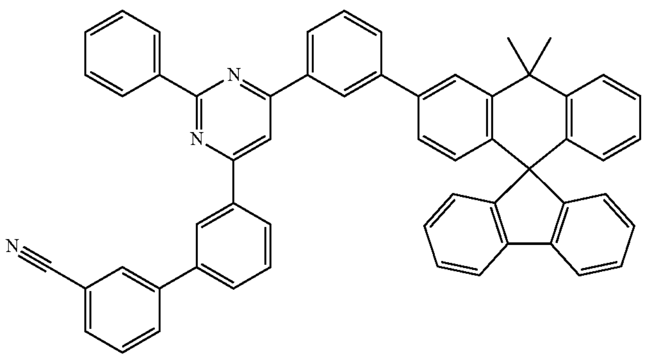
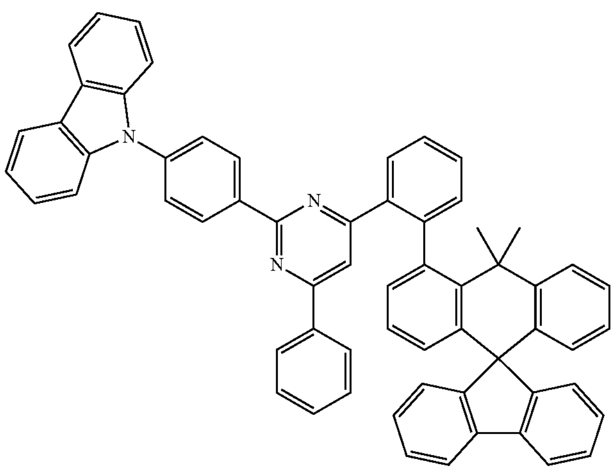

-continued
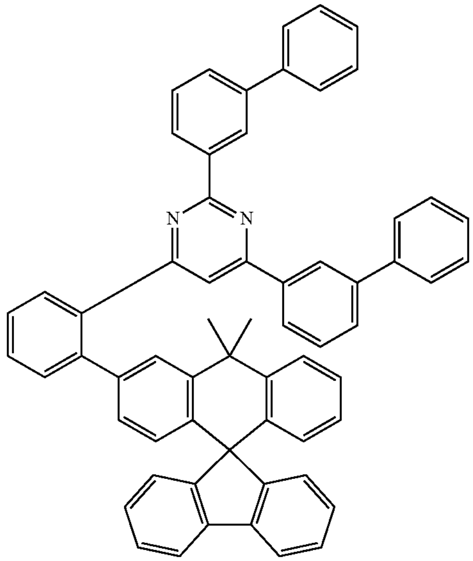
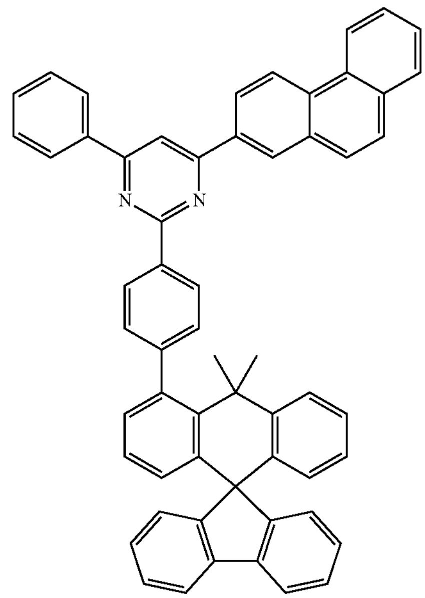
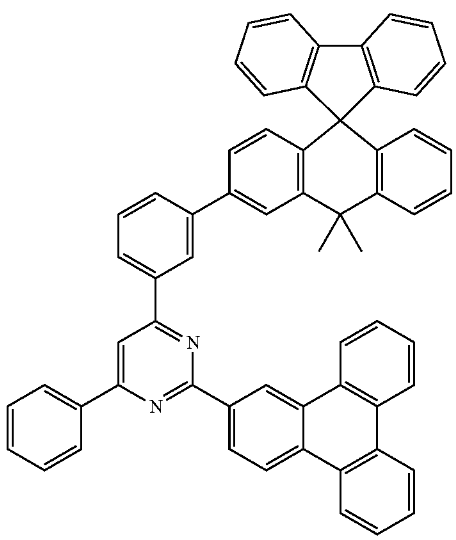
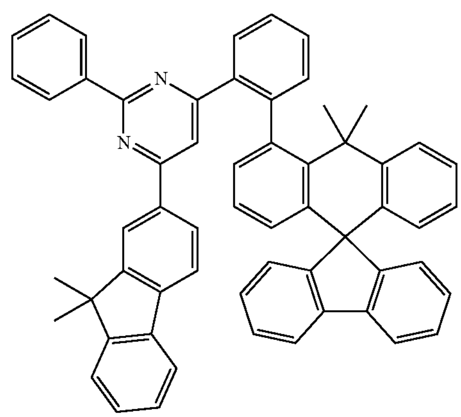
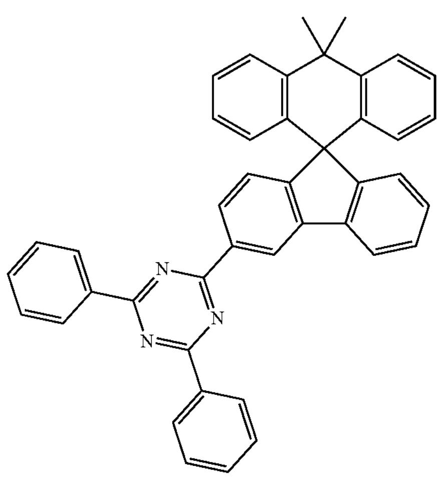
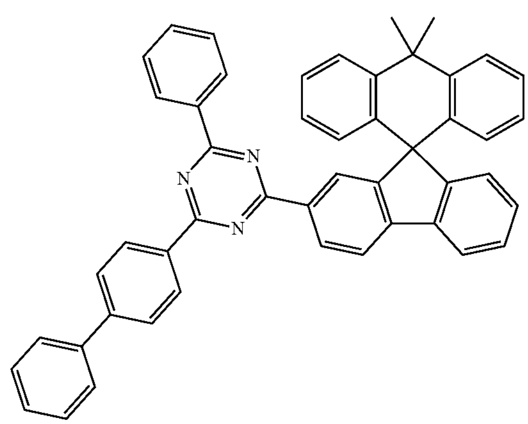

-continued
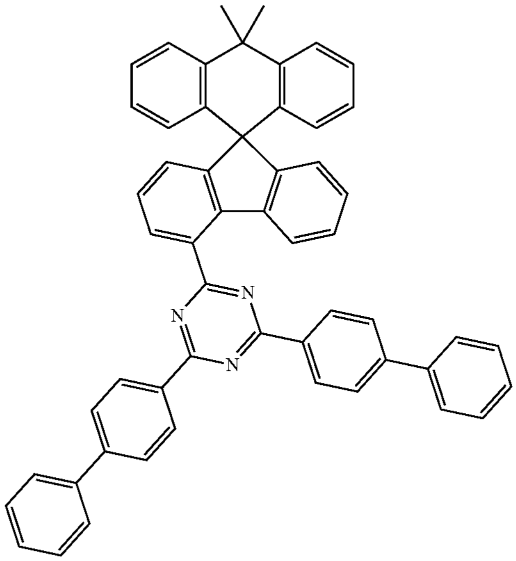
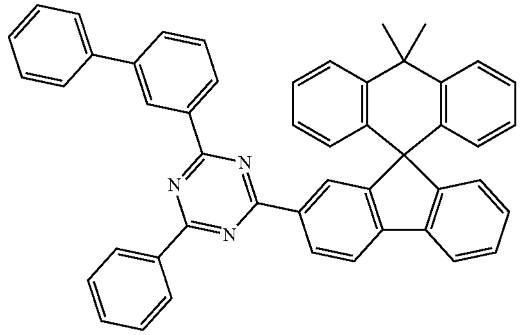
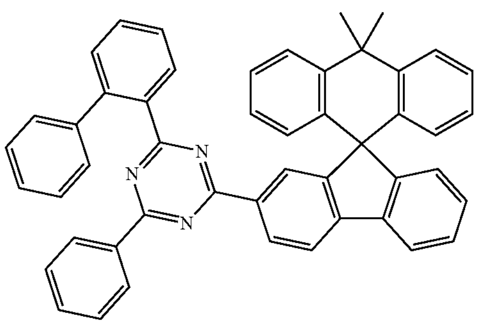
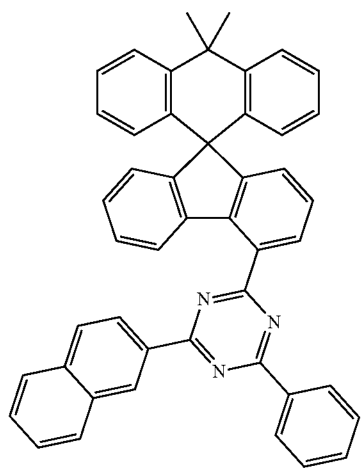
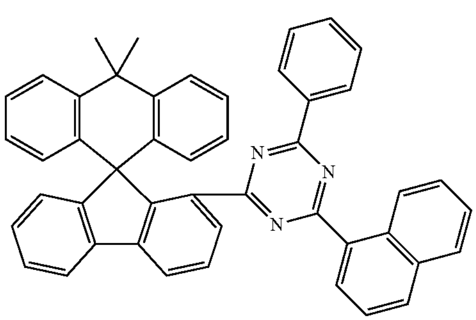
N
N
N

-continued
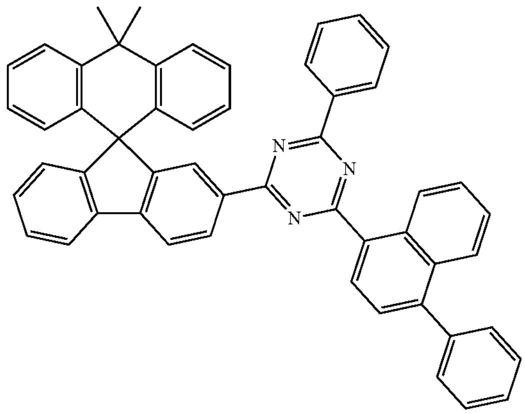
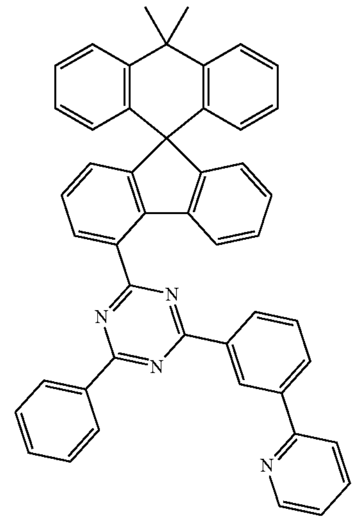
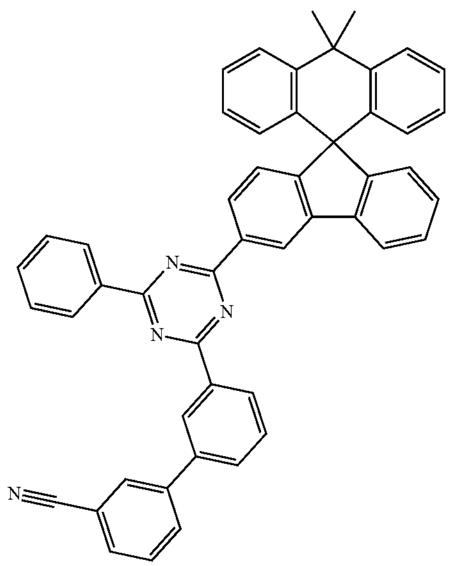
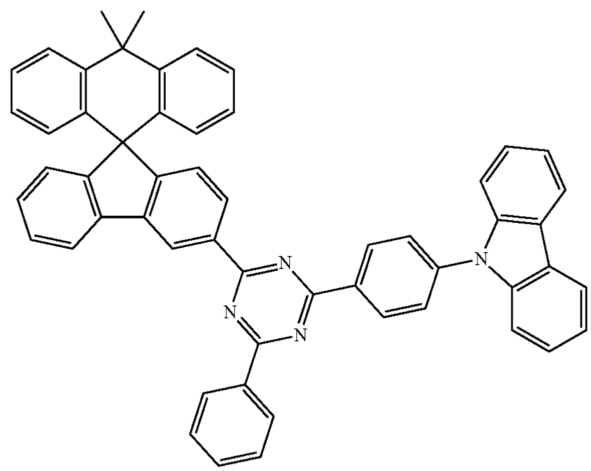
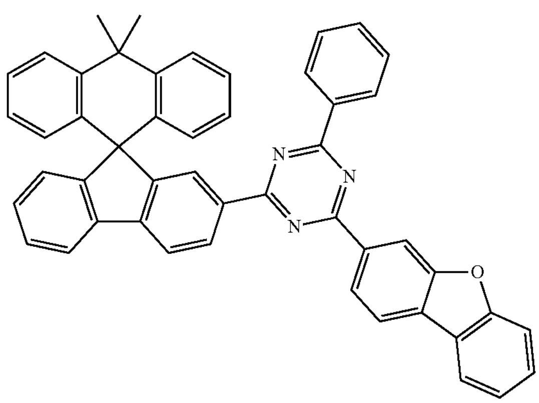
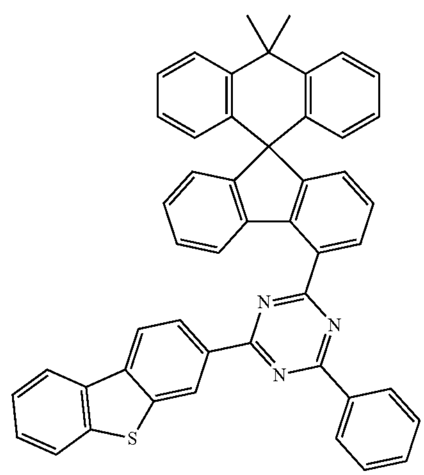

-continued
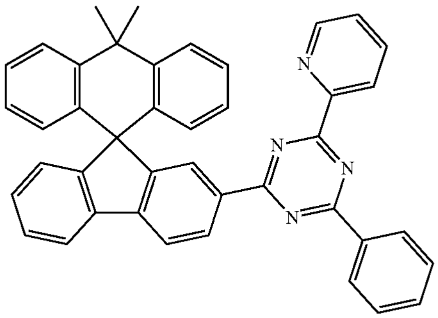
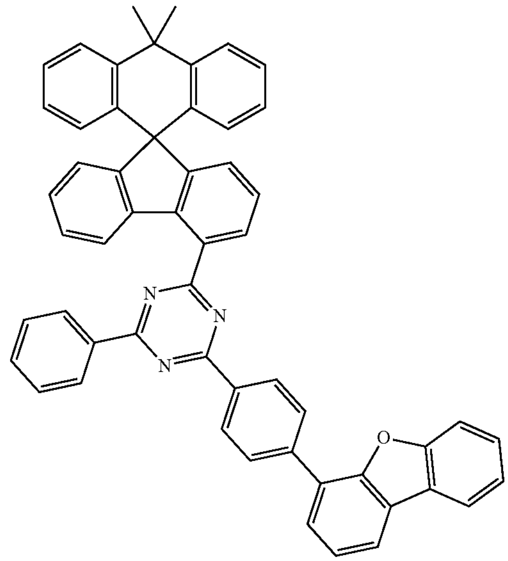
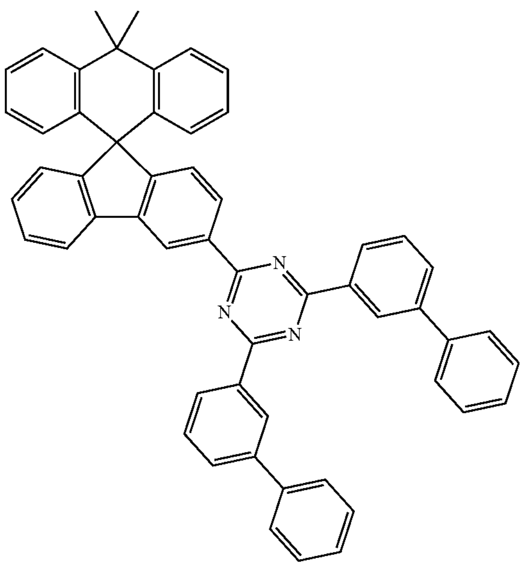
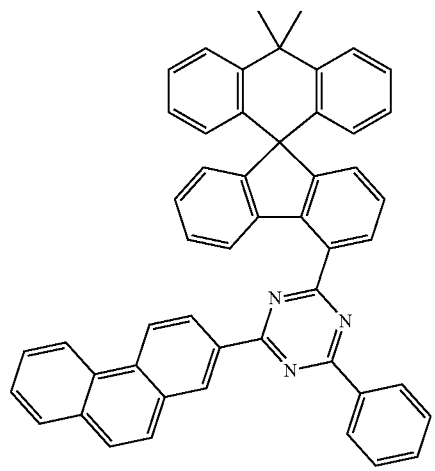
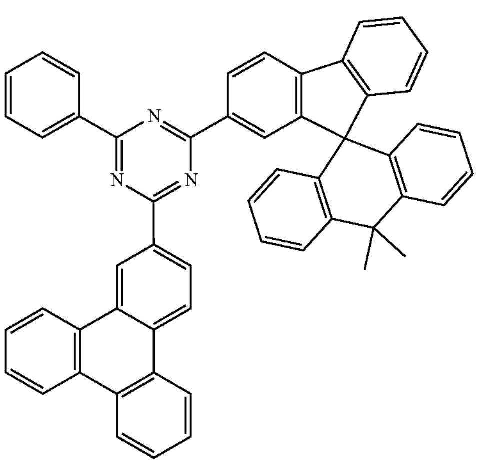
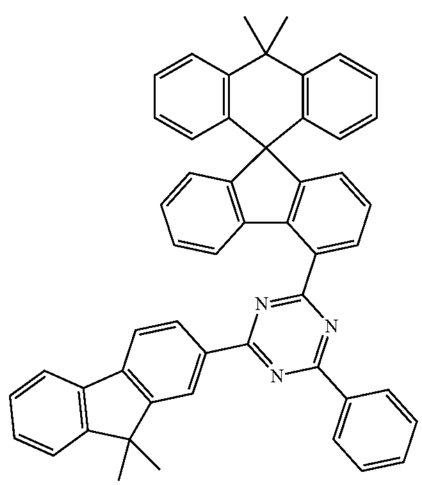

-continued
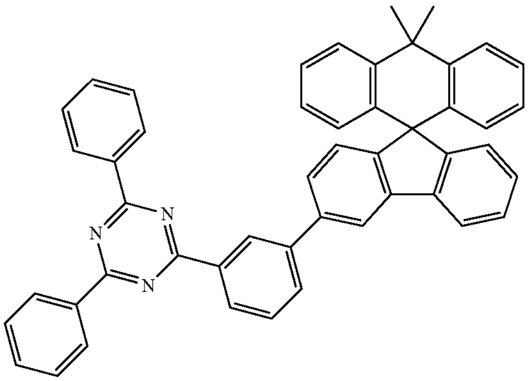
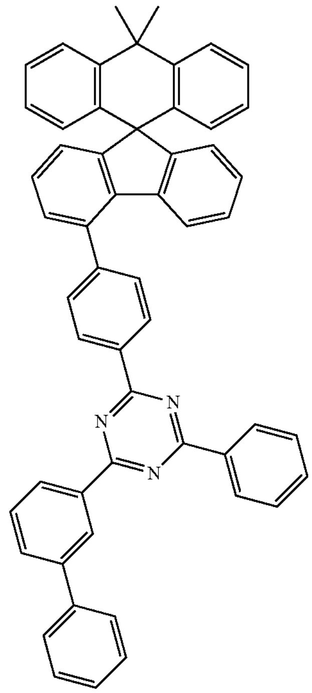
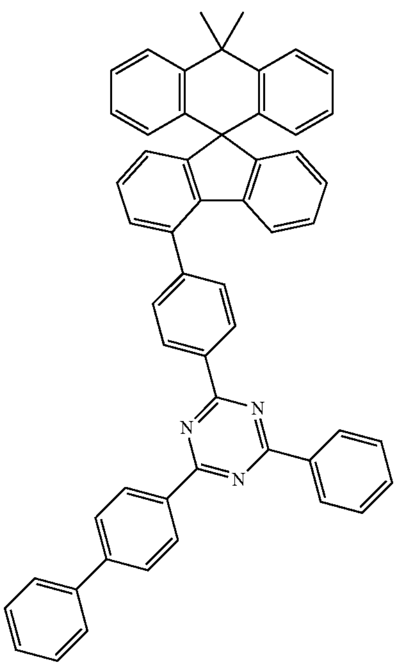
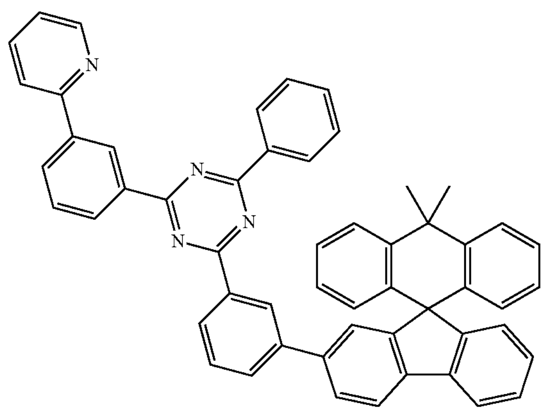
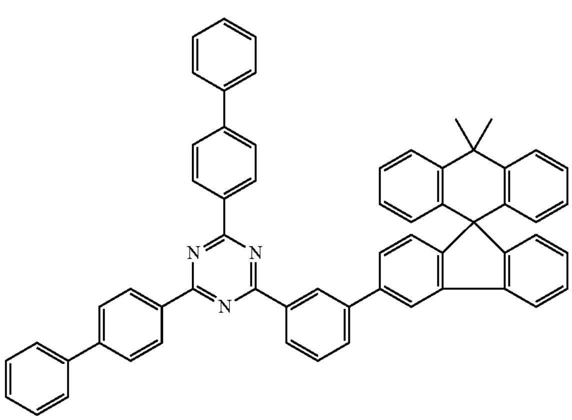
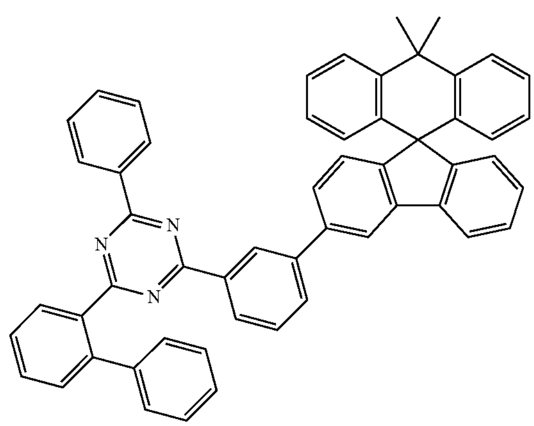

-continued
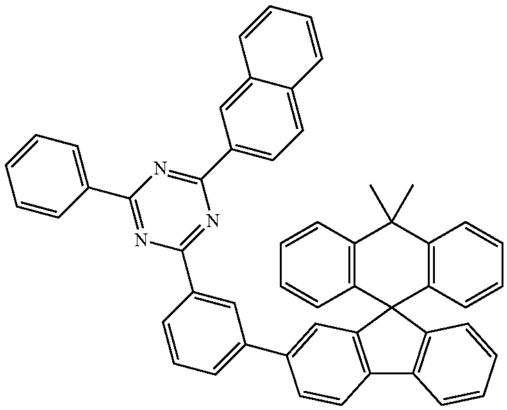
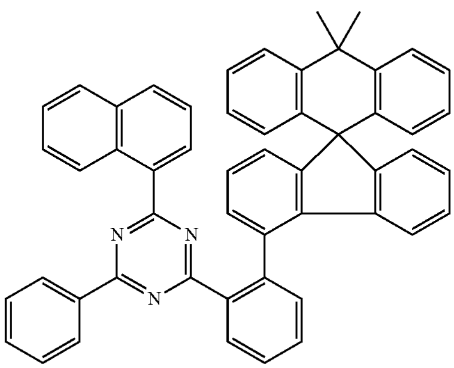
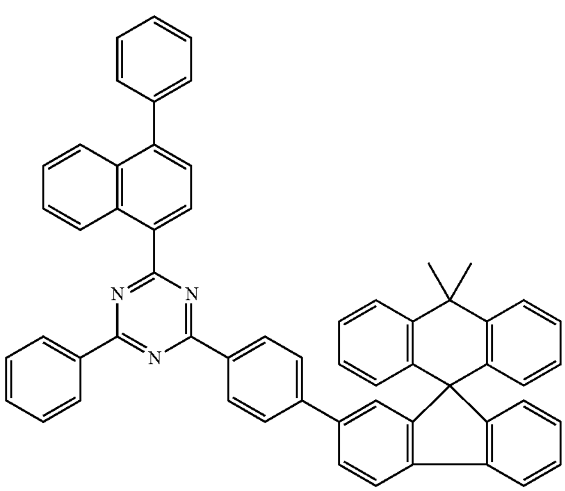
-continued
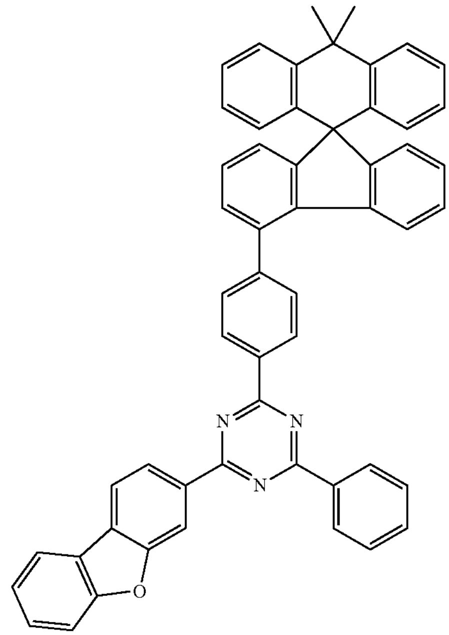
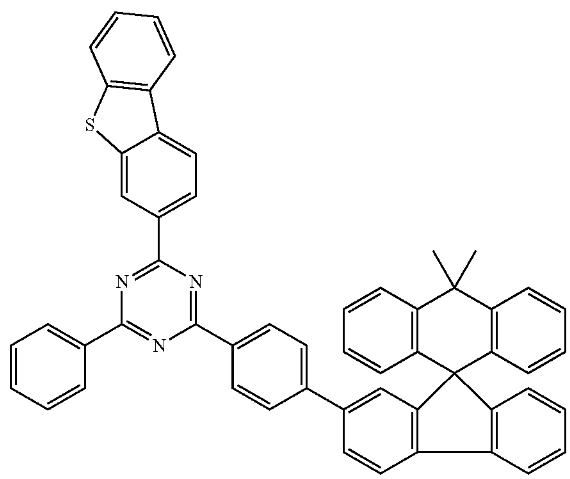
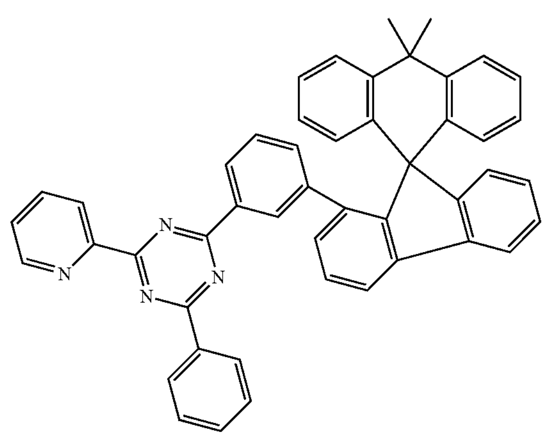

-continued
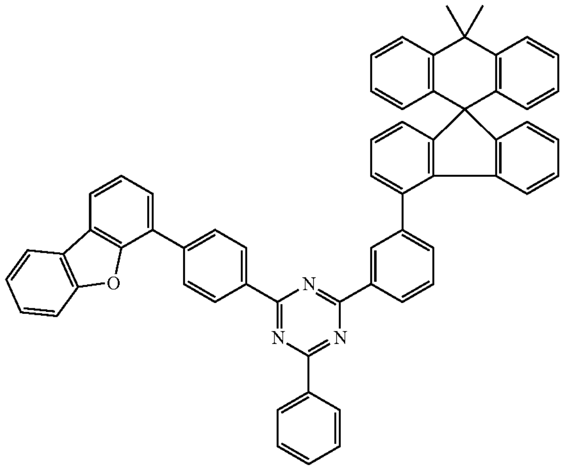
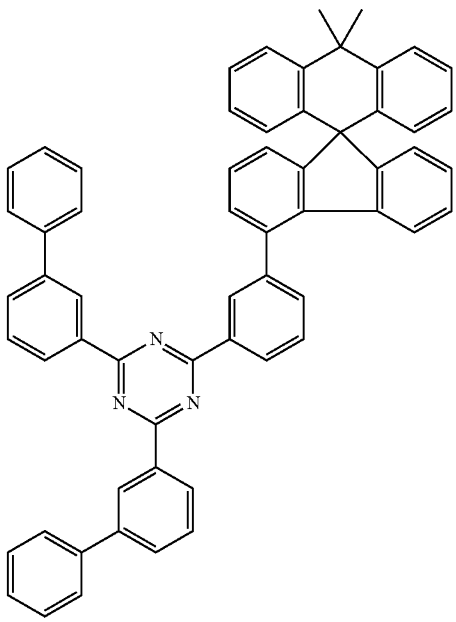
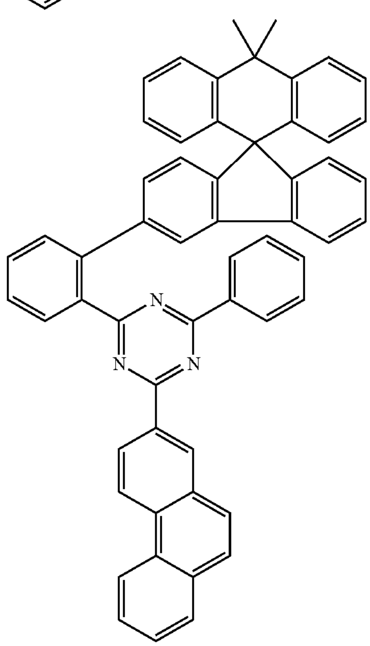
-continued
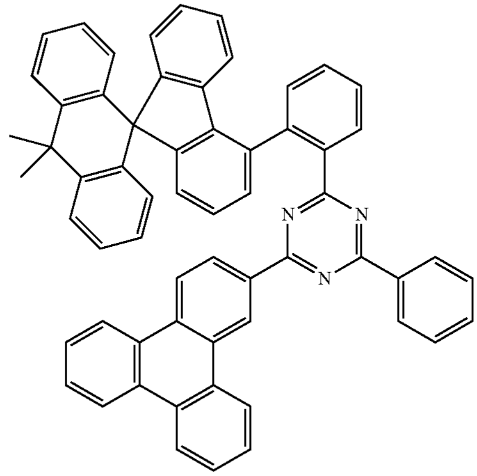
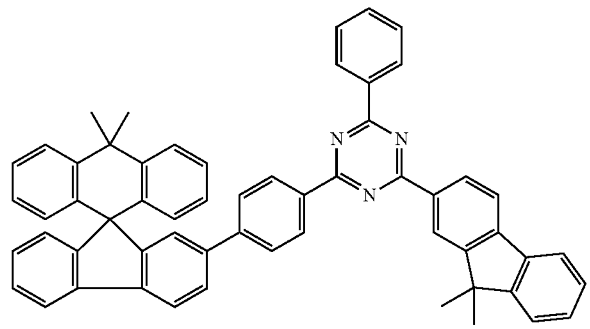
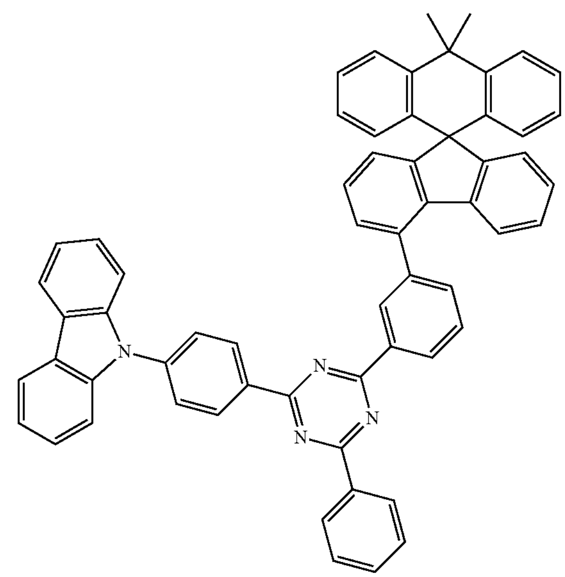
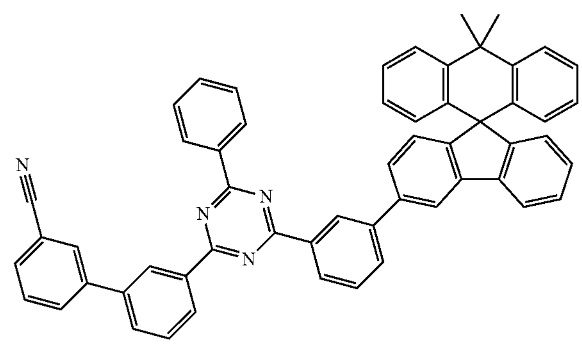

-continued
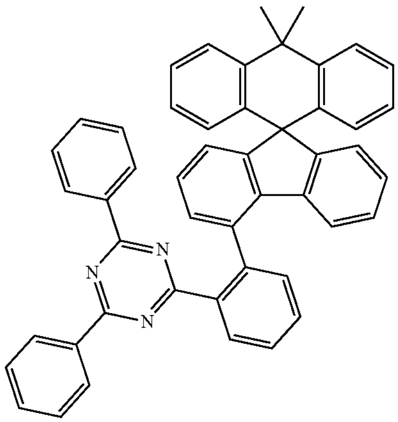
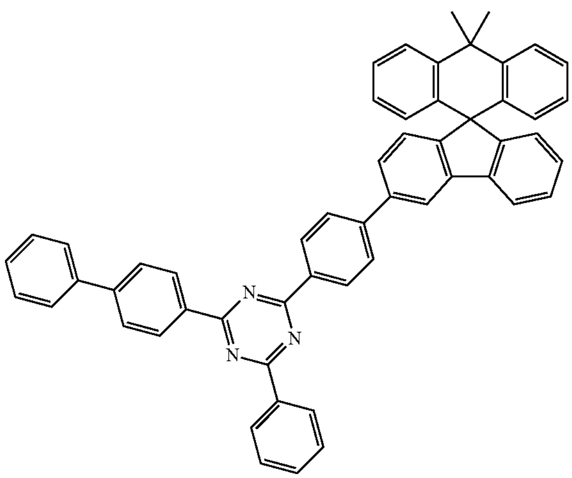
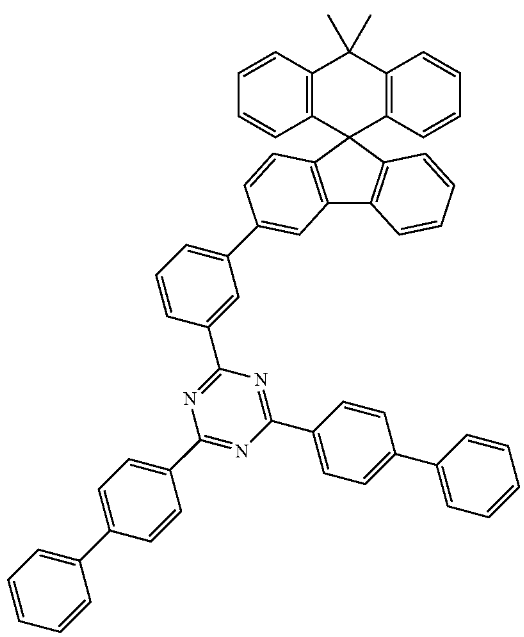
-continued
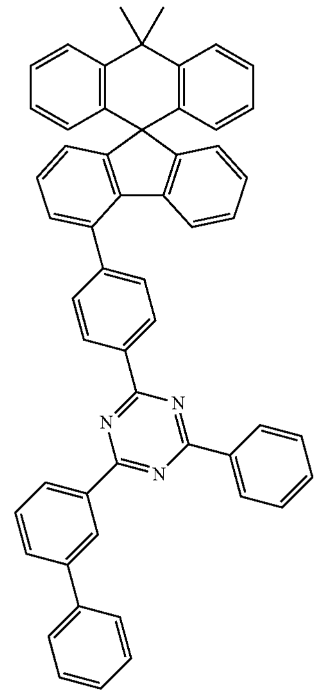
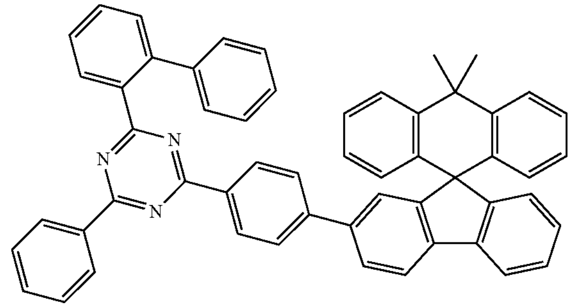
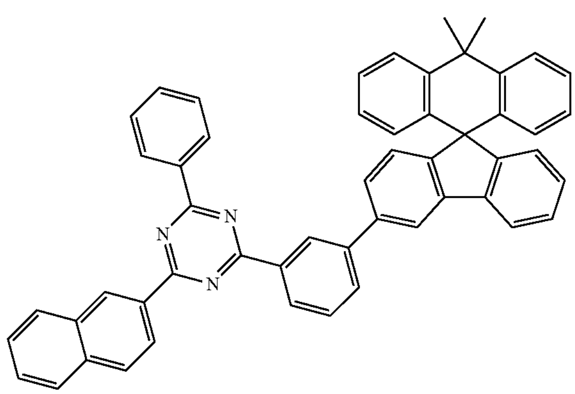

-continued
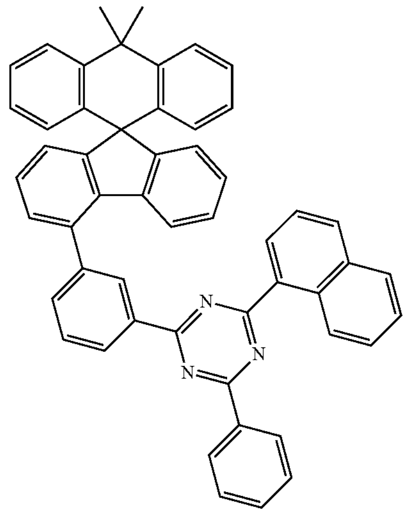
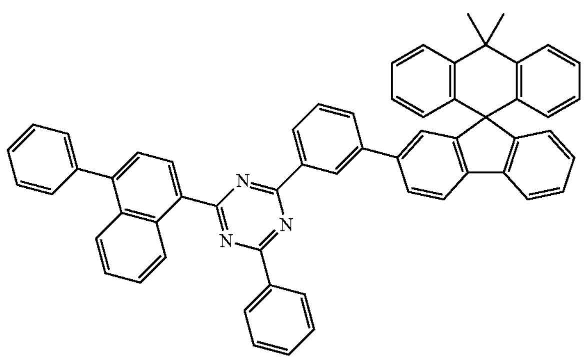
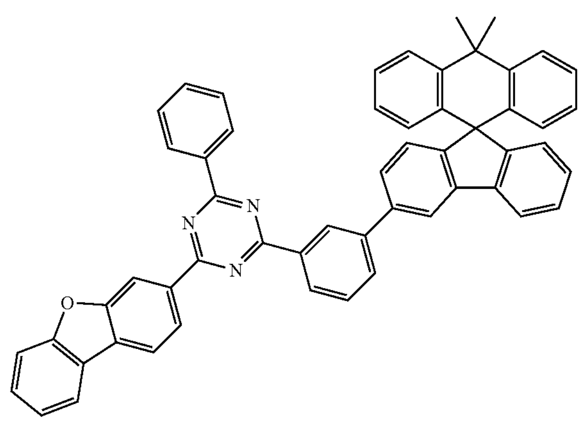
-continued
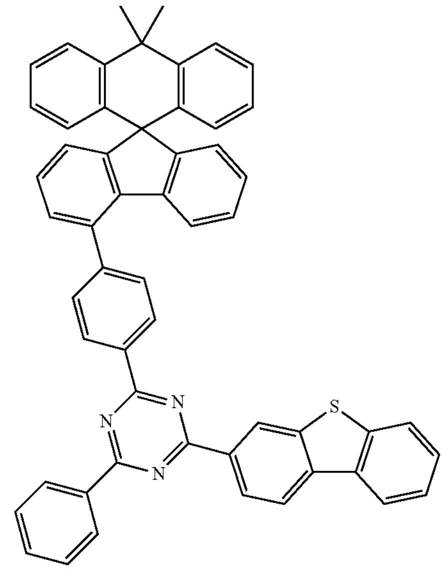
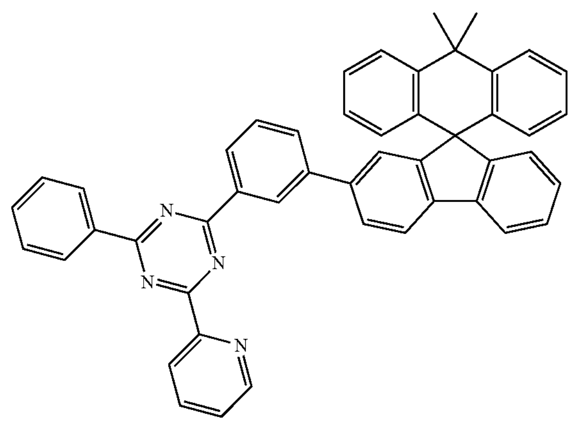
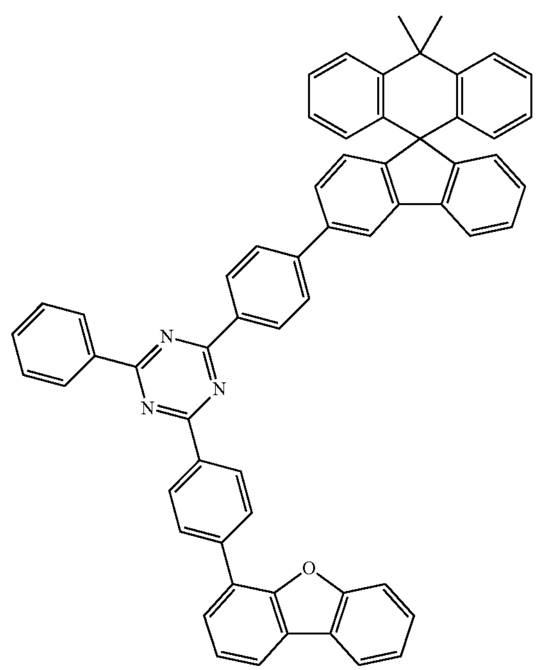

-continued
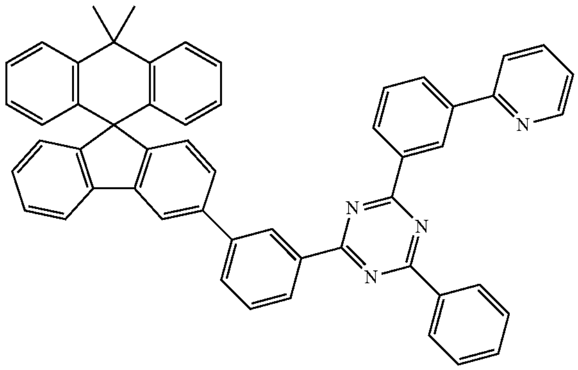
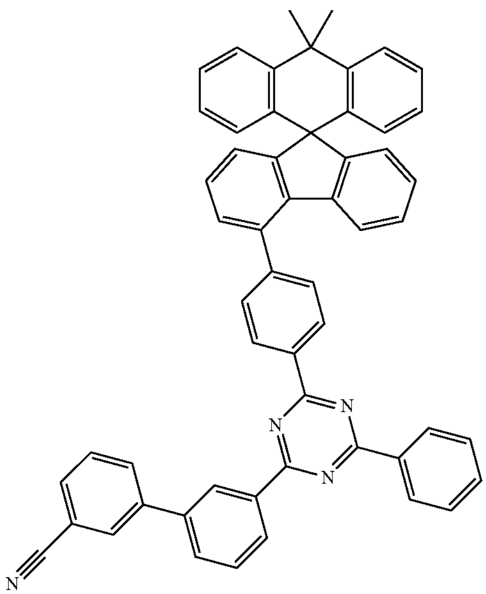
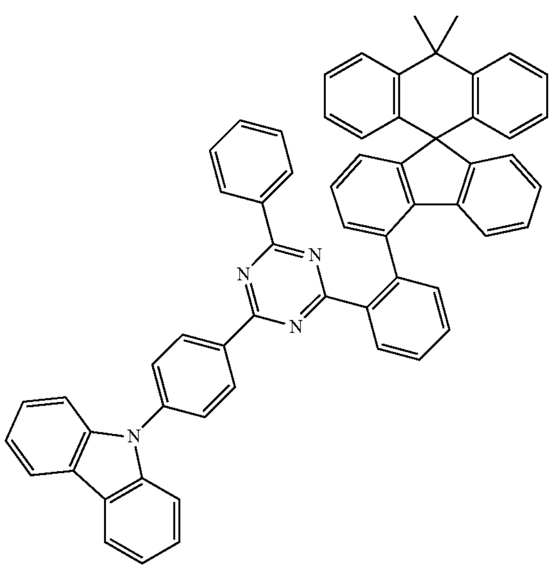
-continued
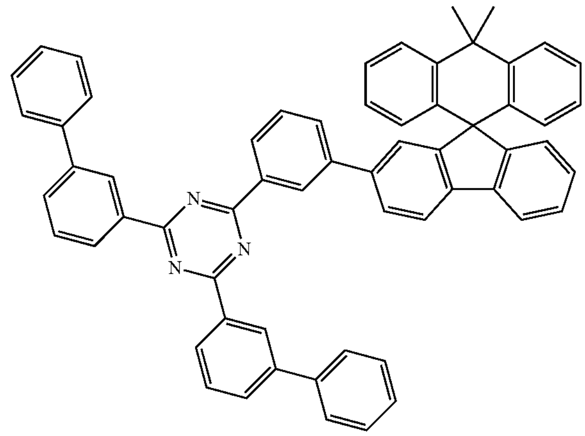
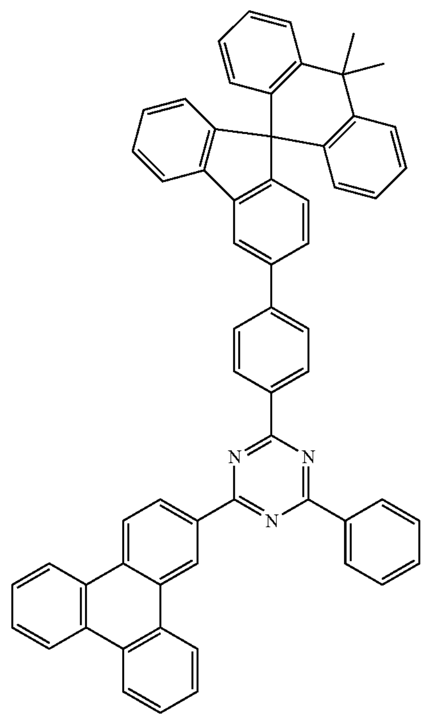
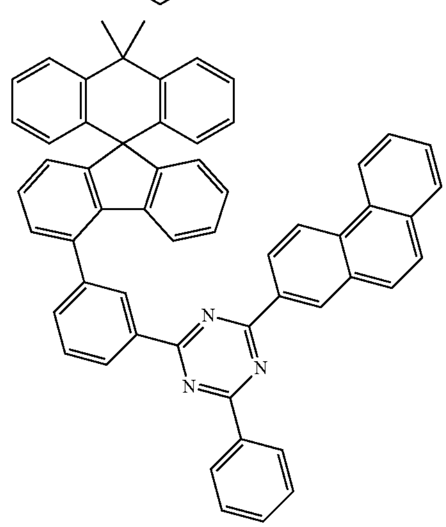

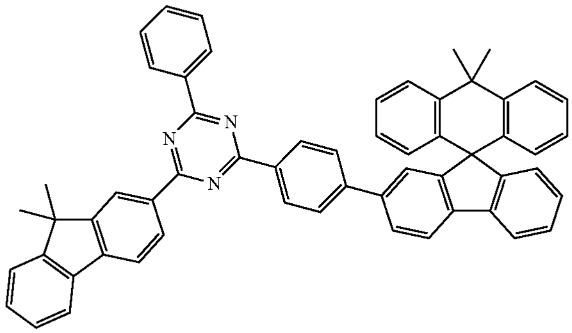
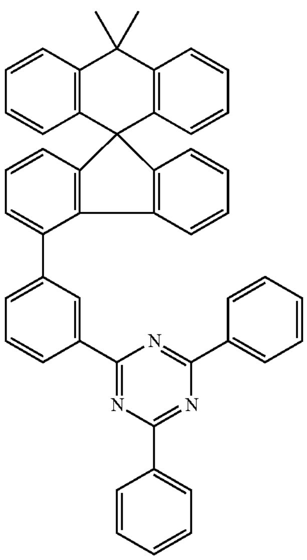
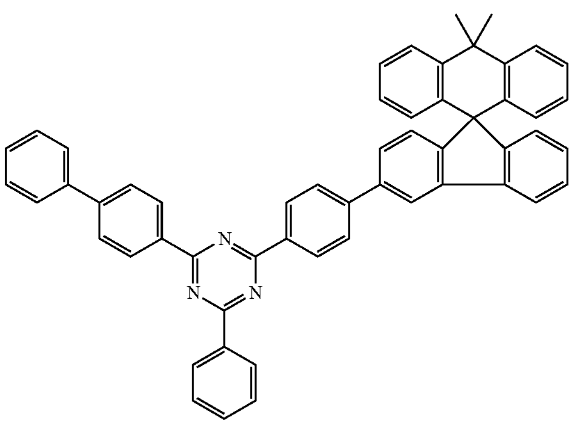
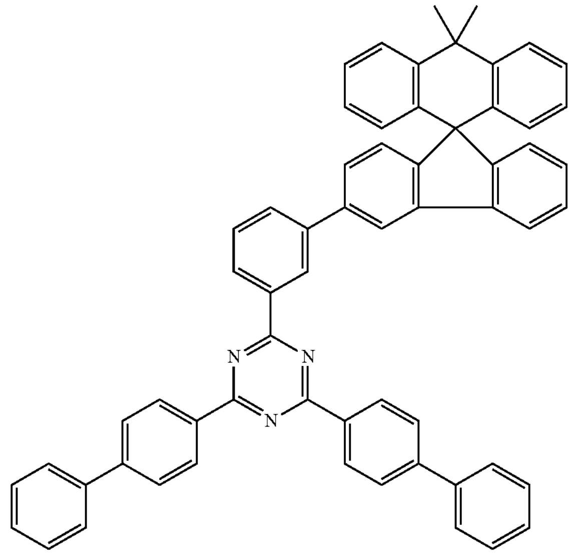
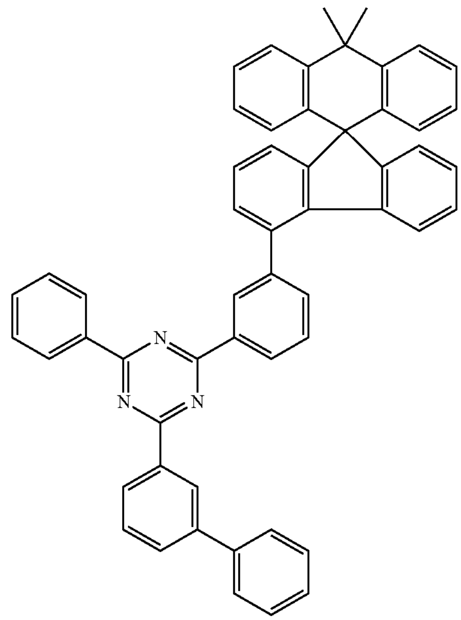
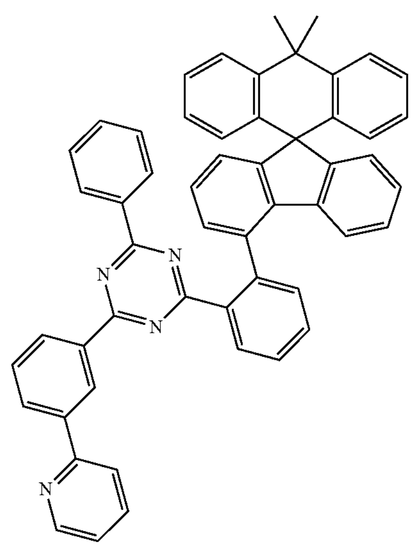

-continued
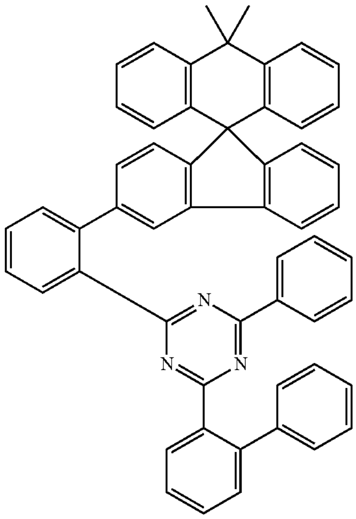
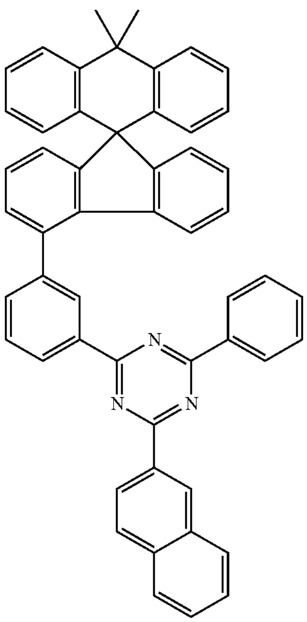
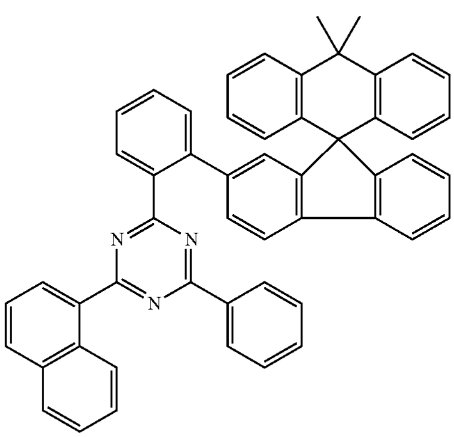
-continued
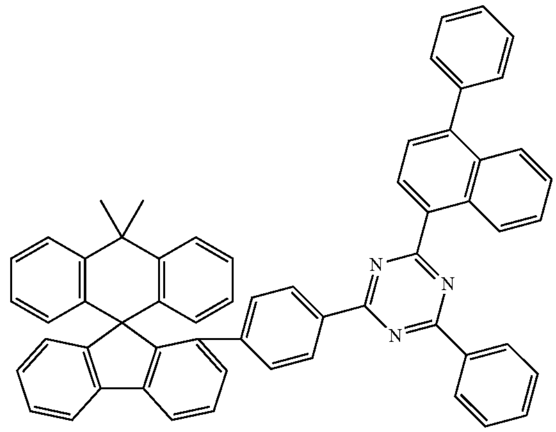
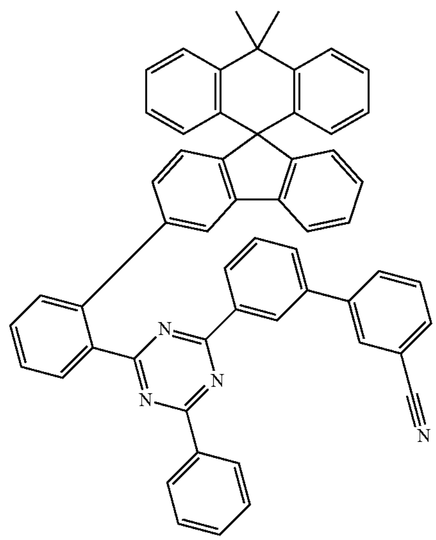
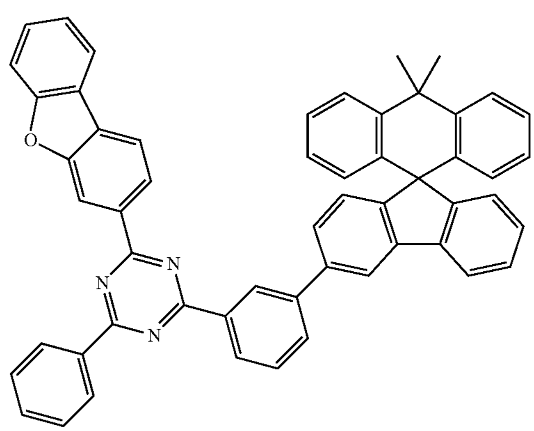

-continued
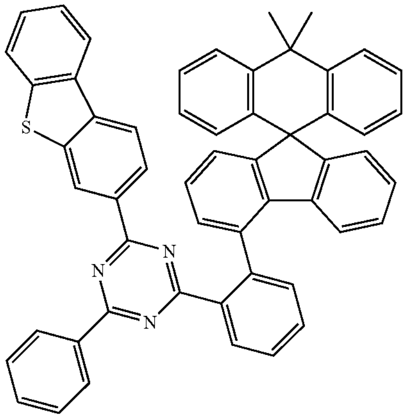
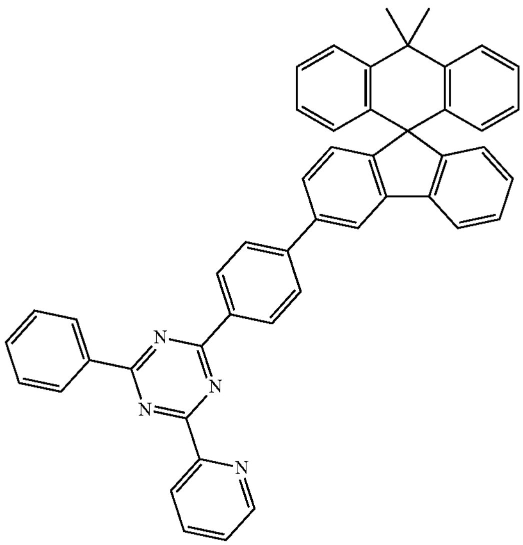
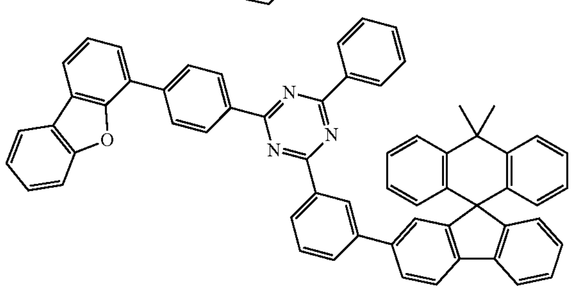
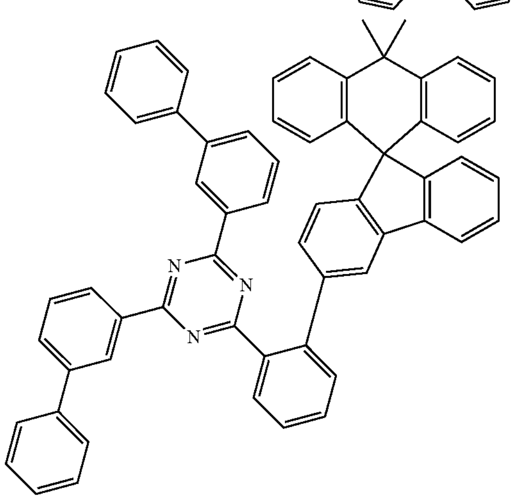
-continued
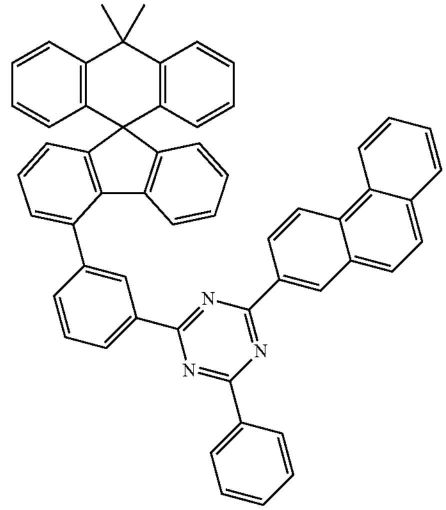
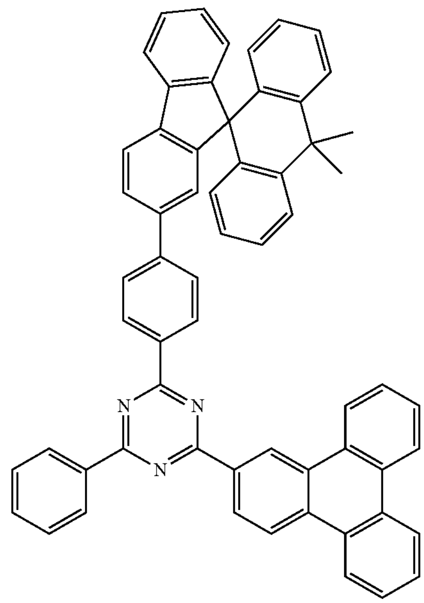
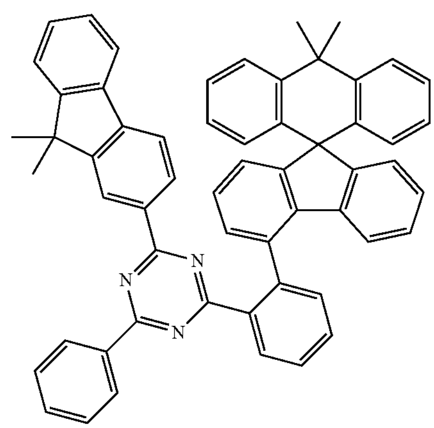

-continued
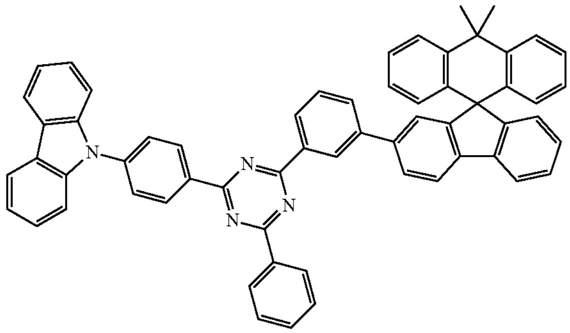
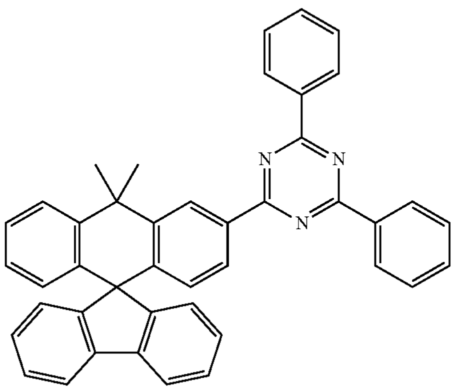
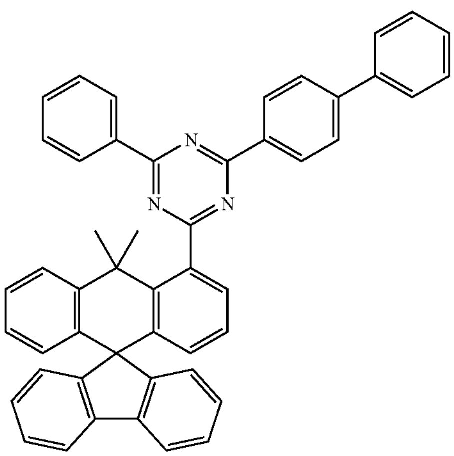
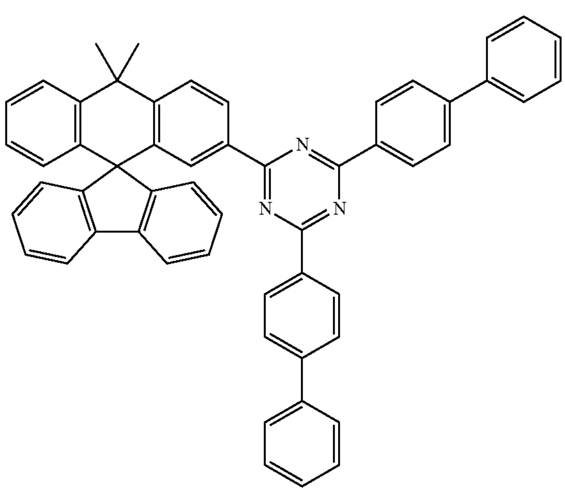
-continued
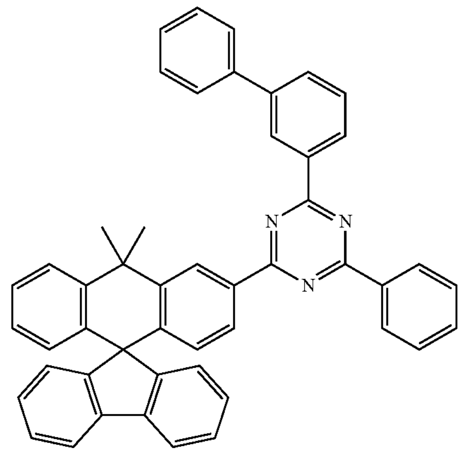
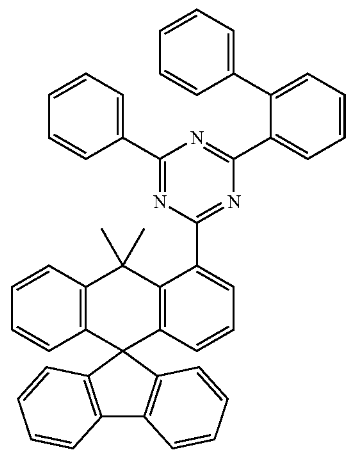
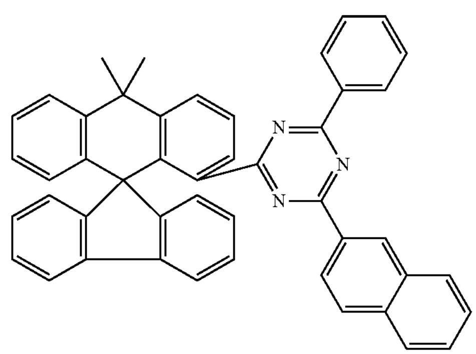
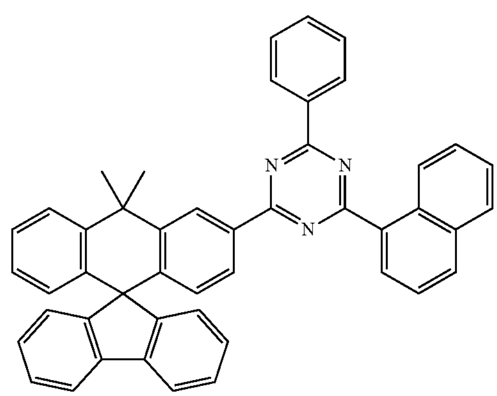

-continued
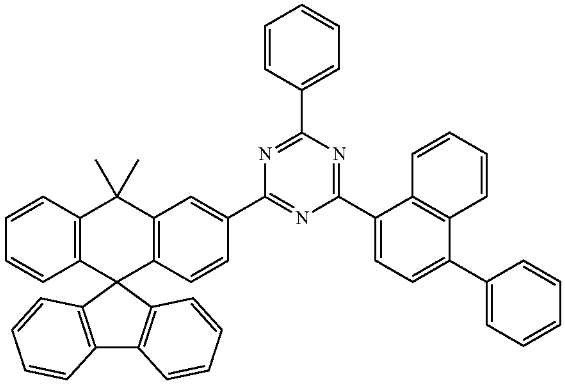
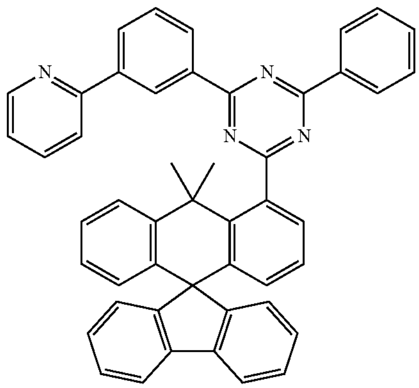
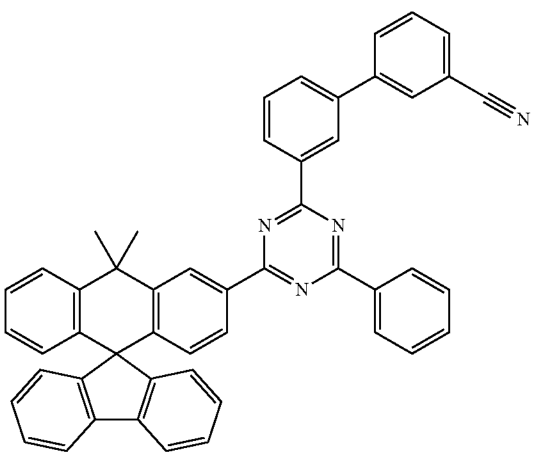
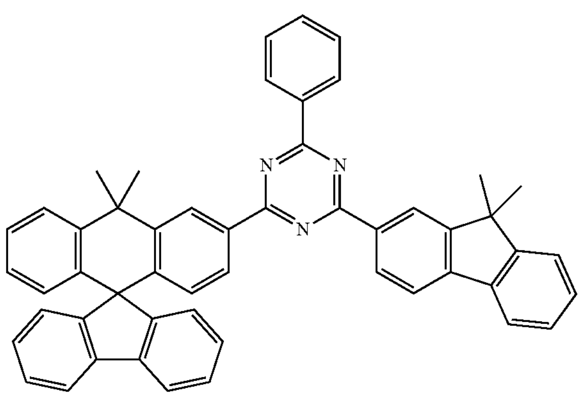
-continued
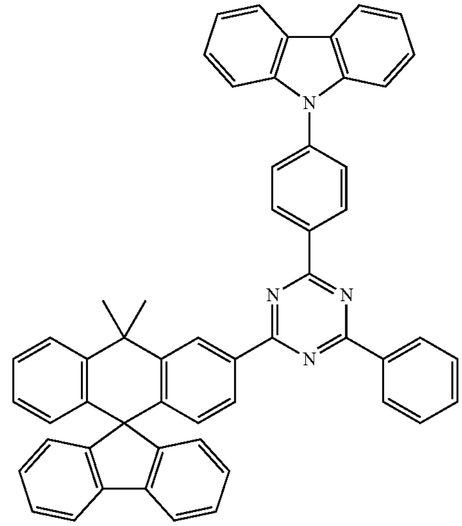
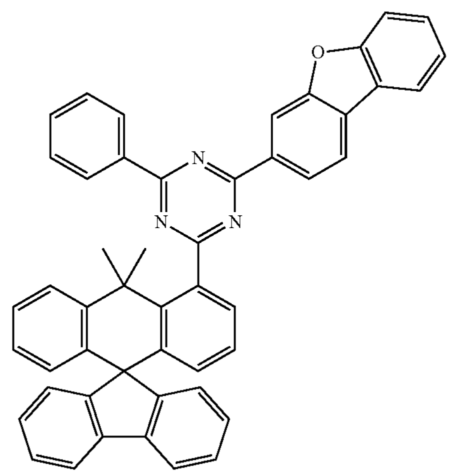
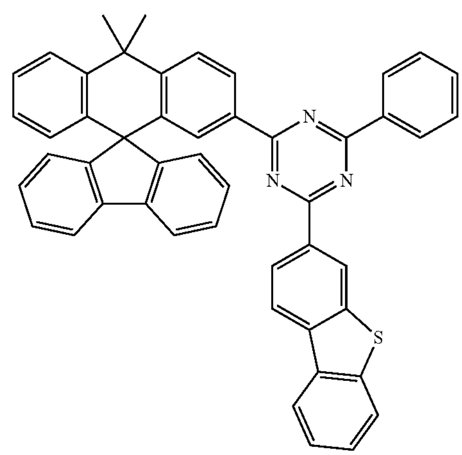

-continued
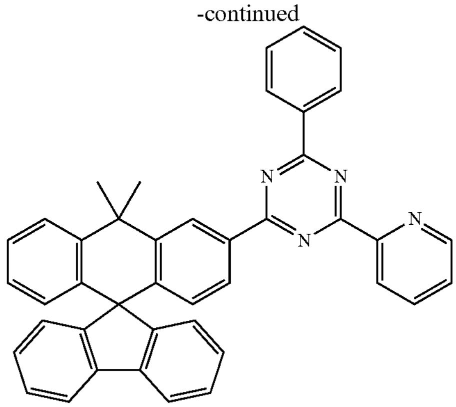
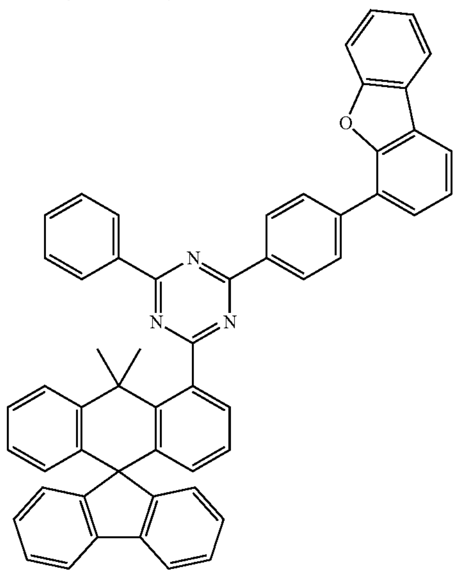
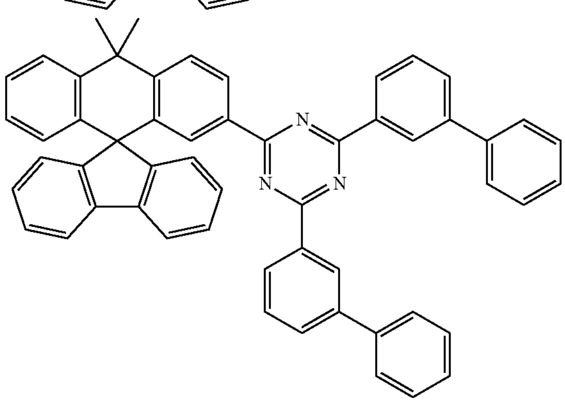
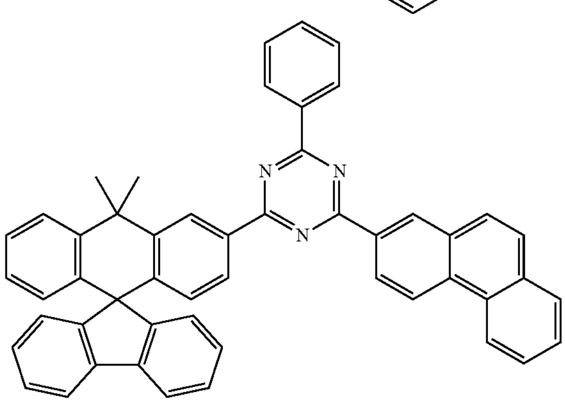
-continued
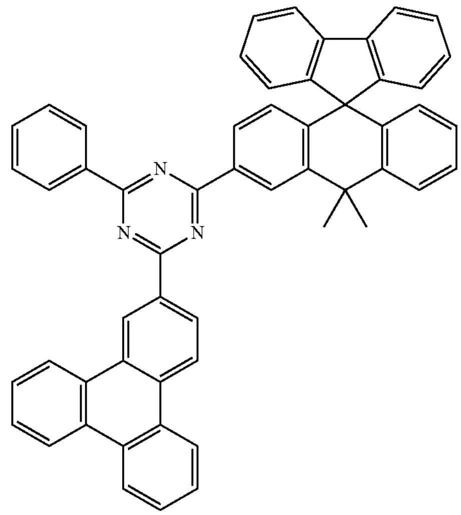
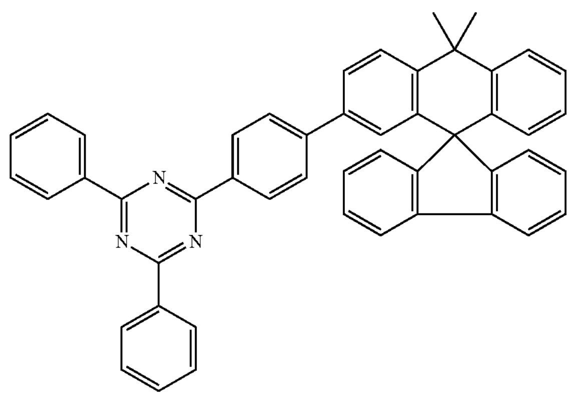
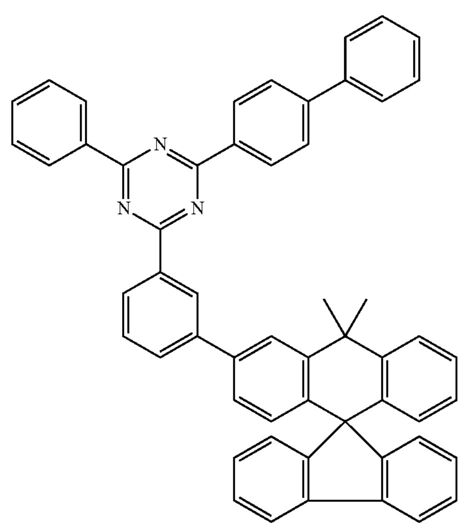

-continued
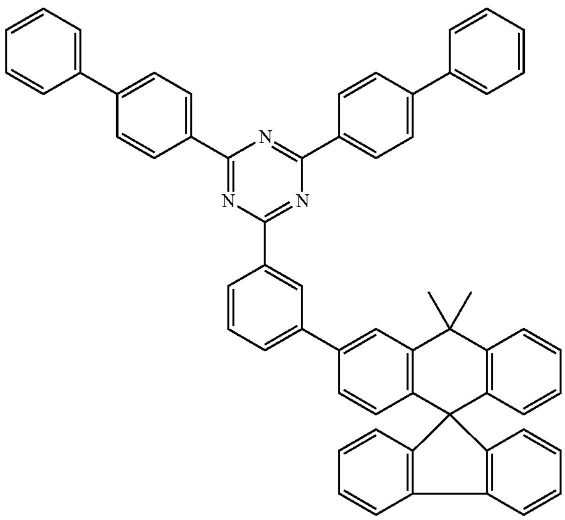
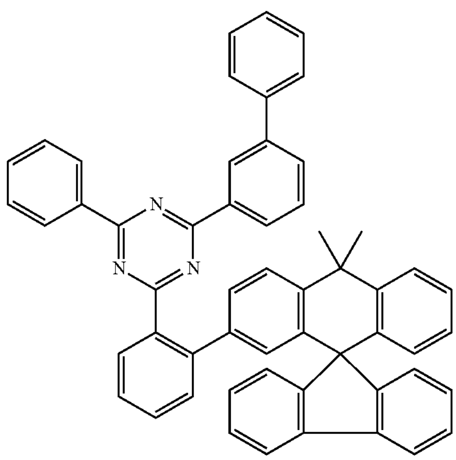
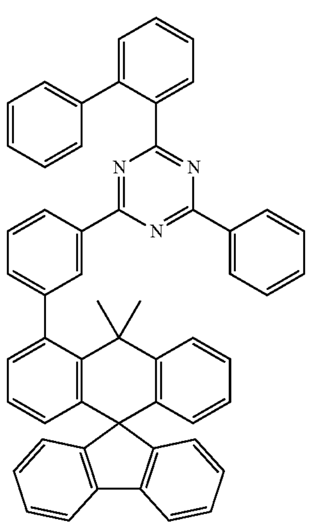
-continued
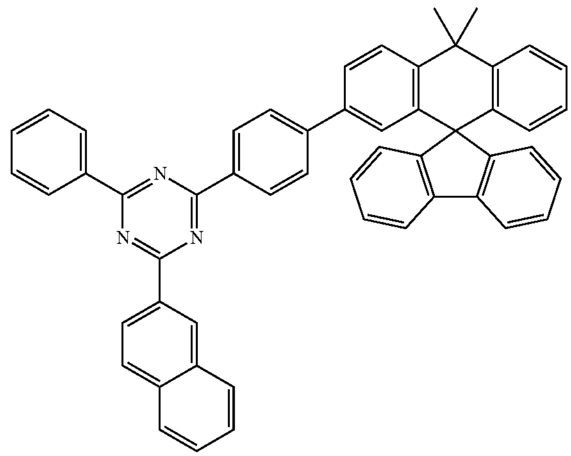
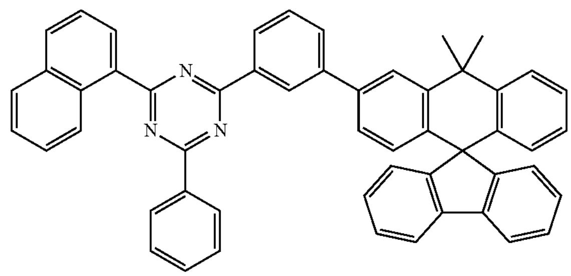
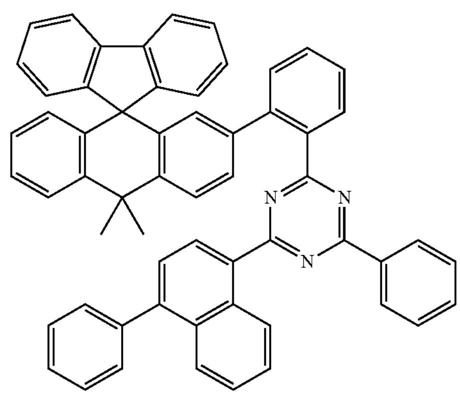
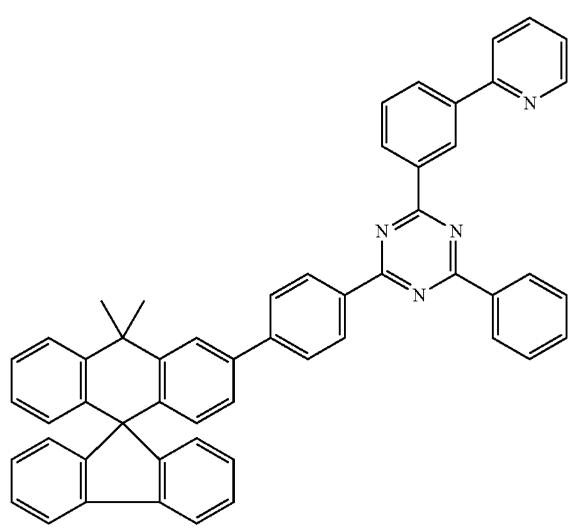

-continued
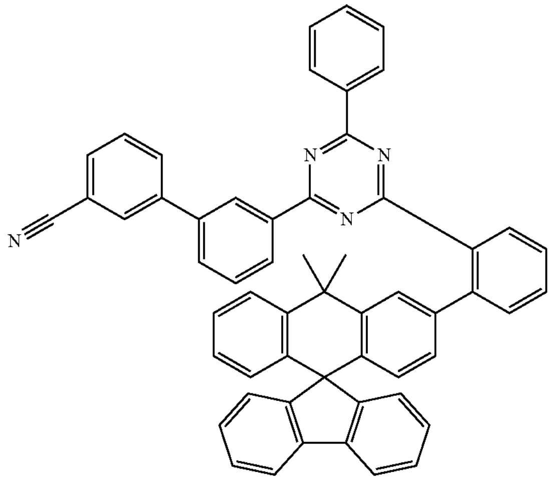
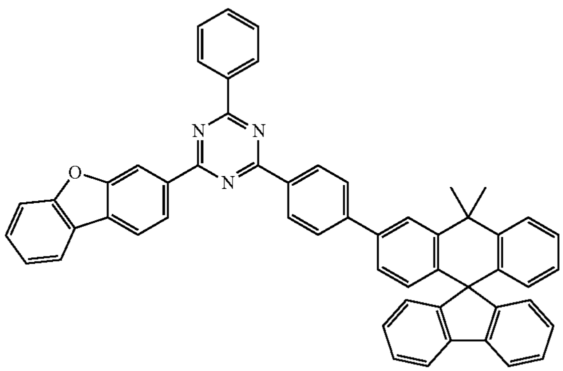
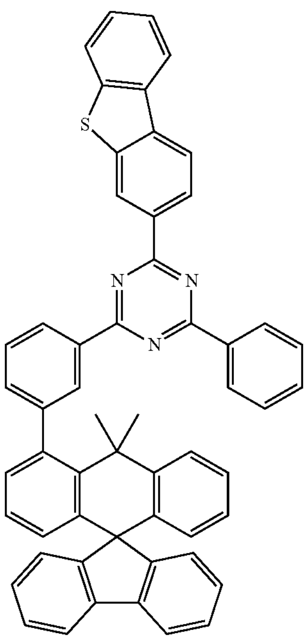
-continued
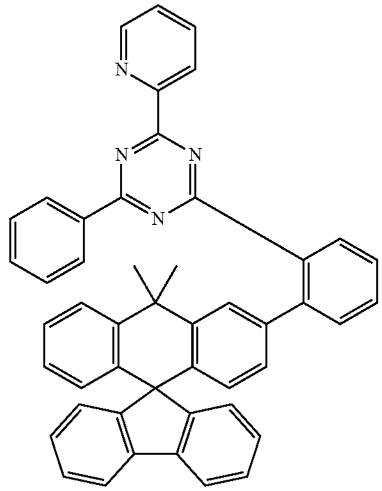
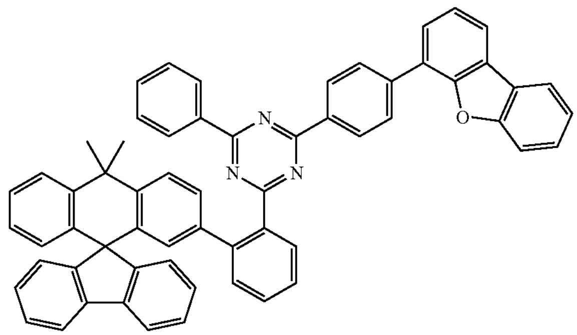
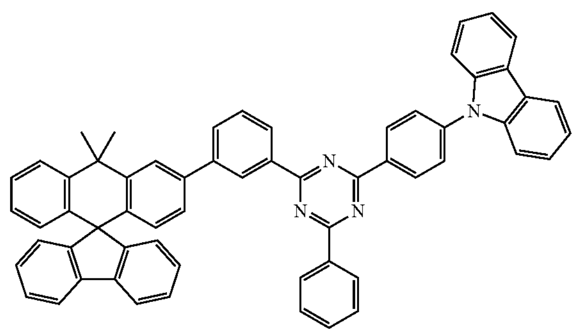
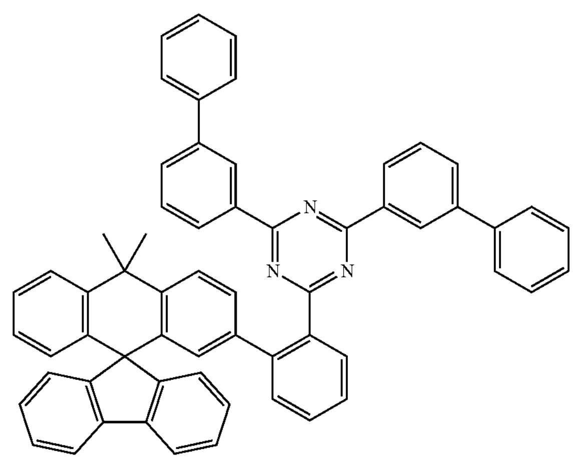

-continued
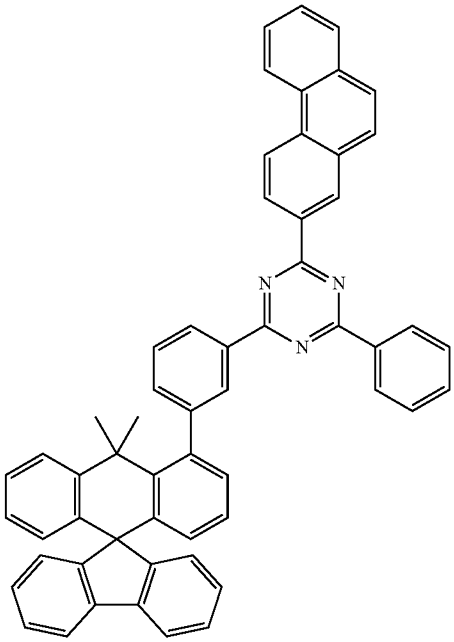
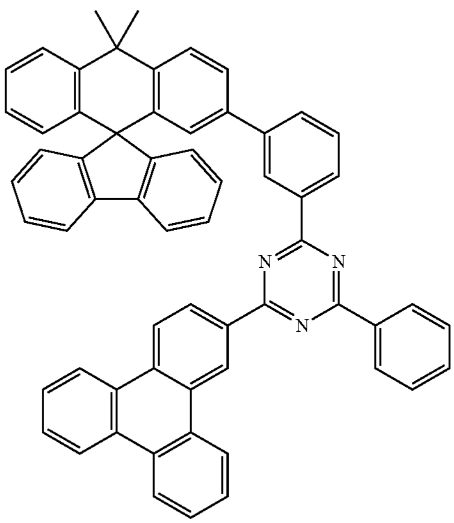
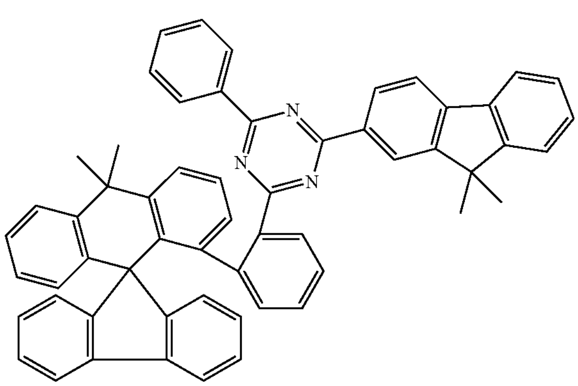
-continued
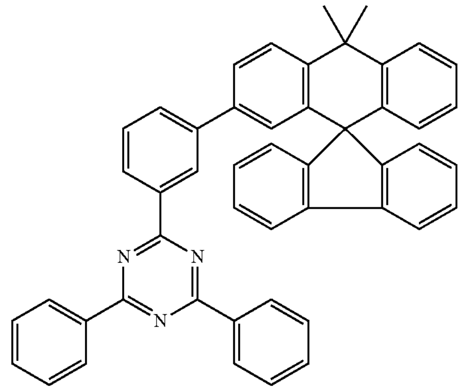
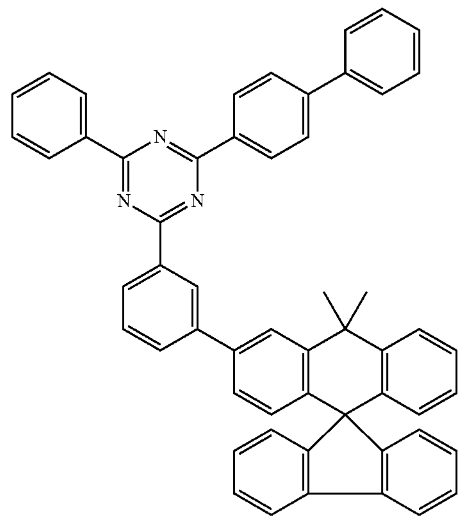
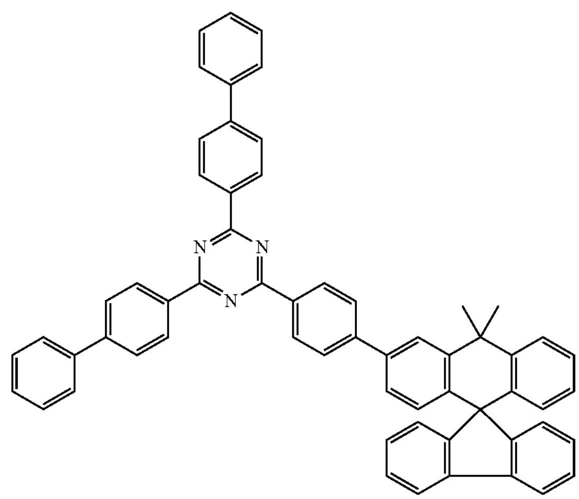

-continued
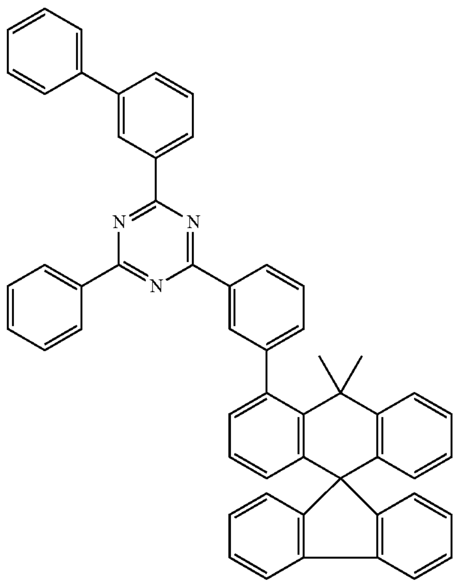
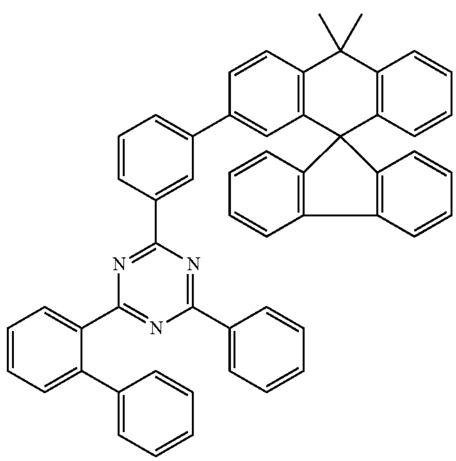
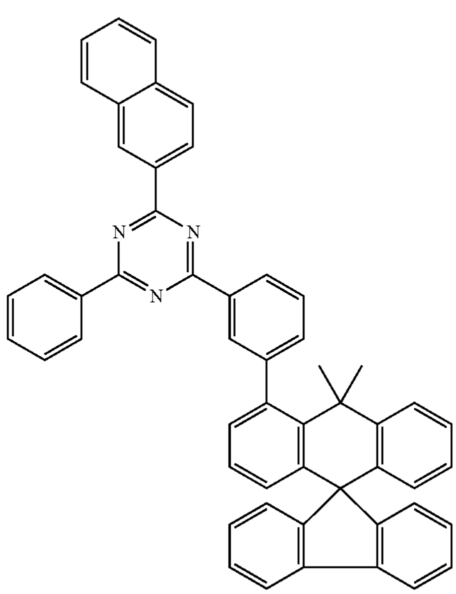
-continued
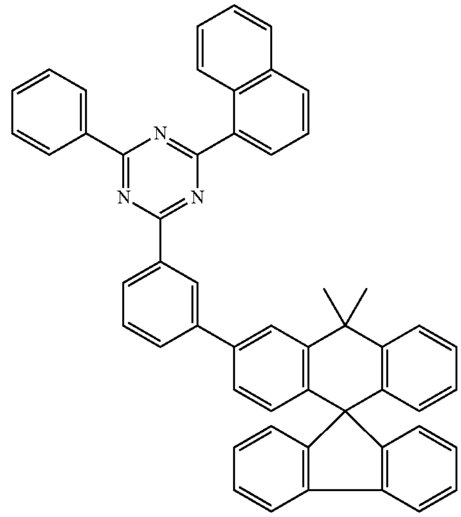
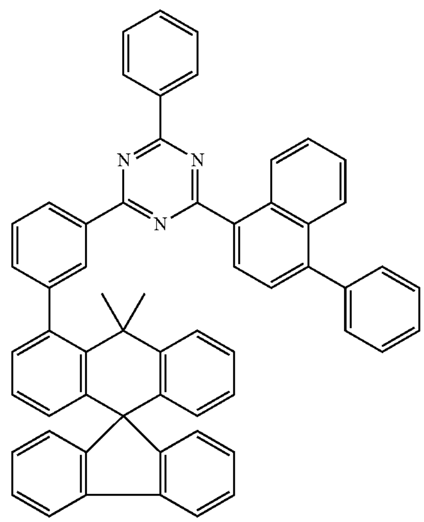
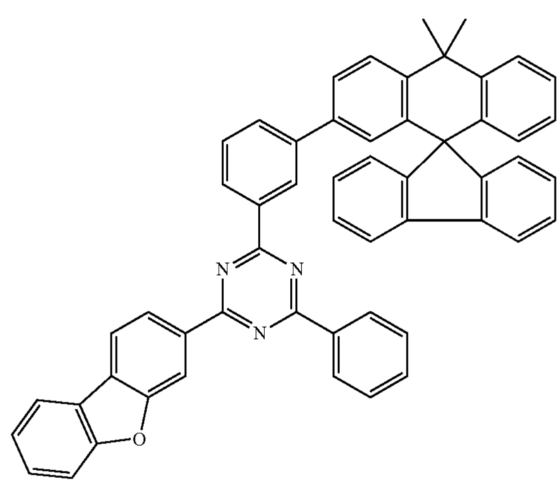

-continued
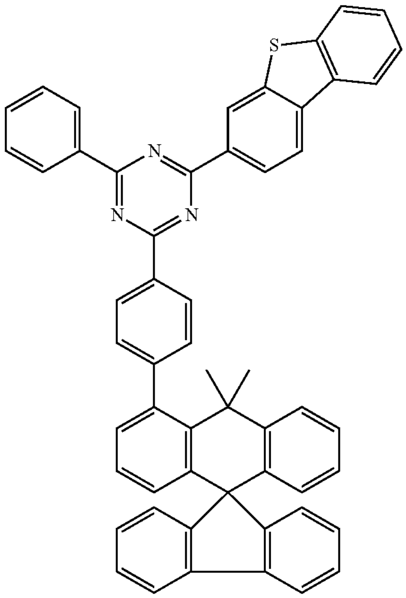
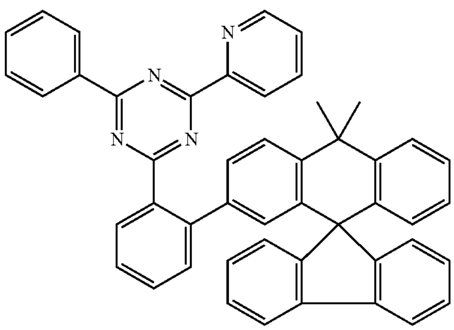
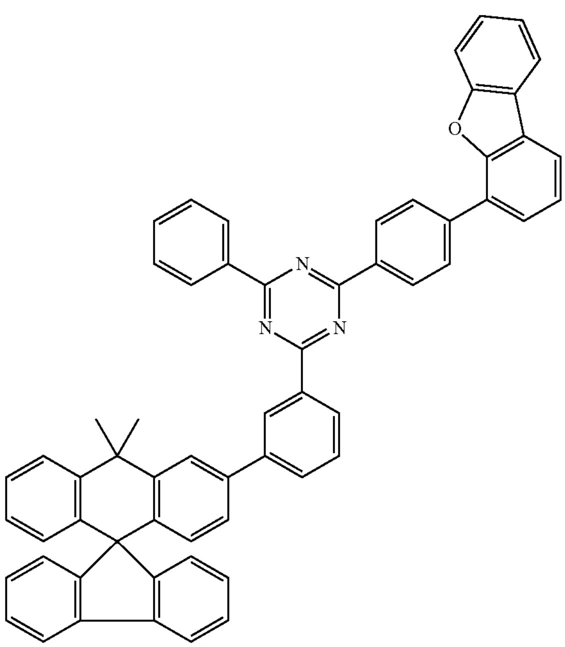
-continued
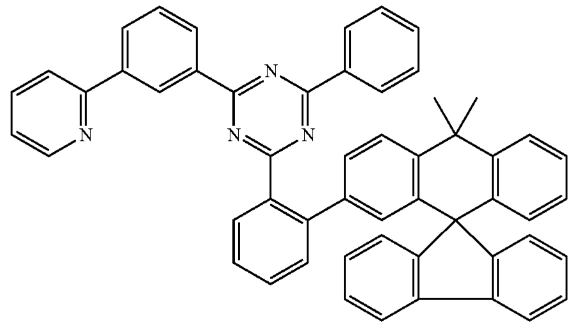
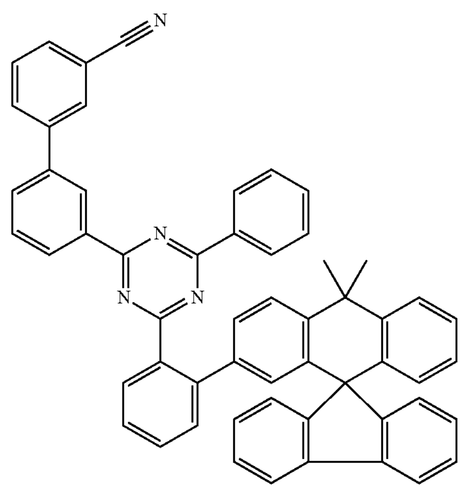
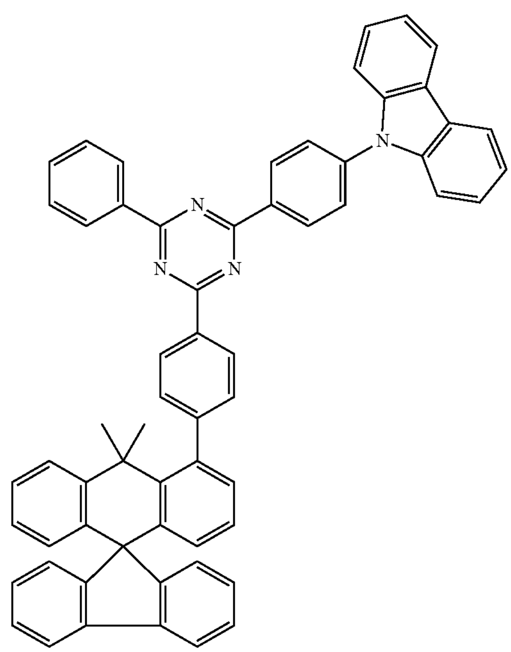

-continued
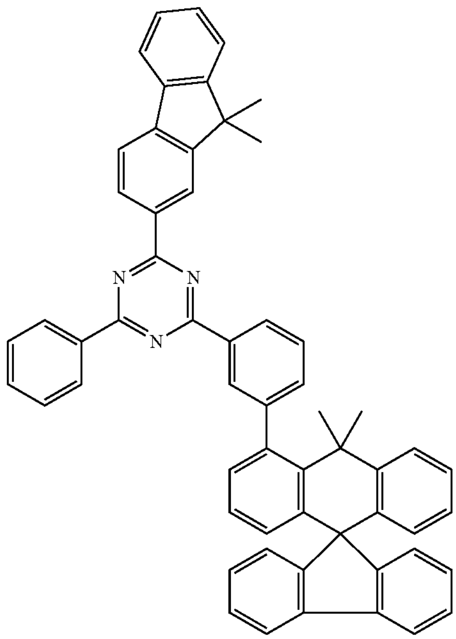
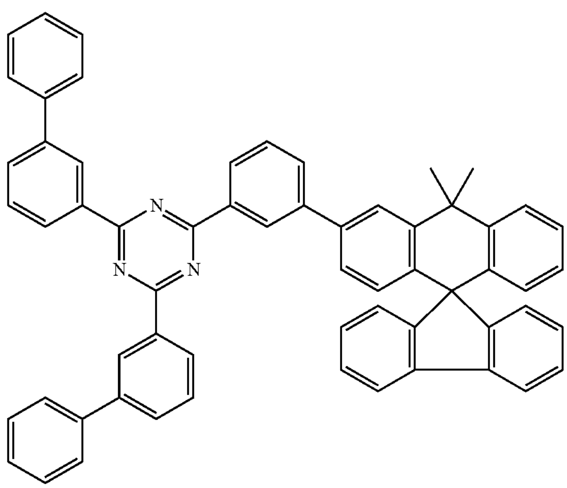
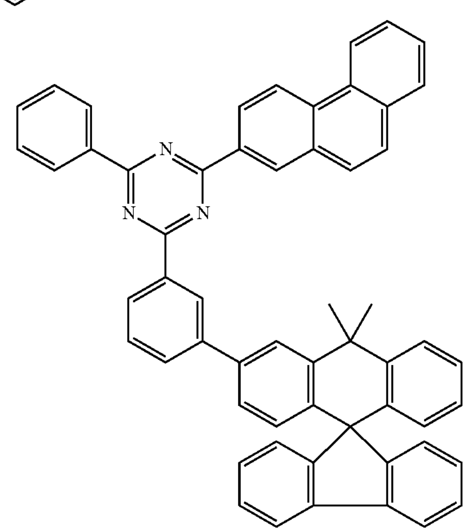
-continued
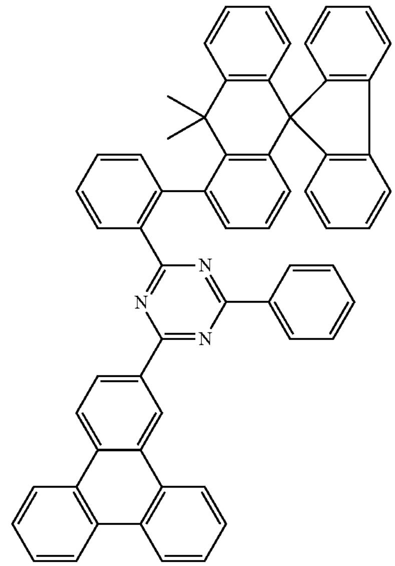
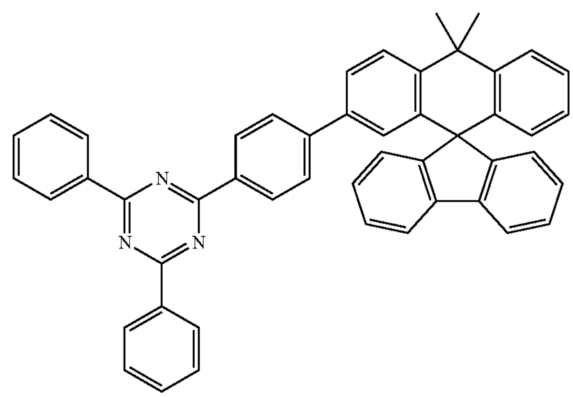
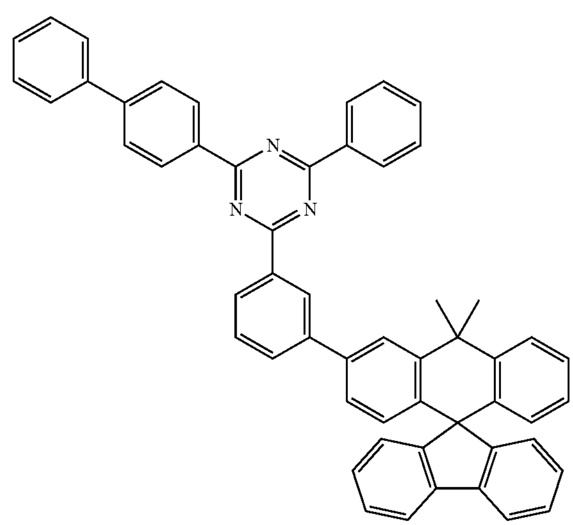

-continued
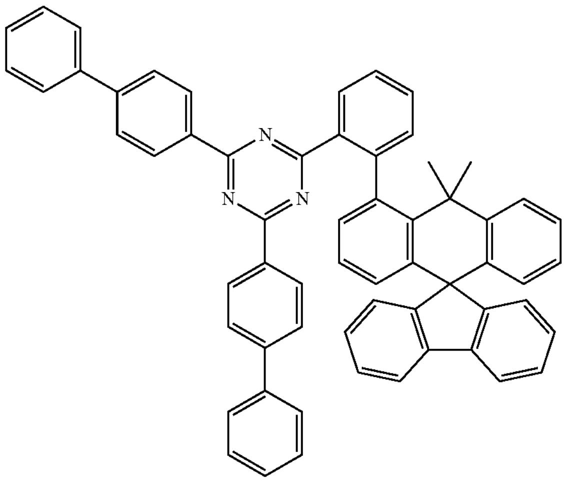
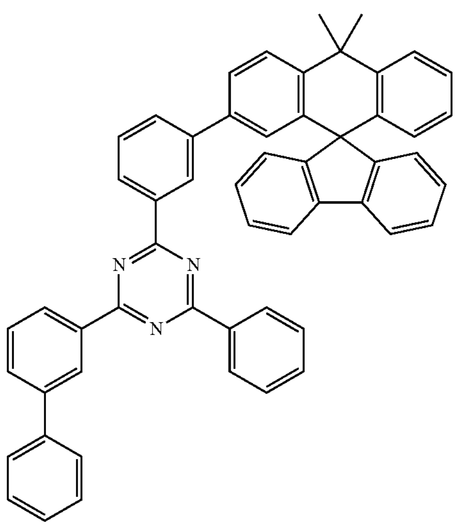
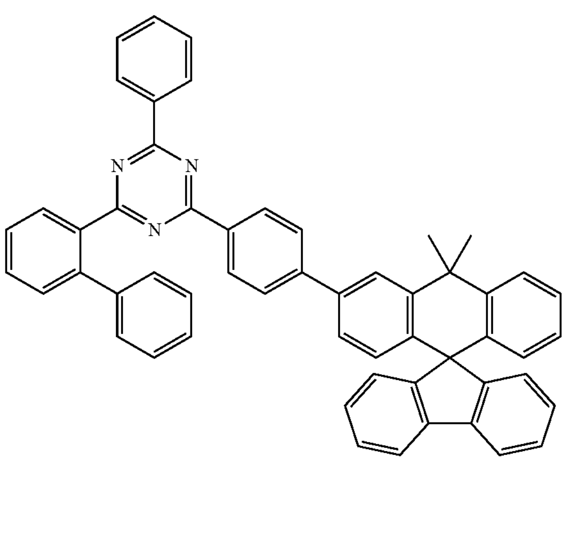
-continued
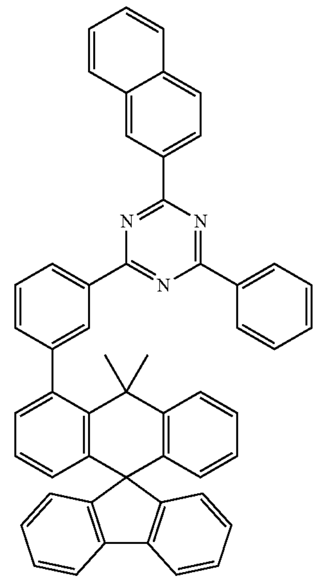
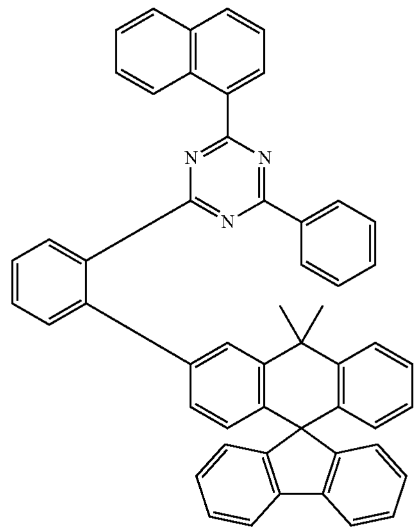
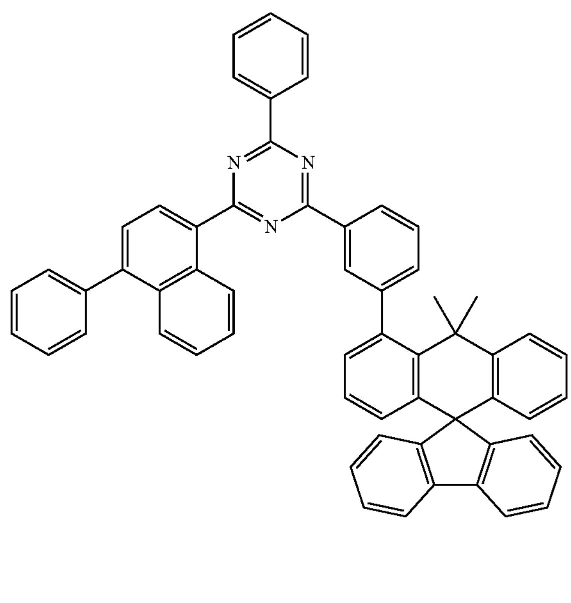

-continued
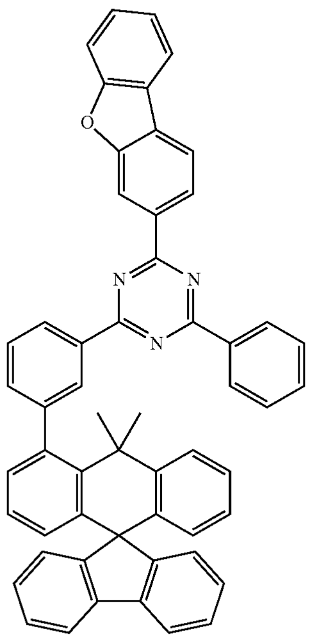
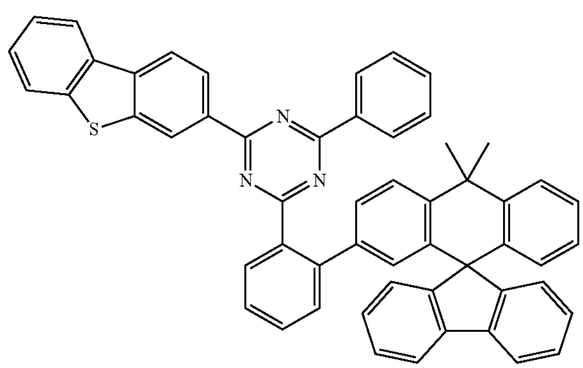
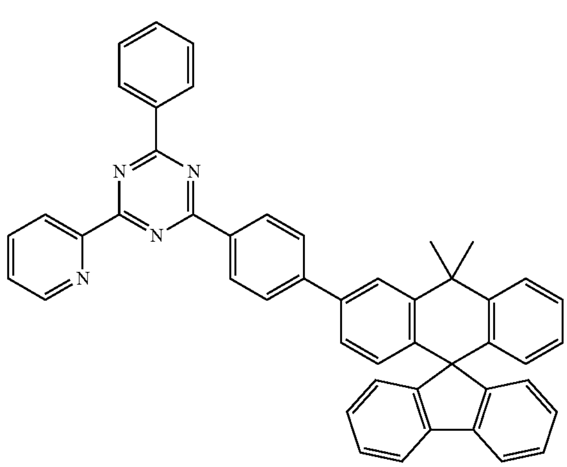
-continued
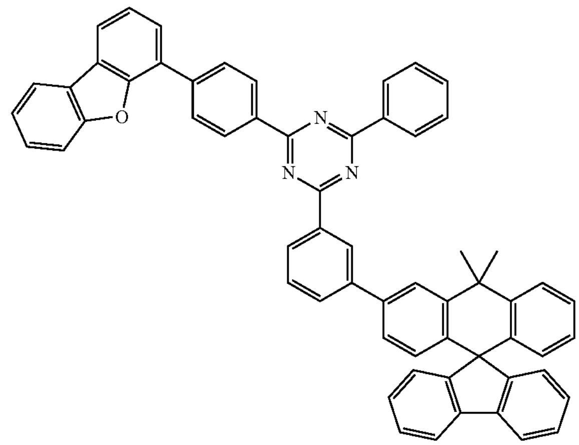
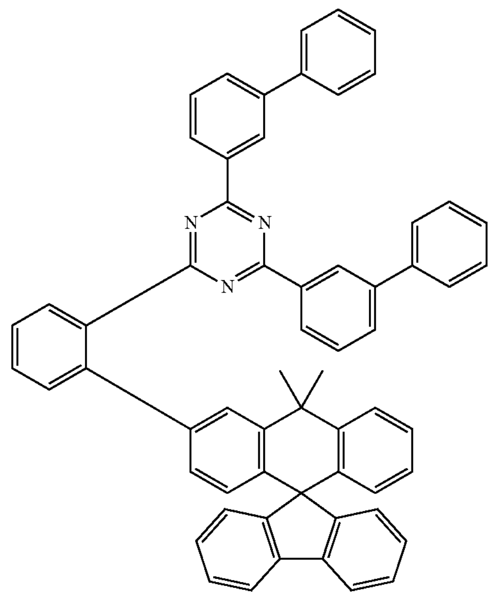
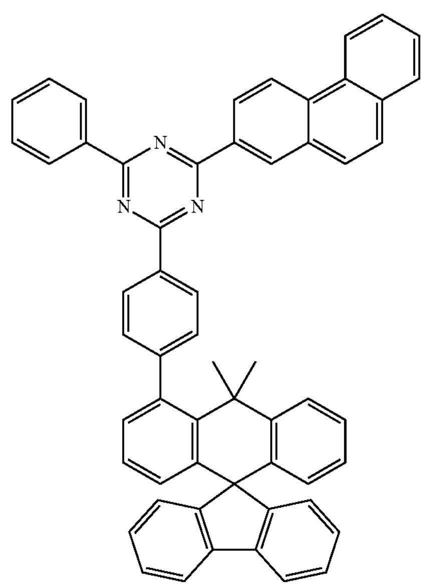

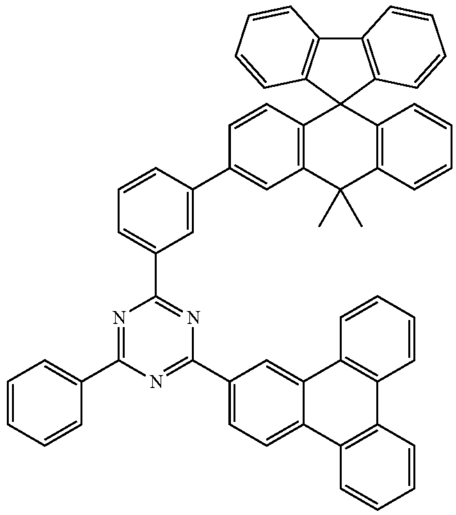
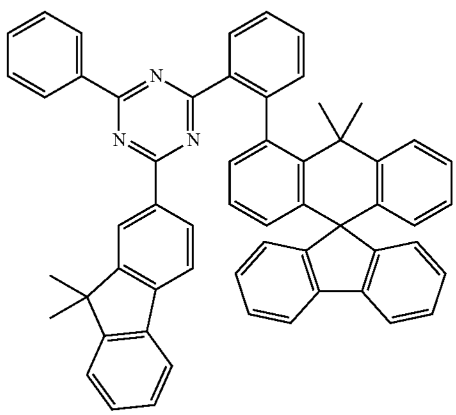
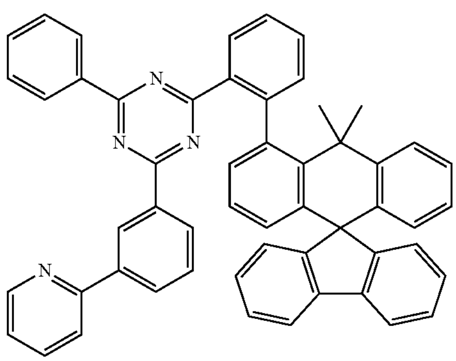
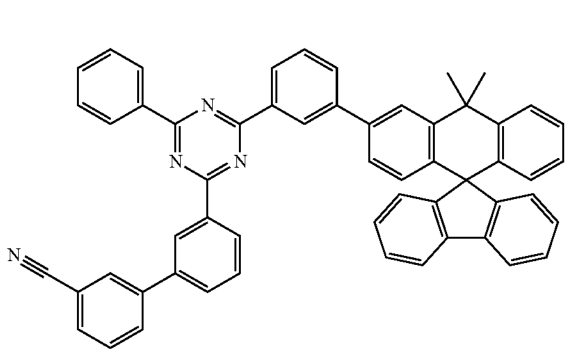
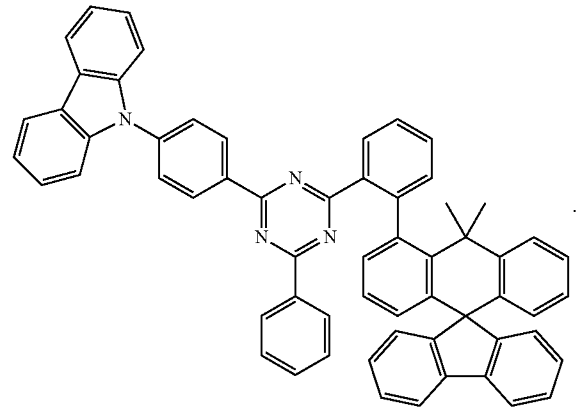
Further, according to an exemplary embodiment of the present specification, the spiro compound can be any one compound selected from the following compounds:
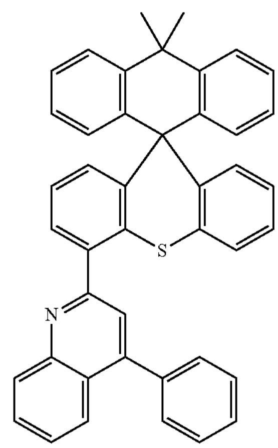
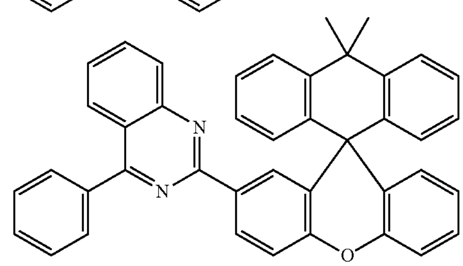
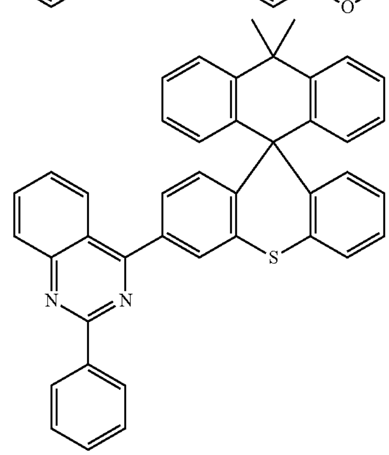

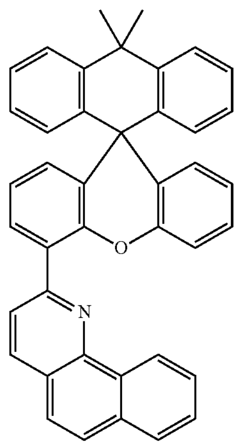
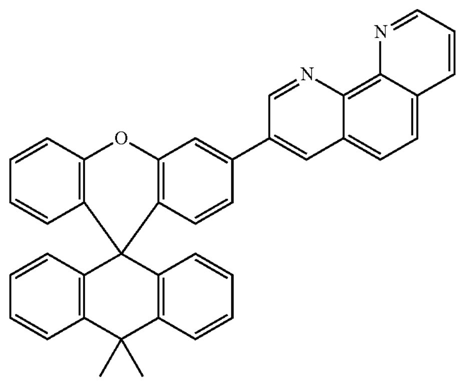
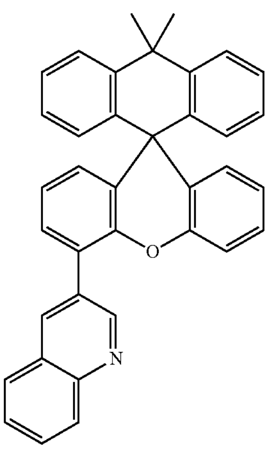
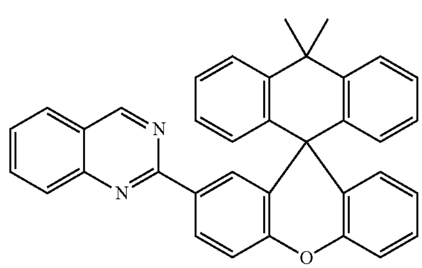
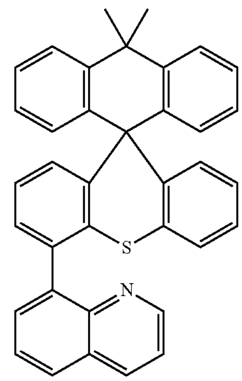
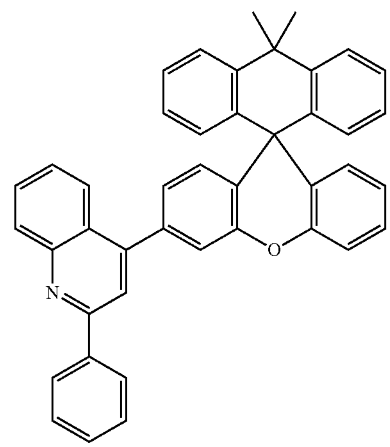
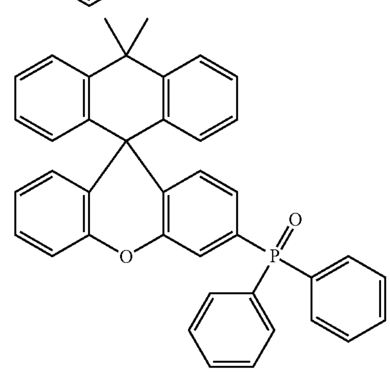
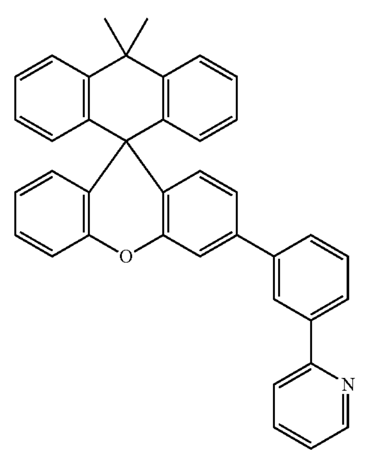

-continued
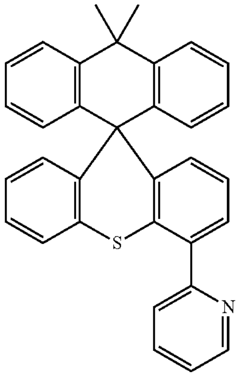
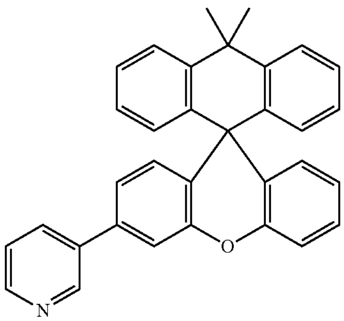
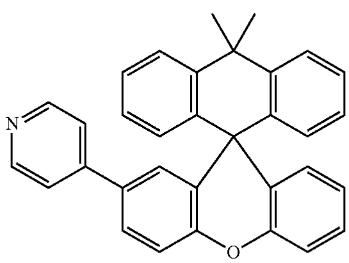
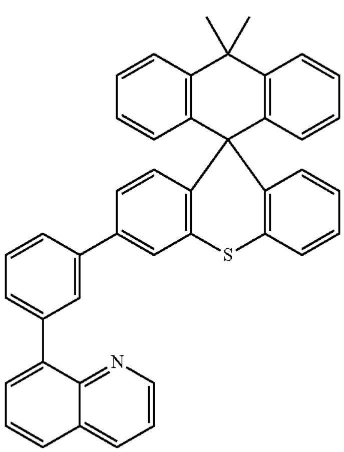
-continued
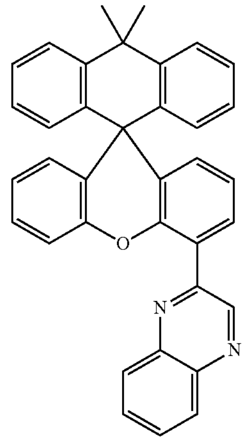
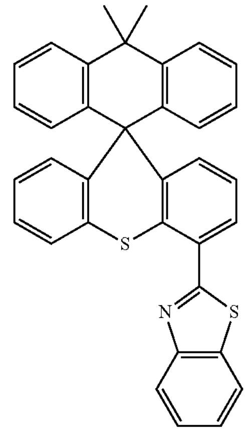
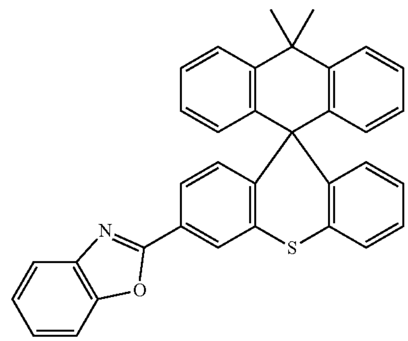
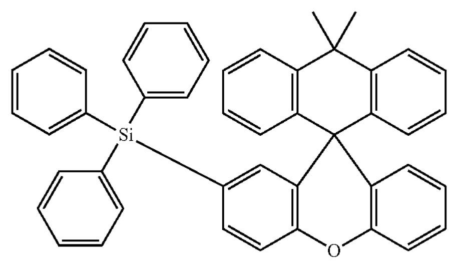
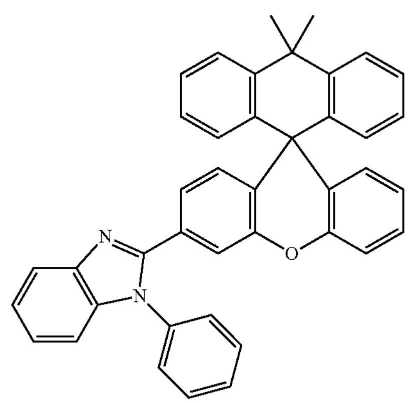

-continued
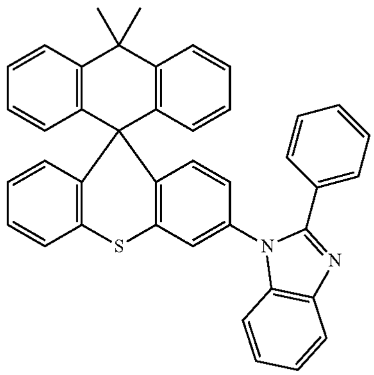
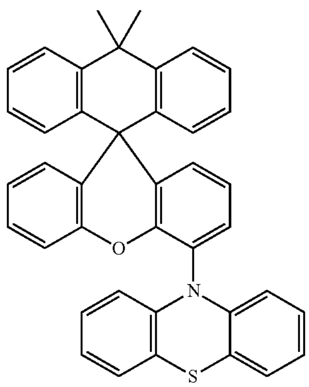
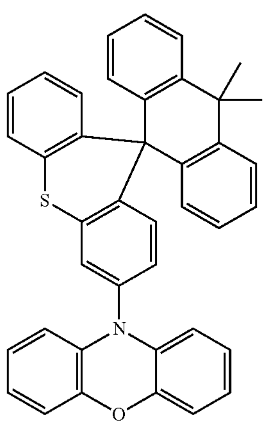
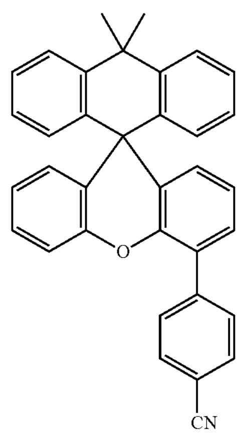
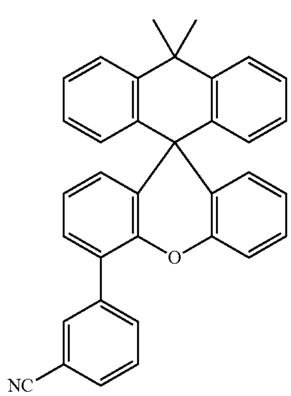
-continued
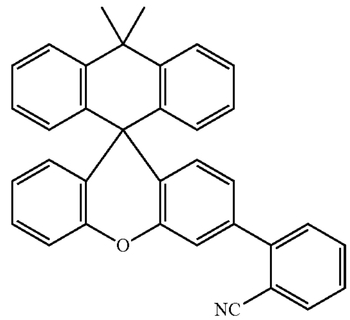
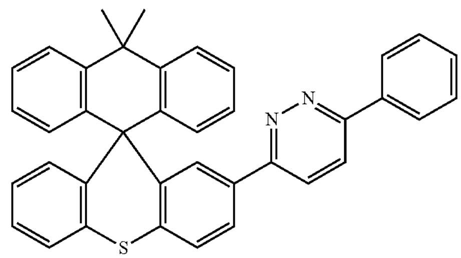
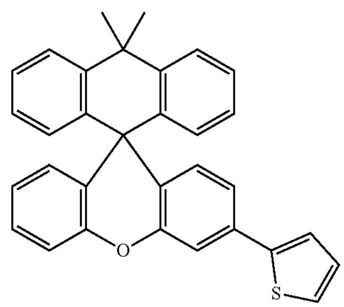
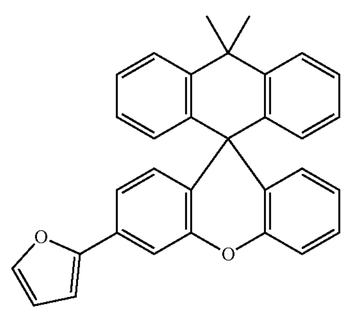
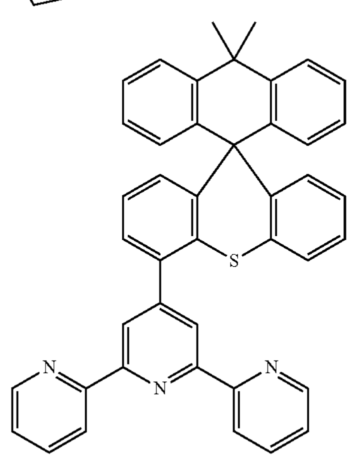

-continued
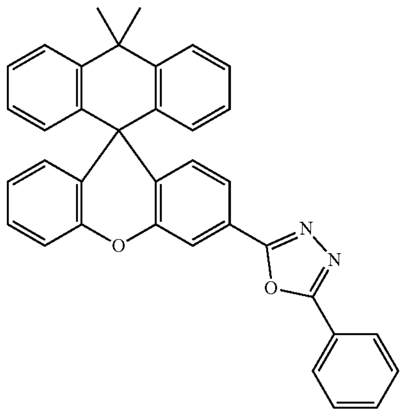
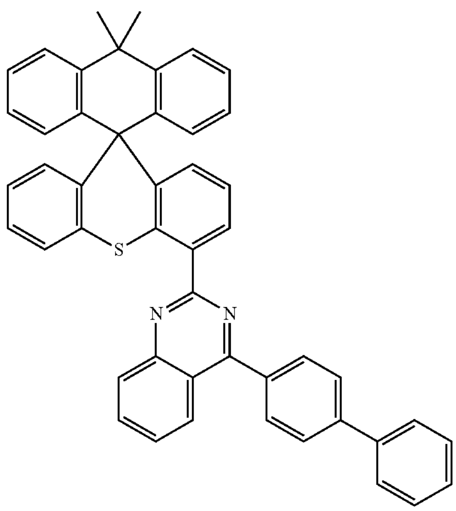
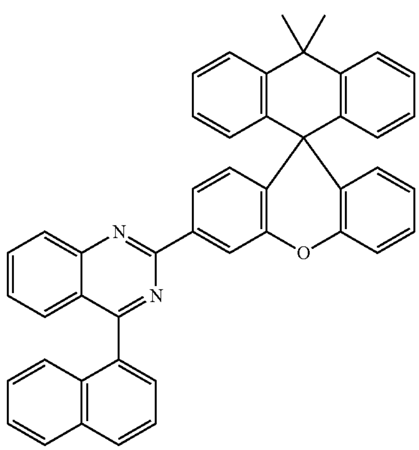
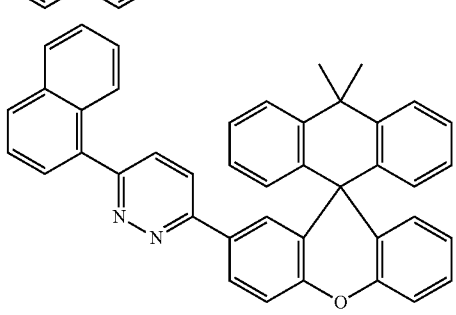
-continued
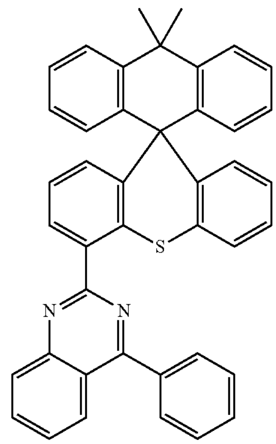
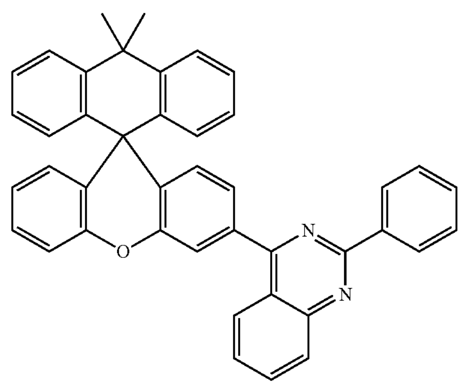
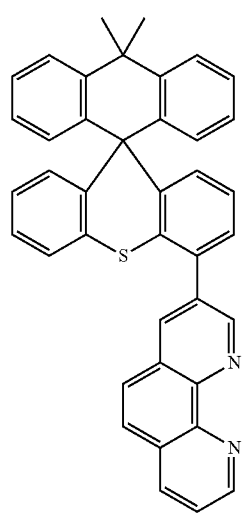

-continued
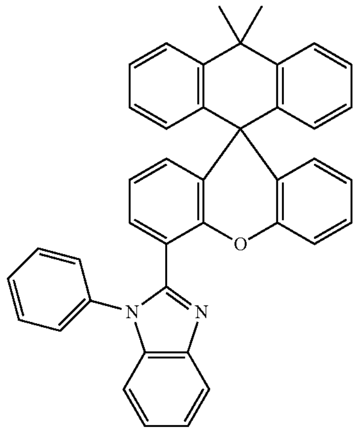
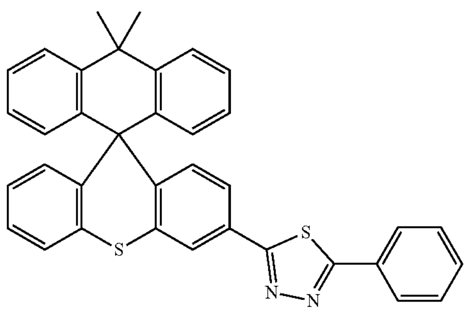
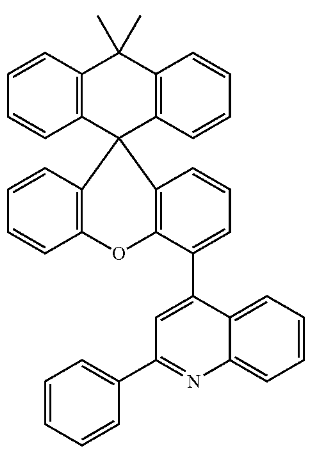
-continued
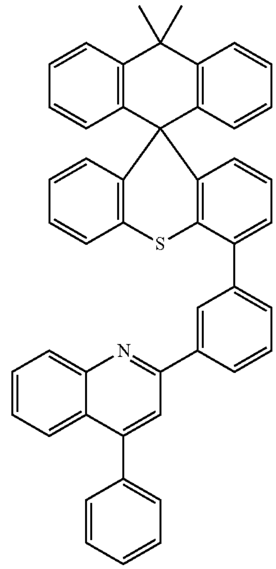
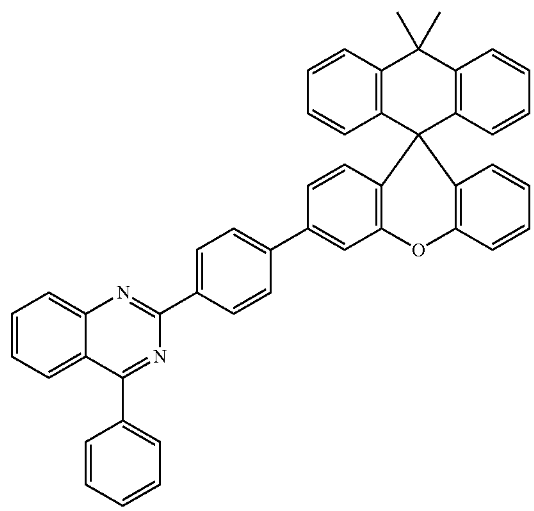
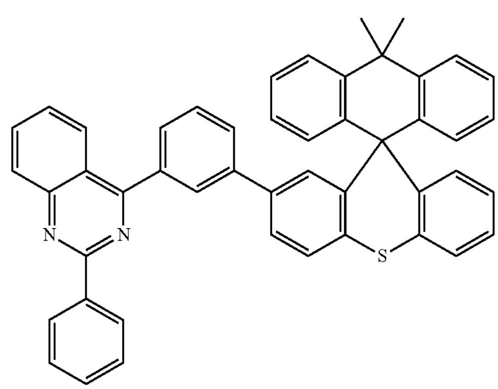

-continued
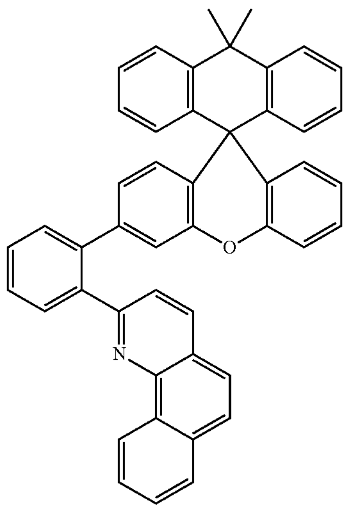
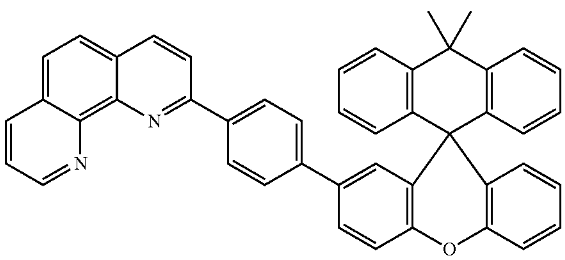
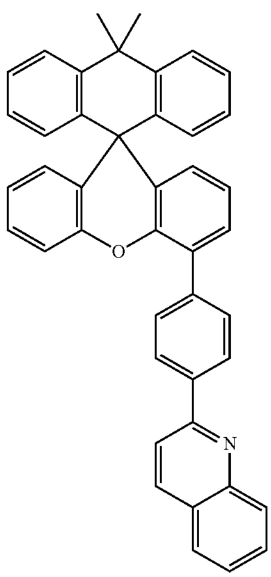
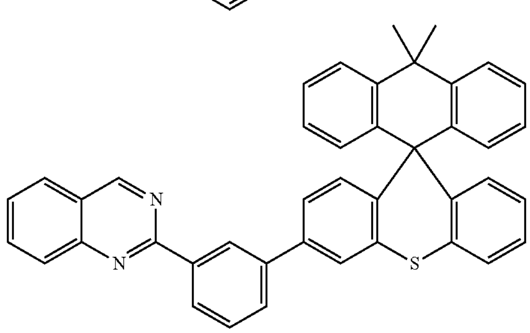
-continued
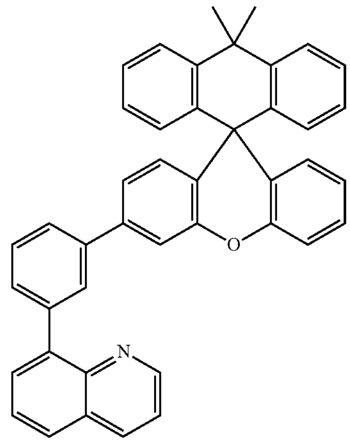
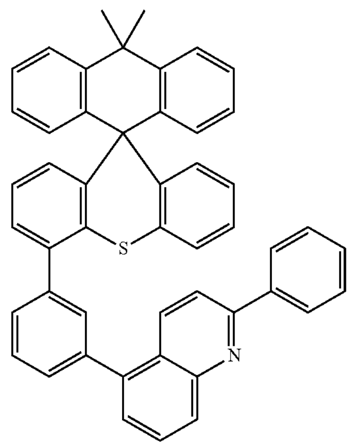
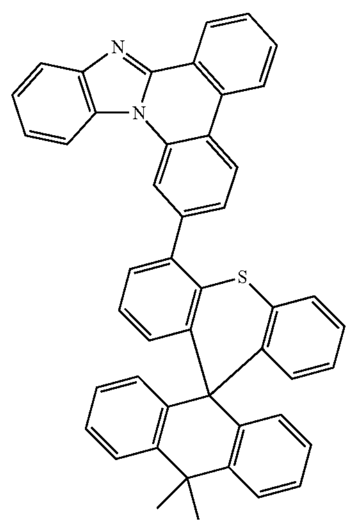
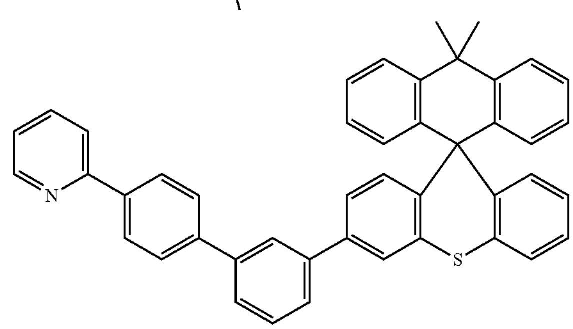

-continued
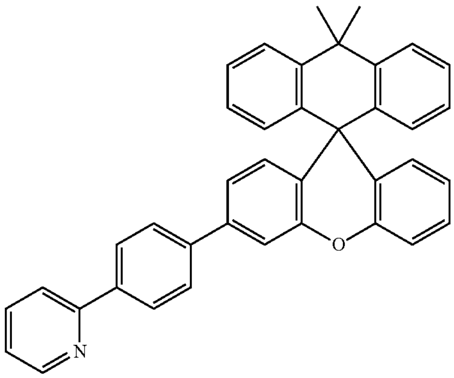
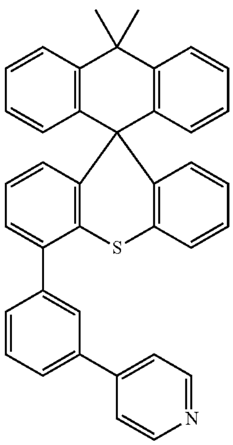
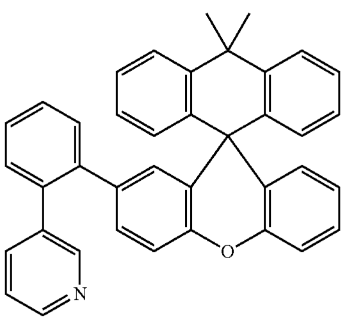
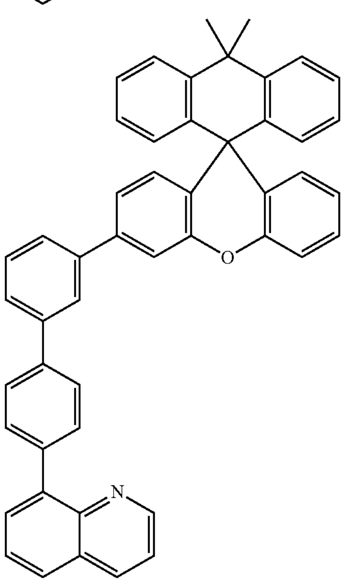
-continued
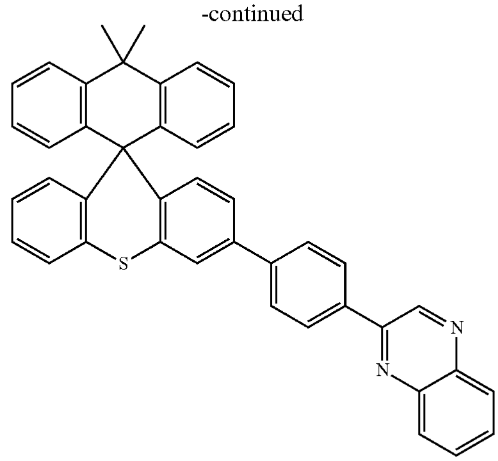
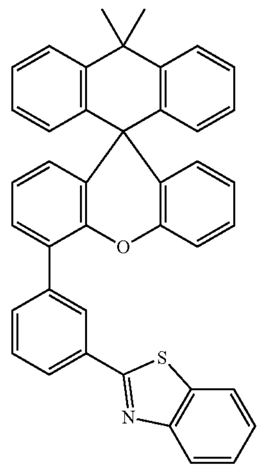
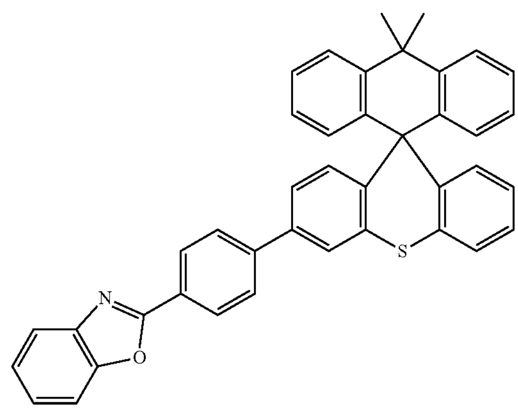
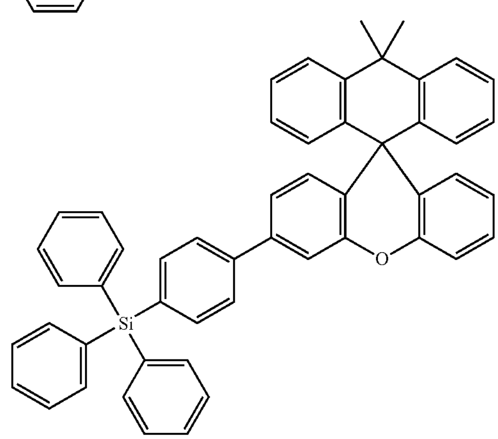

-continued
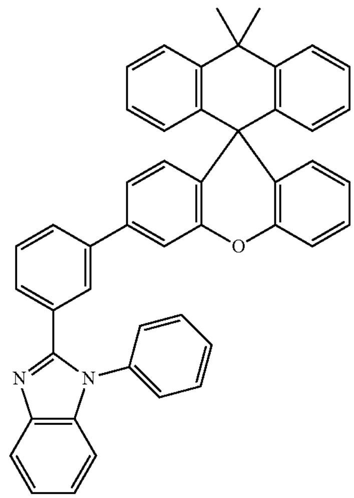
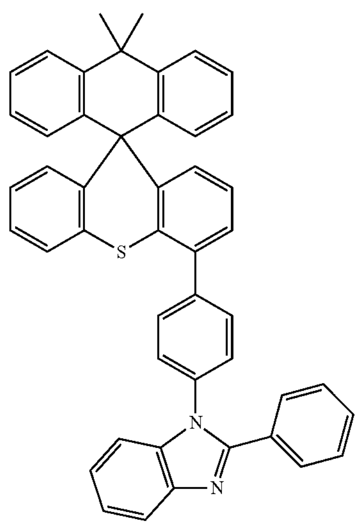
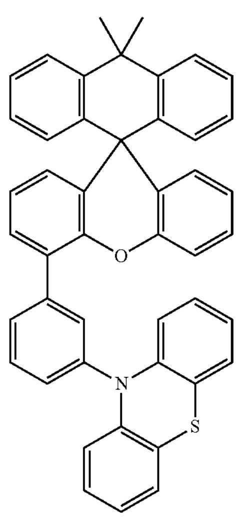
-continued
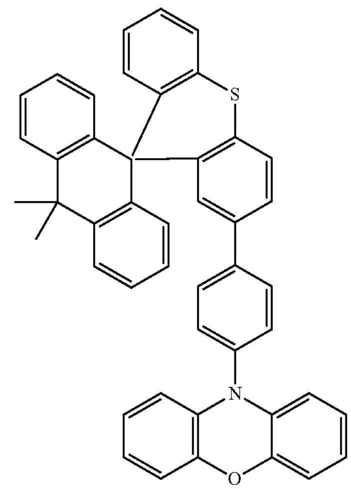
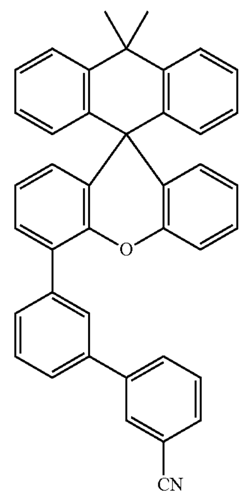
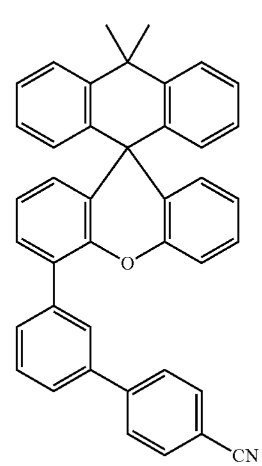
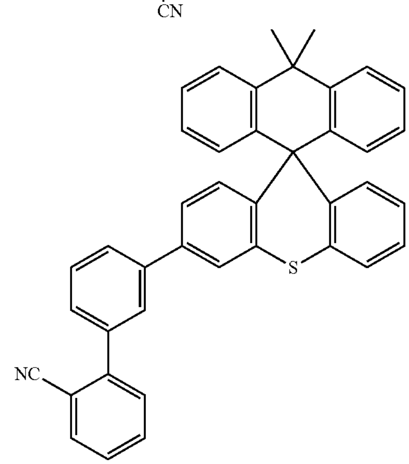
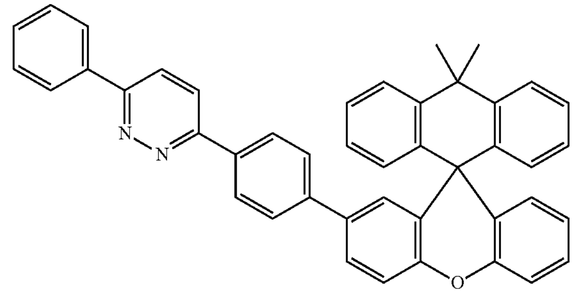

-continued
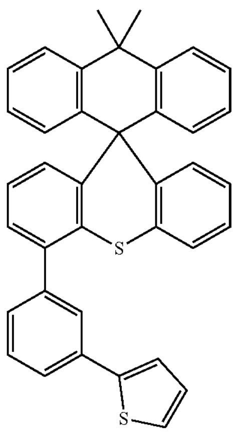
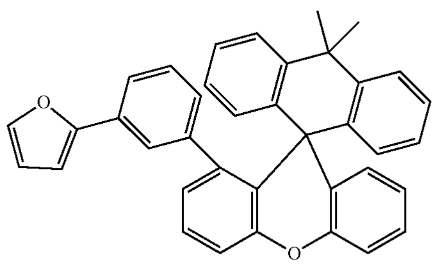
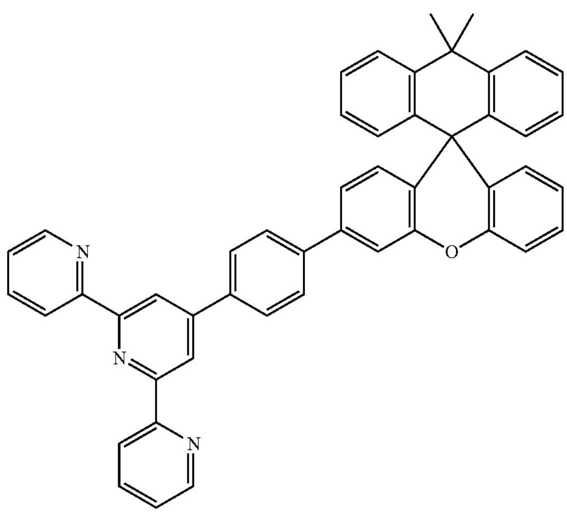
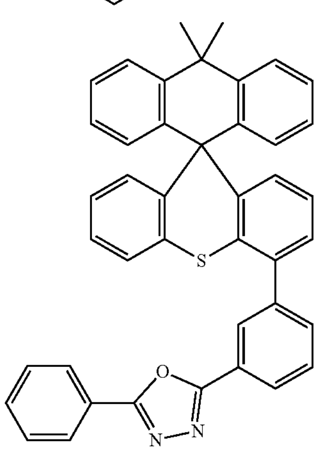
-continued
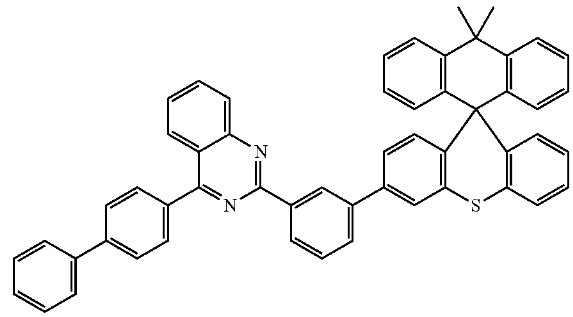
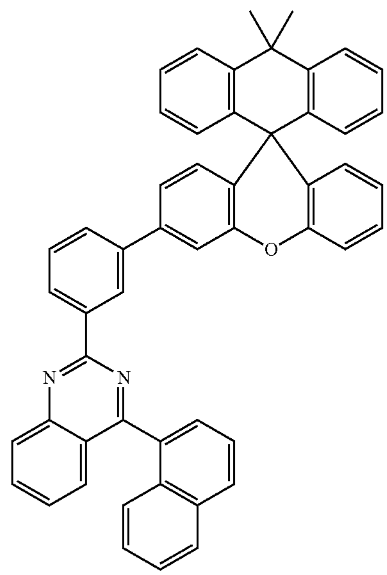
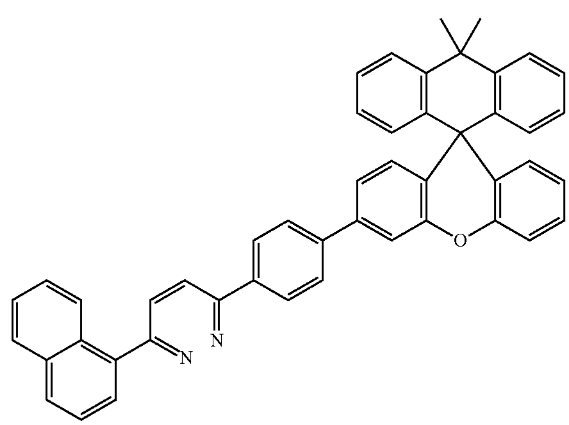

-continued
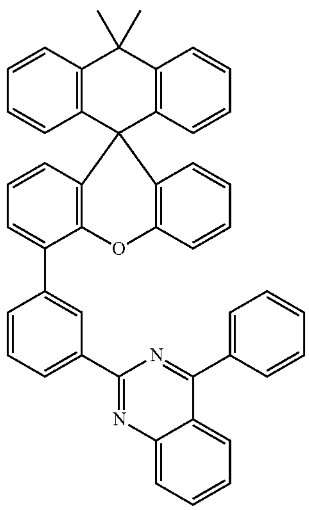
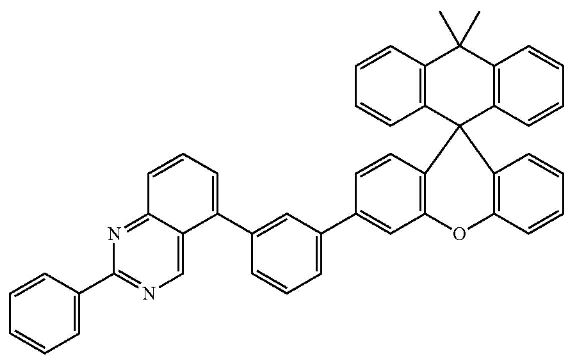
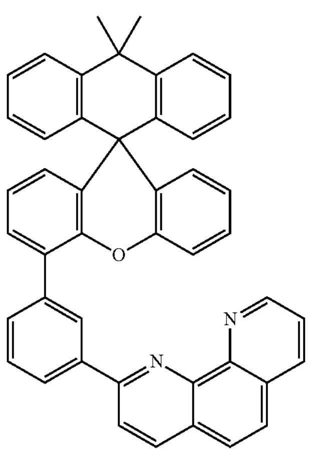
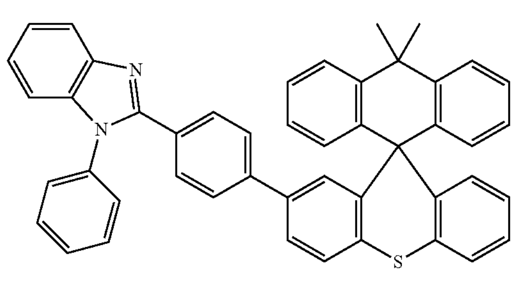
-continued
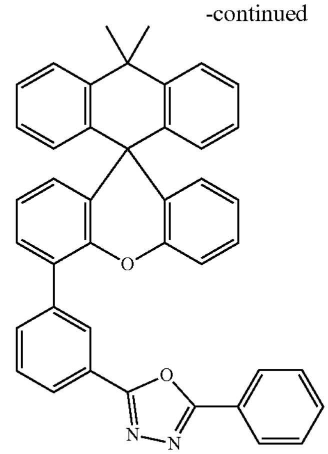
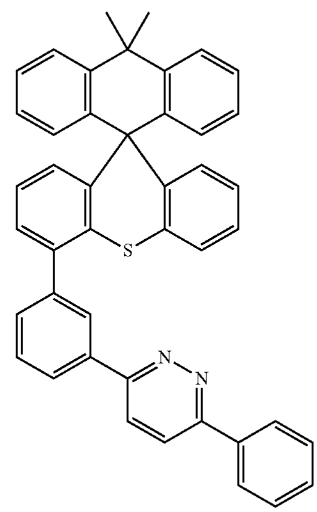
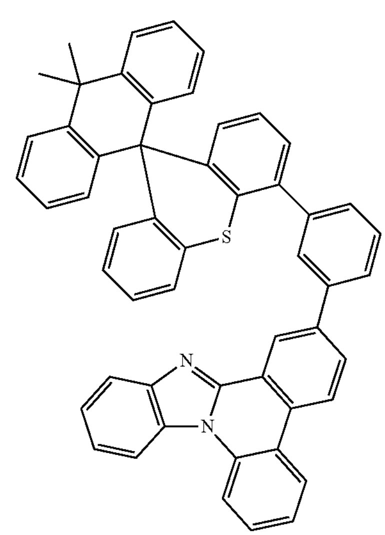

-continued
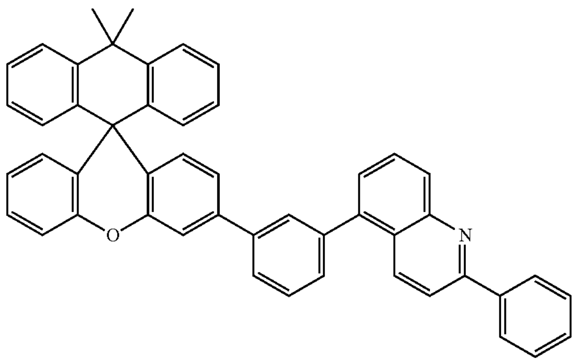
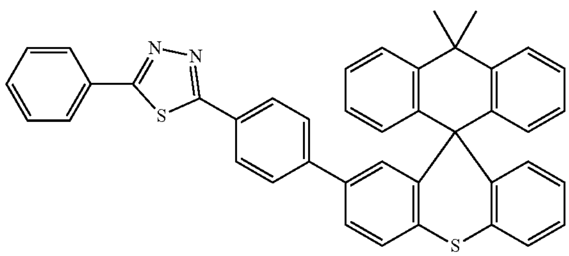
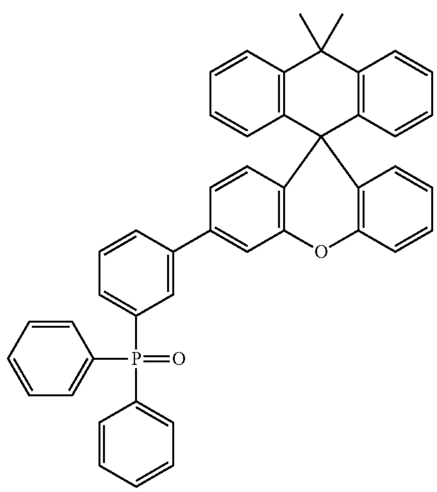
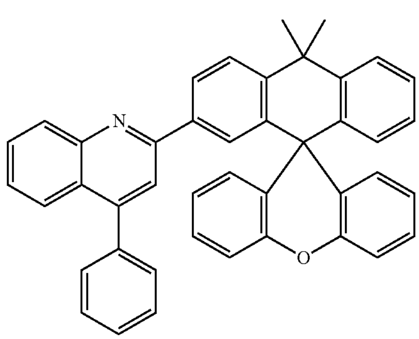
-continued
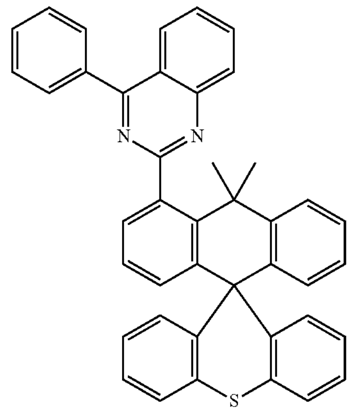
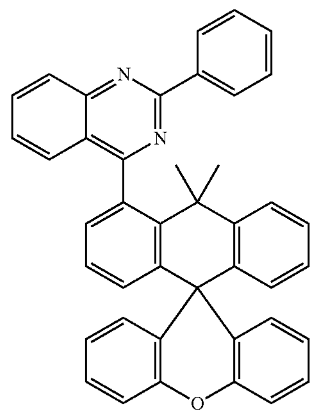
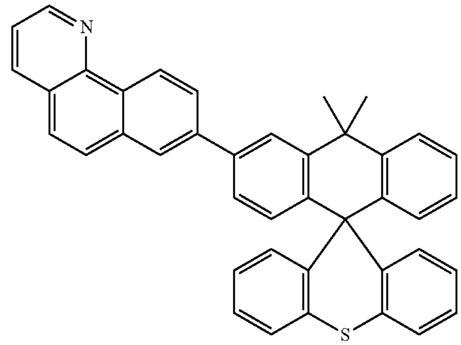
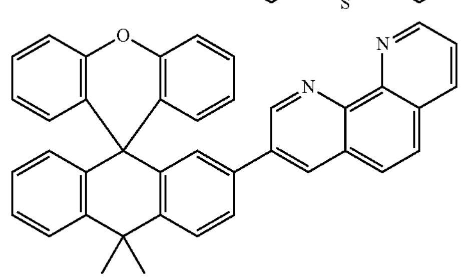
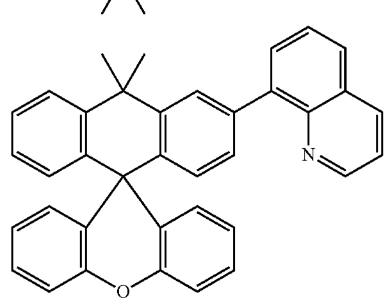

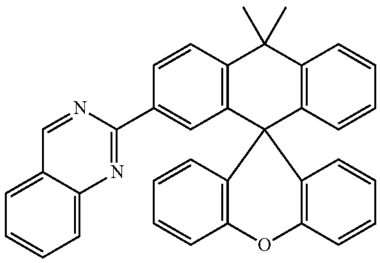
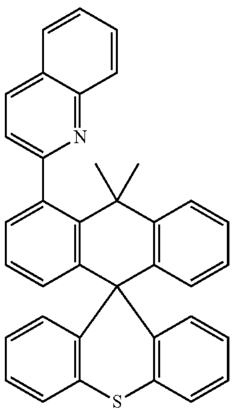
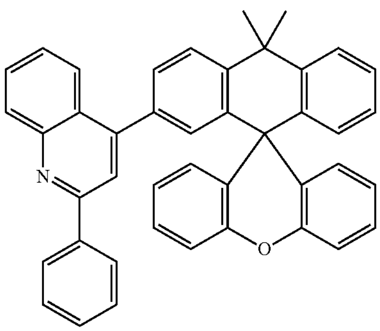
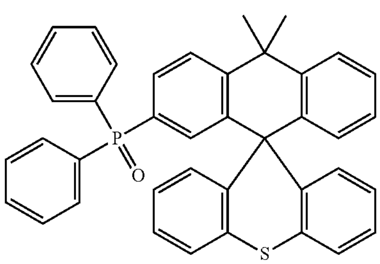
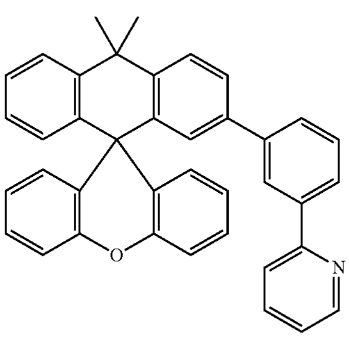
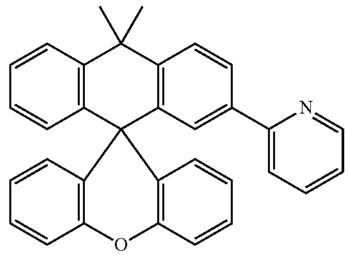
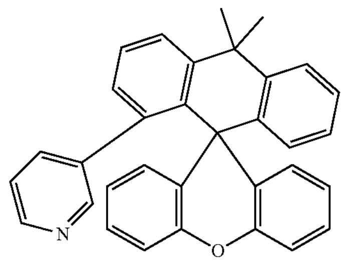
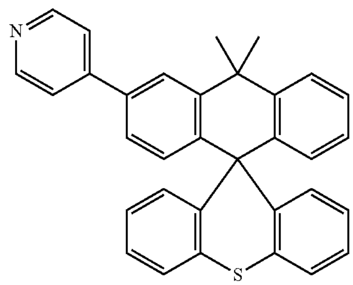
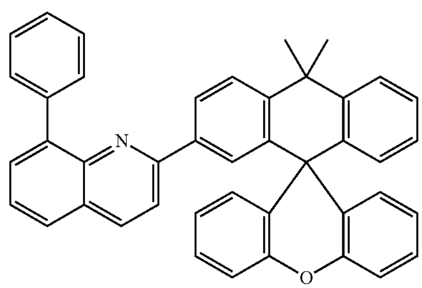
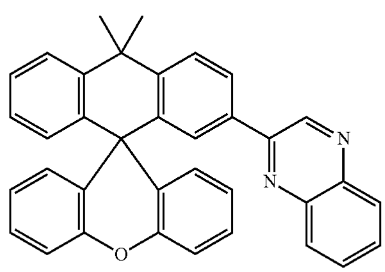
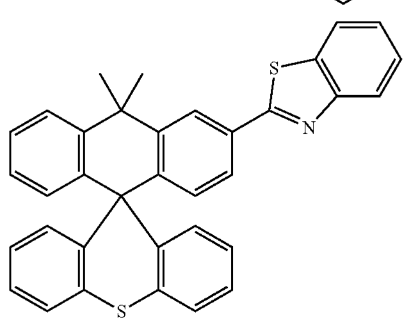

-continued
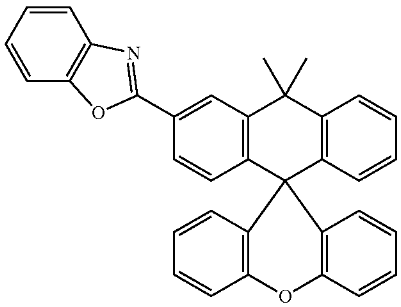
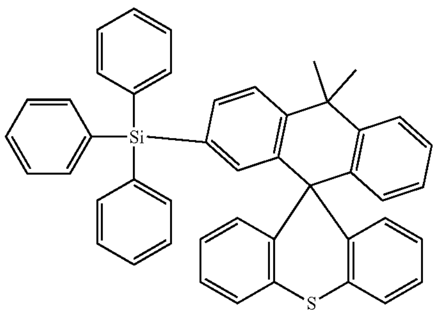
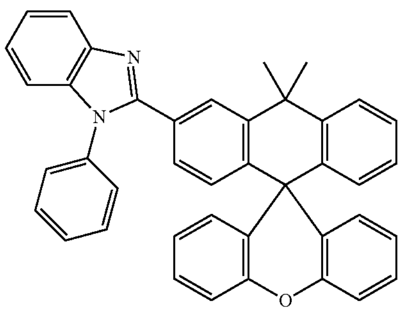
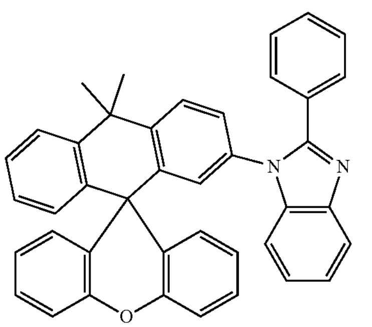
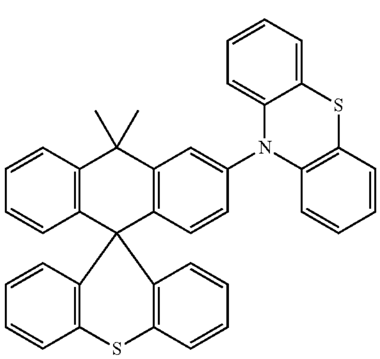
-continued
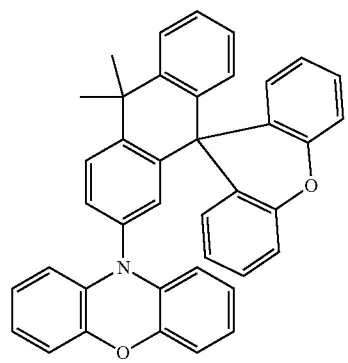
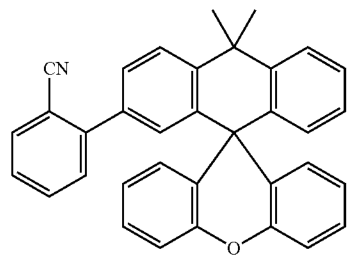
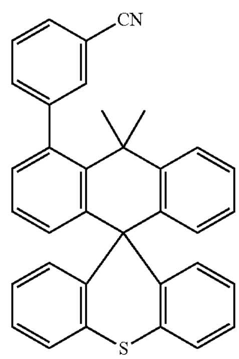
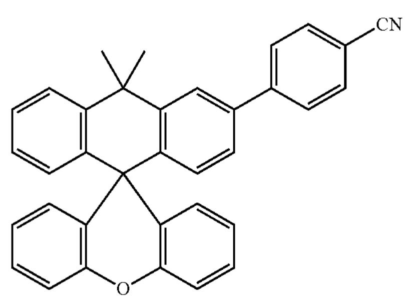
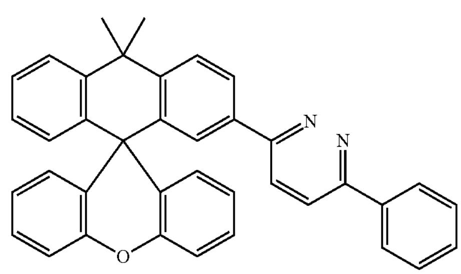

-continued
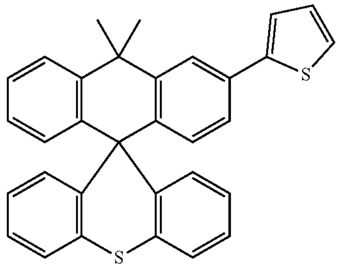
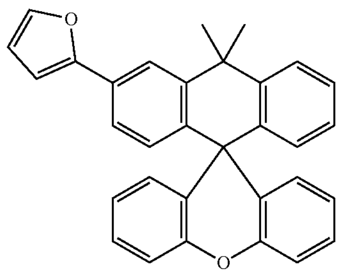
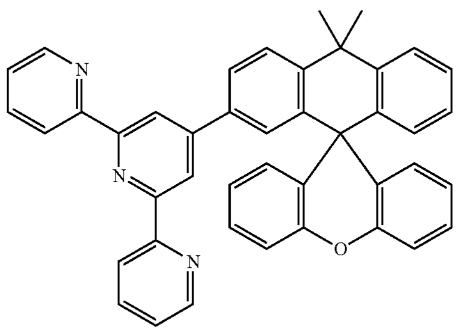
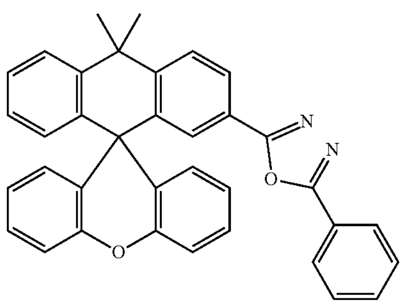
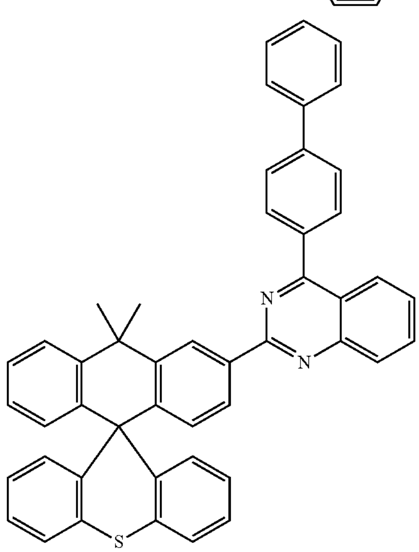
-continued
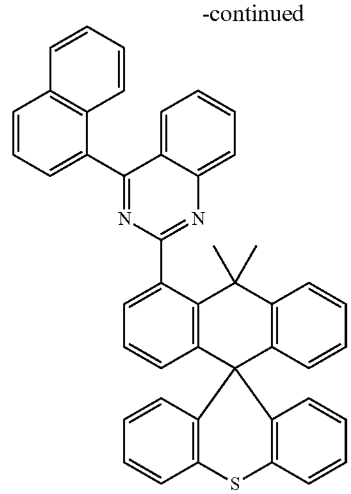
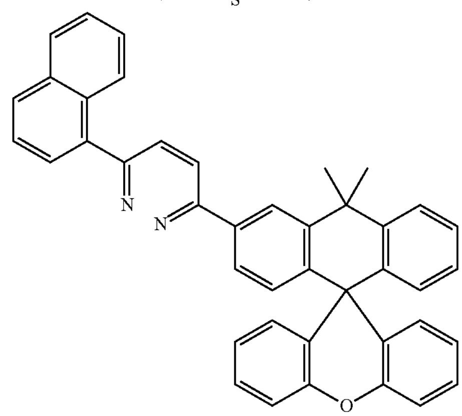
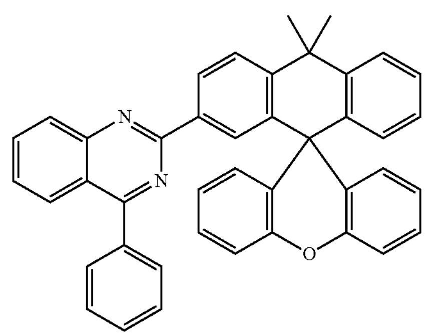
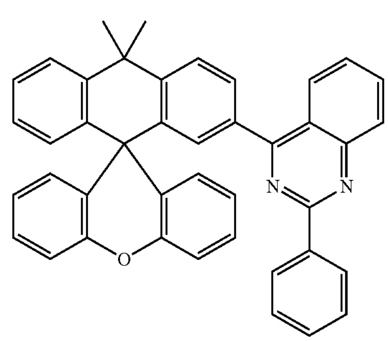

-continued
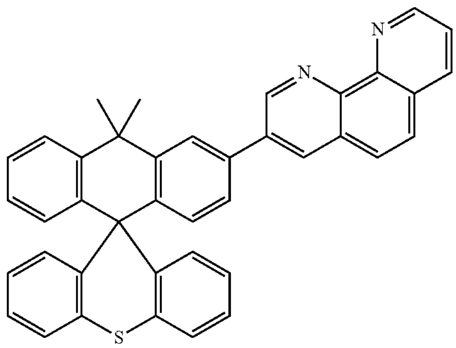
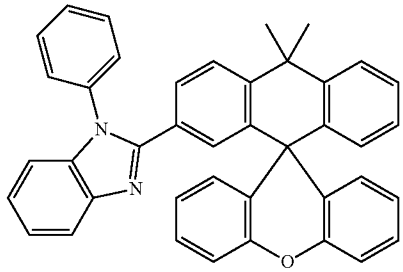
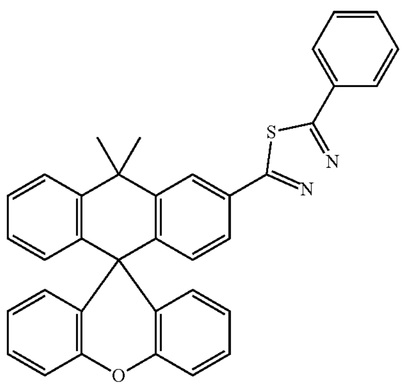
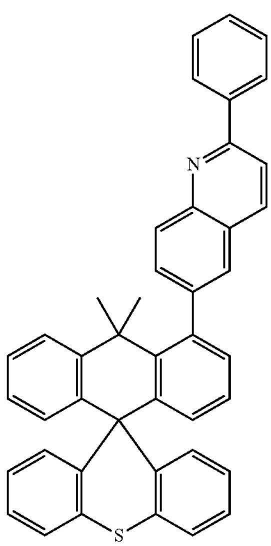
-continued
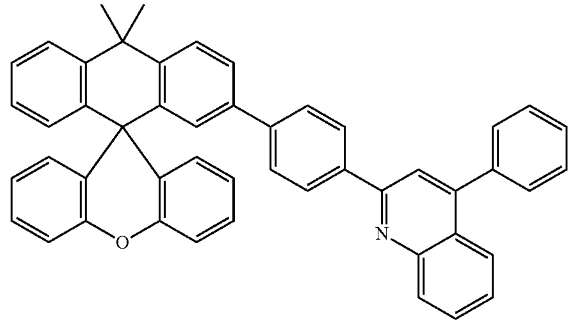
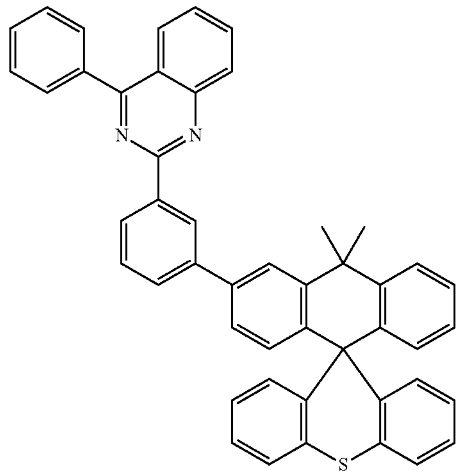
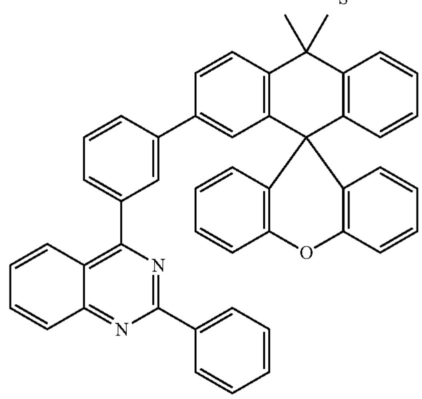
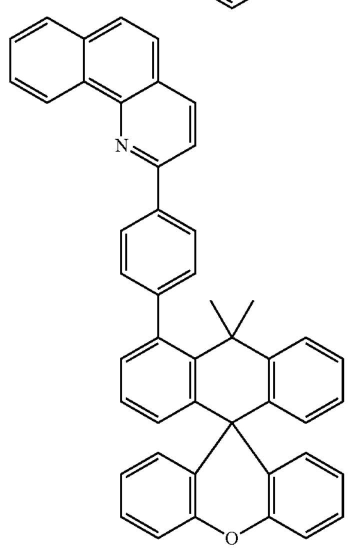

-continued
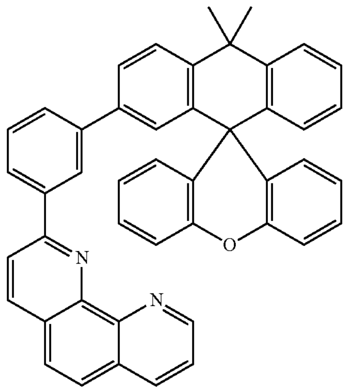
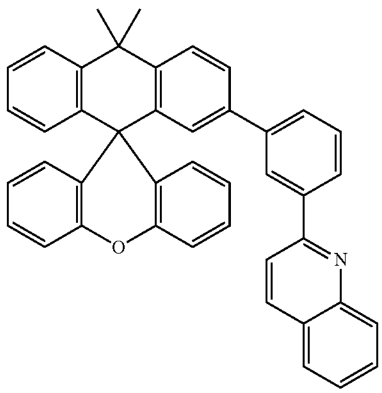
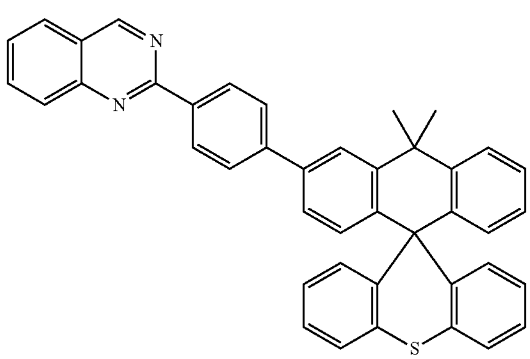
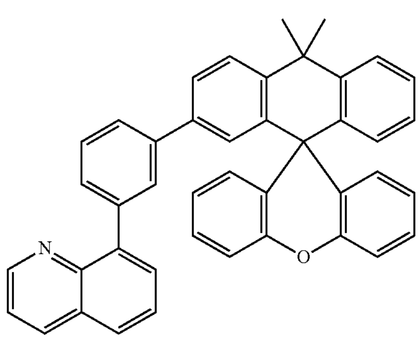
-continued
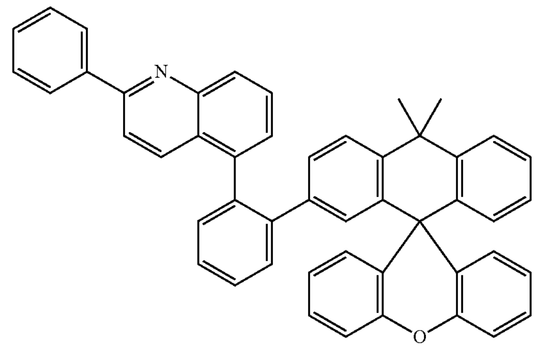
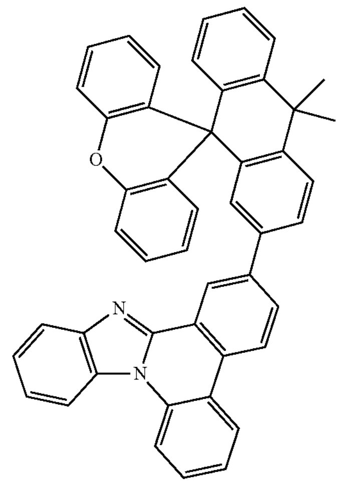
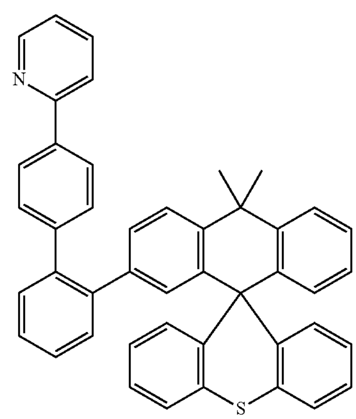
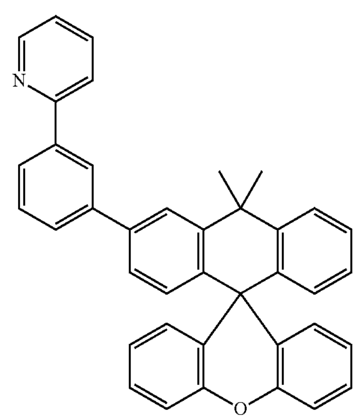

-continued
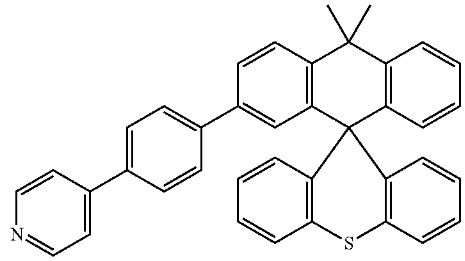
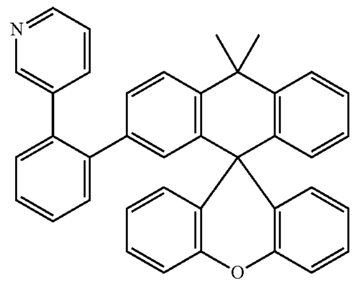
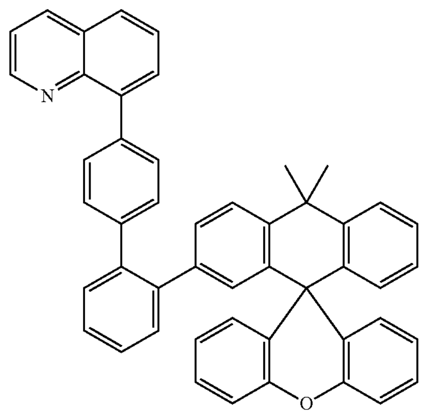
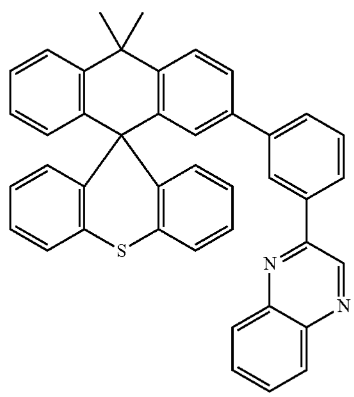
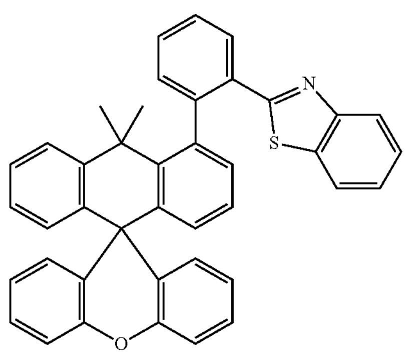
-continued
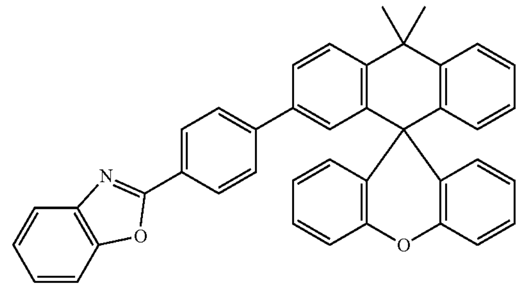
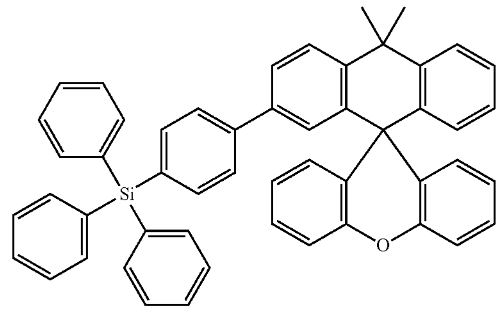
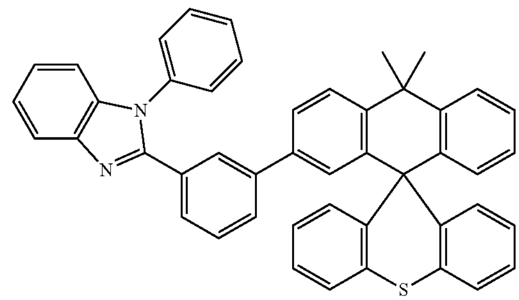
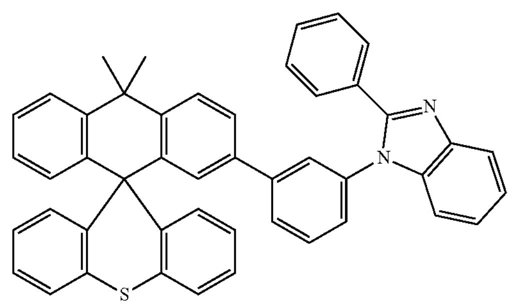
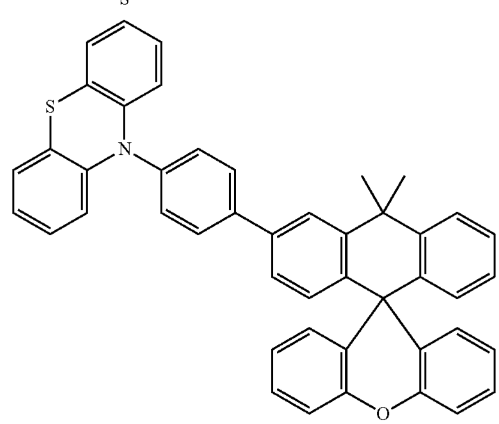

-continued
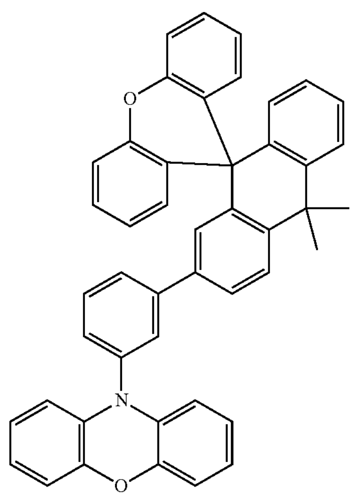
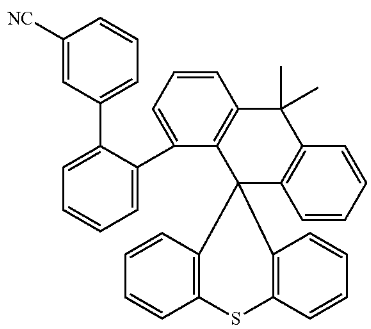
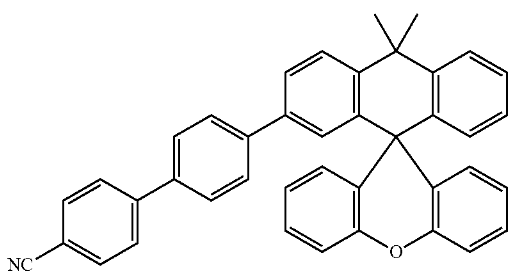
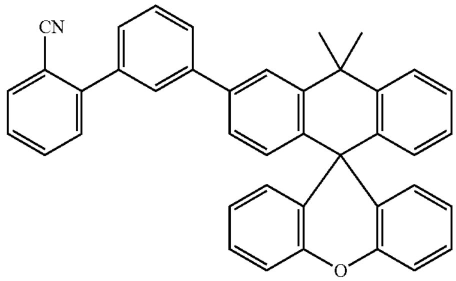
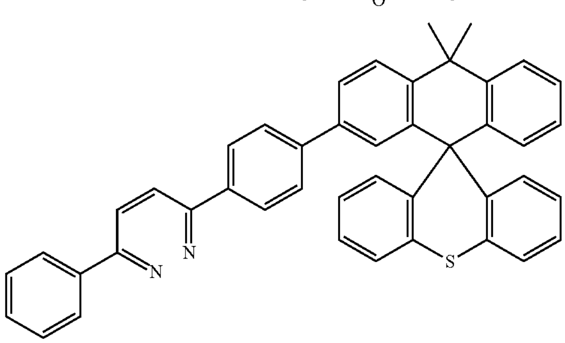
-continued
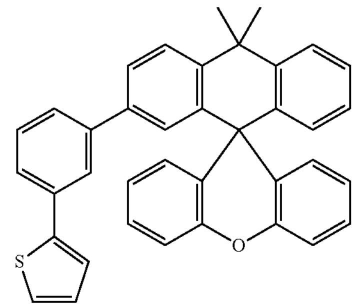
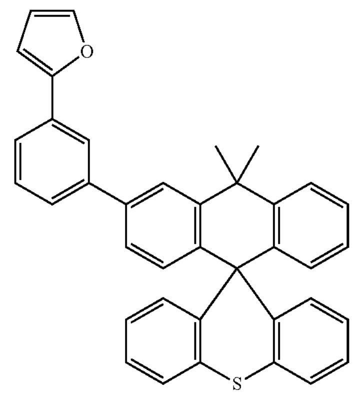
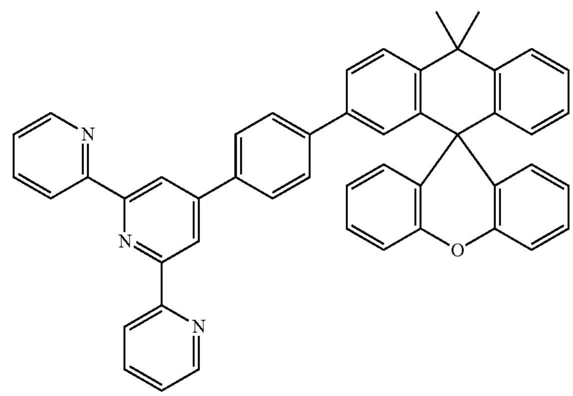
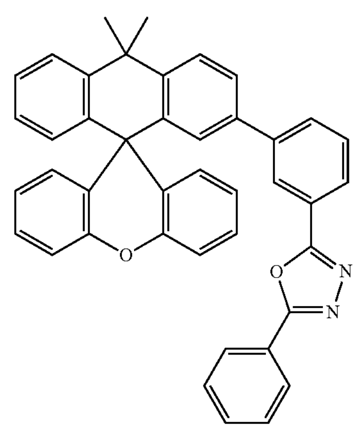

-continued
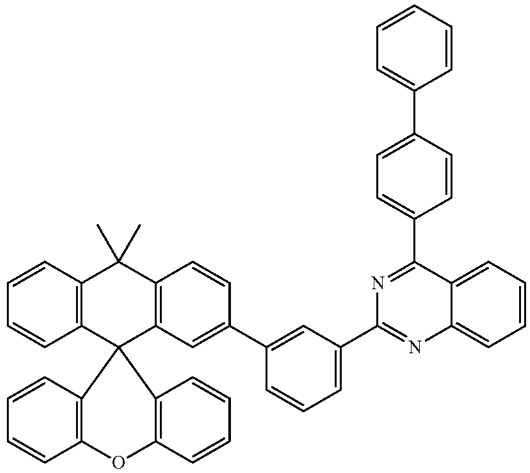
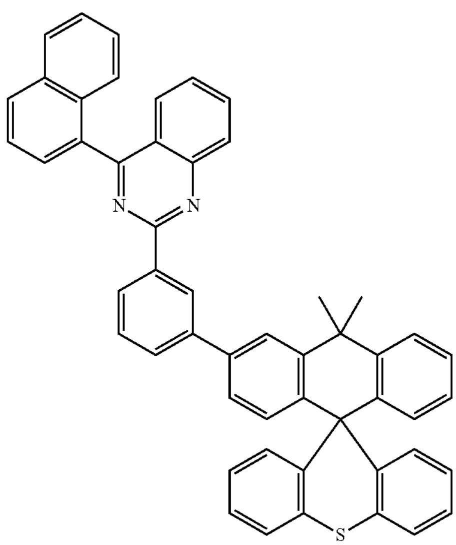
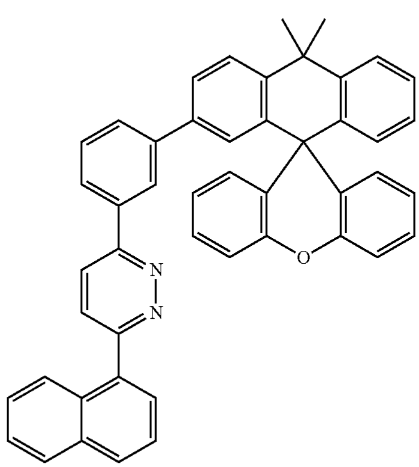
-continued
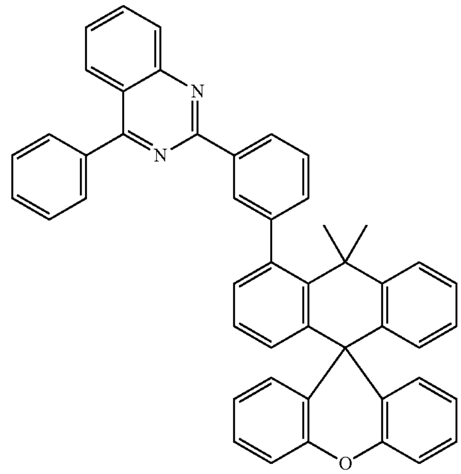
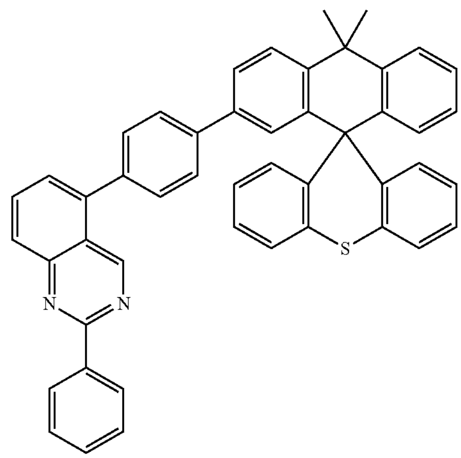
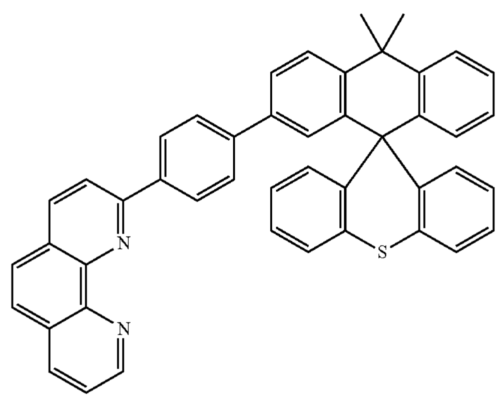
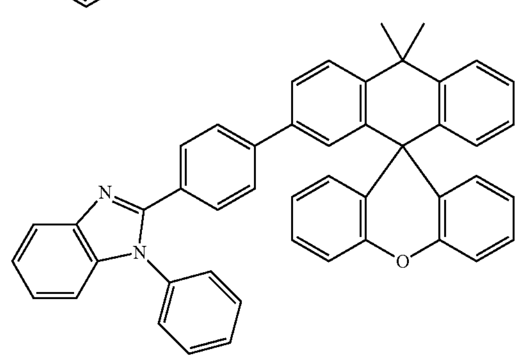

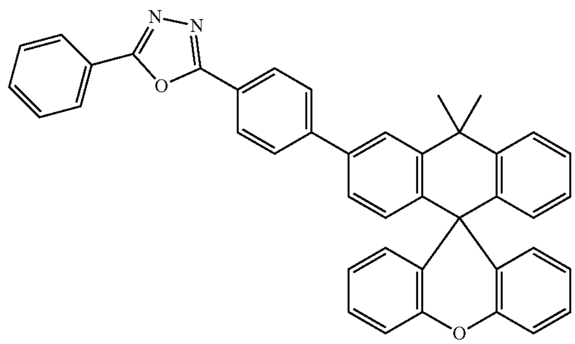
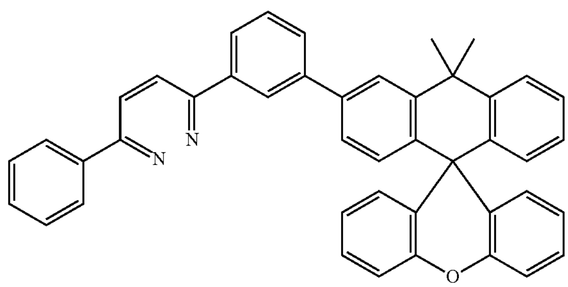
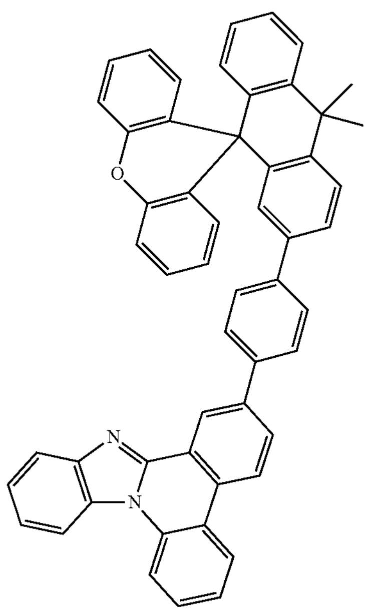
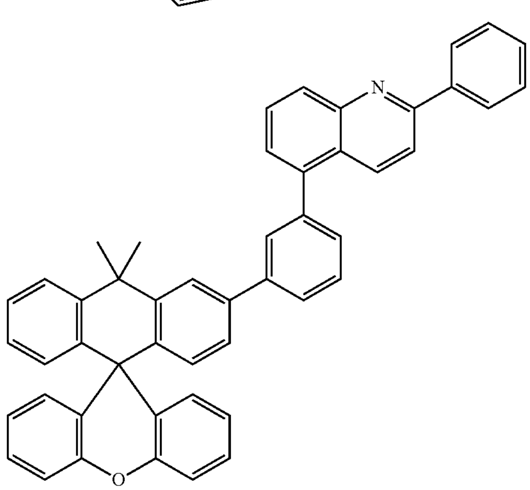
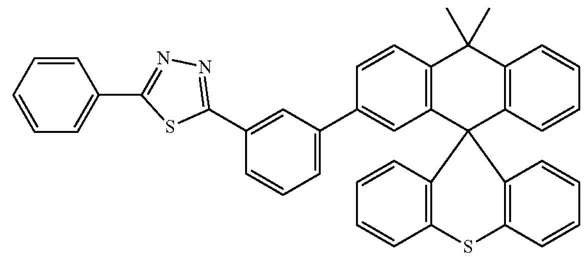
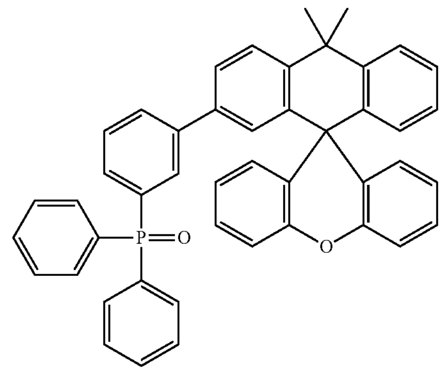
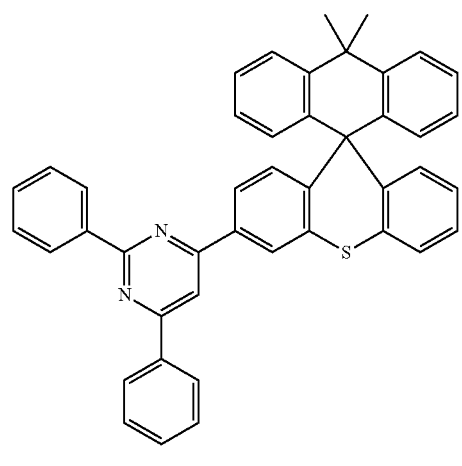
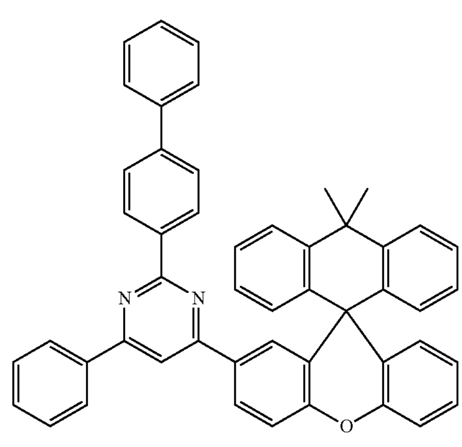

-continued
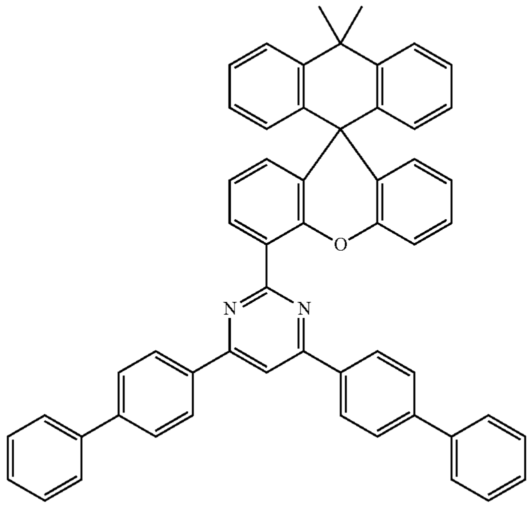
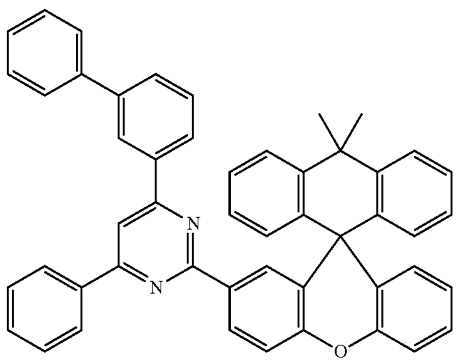
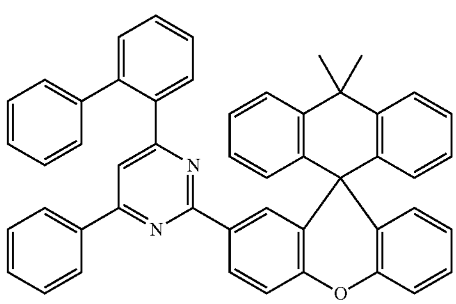
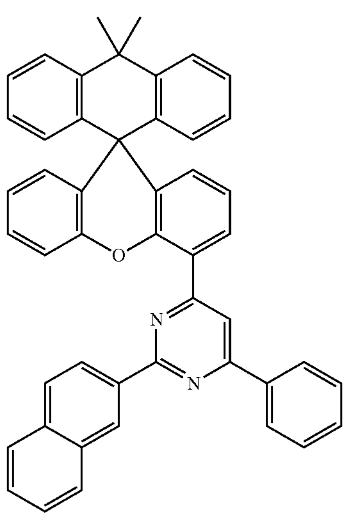
-continued
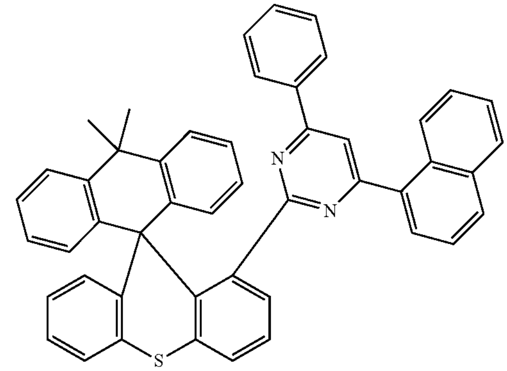
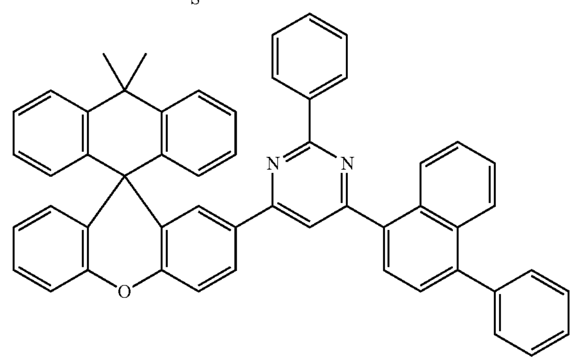
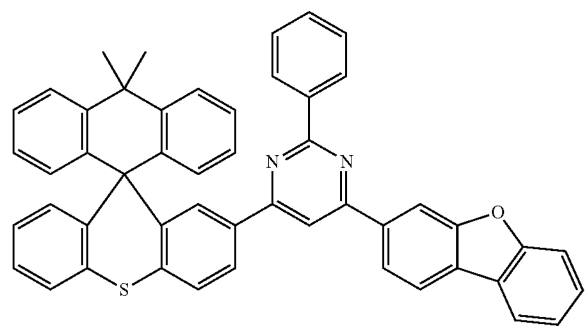
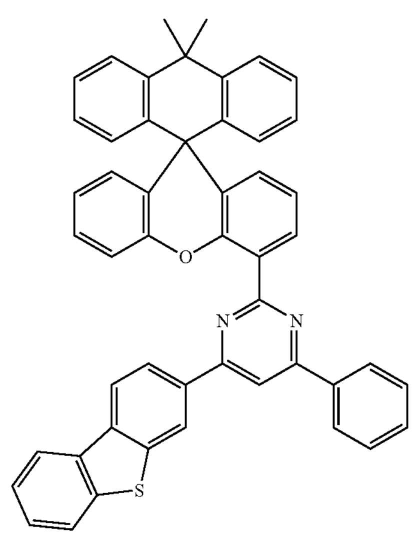

-continued
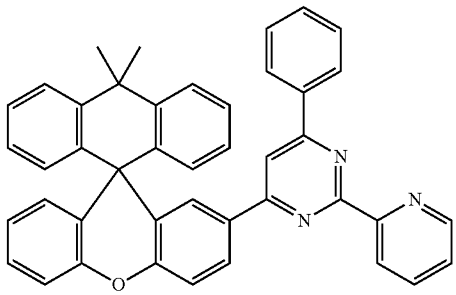
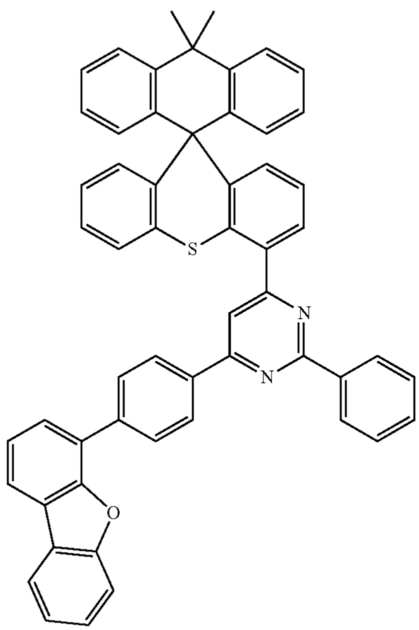
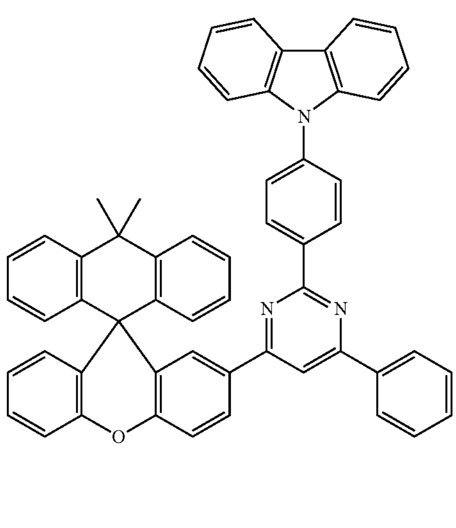
-continued
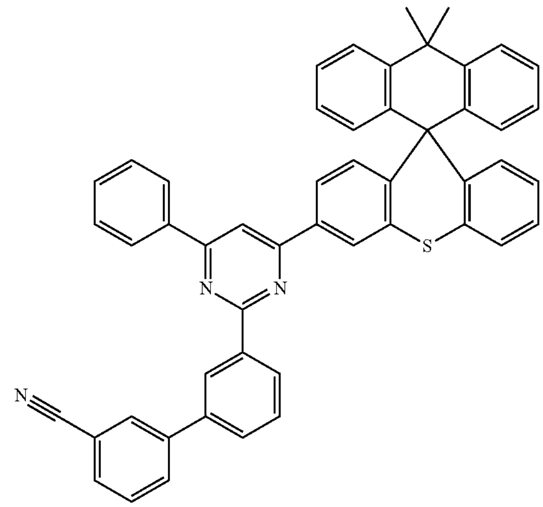
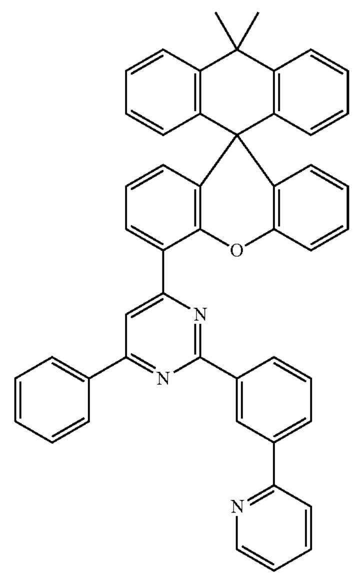
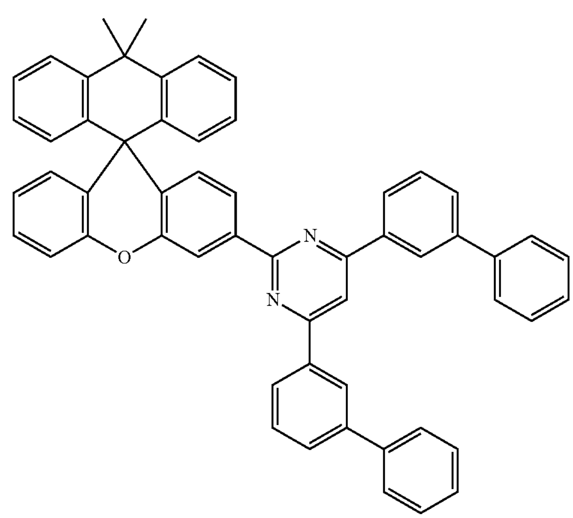

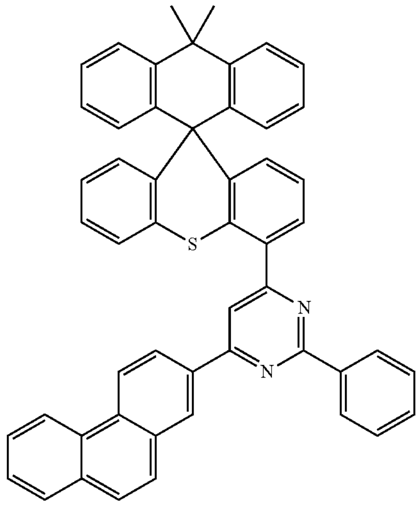
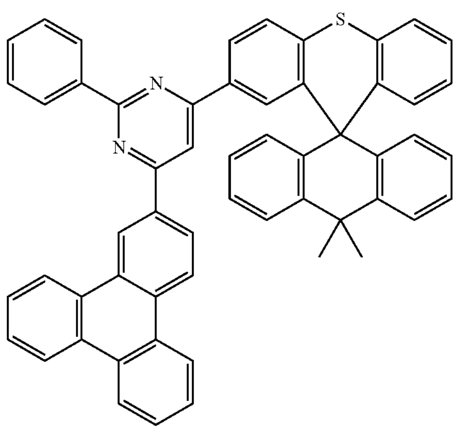
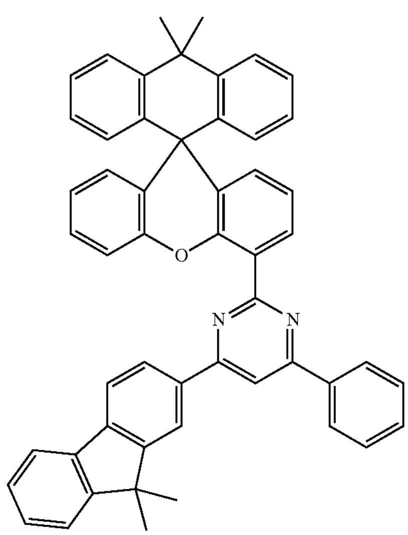
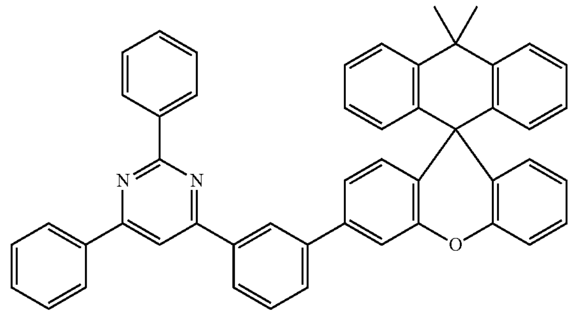
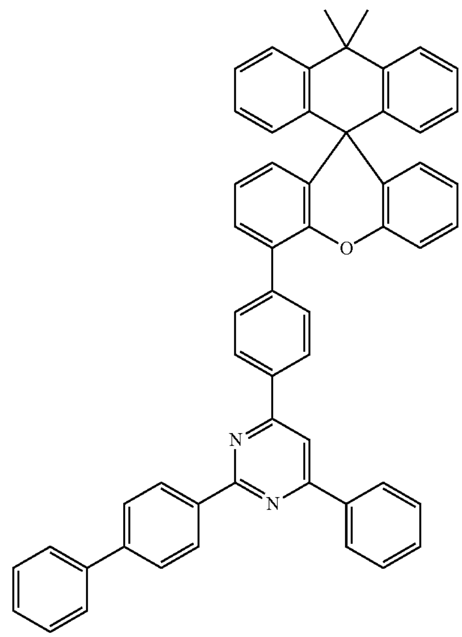
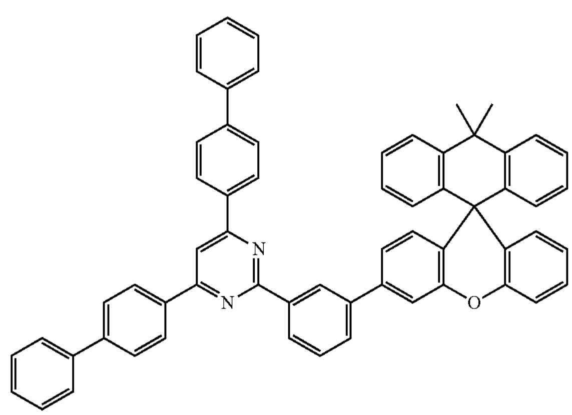

-continued
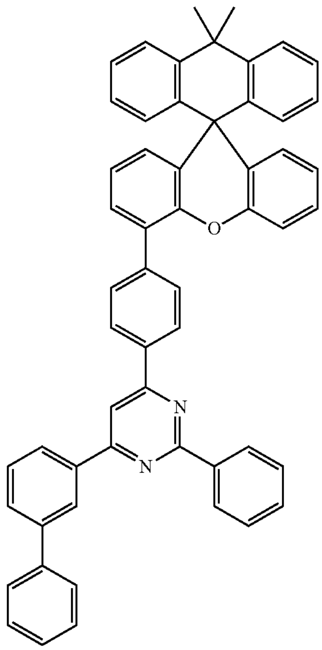
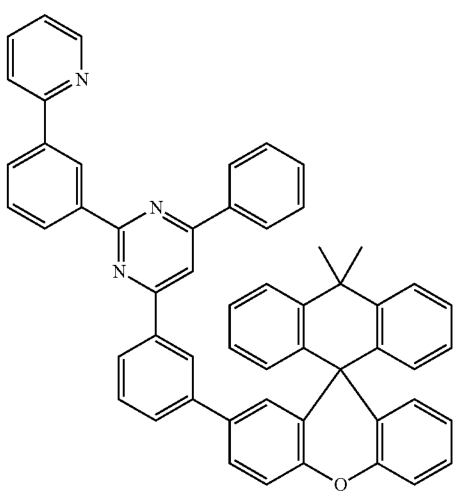
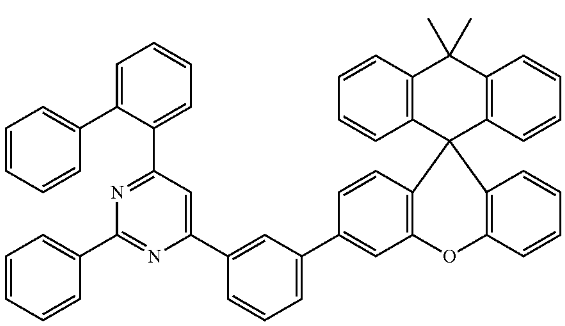
-continued
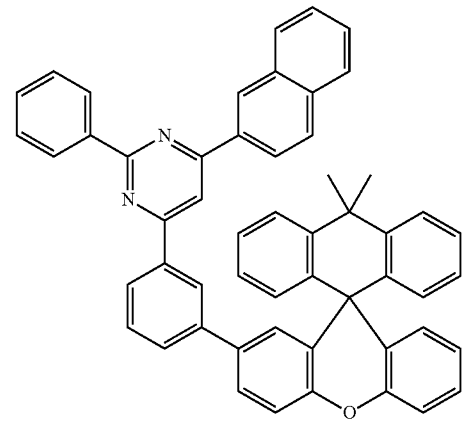
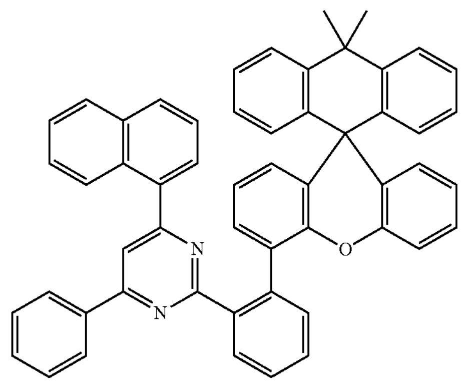
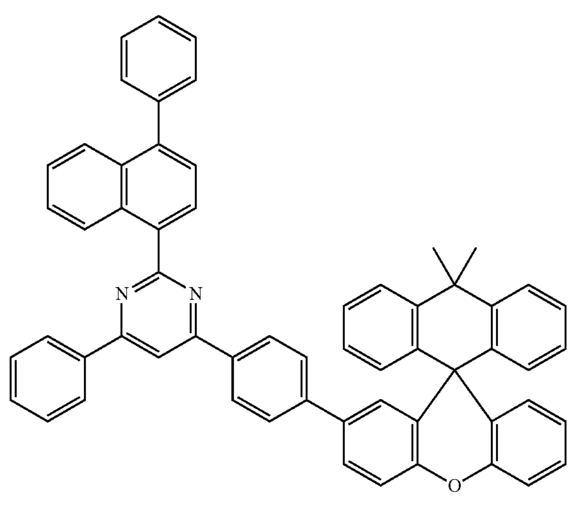

-continued
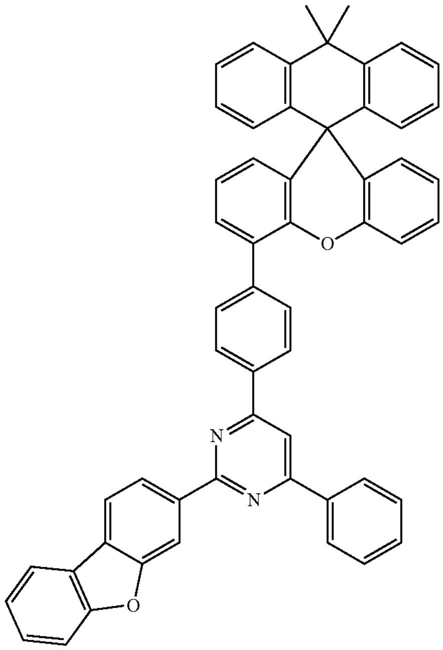
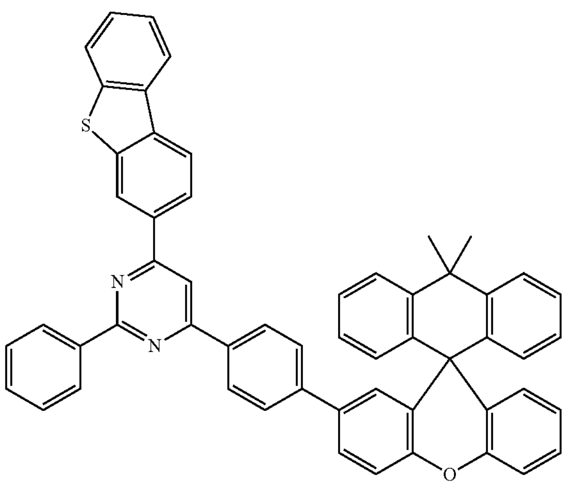
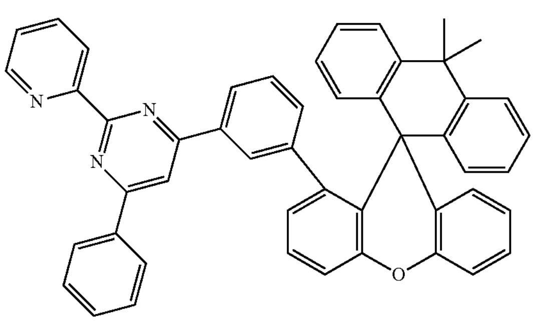
-continued
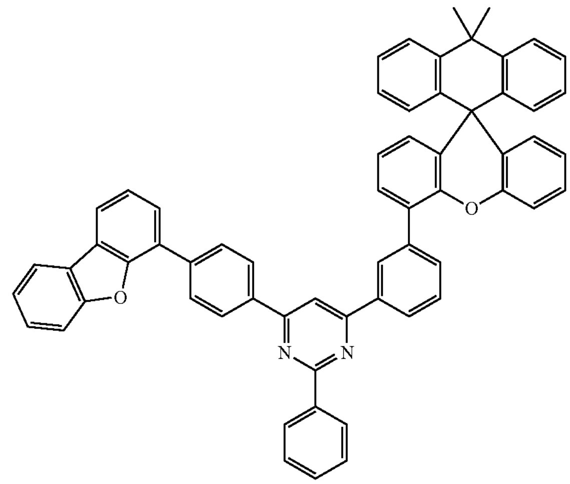
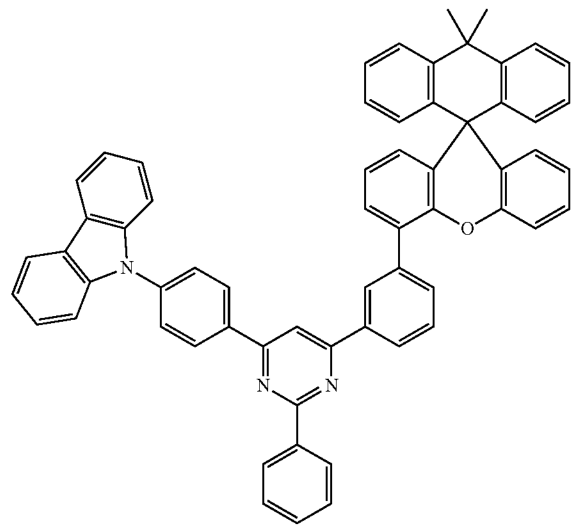
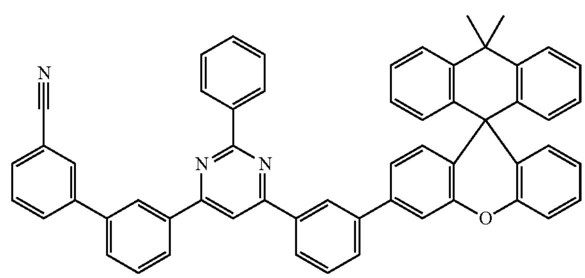
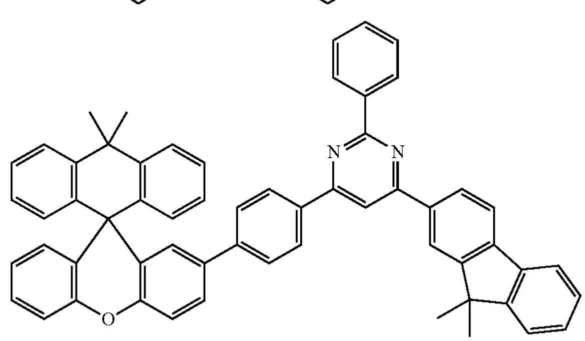

-continued
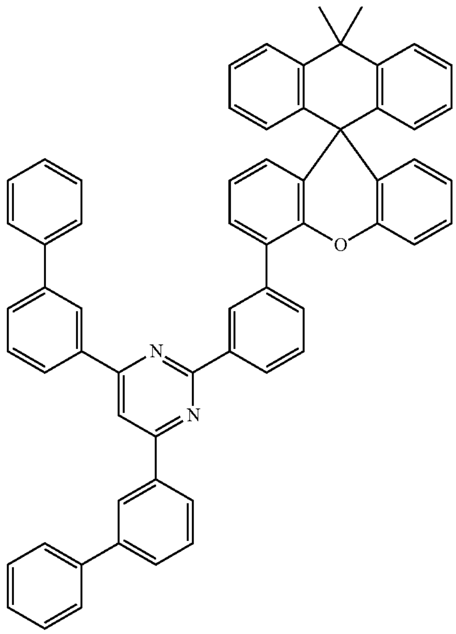
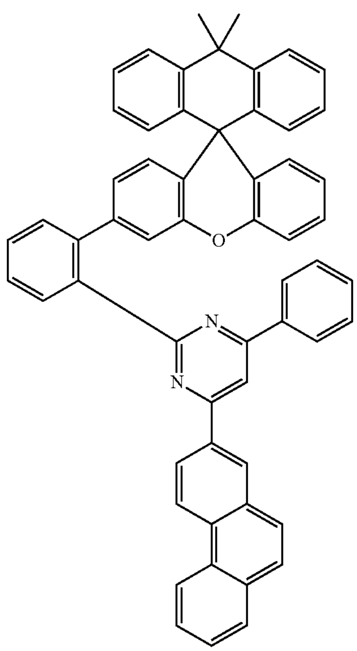
-continued
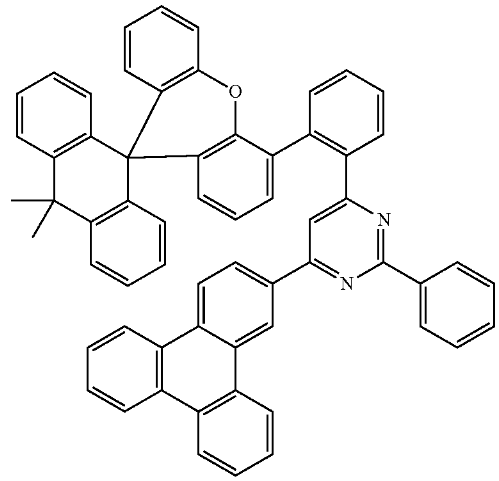
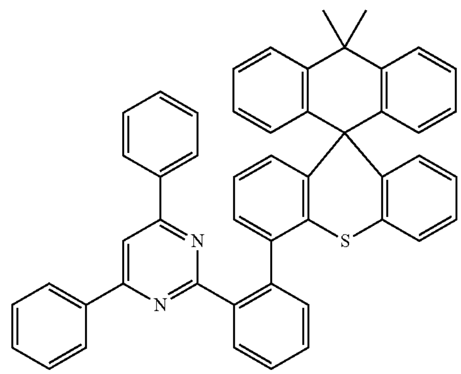
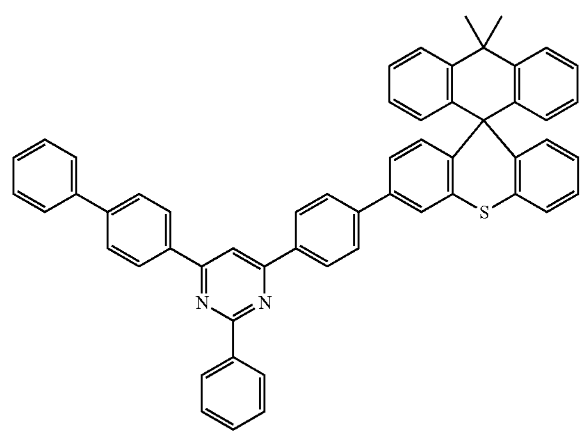

-continued
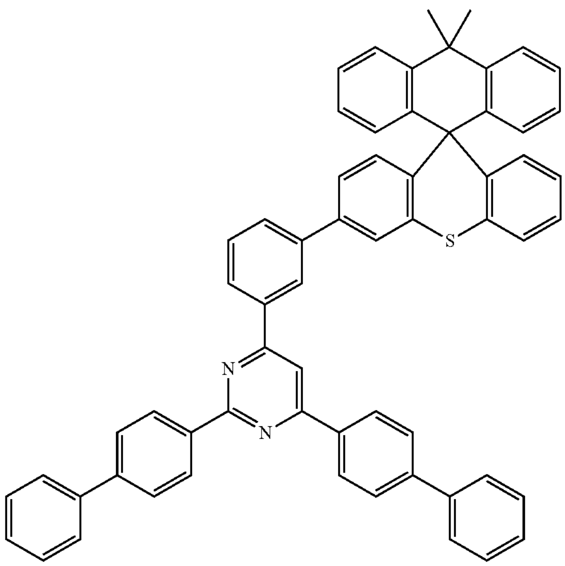
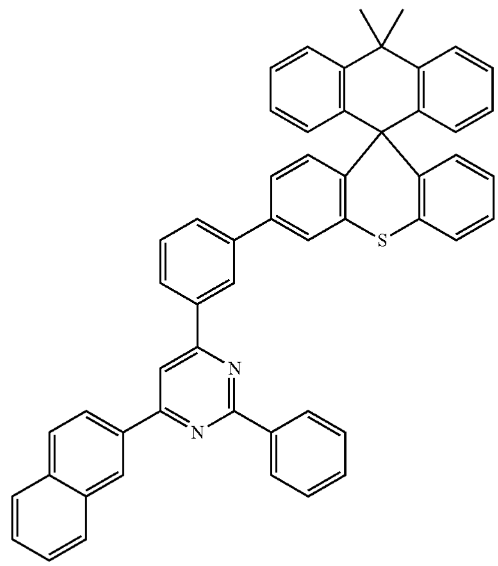
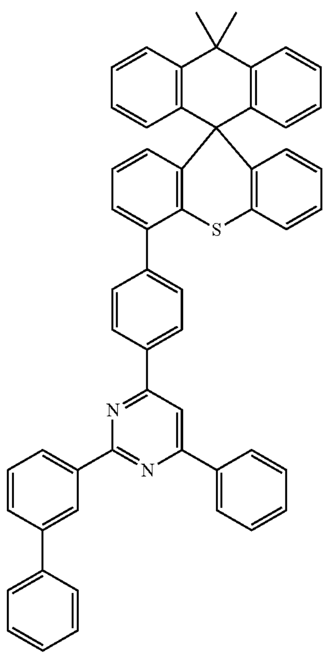
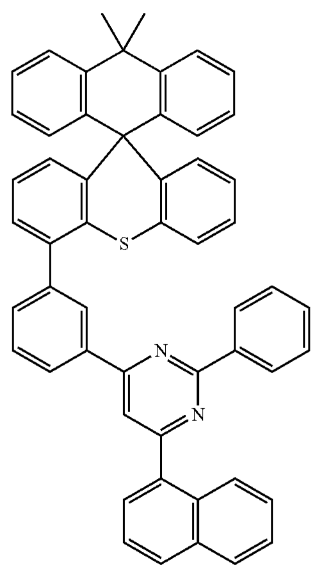
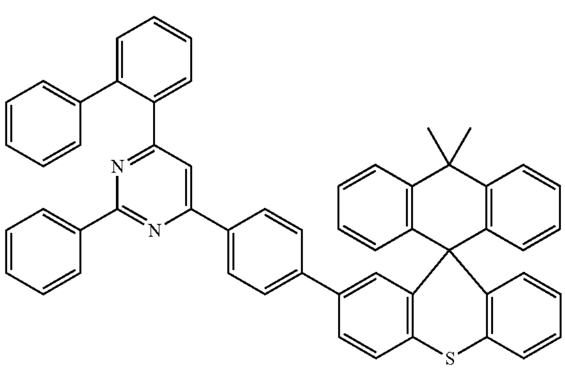
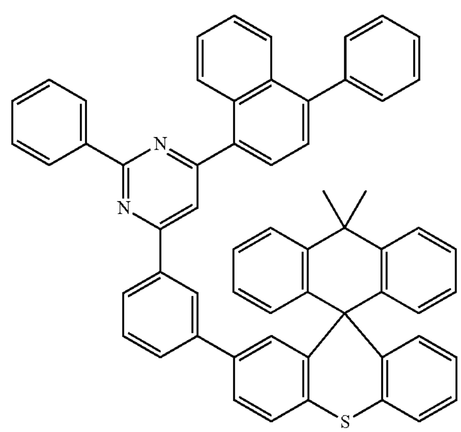

-continued
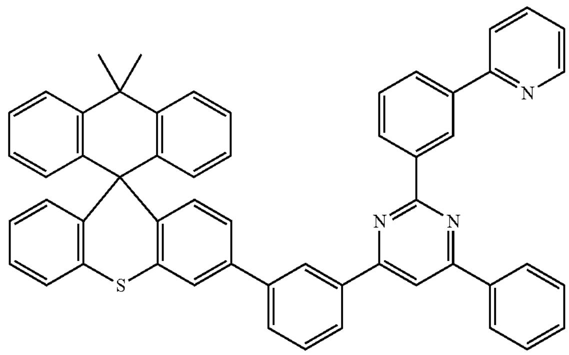
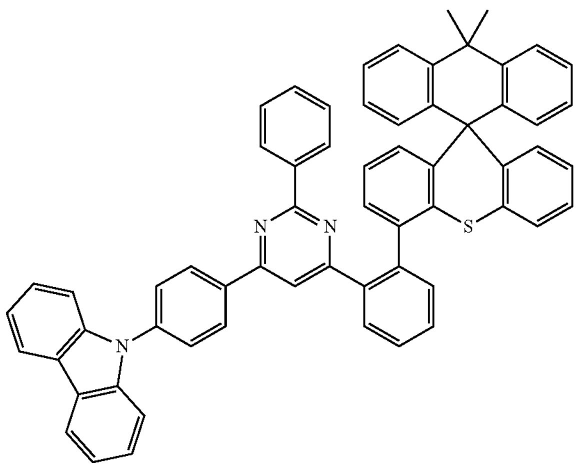
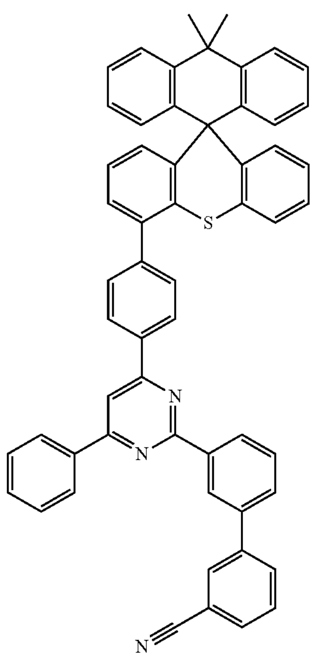
-continued
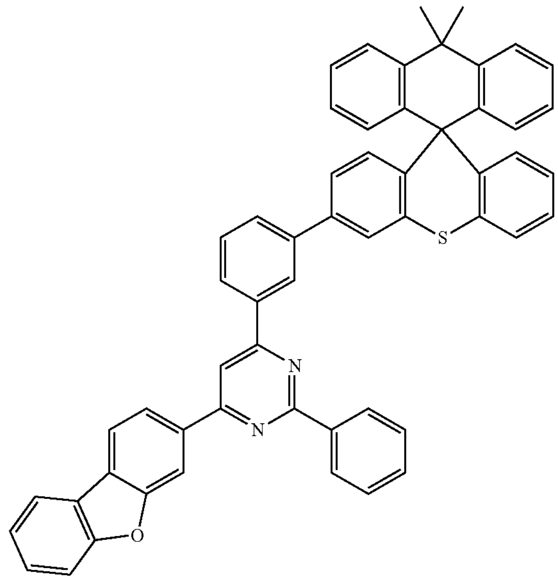
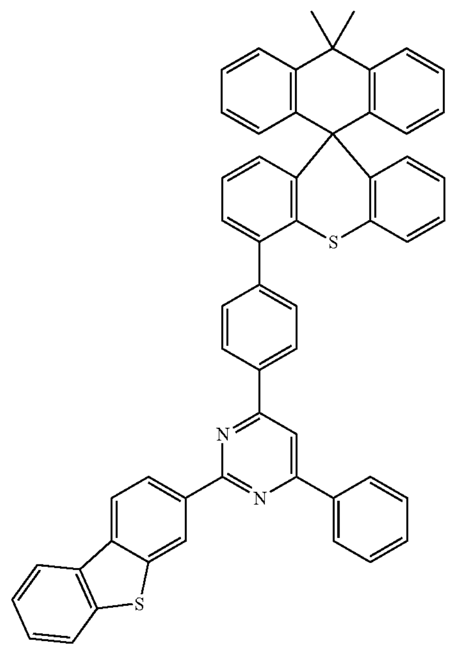
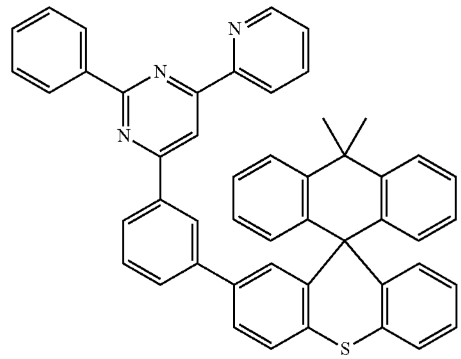

-continued
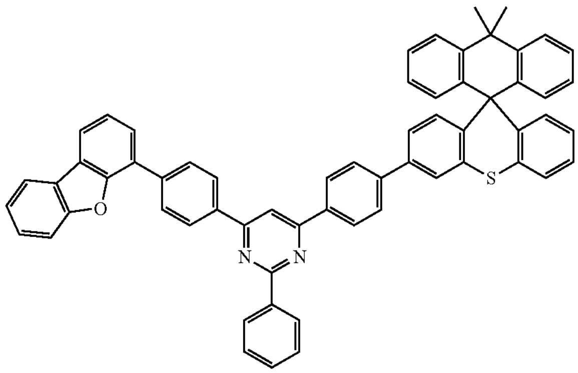
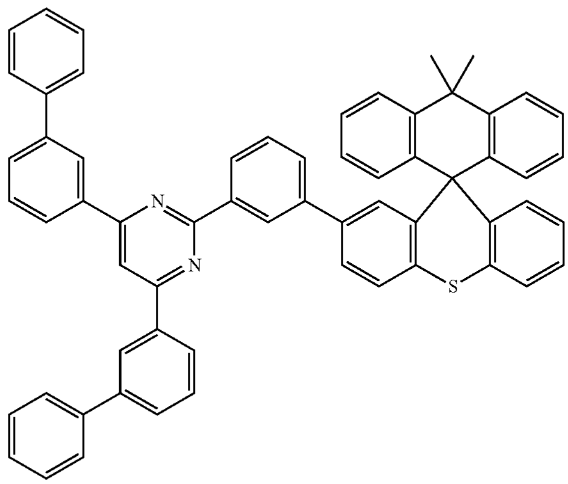
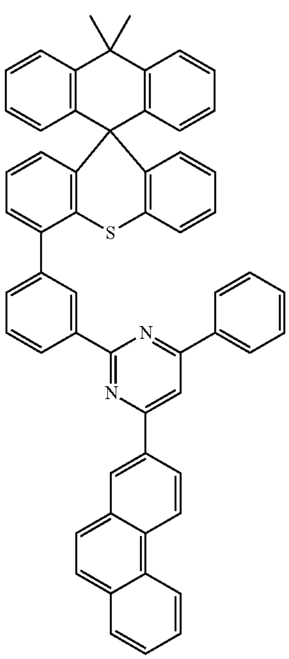
-continued
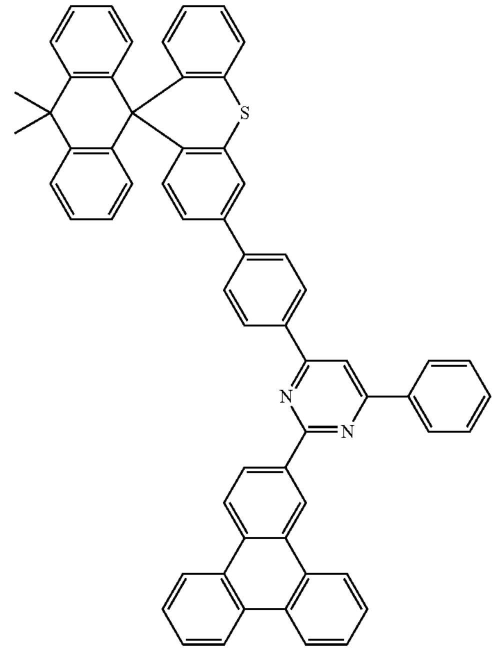
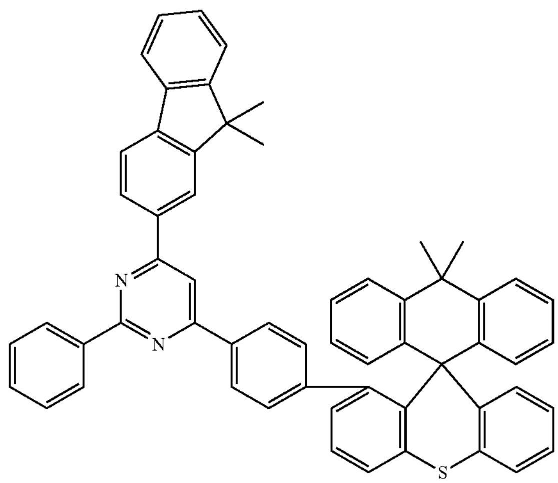
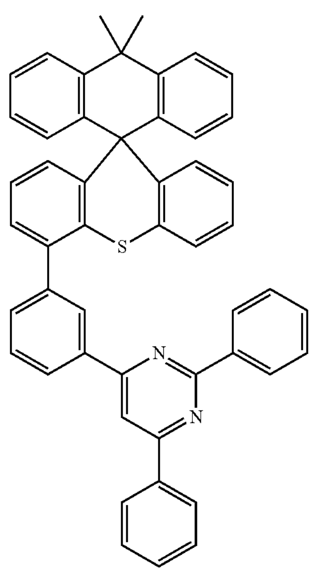

-continued
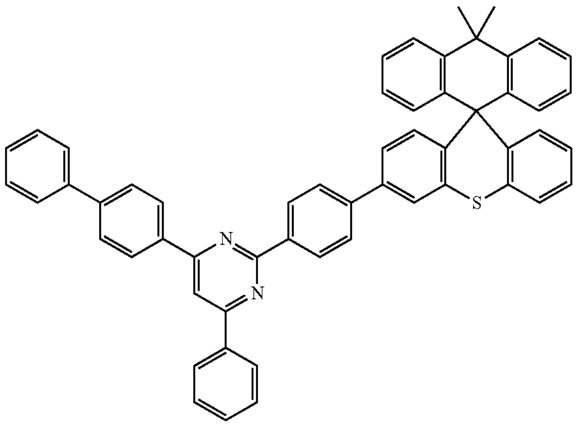
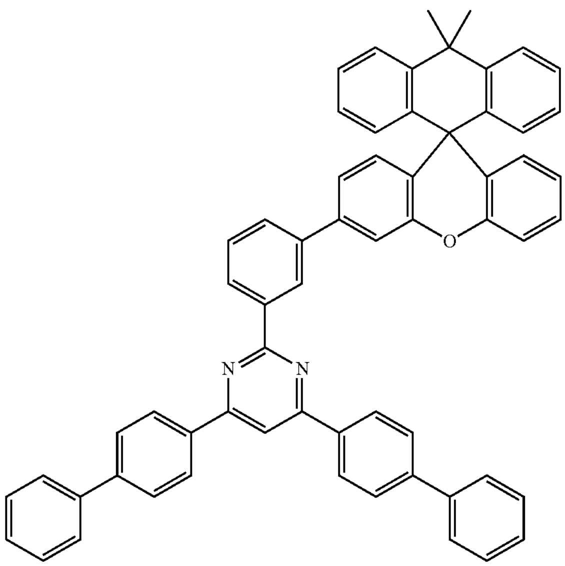
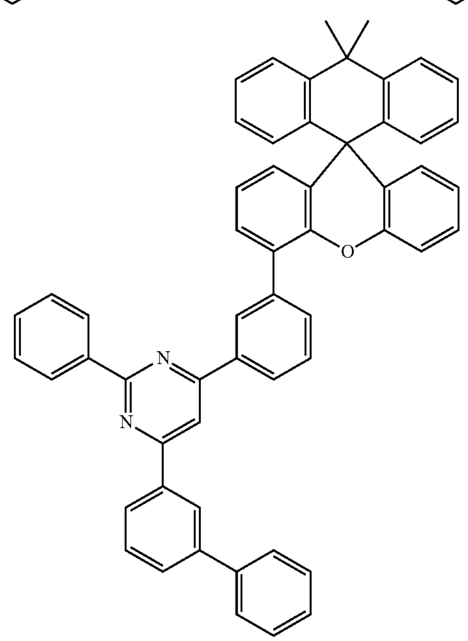
-continued
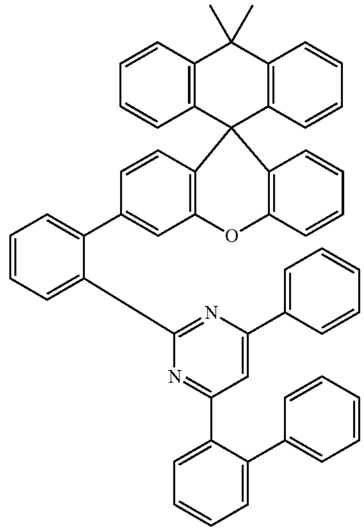
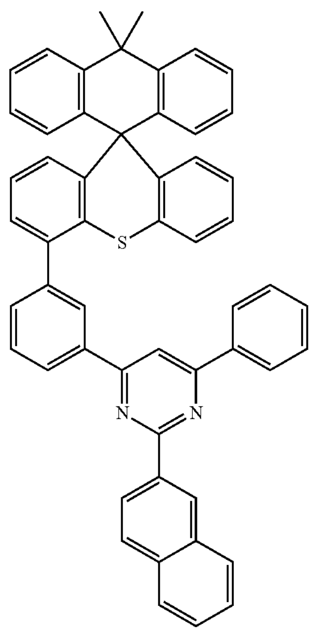
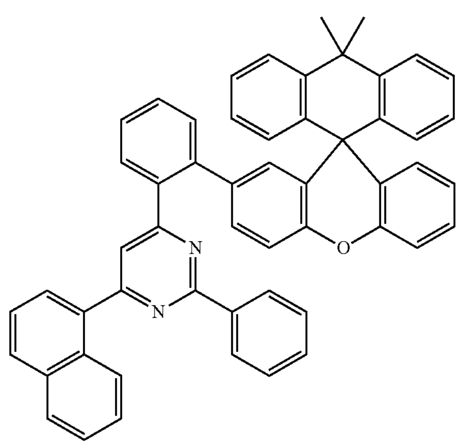

-continued
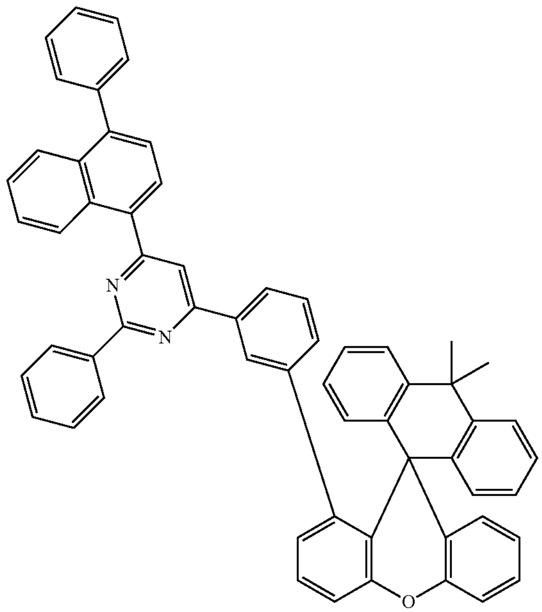
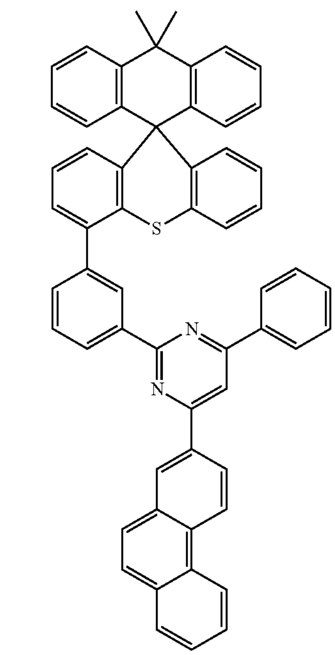
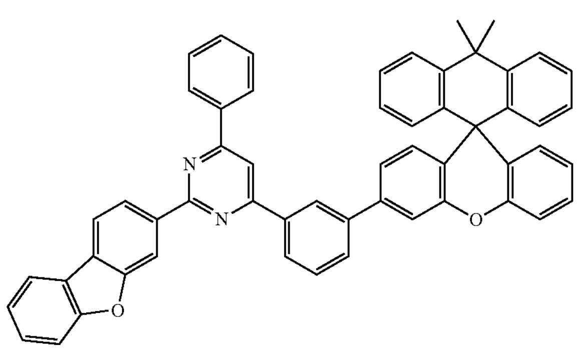
-continued
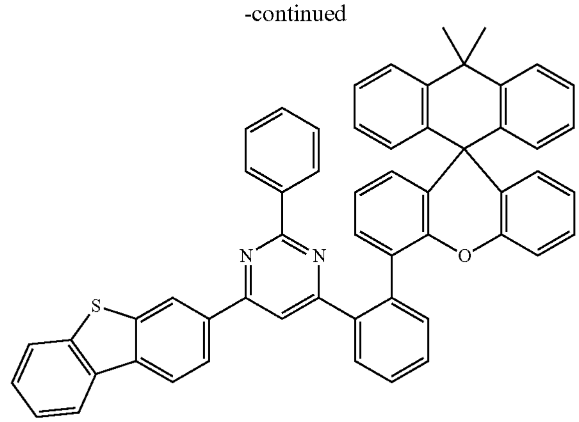
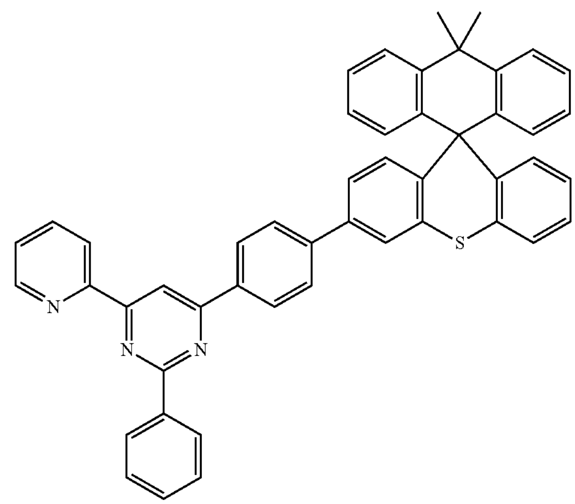
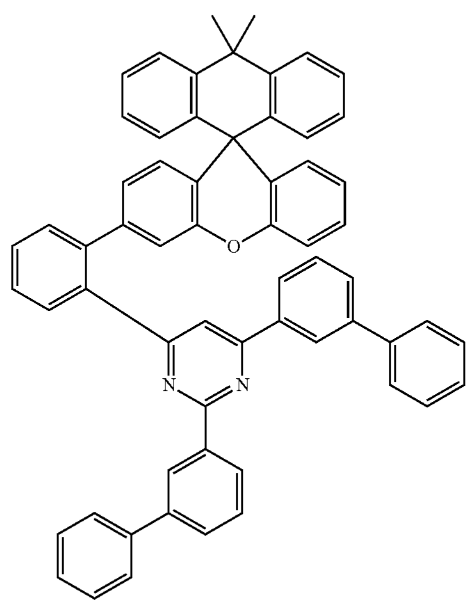

-continued
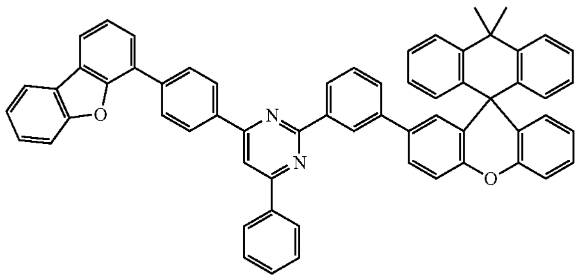
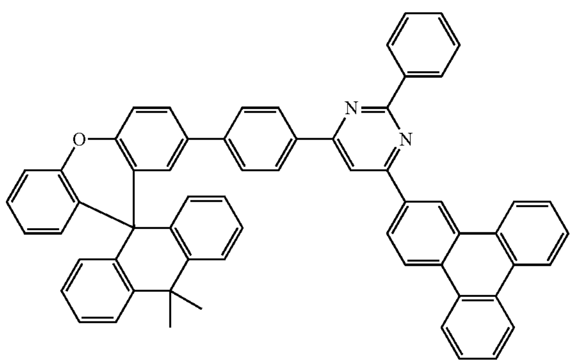
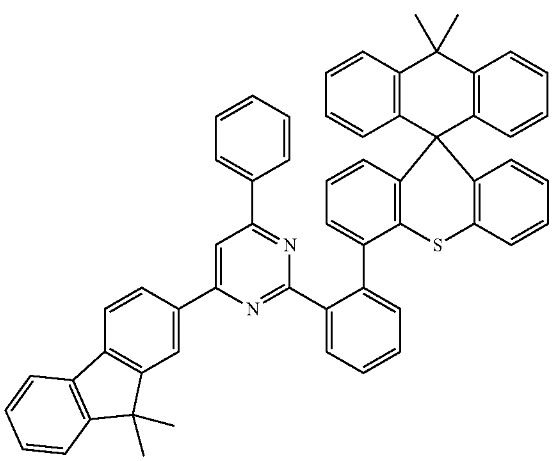
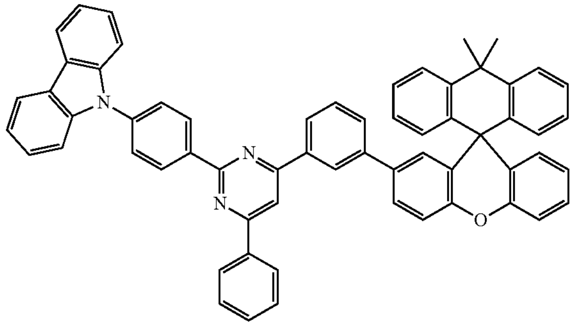
-continued
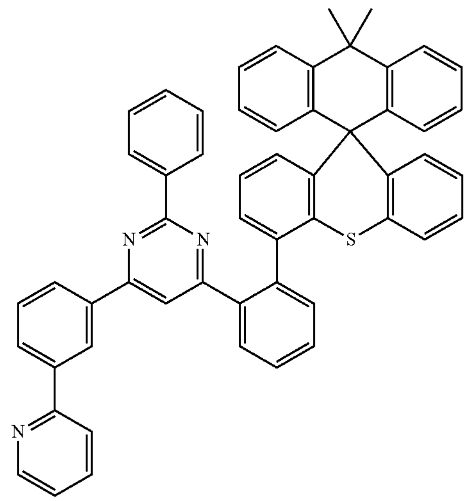
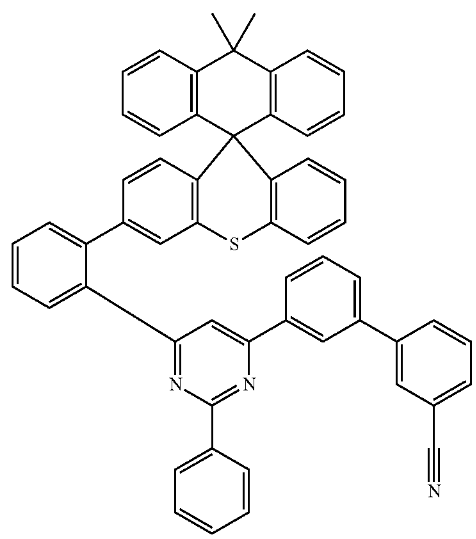
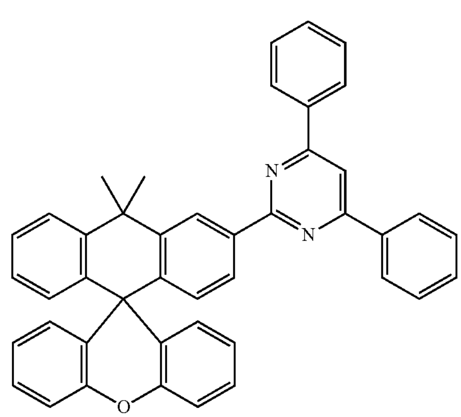

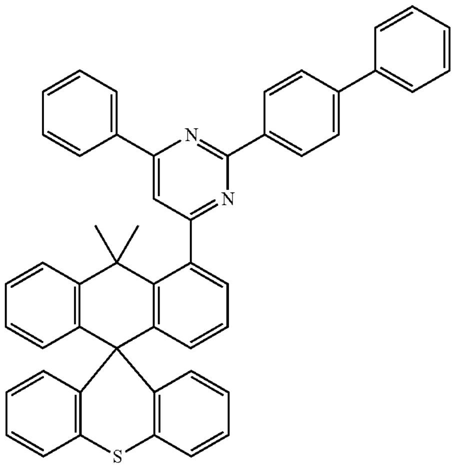
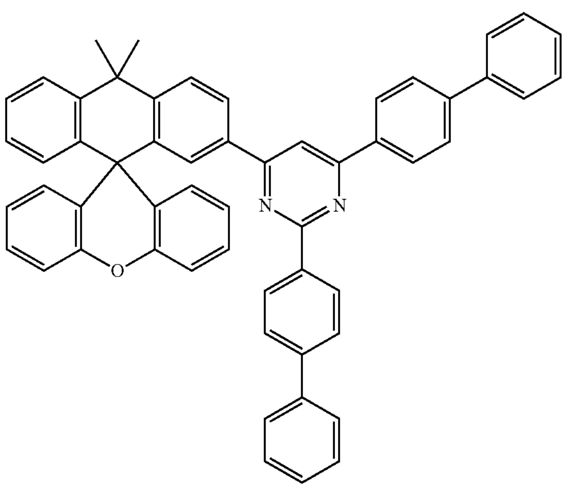
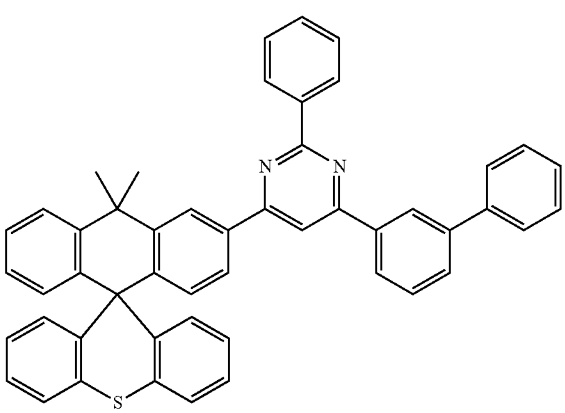
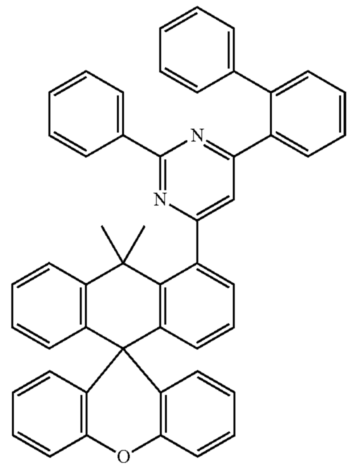
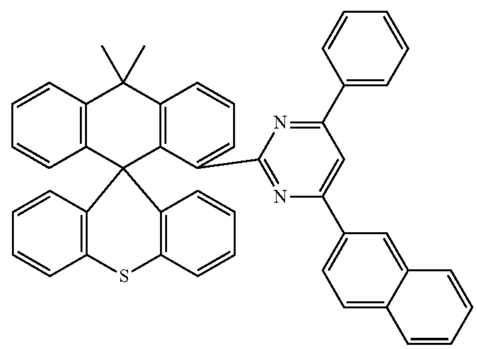
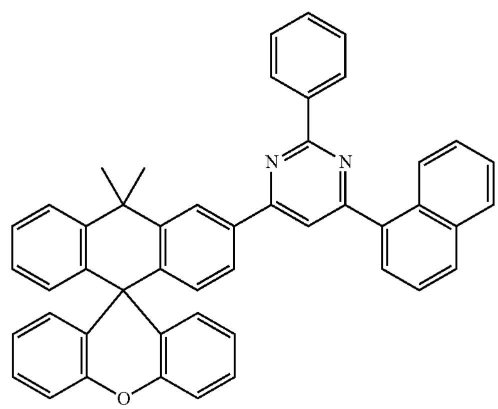
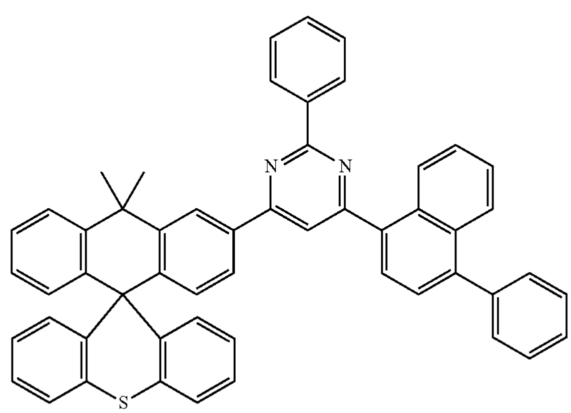

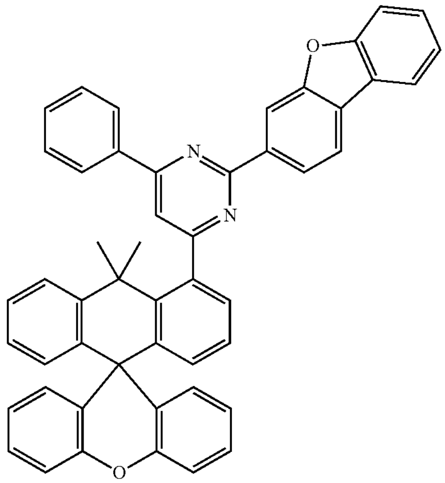
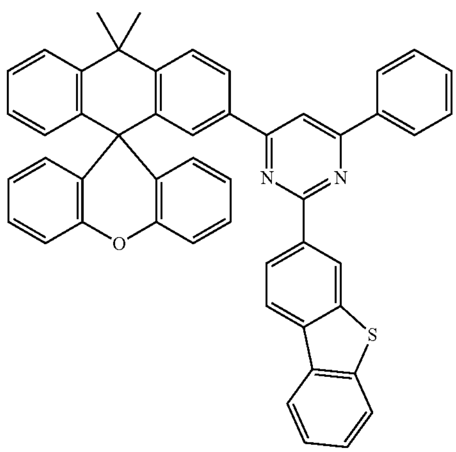
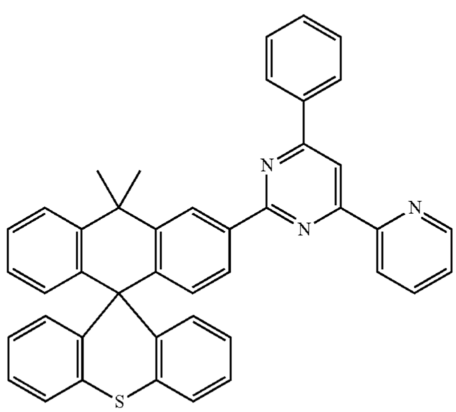
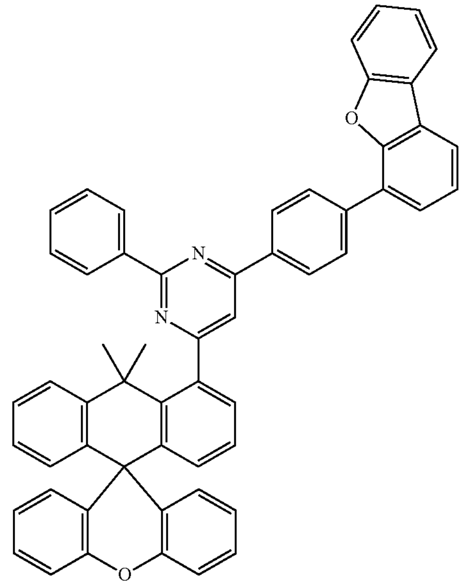
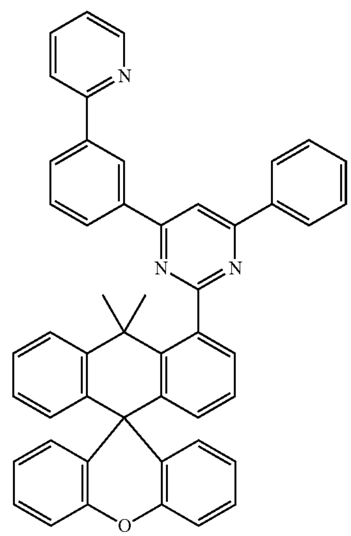
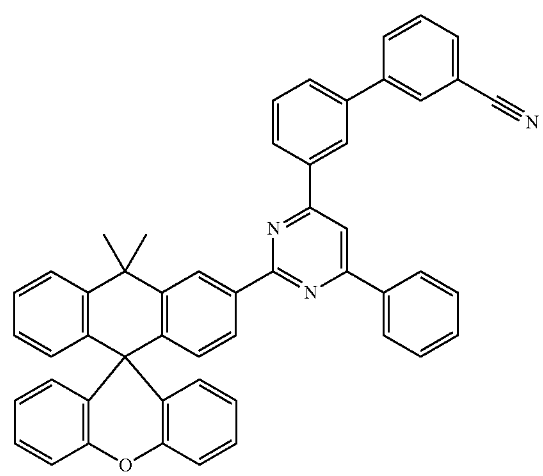

-continued
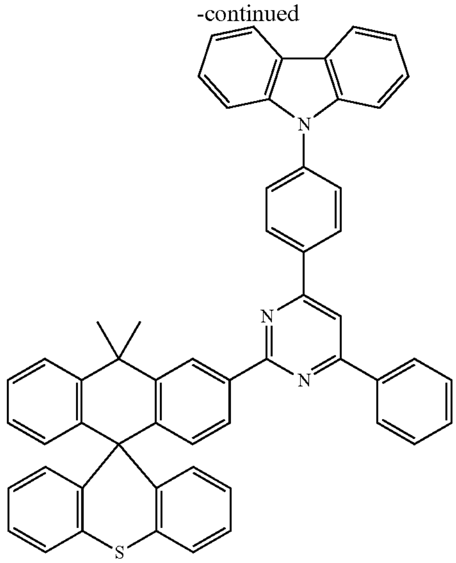
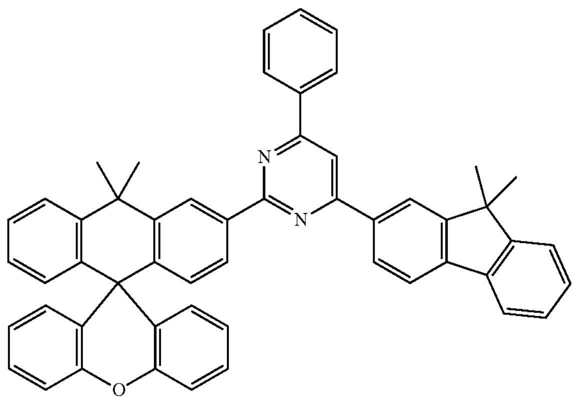
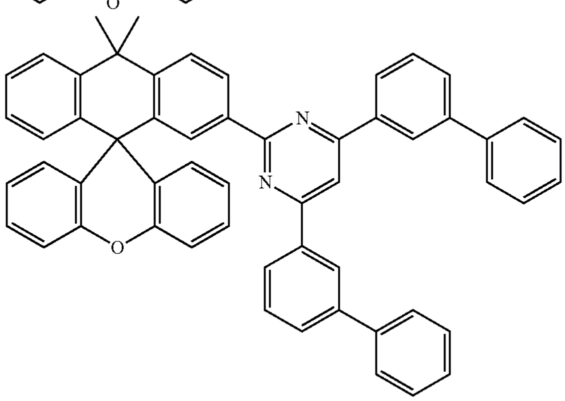
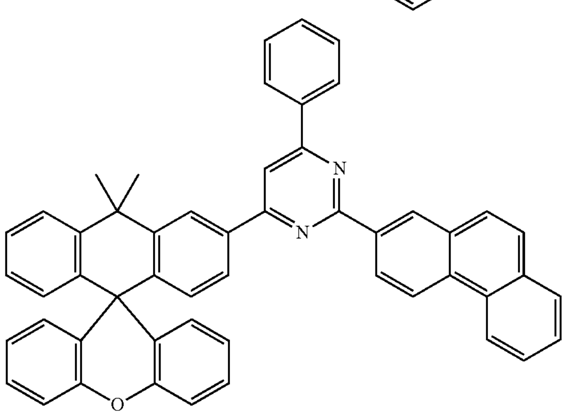
-continued
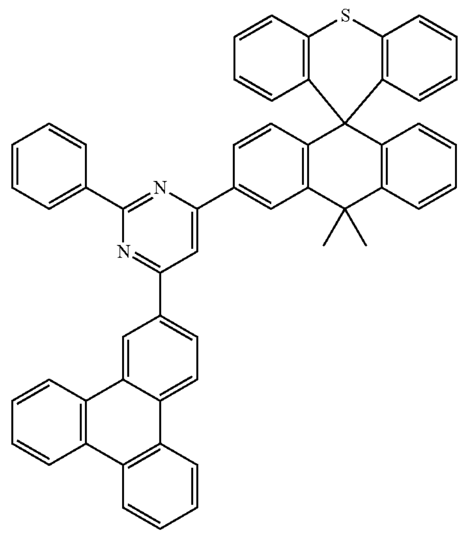
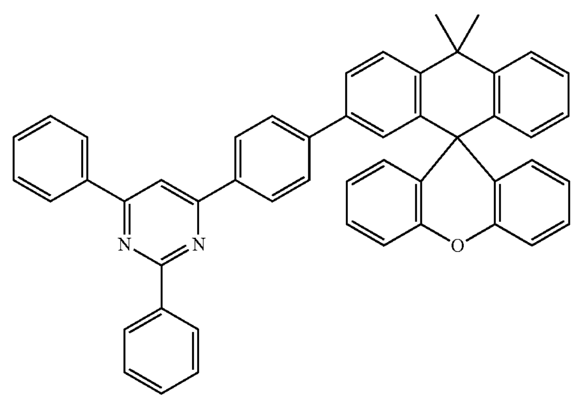
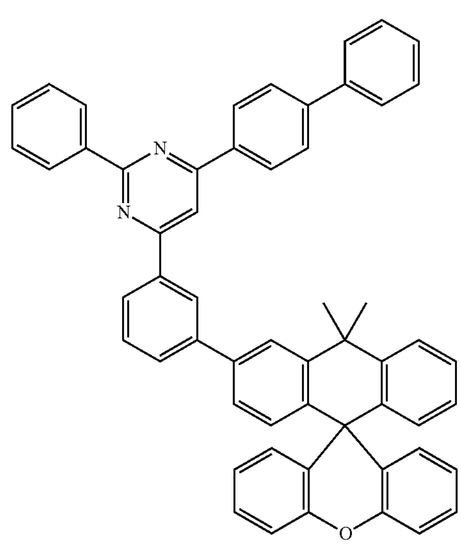

-continued
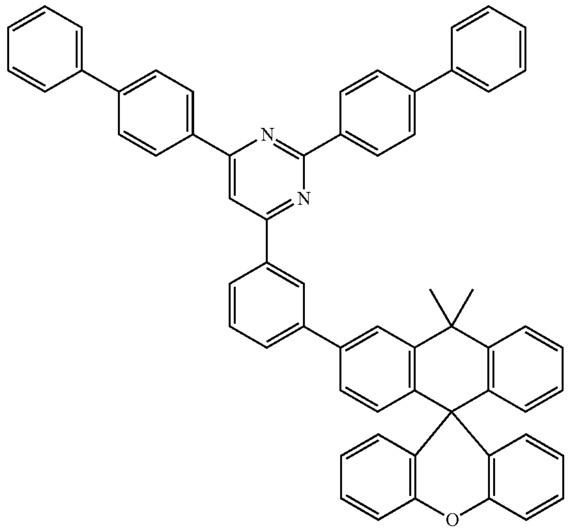
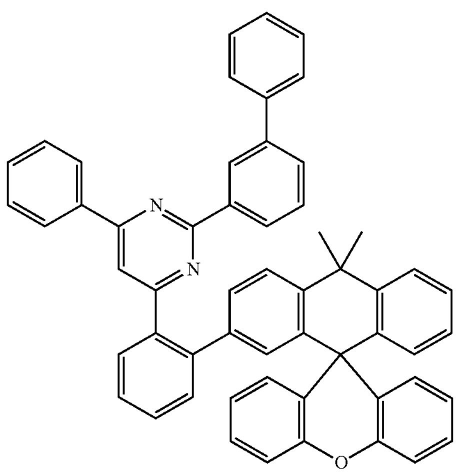
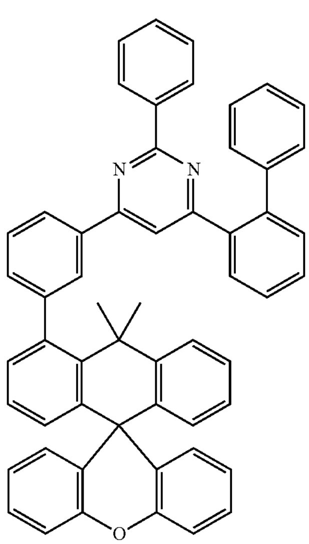
-continued
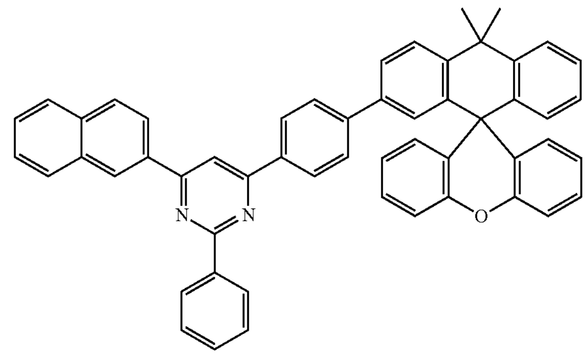
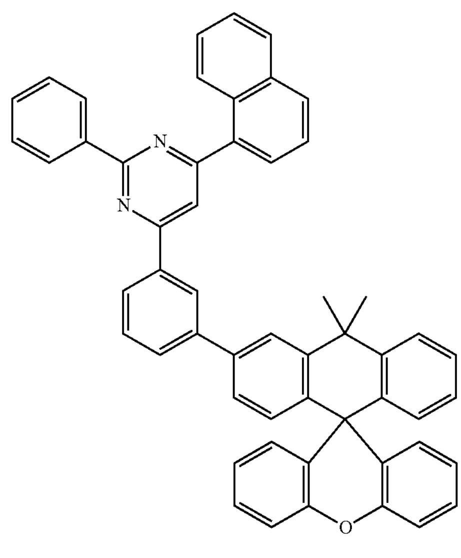
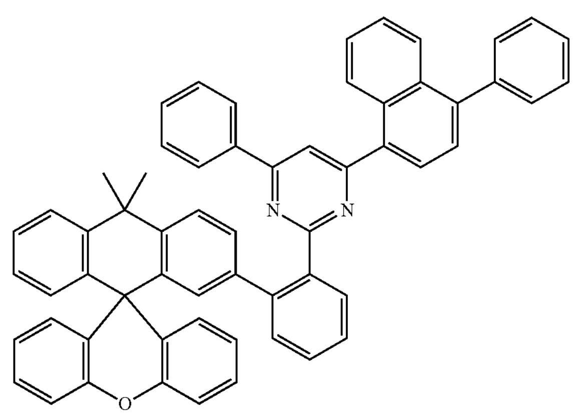

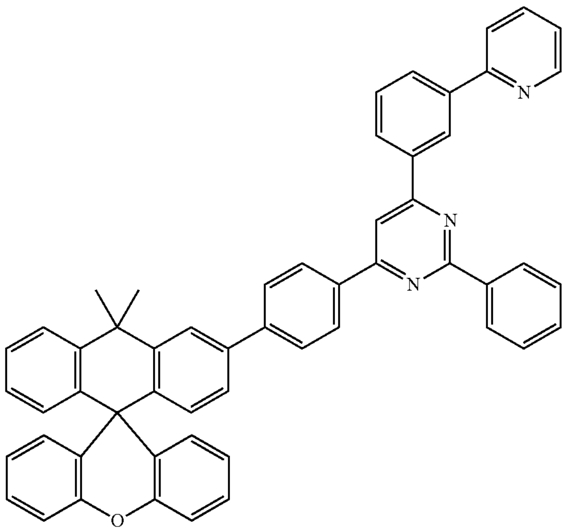
N
N
N
O
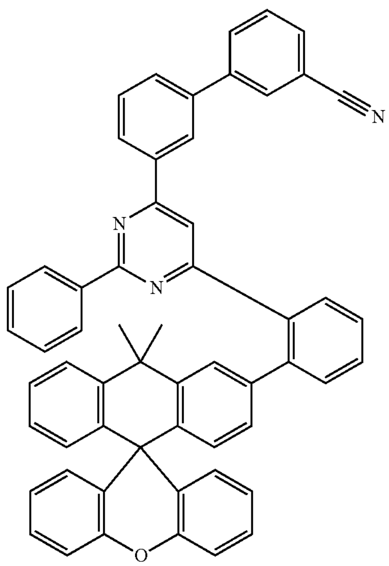
N
N
N
O
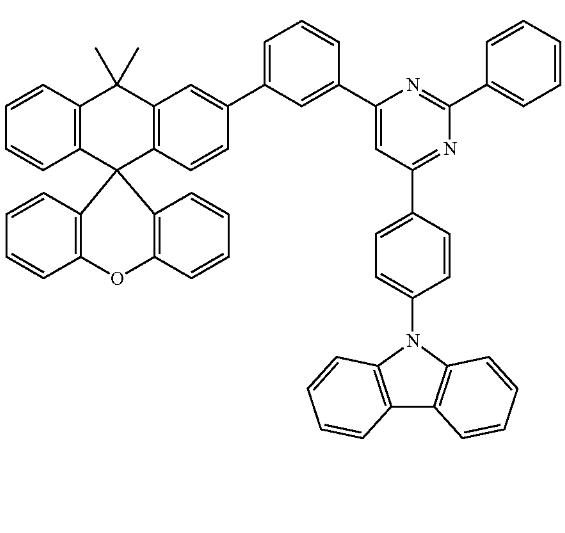
N
N
O
N
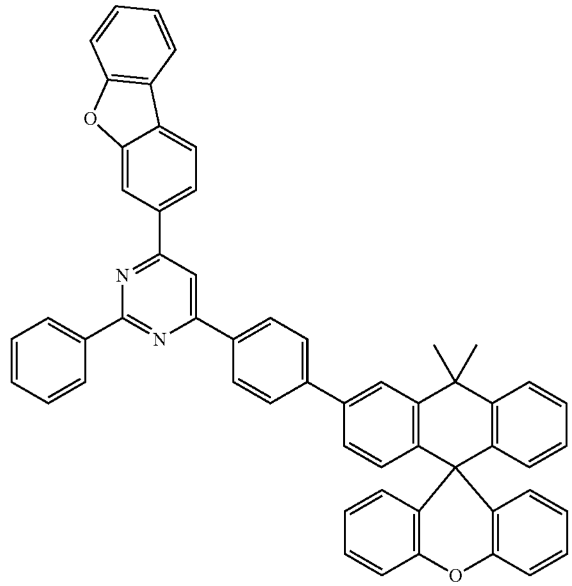
O
N
N
O
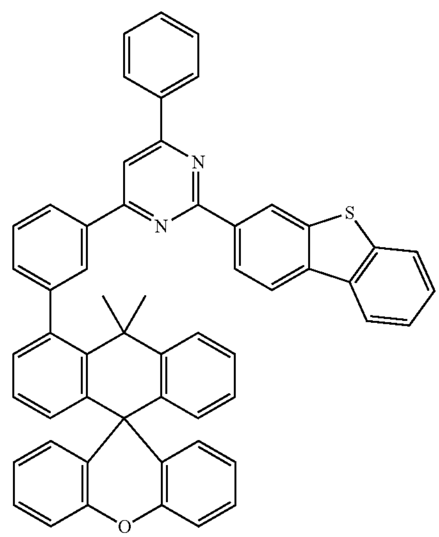
N
N
S
O
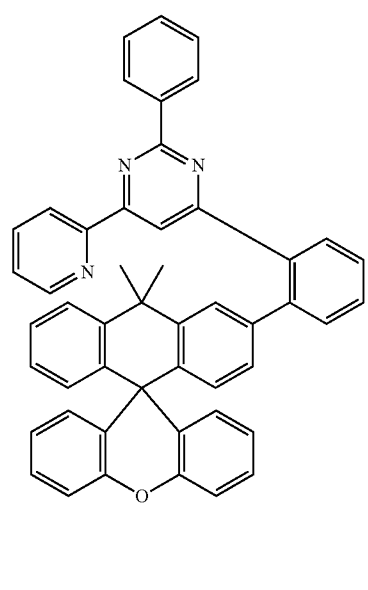
N
N
N
O -continued
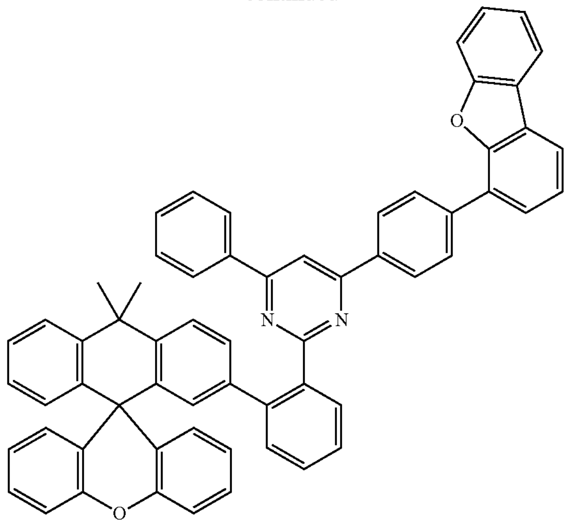
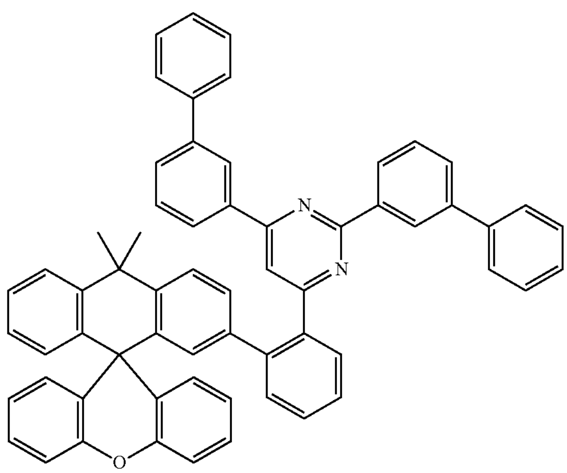
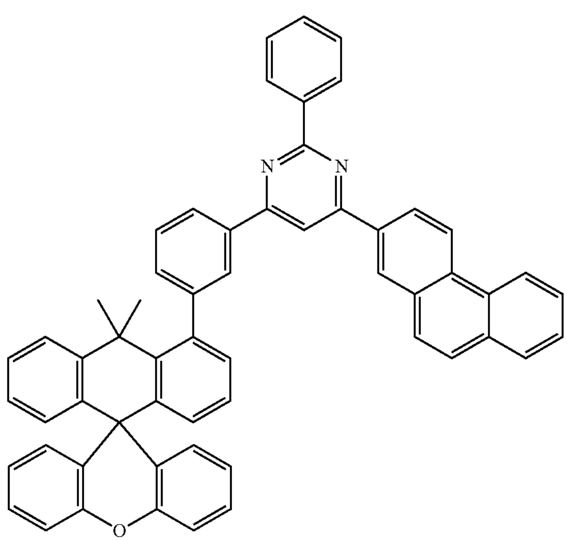
-continued
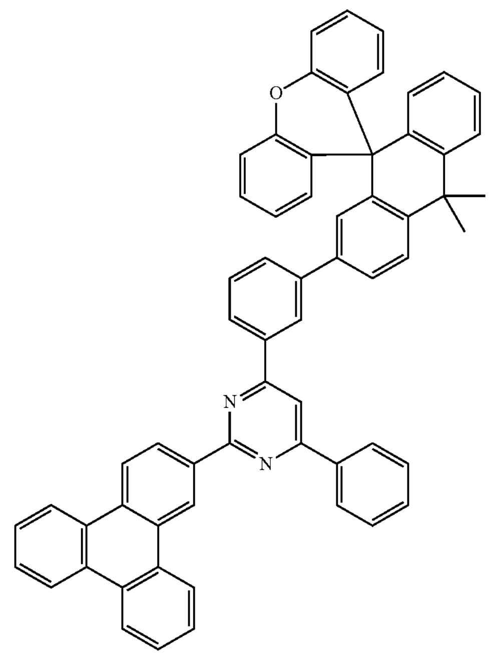
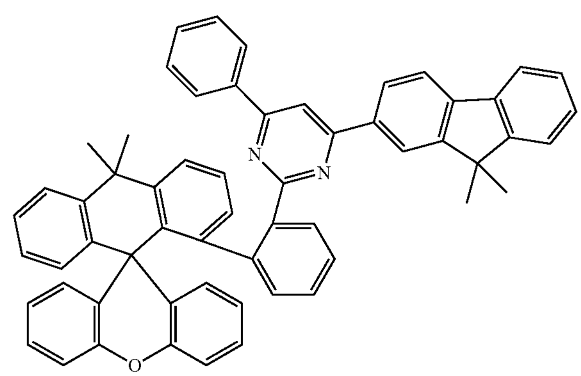
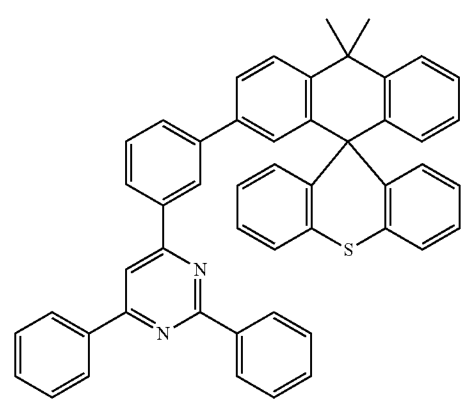

-continued
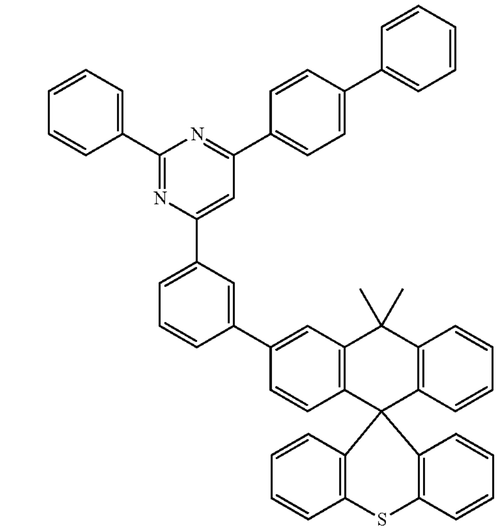
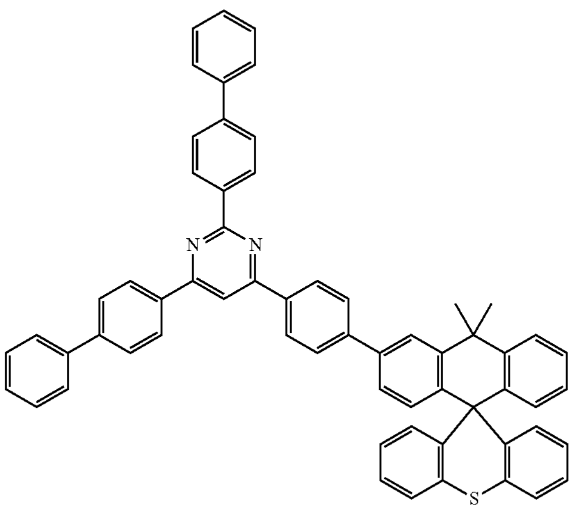
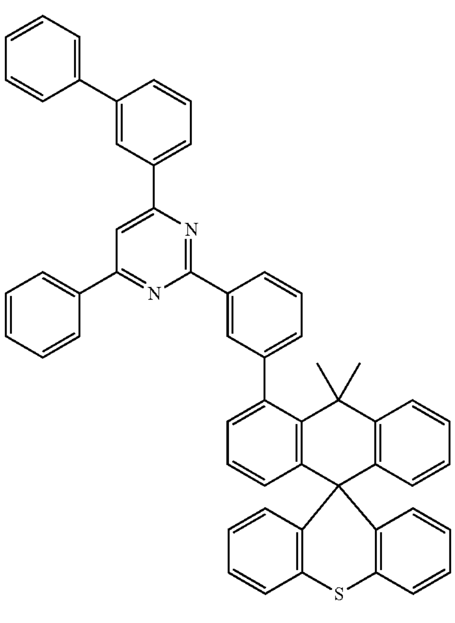
-continued
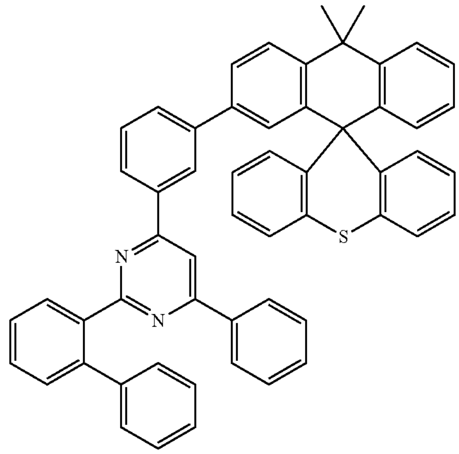
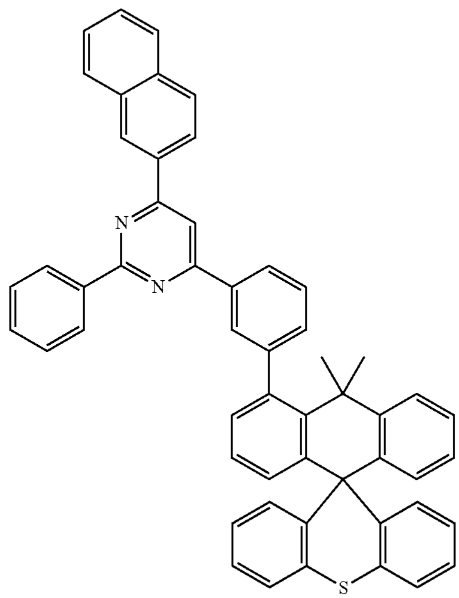
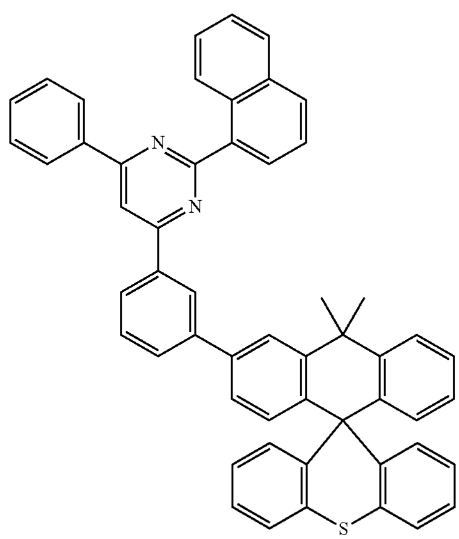

-continued
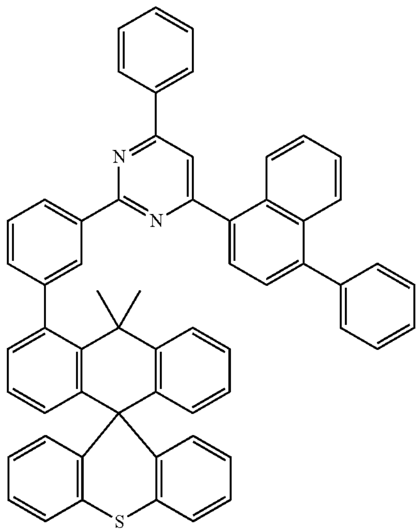
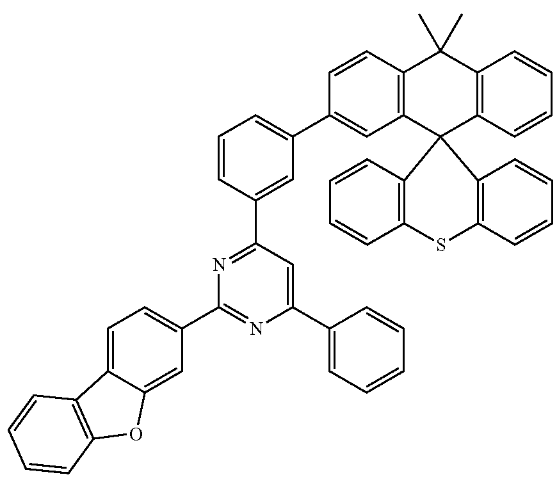
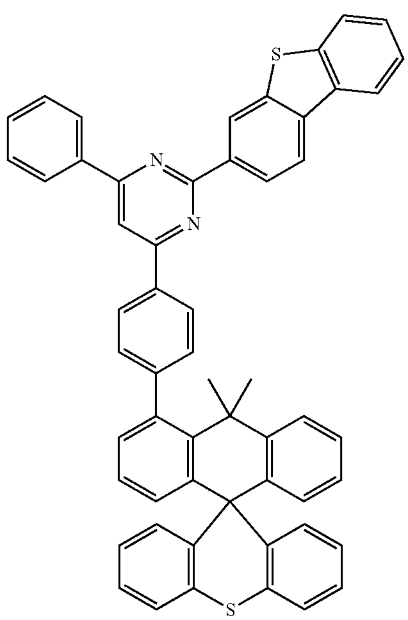
-continued
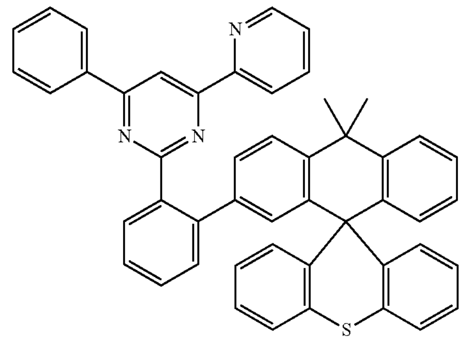
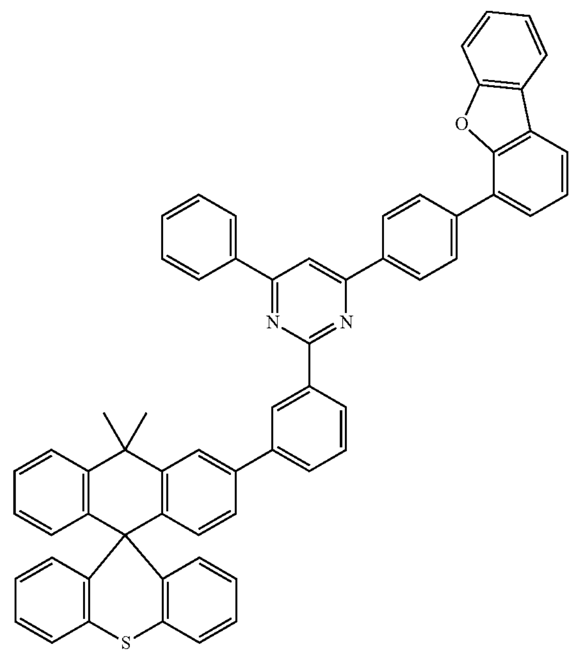
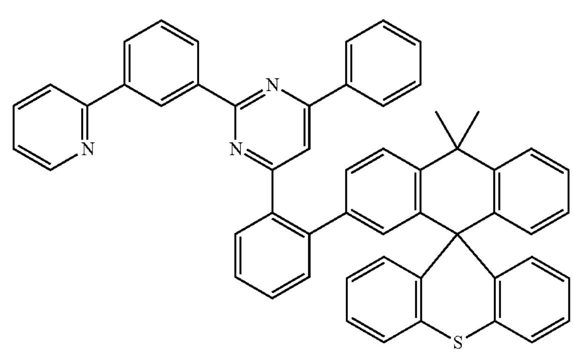

-continued
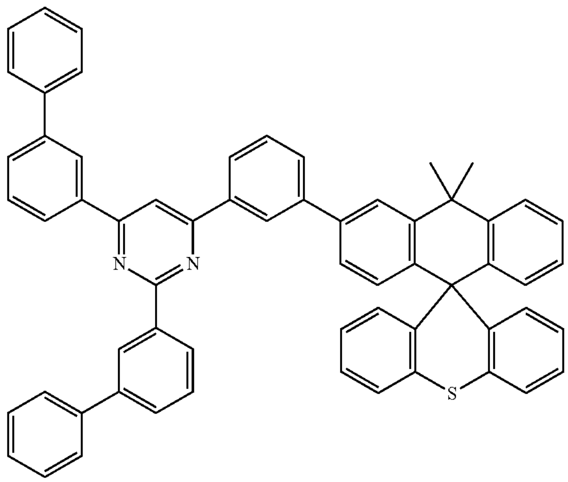
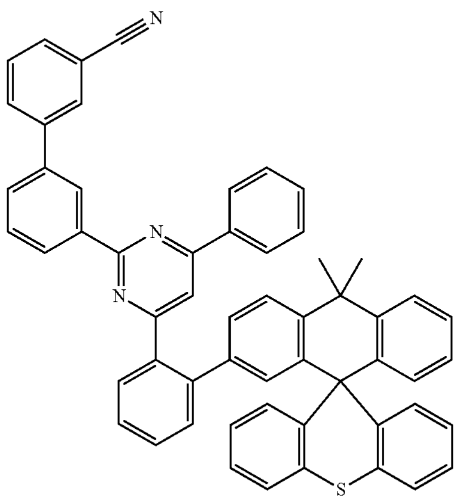
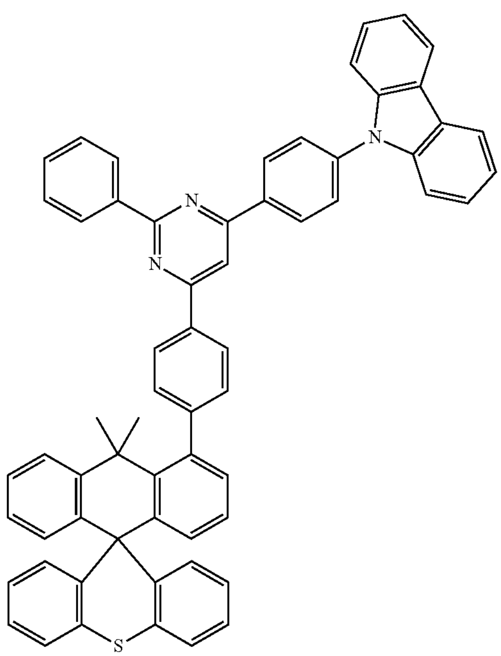
-continued
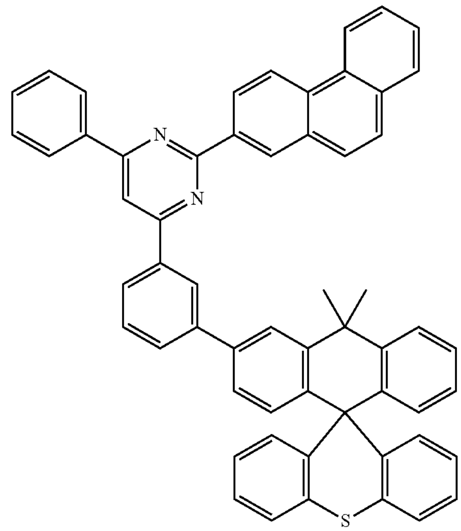
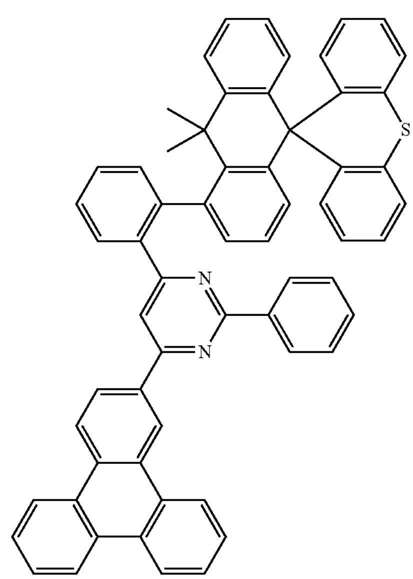

-continued
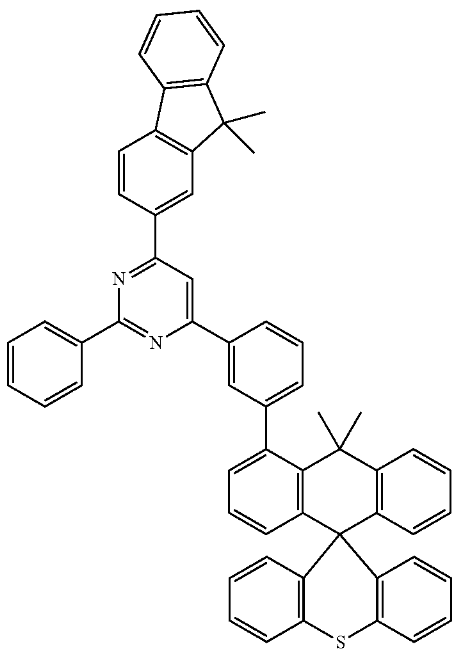
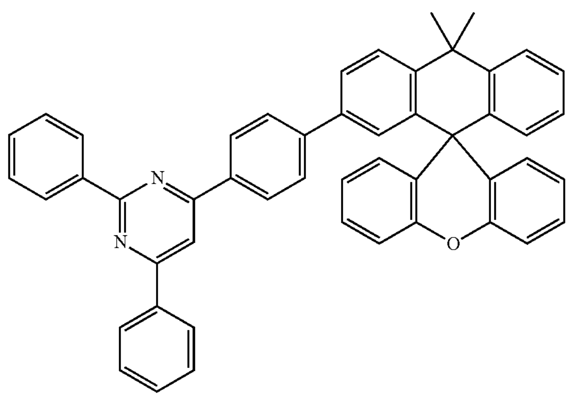
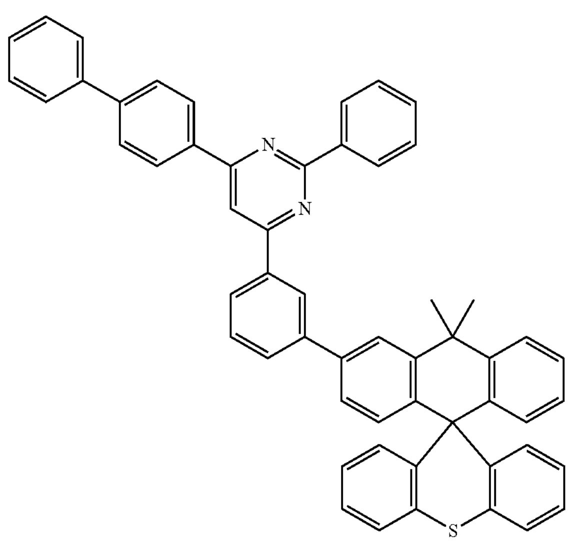
-continued
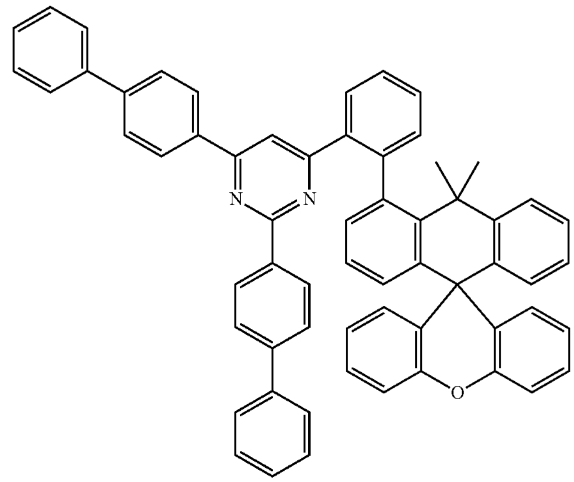
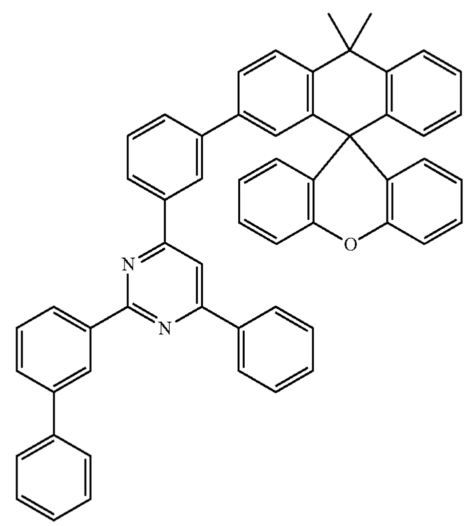
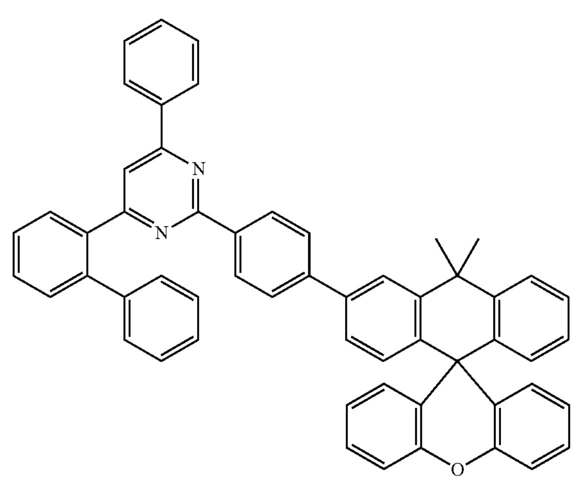

-continued
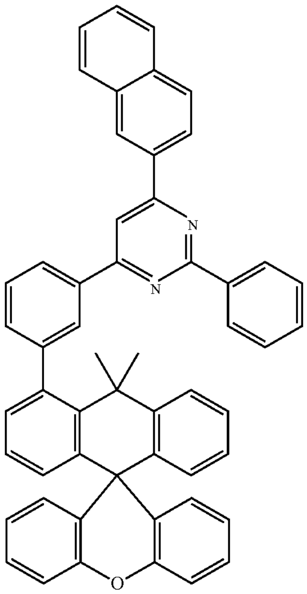
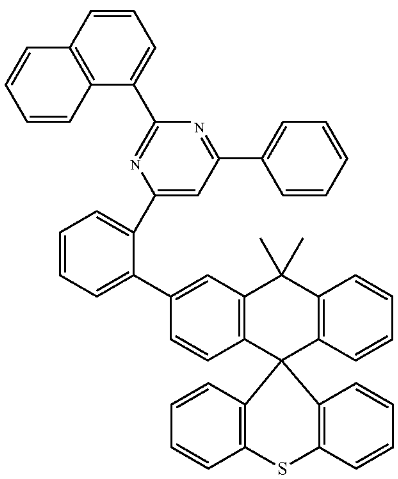
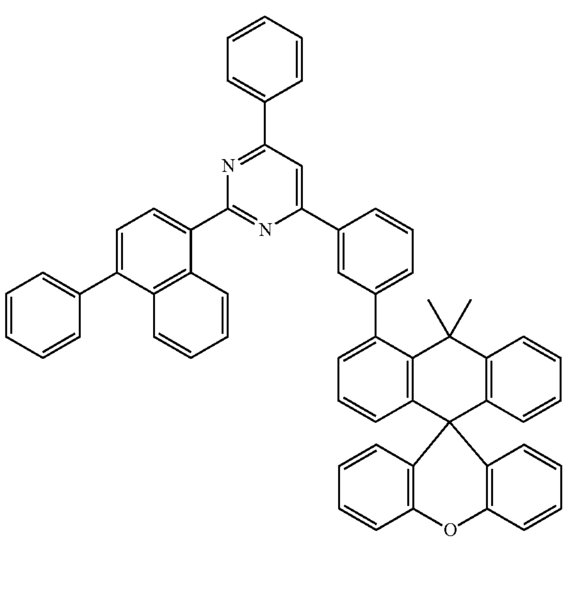
-continued
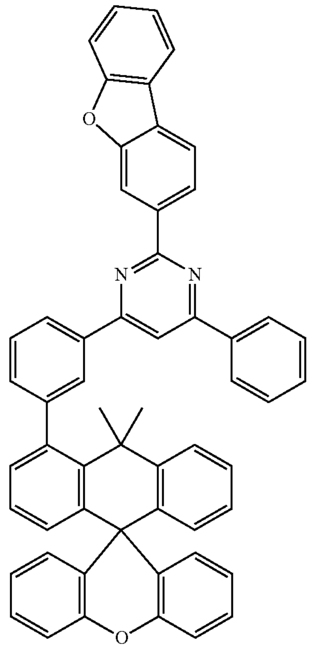
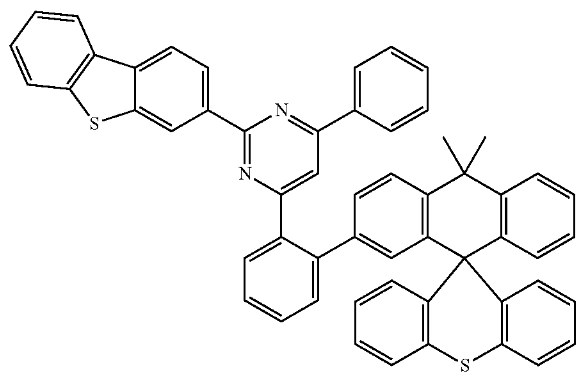
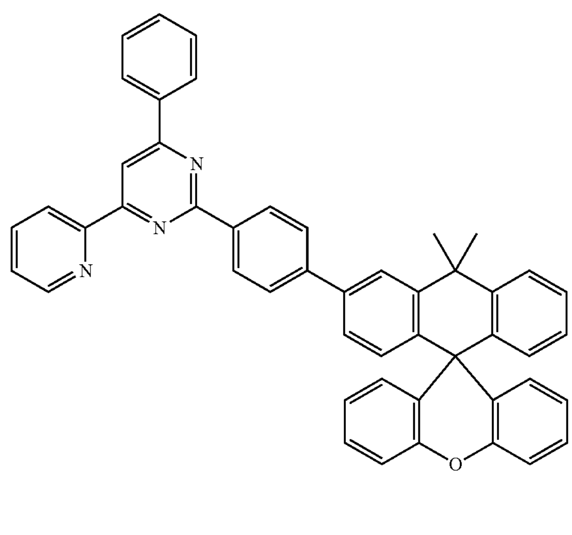

-continued
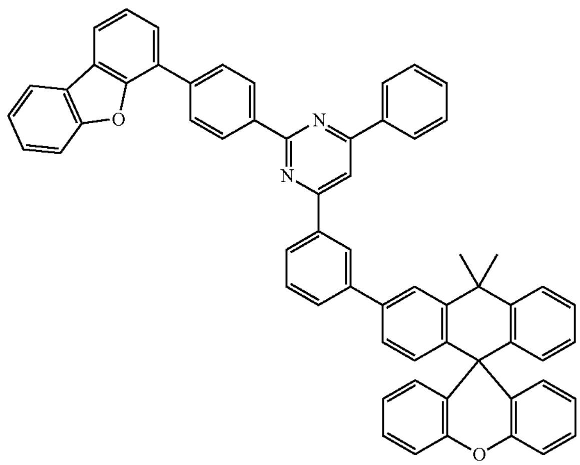
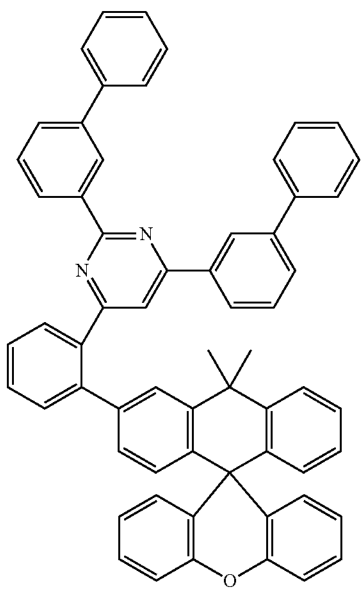
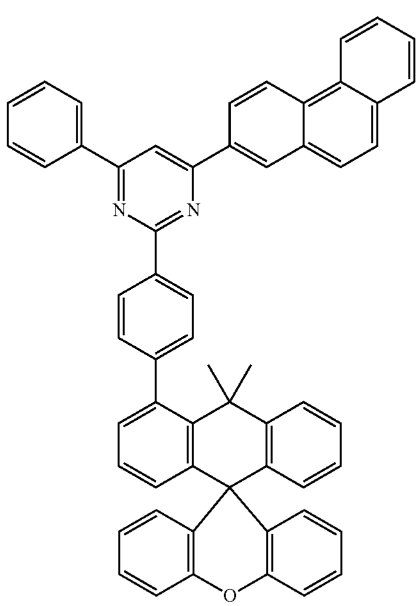
-continued
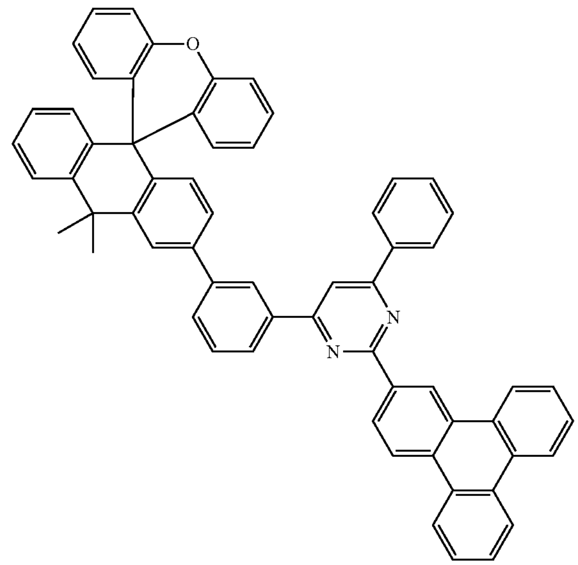
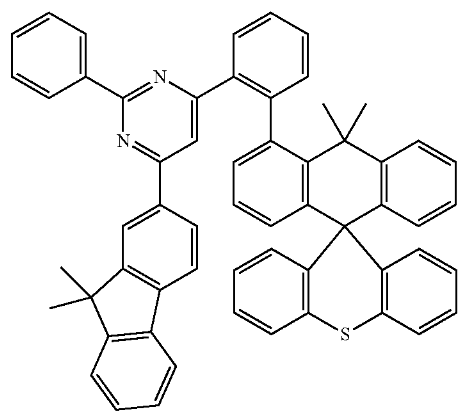
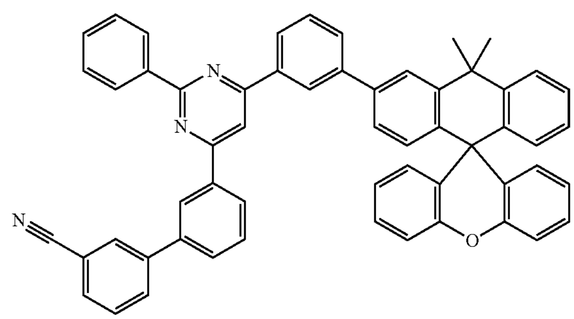
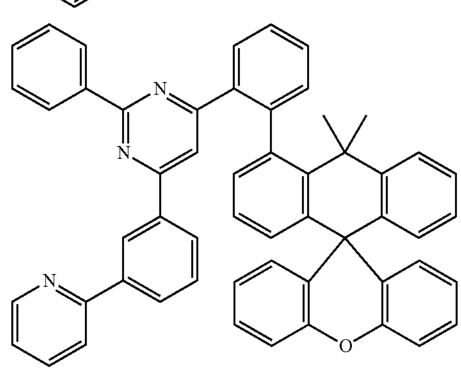

-continued
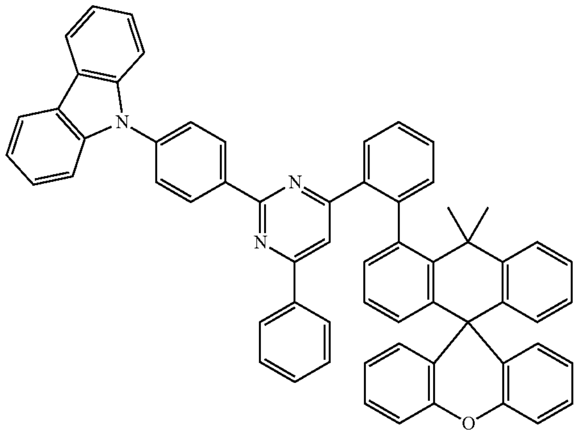
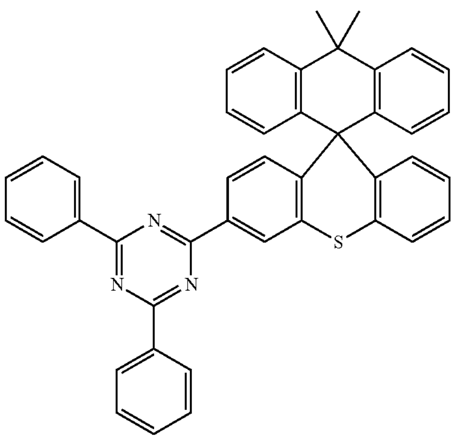
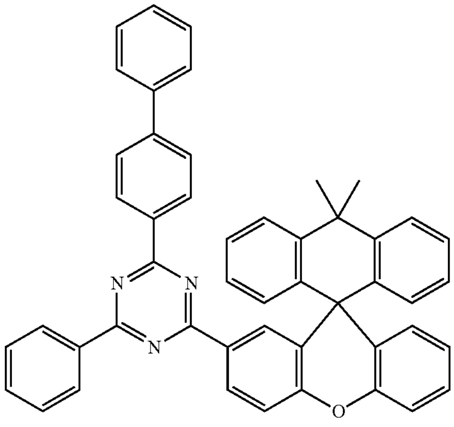
-continued
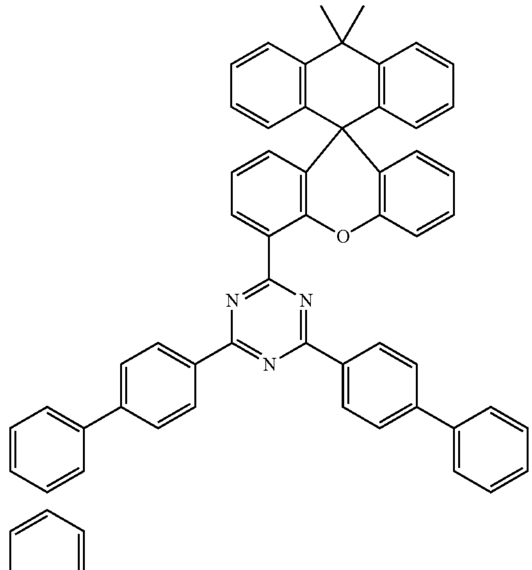
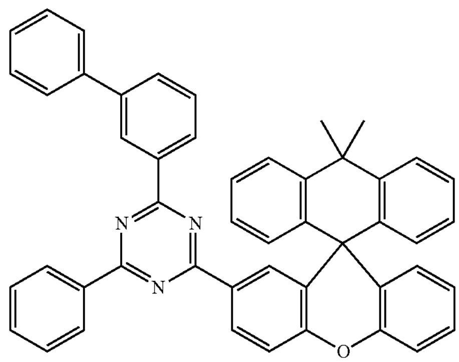
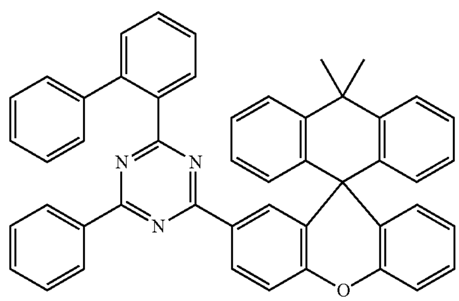
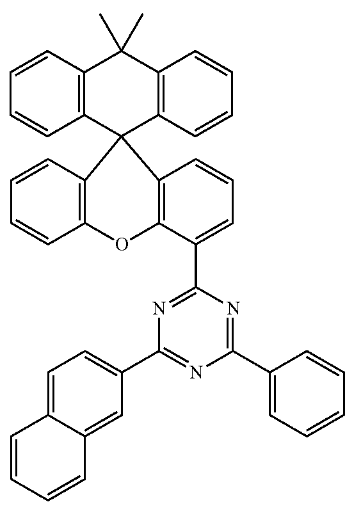

-continued
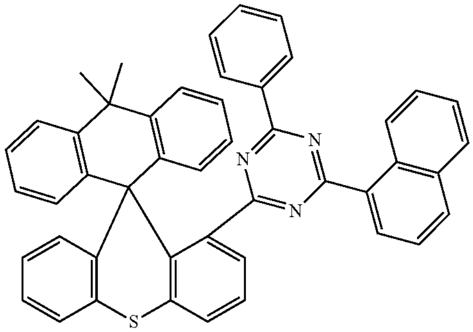
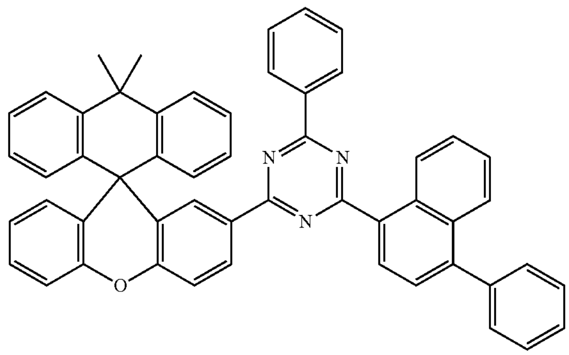
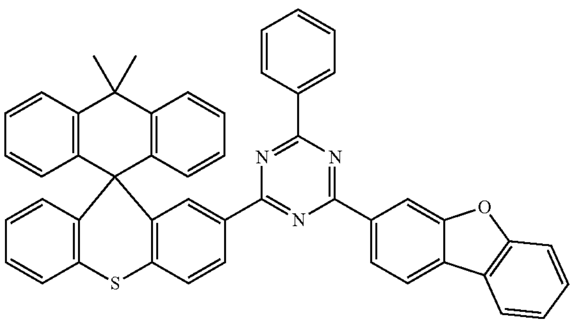
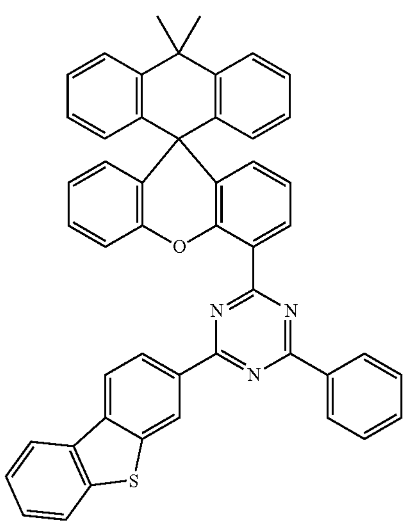
-continued
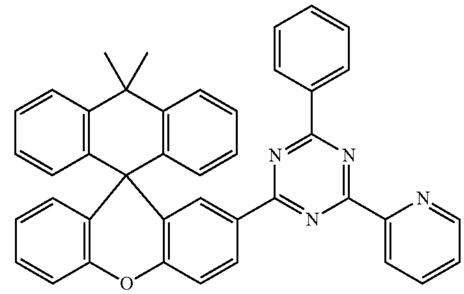
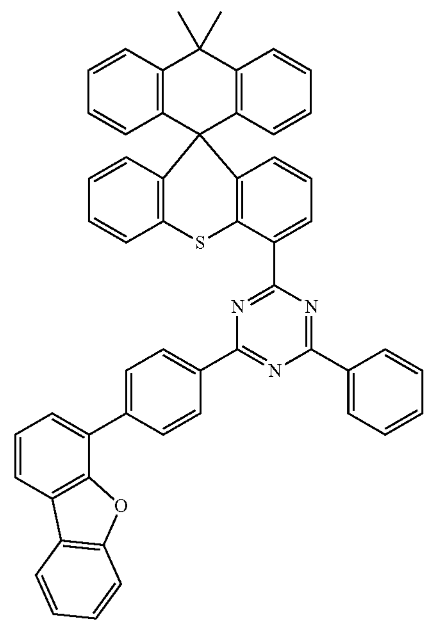
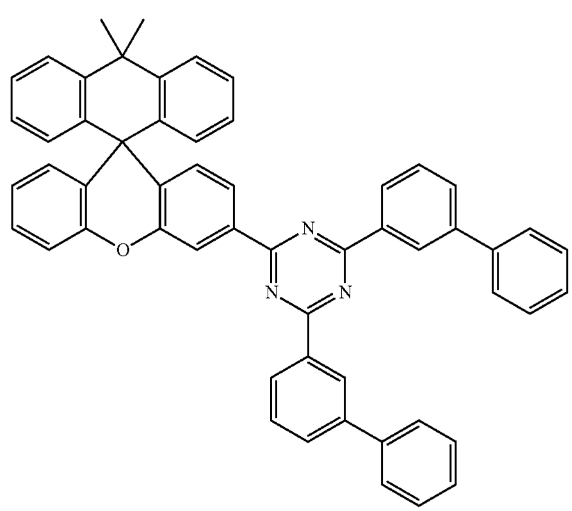

-continued
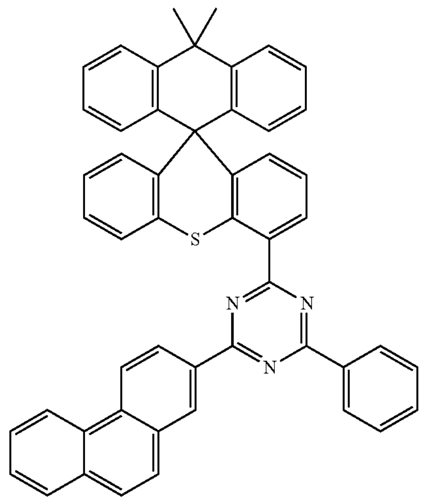
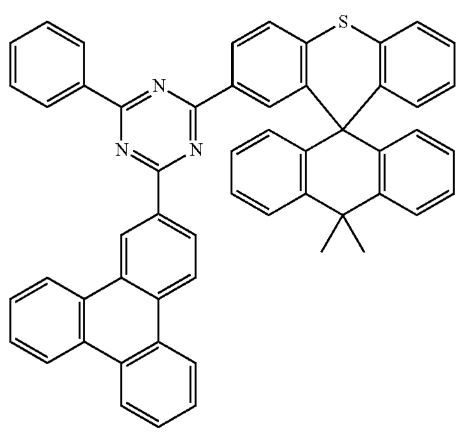
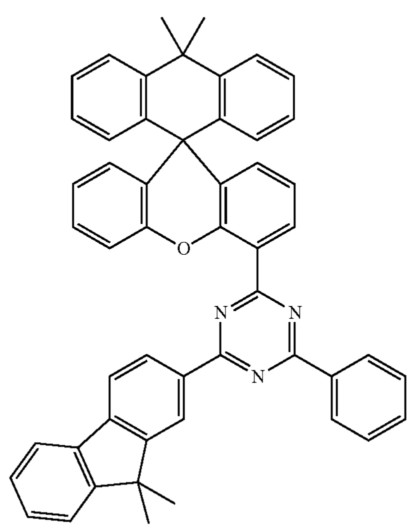
-continued
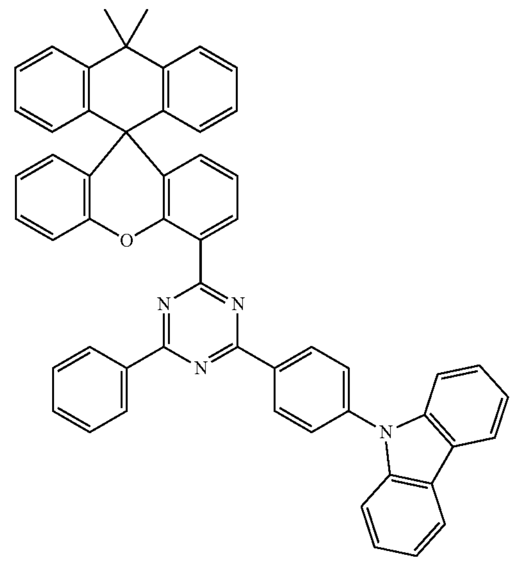
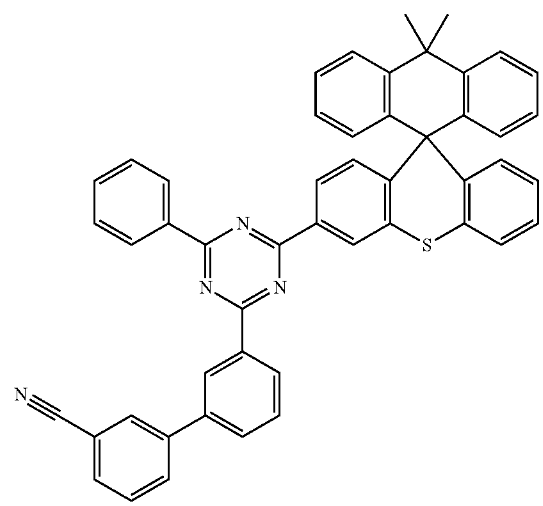
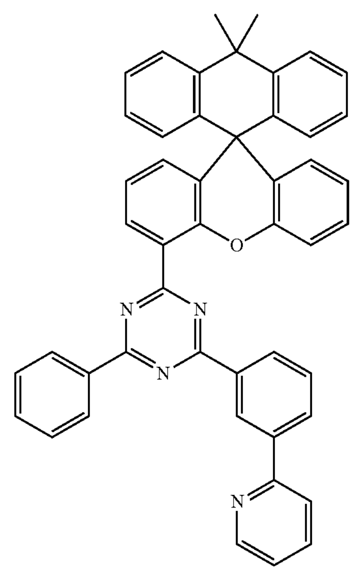

-continued
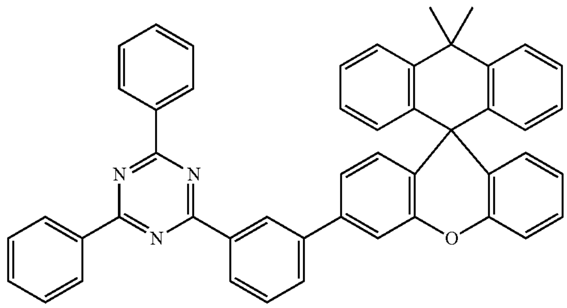
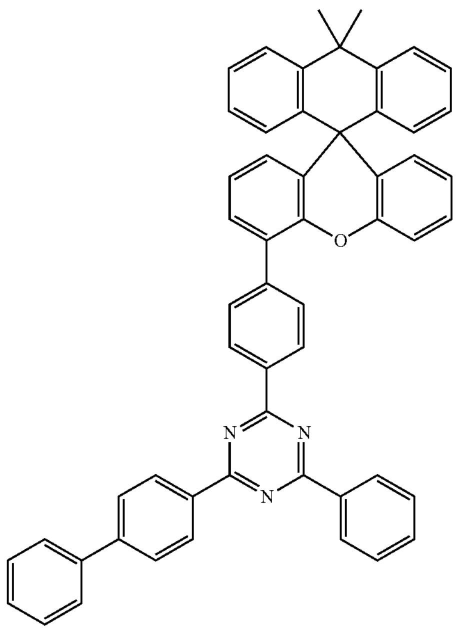
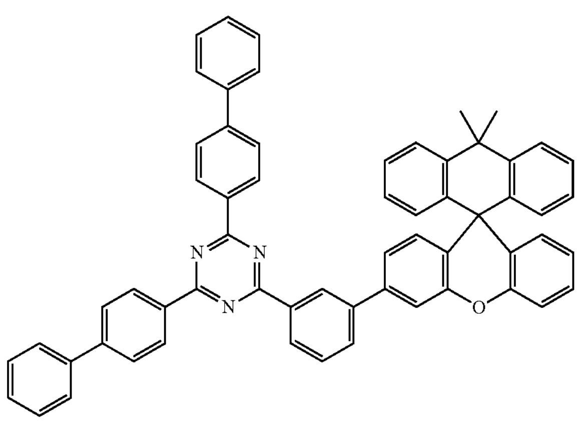
-continued
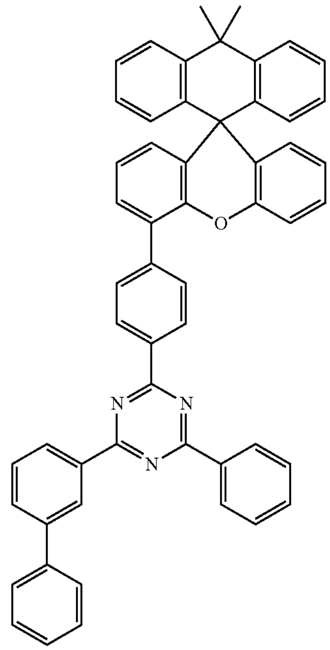
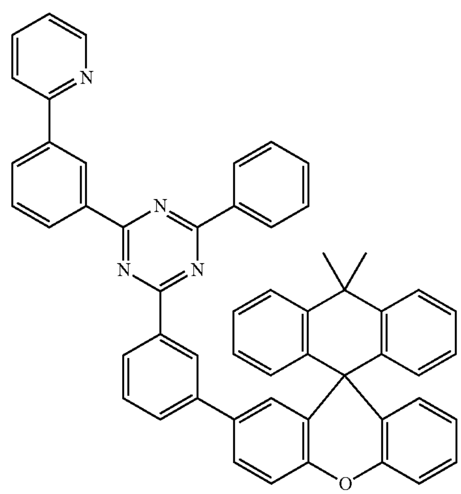
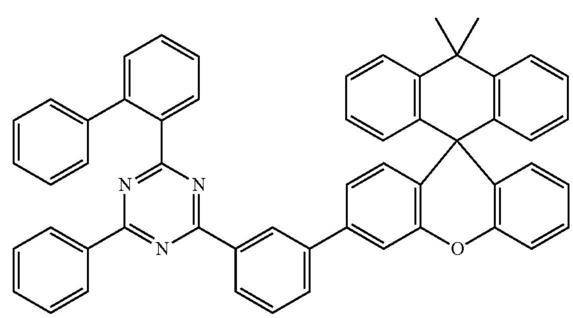

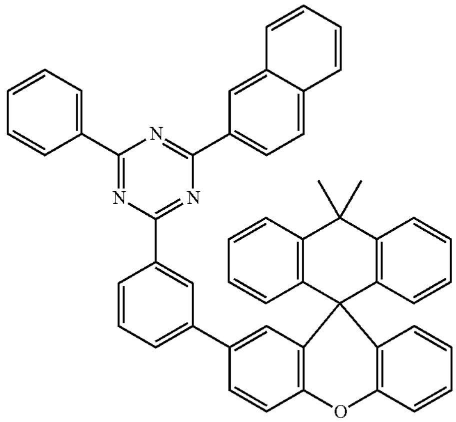
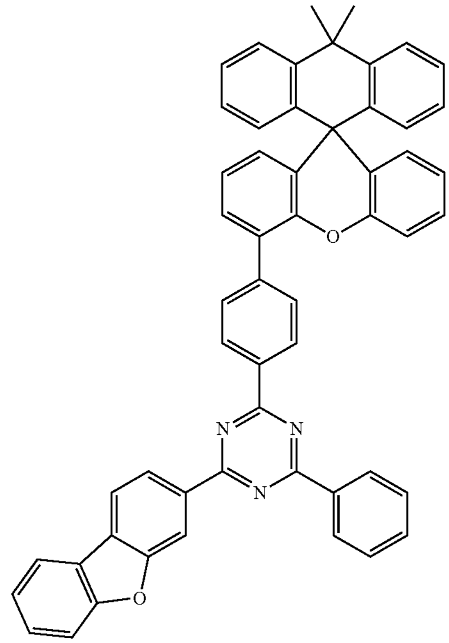
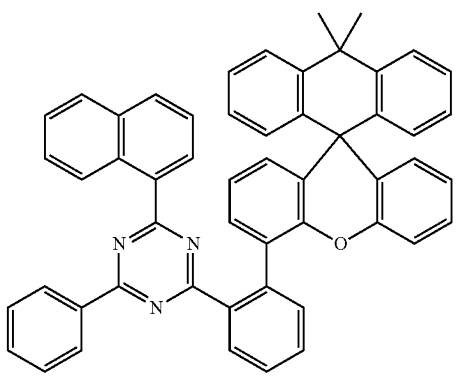
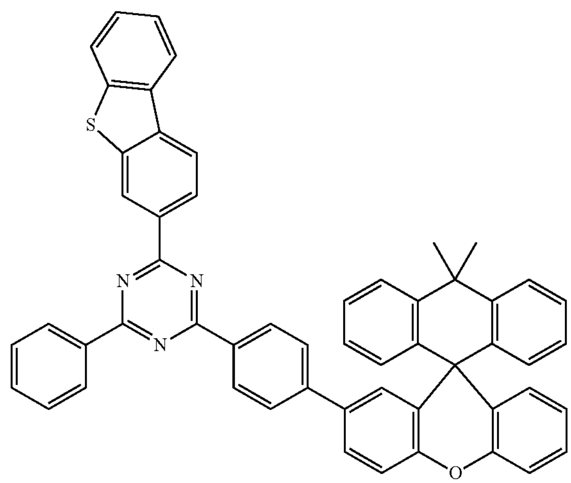
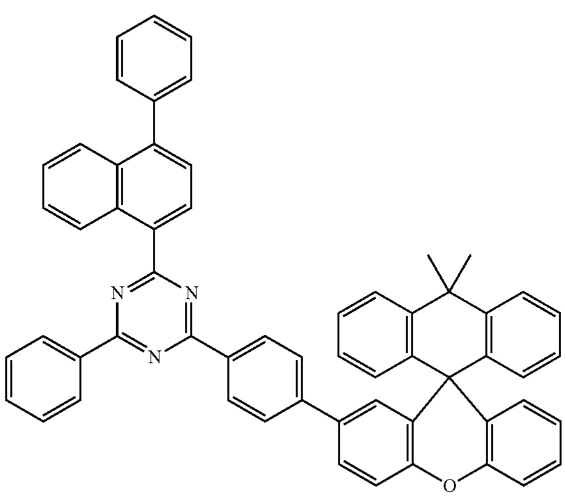
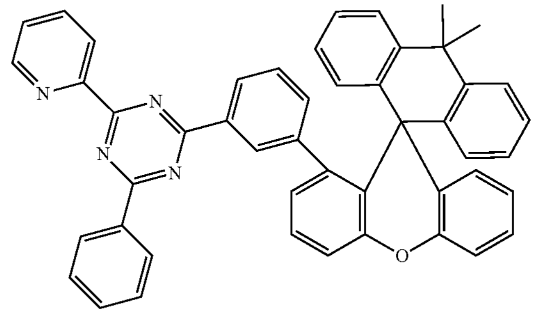

-continued
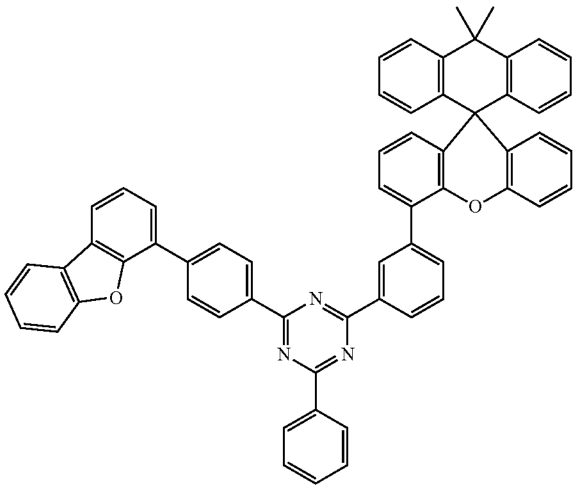
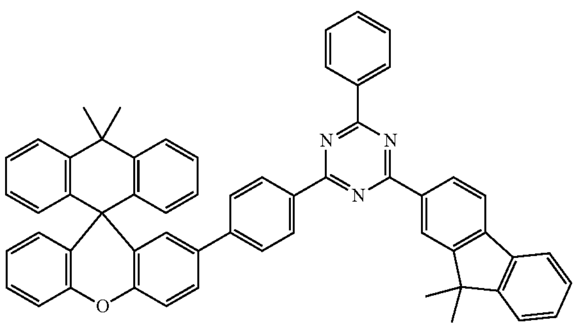
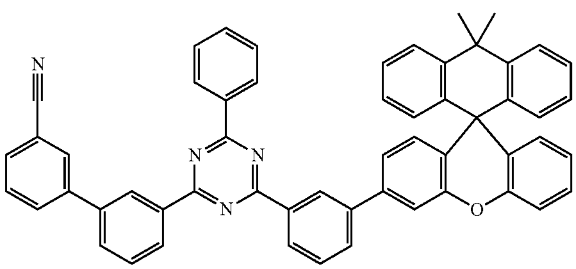
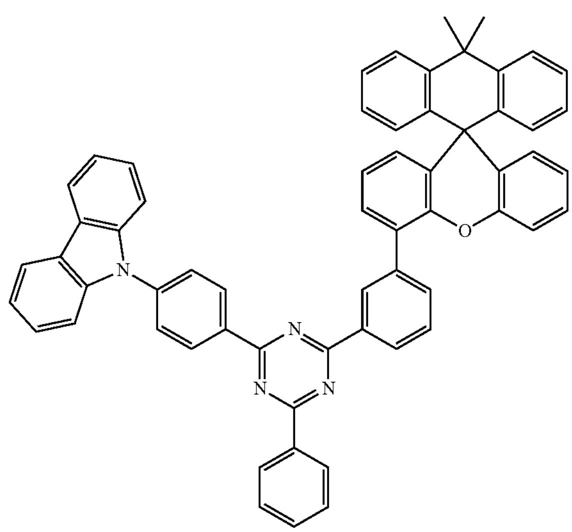
-continued
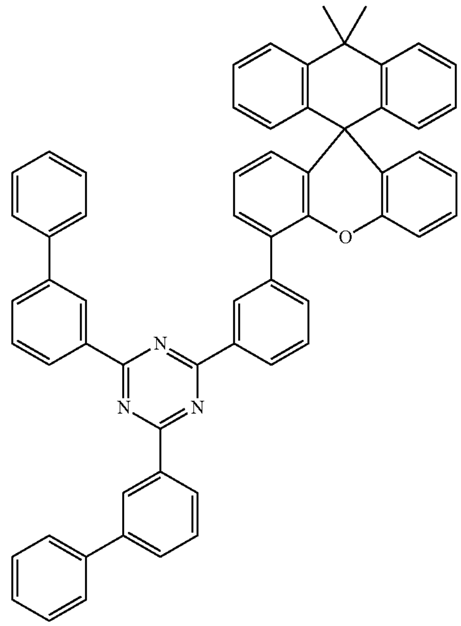
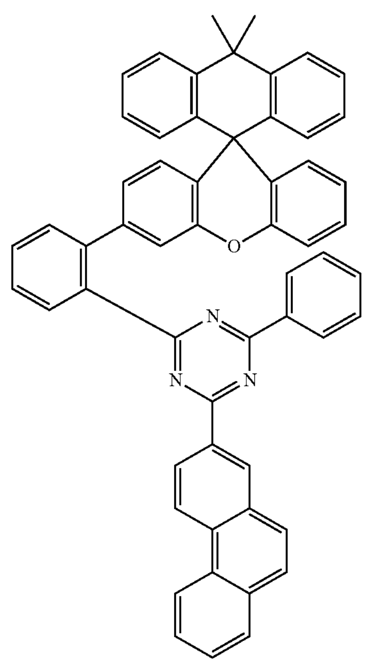

-continued
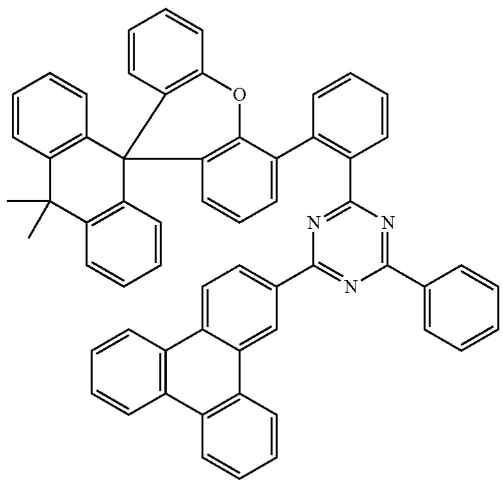
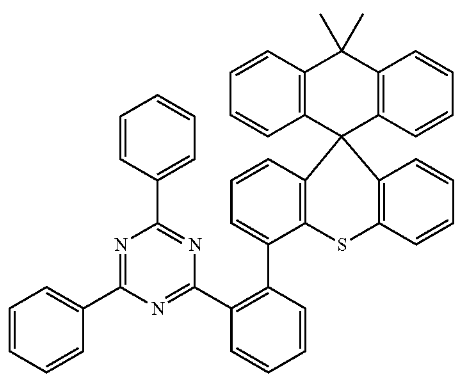
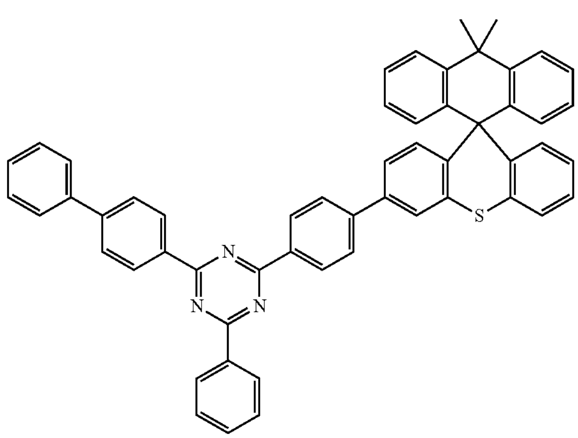
-continued
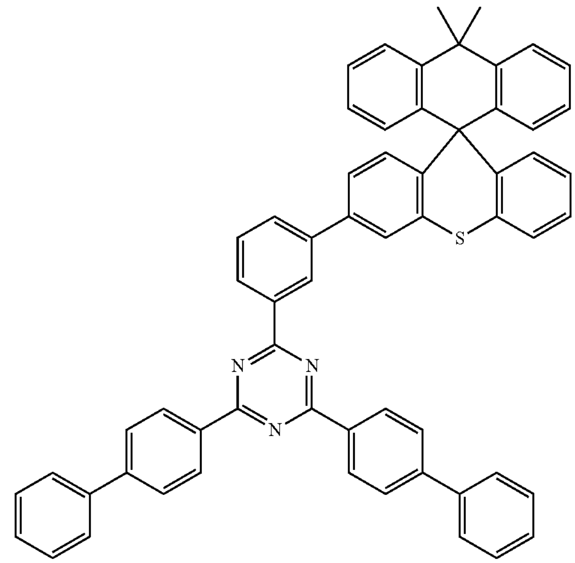
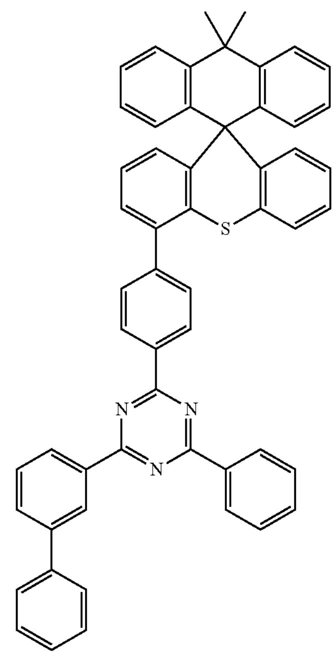
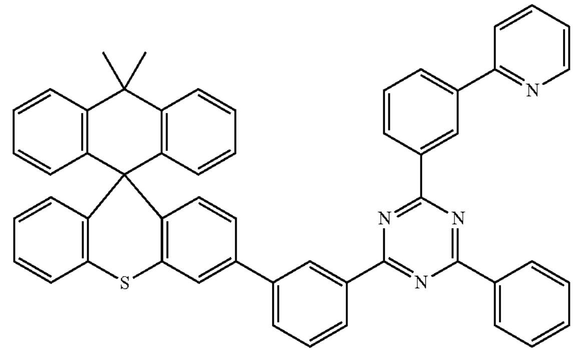

-continued
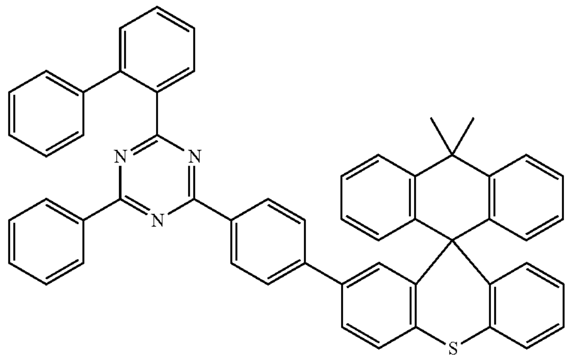
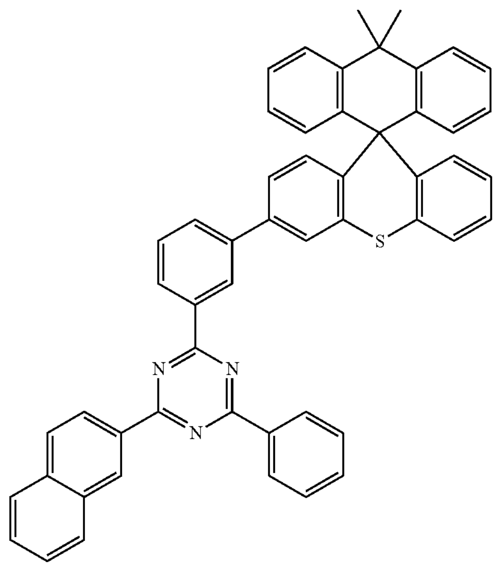
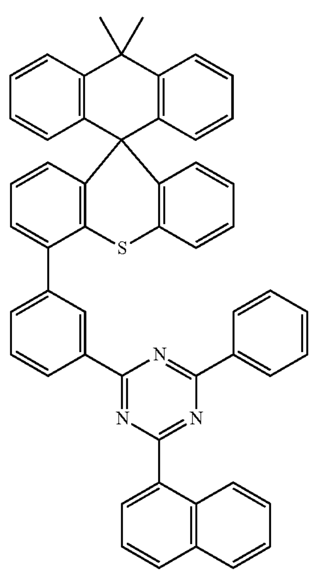
-continued
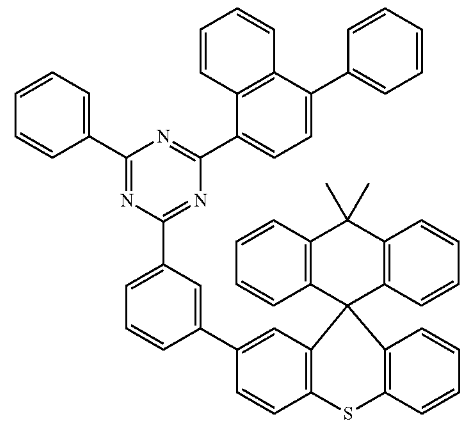
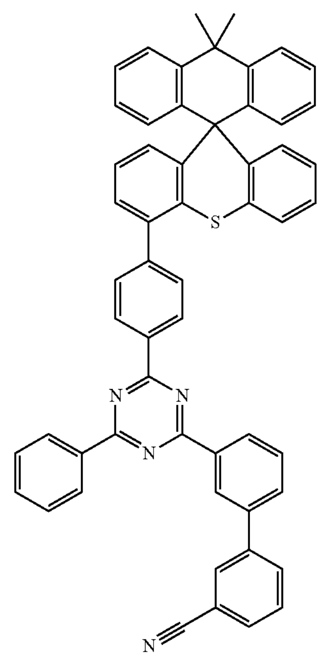
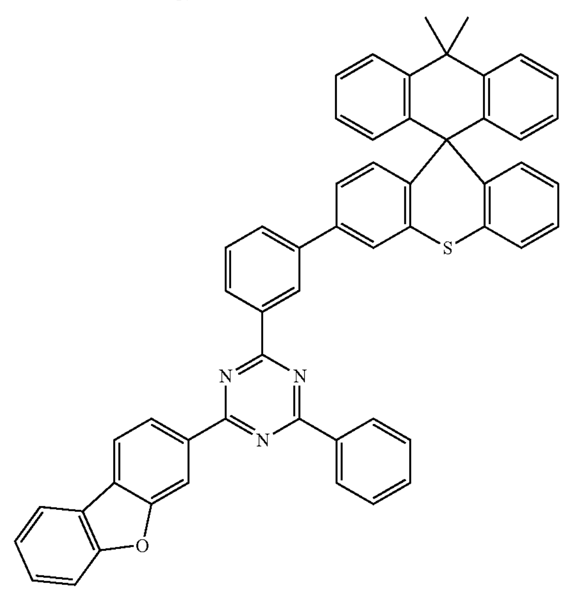

-continued
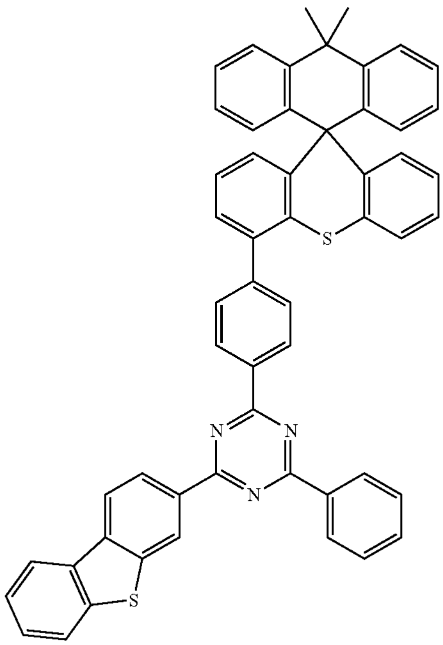
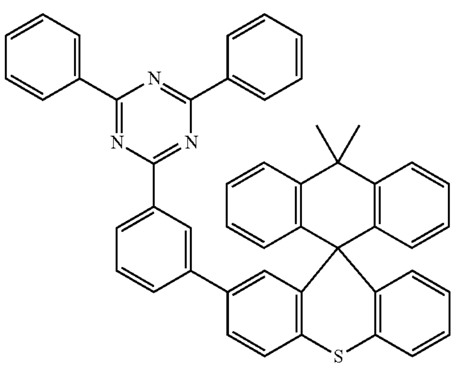
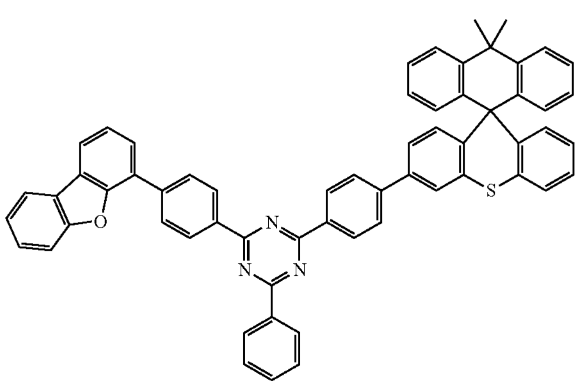
-continued
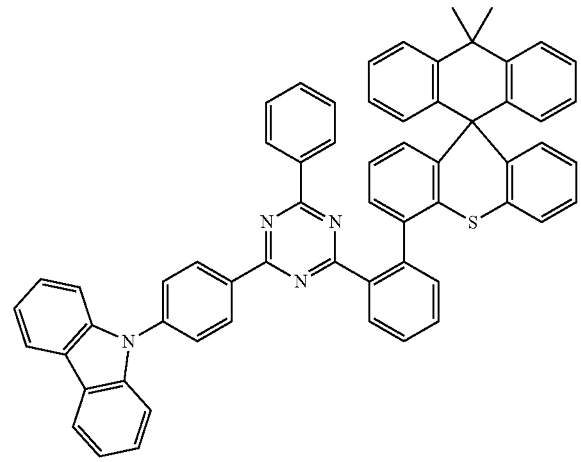
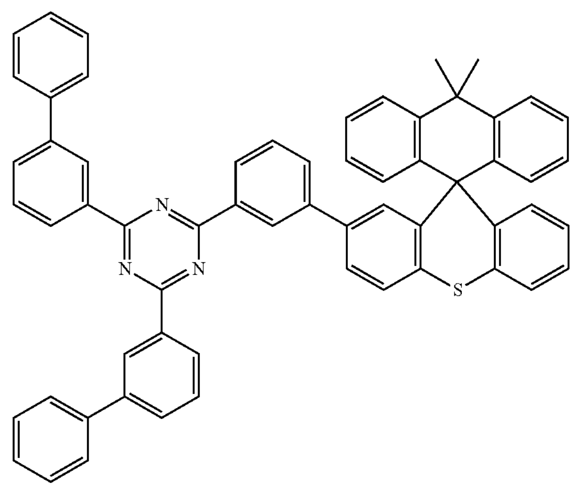
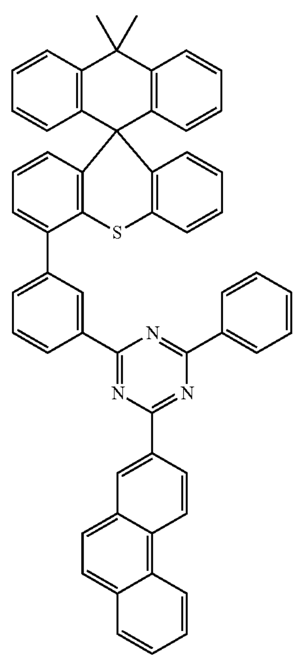

-continued
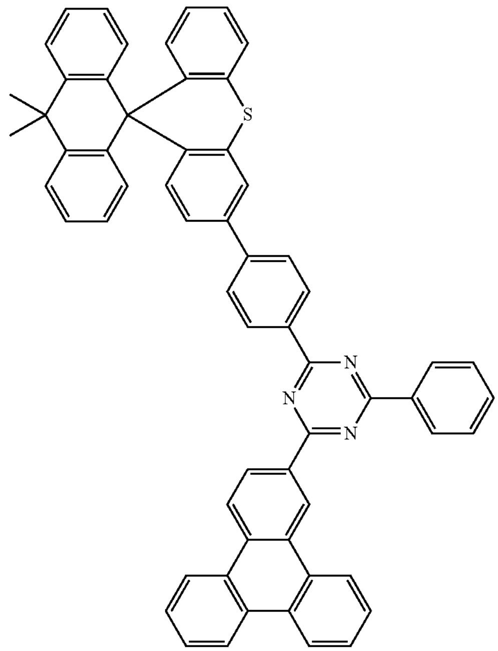
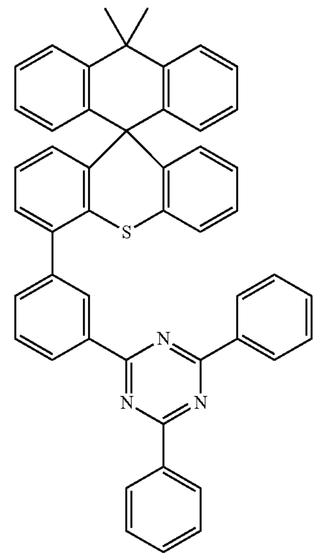
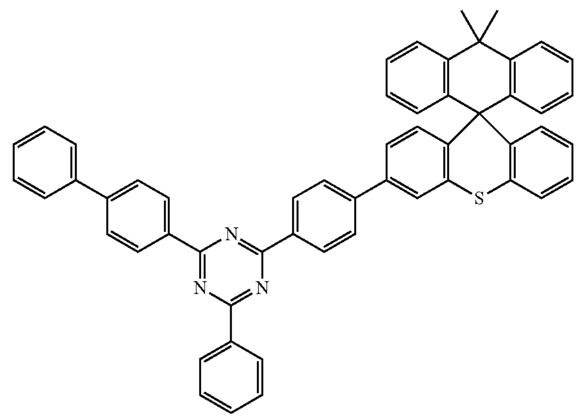
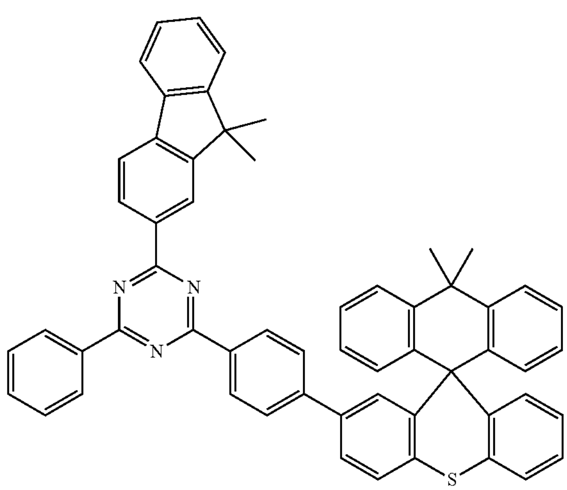
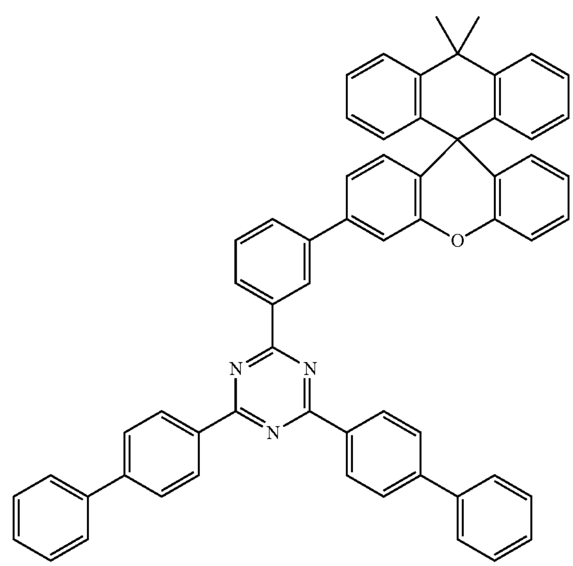

-continued
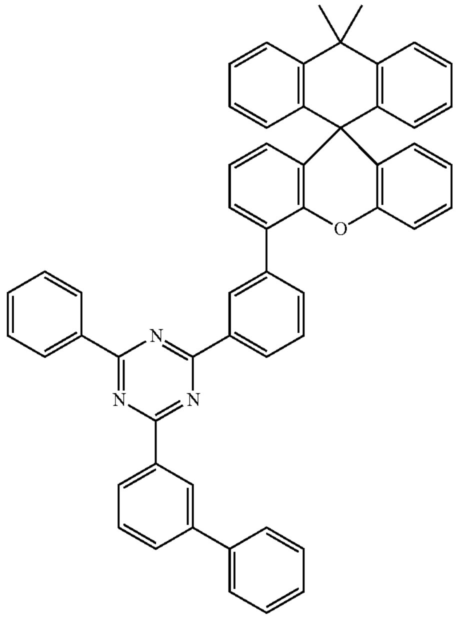
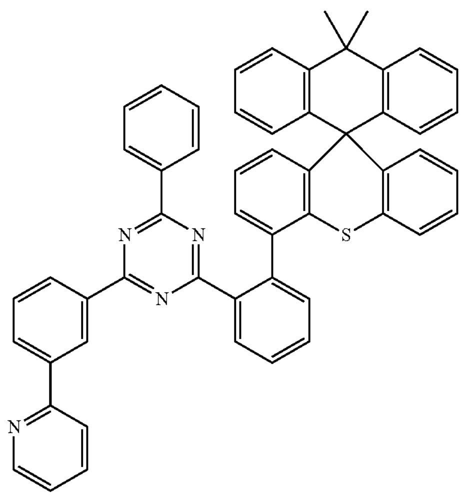
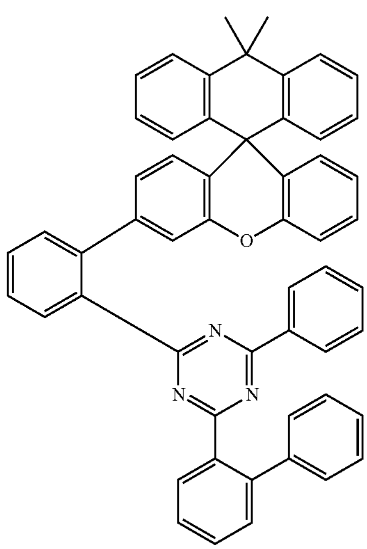
-continued
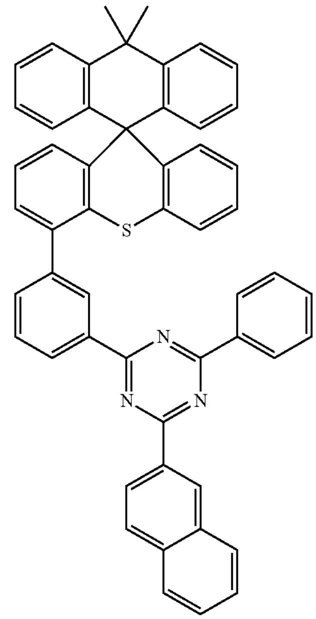
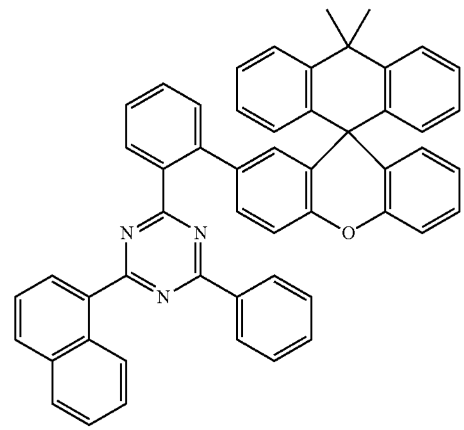
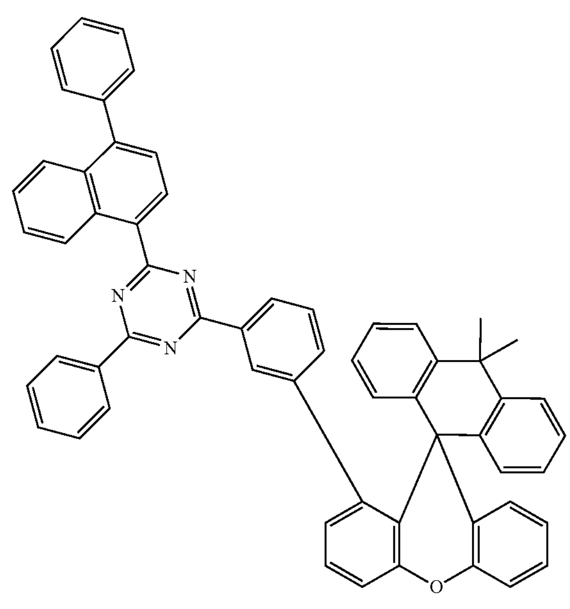

-continued
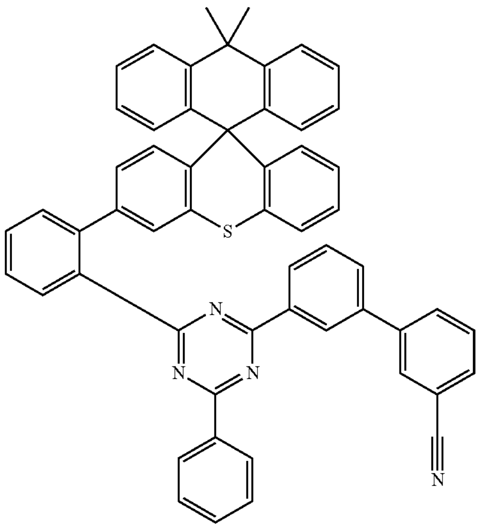
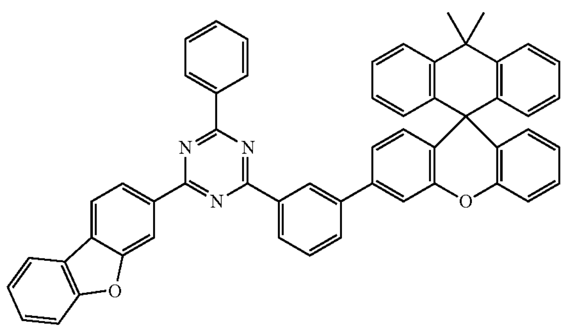
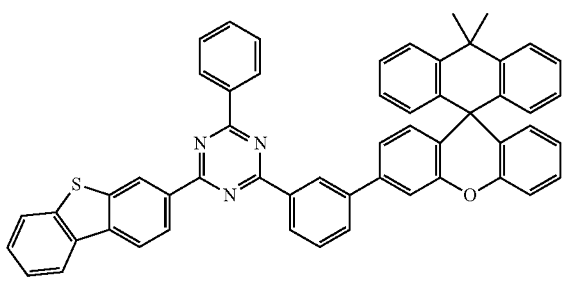
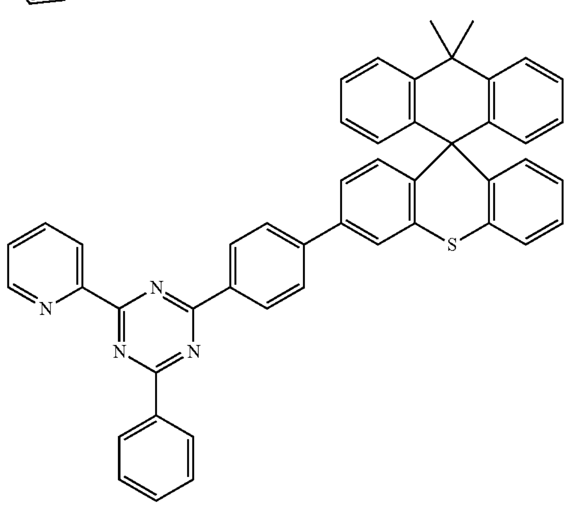
-continued
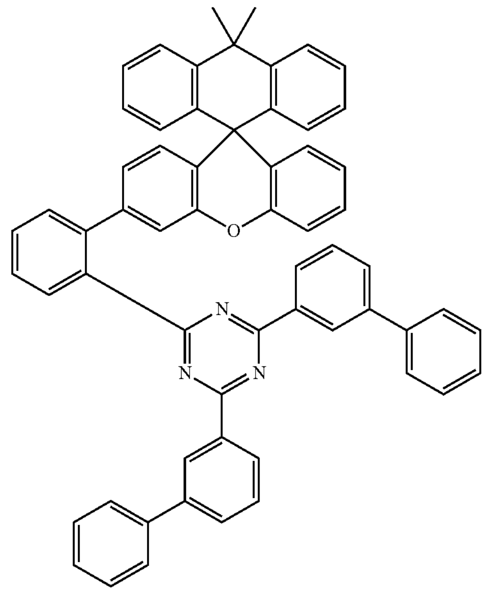
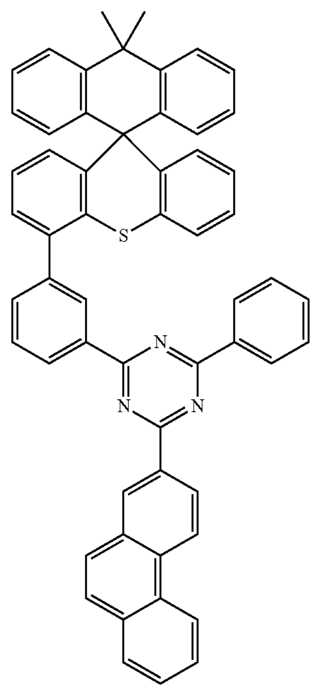
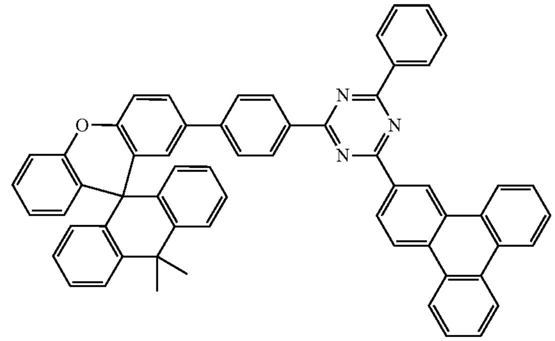

-continued
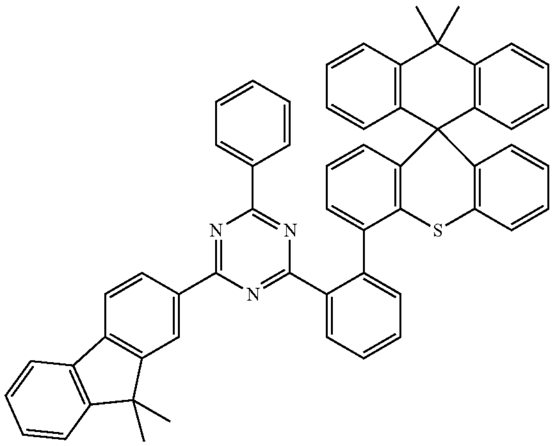
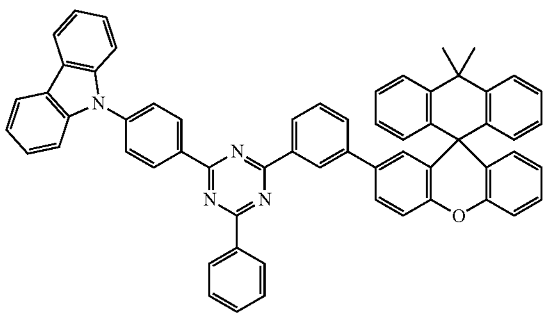
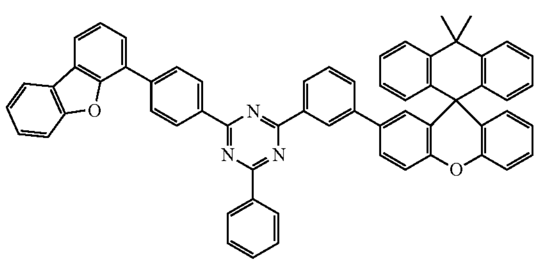
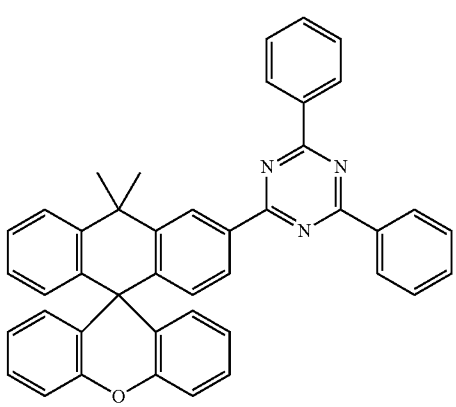
-continued
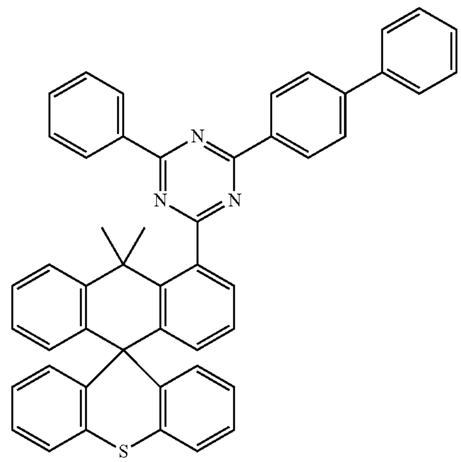
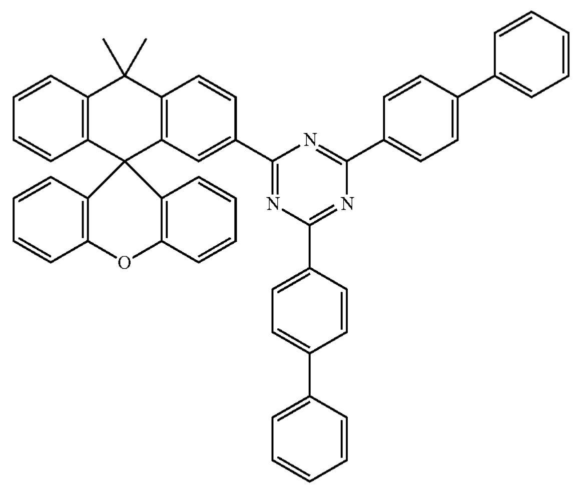
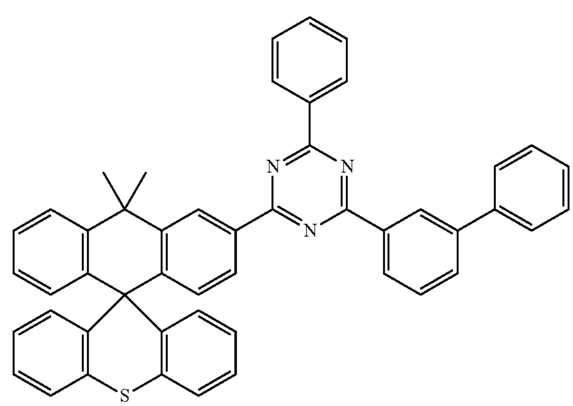

-continued
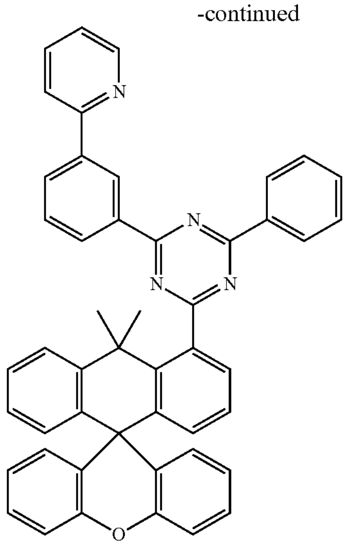
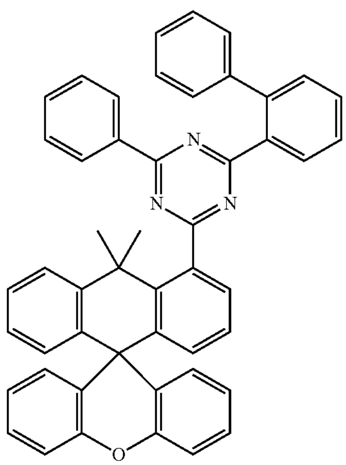
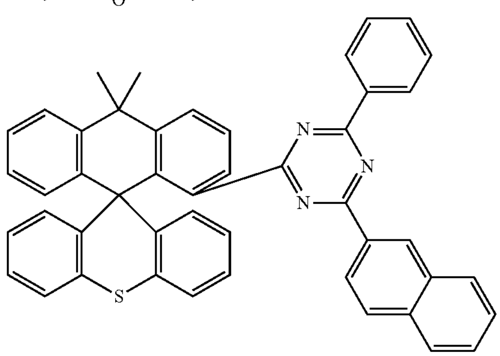
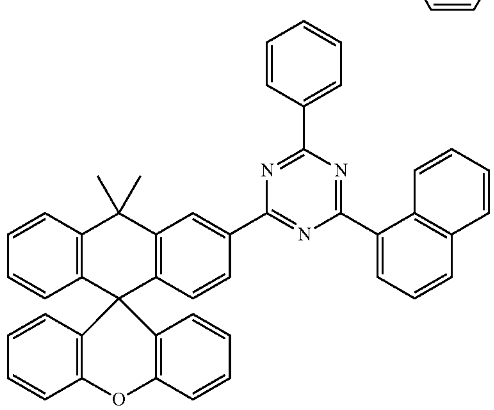
-continued
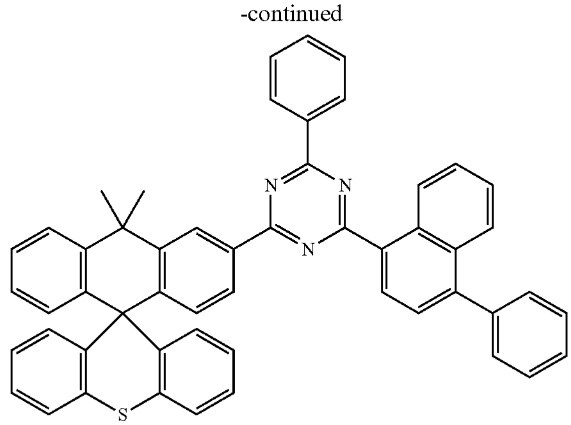
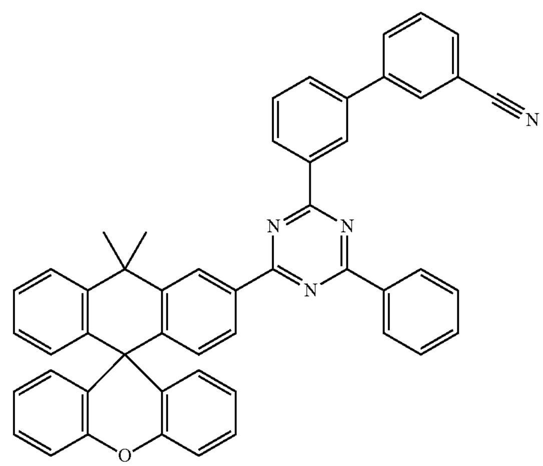
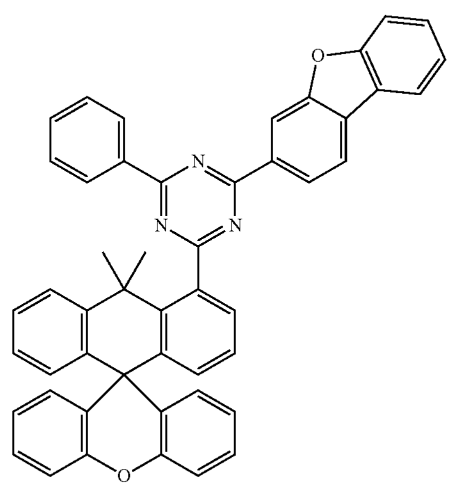

-continued
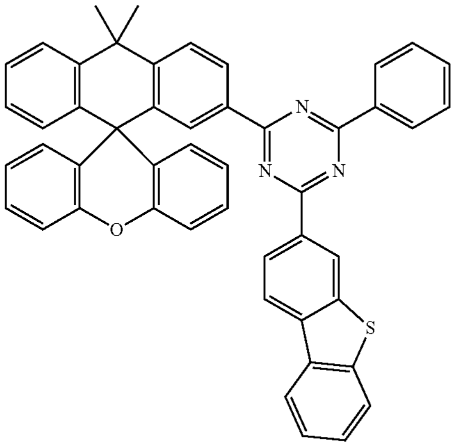
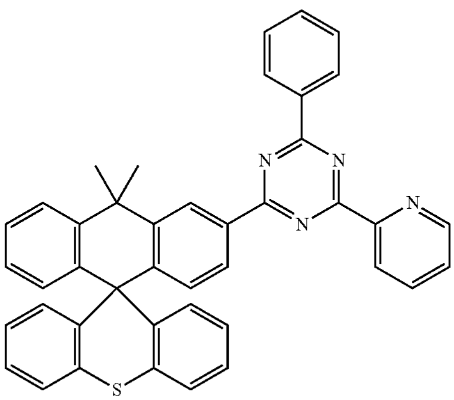
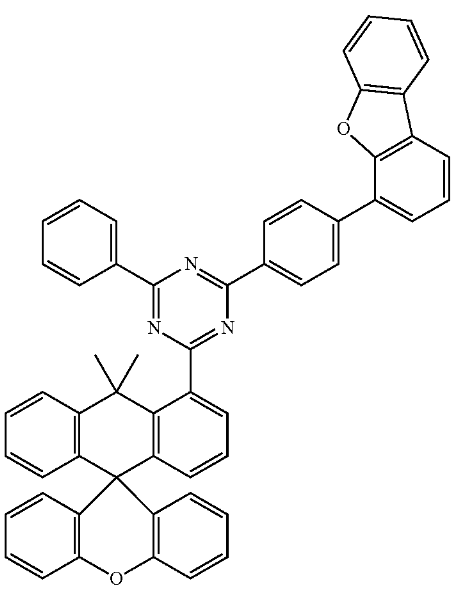
-continued
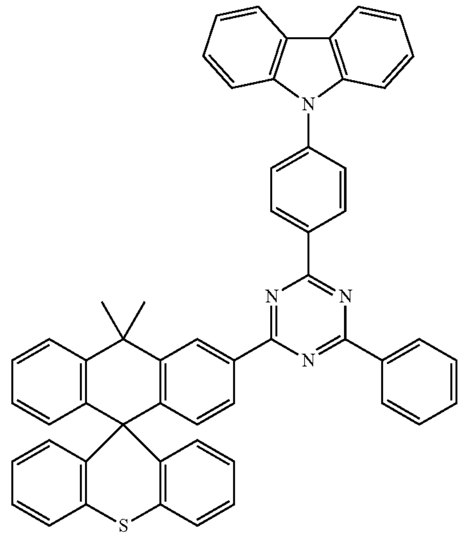
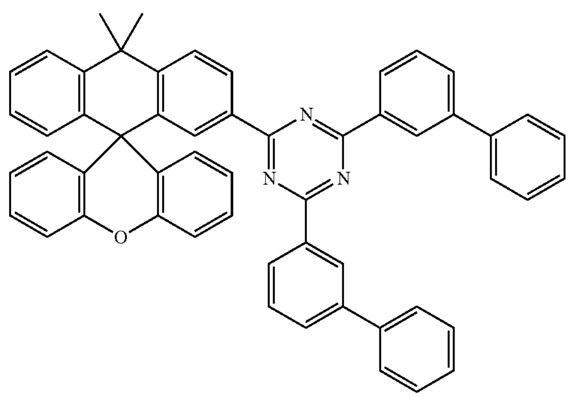
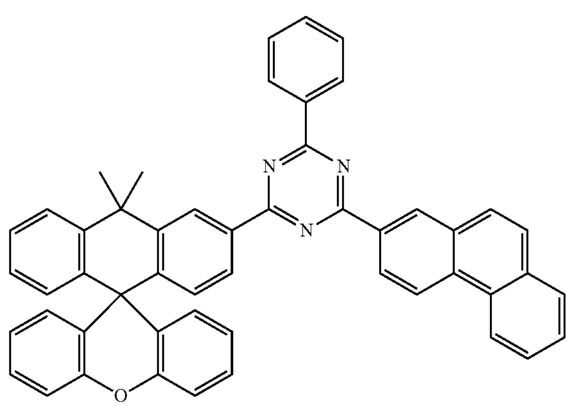

-continued
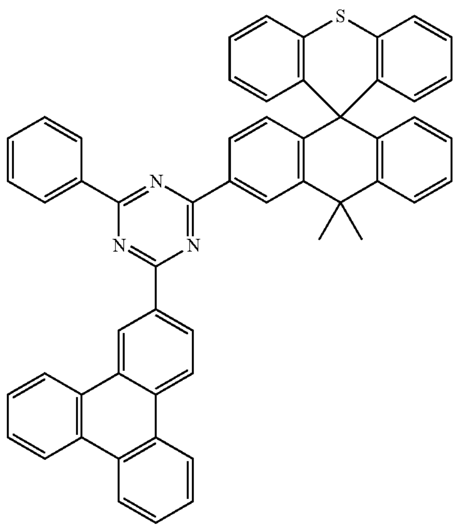
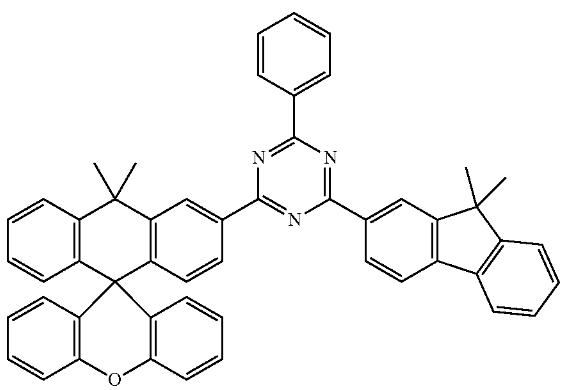
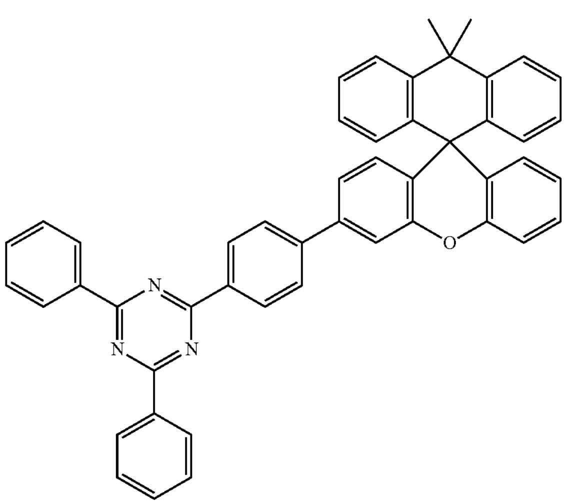
-continued
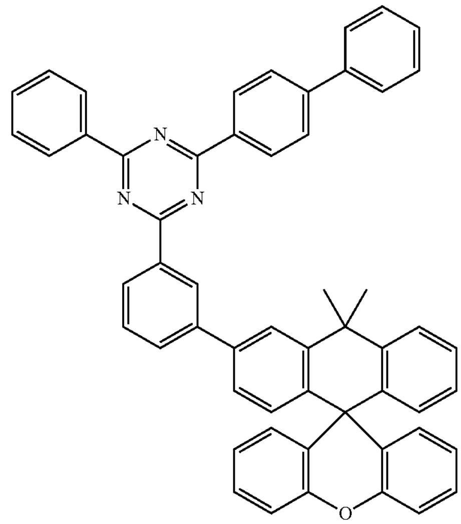
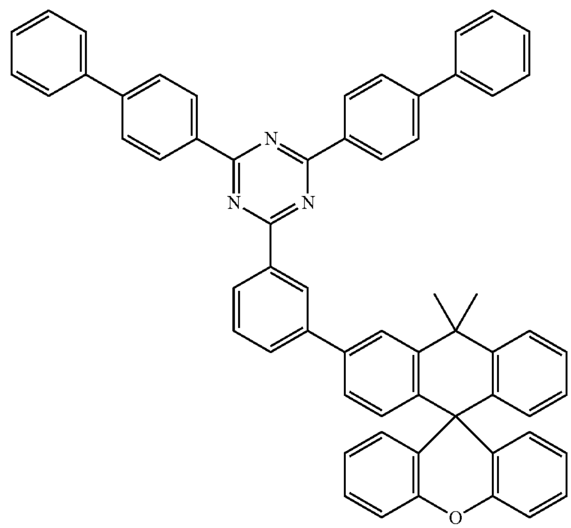
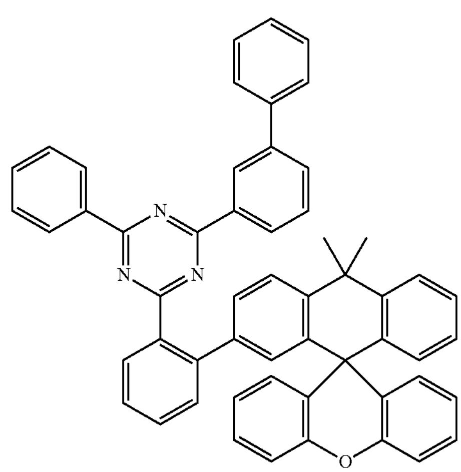

-continued
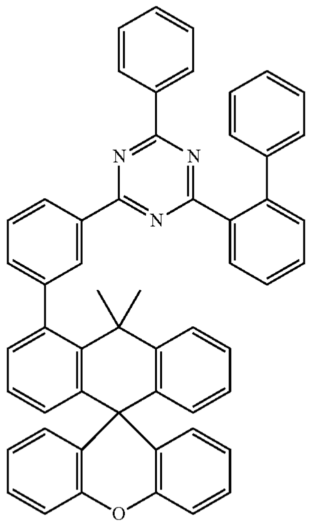
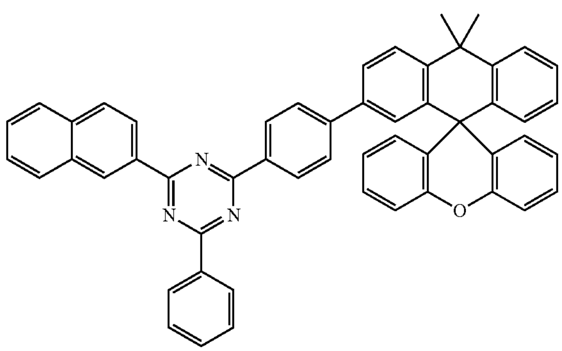
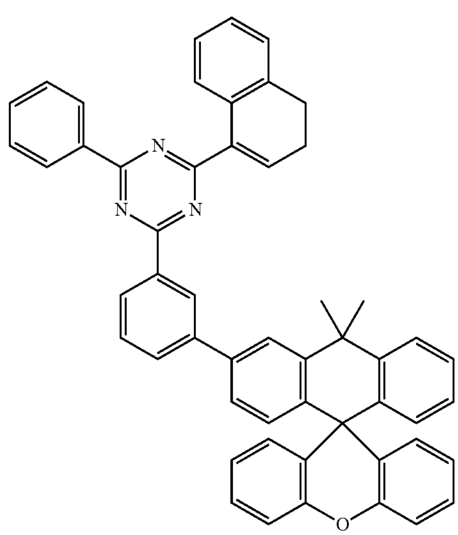
-continued
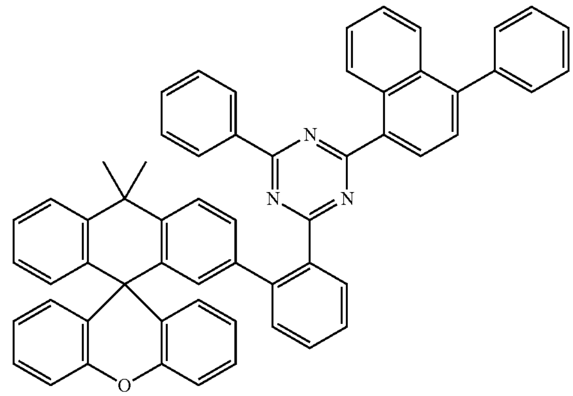
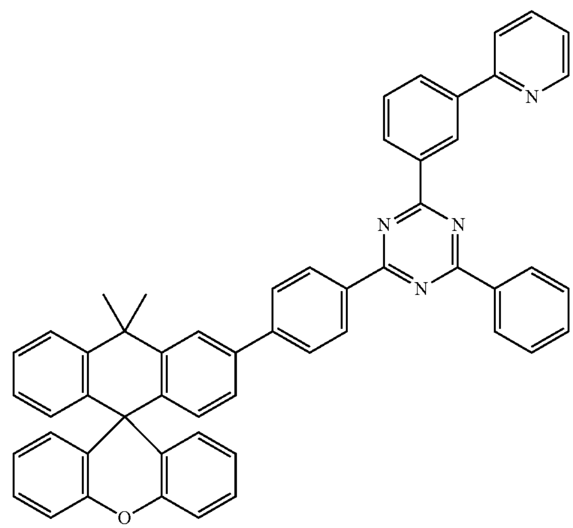
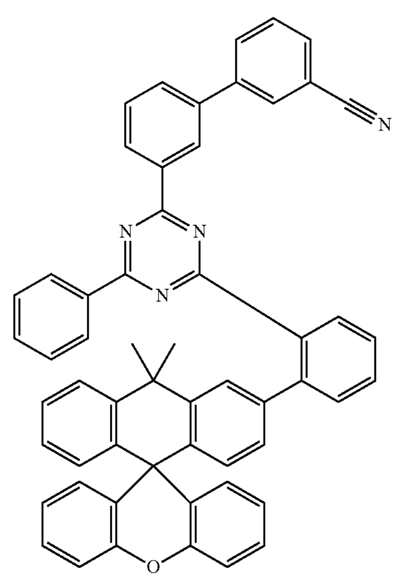

-continued
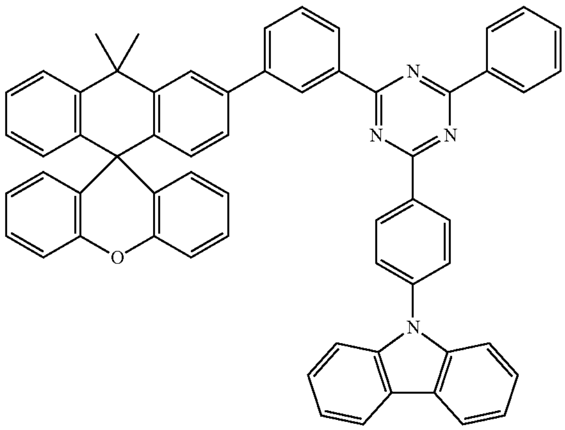
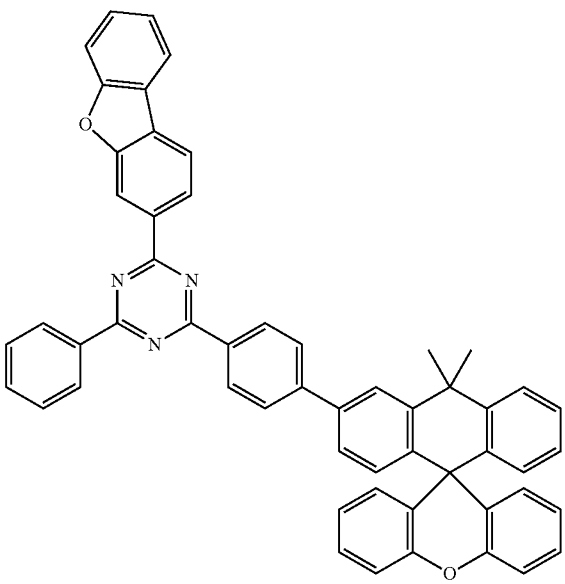
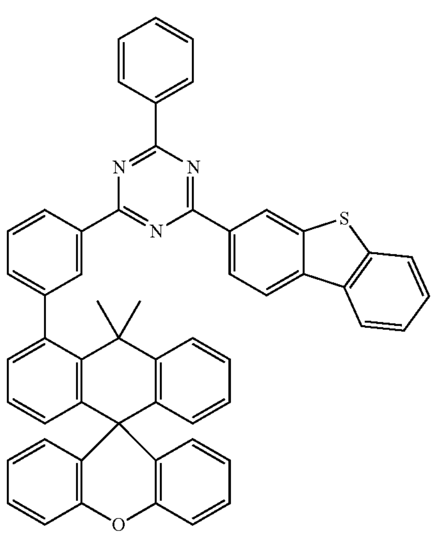
-continued
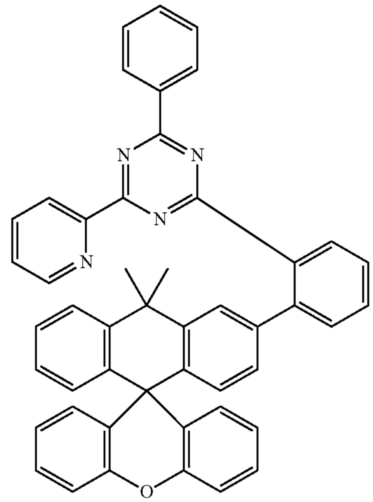
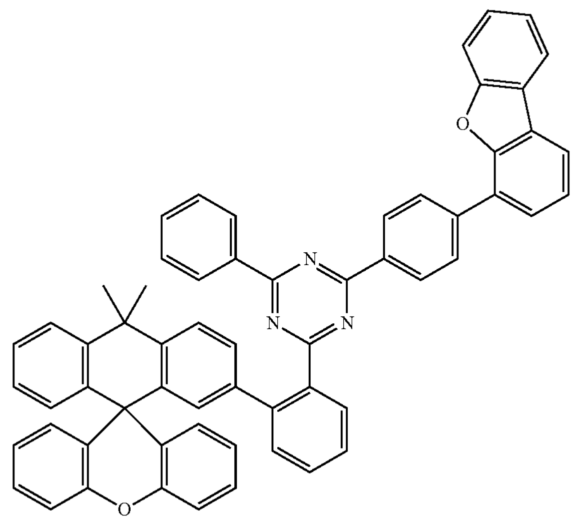
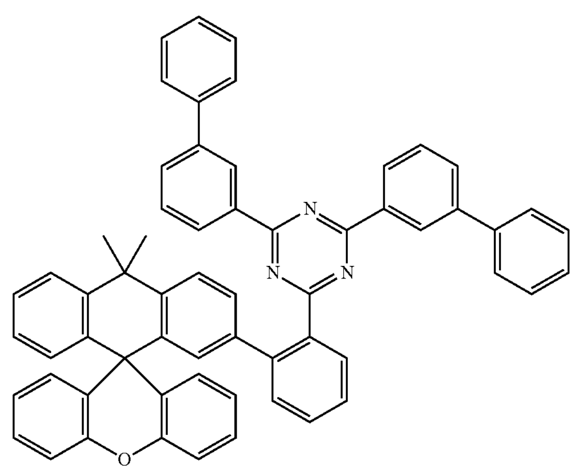

-continued
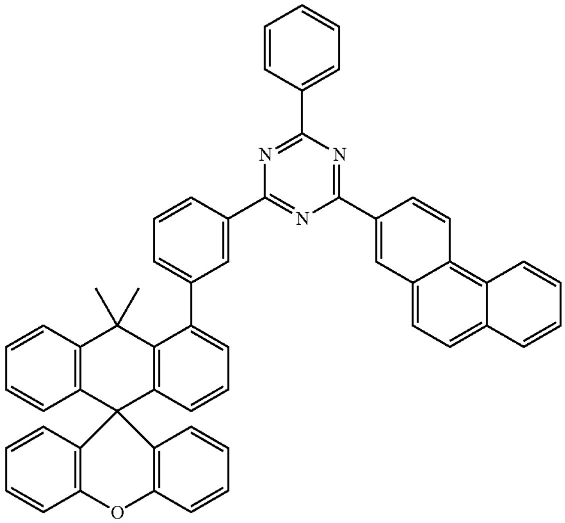
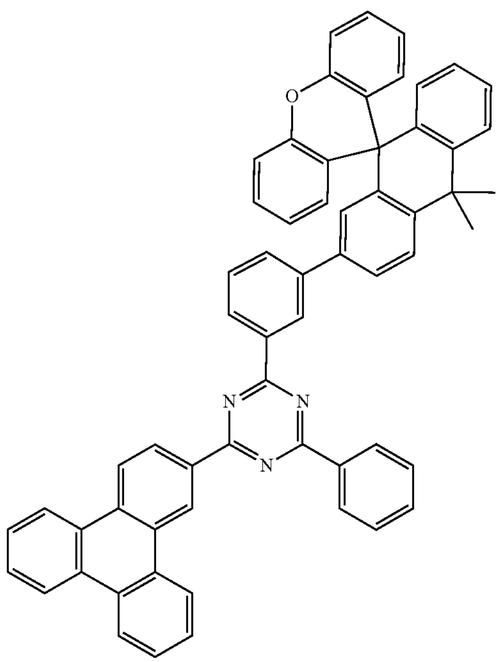
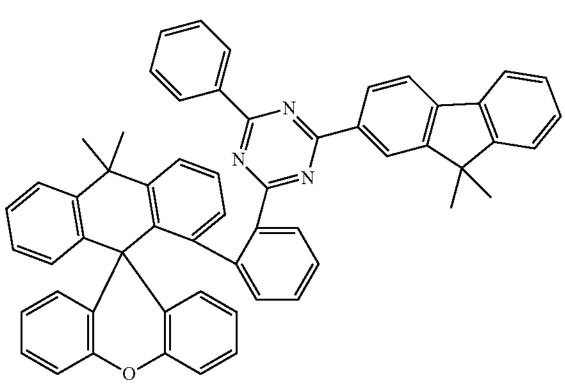
-continued
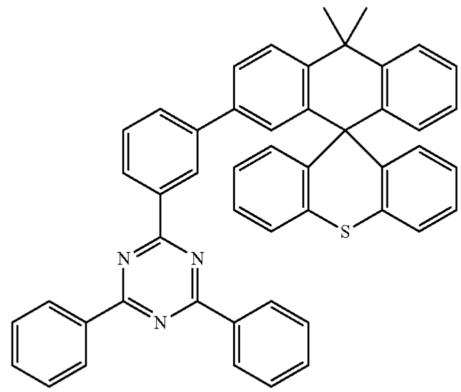
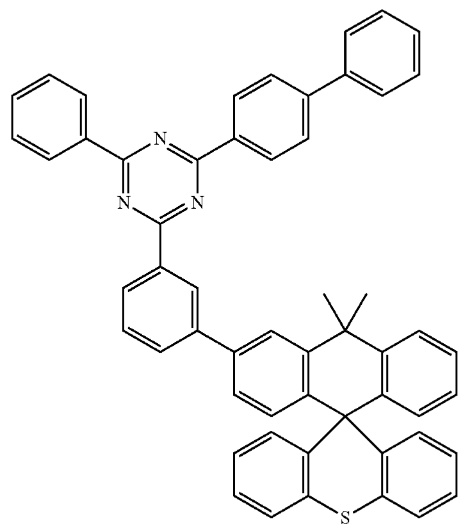
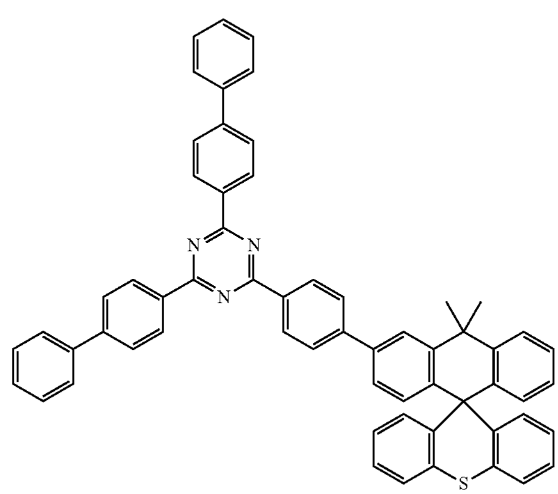

-continued
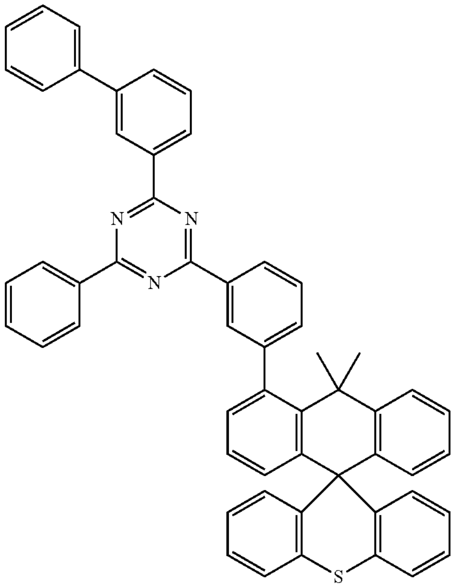
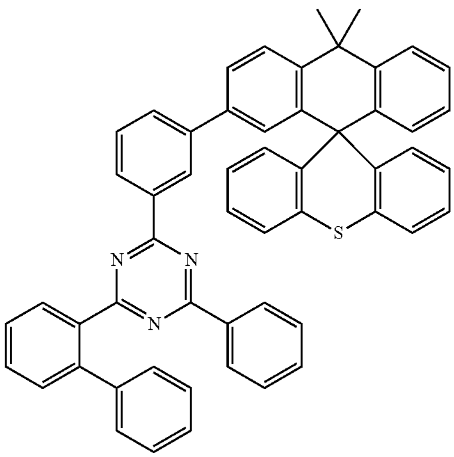
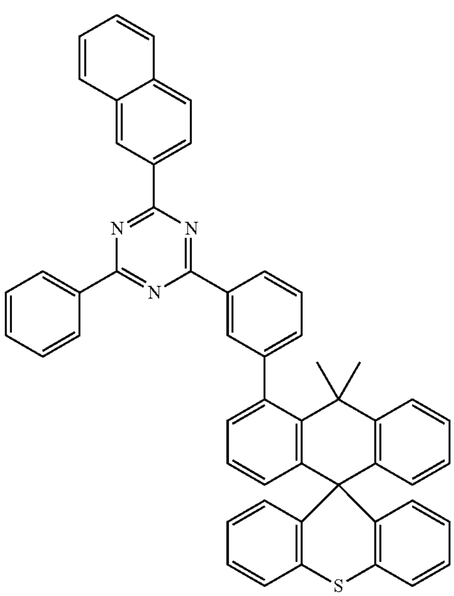
-continued
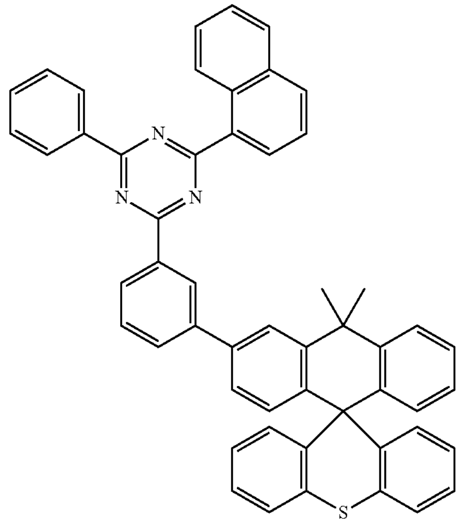
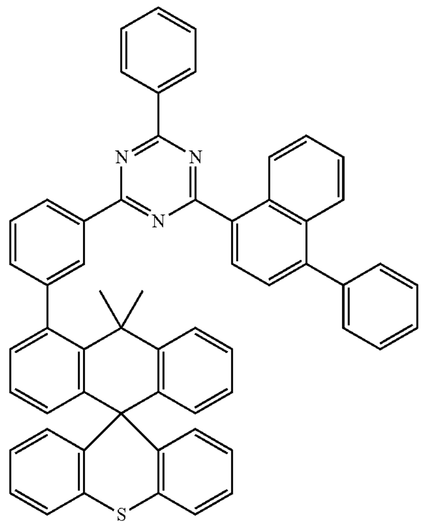
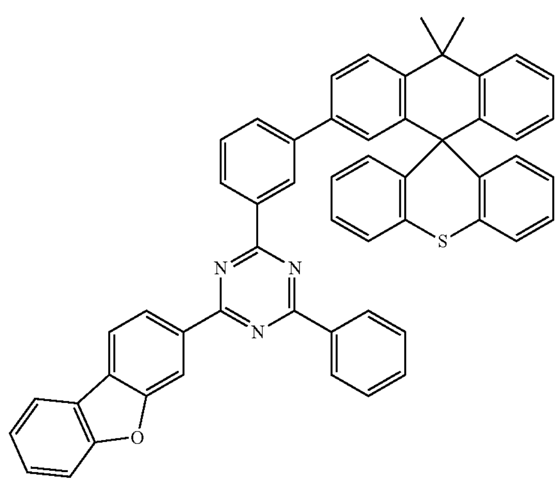

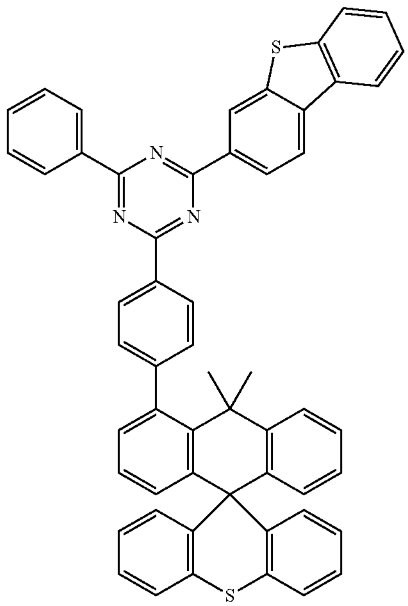
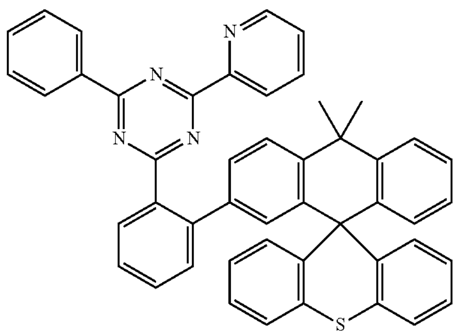
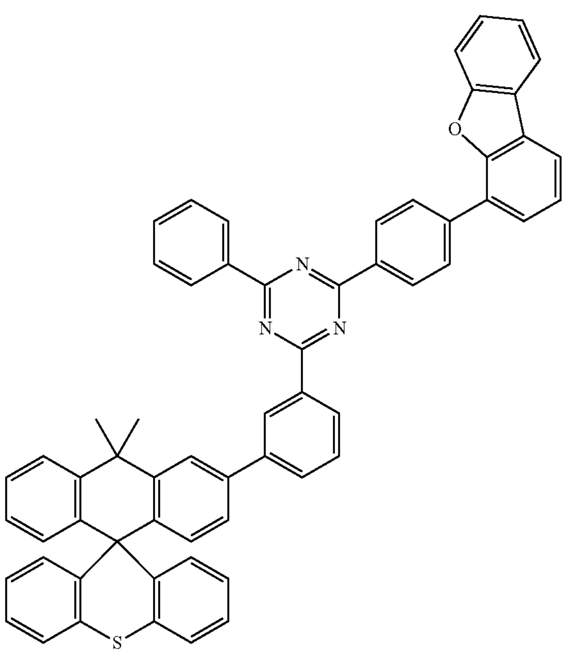
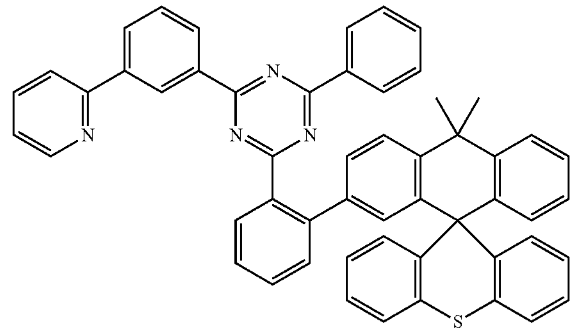
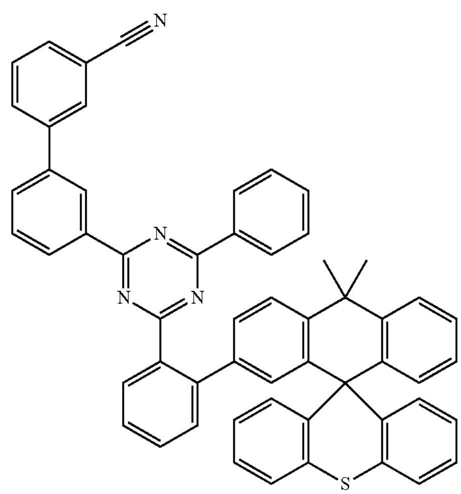
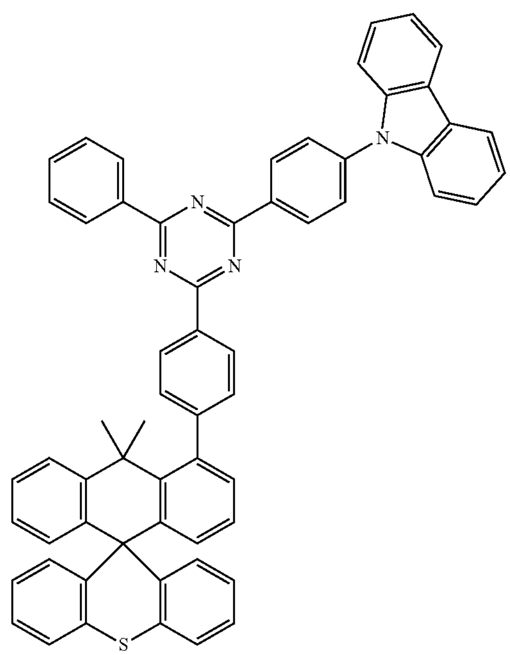

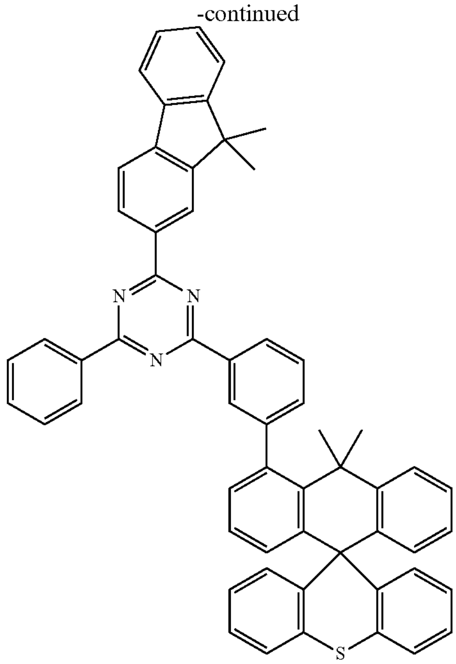
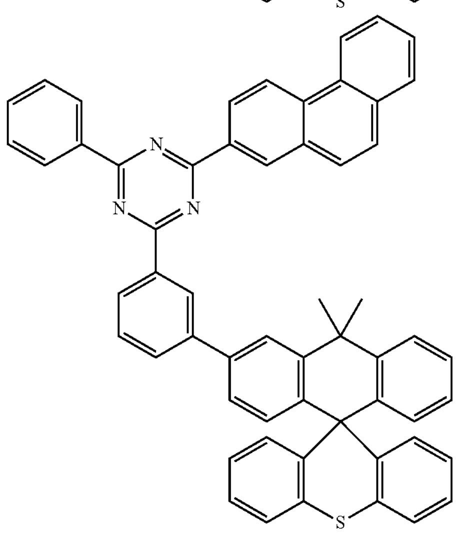
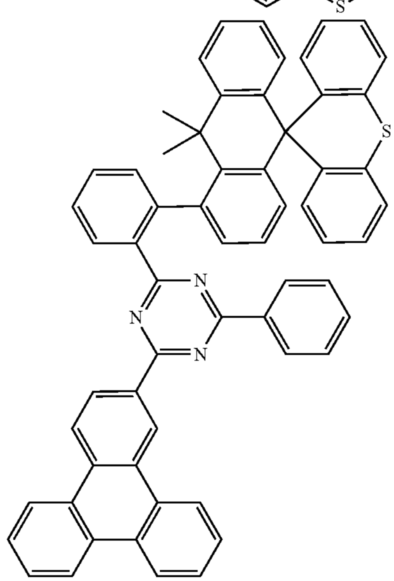
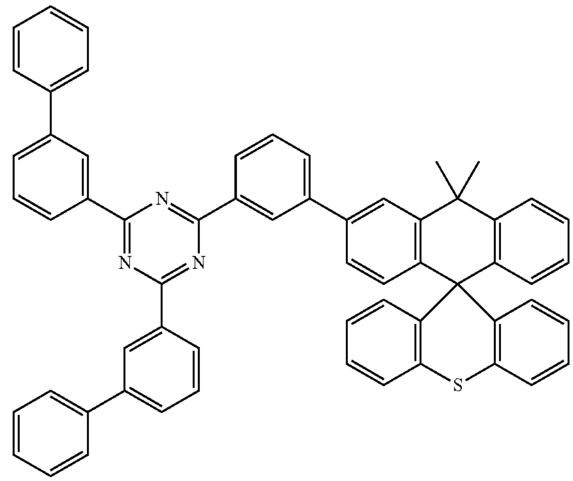
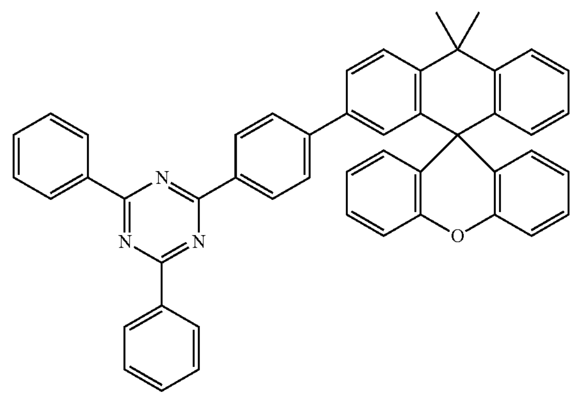
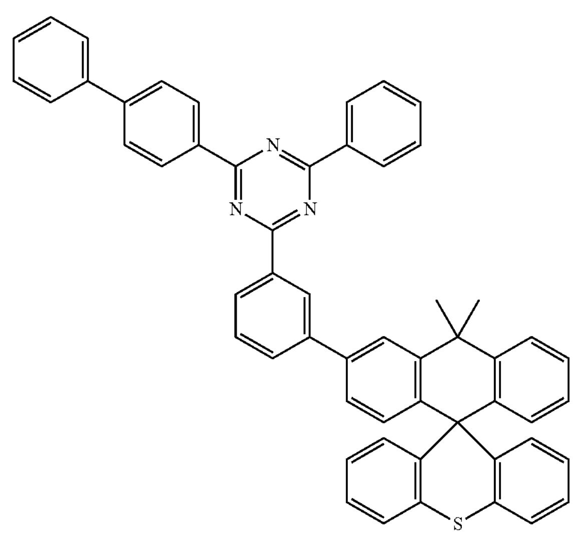

-continued
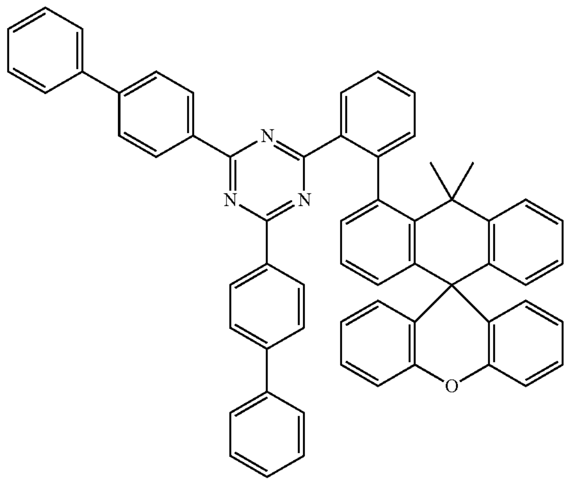
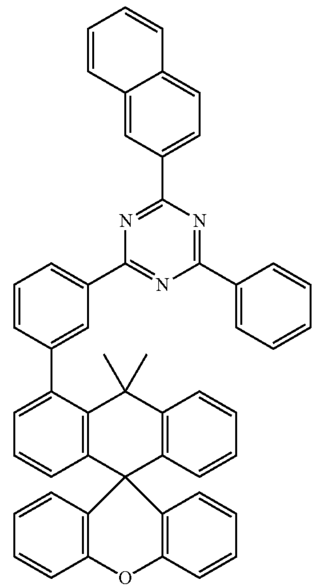
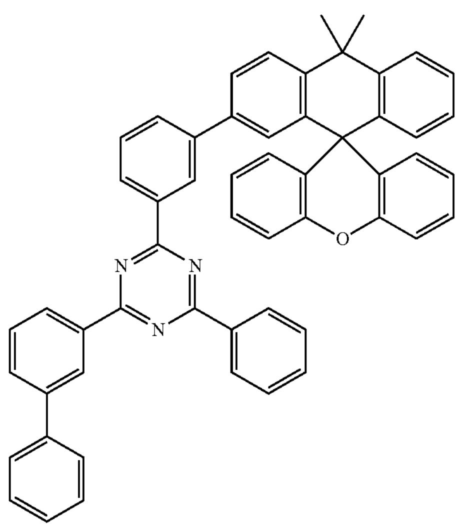
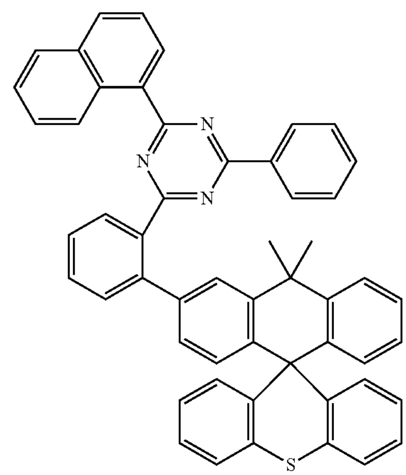
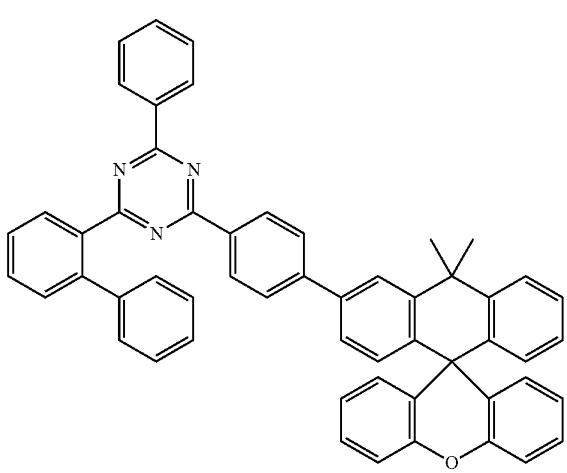
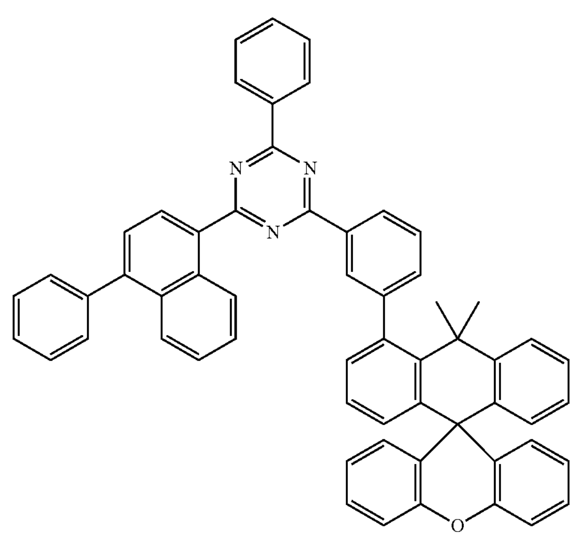

-continued
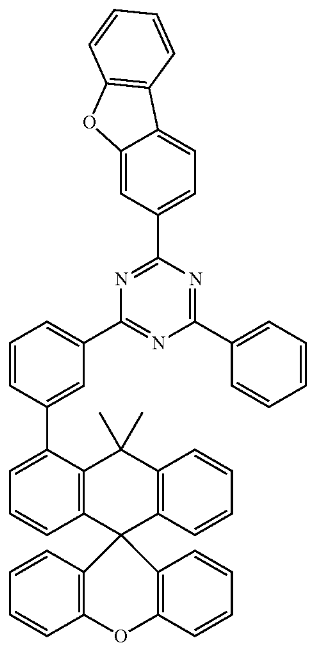
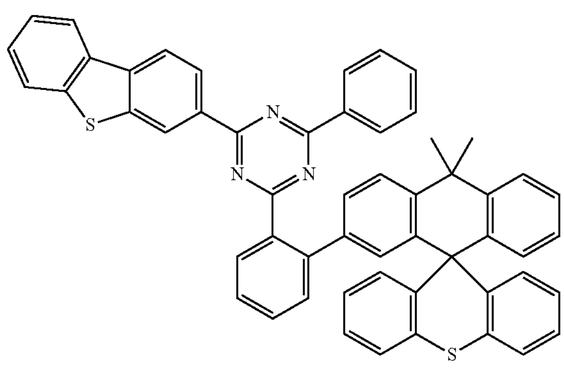
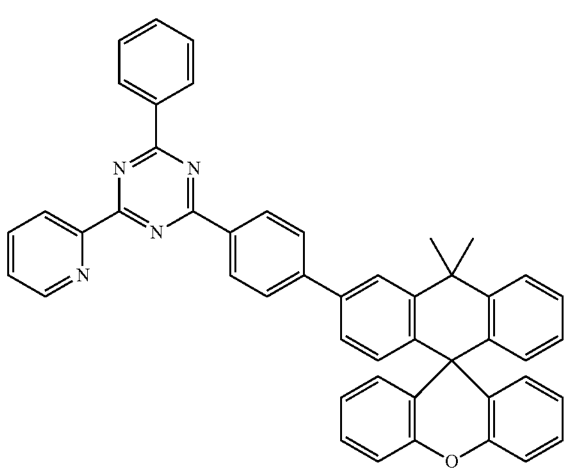
-continued
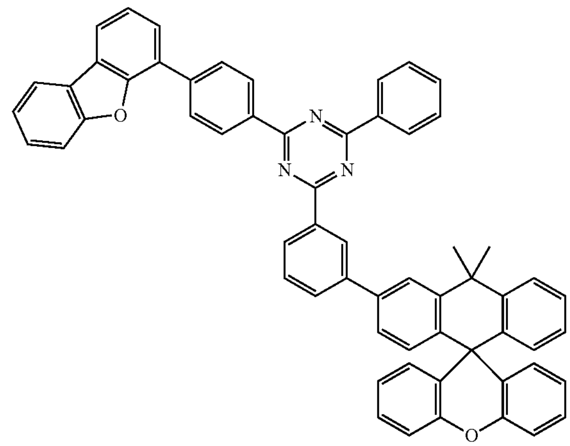
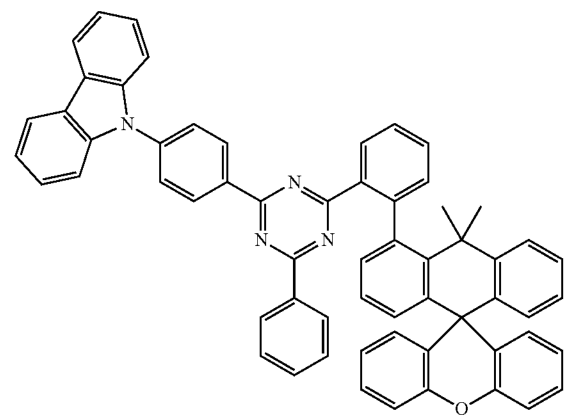
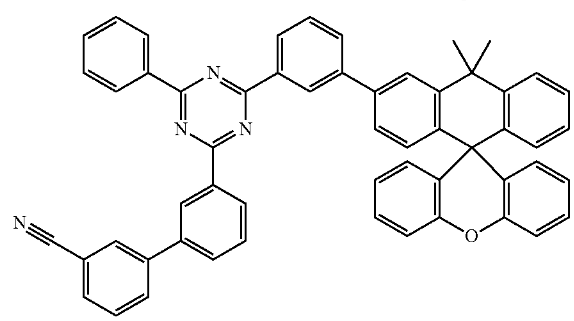
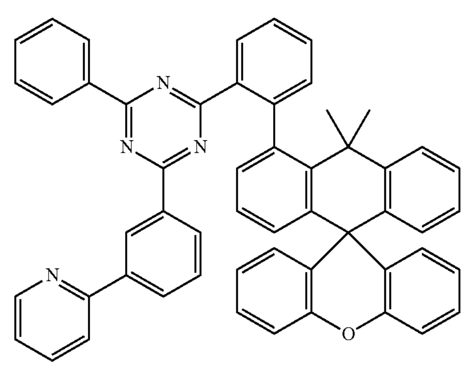

-continued
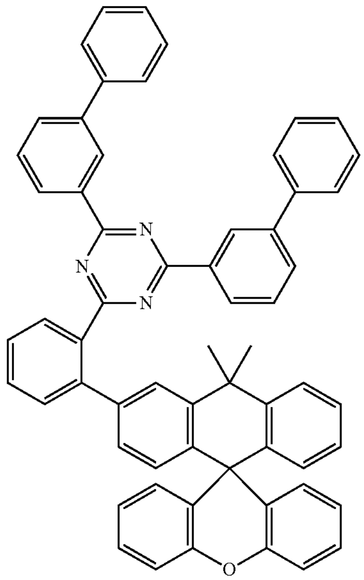
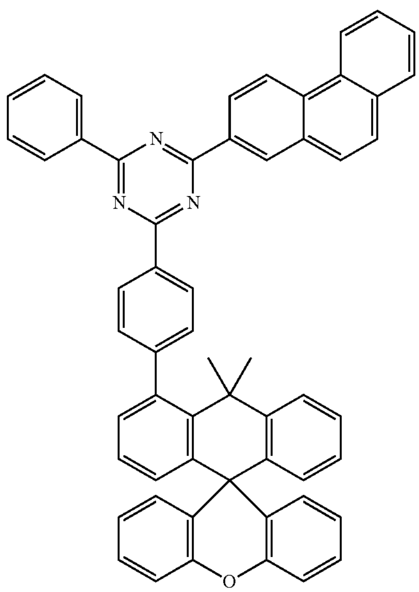
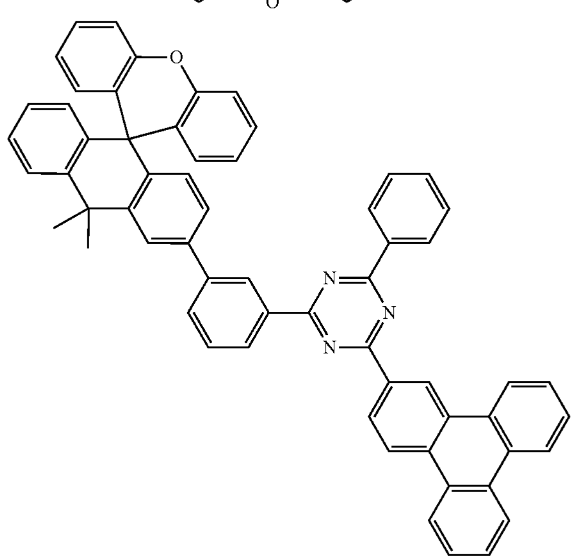
-continued
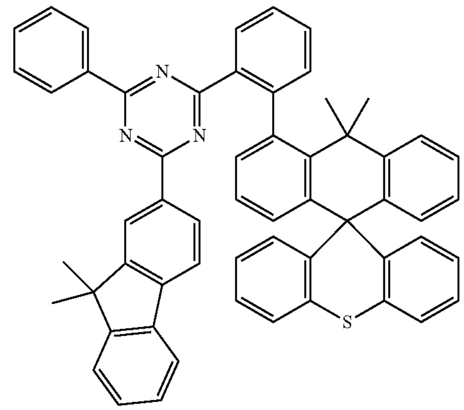
In addition, according to an exemplary embodiment of the present specification, the spiro compound can be any one compound selected from the following compounds:
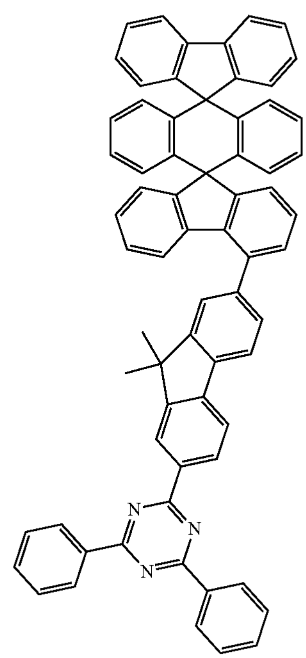

-continued
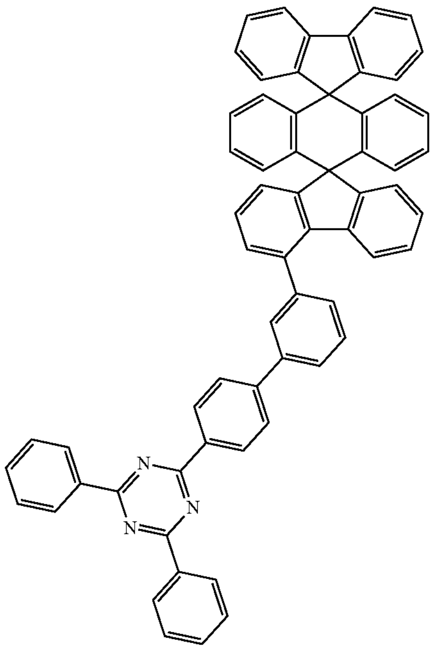
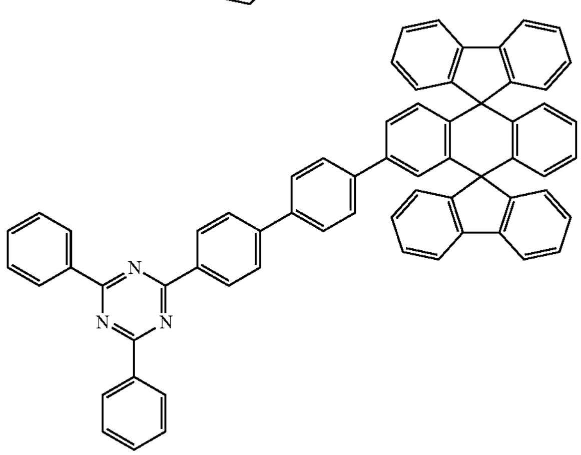
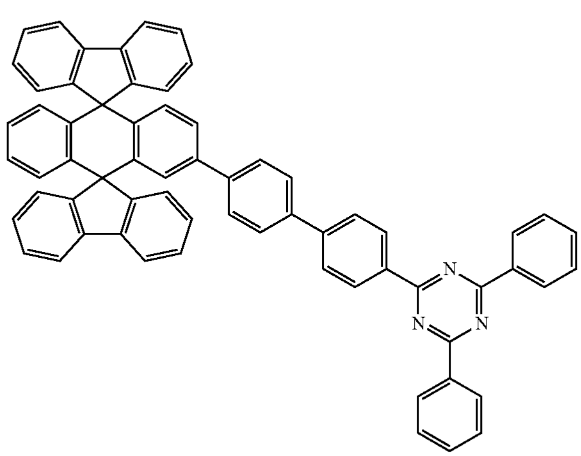
-continued
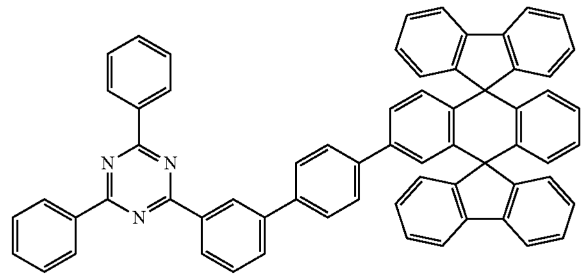
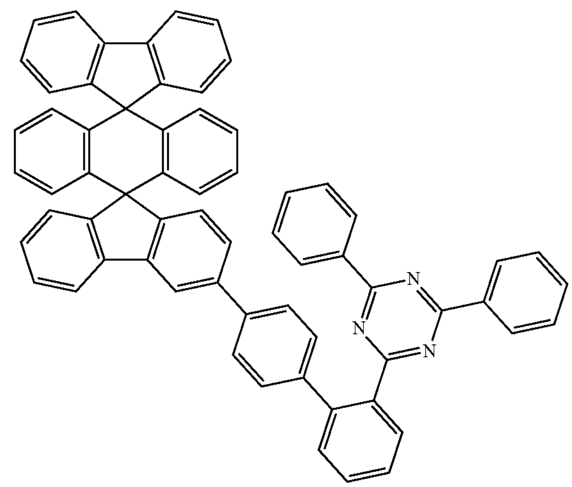
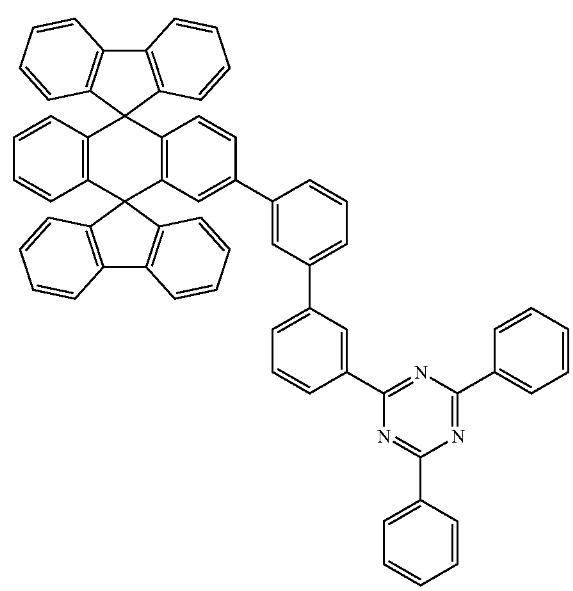

-continued
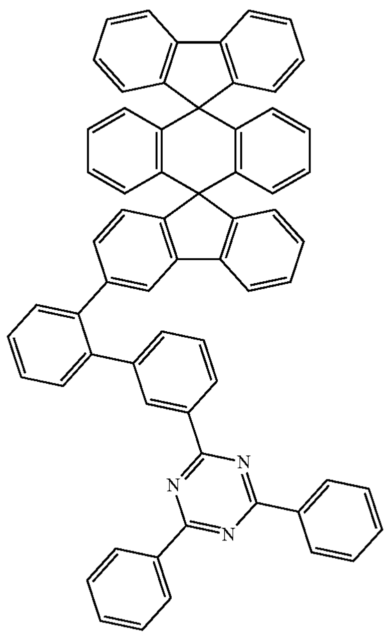
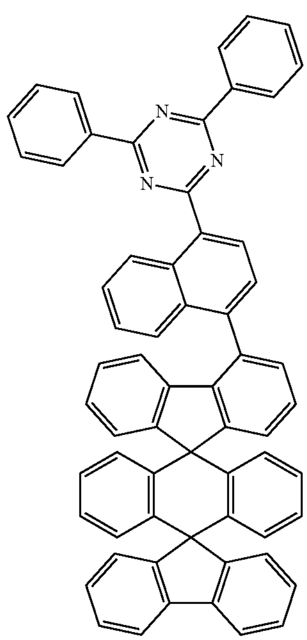
-continued
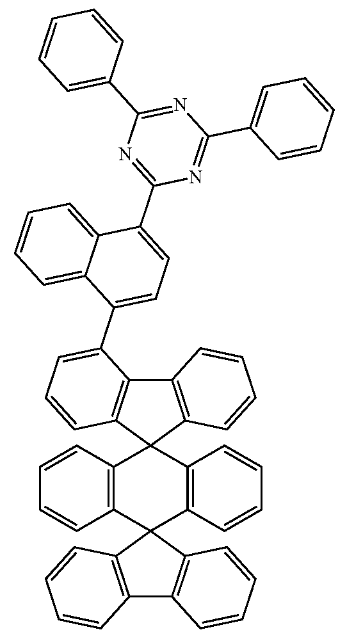
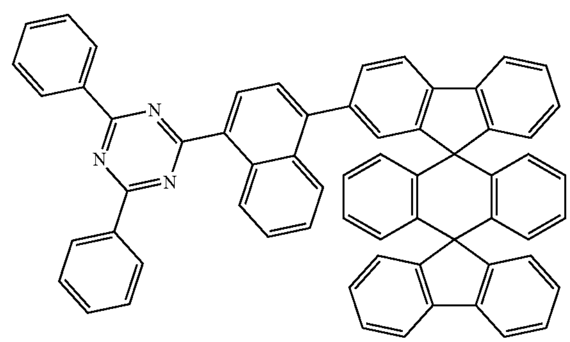
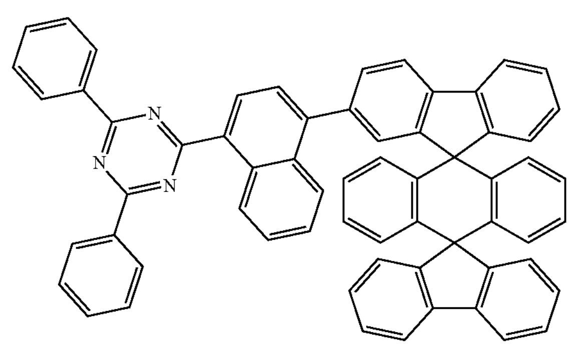

-continued
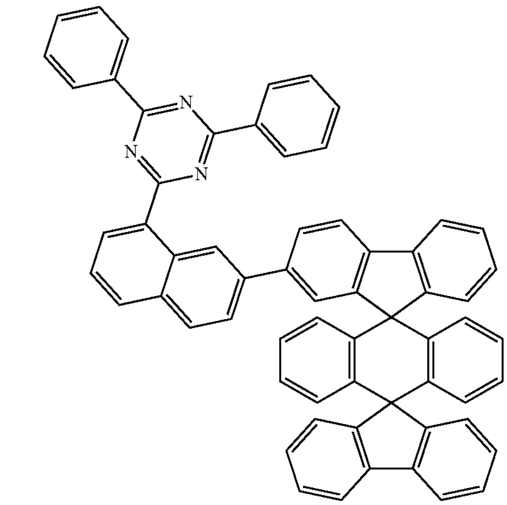
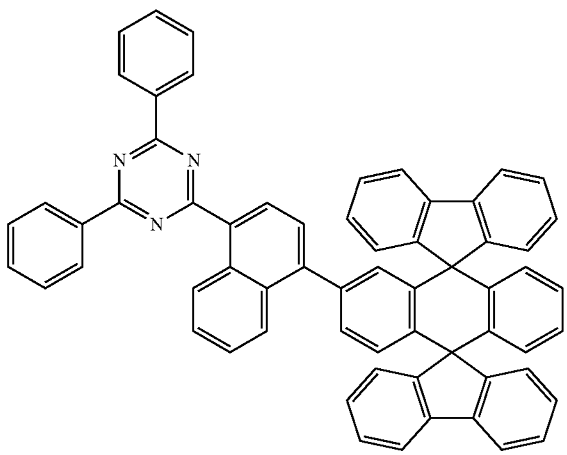
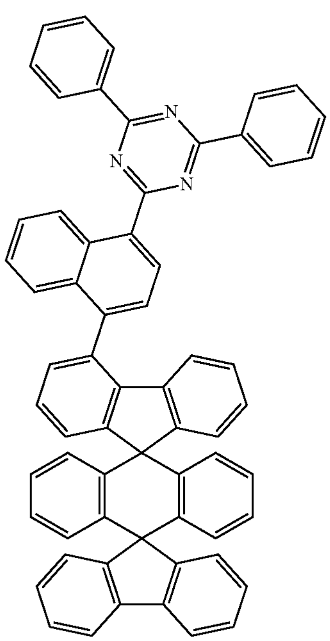
-continued
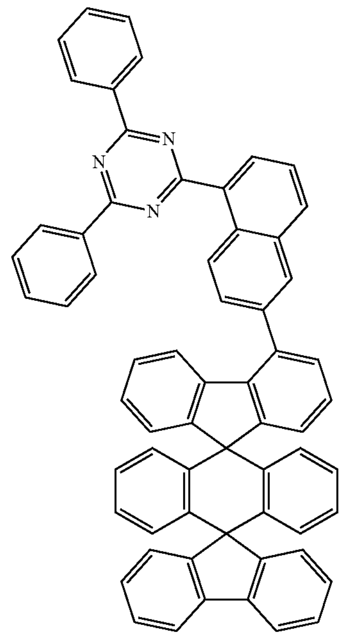
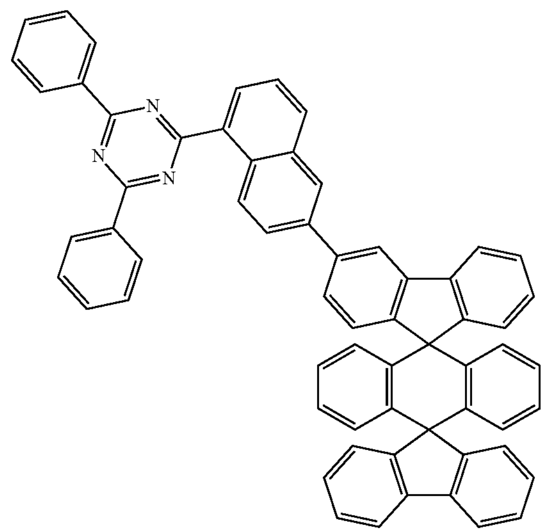
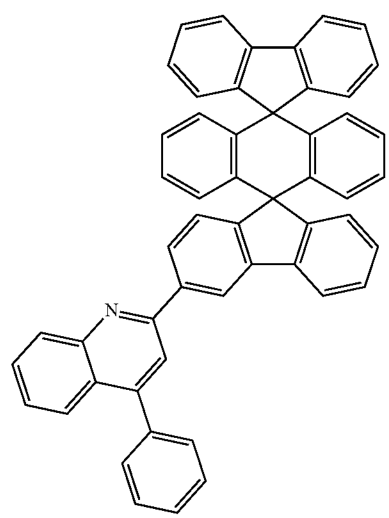

-continued
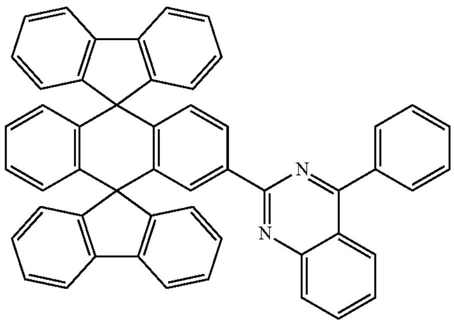
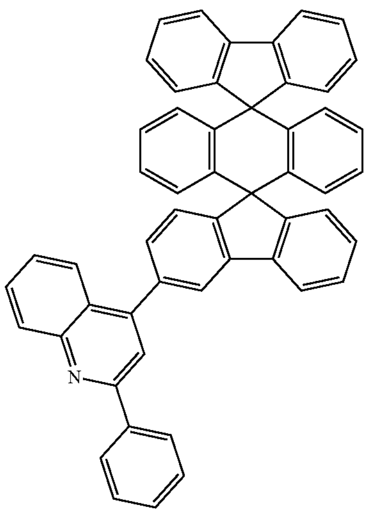
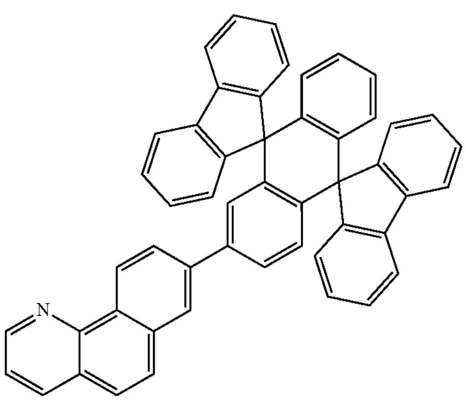
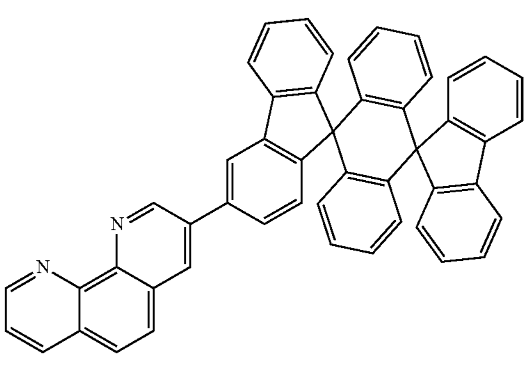
-continued
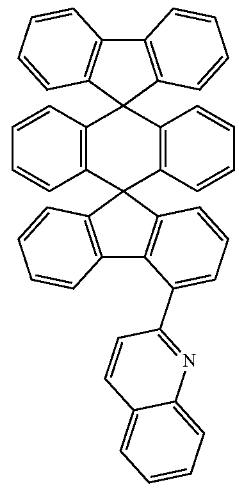
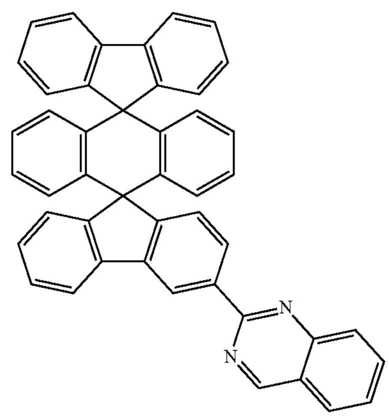
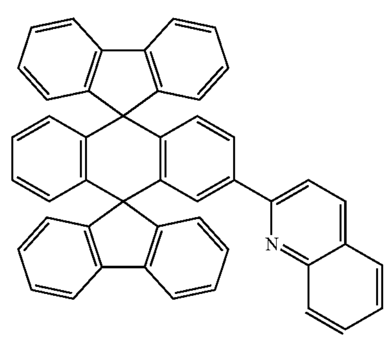

-continued
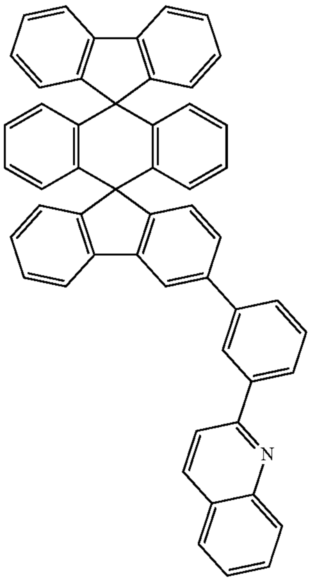
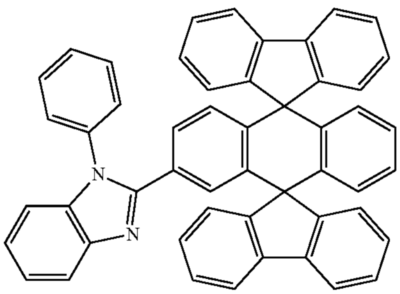
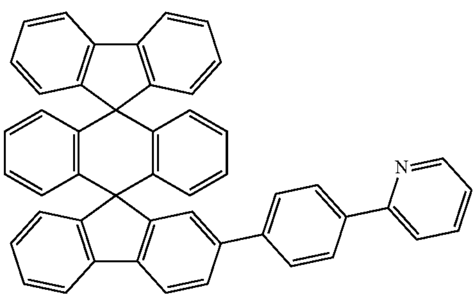
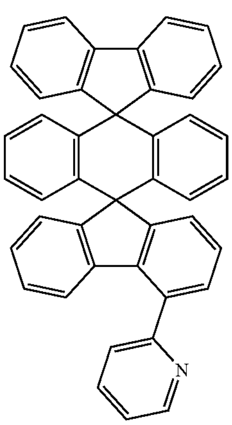
-continued
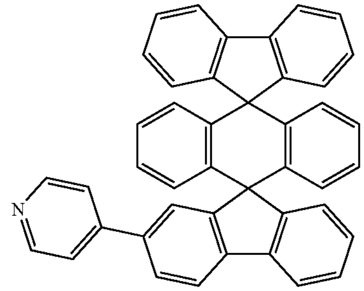
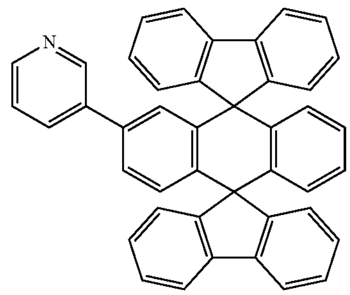
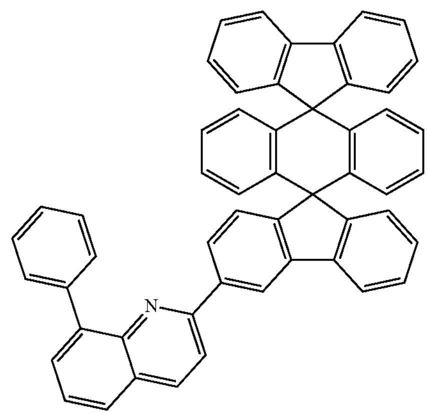
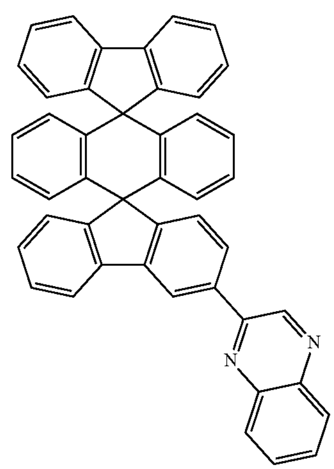

-continued
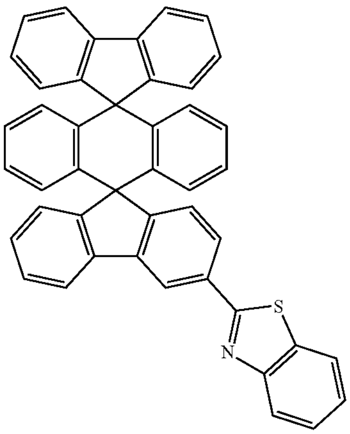
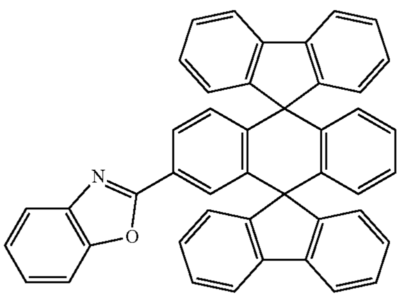
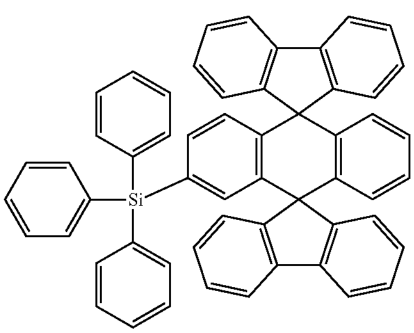
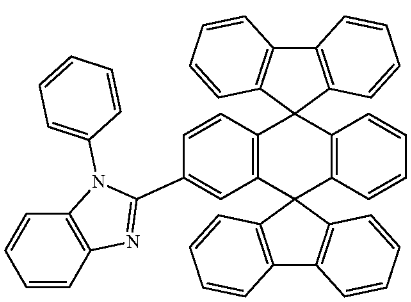
-continued
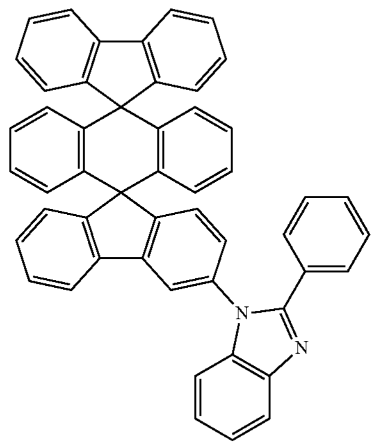
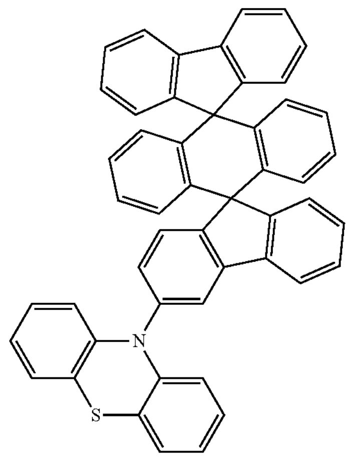
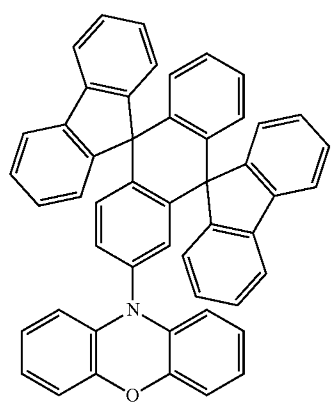
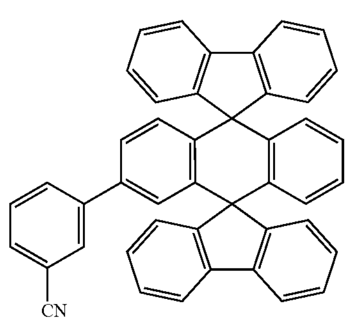

-continued
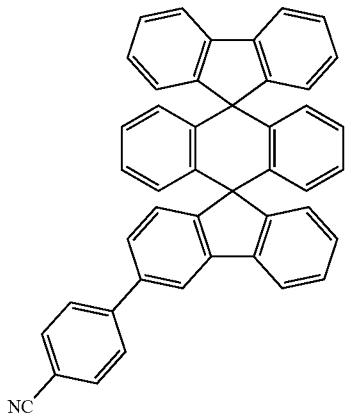
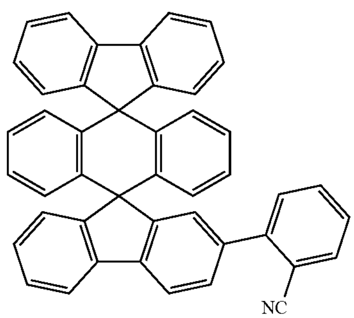
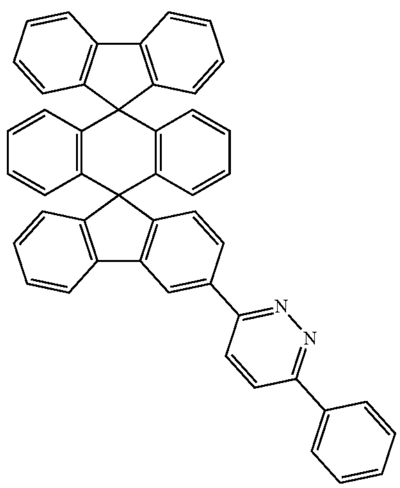
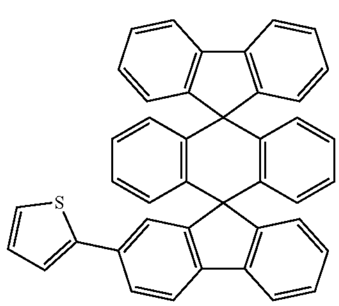
-continued
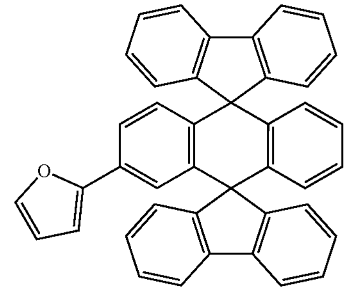
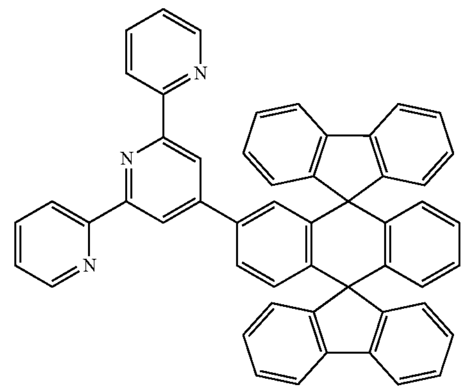
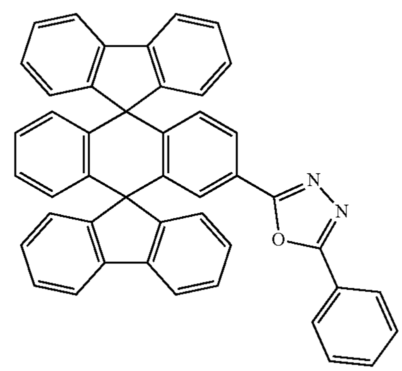
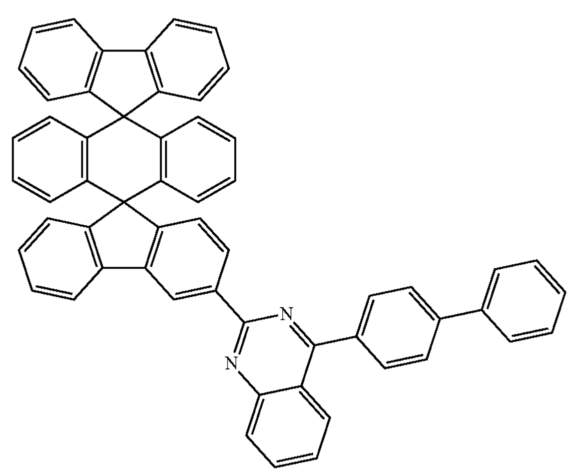

-continued
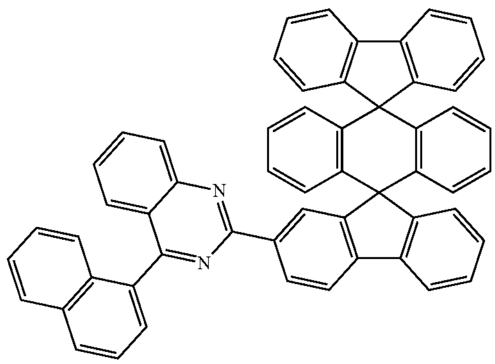
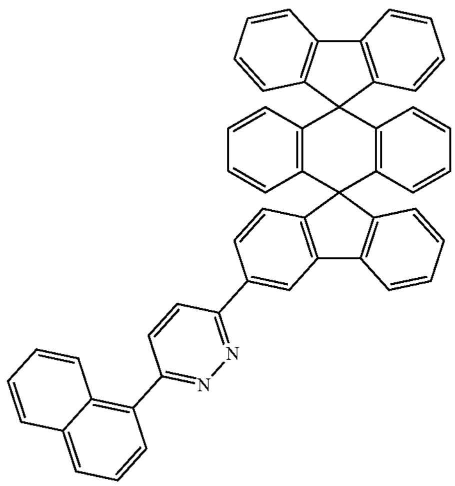
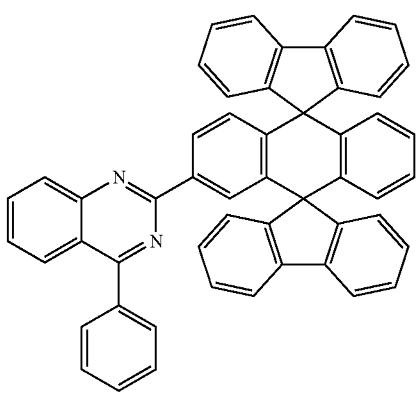
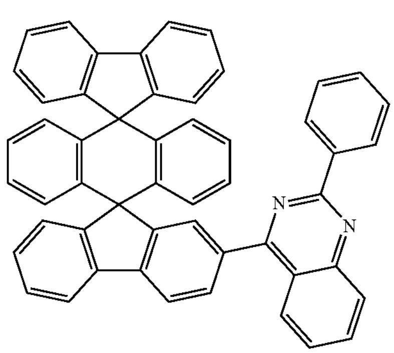
-continued
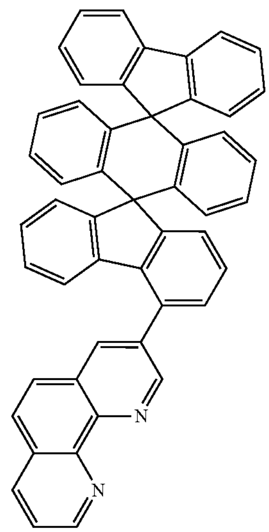
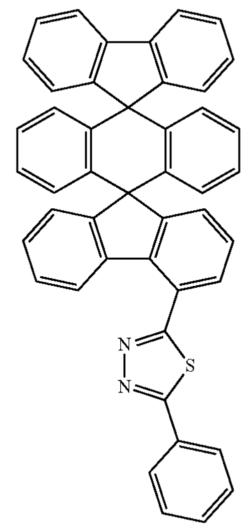
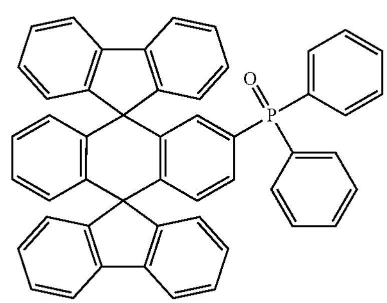
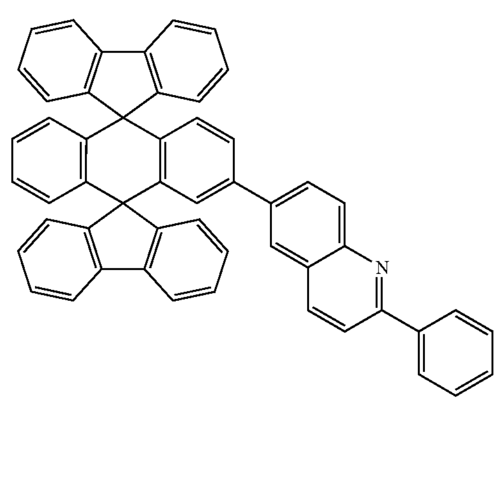

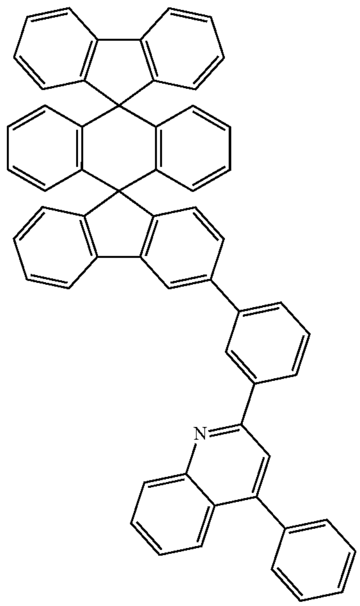
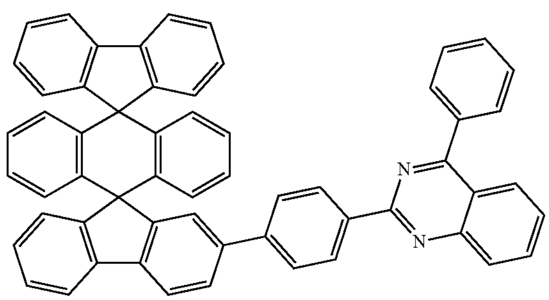
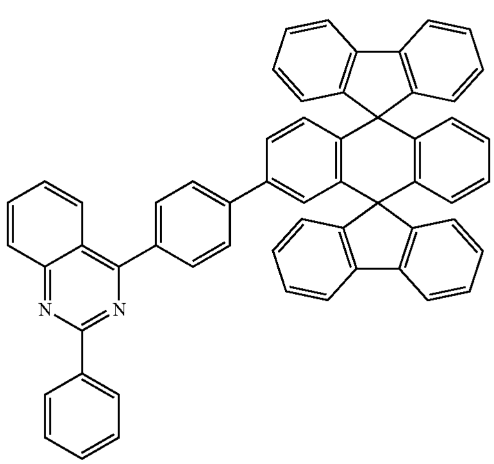
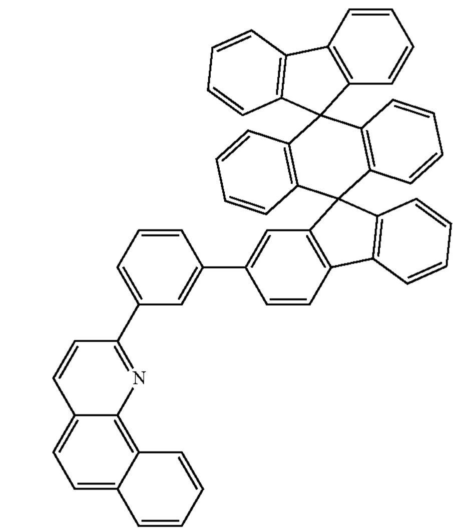
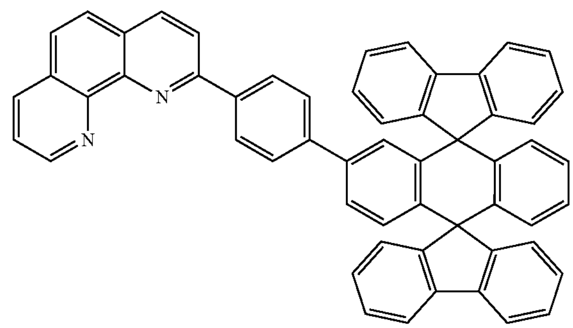
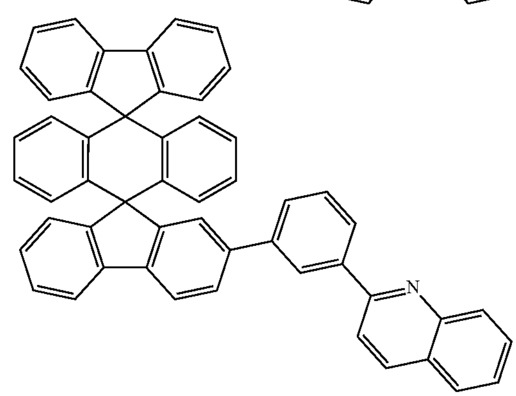
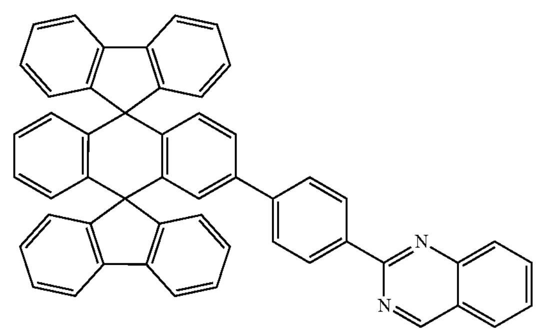

-continued
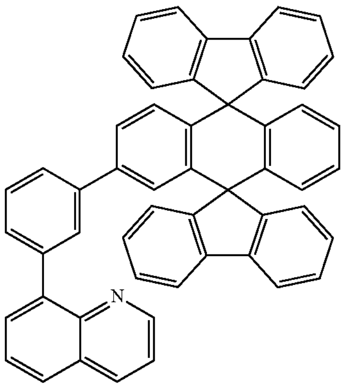
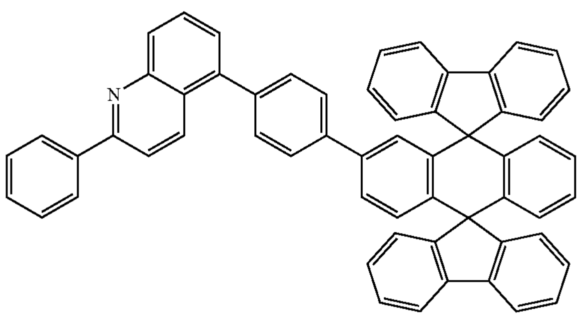
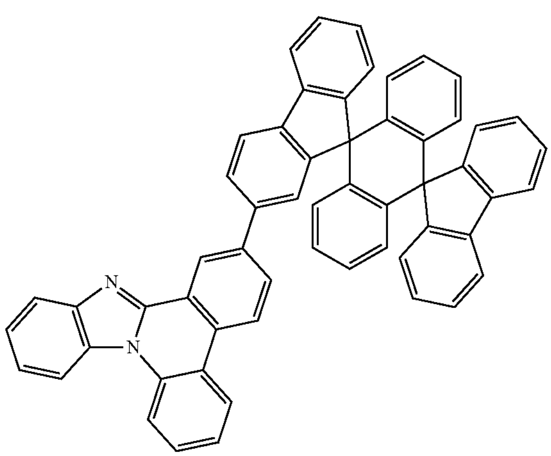
-continued
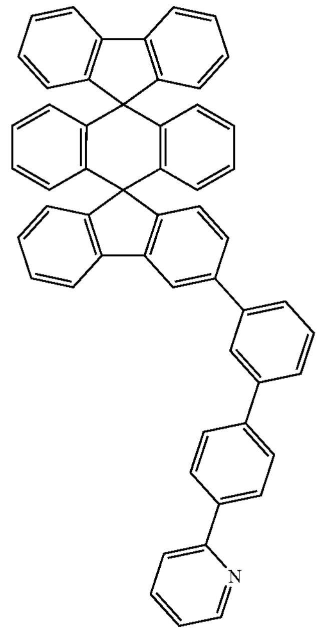
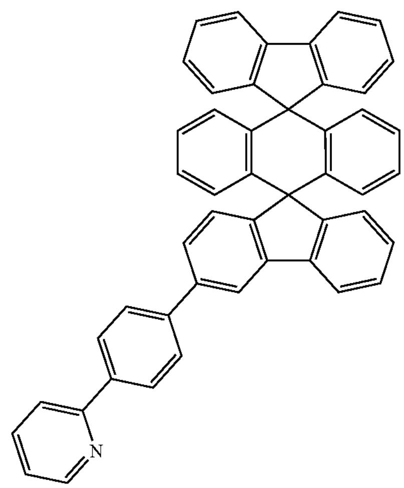
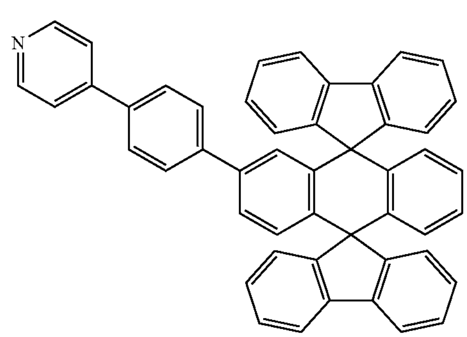

-continued
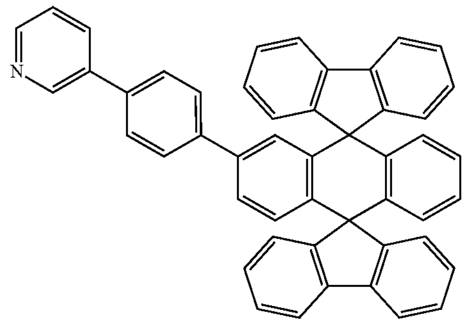
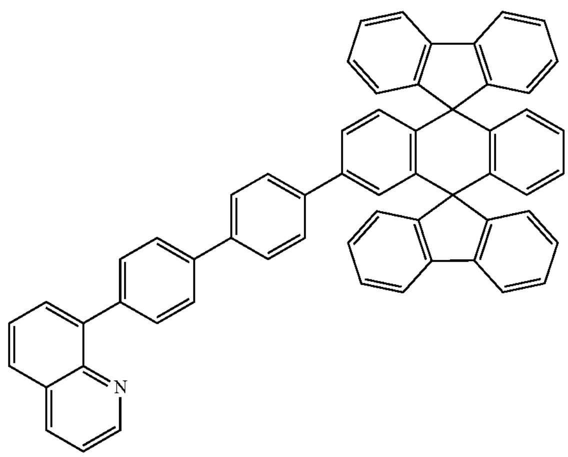
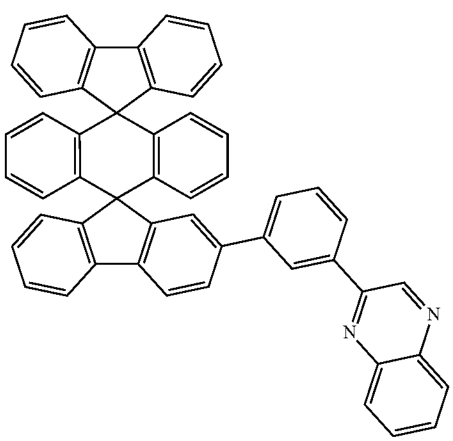
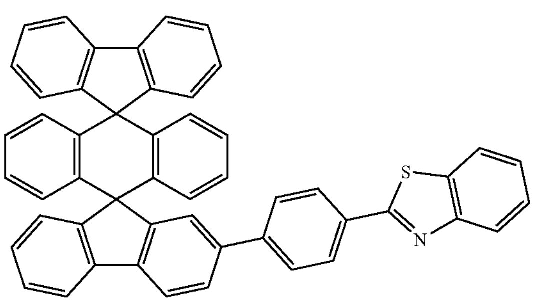
-continued
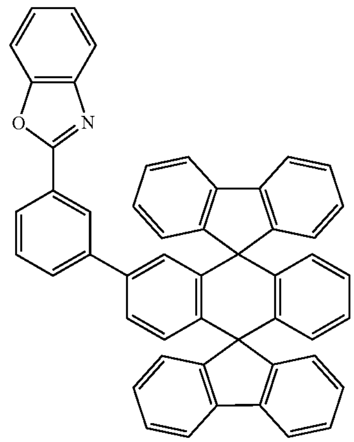
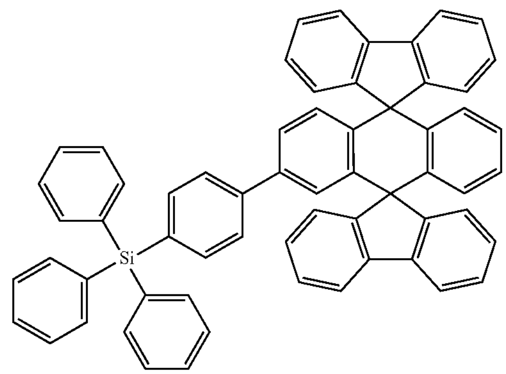
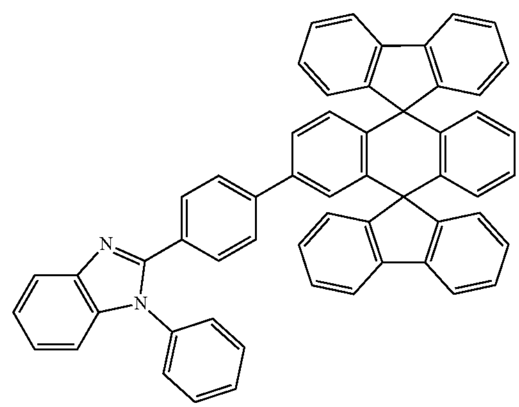
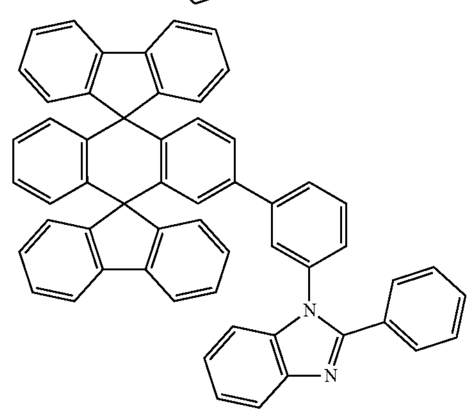

-continued
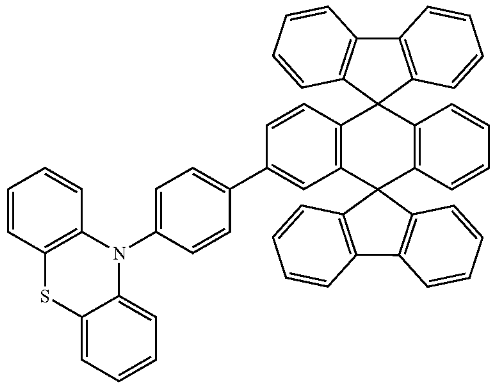
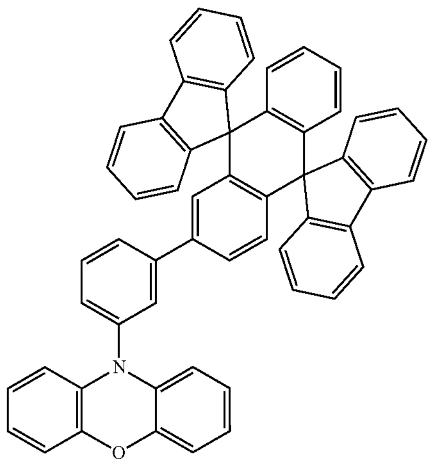
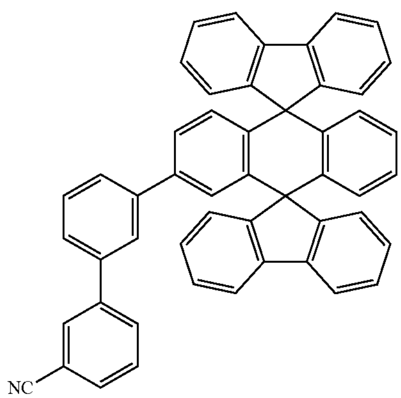
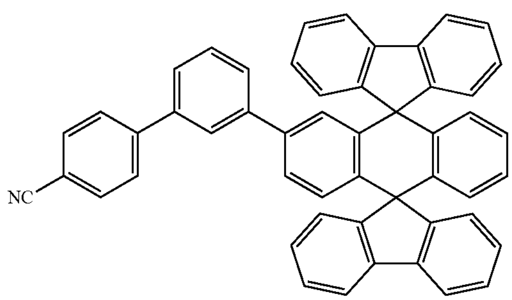
-continued
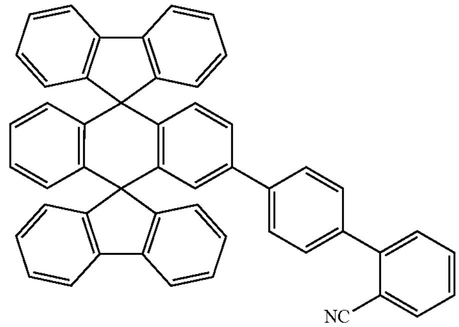
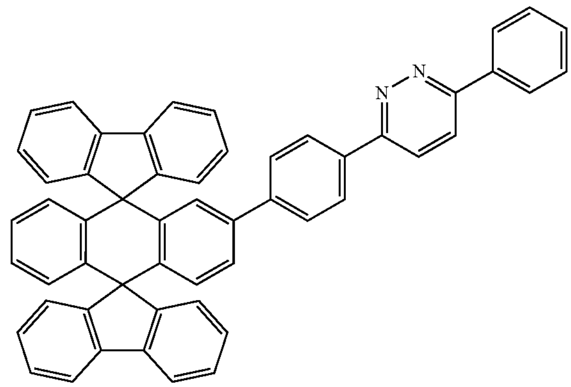
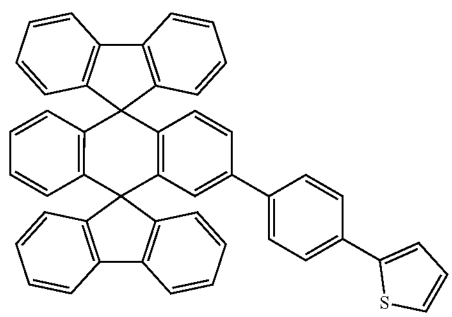
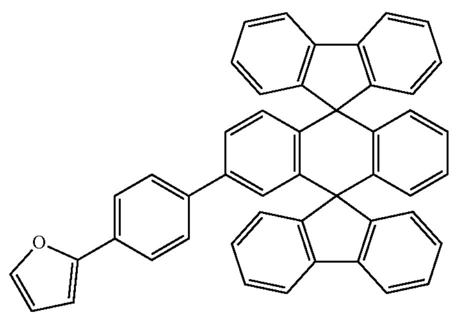
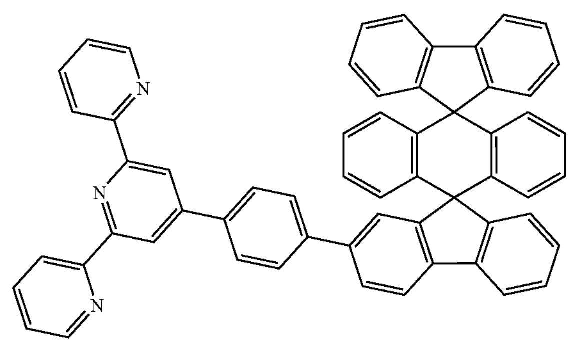

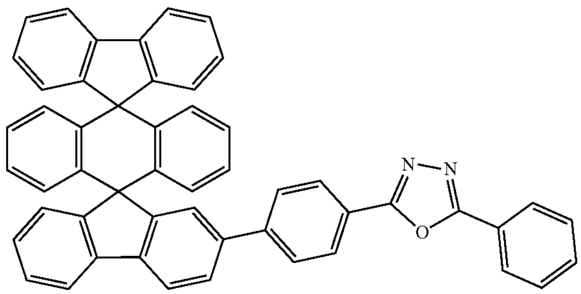
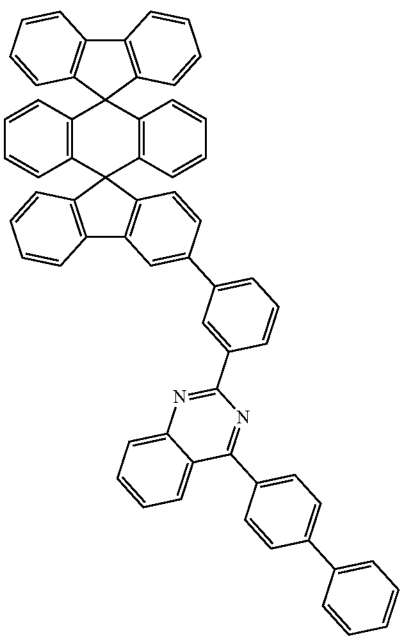
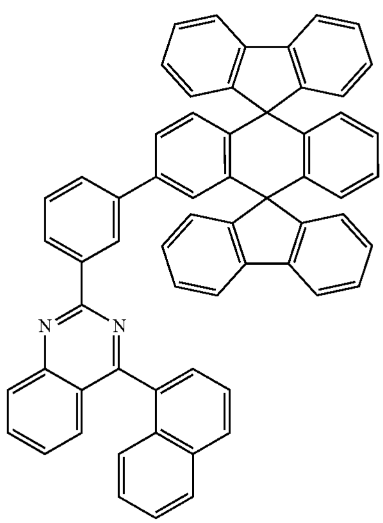
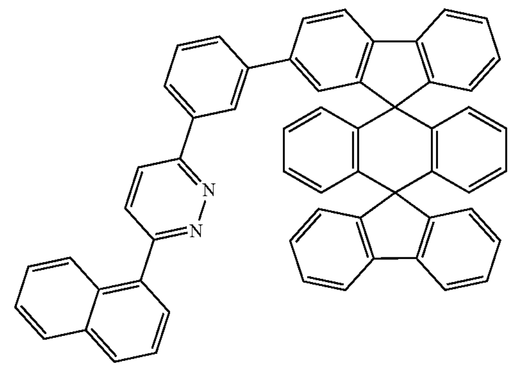
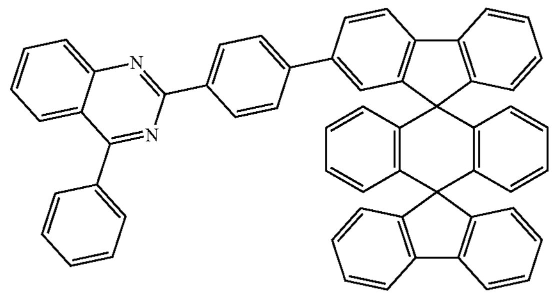
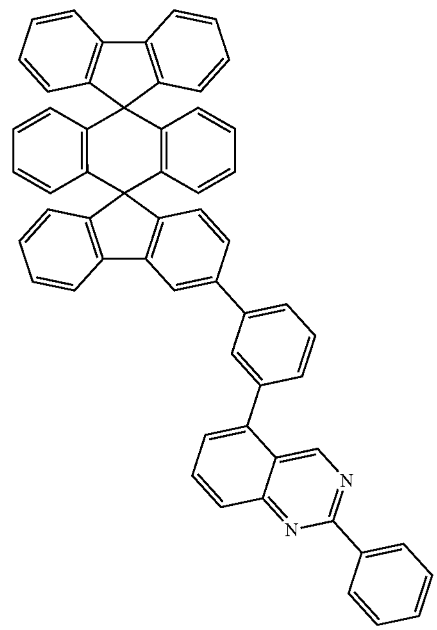
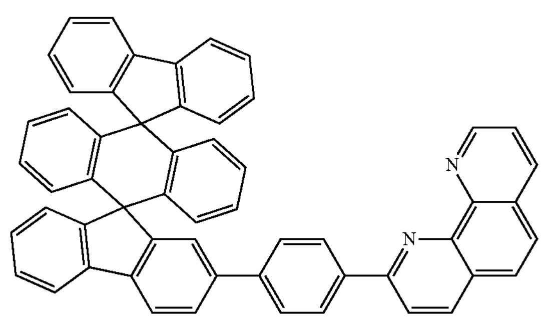
N
N -continued
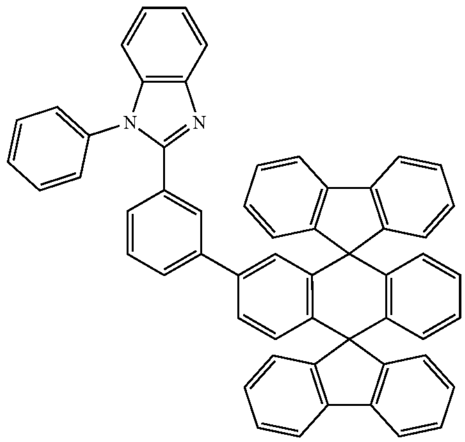
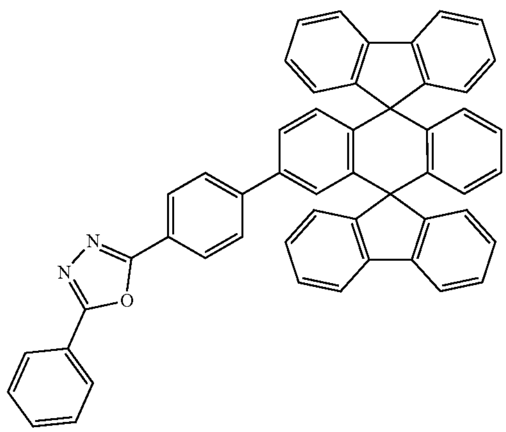
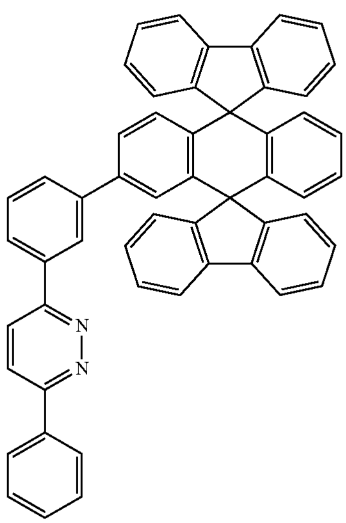
-continued
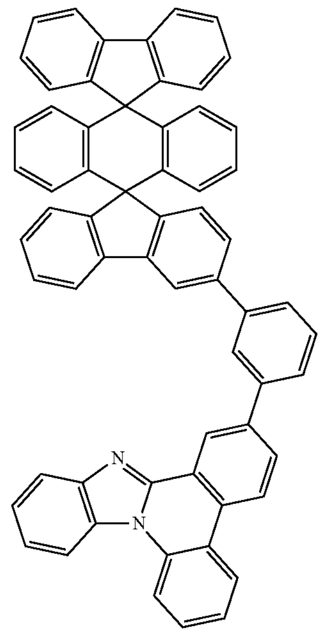
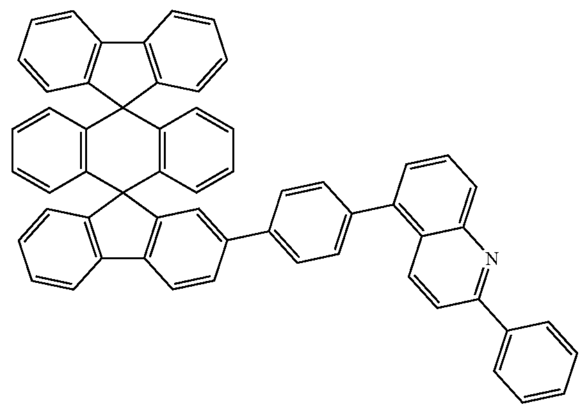
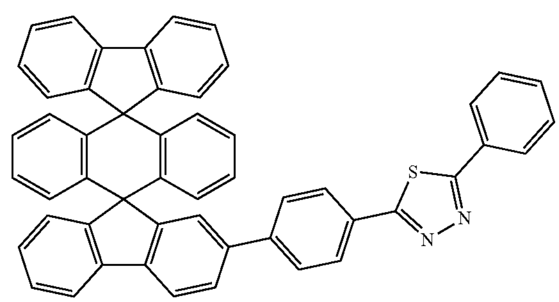
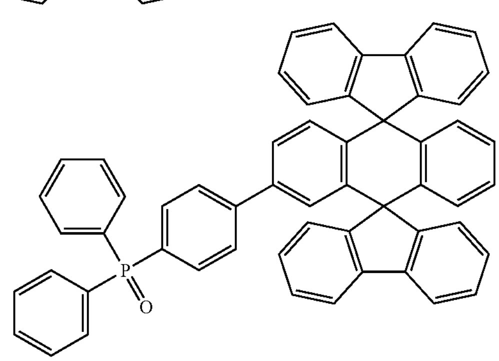

-continued
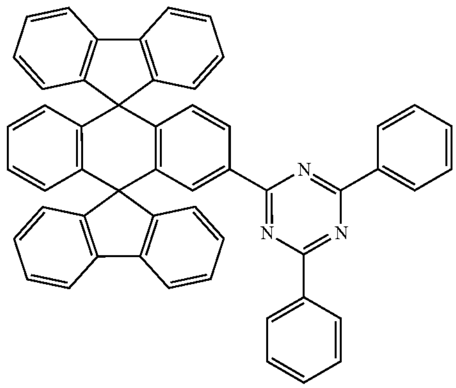
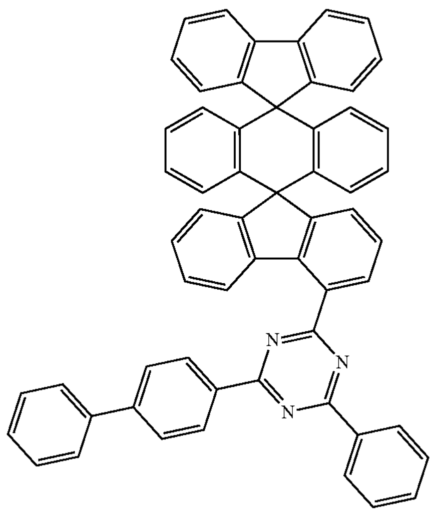
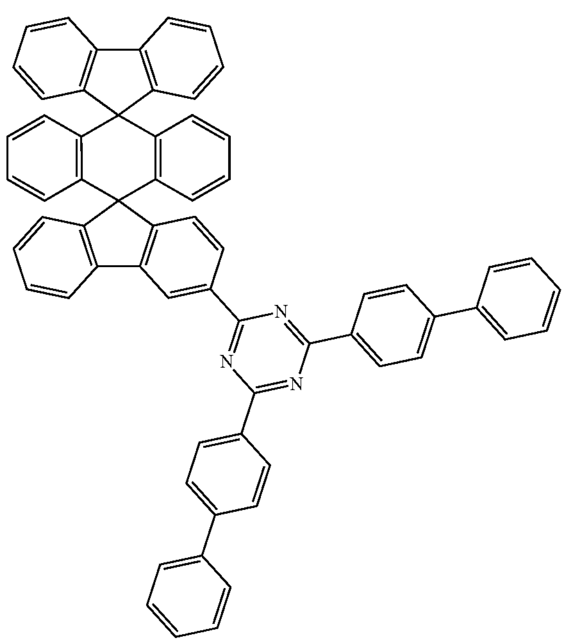
-continued
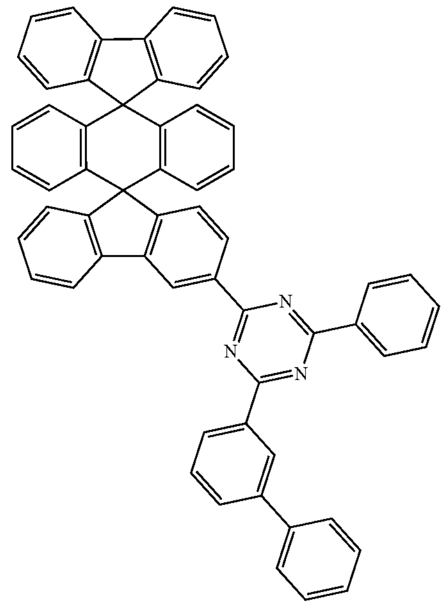
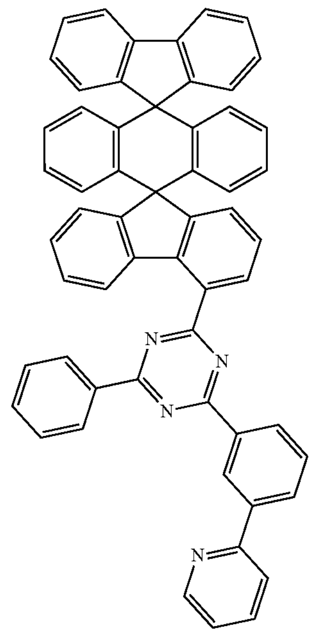
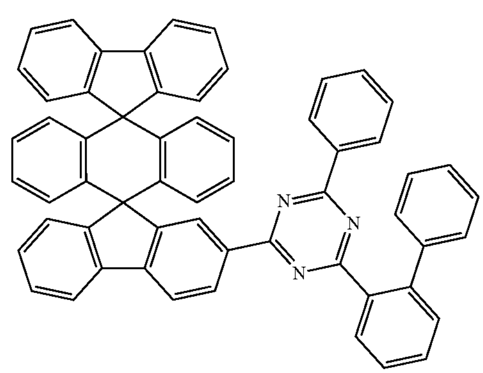

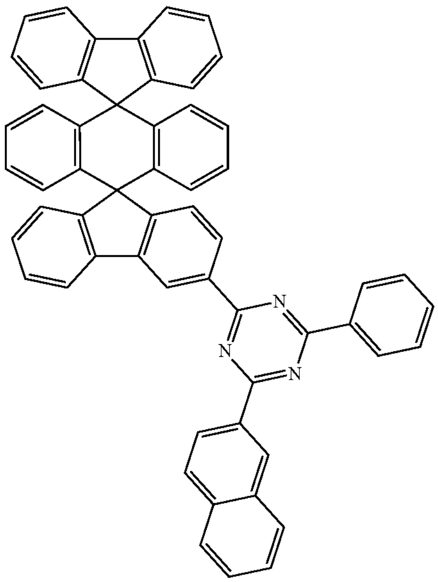
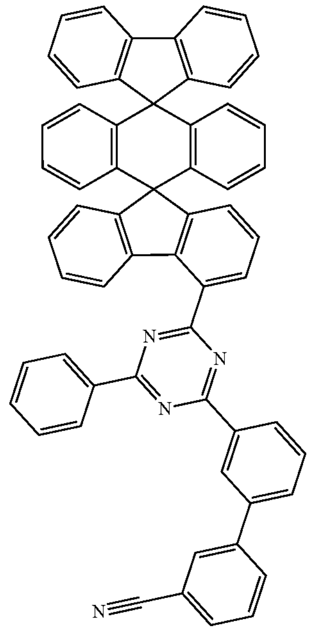
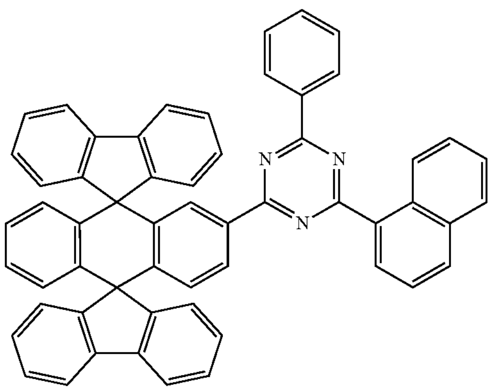
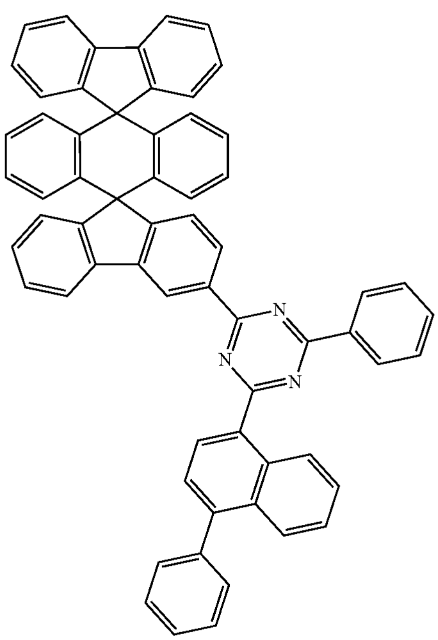
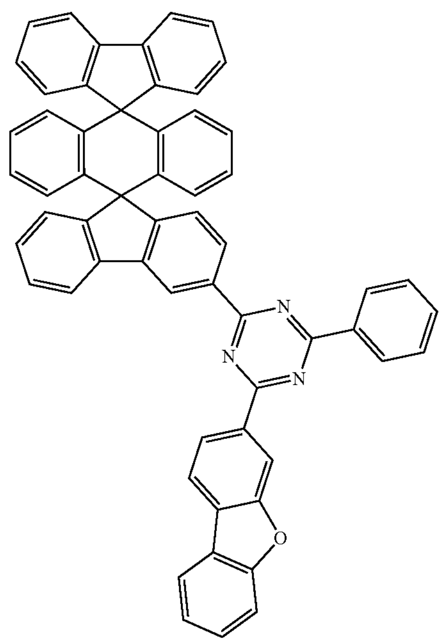

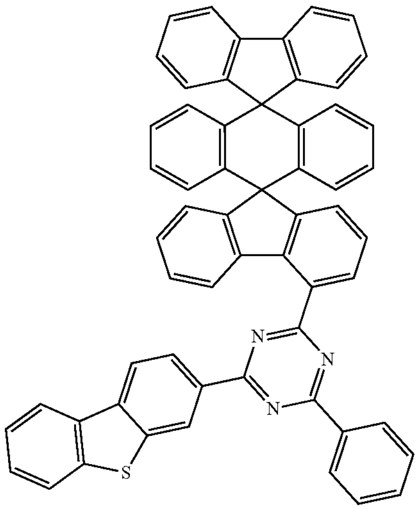
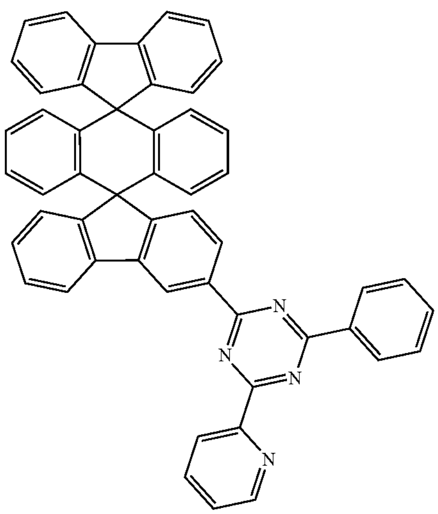
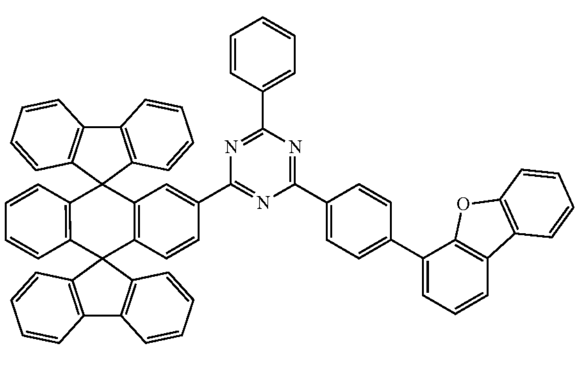
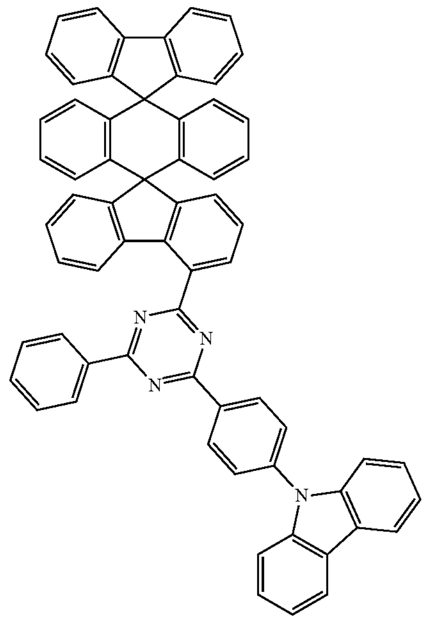
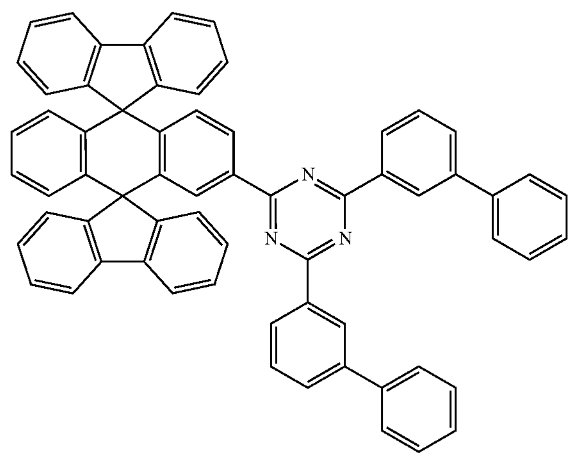
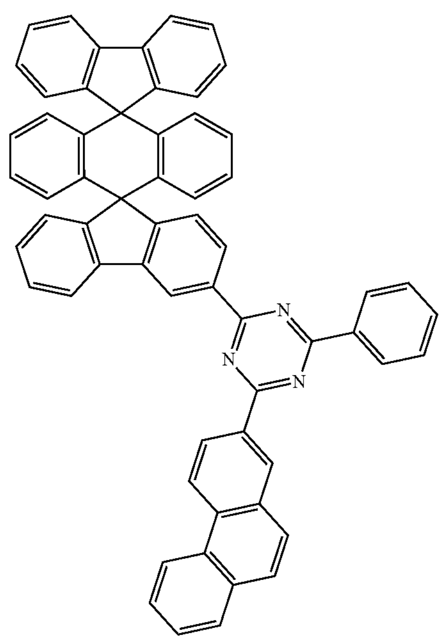

-continued
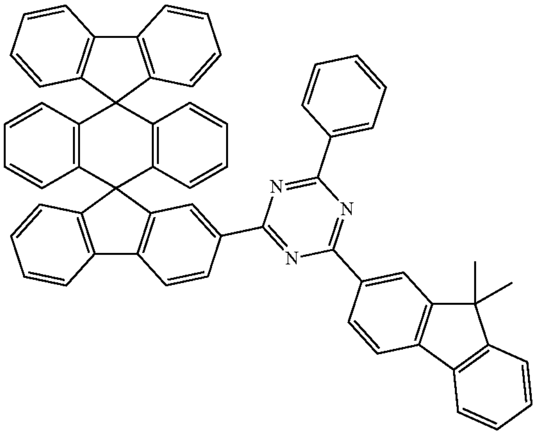
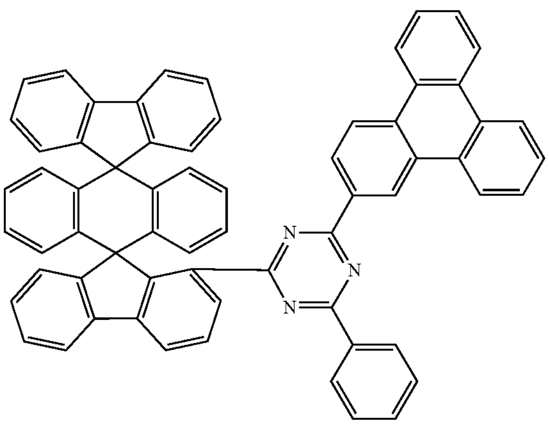
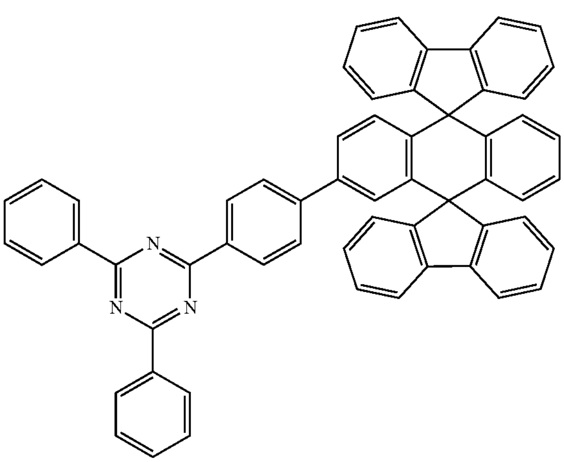
-continued
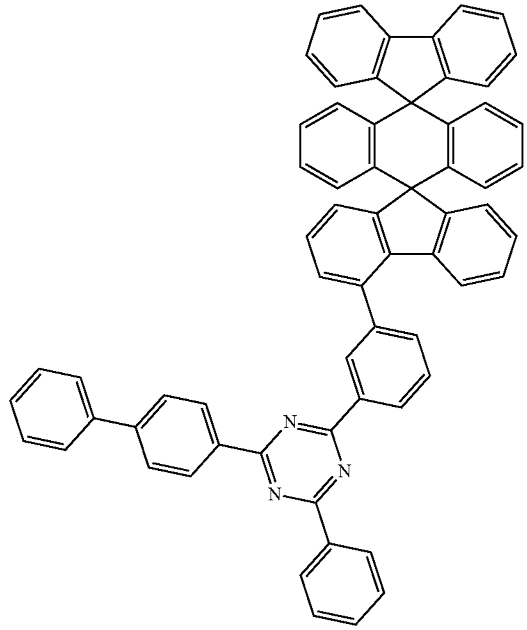
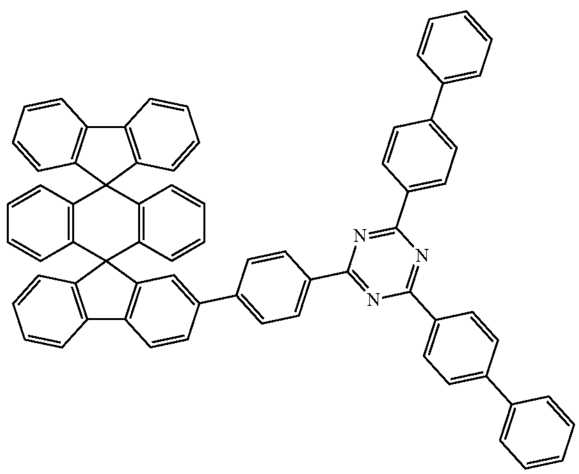
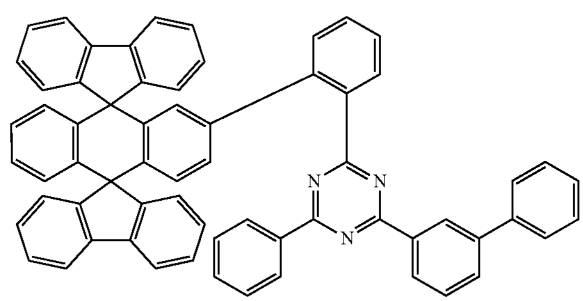

-continued
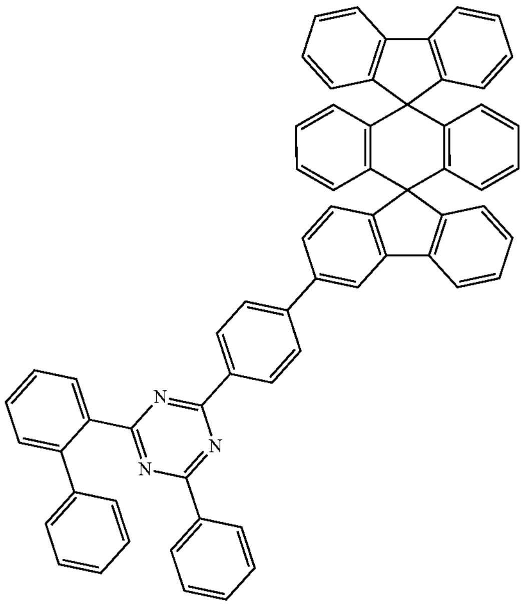
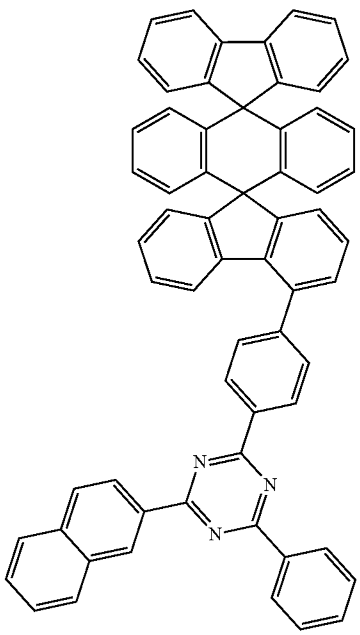
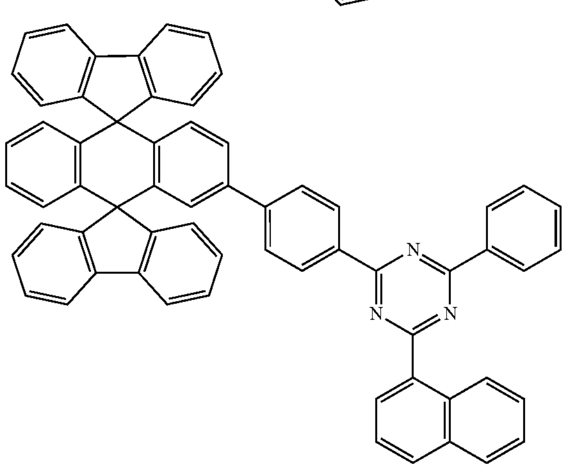
-continued
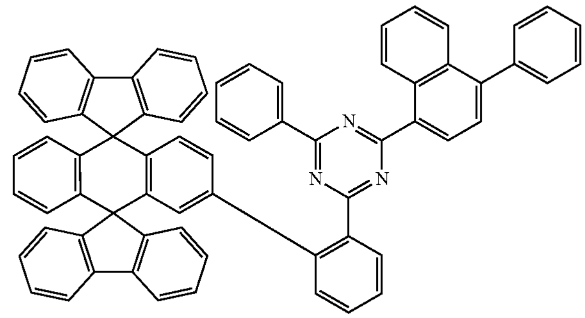
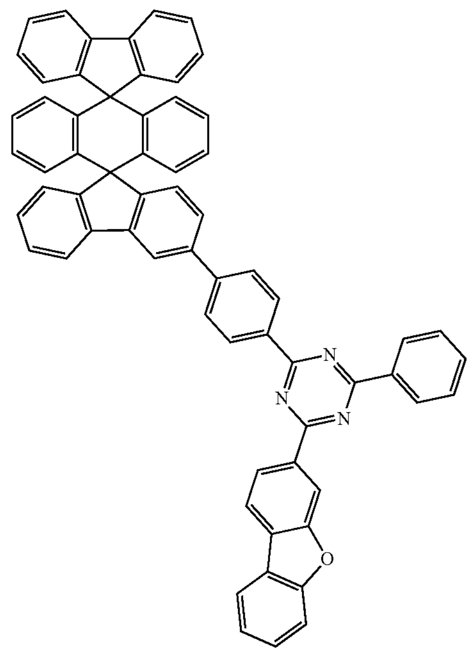
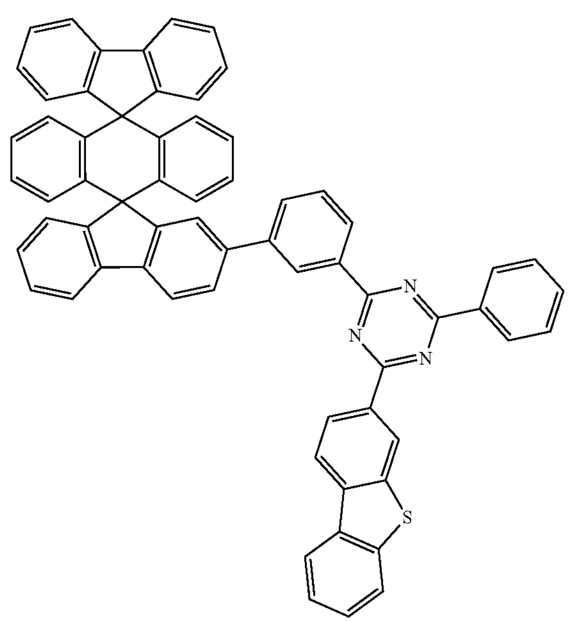

-continued
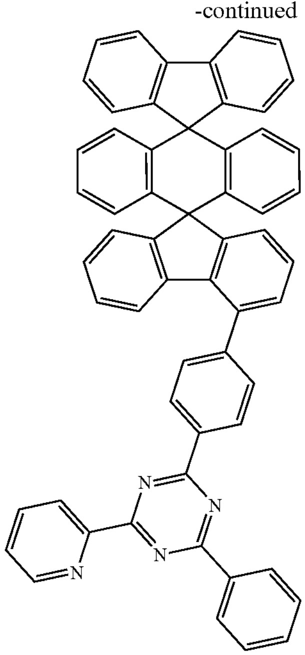
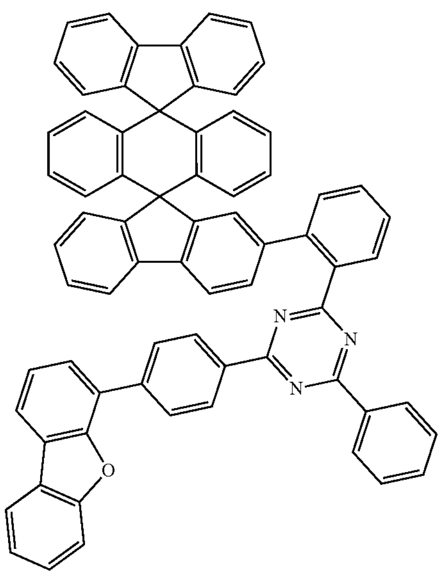
-continued
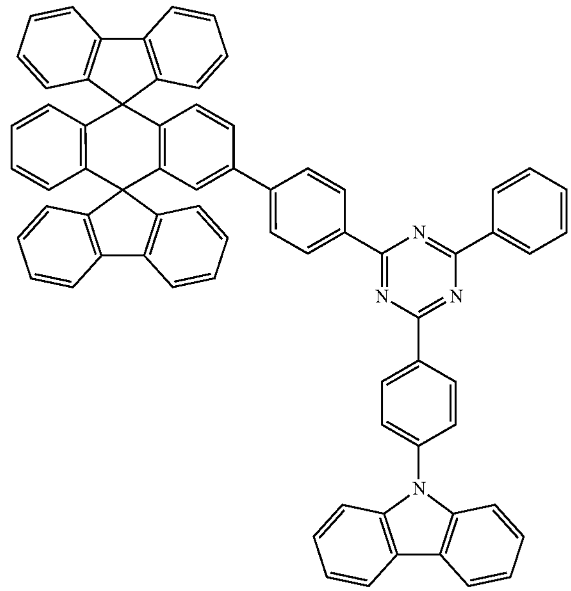
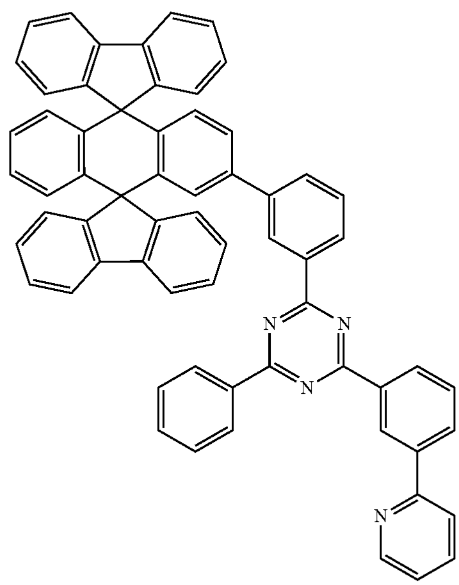
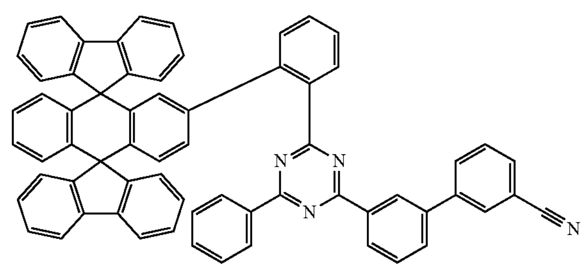

-continued
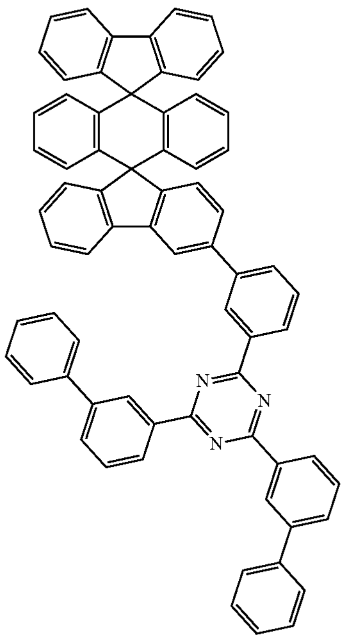
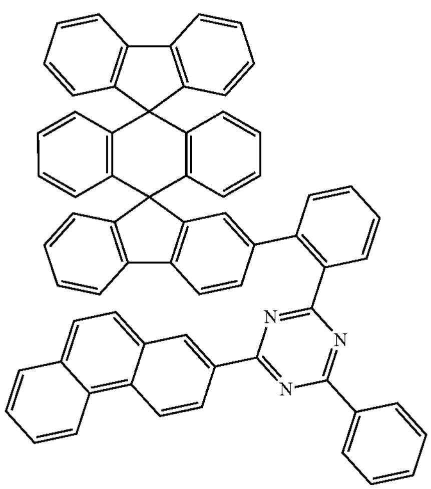
-continued
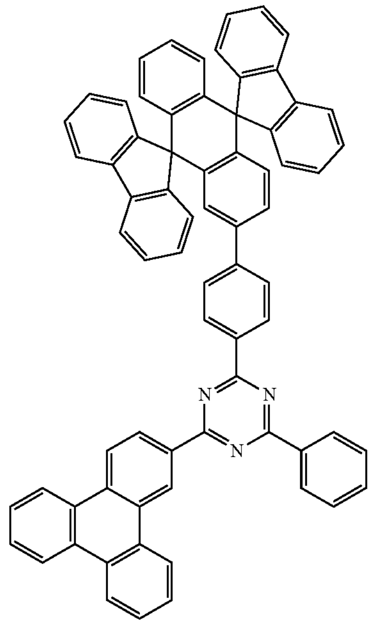
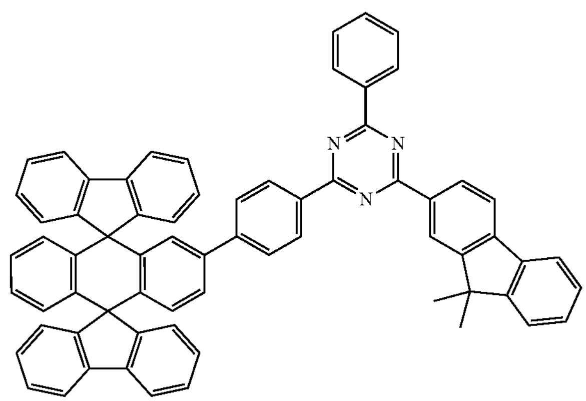
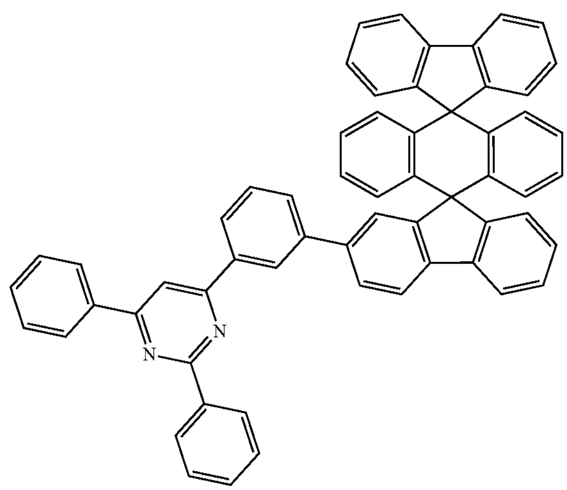

-continued
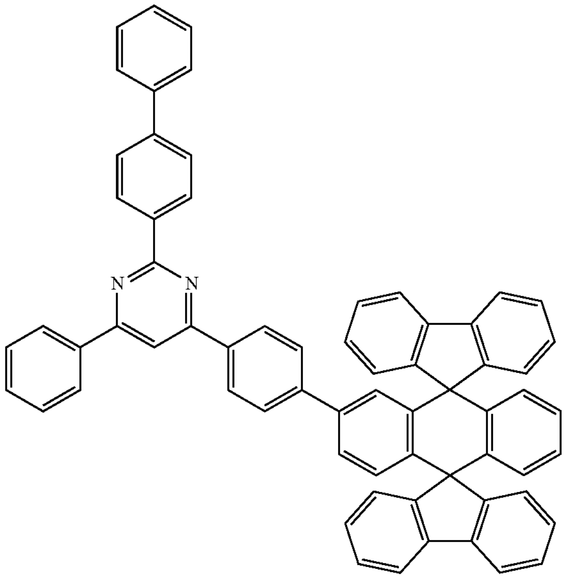
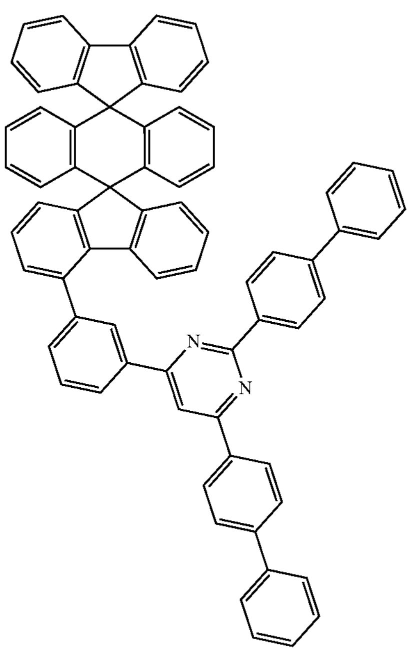
-continued
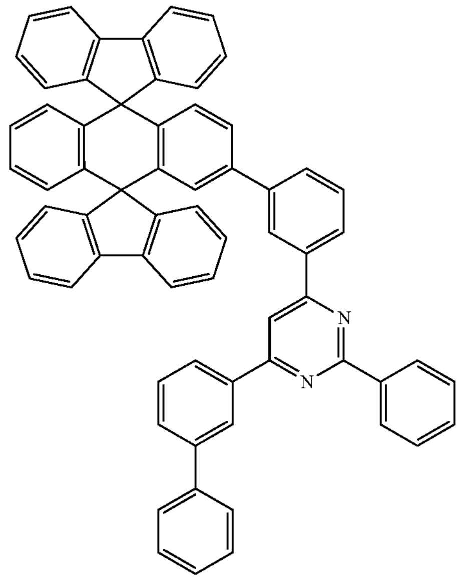
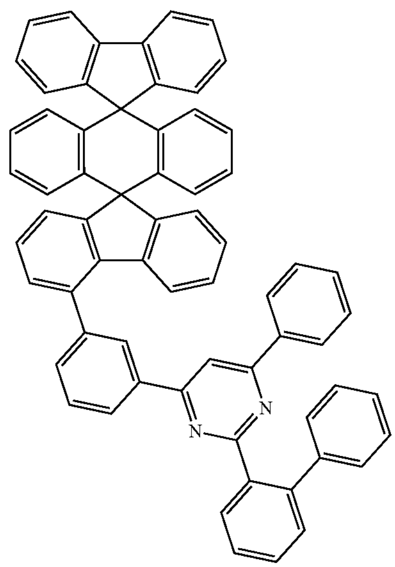
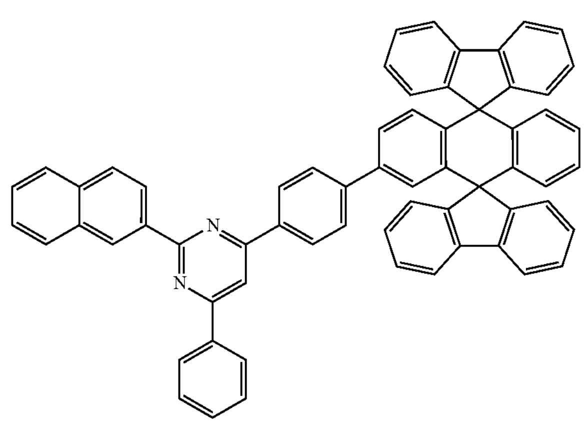

-continued
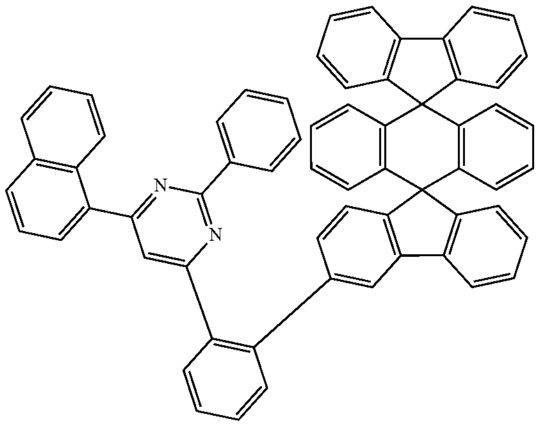
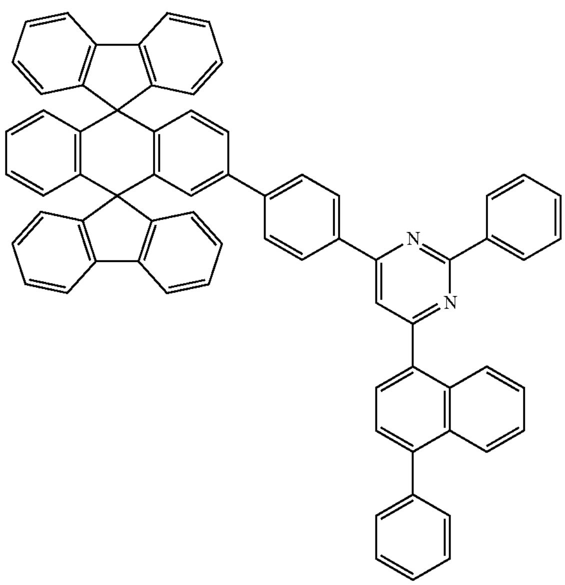
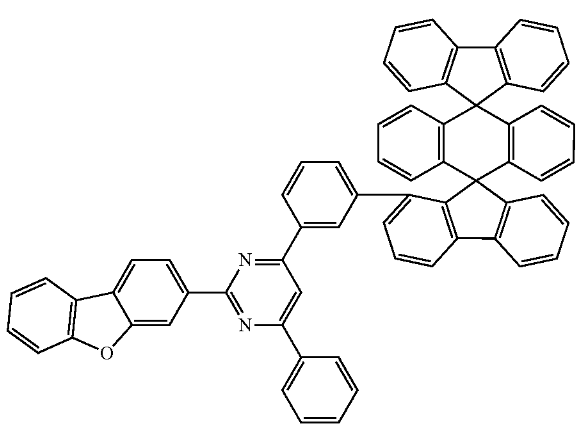
-continued
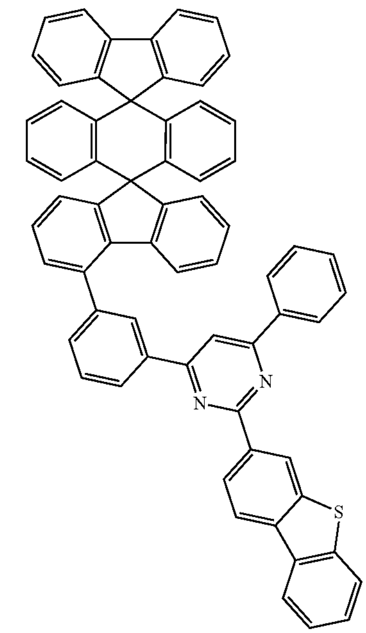
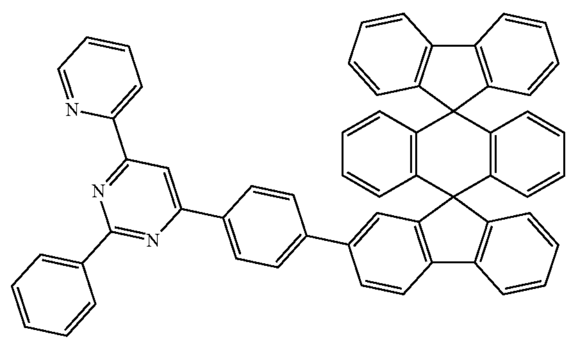
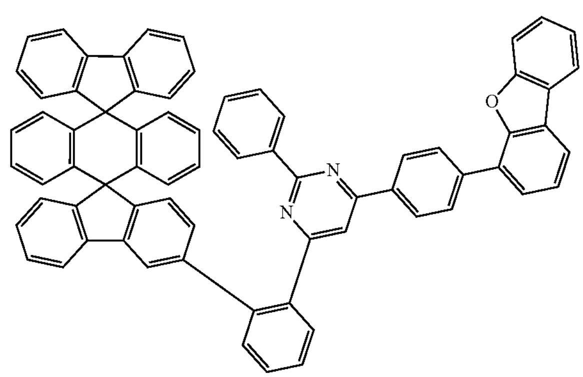

-continued
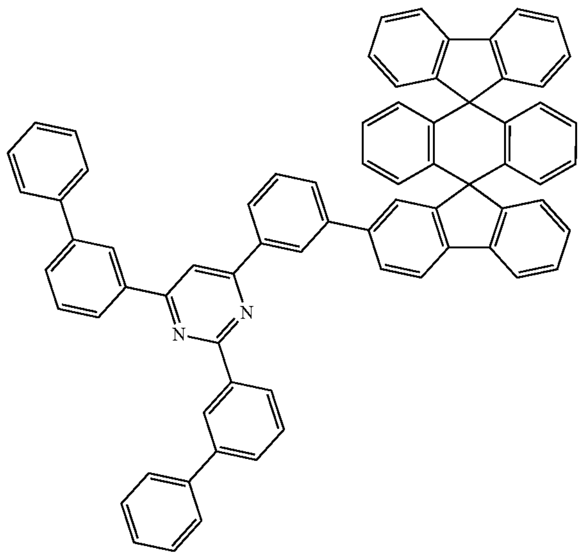
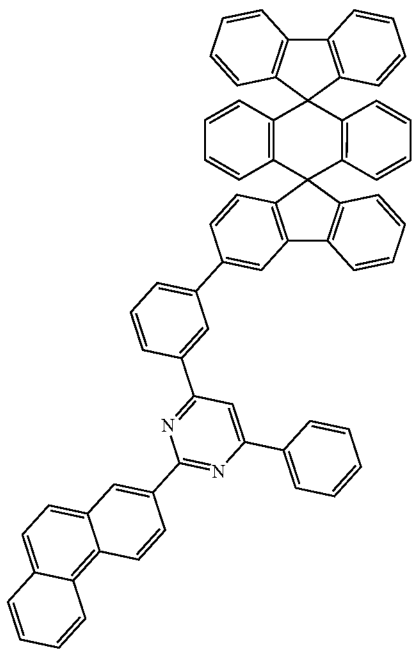
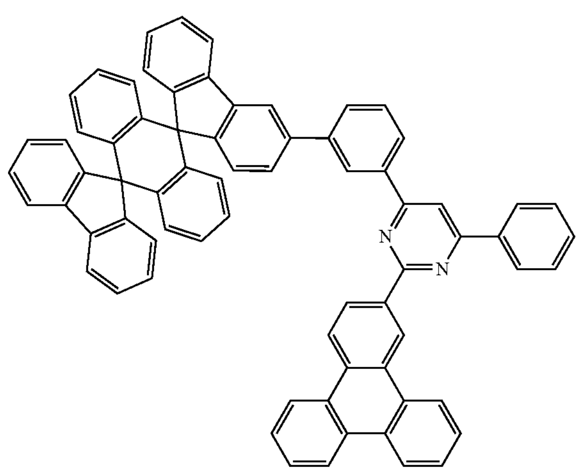
-continued
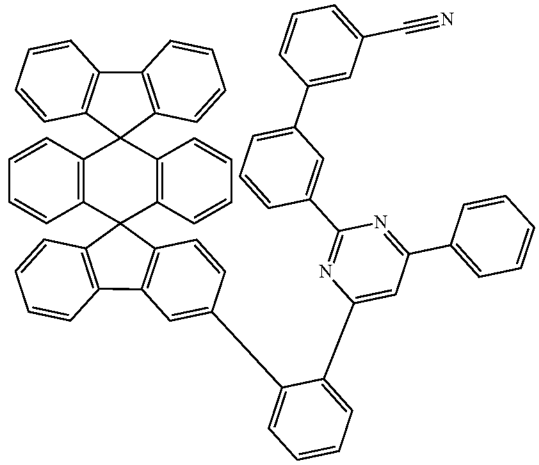
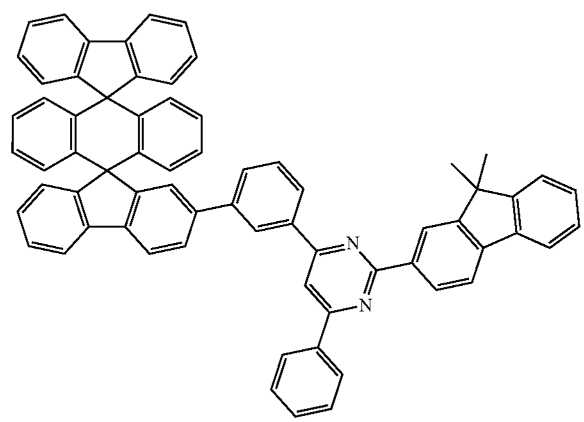
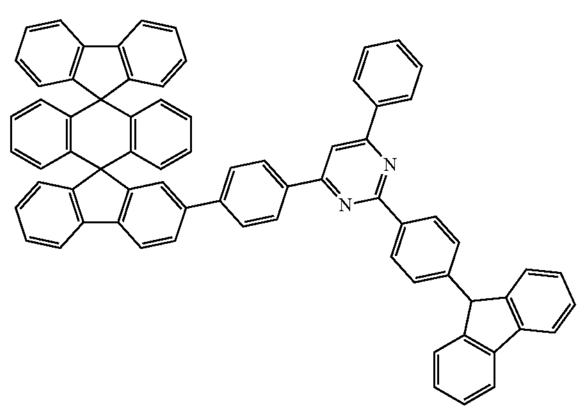

-continued
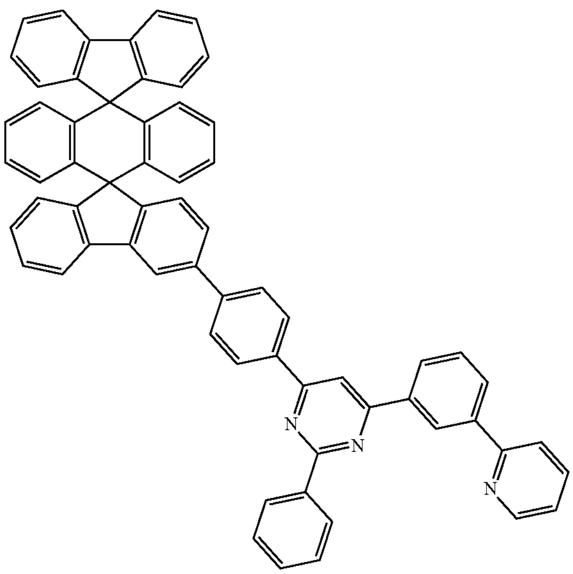
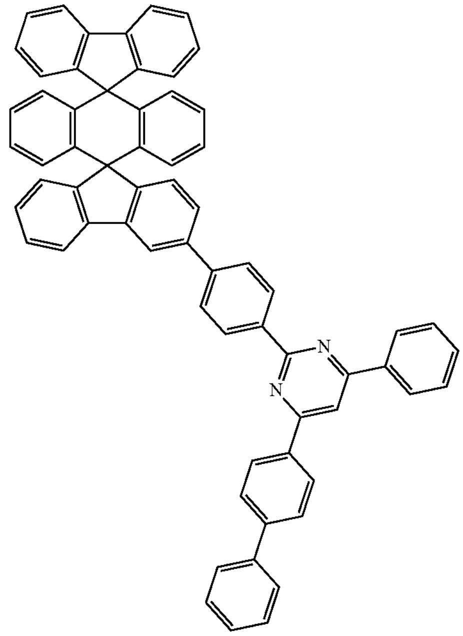
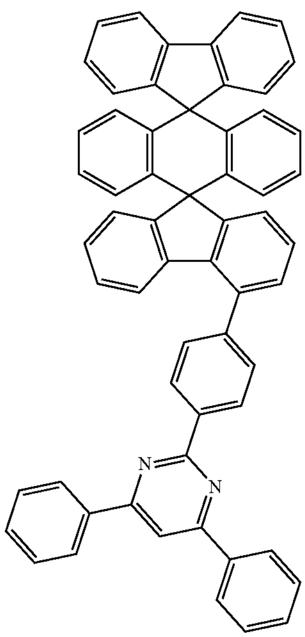
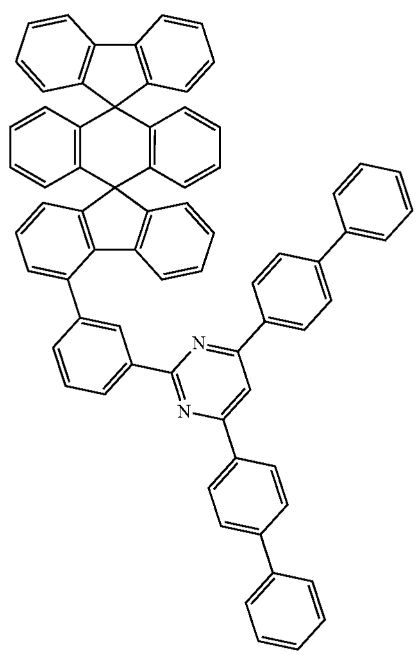
-continued

-continued
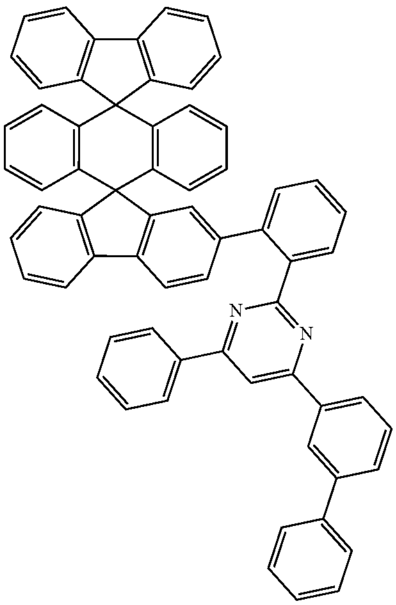
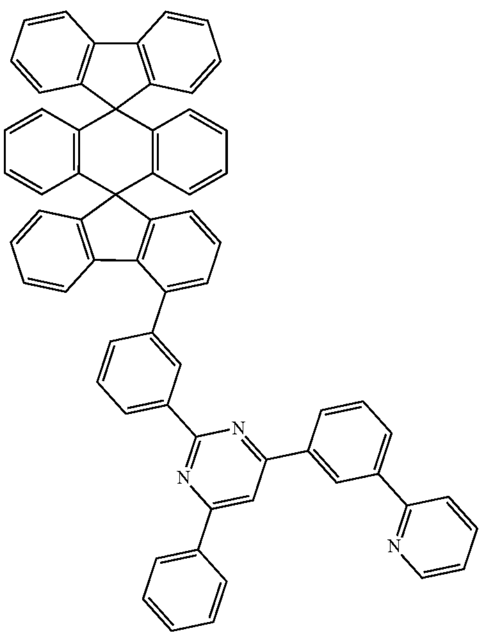
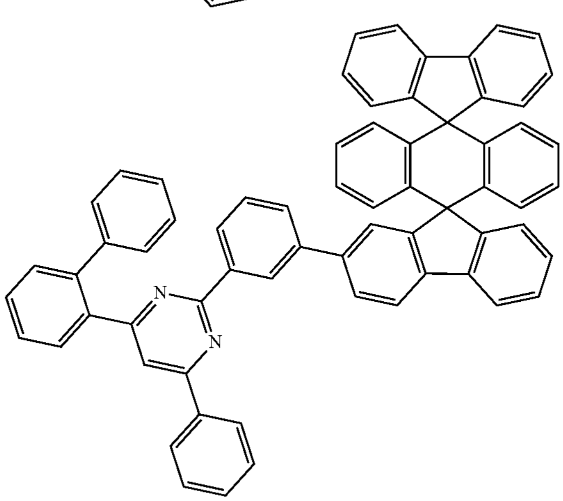
-continued
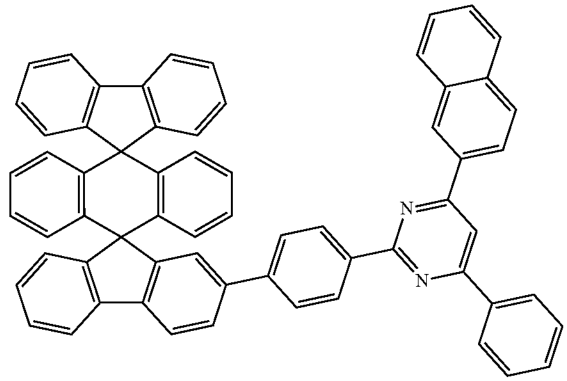
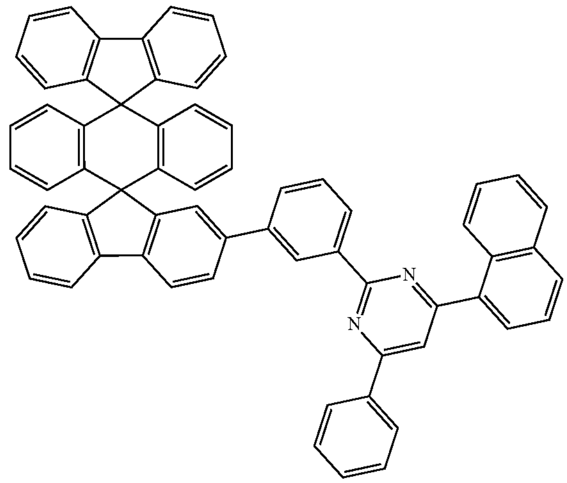
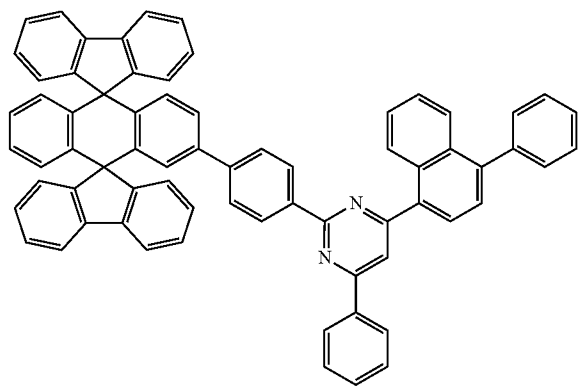
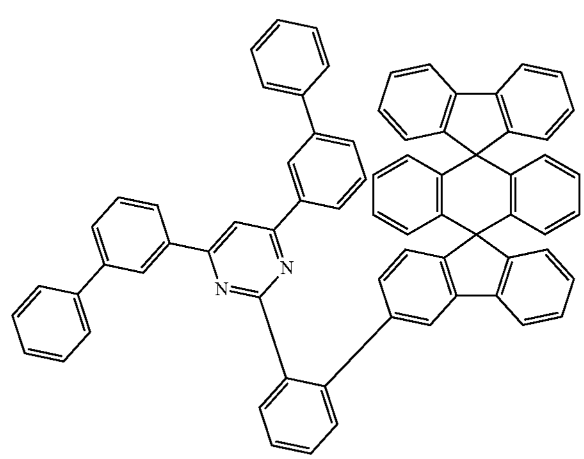

-continued
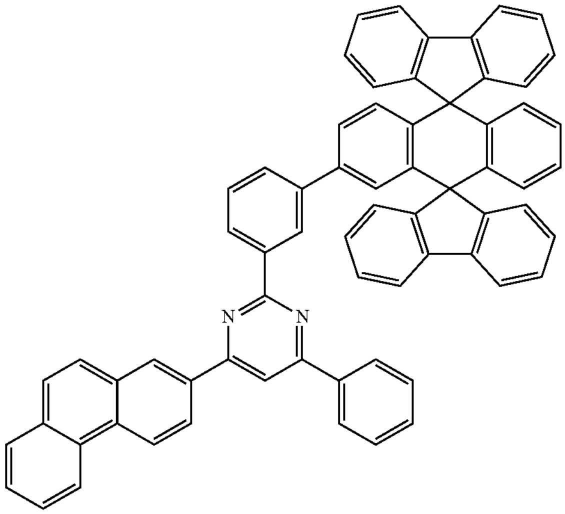
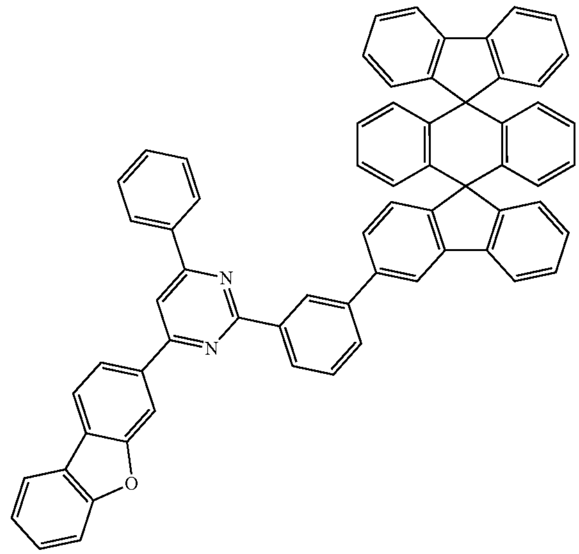
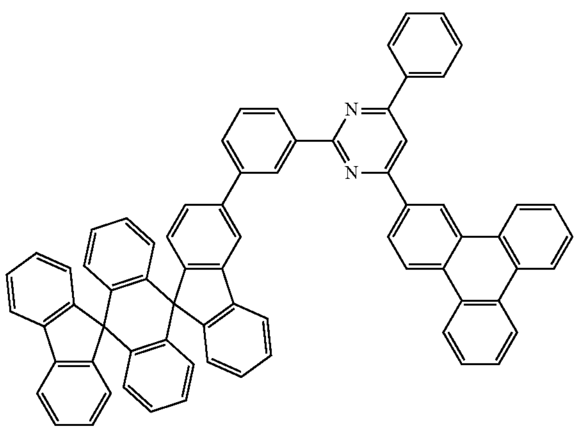
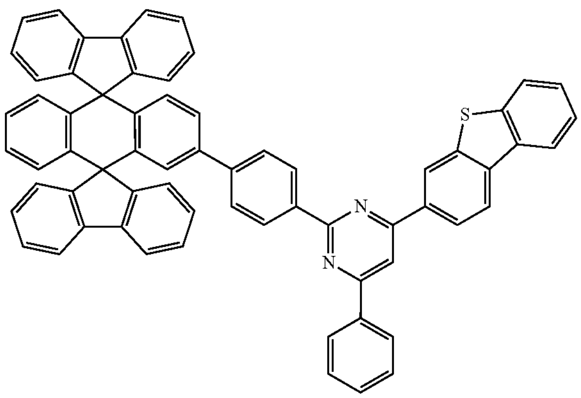
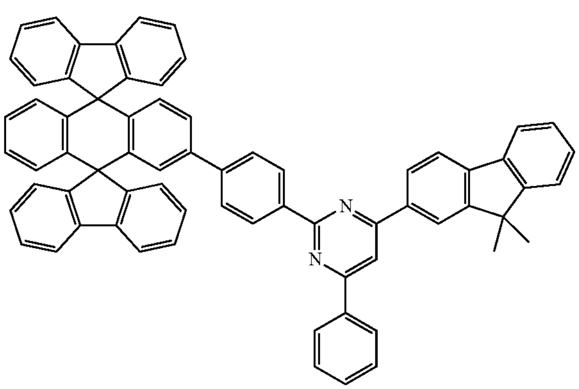
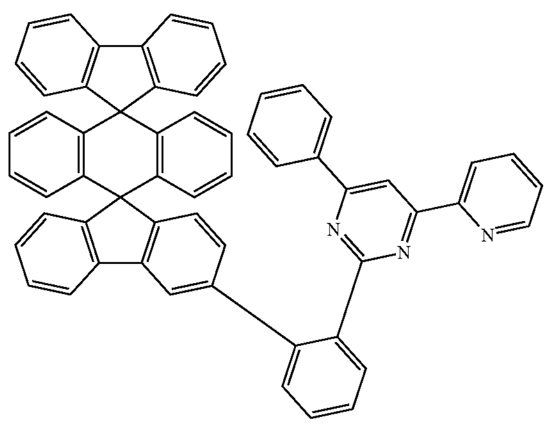

-continued

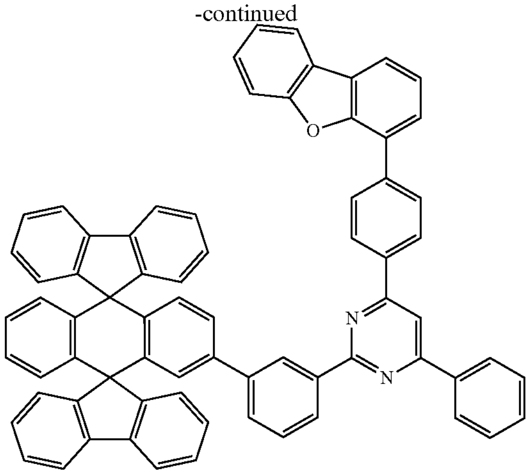

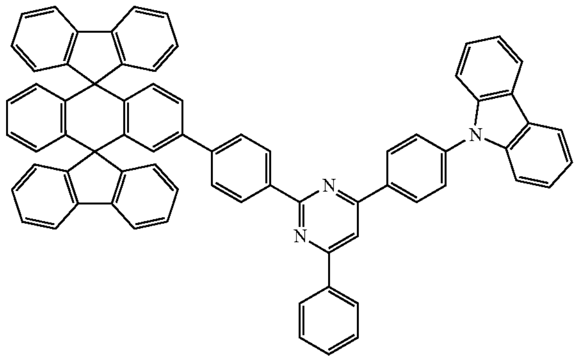

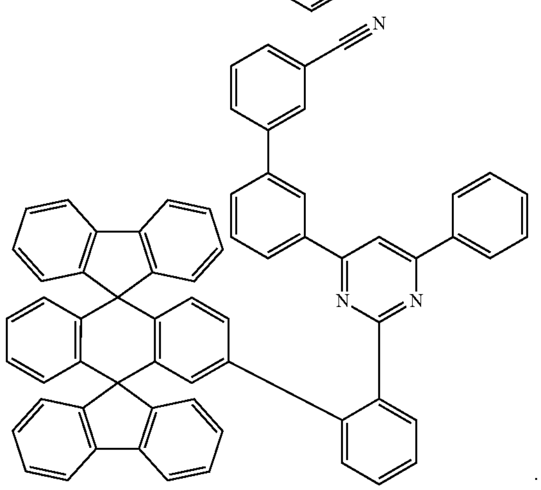

Furthermore, an exemplary embodiment of the present specification can provide an organic electroluminescent device in which three or more of the spiro compounds are included in the light emitting layer; between the anode and the light emitting layer; or between the cathode and the light emitting layer.

Further, an exemplary embodiment of the present specification can provide an organic electroluminescent device in which a hole injection layer, a hole transport layer, and a hole adjusting layer are provided between the anode and the light emitting layer.

In addition, an exemplary embodiment of the present specification can provide an organic electroluminescent device in which the hole adjusting layer is formed of a single layer or multiple layers having two or more layers.

Furthermore, an exemplary embodiment of the present specification can provide an organic electroluminescent device in which an electron injection layer, an electron transport layer, and an electron adjusting layer are provided between the cathode and the light emitting layer.

Further, an exemplary embodiment of the present specification can provide an organic electroluminescent device in which the compound of Formula 2 or 4 is present between the cathode and the light emitting layer.

In addition, an exemplary embodiment of the present specification can provide an organic electroluminescent device in which the compound of Formula 1, 3, 4, or 5 is present between the anode and the light emitting layer.

Furthermore, an exemplary embodiment of the present specification can provide an organic electroluminescent device in which at least one of the layers which are in contact with the light emitting layer includes the spiro compound.

Further, an exemplary embodiment of the present specification can provide an organic electroluminescent device in which the compound of any one of Formulae 2 to 9 is included in at least one of the layers which are in contact with the light emitting layer.

In addition, an exemplary embodiment of the present specification can provide an organic electroluminescent device in which the light emitting layer has two or more hosts.

Furthermore, an exemplary embodiment of the present specification can provide an organic electroluminescent device in which the host includes a compound of Formula 10:

Formula 10

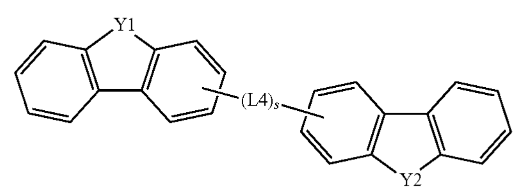

In Formula 10:

Y1 and Y2 are each independently O, S, NR7, or CR8R9;

L4 is a direct bond, a substituted or unsubstituted arylene group having 6 to 50 carbon atoms, or a substituted or unsubstituted divalent heterocyclic group having 2 to 60 carbon atoms;

R7 to R9 are each independently hydrogen, a substituted or unsubstituted alkyl group having 1 to 40 carbon atoms, a substituted or unsubstituted aryl group having 6 to 50 carbon atoms, or a substituted or unsubstituted heterocyclic group having 2 to 60 carbon atoms;

adjacent groups of R7 to R9 can be bonded to each other to form a ring; and s is an integer from 1 to 4.

According to an exemplary embodiment of the present specification, L4 is a direct bond, a substituted or unsubstituted arylene group having 6 to 50 carbon atoms, or a substituted or unsubstituted divalent heterocyclic group having 5 to 60 carbon atoms.

According to an exemplary embodiment of the present specification, R7 to R9 are each independently hydrogen, a substituted or unsubstituted alkyl group having 1 to 40 carbon atoms, a substituted or unsubstituted aryl group having 6 to 50 carbon atoms, or a substituted or unsubstituted heterocyclic group having 5 to 60 carbon atoms.

Further, an exemplary embodiment of the present specification can provide an organic electroluminescent device in which the light emitting dopant includes an organic metal complex including Ir.

In addition, an exemplary embodiment of the present specification can provide an organic electroluminescent device in which the light emitting dopant includes an Ir organic metal complex having a triplet energy ($T_{dopant}$) of 2.4 eV to 2.7 eV.

When one member is disposed "on" another member in the present specification, this includes not only a case where the one member is in contact with another member, but also a case where still another member is present between the two members.

When one part "includes" one constituent element in the present specification, unless otherwise specifically described, this does not mean that another constituent element is excluded, but means that another constituent element can be further included.

An exemplary embodiment of the present specification provides an organic electroluminescent device including an anode, a cathode, and one or more organic material layers disposed between the anode and the cathode, in which one or more layers of the organic material layers include the compound.

The one or more organic material layers of the organic electroluminescent device of the present specification can be composed of a single-layered structure, but can be composed of a multi-layered structure in which two or more organic material layers are stacked. For example, the organic material layer of the present specification can be composed of one to three layers. In addition, the organic electroluminescent device of the present specification can have a structure including a hole injection layer, a light emitting layer, an electron transport layer, and the like as organic material layers. However, the structure of the organic electroluminescent device is not limited thereto, and can include a fewer number of organic layers.

Furthermore, according to an exemplary embodiment of the present specification, the organic material layer can include an electron injection layer, an electron transport layer, or a light emitting layer, and the electron injection layer, the electron transport layer, or the light emitting layer can include the compound of Formula 1.

In an exemplary embodiment of the present specification, the organic electroluminescent device can further include one or two or more layers selected from the group consisting of a hole injection layer and a hole transport layer.

Specifically, in an exemplary embodiment of the present specification, the compound can also be included in one layer of the two or more electron injection layers, the two or more electron transport layers, or the two or more light emitting layers, and can be included in the respective two or more electron injection layers, the respective two or more electron transport layers, or the respective two or more light emitting layers.

Further, in an exemplary embodiment of the present specification, when the compound is included in the respective two or more electron injection layers, the respective two or more electron transport layers, or the respective two or more light emitting layers, the other materials except for the compound can be the same as or different from each other.

In another exemplary embodiment, the organic electroluminescent device can be an organic electroluminescent device having a normal type structure in which an anode, one or more organic material layers, and a cathode are sequentially stacked on a substrate.

In still another exemplary embodiment, the organic electroluminescent device can be an organic electroluminescent device having an inverted type structure in which a cathode, one or more organic material layers, and an anode are sequentially stacked on a substrate.

The organic electroluminescent device can have, for example, a stacking structure described below, but the stacking structure is not limited thereto.

(1) Anode/Hole transport layer/Light emitting layer/Cathode (2) Anode/Hole injection layer/Hole transport layer/Light emitting layer/Cathode (3) Anode/Hole injection layer/Hole buffer layer/Hole transport layer/Light emitting layer/Cathode (4) Anode/Hole transport layer/Light emitting layer/Electron transport layer/Cathode (5) Anode/Hole transport layer/Light emitting layer/Electron transport layer/Electron injection layer/Cathode (6) Anode/Hole injection layer/Hole transport layer/Light emitting layer/Electron transport layer/Cathode (7) Anode/Hole injection layer/Hole transport layer/Light emitting layer/Electron transport layer/Electron injection layer/Cathode (8) Anode/Hole injection layer/Hole buffer layer/Hole transport layer/Light emitting layer/Electron transport layer/Cathode (9) Anode/Hole injection layer/Hole buffer layer/Hole transport layer/Light emitting layer/Electron transport layer/Electron injection layer/Cathode

(10) Anode/Hole transport layer/Electron blocking layer/Light emitting layer/Electron transport layer/Cathode

(11) Anode/Hole transport layer/Electron blocking layer/Light emitting layer/Electron transport layer/Electron injection layer/Cathode

(12) Anode/Hole injection layer/Hole transport layer/Electron blocking layer/Light emitting layer/Electron transport layer/Cathode

(13) Anode/Hole injection layer/Hole transport layer/Electron blocking layer/Light emitting layer/Electron transport layer/Electron injection layer/Cathode

(14) Anode/Hole transport layer/Light emitting layer/Hole blocking layer/Electron transport layer/Cathode

(15) Anode/Hole transport layer/Light emitting layer/Hole blocking layer/Electron transport layer/Electron injection layer/Cathode

(16) Anode/Hole injection layer/Hole transport layer/Light emitting layer/Hole blocking layer/Electron transport layer/Cathode

(17) Anode/Hole injection layer/Hole transport layer/Light emitting layer/Hole blocking layer/Electron transport layer/Electron injection layer/Cathode

(18) Anode/Hole injection layer/Hole transport layer/Light emitting layer/Layer which simultaneously injects and transports electrons/Cathode

(19) Anode/Hole injection layer/Hole transport layer/Hole adjusting layer/Light emitting layer/Electron adjusting layer/Electron transport layer/Cathode

(20) Anode/Hole injection layer/Hole transport layer/First hole adjusting layer/Second hole adjusting layer/Light emitting layer/Electron adjusting layer/Electron transport layer/Cathode For example, the structure of the organic electroluminescent device according to an exemplary embodiment of the present specification is exemplified in FIG. 1.

FIG. 1 exemplifies a structure of an organic electroluminescent device in which a substrate 1, an anode 2, a hole transport layer 5, a light emitting layer 3, an electron transport layer 7, an electron injection layer 6, and a cathode 4 are sequentially stacked. In the structure described above, the compound can be included in the electron transport layer 7, the electron injection layer 6, or the light emitting layer 3.

The organic electroluminescent device of the present specification can be manufactured by the materials and methods known in the art, except that one or more layers of the organic material layers include the compound of Formula 1 of the present specification, that is, the compound.

When the organic electroluminescent device includes a plurality of organic material layers, the organic material layers can be formed of the same material or different materials.

The organic electroluminescent device of the present specification can be manufactured by the materials and methods known in the art, except that one or more layers of the organic material layers include the compound, that is, the compound of Formula 1.

For example, the organic electroluminescent device of the present specification can be manufactured by sequentially stacking an anode, an organic material layer, and a cathode on a substrate. In this case, the organic electroluminescent device can be manufactured by depositing a metal or a metal oxide having conductivity, or an alloy thereof on a substrate to form an anode, forming an organic material layer including a hole injection layer, a hole transport layer, a light emitting layer, and an electron transport layer thereon, and then depositing a material, which can be used as a cathode, thereon, by using a physical vapor deposition (PVD) method such as sputtering or e-beam evaporation. In addition to the method as described above, an organic electroluminescent device can be made by subsequently depositing a cathode material, an organic material layer, and an anode material on a substrate.

Further, the compound of Formula 1 can be formed as an organic material layer by not only a vacuum deposition method, but also a solution application method when an organic electroluminescent device is manufactured. Here, the solution application method means spin coating, dip coating, doctor blading, inkjet printing, screen printing, a spray method, roll coating, and the like, but is not limited thereto.

In addition to the method as described above, an organic electroluminescent device can also be made by sequentially stacking a cathode material, an organic material layer, and an anode material on a substrate (International Publication No. WO2003/012890). However, the manufacturing method is not limited thereto.

As the anode material, materials having a high work function are usually preferred so as to facilitate the injection of holes into an organic material layer. Specific examples of the anode material which can be used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer such as poly(3-methyl-thiophene), poly[3,4-(ethylene-1,2-dioxy)thiophene] (PEDOT), polypyrrole, and polyaniline; and the like, but are not limited thereto.

As the cathode material, materials having a low work function are usually preferred so as to facilitate the injection of electrons into an organic material layer. Specific examples of the cathode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which injects holes from an electrode, and a hole injection material is preferably a compound which has a capability of transporting holes and thus has an effect of injecting holes at an anode and an excellent effect of injecting holes into a light emitting layer or a light emitting material, prevents excitons produced from a light emitting layer from moving to an electron injection layer or an electron injection material, and is also excellent in the ability to form a thin film. The highest occupied molecular orbital (HOMO) of the hole injection material is preferably a value between the work function of the anode material and the HOMO of the neighboring organic material layer. Specific examples of the hole injection material include metal porphyrin, oligothiophene, arylamine-based organic materials, hexanitrile hexaaza-triphenylene-based organic materials, quinacridone-based organic materials, perylene-based organic materials, anthraquinone, polyaniline-based and polythiophene-based conductive polymers, and the like, but are not limited thereto.

The hole transport layer is a layer which accepts holes from a hole injection layer and transports the holes to a light emitting layer, and a hole transport material is suitably a material having high hole mobility which can accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

The light emitting material is a material which can receive holes and electrons from a hole transport layer and an electron transport layer, respectively, and combine the holes and the electrons to emit light in a visible ray region, and is preferably a material having high quantum efficiency for fluorescence or phosphorescence. Specific examples thereof include: an 8-hydroxy-quinoline aluminum complex ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylene-vinylene) (PPV)-based polymers; spiro compounds; polyfluorene, rubrene, and the like, but are not limited thereto.

The electron transport layer is a layer which accepts electrons from an electron injection layer and transports the electrons to a light emitting layer, and an electron transport material is suitably a material having high electron mobility which can proficiently accept electrons from a cathode and transfer the electrons to a light emitting layer, except for the compound according to an exemplary embodiment of the present specification. Specific examples thereof include: Al complexes of 8-hydroxyquinoline, complexes including $Alq_3$, organic radical compounds, hydroxyflavone-metal complexes, and the like, but are not limited thereto. The electron transport layer can be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and an electron injection material is preferably a compound which has a capability of transporting electrons, has an effect of injecting electrons from a cathode and an excellent effect of injecting electrons into a light emitting layer or a light emitting material, prevents excitons produced from a light emitting layer from moving to a hole injection layer, and is also excellent in the ability to form a thin film, except for the compound according to an exemplary embodiment of the present specification. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo-[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

An electron blocking layer or hole adjusting layer can be provided between a hole transport layer and a light emitting layer. For the electron blocking layer or hole adjusting layer, materials known in the art can be used.

The hole blocking layer or electron adjusting layer is a layer which blocks holes from reaching a cathode and adjust electrons. Specific examples thereof include oxadiazole derivatives or triazole derivatives, phenanthroline derivatives, BCP, aluminum complexes, and the like, but are not limited thereto.

The organic electroluminescent device according to the present specification can be a top emission type, a bottom emission type, or a dual emission type according to the material to be used.

EXAMPLES

The manufacture of an organic electroluminescent device including the compound of Formula 1 will be specifically described in the following Examples. However, the following Examples are provided for exemplifying the present specification, and the scope of the present specification is not limited thereby.

<Reference Example 1> Derivation of Energy Levels

Calculation of HOMO/LUMO

In order to understand the distribution of electrons in the molecule and optical properties, a determined structure is required. Further, an electronic structure has different structures in neutral, anionic, and cationic states depending on the charge state of the molecule. In order to drive a device, all the energy levels in the neutral state, the cationic state, and the anionic state are important, but representatively, a highest occupied molecular orbital (HOMO) and a lowest unoccupied molecular orbital (LUMO) in the neutral state are recognized as important properties.

In order to determine the molecular structure of a chemical material, a structure inputted using a density functional theory (DFT) is optimized. In order to calculate a DFT, a BPW91 calculation method (Becke exchange and Perdew correlation-correlation functional) and a double numerical basis set including polarization functional (DNP basis set) are used. The BPW91 calculation method is published in the paper 'A. D. Becke, Phys. Rev. A, 38, 3098 (1988)' and "J. P. Perdew and Y. Wang, Phys. Rev. B, 45, 13244 (1992)', and the DNP basis set is published in the paper 'B. Delley, J. Chem. Phys., 92, 508 (1990)'.

In order to perform the calculation by the density functional theory, the 'DMol3' package manufactured by BIOVIA Dassault Systèmes can be used. When an optimal molecular structure is determined using the given method, it is possible to obtain, as a result, an energy level which can be occupied by electrons. The HOMO energy refers to the orbital energy at the highest energy level among the molecular orbitals which are filled with electrons when energy in a neutral state is obtained, and the LUMO energy corresponds to the orbital energy at the lowest energy level among the molecular orbitals which are not filled with electrons.

T1 Calculation

In order to obtain physical properties of the optimal molecular structure determined by the method in the excited state, singlet and triplet energy levels are calculated using a time dependent density functional theory (TD-DFT). The density functional theory can be calculated using the 'Gaussian09' package which is a commercially available calculation program developed by Gaussian, Inc. In order to calculate the time dependent density functional theory, the B3PW91 calculation method (Becke exchange and Perdew correlation-correlation functional) and a 6-31G* basis set are used. The 6-31G* basis set is published in the paper 'Hehre et al., J. Chem. Phys. 56, 2257 (1972)'.

The energy possessed by an optimal molecular structure determined using the density functional theory when the electronic arrangement is singlet and triplet is calculated using the time dependent density functional theory (TD-DFT).

Compounds used in Device Examples presented below can be distributed in respective organic material layers corresponding to a hole transport region, an electron transport region, and a light emitting layer to constitute an organic electroluminescent device, all of the other organic materials, except for a light emitting dopant, among organic materials included in the one or more organic material layers have a triplet energy ($T_{org}$) of 2.5 eV or more, three or more of the organic materials having a triplet energy ($T_{org}$) of 2.5 eV or more have a triplet energy ($T_{org}$) of 2.7 eV or more, and two or more of the organic materials having a triplet energy ($T_{org}$) of 2.5 eV or more include a spiro compound.

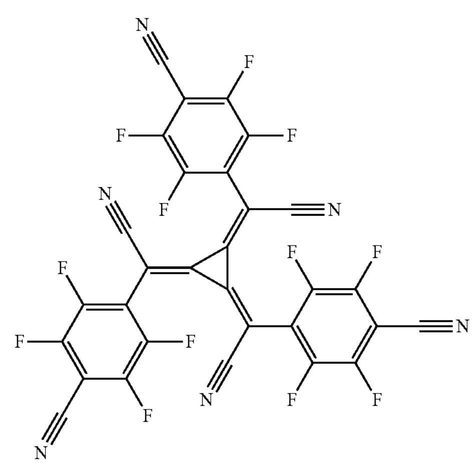

PD1

-continued
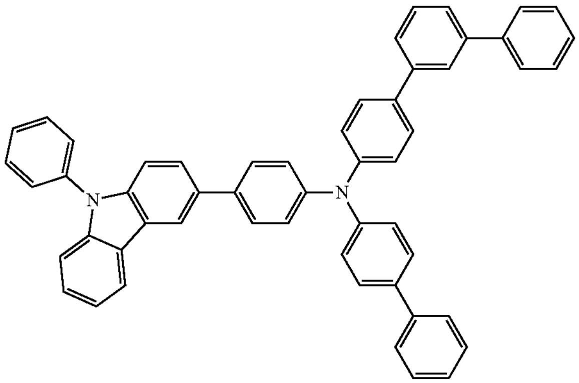
HT1
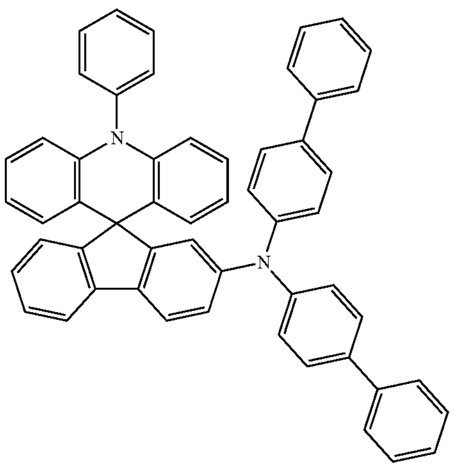
HT2-1
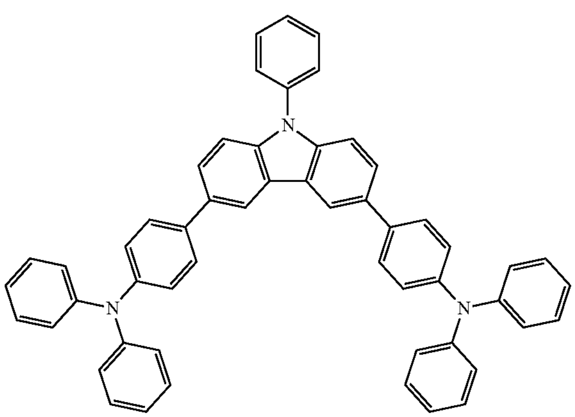
HT2-2
-continued
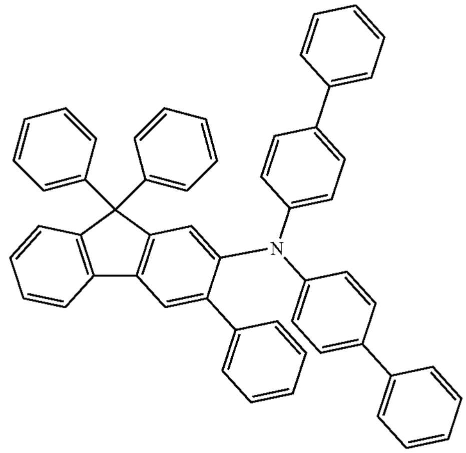
HT2-3
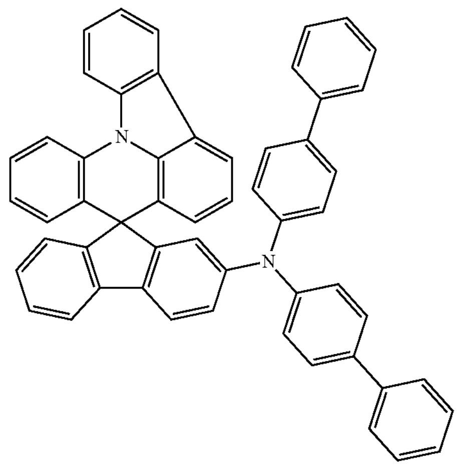
HT2-4
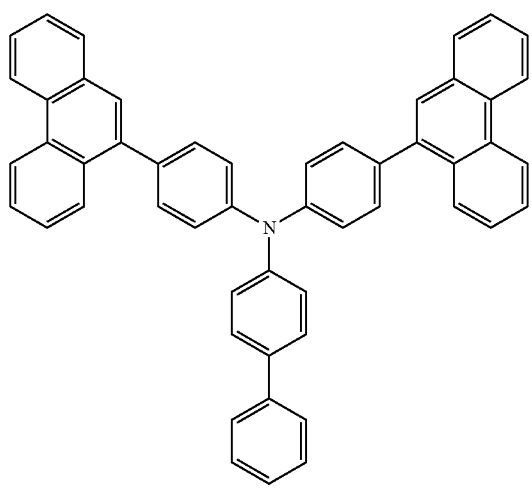
EB2

-continued
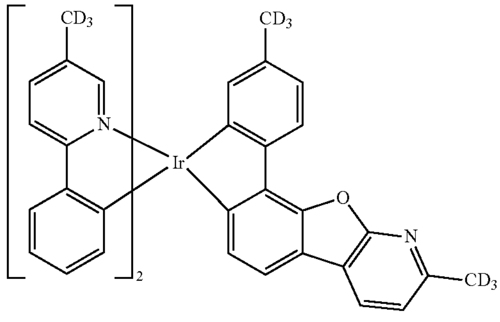
GD1
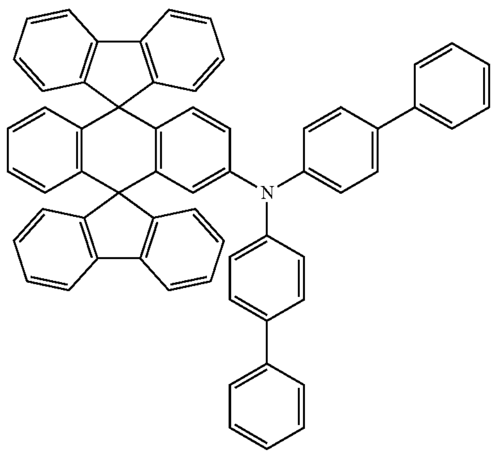
EB3
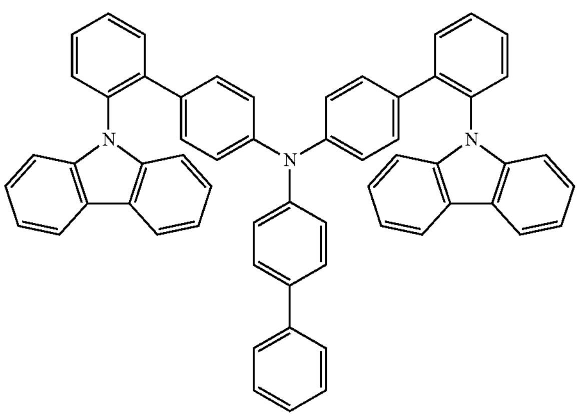
EB4
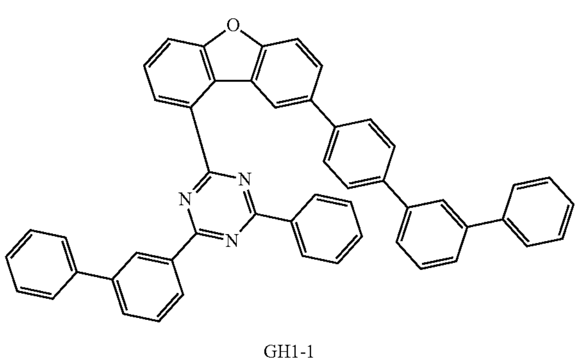
GH1-1
-continued
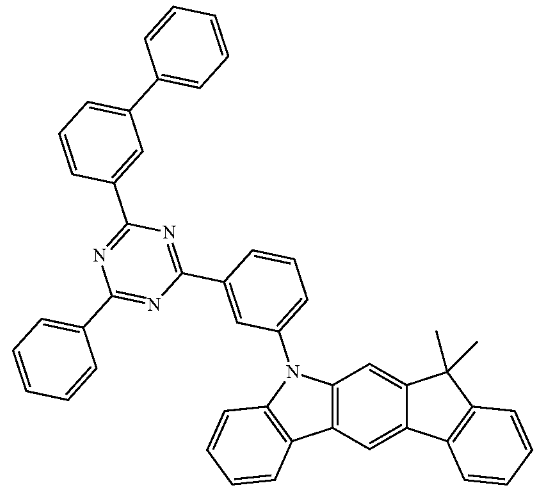
GH1-2
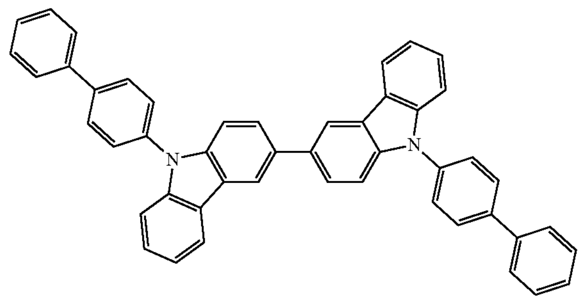
GH2-1
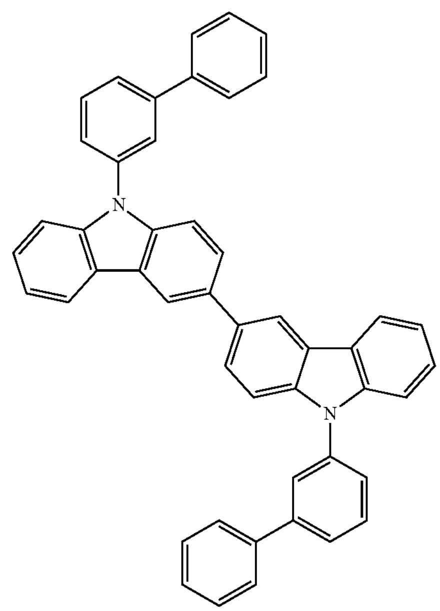
GH2-2

-continued
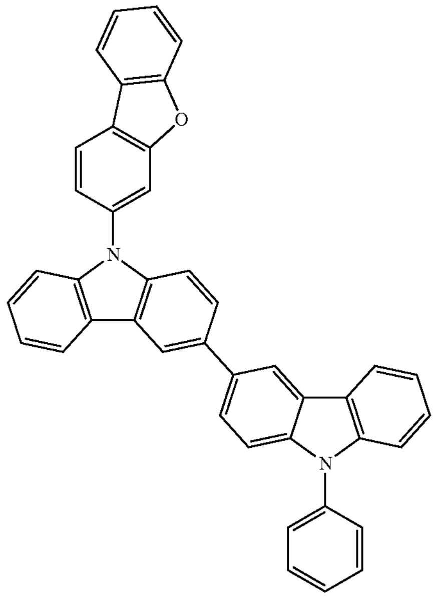
GH2-3
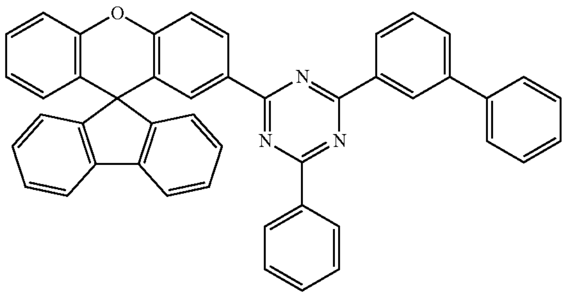
HB1
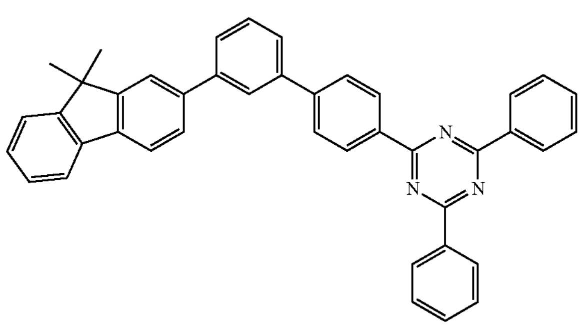
HB3
-continued
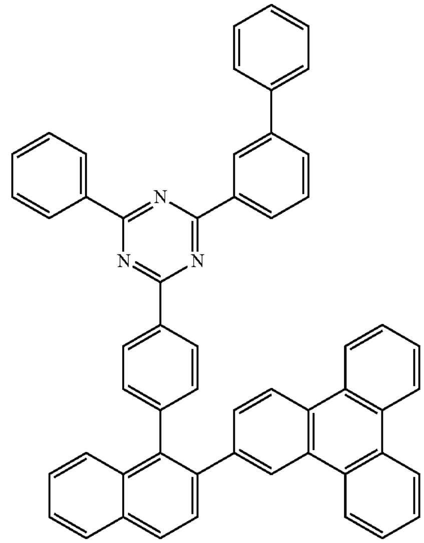
HB4
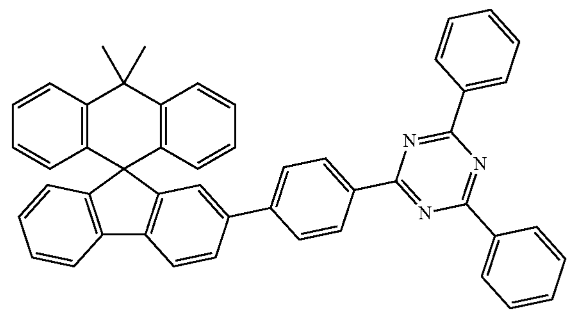
HB5
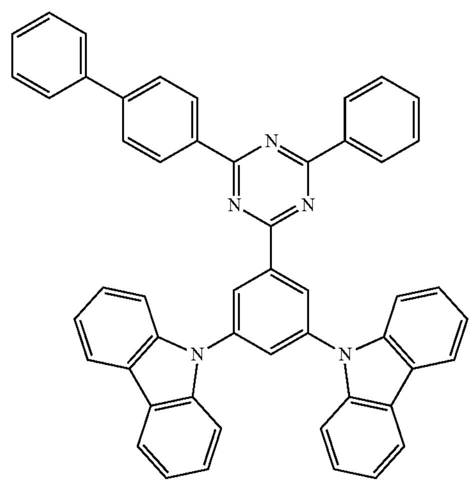
ET1
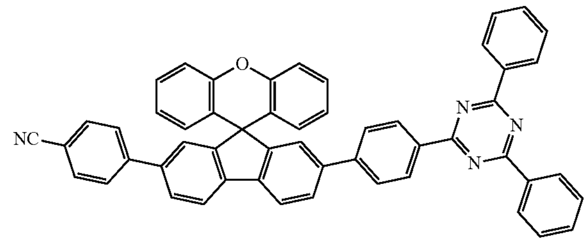
ET2

-continued

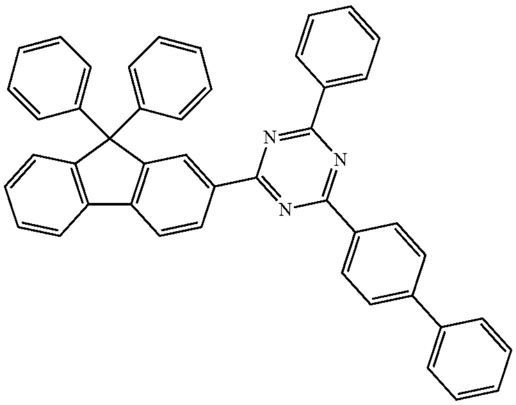

ET3

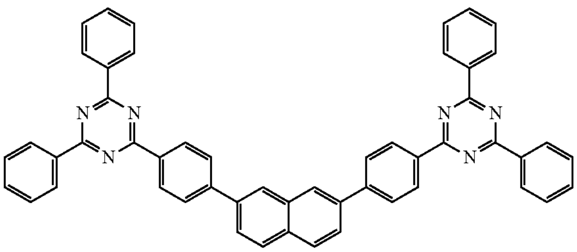

ET4

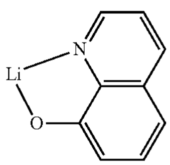

Liq

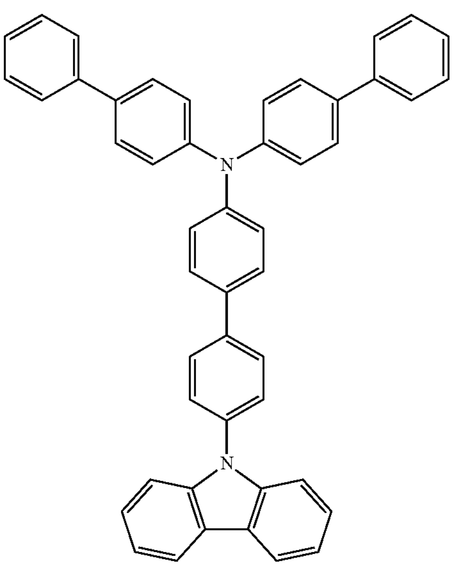

CP1

-continued

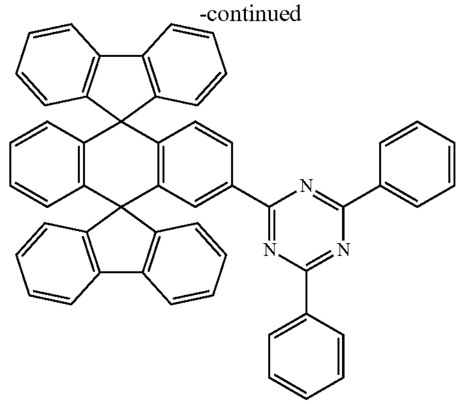

ET5

The compound can be synthesized by a typical method. The synthesis method is not particularly limited, but for example, HT2-3 can be synthesized in accordance with Korean Patent Application Laid-Open No. 10-2017-0092097, HB1 can be synthesized in accordance with Korean Patent No. 10-1755986, and EB3 can be synthesized in accordance with Korean Patent Nos. 10-428642 and 10-1422914.

The compound corresponding to the organic material layer is applied to the Examples as the following example, and the examples and T1 energy level results of the compounds used in the Examples of the organic electroluminescent device showed the results described in the following Table 1.

TABLE 1

| Compound | | T1 Energy level (eV) | Spiro structure | T1 2.7 eV or more -> ○ T1 2.6 eV or more -> Δ T1 less than 2.6 eV -> X/ Spiro -> ○/X |
|---|---|---|---|---|
| Hole transport layer | HT1 | 2.61 | X | Δ/X |
| First hole adjusting layer | HT2-1 | 2.71 | ○ | ○/○ |
| | HT2-2 | 2.76 | X | ○/X |
| | HT2-3 | 2.56 | X | X/X |
| | HT2-4 | 2.56 | ○ | X/○ |
| Second hole adjusting layer | EB2 | 2.50 | X | X/X |
| | EB3 | 2.72 | ○ | ○/○ |
| | EB4 | 2.72 | X | ○/X |
| Light emitting layer (Host) | GH1-1 | 2.75 | X | ○/X |
| | GH1-2 | 2.57 | X | X/X |
| | GH2-1 | 2.92 | X | ○/X |
| | GH2-2 | 2.93 | X | ○/X |
| | GH2-3 | 2.90 | X | ○/X |
| Electron adjusting layer | HB1 | 2.74 | ○ | ○/○ |
| | HB3 | 2.75 | X | ○/X |
| | HB4 | 2.42 | X | X/X |
| | HB5 | 2.56 | ○ | X/○ |
| Electron transport layer | ET1 | 2.75 | X | ○/X |
| | ET2 | 2.67 | ○ | Δ/○ |
| | ET3 | 2.55 | X | X/X |
| | ET4 | 2.35 | X | X/X |
| | ET5 | 2.75 | ○ | ○/○ |

<Example 1> Manufacture of OLED

As an anode, a substrate on which ITO/Ag/ITO were deposited to have a thickness of 70/1,000/70 Å was cut into a size of 50 mm×50 mm×0.5 mm, put into distilled water in which a detergent was dissolved, and washed with ultrasonic waves. A product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents in this order, and drying was then conducted.

HT1 was thermally vacuum-deposited to have a thickness of 50 Å on the anode thus prepared, PD1 (2 wt %) was co-deposited to form a hole injection layer, HT1 as a material which transports holes was vacuum-deposited to have a thickness of 1,150 Å thereon to form a hole transport layer, and then HT2-1 was deposited to have a thickness of 850 Å to form a first hole adjusting layer. Hosts GH1-1 and GH2-3 co-deposited at a mass ratio of 7:3 and vacuum-deposited to have a thickness of 360 Å to form a light emitting layer, and a dopant GD1 (12 wt %) was co-deposited together. Thereafter, HB5 was deposited to have a thickness of 50 Å to form an electron adjusting layer, and ET3 and Liq were mixed at a mass ratio of 7:3 to form an electron transport layer having a thickness of 350 Å. Sequentially, lithium fluoride (LiF) was deposited to have a thickness of 50 Å to form a film as an electron injection layer <EIL>, magnesium and silver (1:4, weight ratio) were used to form a cathode having a thickness of 200 Å, and then CP1 was deposited to have a thickness of 600 Å, thereby completing a device. In the aforementioned procedure, the deposition rate of the organic materials was maintained at 1 Å/sec.

Examples 1 to 10 and Comparative Examples 1 to 7, which are results in which the compound was used as a material which forms each layer of the organic electroluminescent device, are shown in Tables 2 and 3.

Examples (applied to the Examples and Comparative Examples) of the compound used in the hole transport region, the electron transport region, and the light emitting layer, respectively, of the organic electroluminescent device suggested by the present document are as follows.

Hole Transport Region
- Hole transport layer: HT1
- First hole adjusting layer: HT2-1 to HT2-4
- Second hole adjusting layer: EB2 to EB4

Light Emitting Layer
- First host: GH1-1 and GH1-2
- Second host: GH2-1 and GH2-3
- Dopant: GD1

Electron Transport Region
- Electron adjusting layer: HB1 and HB3 to HB5
- Electron transport layer: ET1 to ET5

TABLE 2

| Experimental Example | Hole injection layer | Hole transport layer | Hole adjusting layer: First hole adjusting layer | Hole adjusting layer: Second hole adjusting layer | Light emitting layer: First host | Light emitting layer: Second host | Light emitting layer: Host ratio (mass ratio) | Light emitting layer: Dopant (wt %) | Electron adjusting layer | Electron transport layer |
|---|---|---|---|---|---|---|---|---|---|---|
| Example 1 | HT1 (PD1, 2 wt %) | HT1 | HT2-1 | — | GH1-1 | GH2-3 | 7:3 | GD1 (12 wt %) | HB5 | ET3 |
| | | Δ/X | ○/○ | — | ○/X | ○/X | — | — | X/○ | X/X |
| Example 2 | HT1 (PD1, 2 wt %) | HT1 | HT2-1 | — | GH1-1 | GH2-3 | 7:3 | GD1 (12 wt %) | HB1 | ET3 |
| | — | Δ/X | ○/○ | — | ○/X | ○/X | — | — | ○/○ | X/X |
| Example 3 | HT1 (PD1, 2 wt %) | HT1 | HT2-1 | EB3 | GH1-2 | GH2-3 | 7:3 | GD1 (12 wt %) | HB5 | ET3 |
| | — | Δ/X | ○/○ | ○/○ | X/X | ○/X | — | — | X/○ | X/X |
| Example 4 | HT1 (PD1, 2 wt %) | HT1 | HT2-1 | EB3 | GH1-1 | GH2-3 | 7:3 | GD1 (12 wt %) | HB5 | ET2 |
| | — | Δ/X | ○/○ | ○/○ | ○/X | ○/X | — | — | X/○ | Δ/○ |
| Example 5 | HT1 (PD1, 2 wt %) | HT1 | HT2-3 | EB2 | GH1-2 | GH2-2 | 7:3 | GD1 (12 wt %) | HB1 | ET5 |
| | — | Δ/X | X/X | X/X | X/X | ○/X | — | — | ○/○ | ○/○ |
| Example 6 | HT1 (PD1, 2 wt %) | HT1 | HT2-1 | EB2 | GH1-1 | GH2-2 | 7:3 | GD1 (12 wt %) | HB5 | ET5 |
| | — | Δ/X | ○/○ | X/X | ○/X | ○/X | — | — | X/○ | ○/○ |
| Example 7 | HT1 (PD1, 2 wt %) | HT1 | HT2-3 | EB3 | GH1-1 | GH2-1 | 7:3 | GD1 (12 wt %) | HB3 | ET3 |
| | — | Δ/X | X/X | ○/○ | ○/X | ○/X | — | — | ○/X | Δ/○ |
| Example 8 | HT1 (PD1, 2 wt %) | HT1 | HT2-1 | EB3 | GH1-1 | GH2-2 | 5:5 | GD1 (12 wt %) | HB1 | ET2 |
| | — | Δ/X | ○/○ | ○/○ | ○/X | ○/X | — | — | ○/○ | Δ/○ |
| Example 9 | HT1 (PD1, 2 wt %) | HT1 | HT2-1 | EB4 | GH1-2 | GH2-2 | 5:5 | GD1 (12 wt %) | HB1 | ET1 |
| | — | Δ/X | ○/○ | ○/X | X/X | ○/X | — | — | ○/○ | ○/X |
| Example 10 | HT1 (PD1, 2 wt %) | HT1 | HT2-1 | EB3 | GH1-1 | GH2-2 | 7:3 | GD1 (12 wt %) | HB3 | ET5 |

TABLE 2-continued

| Experimental Example | Hole injection layer | Hole transport layer | Hole adjusting layer: First hole adjusting layer | Second hole adjusting layer | Light emitting layer: First host | Second host | Host ratio (mass ratio) | Dopant (wt %) | Electron adjusting layer | Electron transport layer |
|---|---|---|---|---|---|---|---|---|---|---|
| | — | Δ/X | ○/○ | ○/X | ○/X | ○/X | — | — | ○/X | ○/○ |
| Comparative Example 1 | HT1 (PD1, 2 wt %) | HT1 | HT2-3 | EB2 | GH1-2 | GH2-2 | 7:3 | GD1 (12 wt %) | HB5 | ET3 |
| | — | Δ/X | X/X | X/X | X/X | ○/X | — | — | X/○ | X/X |
| Comparative Example 2 | HT1 (PD1, 2 wt %) | HT1 | HT2-3 | EB2 | GH1-2 | GH2-2 | 7:3 | GD1 (12 wt %) | HB4 | ET3 |
| | — | Δ/X | X/X | X/X | X/X | ○/X | — | — | X/X | X/X |
| Comparative Example 3 | HT1 (PD1, 2 wt %) | HT1 | HT2-3 | EB2 | GH1-1 | GH2-1 | 7:3 | GD1 (12 wt %) | HB5 | ET2 |
| | — | Δ/X | X/X | X/X | ○/X | ○/X | — | — | X/○ | Δ/○ |
| Comparative Example 4 | HT1 (PD1, 2 wt %) | HT1 | HT2-3 | EB3 | GH1-2 | GH2-1 | 7:3 | GD1 (12 wt %) | HB3 | ET3 |
| | — | Δ/X | X/X | ○/○ | X/X | ○/X | — | — | ○/X | X/X |
| Comparative Example 5 | HT1 (PD1, 2 wt %) | HT1 | HT2-1 | EB4 | GH1-1 | GH2-2 | 7:3 | GD1 (12 wt %) | HB3 | ET1 |
| | — | Δ/X | ○/○ | ○/X | ○/X | ○/X | — | — | ○/X | ○/X |
| Comparative Example 6 | HT1 (PD1, 2 wt %) | HT1 | HT2-1 | EB3 | GH1-2 | GH2-3 | 7:3 | GD1 (12 wt %) | HB5 | ET4 |
| | — | Δ/X | ○/○ | ○/○ | X/X | ○/X | — | — | X/○ | X/X |
| Comparative Example 7 | HT1 (PD1, 2 wt %) | HT1 | HT2-1 | EB3 | GH1-2 | GH2-3 | 5:5 | GD1 (12 wt %) | HB5 | ET4 |
| | — | Δ/X | ○/○ | ○/○ | X/X | ○/X | — | — | X/○ | X/X |

| Experimental Example | Voltage (V) (@20 mA/cm$^2$) | Cd/A (@20 mA/cm$^2$) | Color coordinance (x,y) | Service Life (T95, h) (@20 mA/cm$^2$) |
|---|---|---|---|---|
| Example 1 | 3.77 | 121.30 | (0.22, 0.72) | 133.5 |
| Example 2 | 3.71 | 123.50 | (0.22, 0.72) | 145.9 |
| Example 3 | 3.58 | 135.20 | (0.22, 0.72) | 189.9 |
| Example 4 | 3.63 | 141.50 | (0.22, 0.72) | 189.9 |
| Example 5 | 3.72 | 133.90 | (0.22, 0.73) | 183.1 |
| Example 6 | 3.51 | 138.70 | (0.23, 0.70) | 180.9 |
| Example 7 | 3.53 | 139.50 | (0.23, 0.70) | 195.3 |
| Example 8 | 3.51 | 140.80 | (0.22, 0.73) | 203.8 |
| Example 9 | 3.46 | 138.20 | (0.23, 0.70) | 201.7 |
| Example 10 | 3.42 | 152.50 | (0.22, 0.72) | 208.2 |
| Comparative Example 1 | 4.23 | 113.50 | (0.23, 0.70) | 111.5 |
| Comparative Example 2 | 4.38 | 99.50 | (0.22, 0.72) | 100.8 |
| Comparative Example 3 | 3.98 | 106.50 | (0.23, 0.70) | 115.6 |
| Comparative Example 4 | 4.15 | 112.60 | (0.22, 0.72) | 123.0 |
| Comparative Example 5 | 3.66 | 132.10 | (0.22, 0.72) | 98.1 |
| Comparative Example 6 | 3.81 | 108.40 | (0.22, 0.72) | 99.7 |
| Comparative Example 7 | 3.78 | 104.50 | (0.22, 0.72) | 97.5 |

An organic electroluminescent device suggested by the present invention in which all of the other organic materials, except for a light emitting dopant, among the organic materials included in the one or more organic material layers have a triplet energy ($T_{org}$) of 2.5 eV or more, at least three or more of the organic materials having a triplet energy ($T_{org}$) of 2.5 eV or more have a triplet energy ($T_{org}$) of 2.7 eV or more, and at least two or more of the organic materials having a triplet energy ($T_{org}$) of 2.5 eV or more include a Spiro compound exhibits an excellent device performance compared to the Comparative Examples. An organic electroluminescent device manufactured by introducing the compound having the characteristics into the hole transport region, the electron transport region, and the light emitting layer has, as a green phosphorescent light emitting device, relatively fast carrier transport and transfer characteristics of holes and electrons, and carriers injected from the sides of the anode and the cathode make a balance in the light emitting layer. Further, the injection and movement of carriers into the light emitting layer, the energy transfer, and the like exhibit effective light emission through a device to which the combination of the compounds having characteristics of the present specification in the light emitting region is applied. Further, the injection and movement of carriers into the light emitting layer, the energy transfer, and the like efficiently elicit phosphorescent light emission of the light emitting region, and thus exhibit an excellent device performance.

Example 1 is a case of having the characteristics of the claims of the present specification as an organic electroluminescent device manufactured by constituting a hole adjusting layer as a single layer. When compared with Comparative Example 1 that does not have the constitution (compound applied to the entire device except for a dopant has 2.5 eV or more) included in the claims of the present specification, it can be observed that Example 1 exhibits the results of particularly lower driving voltage and higher efficiency and service life, although Example 1 is composed of a first hole adjusting layer in which the hole adjusting layer is a single layer.

Further, unlike Example 1, by introducing the compound having a triplet energy of 2.7 eV or more and a spiro structure in the hole transport region and the electron transport region, which are in contact with the light emitting layer, in Example 2, it is possible to observe the result that the stability of the device is relatively increased, compared to Example 1 in which the compound having a high triplet energy and a spiro structure is introduced only into the hole transport region.

Furthermore, by constituting the hole adjusting layer of the hole transport region with two layers to smoothly transport carriers to the light emitting layer, Examples 3 and 4 also exhibited particularly a relatively low driving voltage and an improved service life as compared to Examples 1 and 2.

In Example 5, the device was manufactured as a constitution having the characteristics only in the electron transport region in distinction from Examples 1 and 2 in which the compound having a high triplet energy and a spiro structure was introduced only into the hole transport region, and the result of the same performance as those of Examples 1 and 2 could be observed. This is a result due to the imbalance of carriers occurring simultaneously with the smooth injection of carriers composed of holes and electrons from only one of the cathode or the anode to the light emitting layer. However, in the case of Comparative Example 1 that does not correspond to the present invention, it is observed that the stability of the phosphorescent light emitting device deteriorates.

Examples 6 to 10 are the cases where the constitution of the device corresponding to the present specification is made by adopting the combination of the compounds for the hole transport region, the electron transport region, and the light emitting layer, and in some cases, a complementary phenomenon of efficiency and service life is particularly observed. The service life is advantageous in a result of evaluating a device with a constitution in which a compound having a Spiro structure and a high T1 is in contact with the light emitting layer, the voltage is advantageous in the case where the compound having a spiro structure and a high T1 is in contact with the electrode, and the change in efficiency can be observed depending on the balance of carriers.

When the device departing from the scope of the present invention is constituted like Comparative Examples 2 to 7, as a result of observing the presented device results, it can be seen that the devices have particularly low service lives, and fail to elicit the overall performance of the phosphorescent device of the present invention.

The invention claimed is:

1. An organic electroluminescent device comprising:

a cathode;

an anode; and one or more organic material layers provided between the cathode and the anode and including an organic material, wherein the one or more organic material layers comprise a light emitting layer, an electron transport region provided between the cathode and the light emitting layer, and a hole transport region provided between the anode and the light emitting layer, all of the organic materials, except for a dopant, among the organic materials included in the one or more organic material layers, have a triplet energy ($T_{org}$) of 2.5 eV or more, three or more of the organic materials having a triplet energy ($T_{org}$) of 2.5 eV or more have a triplet energy ($T_{org}$) of 2.7 eV or more, and two or more of the organic materials having a triplet energy ($T_{org}$) of 2.5 eV or more comprise a spiro compound, and the light emitting layer comprises two or more hosts.

2. The organic electroluminescent device of claim 1, wherein all of the organic materials, except for a dopant, among the organic materials included in the one or more organic material layers, have a triplet energy ($T_{org}$) of 2.6 eV or more.

3. The organic electroluminescent device of claim 1, wherein three or more of the organic materials having a triplet energy ($T_{org}$) of 2.5 eV or more comprise a spiro compound.

4. The organic electroluminescent device of claim 1, wherein the organic electroluminescent device has a light emitting spectrum ($\lambda_{max}$) of 500 nm to 550 nm.

5. The organic electroluminescent device of claim 1, wherein the spiro compound is a compound of Formula 1:

Formula 1

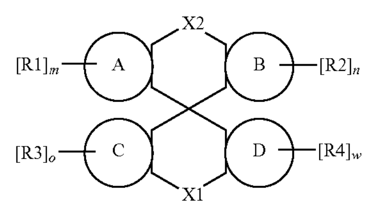

wherein in Formula 1:

Ring A to Ring D are each independently a substituted or unsubstituted aromatic hydrocarbon ring having 6 to 30 carbon atoms, or a substituted or unsubstituted hetero ring having 5 to 40 carbon atoms;

X1 and X2 are each independently a direct bond, CRR', NR", O, or S;

at least one of R, R', R", and R1 to R4 is $-(L)_a-(A)_b$, and the remaining one(s) are each independently hydrogen, deuterium, a nitrile group, a nitro group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heterocyclic group, or adjacent groups are optionally bonded to each other to form a substituted or unsubstituted ring;

R1 to R4 are optionally each independently bonded to any one of adjacent Ring A to Ring D to form a substituted or unsubstituted ring;

R and R' are optionally bonded to each other to form a substituted or unsubstituted spiro ring;

L is a direct bond, a substituted or unsubstituted arylene group, or a substituted or unsubstituted monocyclic heteroarylene group comprising N;

A is a nitrile group, a substituted or unsubstituted silyl group, a substituted or unsubstituted phosphine oxide group, a substituted or unsubstituted amine group, a substituted or unsubstituted aryl group, or a substituted or unsubstituted heterocyclic group;

a and b are each an integer from 1 to 2;

m, n, o, and w are each independently an integer from 0 to 4;

when a and b are each 2, the substituents in the parenthesis are the same as or different from each other, and when m, n, o, and w are each 2 or more, the substituents in the parenthesis are the same as or different from each other.

6. The organic electroluminescent device of claim 1, wherein the spiro compound is any one of the following Formulae 2 to 9:

[Formula 2]

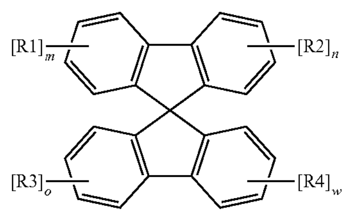

[Formula 3]

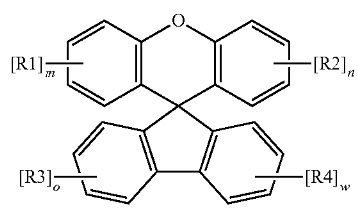

[Formula 4]

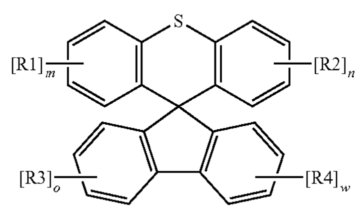

[Formula 5]

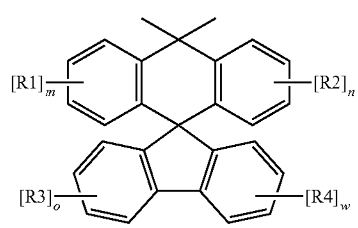

[Formula 6]

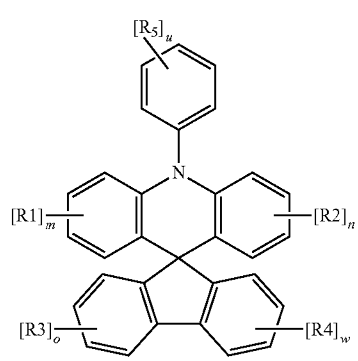

-continued

[Formula 7]

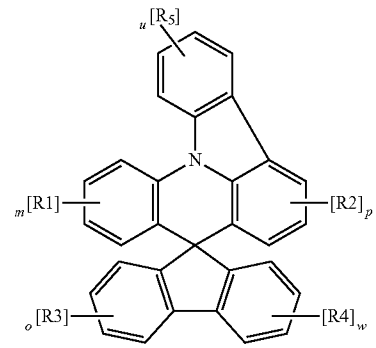

[Formula 8]

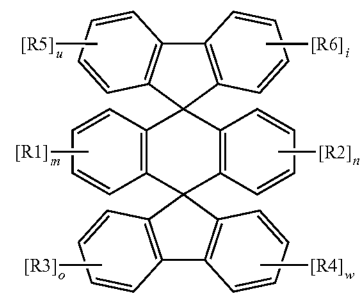

[Formula 9]

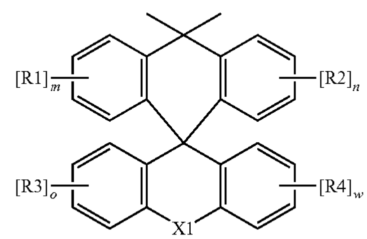

wherein in Formulae 2 to 9:

X1 is CRR', NR", O, or S;

at least one of R, R', R", and R1 to R6 is $-(L)_a-(A)_b$, and the remaining ones are each independently hydrogen, deuterium, a nitrile group, a nitro group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heterocyclic group;

L is a direct bond, a substituted or unsubstituted arylene group, or a substituted or unsubstituted monocyclic heteroarylene group comprising N;

A is a nitrile group, a substituted or unsubstituted silyl group, a substituted or unsubstituted phosphine oxide group, a substituted or unsubstituted amine group, a substituted or unsubstituted aryl group, or a substituted or unsubstituted heterocyclic group;

a and b are each an integer from 1 to 2;

m, n, o, w, u, and i are each independently an integer from 0 to 4; and p is an integer from 0 to 3, when a and b are each 2, the substituents in the parenthesis are the same as or different from each other, and when m, n, o, p, w, u, and i are each 2 or more, the substituents in the parenthesis are the same as or different from each other.

7. The organic electroluminescent device of claim 5, wherein three or more of the spiro compounds are included in the light emitting layer, between the anode and the light emitting layer, or between the cathode and the light emitting layer.

8. The organic electroluminescent device of claim 1, wherein at least one selected from the group consisting of a hole injection layer, a hole transport layer, and a hole adjusting layer is provided in the hole transport region.

9. The organic electroluminescent device of claim 8, wherein the hole adjusting layer is formed of a single layer or multiple layers having two or more layers.

10. The organic electroluminescent device of claim 1, wherein at least one selected from the group consisting of an electron injection layer, an electron transport layer, and an electron adjusting layer is provided in the electron transport region.

11. The organic electroluminescent device of claim 5, wherein the compound of Formula 1 is present between the cathode and the light emitting layer.

12. The organic electroluminescent device of claim 5, wherein the compound of Formula 1 is present between the anode and the light emitting layer.

13. An organic electroluminescent device comprising:

a cathode;

an anode; and one or more organic material layers provided between the cathode and the anode and including an organic material, wherein the one or more organic material layers comprise a light emitting layer, an electron transport region provided between the cathode and the light emitting layer, and a hole transport region provided between the anode and the light emitting layer, all of the organic materials, except for a dopant, among the organic materials included in the one or more organic material layers, have a triplet energy ($T_{org}$) of 2.5 eV or more, three or more of the organic materials having a triplet energy ($T_{org}$) of 2.5 eV or more have a triplet energy ($T_{org}$) of 2.7 eV or more, and two or more of the organic materials having a triplet energy ($T_{org}$) of 2.5 eV or more comprise a spiro compound, wherein at least one of the organic material layers is in contact with the light emitting layer and comprises the spiro compound.

14. The organic electroluminescent device of claim 6, wherein the compound of any one of Formulae 2 to 9 is included in at least one of the layers which are in contact with the light emitting layer.

15. The organic electroluminescent device of claim 1, wherein the host comprises a compound of Formula 10:

Formula 10

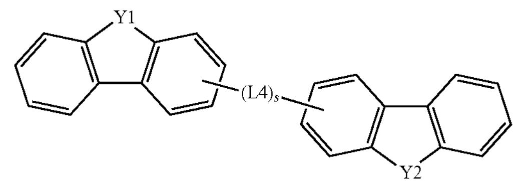

wherein in Formula 10:

Y1 and Y2 are each independently O, S, NR7, or CR8R9;

L4 is a direct bond, a substituted or unsubstituted arylene group having 6 to 50 carbon atoms, or a substituted or unsubstituted divalent heterocyclic group having 2 to 60 carbon atoms;

R7 to R9 are each independently hydrogen, a substituted or unsubstituted alkyl group having 1 to 40 carbon atoms, a substituted or unsubstituted aryl group having 6 to 50 carbon atoms, or a substituted or unsubstituted heterocyclic group having 2 to 60 carbon atoms;

adjacent groups in R7 to R9 are optionally bonded to each other to form a ring; and s is an integer from 1 to 4.

16. An organic electroluminescent device comprising:

a cathode;

an anode; and one or more organic material layers provided between the cathode and the anode and including an organic material, wherein the one or more organic material layers comprise a light emitting layer, an electron transport region provided between the cathode and the light emitting layer, and a hole transport region provided between the anode and the light emitting layer, all of the organic materials, except for a dopant, among the organic materials included in the one or more organic material layers, have a triplet energy ($T_{org}$) of 2.5 eV or more, three or more of the organic materials having a triplet energy ($T_{org}$) of 2.5 eV or more have a triplet energy ($T_{org}$) of 2.7 eV or more, and two or more of the organic materials having a triplet energy ($T_{org}$) of 2.5 eV or more comprise a spiro compound, wherein the dopant comprises a light emitting dopant, and the light emitting dopant comprises an organic metal complex comprising Ir.

17. The organic electroluminescent device of claim 1, wherein the dopant comprises a light emitting dopant, and the light emitting dopant comprises an Ir organic metal complex having a triplet energy ($T_{dopant}$) of 2.4 eV to 2.7 eV.

* * * * *